US008829630B2

(12) United States Patent
Sakuragi et al.

(10) Patent No.: US 8,829,630 B2
(45) Date of Patent: Sep. 9, 2014

(54) PRESSURE SENSOR AND METHOD FOR MANUFACTURING PRESSURE SENSOR

(75) Inventors: Masahiro Sakuragi, Kyoto (JP); Toma Fujita, Kyoto (JP); Mizuho Okada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/699,614

(22) PCT Filed: May 25, 2011

(86) PCT No.: PCT/JP2011/061970
§ 371 (c)(1), (2), (4) Date: Nov. 21, 2012

(87) PCT Pub. No.: WO2011/148973
PCT Pub. Date: Dec. 1, 2011

(65) Prior Publication Data

US 2013/0062713 A1 Mar. 14, 2013

(30) Foreign Application Priority Data

May 25, 2010 (JP) ................................ 2010-119704
May 25, 2010 (JP) ................................ 2010-119705
Jun. 28, 2010 (JP) ................................ 2010-146360

(51) Int. Cl.
*H01L 29/84* (2006.01)
*B81C 1/00* (2006.01)
*H01L 21/762* (2006.01)
*G01L 9/00* (2006.01)

(52) U.S. Cl.
CPC ........... *G01L 9/0042* (2013.01); *B81C 1/00158* (2013.01); *H01L 21/76283* (2013.01); *B81B 2201/0264* (2013.01); *B81C 2201/014* (2013.01); *H01L 21/76264* (2013.01); *B81B 2203/0127* (2013.01)
USPC ........................................................ 257/419

(58) Field of Classification Search
CPC . H01L 41/1132; G01L 9/0042; G01L 9/0073; B81C 1/00158; B81G 2201/0264
USPC ........................................................ 257/419
See application file for complete search history.

(56) References Cited

U.S. PATENT DOCUMENTS 5,163,329 A * 11/1992 Shimaoka et al. ............. 73/721
2001/0052628 A1 12/2001 Ishio et al.

FOREIGN PATENT DOCUMENTS

| | | | |
|---|---|---|---|
| JP | 05-114743 | A | 5/1993 |
| JP | 09-257618 | A | 10/1997 |
| JP | 2850558 | B | 11/1998 |
| JP | 11-135806 | A | 5/1999 |
| JP | 2002-071493 | A | 3/2002 |

* cited by examiner

*Primary Examiner* — Tran Tran
(74) *Attorney, Agent, or Firm* — Rabin & Berdo, P.C.

(57) ABSTRACT

[Subject] To provide a pressure sensor capable of implementing cost reduction and miniaturization.
[Solving Means] A pressure sensor 1 includes a silicon substrate 2 provided therein with a reference pressure chamber 8, a diaphragm 10, consisting of part of the silicon substrate 2, formed on a surface layer portion of the silicon substrate 2 to partition a reference pressure chamber 8, and an etching stop layer 9 formed on a lower surface of the diaphragm 10 facing the reference pressure chamber 8. A through-hole 11 communicating with the reference pressure chamber 8 is formed on the diaphragm 10, and a filler 13 is arranged in the through-hole 11.

8 Claims, 225 Drawing Sheets

FIG. 5C( a )
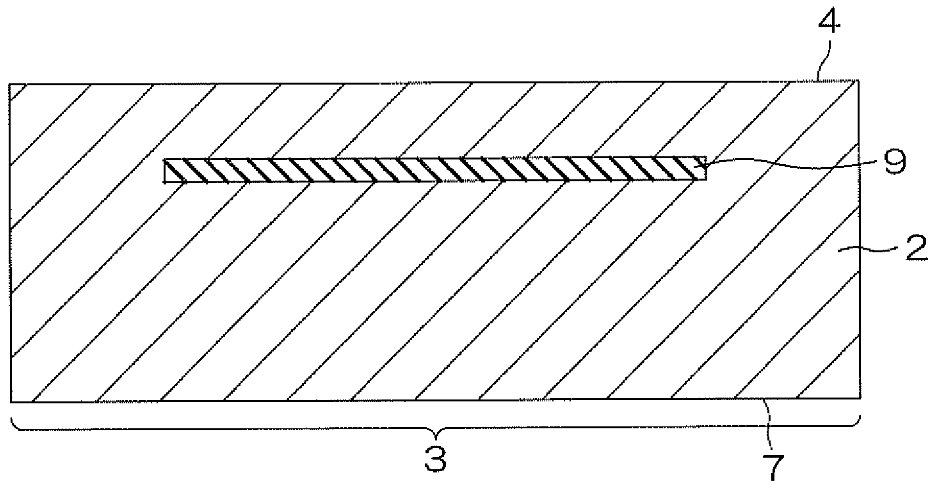
FIG. 5C( b )
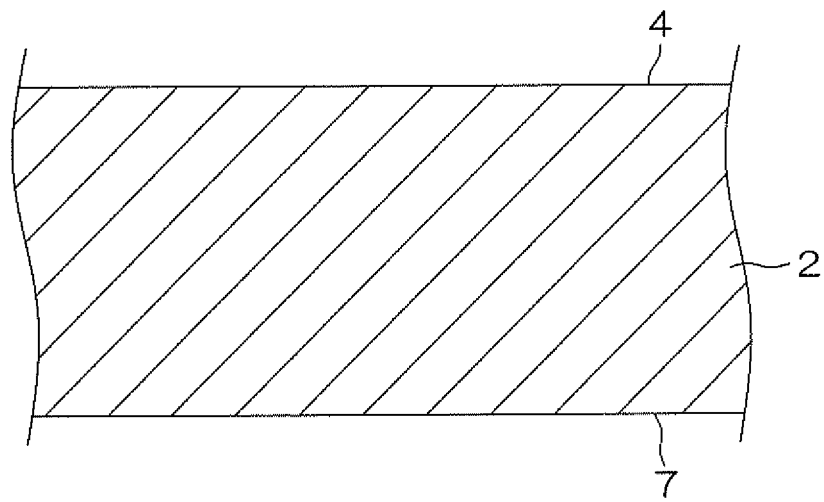

IMPLANTATION
44
44
43
23
4
R2
9
2
7
3

R1
23
9
23
23
R2
R4
23
23
23
R3
3(2)

43
4
2
7

FIG. 7D( a )
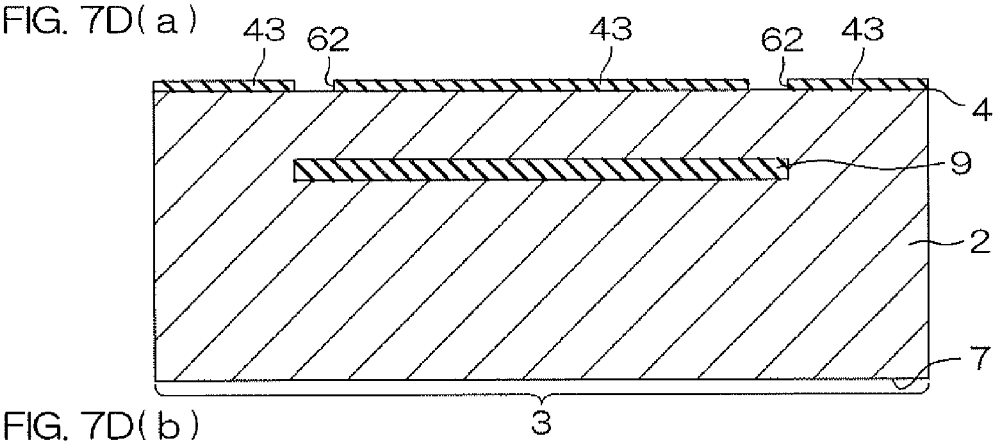
FIG. 7D( b )
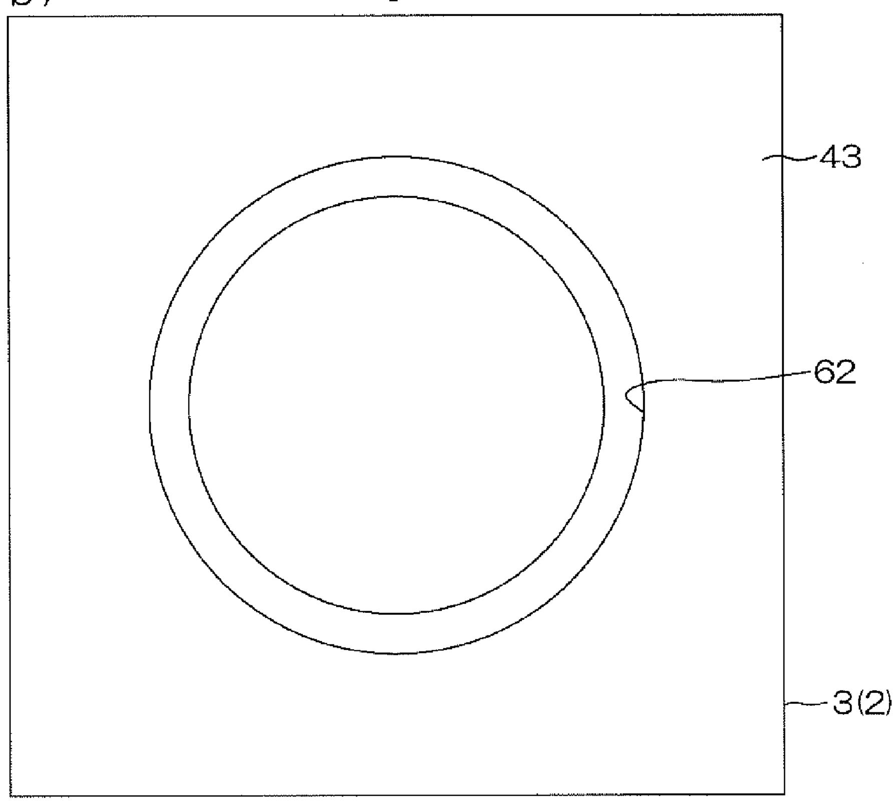
FIG. 7D( c )
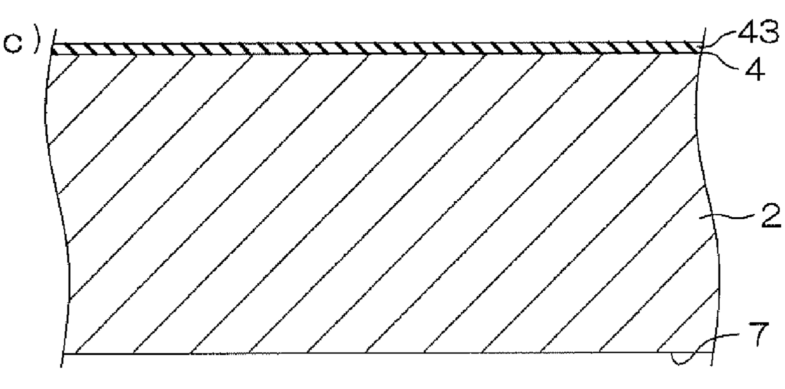

FIG. 7J( a )
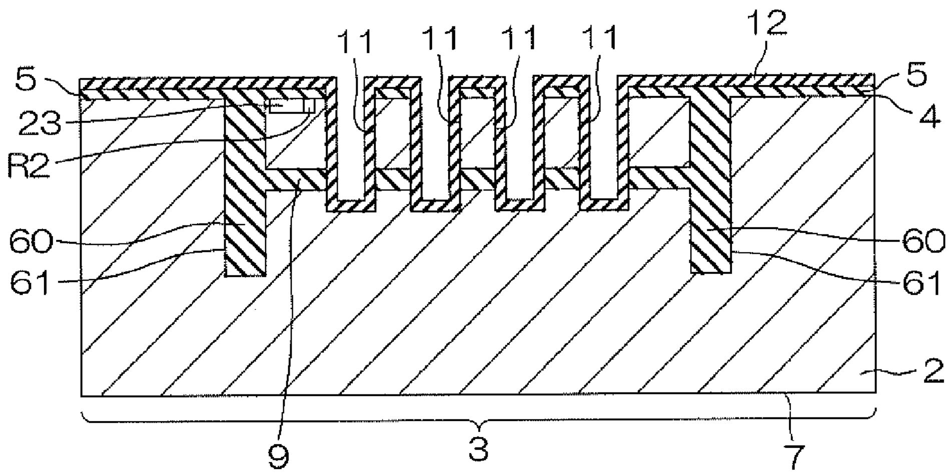
FIG. 7J( b )
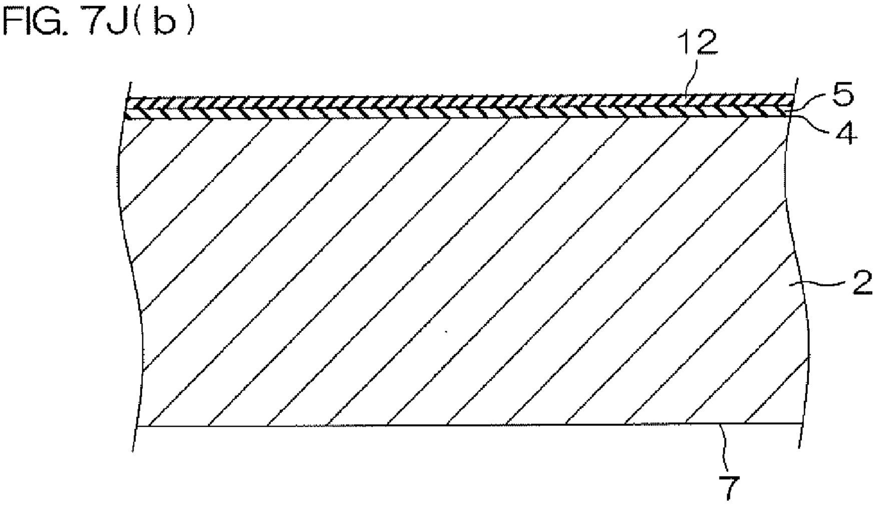

FIG. 7P( a )
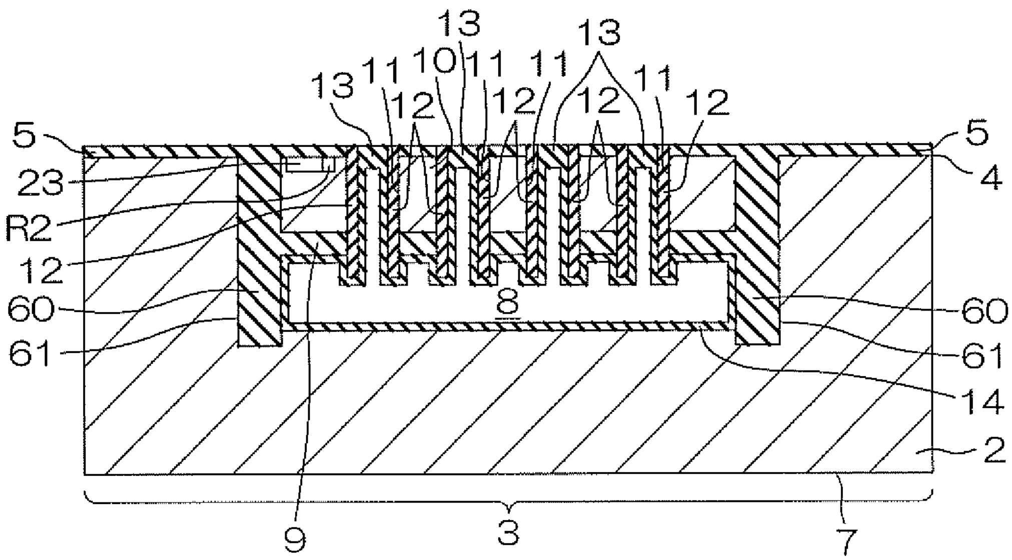
FIG. 7P( b )
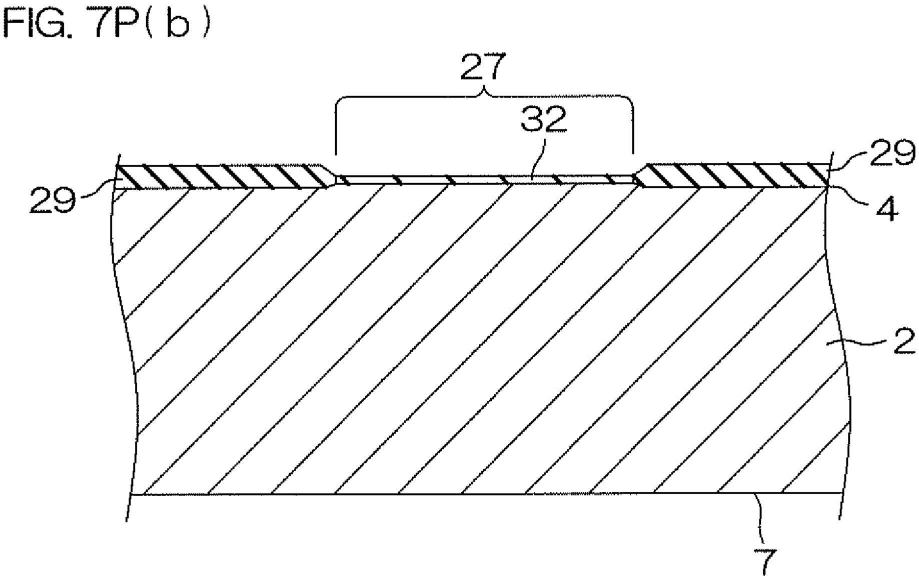

FIG. 10( a )
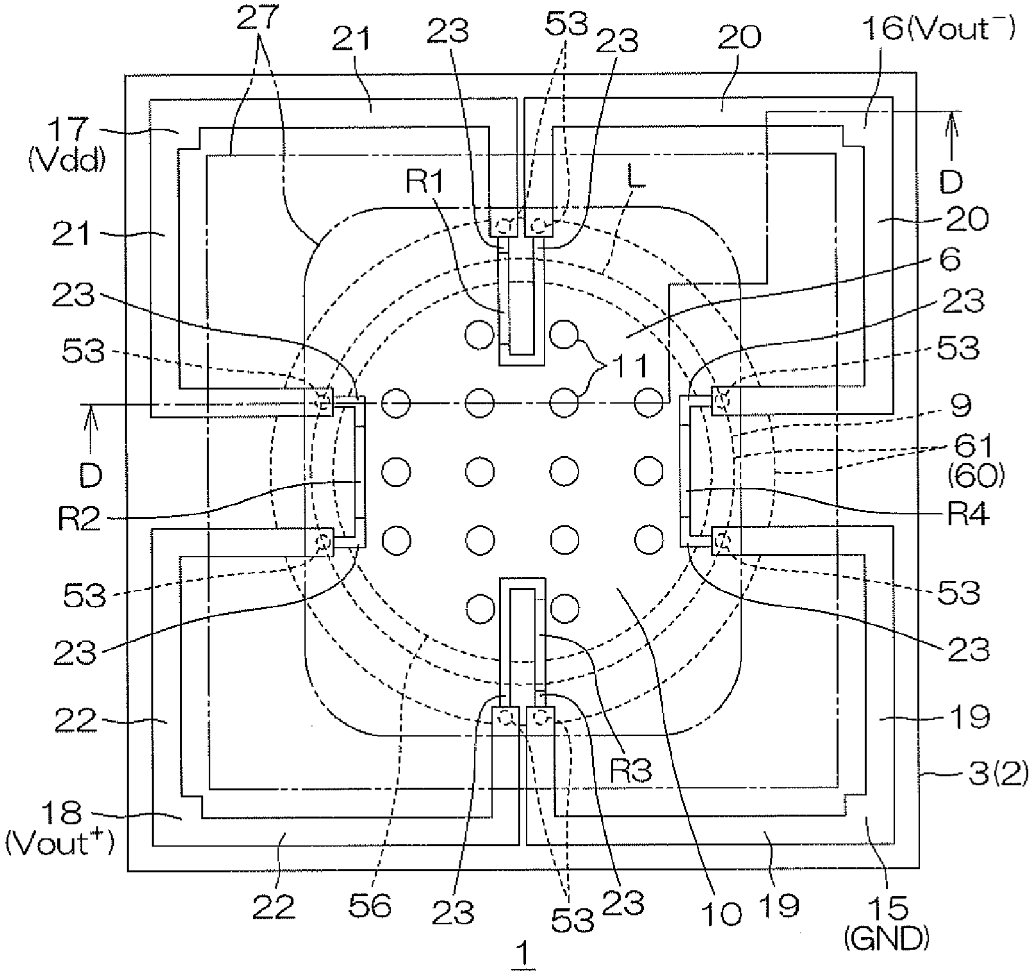
FIG. 10( b )
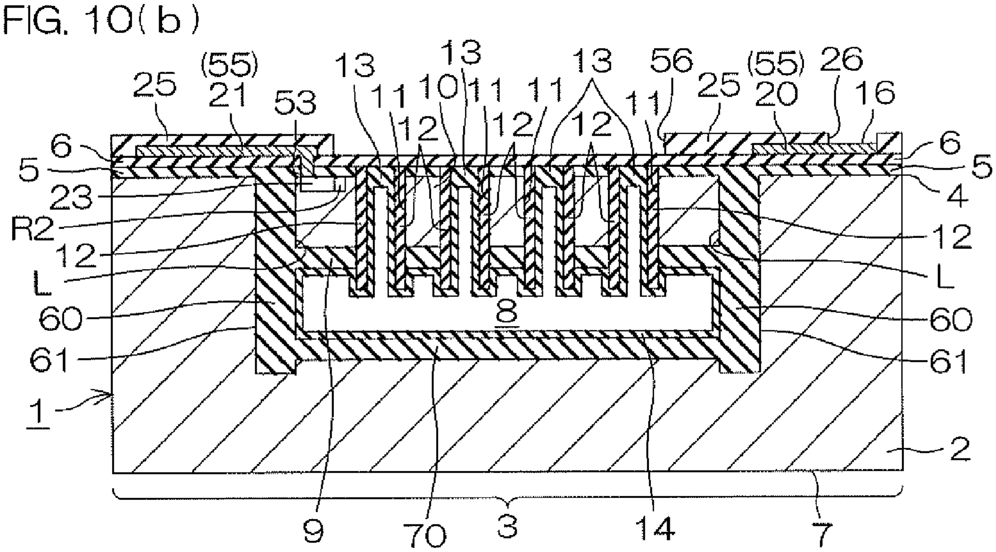

FIG. 11M( a )
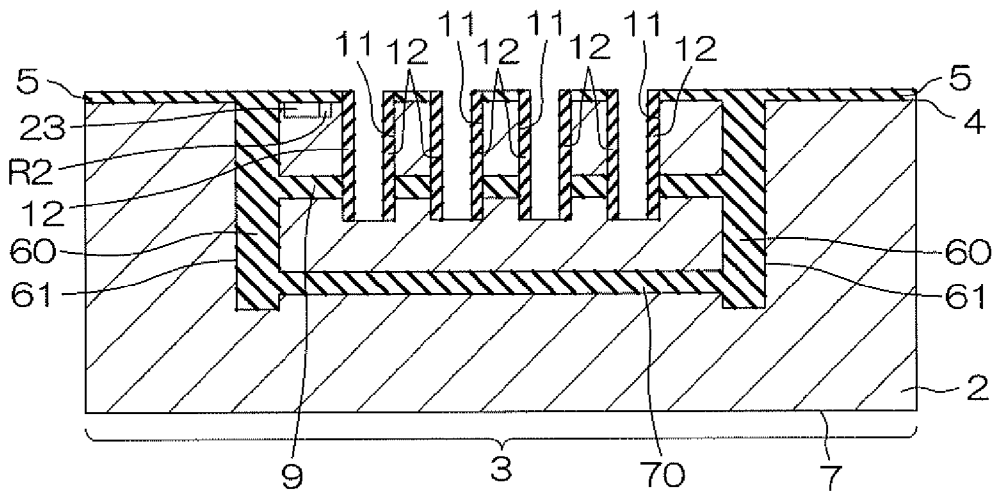
FIG. 11M( b )
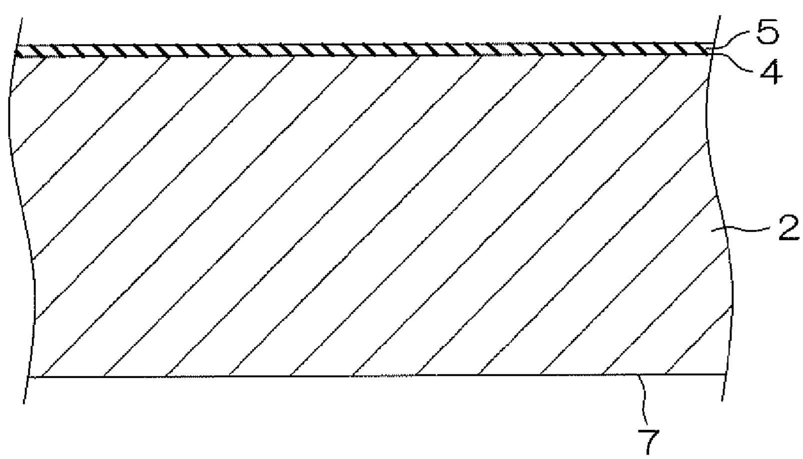

FIG. 14B( a )
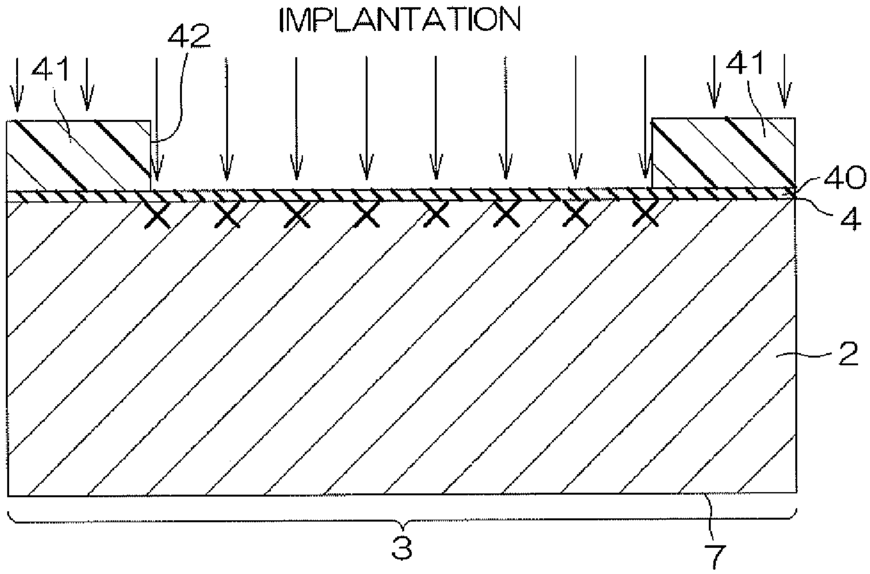
FIG. 14B( b )
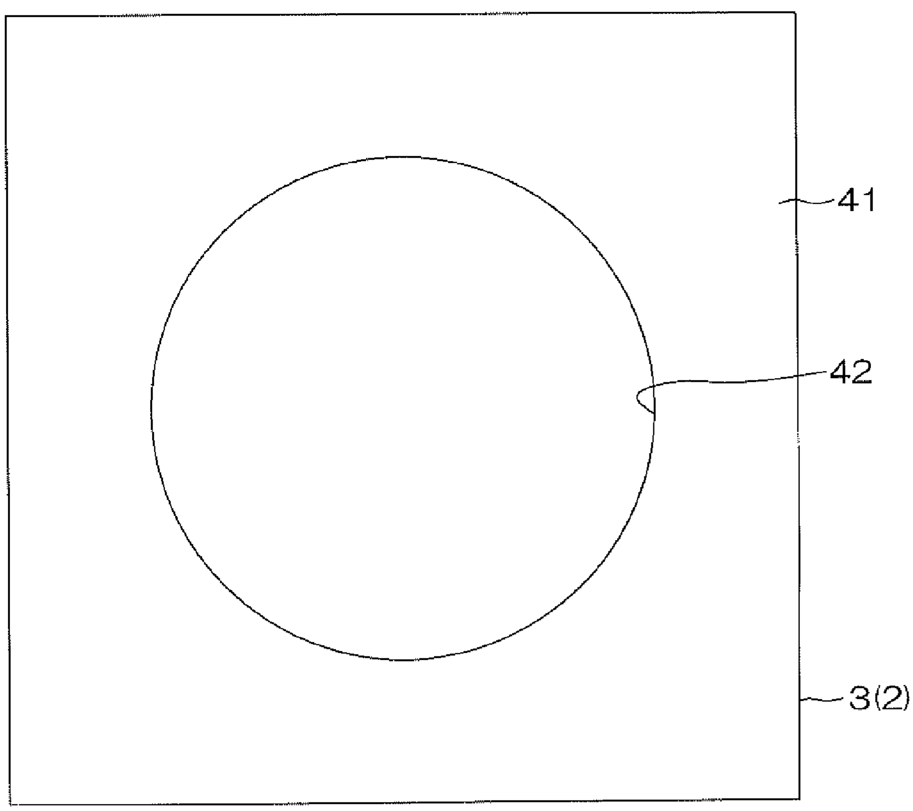

FIG. 14G( a )
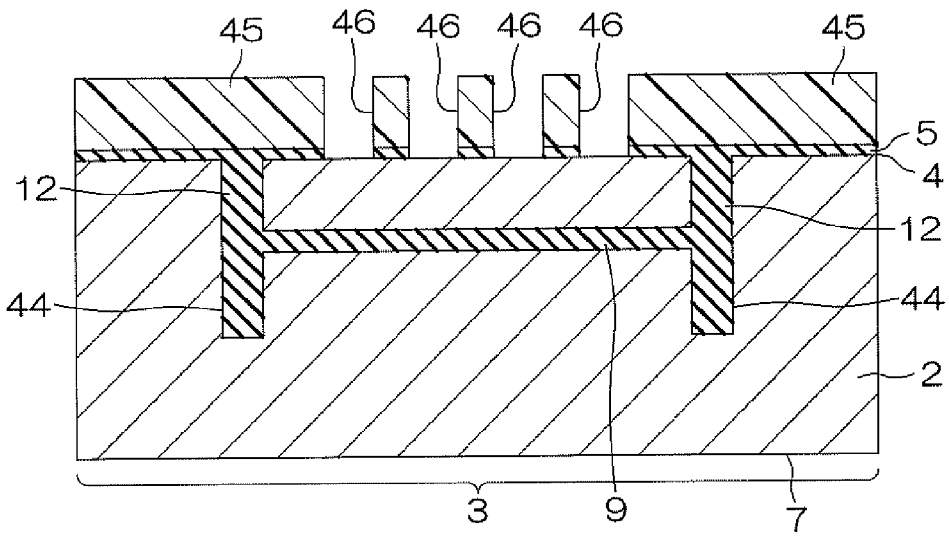
FIG. 14G( b )
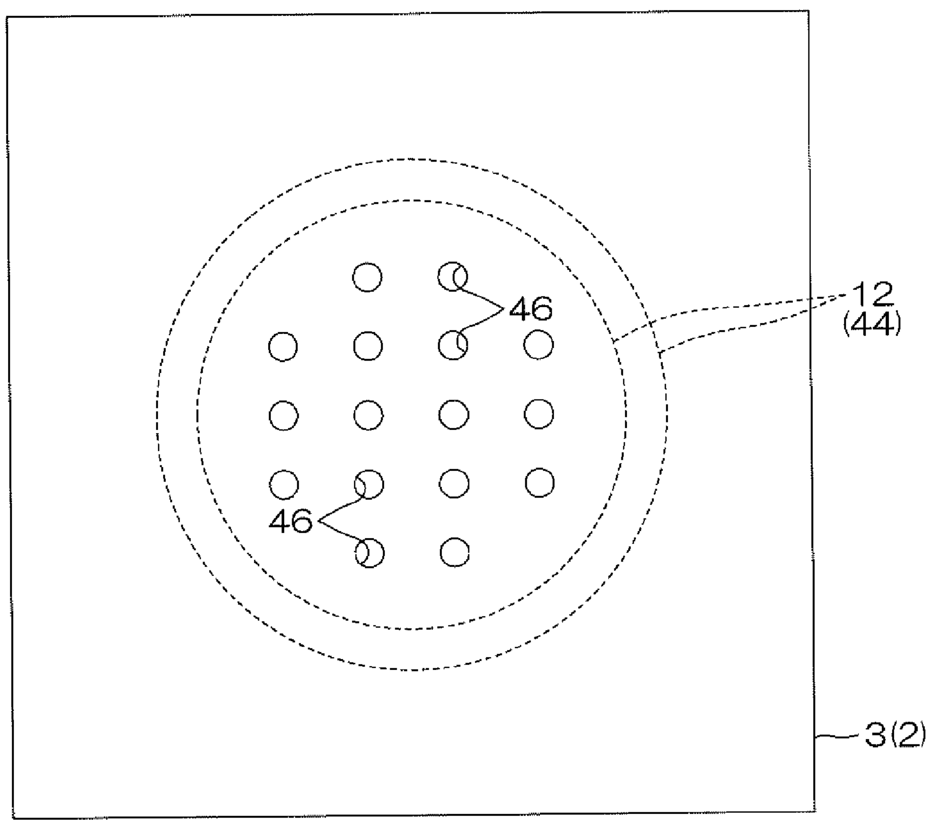

FIG. 14H( a )
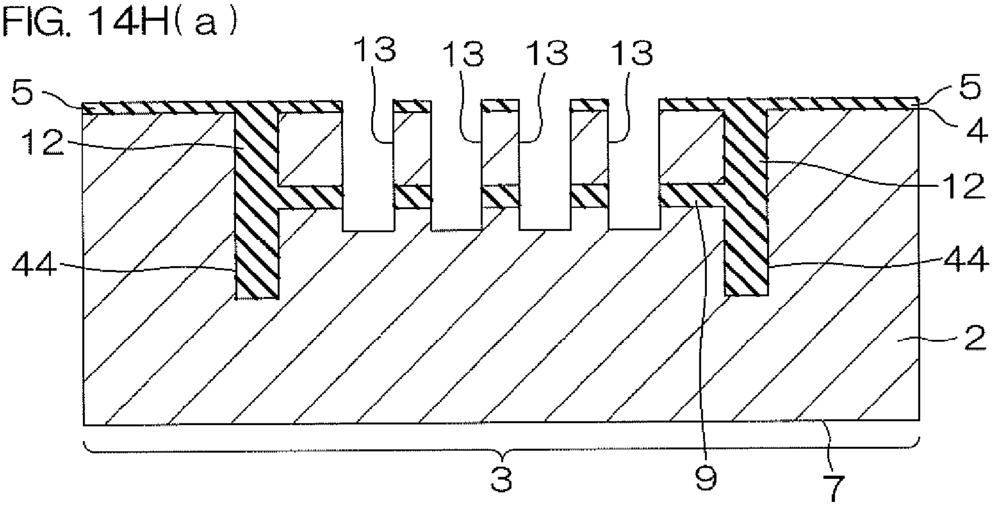
FIG. 14H( b )
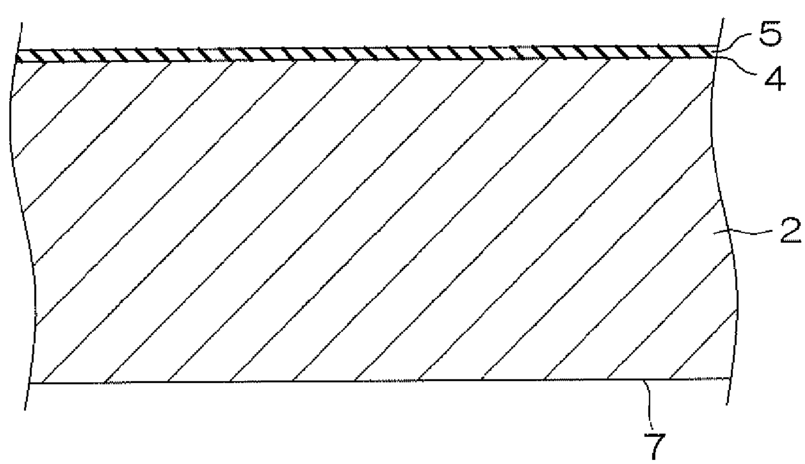

FIG. 14K( a )
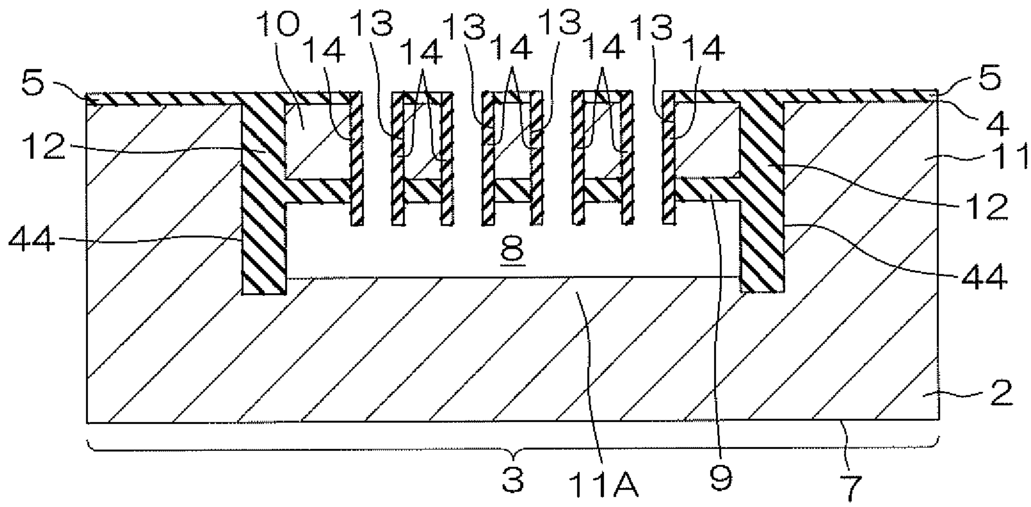
FIG. 14K( b )
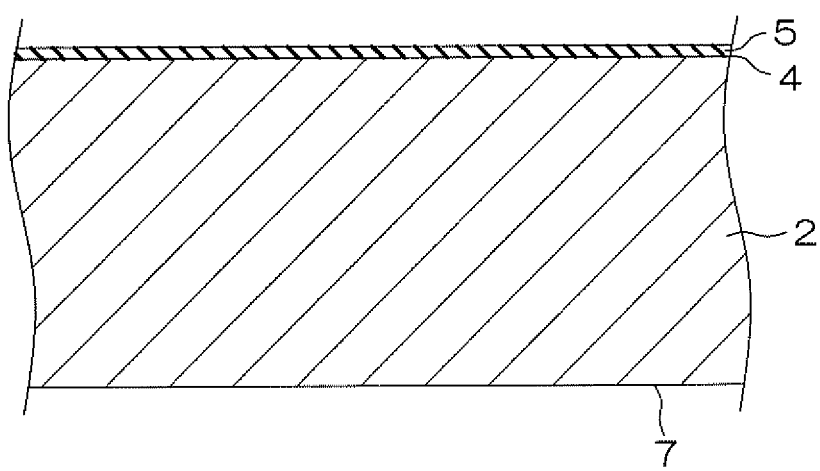

FIG. 16N( a )
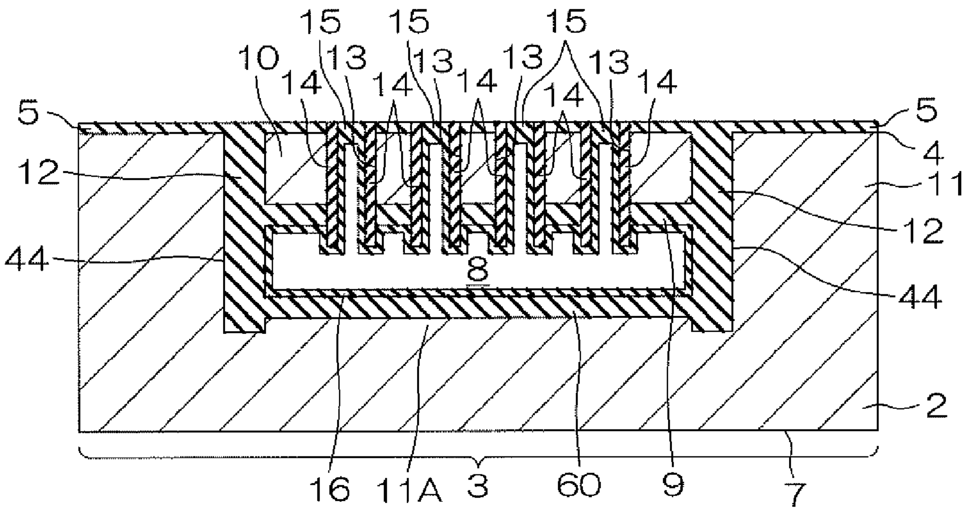
FIG. 16N( b )
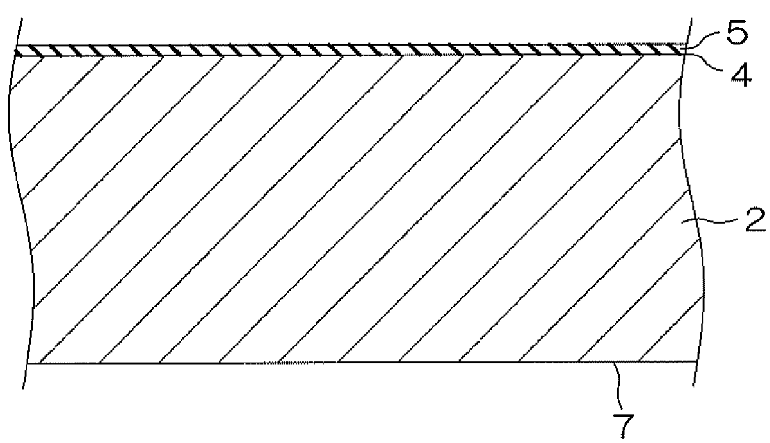

FIG. 160( a )
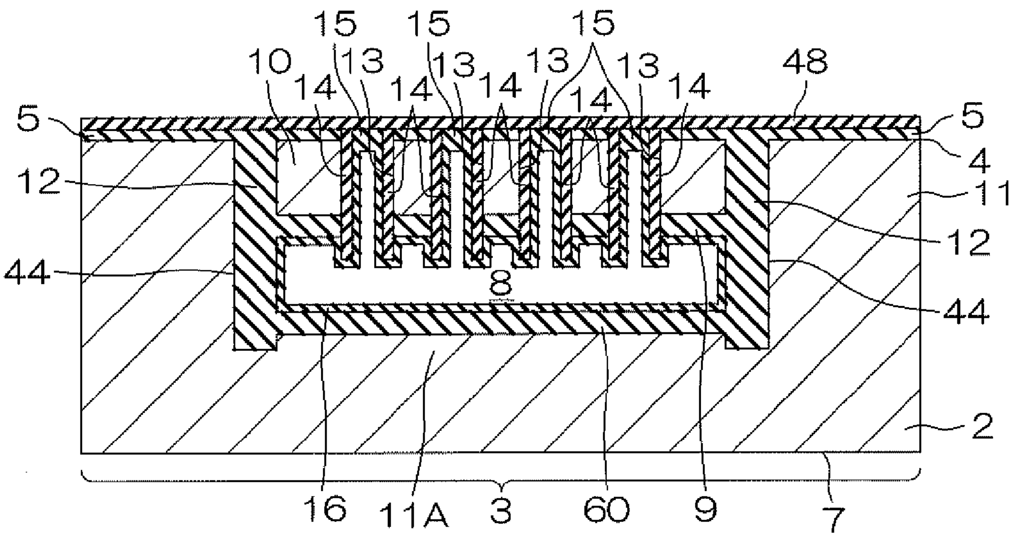
FIG. 160( b )
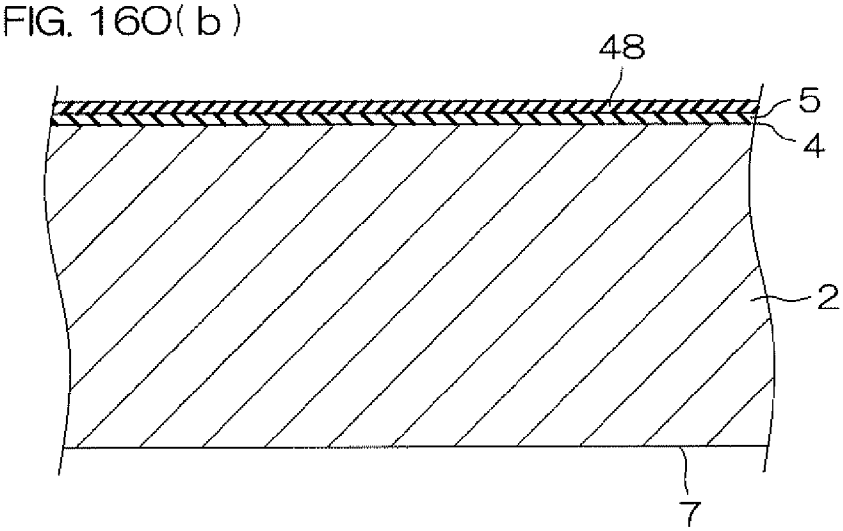

FIG. 18C( a )
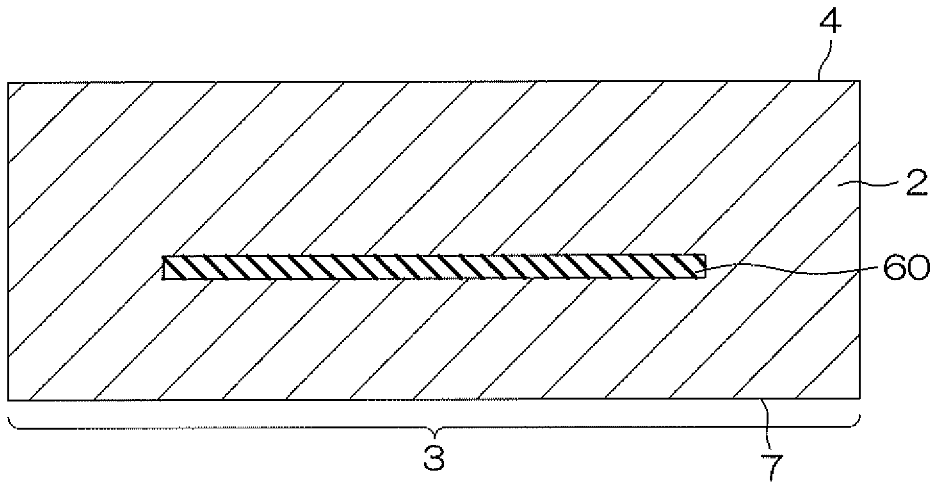
FIG. 18C( b )
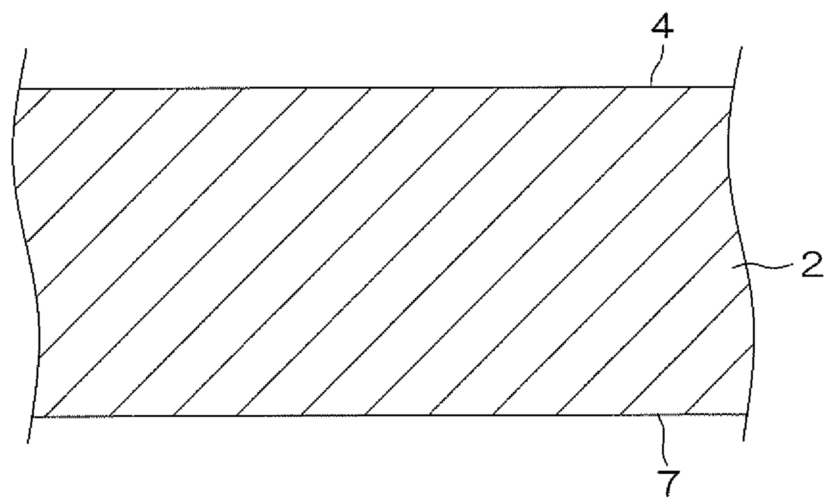

FIG. 18D( a )
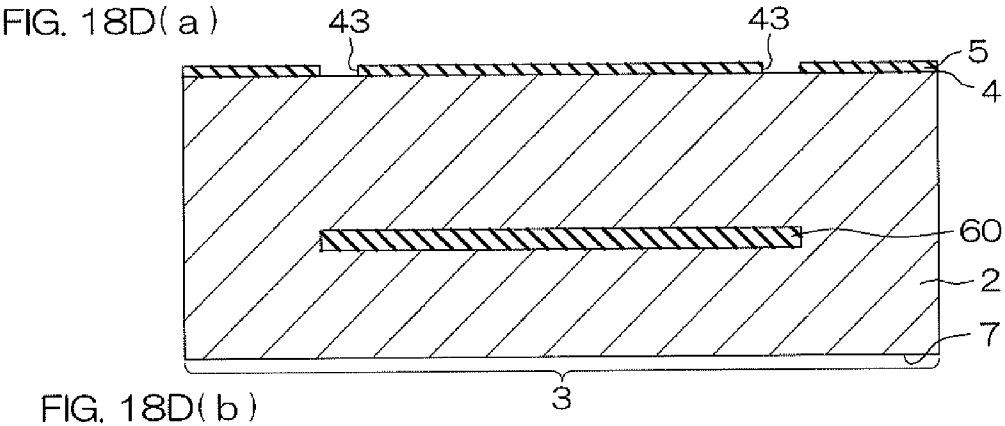
FIG. 18D( b )
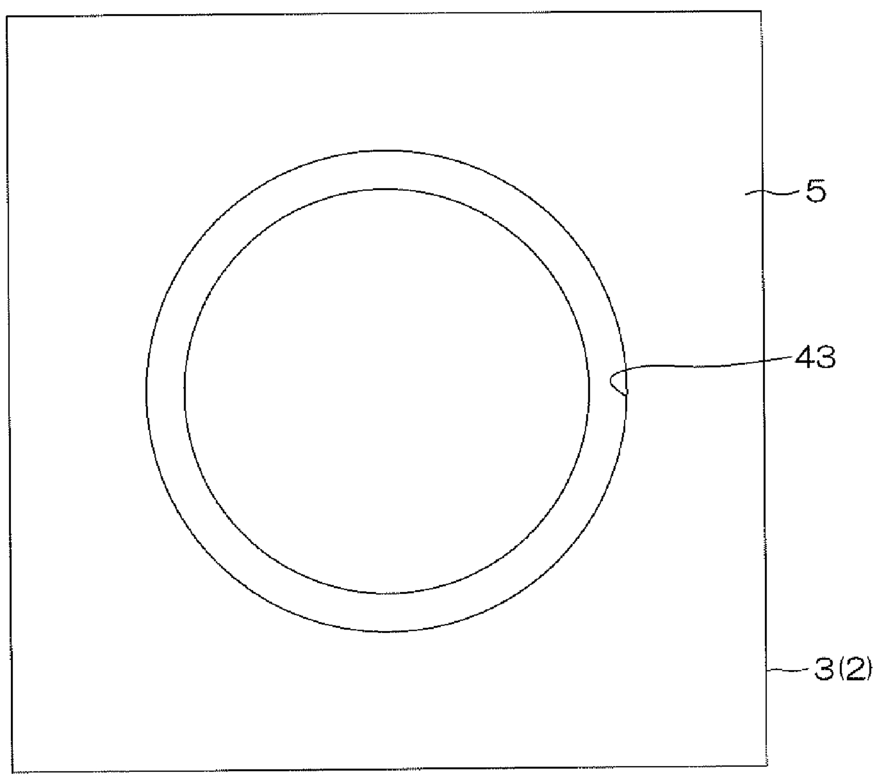
FIG. 18D( c )
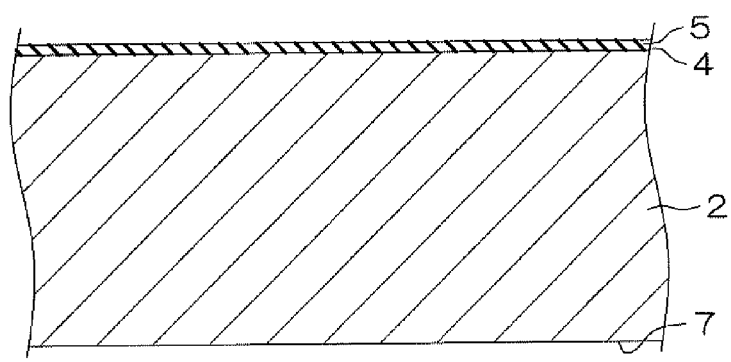

FIG. 18M( a )
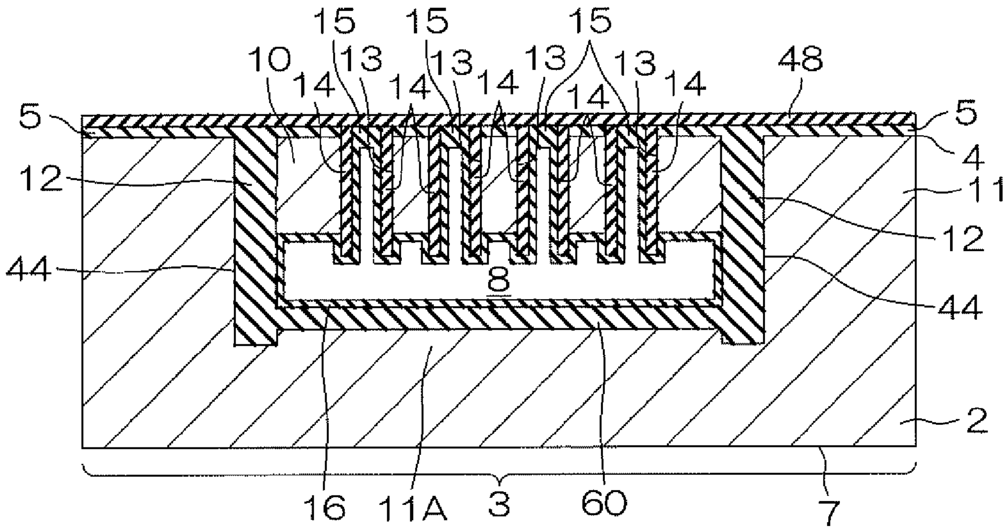
FIG. 18M( b )
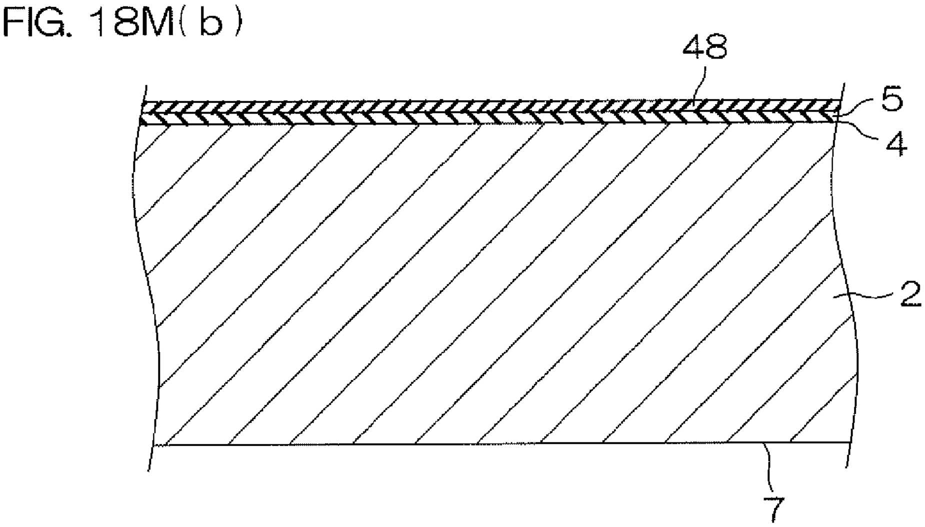

FIG. 21B( a )
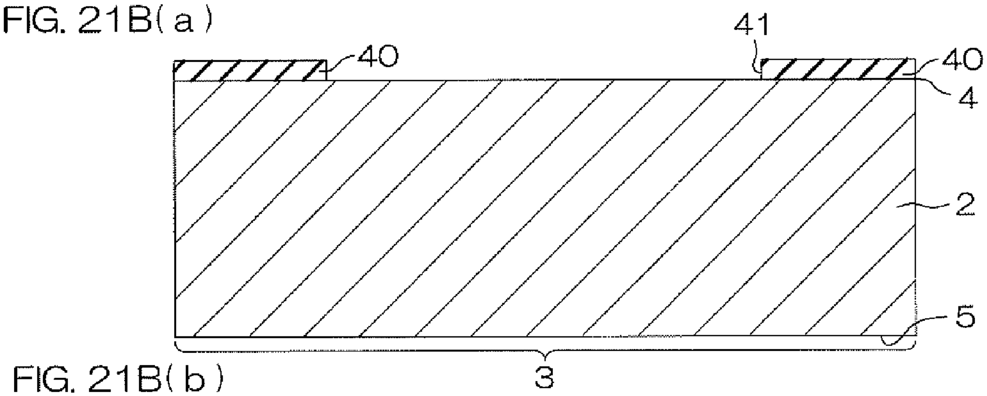
FIG. 21B( b )
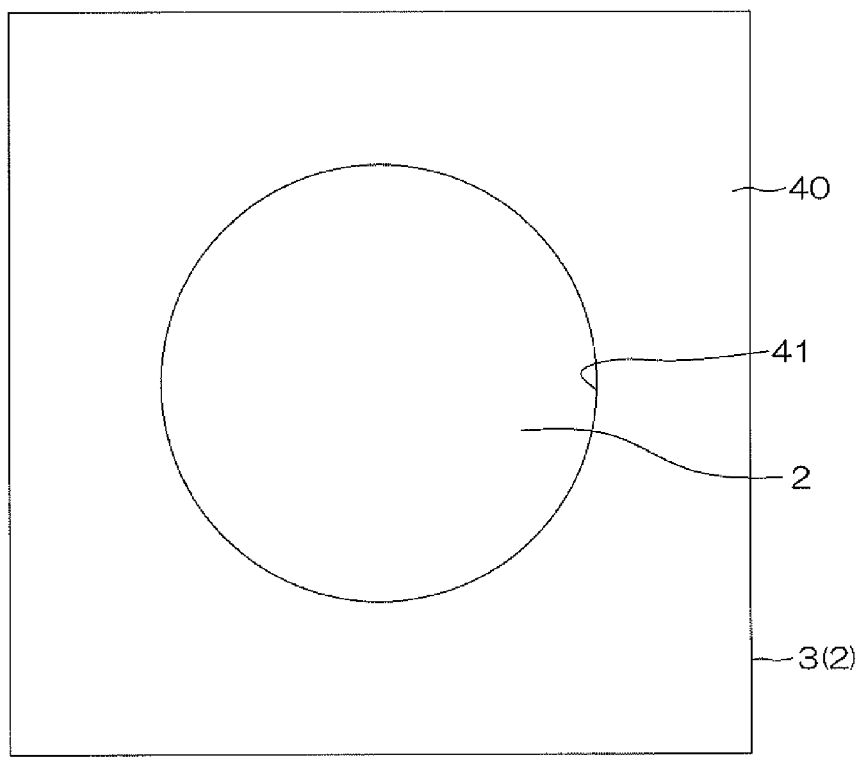
FIG. 21B( c )
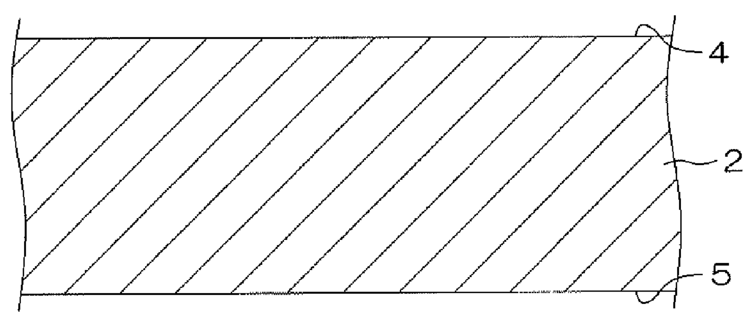

FIG. 23H( a )
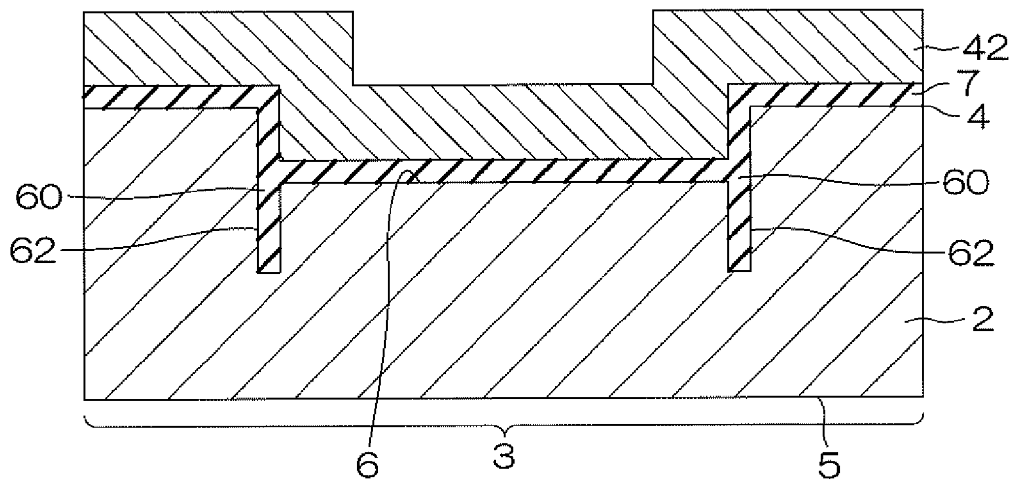
FIG. 23H( b )
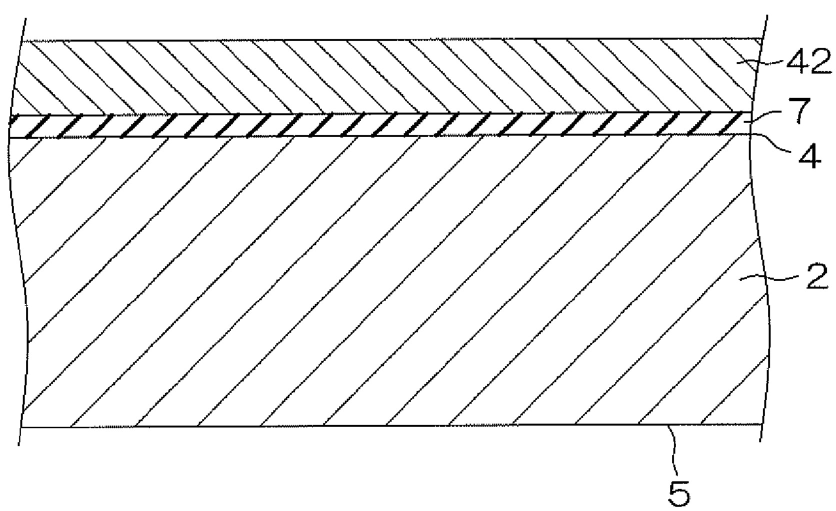

FIG. 23J( a )
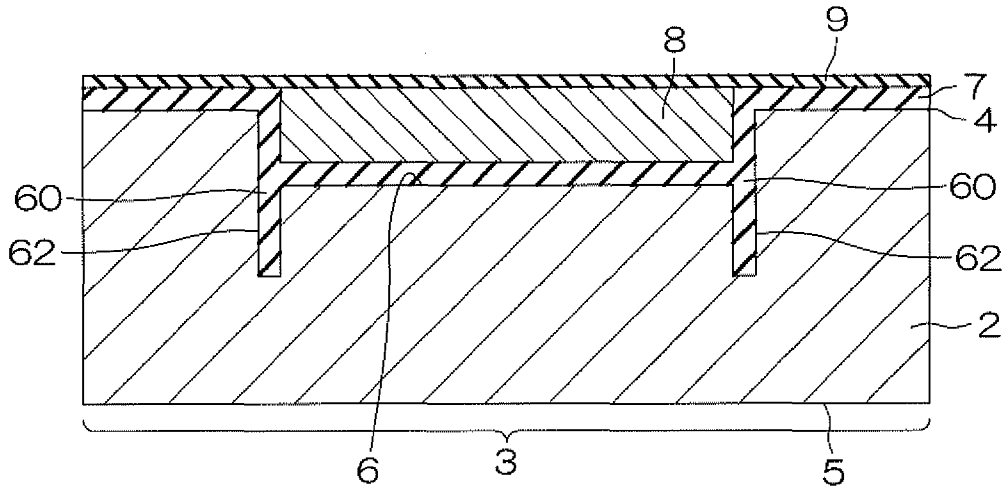
FIG. 23J( b )
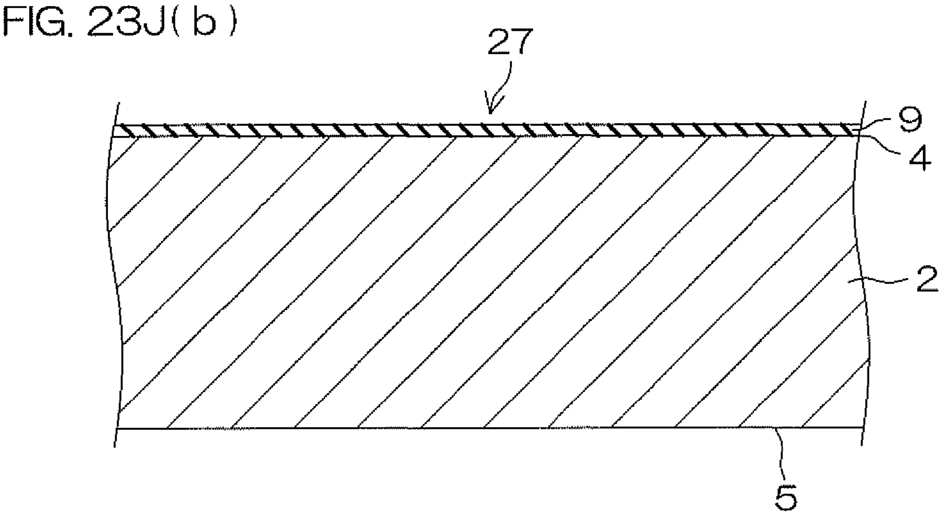

FIG. 23M( a )
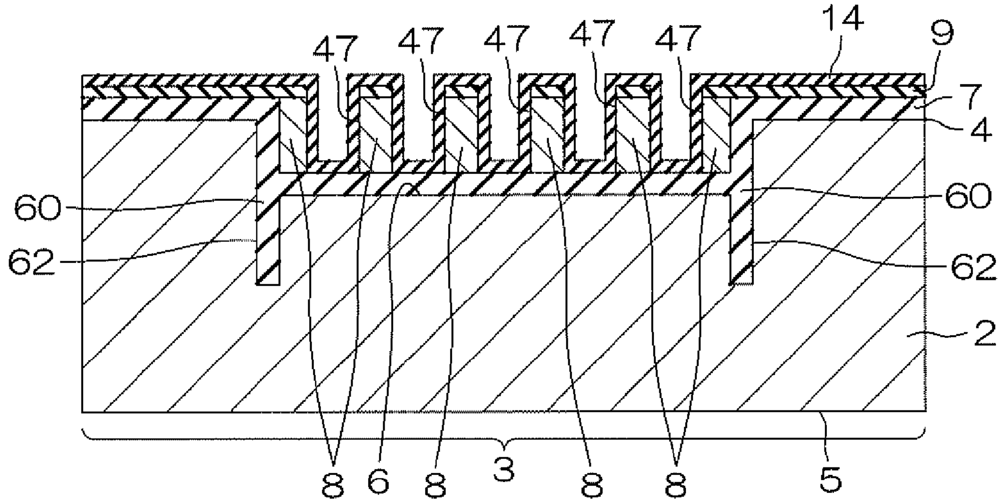
FIG. 23M( b )
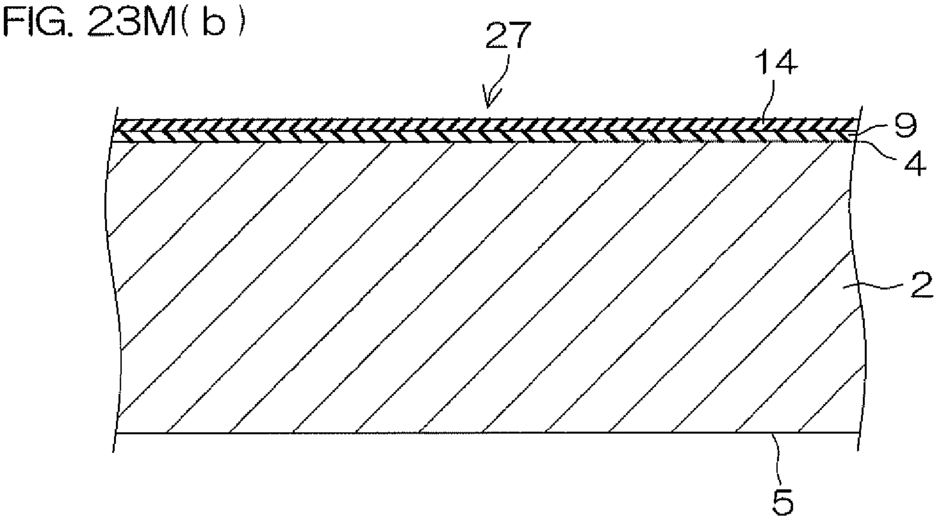

FIG. 23N( a )
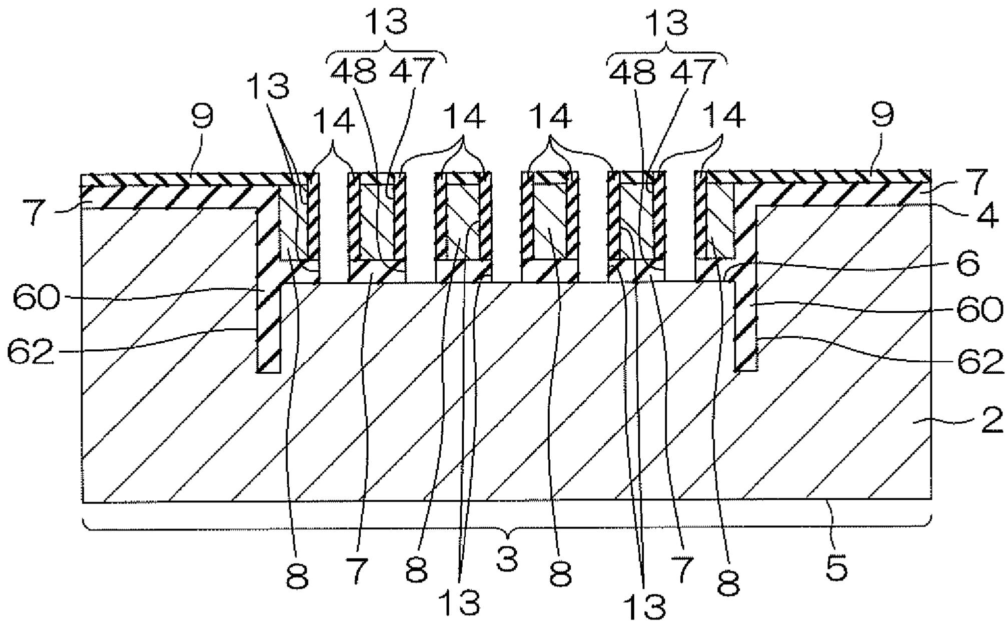
FIG. 23N( b )
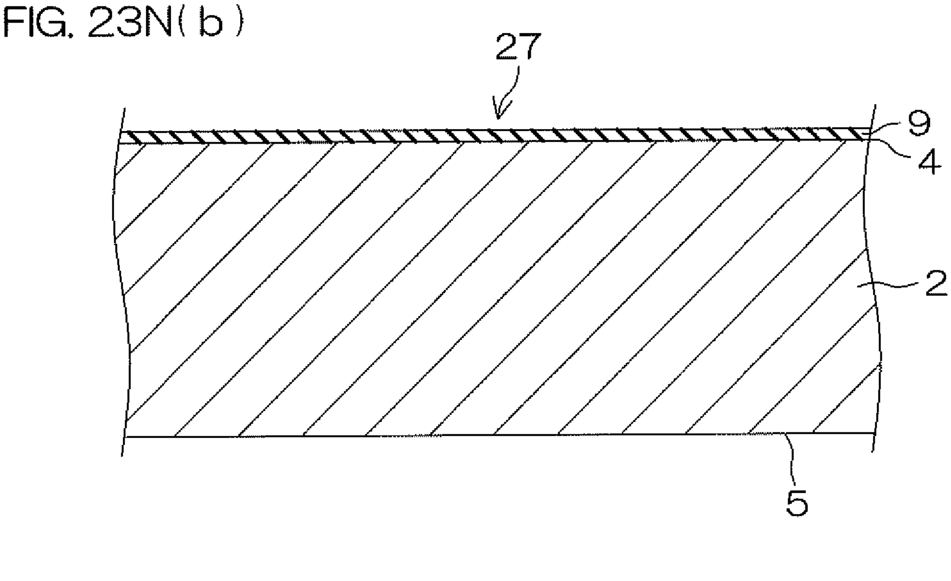

FIG. 25A( a )
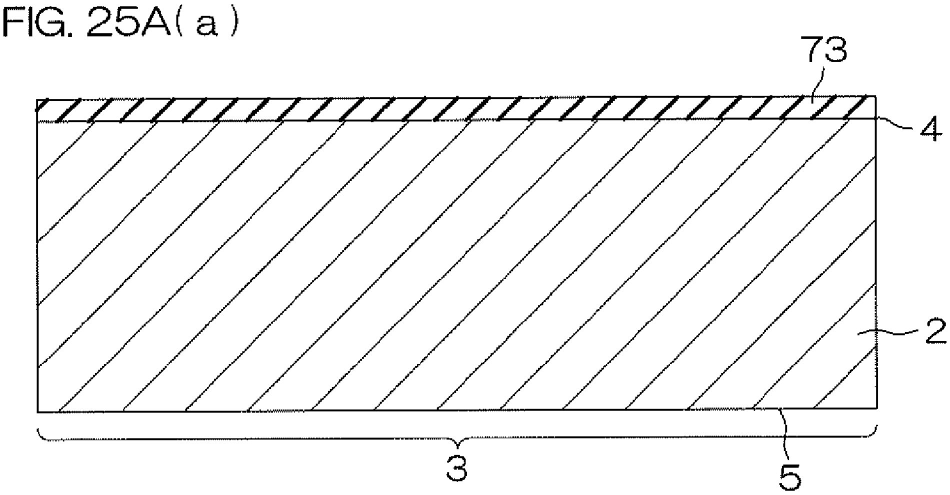
FIG. 25A( b )
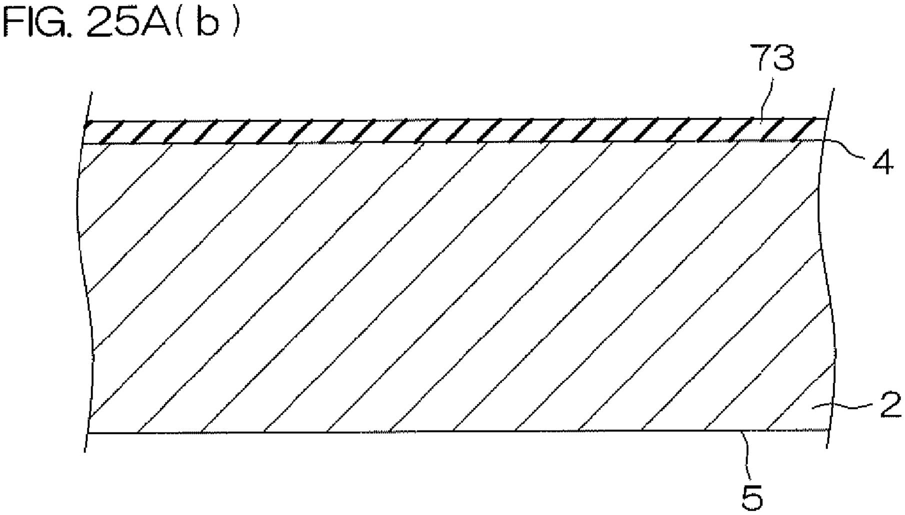

FIG. 25B( a )
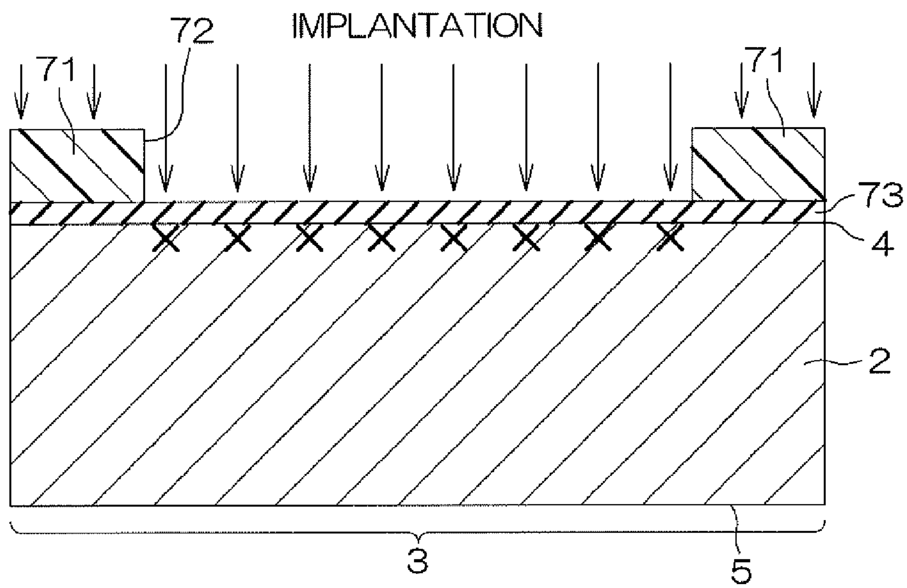
FIG. 25B( b )
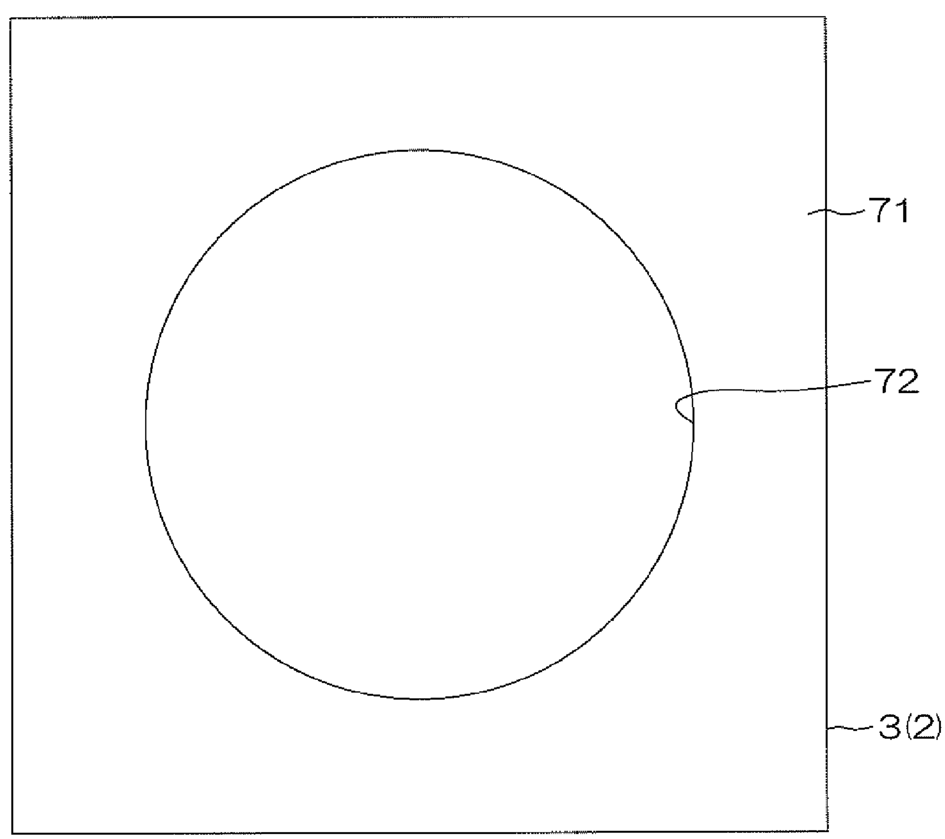

FIG. 25E( a )
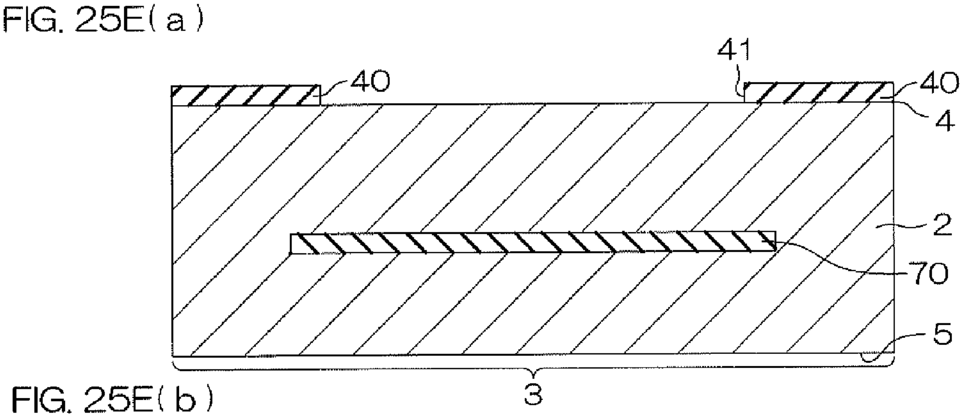
FIG. 25E( b )
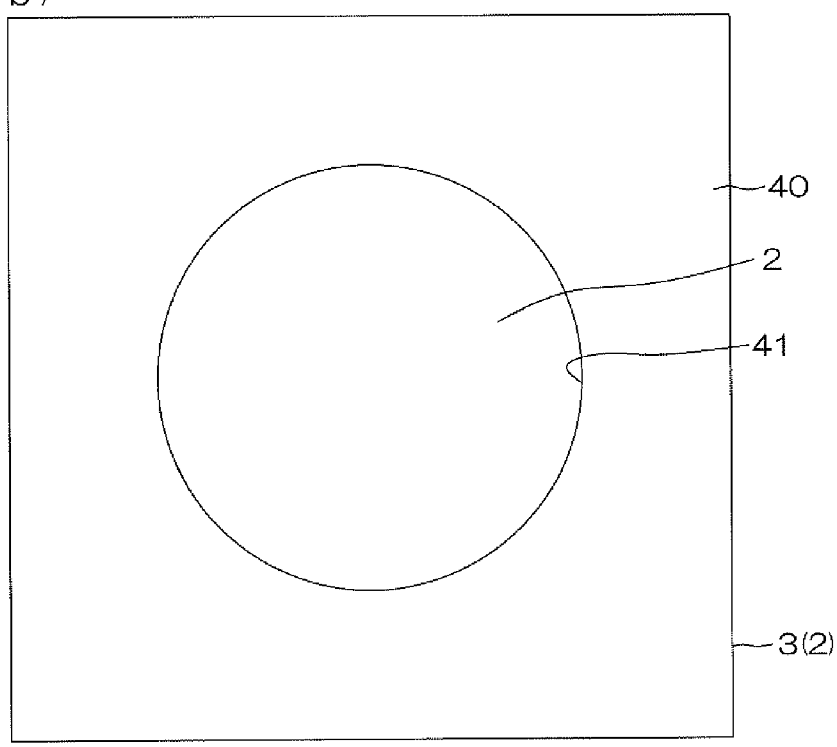
FIG. 25E( c )
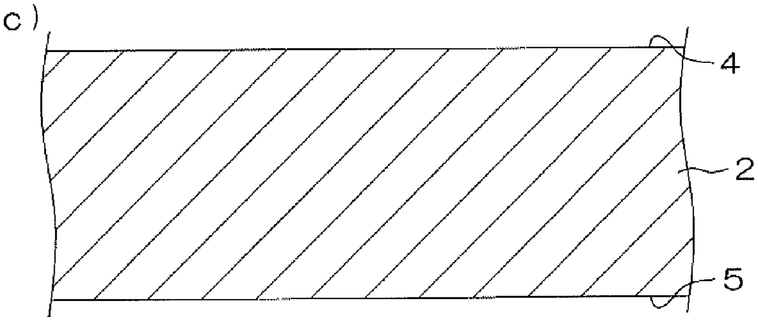

FIG. 25H( a )
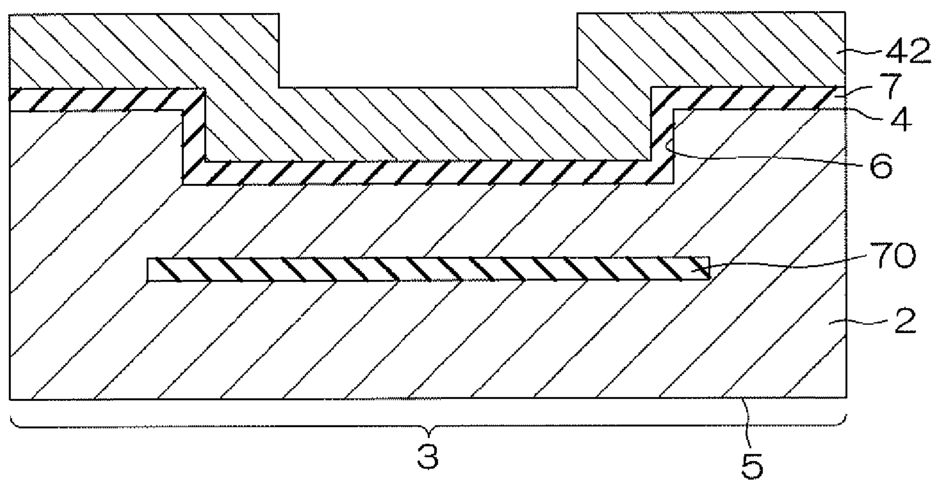
FIG. 25H( b )
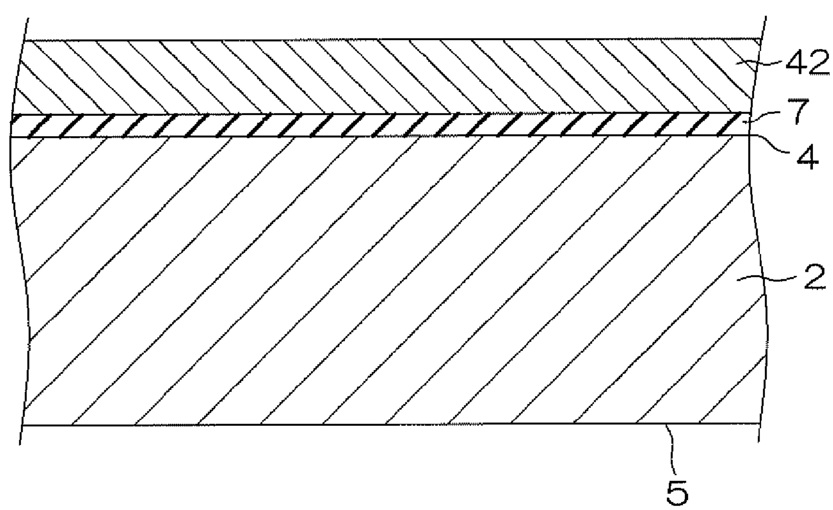

FIG. 25Q( a )
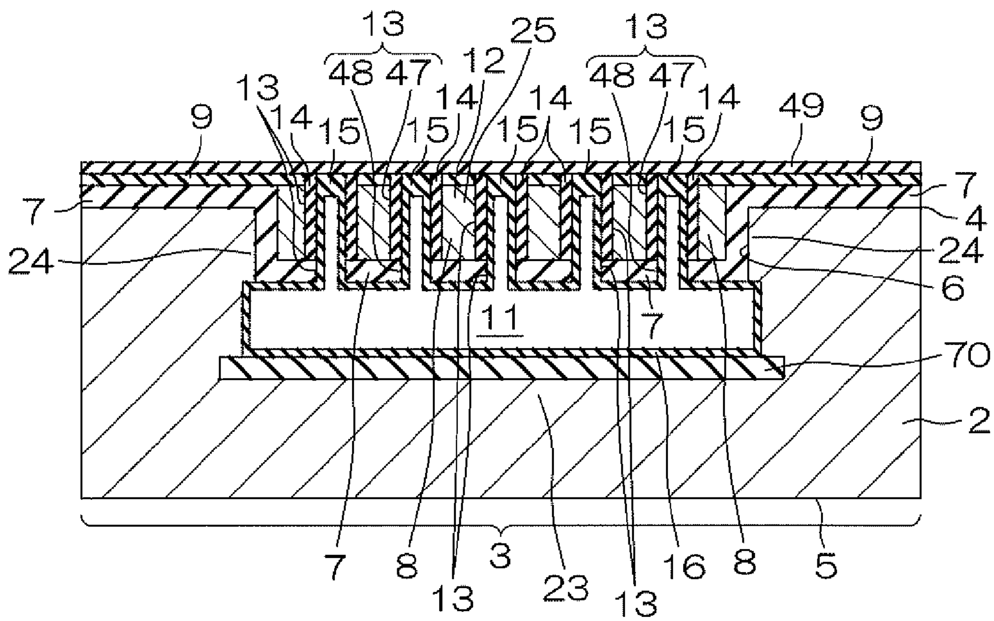
FIG. 25Q( b )
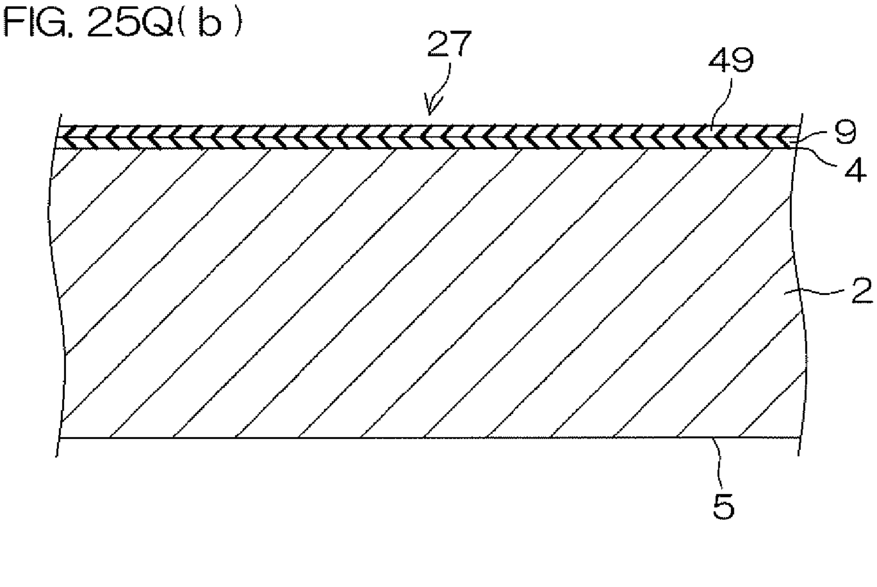

FIG. 27F( a )
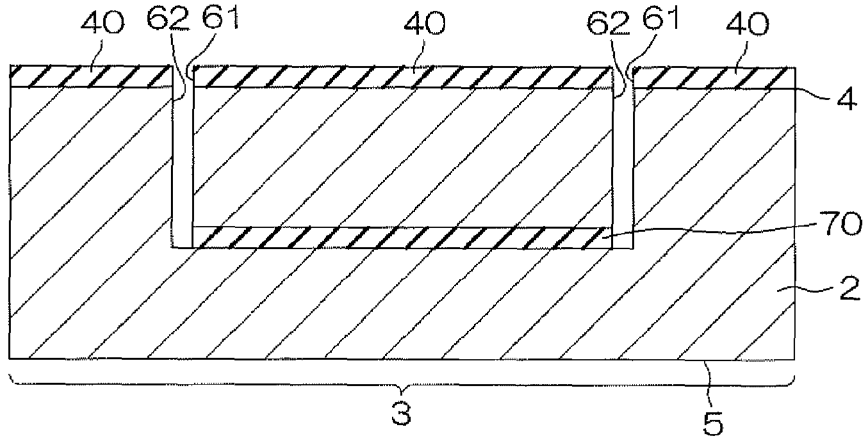
FIG. 27F( b )
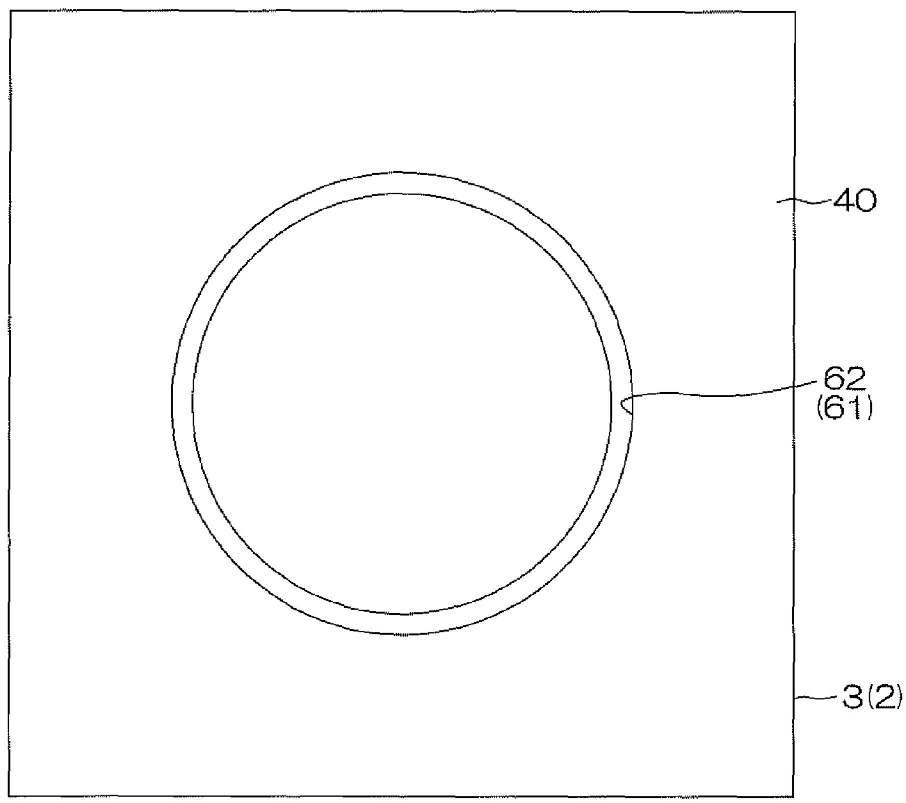

FIG. 27H( a )
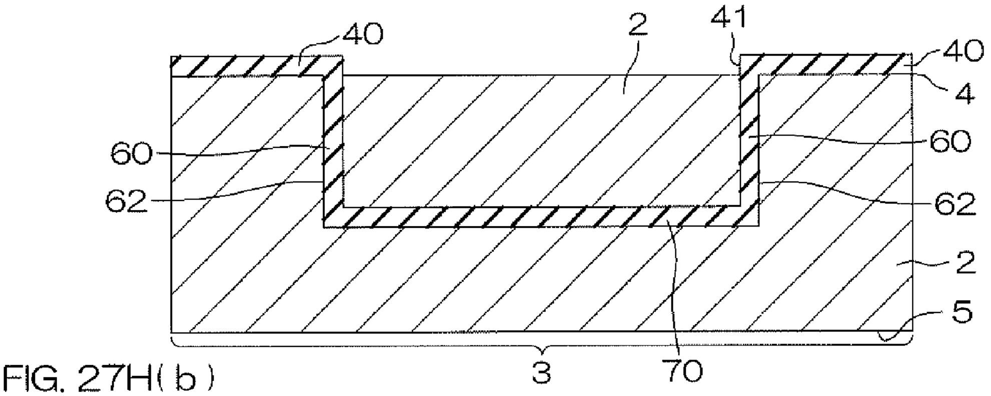
FIG. 27H( b )
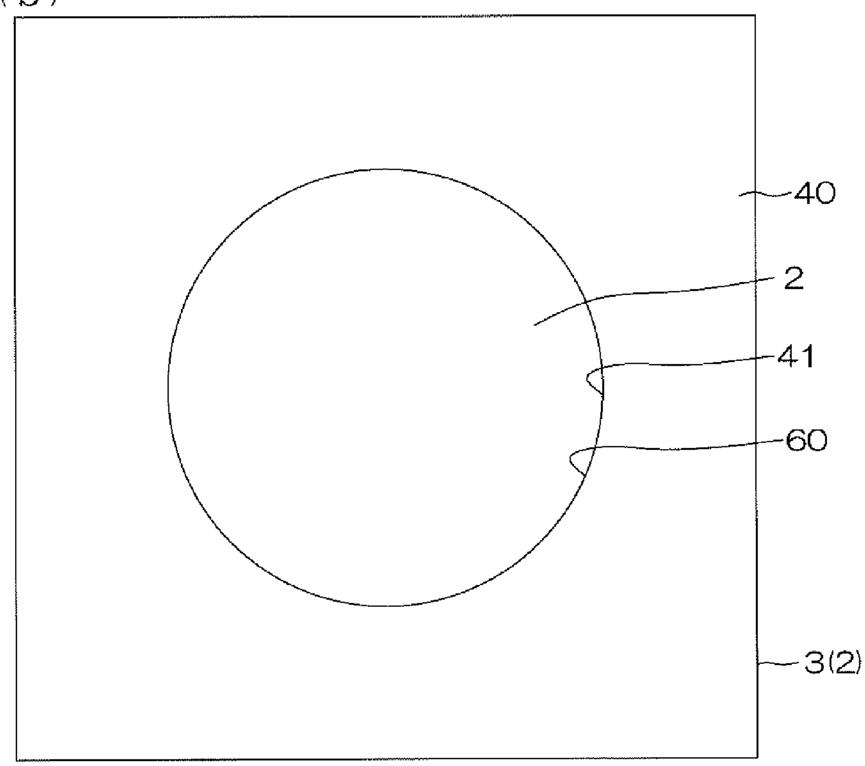
FIG. 27H( c )
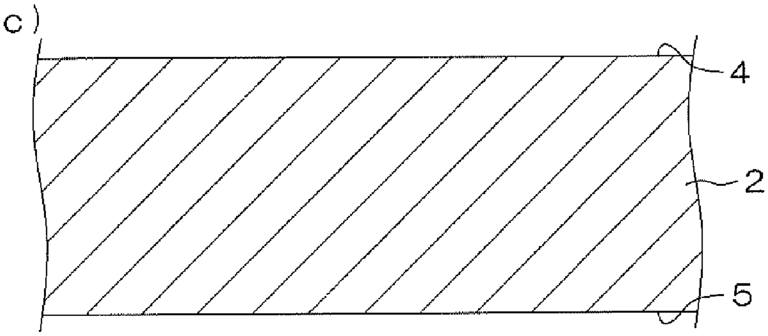

FIG. 27M( a )
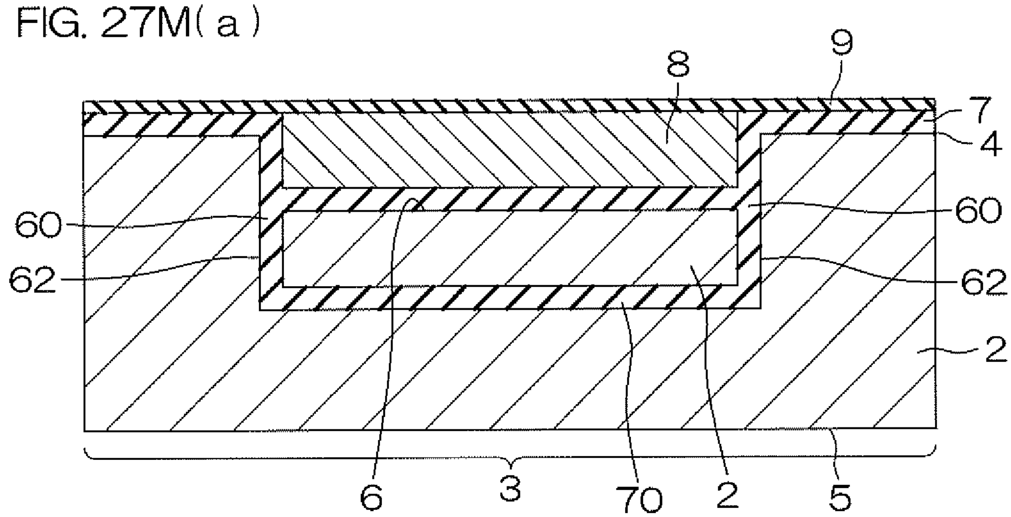
FIG. 27M( b )
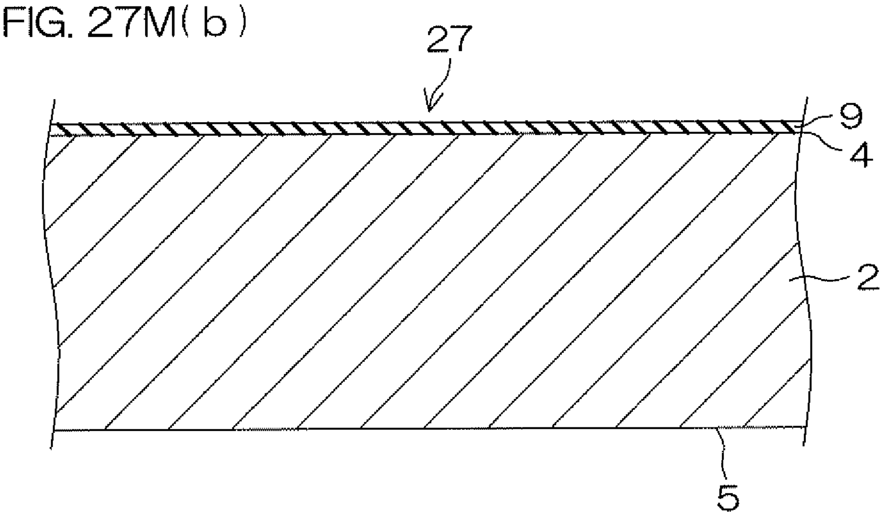

FIG. 27P( a )
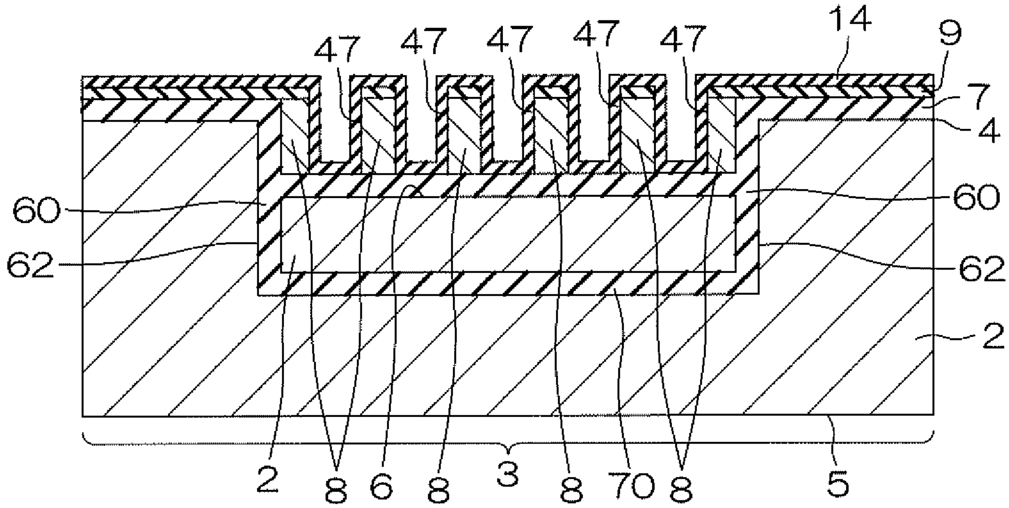
FIG. 27P( b )
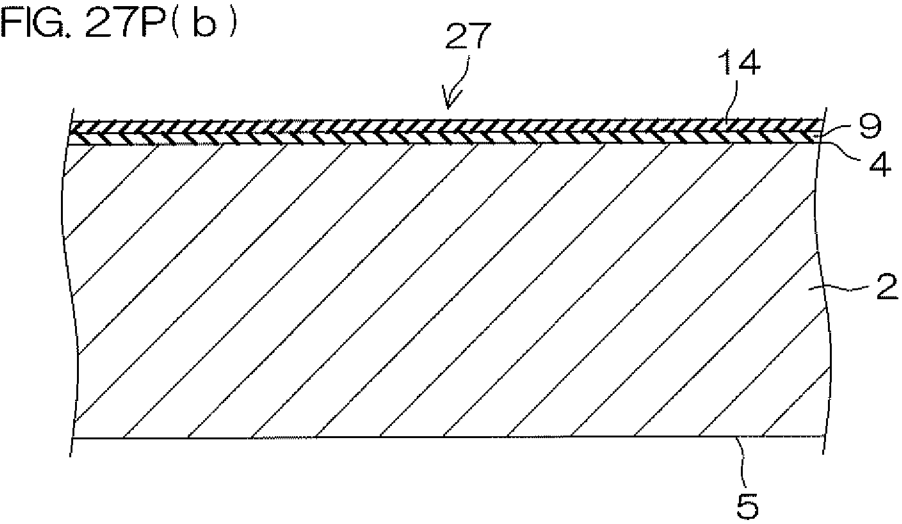

PRESSURE SENSOR AND METHOD FOR MANUFACTURING PRESSURE SENSOR

TECHNICAL FIELD

The present invention relates to a pressure sensor and a method for manufacturing the same. In particular, it relates to a capacitance pressure sensor and a method for manufacturing the same.

BACKGROUND ART

A pressure sensor manufactured according to the MEMS (Micro Electro Mechanical Systems) technique is employed for a pressure sensor or a pressure switch provided on an industrial machine or the like, for example.

Such a pressure sensor includes a diaphragm formed by partially thinly working a substrate as a pressure sensing portion, for example, and detects stress or displacement caused when the diaphragm is deformed by receiving pressure.

A pressure sensor formed by bonding two substrates to each other is known as such a pressure sensor, for example (refer to Patent Document 1, for example).

In order to manufacture the pressure sensor described in Patent Document 1, a LOCOS oxide film is first formed on a surface of a first substrate to surround a prescribed region, and a second substrate is bonded to a surface of the LOCOS oxide film. Thus, a space is formed between the two substrates in the prescribed region. Then, a surface of the first substrate opposite to a surface provided with the LOCOS oxide film is cut/polished until the LOCOS oxide film is exposed. As a result, a remaining portion of the first substrate surrounded by the LOCOS oxide film forms a diaphragm.

A piezoresistance pressure sensor is obtained by forming a piezoresistor on the diaphragm. A capacitance pressure sensor is obtained by forming electrodes on both of the first substrate (a diaphragm portion) and the second substrate (a portion opposed to the diaphragm portion).

CITATION LIST

Patent Literature

Patent Literature 1: Japanese Patent No. 2850558

SUMMARY OF INVENTION

Technical Problem

In the aforementioned prior art, two substrates are required in order to manufacture one pressure sensor, and hence the manufacturing cost increases. Further, the pressure sensor has a thickness close to the total thickness of the two substrates, and hence the volume of the overall pressure sensor enlarges.

In addition, the two substrates are so employed in order to manufacture one pressure sensor that the number of manufacturing steps for the pressure sensor increases. Particularly in the case of manufacturing the capacitance pressure sensor with the two substrates, electrodes must be formed on both of the first substrate having the diaphragm and the second substrate having the portion opposed to the diaphragm through the space.

An object of the present invention is to provide a pressure sensor capable of implementing cost reduction and miniaturization, particularly a capacitance pressure sensor.

Another object of the present invention is to provide a method for manufacturing a pressure sensor capable of simply manufacturing a low-cost and miniature pressure sensor.

Solution to Problem

In order to attain the aforementioned objects, a pressure sensor according to the present invention includes a substrate provided therein with a reference pressure chamber, a diaphragm, consisting of part of the substrate, formed on a surface layer portion (an in-substrate region around a surface) of the substrate to partition the reference pressure chamber and provided with a through-hole communicating with the reference pressure chamber, an etching stop layer formed on a surface of the diaphragm facing the reference pressure chamber, and an embedding material arranged in the through-hole.

According to the structure, the reference pressure chamber (a space) is formed in the single substrate, while the diaphragm is formed by part of the substrate. Therefore, the reference pressure chamber and the diaphragm may not be formed by bonding two substrates to each other, whereby the cost can be reduced.

Further, the pressure sensor is constituted of one substrate, whereby the pressure sensor can be miniaturized as compared with a case of constituting the pressure sensor by bonding two substrates to each other.

In addition, the through-hole communicating with the reference pressure chamber in the diaphragm partitioning the reference pressure chamber is filled up with the embedding material, whereby the reference pressure chamber can be sealed. Thus, when pressure in the reference pressure chamber is set to reference pressure, pressure received by the diaphragm can be detected as relative pressure with respect to the reference pressure.

The reference pressure chamber can be formed by isotropic etching performed by introducing an etchant from the through-hole. At this time, the etching stop layer formed on the surface of the diaphragm facing the reference pressure chamber prevents etching of a substrate material constituting the diaphragm. Thus, the diaphragm is not unnecessarily etched by the etchant in the reference pressure chamber, whereby the thickness of the diaphragm can be correctly set to a target thickness. In the pressure sensor, therefore, improvement of sensitivity can be attained while dispersion in sensitivity can be suppressed.

Preferably, the pressure sensor further includes a piezoresistor formed on a surface of the diaphragm opposite to the surface facing the reference pressure chamber. Thus, a piezoresistance pressure sensor detecting strain resulting from pressure received by the diaphragm as resistance value change of the piezoresistor can be constituted.

Preferably, the pressure sensor further includes a separation layer surrounding the diaphragm and separating the diaphragm from another portion of the substrate. Thus, the diaphragm is partitioned by the separation layer, whereby the diaphragm can be precisely formed in target dimensions. In the pressure sensor, therefore, improvement of sensitivity can be attained, and dispersion in sensitivity can be suppressed.

Preferably, the separation layer extends in the substrate up to a position deeper than a bottom surface of the reference pressure chamber. Thus, not only the diaphragm but also the reference pressure chamber is partitioned by the separation layer, whereby both of the diaphragm and the reference pressure layer can be precisely formed in target dimensions.

Preferably, the pressure sensor further includes a second etching stop layer formed on a bottom surface opposed to the etching stop layer in an inner wall surface of the reference pressure chamber. Thus, the reference pressure chamber is held and partitioned by the etching stop layer and the second etching stop layer in the thickness direction of the substrate, whereby the reference pressure chamber can be precisely formed in target dimensions.

Preferably, the pressure sensor further includes a sidewall layer, cylindrically formed to cover a sidewall of the through-hole, protruding into the reference pressure chamber from the etching stop layer. Thus, when the diaphragm having the through-hole remarkably warps toward the side of the reference pressure chamber, the sidewall layer comes into contact with an inner wall surface of the reference pressure chamber, to regulate excess deformation of the diaphragm. Therefore, damage of the diaphragm can be prevented.

Preferably, the pressure sensor further includes an integrated circuit portion having an integrated circuit device formed on the substrate. Thus, the pressure sensor and the integrated circuit portion can be formed on the same substrate.

A method for manufacturing a pressure sensor according to the present invention includes a step of forming an etching stop layer on a position of a prescribed depth from a surface of a substrate, a step of forming a through-hole of a depth passing through the etching stop layer from the surface of the substrate, an etching step of forming a reference pressure chamber under the etching stop layer and forming a diaphragm on the etching stop layer by introducing an etchant into the through-hole and etching a substrate material under the etching stop layer, and a step of arranging an embedding material in the through-hole.

According to the method, the pressure sensor of the aforementioned structure is obtained. According to the method, the substrate material is so etched by the etchant introduced into the through-hole that the reference pressure chamber is formed under the etching stop layer. On the other hand, the diaphragm is formed on the etching stop layer. At this time, the diaphragm is cut off from the etchant in the reference pressure chamber by the etching stop layer. Thus, the diaphragm is not eroded by the etchant for forming the reference pressure chamber, whereby the thickness of the diaphragm can be precisely set to a target thickness. Therefore, a pressure sensor capable of attaining improvement of sensitivity and capable of suppressing dispersion in sensitivity can be simply manufactured.

According to the method, the reference pressure chamber and the diaphragm can be formed through a small number of steps employing only one substrate without bonding two substrates to each other, whereby a low-cost and miniature pressure sensor can be simply manufactured.

Further, the reference pressure chamber under the etching stop layer can be sealed by arranging the embedding material in the through-hole. Thus, pressure in the reference pressure chamber is so set to reference pressure that the completed pressure sensor can detect pressure received by the diaphragm as relative pressure with respect to the reference pressure.

Preferably, the step of forming the etching stop layer includes an ion implantation step of implanting nitrogen ions or oxygen ions into the substrate and a heat treatment step of performing heat treatment on the substrate after the ion implantation step. The nitrogen ions or the oxygen ions implanted into the substrate are activated by the heat treatment step, whereby the etching stop layer consisting of a nitride film or an oxide film can be formed on the position of the prescribed depth from the surface of the substrate.

Preferably, the heat treatment step includes a step of epitaxially growing a semiconductor layer on the surface of the substrate after the ion implantation step. In this case, the etching stop layer is arranged under the semiconductor layer after the heat treatment step, whereby the same is reliably formed on the position of the prescribed depth from the surface of the substrate. Further, the substrate is so heated at the time of the epitaxial growth that the nitrogen ions or the oxygen ions are simultaneously activated, whereby no heat treatment for ion activation may be separately performed.

Preferably, the method for manufacturing a pressure sensor according to the present invention further includes a step of forming a piezoresistor on a surface of the diaphragm opposite to a surface facing the reference pressure chamber. Thus, a piezoresistance pressure sensor detecting strain resulting from pressure received by the diaphragm by resistance value change of the piezoresistor is obtained.

Preferably, the method for manufacturing a pressure sensor according to the present invention further includes a trench forming step of forming an annular trench surrounding a region of the surface of the substrate where the through-hole is planned to be formed to be deeper than a portion of the substrate planned to become a bottom surface of the reference pressure chamber before the etching step, and a trench embedding step of embedding an isolation layer in the annular trench.

Thus, the diaphragm and the reference pressure chamber are formed to be partitioned by the isolation film in the etching step, whereby the diaphragm can be precisely formed in target dimensions. Therefore, a pressure sensor capable of attaining improvement of sensitivity and capable of suppressing dispersion in sensitivity can be manufactured. Further, the etching of the reference pressure chamber stops on the isolation layer, whereby not only the diaphragm but also the reference pressure chamber can be precisely formed in target dimensions.

Preferably, the method for manufacturing a pressure sensor according to the present invention further includes a step of forming a second etching stop layer on a position of a depth planned to be provided with the bottom surface of the reference pressure chamber in the substrate before the step of forming the through-hole in the substrate. Thus, the reference pressure chamber is formed to be partitioned by the etching stop layer and the second etching stop layer in the thickness direction of the substrate in the etching step, whereby the reference pressure chamber can be precisely formed in target dimensions.

Preferably, the etching step further includes a step of forming a sidewall insulating layer on a sidewall of the through-hole, and a step of isotropically etching the material for the substrate by introducing an etchant into the through-hole.

The sidewall insulating layer is previously formed on the sidewall of the through-hole, whereby the etchant introduced into the through-hole can be prevented from etching the sidewall of the through-hole (a diaphragm portion).

When isotropically etching the material for the substrate on a lower end side of the through-hole, the sidewall insulating layer protrudes into the reference pressure chamber from the etching stop layer. Thus, when the diaphragm on the etching stop layer remarkably warps toward the side of the reference pressure chamber, the sidewall insulating layer comes into contact with an inner wall surface of the reference pressure chamber, to regulate excess deformation of the diaphragm. Therefore, damage of the diaphragm can be prevented.

Preferably, the method for manufacturing a pressure sensor according to the present invention further includes a step of forming an integrated circuit device on a region of the substrate other than a region where the reference pressure chamber is formed. Thus, the pressure sensor and an integrated circuit portion can be formed on the same substrate. As to a pressure sensor portion and the integrated circuit portion, at least partial manufacturing steps are preferably shared. For example, a contact hole forming step and a wiring step may be simultaneously carried out on the pressure sensor portion and the integrated circuit portion.

A capacitance pressure sensor according to the present invention includes a semiconductor substrate provided therein with a reference pressure chamber, a diaphragm, consisting of part of the substrate, formed on a surface layer portion (an in-substrate region around a surface) of the substrate to partition the reference pressure chamber and provided with a through-hole communicating with the reference pressure chamber, an etching stop layer formed on at least either one of a ceiling surface which is a surface of the diaphragm opposed to the reference pressure chamber and a bottom surface opposed to the ceiling surface in inner wall surfaces of the reference pressure chamber, an embedding material arranged in the through-hole, and an isolation layer surrounding the diaphragm and isolating the diaphragm from another portion of the semiconductor substrate.

According to the structure, the reference pressure chamber (a space) is formed in one semiconductor substrate, and the diaphragm is formed by part of the semiconductor substrate. Therefore, the reference pressure chamber and the diaphragm may not be formed by bonding two substrates to each other, whereby the cost can be reduced.

Further, the capacitance pressure sensor is constituted of one substrate, whereby the capacitance pressure sensor can be miniaturized as compared with a case of constituting the capacitance pressure sensor by bonding two substrates to each other.

In addition, the through-hole communicating with the reference pressure chamber in the diaphragm partitioning the reference pressure chamber is filled up with the embedding material, whereby the reference pressure chamber can be sealed. Thus, when pressure in the reference pressure chamber is set to reference pressure, pressure received by the diaphragm can be detected as relative pressure with respect to the reference pressure. More specifically, the diaphragm is deformed in response to difference between pressure on the side of the reference pressure chamber and pressure on a side opposite to the reference pressure chamber. Thus, the distance between the diaphragm and a bottom surface of the reference pressure chamber changes. As a result, capacitance between the diaphragm and the bottom surface of the reference pressure chamber changes. The pressure received by the diaphragm can be detected by detecting the capacitance.

The reference pressure chamber can be formed by isotropic etching performed by introducing an etchant from the through-hole. At this time, the etching stop layer is formed on at least one of the ceiling surface and the bottom surface in the inner wall surfaces of the reference pressure chamber, whereby the reference pressure chamber is partitioned by the etching stop layer when forming the reference pressure chamber. Thus, the reference pressure chamber can be formed in target dimensions. Therefore, the capacitance pressure sensor can attain improvement of sensitivity and can suppress dispersion in sensitivity.

The isolation layer surrounds the diaphragm, and isolates the diaphragm from other portions of the semiconductor substrate. Thus, the diaphragm and other portions of the semiconductor substrate are insulated, whereby a capacitor structure can be formed by the diaphragm and the semiconductor substrate of the portion partitioning the bottom surface of the reference pressure chamber. Further, the diaphragm is partitioned by the isolation layer, whereby the diaphragm can be formed in target dimensions. Thus, improvement of the sensitivity of the capacitance pressure sensor can be attained, and dispersion in sensitivity can be suppressed.

Preferably, the etching stop layer is an insulating layer. Thus, capacitance between the diaphragm and the bottom surface of the reference pressure chamber can be enlarged, whereby the sensitivity can be increased.

Preferably, the capacitance pressure sensor further includes a first wire connected to the diaphragm, and a second wire connected to a portion of the semiconductor substrate insulated from the diaphragm by the isolation layer. Thus, a capacitance pressure sensor of a simple structure employing the respective ones of the portion and the diaphragm on the same semiconductor substrate as electrodes can be provided.

Preferably, the isolation layer extends in the semiconductor substrate up to a position deeper than a bottom surface of the reference pressure chamber. Thus, not only the diaphragm but also the reference pressure chamber is partitioned by the isolation layer, whereby both of the diaphragm and the reference pressure chamber can be formed in target dimensions. In other words, dimensions of the portion (the portion partitioning the bottom surface of the reference pressure chamber) of the semiconductor substrate opposed to the diaphragm are correctly settled. Therefore, capacitance of a capacitor structure formed by the diaphragm and a bottom surface portion of the reference pressure chamber can be precisely controlled to a design value. Thus, dispersion in sensitivity of the capacitance pressure sensor can be suppressed.

Preferably, the capacitance pressure sensor further includes a sidewall insulating layer, cylindrically formed to cover a sidewall of the through-hole, protruding into the reference pressure chamber from the diaphragm. Thus, when the diaphragm having the through-hole remarkably warps toward the side of the reference pressure chamber, the sidewall insulating layer comes into contact with an inner wall surface of the reference pressure chamber, to regulate excess deformation of the diaphragm. Therefore, damage of the diaphragm can be prevented.

Preferably, the capacitance pressure sensor further includes an integrated circuit portion having an integrated circuit device formed on the semiconductor substrate. Thus, the capacitance pressure sensor and the integrated circuit portion can be formed on the same semiconductor substrate.

A method for manufacturing a capacitance pressure sensor according to the present invention includes a step of forming a first etching stop layer on a position of a prescribed depth from a surface of a semiconductor substrate, a trench forming step of forming an annular trench surrounding a prescribed region of the semiconductor substrate above the first etching stop layer to be deeper than the first etching stop layer, a trench embedding step of embedding an isolation layer in the annular trench, a step of forming a hole of a depth passing through the first etching stop layer from the surface of the semiconductor substrate, an etching step of forming a reference pressure chamber under the first etching stop layer and forming a diaphragm on the first etching stop layer by introducing an etchant into the hole and etching a substrate material under the first etching stop layer, and a step of arranging an embedding material in the hole.

According to the method, the capacitance pressure sensor of the aforementioned structure is obtained. According to the method, the substrate material is so etched by the etchant introduced into the hole passing through the first etching stop layer that the reference pressure chamber is formed under the etching stop layer on the semiconductor substrate. On the other hand, the diaphragm is formed on the first etching stop layer.

At this time, the diaphragm is cut off from the etchant in the reference pressure chamber by the first etching stop layer. Thus, the diaphragm is not eroded by the etchant for forming the reference pressure chamber, whereby the thickness of the diaphragm can be precisely set to a target thickness.

At this time, the isolation layer embedded in the annular trench formed to be deeper than the first etching stop layer surrounds the diaphragm present on the prescribed region above the first etching stop layer. Thus, the diaphragm is partitioned by the isolation layer, whereby the diaphragm can be precisely formed in target dimensions. Further, the isolation layer so isolates the diaphragm from other portions of the semiconductor substrate that the diaphragm and the portions are insulated, whereby a capacitor structure can be formed by the diaphragm and the semiconductor substrate of the portion partitioning a bottom surface of the reference pressure chamber.

Further, a top surface of the reference pressure chamber is partitioned by the first etching stop layer, whereby the reference pressure chamber can be precisely formed in target dimensions.

Thus, a capacitance pressure sensor capable of attaining improvement of sensitivity and capable of suppressing dispersion in sensitivity can be simply manufactured.

According to the method, further, the reference pressure chamber and the diaphragm can be formed through a small number of steps employing only one semiconductor substrate without bonding two semiconductor substrates to each other, whereby a low-cost and miniature capacitance pressure sensor can be simply manufactured.

The embedding material is so arranged in the hole that the reference pressure chamber under the first etching stop layer can be sealed. Thus, pressure in the reference pressure chamber is so set to reference pressure that the completed capacitance pressure sensor can detect pressure received by the diaphragm as relative pressure with respect to the reference pressure. More specifically, the diaphragm is deformed in response to difference between pressure on the side of the reference pressure chamber and pressure on a side opposite to the reference pressure chamber. Thus, the distance between the diaphragm and the bottom surface of the reference pressure chamber changes. As a result, capacitance between the diaphragm and the bottom surface of the reference pressure chamber changes. The pressure received by the diaphragm can be detected by detecting the capacitance.

Another method for manufacturing a capacitance pressure sensor according to the present invention includes a step of forming a first etching stop layer on a position of a prescribed depth from a surface of a semiconductor substrate, a step of forming a second etching stop layer on a position of the semiconductor substrate deeper than the first etching stop layer, a trench forming step of forming an annular trench surrounding a prescribed region of the semiconductor substrate above the first etching stop layer to be deeper than the first etching stop layer, a trench embedding step of embedding an isolation layer in the annular trench, a step of forming a hole passing through the first etching stop layer from the surface of the semiconductor substrate and having a bottom surface on a depth position between the first etching stop layer and the second etching stop layer, an etching step of forming a reference pressure chamber between the first etching stop layer and the second etching stop layer and forming a diaphragm on the first etching stop layer by introducing an etchant into the hole and etching a substrate material under the first etching stop layer, and a step of arranging an embedding material in the hole.

According to the method, a capacitance pressure sensor of the aforementioned structure is obtained. According to the method, the substrate material is etched by the etchant introduced into the hole passing through the first etching stop layer between the first etching stop layer and the second etching stop layer in the semiconductor substrate, whereby the reference pressure chamber is formed. On the other hand, the diaphragm is formed on the first etching stop layer.

At this time, the diaphragm is cut off from the etchant in the reference pressure chamber by the first etching stop layer. Thus, the diaphragm is not eroded by the etchant for forming the reference pressure chamber, whereby the thickness of the diaphragm can be precisely set to a target thickness.

At this time, the isolation layer embedded in the annular trench formed to be deeper than the first etching stop layer surrounds the diaphragm present on the prescribed region above the first etching stop layer. Thus, the diaphragm is partitioned by the isolation layer, whereby the diaphragm can be precisely formed in target dimensions. Further, the isolation layer so isolates the diaphragm from other portions of the semiconductor substrate that the diaphragm and the portions are insulated, whereby a capacitor structure can be formed by the diaphragm and the semiconductor substrate of the portion partitioning a bottom surface of the reference pressure chamber.

At this time, further, the reference pressure chamber is held and partitioned by the first etching stop layer and the second etching stop layer, whereby the reference pressure layer can be precisely formed in target dimensions.

Thus, a capacitance pressure sensor capable of attaining improvement of sensitivity and capable of suppressing dispersion in sensitivity can be simply manufactured.

According to the method, the reference pressure chamber and the diaphragm can be formed through a small number of steps employing only one semiconductor substrate without bonding two semiconductor substrates to each other, whereby a low-cost and miniature capacitance pressure sensor can be simply manufactured.

Further, the reference pressure chamber under the first etching stop layer can be sealed by arranging the embedding material in the through-hole. Thus, pressure in the reference pressure chamber is so set to reference pressure that the completed capacitance pressure sensor can detect pressure received by the diaphragm as relative pressure with respect to the reference pressure. More specifically, the diaphragm is deformed in response to difference between pressure on the side of the reference pressure chamber and pressure on a side opposite to the reference pressure chamber. Thus, the distance between the diaphragm and the bottom surface of the reference pressure chamber changes. As a result, capacitance between the diaphragm and the bottom surface of the reference pressure chamber changes. The pressure received by the diaphragm can be detected by detecting the capacitance.

Still another method for manufacturing a capacitance pressure sensor according to the present invention includes a step of forming a second etching stop layer on a position of a prescribed depth from a surface of a semiconductor substrate, a trench forming step of forming an annular trench surrounding a prescribed region of the semiconductor substrate above the second etching stop layer, a trench embedding step of embedding an isolation layer in the annular trench, a step of forming a hole shallower than the second etching stop layer from the surface of the semiconductor layer, an etching step of forming a reference pressure chamber on the second etching stop layer and forming a diaphragm above the reference pressure chamber by introducing an etchant into the hole and etching a substrate material under the hole, and a step of arranging an embedding material in the hole.

According to the method, a capacitance pressure sensor of the aforementioned structure is obtained. According to the method, the substrate material under the hole is etched by the etchant introduced into the hole shallower than the second etching stop layer on the semiconductor substrate, whereby the reference pressure chamber is formed on the second etching stop layer. On the other hand, the diaphragm is formed on the reference pressure chamber.

At this time, a bottom of the reference pressure chamber is partitioned by the second etching stop layer, whereby the reference pressure chamber can be precisely formed in target dimensions.

At this time, further, the isolation layer embedded in the annular trench surrounds the diaphragm present on the prescribed region above the second etching stop layer. Thus, the diaphragm is partitioned by the isolation layer, whereby the diaphragm can be precisely formed in target dimensions. Further, the isolation layer so isolates the diaphragm from other portions of the semiconductor substrate that the diaphragm and the portions are insulated, whereby a capacitor structure can be formed by the diaphragm and the semiconductor substrate of the portion partitioning the diaphragm and the bottom surface of the reference pressure chamber.

Thus, a capacitance pressure sensor capable of attaining improvement of sensitivity and capable of suppressing dispersion in sensitivity can be simply manufactured.

According to the method, the reference pressure chamber and the diaphragm can be formed through a small number of steps employing only one semiconductor substrate without bonding two semiconductor substrates to each other, whereby a low-cost and miniature capacitance pressure sensor can be simply manufactured.

Further, the reference pressure chamber under the hole can be sealed by arranging the embedding material in the hole. Thus, pressure in the reference pressure chamber is so set to reference pressure that the completed capacitance pressure sensor can detect pressure received by the diaphragm as relative pressure with respect to the reference pressure. More specifically, the diaphragm is deformed in response to difference between pressure on the side of the reference pressure chamber and pressure on a side opposite to the reference pressure chamber. Thus, the distance between the diaphragm and the bottom surface of the reference pressure chamber changes. As a result, capacitance between the diaphragm and the bottom surface of the reference pressure chamber changes. The pressure received by the diaphragm can be detected by detecting the capacitance.

Preferably, the step of forming the etching stop layer includes an ion implantation step of implanting nitrogen ions or oxygen ions into the semiconductor substrate and a heat treatment step of performing heat treatment on the semiconductor substrate after the ion implantation step. The nitrogen ions or the oxygen ions implanted into the substrate are activated by the heat treatment step, whereby the etching stop layer consisting of a nitride film or an oxide film can be formed on the position of the prescribed depth from the surface of the substrate.

Preferably, the method for manufacturing a capacitance pressure sensor according to the present invention further includes a step of connecting a first wire to the diaphragm, and a step of connecting a second wire to a portion of the semiconductor substrate insulated from the diaphragm by the isolation layer. Thus, a capacitance pressure sensor of a simple structure employing the respective ones of the portion and the diaphragm on the same semiconductor substrate as electrodes can be simply manufactured.

Preferably, the etching step further includes a step of forming a sidewall insulating layer on a sidewall of the hole, and a step of isotropically etching the material for the semiconductor substrate by introducing an etchant into the hole.

The sidewall insulating layer is previously formed on the sidewall of the hole, whereby the etchant introduced into the hole can be prevented from etching the sidewall of the hole (a diaphragm portion).

When isotropically etching the material for the semiconductor substrate on a lower end side of the hole, the sidewall insulating layer protrudes into the reference pressure chamber from the diaphragm. Thus, when the diaphragm remarkably warps toward the side of the reference pressure chamber, the sidewall insulating layer comes into contact with an inner wall surface of the reference pressure chamber, to regulate excess deformation of the diaphragm. Therefore, damage of the diaphragm can be prevented.

Preferably, the method for manufacturing a capacitance pressure sensor according to the present invention further includes a step of forming an integrated circuit device on a region of the semiconductor substrate other than a region where the reference pressure chamber is formed. Thus, the capacitance pressure sensor and an integrated circuit portion can be formed on the same substrate. As to a pressure sensor portion and the integrated circuit portion, at least partial manufacturing steps are preferably shared. For example, a contact hole forming step and a wiring step are simultaneously carried out on the pressure sensor portion and the integrated circuit portion.

A further method for manufacturing a capacitance pressure sensor according to the present invention includes a step of forming a recess portion on a semiconductor substrate, a step of forming an insulating layer on an inner wall surface of the recess portion, a step of embedding a conductor layer in the recess portion, a step of forming a through-hole passing through the conductor layer and the insulating layer from a surface of the conductor layer, a step of forming a reference pressure chamber under the insulating layer by introducing an etchant into the through-hole, and an embedding step of embedding an embedding material in the through-hole.

According to the method, the insulating layer is formed on the inner wall surface of the recess portion formed on the semiconductor substrate and the conductor layer is embedded in the recess portion, whereby the conductor layer and the semiconductor substrate can be insulated by the insulating layer. The etchant is introduced into the through-hole passing through the conductor layer and the insulating layer, whereby the reference pressure chamber is formed under the insulating layer. On the other hand, the conductor layer in the recess portion becomes a diaphragm deformed in response to pressure fluctuation.

Therefore, the reference pressure chamber and the diaphragm can be formed through a small number of steps employing only one semiconductor substrate without bonding two semiconductor substrates to each other, whereby a low-cost and miniature capacitance pressure sensor can be simply manufactured.

The diaphragm and the semiconductor substrate are insulated by the insulating layer so that the diaphragm is not eroded by the etchant etching the substrate material under the insulating layer, whereby the thickness of the diaphragm can be precisely formed in target dimensions. Therefore, a capacitance pressure sensor capable of attaining improvement of sensitivity and capable of suppressing dispersion in sensitivity can be simply manufactured.

Further, the reference pressure chamber under the through-hole can be sealed by embedding the embedding material in the through-hole. Thus, pressure in the reference pressure chamber is so set to reference pressure that the completed capacitance pressure sensor can detect pressure received by the diaphragm as relative pressure with respect to the reference pressure. More specifically, the diaphragm is deformed in response to difference between pressure on the side of the reference pressure chamber and pressure on a side opposite to the reference pressure chamber. Thus, the distance between the diaphragm and a bottom surface of the reference pressure chamber changes. As a result, capacitance between the diaphragm and the bottom surface of the reference pressure chamber changes. The pressure received by the diaphragm can be detected by detecting the capacitance.

Preferably, the step of forming the reference pressure chamber includes a step of etching the material for the semiconductor substrate under the insulating layer so that the reference pressure chamber reaches a region wider than the recess portion.

In this case, a movable film having the diaphragm and an outer peripheral film portion formed on the periphery thereof is formed above the reference pressure chamber when the capacitance pressure sensor is completed. The diaphragm is positioned on a central region inside the outer peripheral film portion, and hence the same is remarkably displaced when the movable film warps. Thus, responsibility of the diaphragm to small pressure fluctuation improves. Therefore, improvement of sensitivity of the capacitance pressure sensor can be attained.

Preferably, the method for manufacturing a capacitance pressure sensor according to the present invention includes a step of forming an annular trench, surrounding a region planned to form the recess portion, deeper than a depth planned to form the reference pressure chamber before forming the recess portion, and a trench embedding step of embedding an etching stop layer in the annular trench.

In this case, the diaphragm in the recess portion is partitioned by the etching stop layer of the annular trench. Further, etching in the lateral direction at the time of forming the reference pressure chamber stops on the etching stop layer.

Thus, both of the diaphragm and the reference pressure chamber are partitioned by the etching stop layer, whereby the respective ones of the diaphragm and the reference pressure chamber can be precisely formed in target dimensions. Therefore, a capacitance pressure sensor capable of attaining improvement of sensitivity and capable of suppressing dispersion in sensitivity can be simply manufactured.

Preferably, the step of forming the through-hole includes a step of forming a first hole portion reaching the insulating layer from a surface of the conductor layer, a step of forming a sidewall insulating layer on an inner sidewall of the first hole portion, and a step of forming a second hole portion passing through the insulating layer on a region inside the sidewall insulating layer.

In this case, the through-hole is constituted of the first hole portion and the second hole portion. The sidewall insulating layer is formed on the inner sidewall of the first hole portion, whereby the inner sidewall of the first hole portion can be prevented from being eroded by the etchant introduced into the through-hole.

The through-hole is completed by forming the second hole portion passing through the insulating layer after forming the sidewall insulating layer on the inner sidewall of the first hole portion, whereby the sidewall insulating layer does not protrude into the reference pressure chamber from the through-hole in the state where the through-hole is completed. Therefore, no fluctuation of capacitance resulting from protrusion of the sidewall insulating layer takes place. Thus, capacitance between the diaphragm and a bottom surface of the reference pressure chamber can be settled without taking influence by the sidewall insulating layer into consideration, whereby design is simplified. As a result, a capacitance pressure sensor capable of attaining improvement of sensitivity and capable of suppressing dispersion in sensitivity can be simply manufactured.

Preferably, the method for manufacturing a capacitance pressure sensor according to the present invention further includes a step of forming a second etching stop layer on a position of a depth planned to be provided with a bottom surface of the reference pressure chamber on the semiconductor substrate before the step of forming the recess portion on the semiconductor substrate.

In this case, the material for the semiconductor substrate under the second etching stop layer is not eroded by the etchant when introducing the etchant into the through-hole and etching the material for the semiconductor substrate under the insulating layer. Therefore, the reference pressure chamber is held and partitioned by the insulating layer and the second etching stop layer, whereby the reference pressure chamber can be precisely formed in target dimensions. In other words, the distance between the diaphragm (the conductor layer) and the bottom surface of the reference chamber can be precisely customized to a design value, whereby dispersion in capacitance therebetween can be suppressed. Therefore, a capacitance pressure sensor capable of attaining improvement of sensitivity and capable of suppressing dispersion in sensitivity can be simply manufactured.

Preferably, the method for manufacturing a capacitance pressure sensor according to the present invention further includes a step of forming an integrated circuit device on a region of the semiconductor substrate other than a region where the reference pressure chamber is formed. Thus, the capacitance pressure sensor and an integrated circuit portion can be formed on the same substrate. As to a pressure sensor portion and the integrated circuit portion, at least partial manufacturing steps are preferably shared. For example, a contact hole forming step and a wiring step may be simultaneously carried out on the pressure sensor portion and the integrated circuit portion.

Another capacitance pressure sensor according to the present invention includes a diaphragm including a conductor layer, an insulating layer in contact with a peripheral end surface and a lower surface of the diaphragm, and a semiconductor substrate, having a reference pressure chamber partitioned by the insulating layer under the diaphragm, supporting a peripheral edge portion of the diaphragm through the insulating layer, while a through-hole passing through the conductor layer and the insulating layer to reach the reference pressure chamber is formed, and an embedding material is embedded in the through-hole.

According to the structure, one semiconductor substrate supports the peripheral edge portion of the diaphragm through the insulating layer in contact with the peripheral end surface and the lower surface of the diaphragm including the conductor layer, and has the reference pressure chamber (a space) under the diaphragm. Therefore, the reference pressure chamber and the diaphragm may not be formed by bonding two semiconductor substrates to each other, whereby the cost can be lowered.

Further, the capacitance pressure sensor is constituted of one semiconductor substrate, whereby the capacitance pressure sensor can be miniaturized as compared with a case of constituting the capacitance pressure sensor by bonding two semiconductor substrates to each other.

In addition, the embedding material is embedded in the through-hole reaching the reference pressure chamber through the insulating layer partitioning the reference pressure chamber and the conductor layer, whereby the reference pressure chamber can be sealed. Thus, when pressure in the reference pressure chamber is set to reference pressure, pressure received by the diaphragm can be detected as relative pressure with respect to the reference pressure. The diaphragm is deformed in response to difference between pressure on the side of the reference pressure chamber and pressure on a side opposite to the reference pressure chamber. Thus, the distance between the diaphragm and a bottom surface of the reference pressure chamber changes. As a result, capacitance between the diaphragm (the conductor layer) and the bottom surface of the reference pressure chamber changes. The pressure received by the diaphragm can be detected by detecting the capacitance.

Preferably, the reference pressure chamber is formed to reach a region wider than the conductor layer. More preferably, a movable film having the diaphragm and an outer peripheral film portion formed on the periphery thereof is preferably formed above the reference pressure chamber. Thus, the diaphragm is positioned on a central region inside the outer peripheral film portion, and hence the same is remarkably displaced when the movable film warps. Therefore, responsibility of the diaphragm to small pressure fluctuation improves. Accordingly, improvement of sensitivity of the capacitance pressure sensor can be attained.

Preferably, the capacitance pressure sensor further includes an etching stop layer, surrounding the reference pressure chamber to partition a side surface of the reference pressure chamber, extending in the semiconductor substrate up to a position deeper than a bottom surface of the reference pressure chamber. Thus, etching in the lateral direction at the time of forming the reference pressure chamber stops on the etching stop layer in manufacturing steps for the capacitance pressure sensor. Therefore, the reference pressure chamber can be precisely formed in target dimensions. Accordingly, improvement of sensitivity of the capacitance pressure sensor can be attained, and dispersion of the sensitivity can be suppressed.

Preferably, the capacitance pressure sensor further includes a sidewall insulating layer cylindrically formed to cover an inner sidewall of the through-hole and arranged in the through-hole not to project into the reference pressure chamber.

The sidewall insulating layer is formed on the inner sidewall of the through-hole, whereby the inner sidewall of the through-hole can be prevented from being eroded by the etchant introduced into the through-hole at the time of the etching for forming the reference pressure chamber. Thus, dispersion in area of the diaphragm (the conductor layer) can be suppressed.

The sidewall insulating layer does not project into the reference pressure chamber from the through-hole, whereby no fluctuation of capacitance resulting from protrusion of the sidewall insulating layer takes place. Thus, capacitance between the diaphragm and a bottom surface of the reference pressure chamber can be settled without taking influence by the sidewall insulating layer into consideration, whereby design is simplified. Accordingly, improvement of sensitivity of the capacitance pressure sensor can be attained, and dispersion in sensitivity can be suppressed.

Preferably, the capacitance pressure sensor further includes a second etching stop layer formed on a bottom surface of the reference pressure chamber. Thus, the reference pressure chamber is held and partitioned by the insulating layer and the second etching stop layer, whereby the reference pressure chamber can be precisely formed in target dimensions. In other words, the distance between the diaphragm (the conductor layer) and the bottom surface of the reference pressure chamber can be precisely customized to a design value, whereby dispersion in capacitance therebetween can be suppressed. Therefore, improvement of sensitivity of the capacitance pressure sensor can be attained, and dispersion in sensitivity can be suppressed.

Preferably, the capacitance pressure sensor further includes an integrated circuit portion having an integrated circuit device formed on the semiconductor substrate. Thus, the capacitance pressure sensor and the integrated circuit portion can be formed on the same semiconductor substrate.

BRIEF DESCRIPTION OF DRAWINGS

FIG. 9O(a) is a schematic sectional view on the same position as that in FIG. 8(*b*) showing a step subsequent to that in FIG. 9N, and FIG. 9O(b) shows a cutting plane on the same position as that in FIG. 9A(b) at the same point of time as that in FIG. 9O(a).

FIG. 10(*a*) is an enlarged plan view of a pressure sensor according to a fourth embodiment, and FIG. 10(*b*) is a sectional view along a cutting plane line D-D in FIG. 10(*a*).

FIG. 18C(a) is a schematic sectional view showing a step subsequent to that in FIG. 18B(a), and FIG. 18C(b) shows a cutting plane on the same position as that in FIG. 13(*b*) at the same point of time as that in FIG. 18C(a).

FIG. 18D(a) is a schematic sectional view showing a step subsequent to that in FIG. 18C(a), FIG. 18D(b) is a plan view in the state of FIG. 18D(a), and FIG. 18D(c) shows a cutting plane on the same position as that in FIG. 13(*b*) at the same point of time as that in FIG. 8D(a).

FIG. 18E(a) is a schematic sectional view showing a step subsequent to that in FIG. 18D(a), and FIG. 18E(b) is a plan view in the state of FIG. 18E(a).

FIG. 18F is a schematic sectional view showing a step subsequent to that in FIG. 18E(a).

FIG. 18G(a) is a schematic sectional view showing a step subsequent to that in FIG. 18F, and FIG. 18G(b) is a plan view in the state of FIG. 18G(a).

FIG. 18H(a) is a schematic sectional view showing a step subsequent to that in FIG. 18G(a), and FIG. 18H(b) shows a cutting plane on the same position as that in FIG. 13(*b*) at the same point of time as that in FIG. 18H(a).

FIG. 18I(a) is a schematic sectional view showing a step subsequent to that in FIG. 18H(a), and FIG. 18I(b) shows a cutting plane on the same position as that in FIG. 13(*b*) at the same point of time as that in FIG. 18I(a).

FIG. 18J(a) is a schematic sectional view showing a step subsequent to that in FIG. 18H(a), and FIG. 18J(b) shows a cutting plane on the same position as that in FIG. 13(*b*) at the same point of time as that in FIG. 18J(a).

FIG. 18K(a) is a schematic sectional view showing a step subsequent to that in FIG. 18J(a), and FIG. 18K(b) shows a cutting plane on the same position as that in FIG. 13(*b*) at the same point of time as that in FIG. 18K(a).

FIG. 18L(a) is a schematic sectional view showing a step subsequent to that in FIG. 18K(a), and FIG. 18L(b) shows a cutting plane on the same position as that in FIG. 13(*b*) at the same point of time as that in FIG. 18L(a).

FIG. 18M(a) is a schematic sectional view showing a step subsequent to that in FIG. 18L(a), and FIG. 18M(b) shows a cutting plane on the same position as that in FIG. 13(*b*) at the same point of time as that in FIG. 18M(a).

FIG. 18N is a schematic sectional view showing a step subsequent to that in FIG. 18M(b).

Figure 13A:
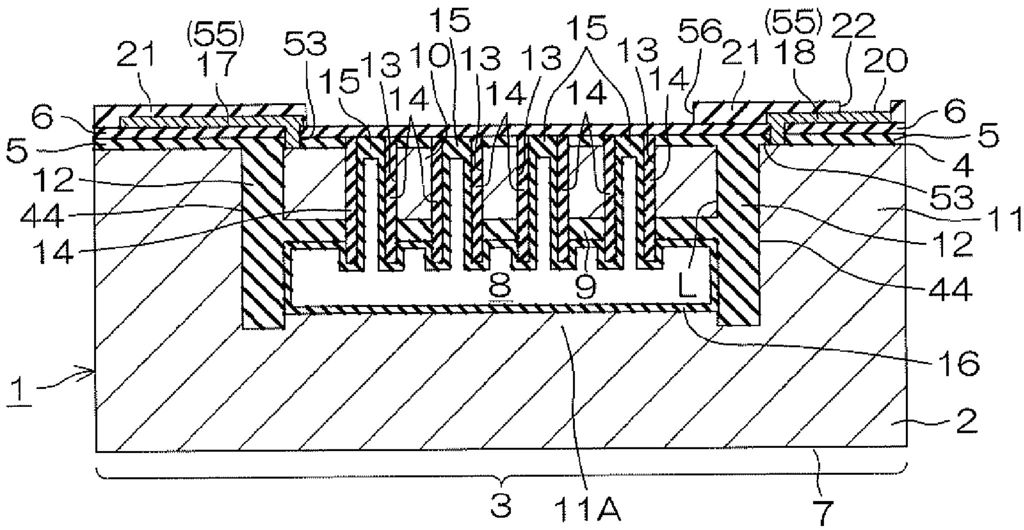
FIG. 13(*a*) is a sectional view along a cutting plane line A-A in FIG. 12 in the case of the pressure sensor according to the fifth embodiment, and FIG. 13(*b*) is a sectional view of a principal portion of the pressure sensor in an integrated circuit region of FIG. 12.
Figure 13B:
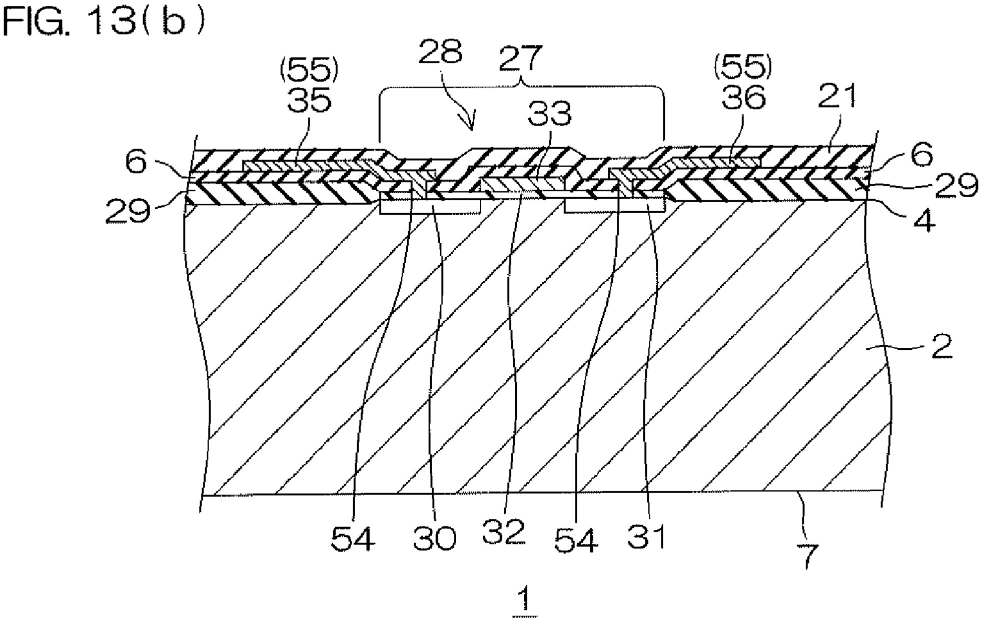
Figure 17:
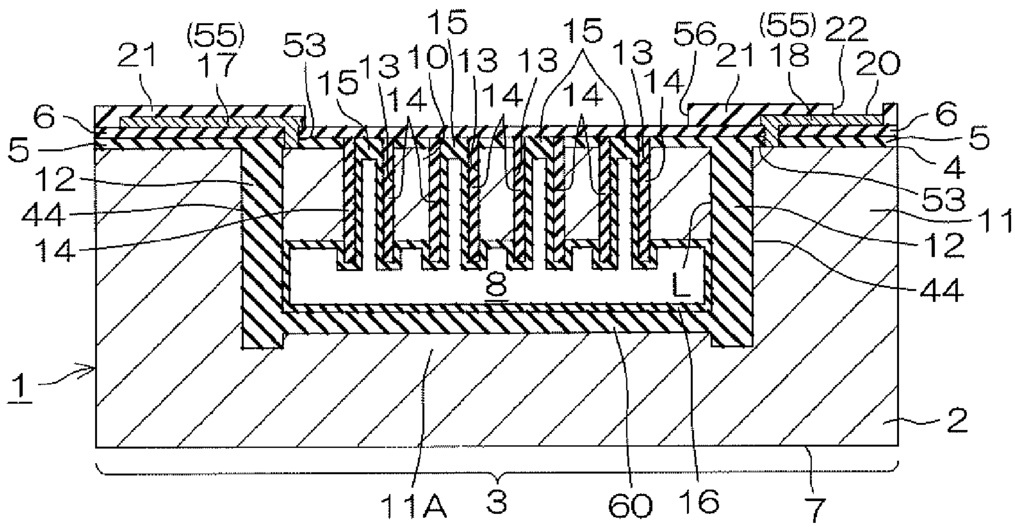
FIG. 17 is a sectional view along the cutting plane line A-A in FIG. 12 in a case of a pressure sensor according to a seventh embodiment.
Figure 18A:
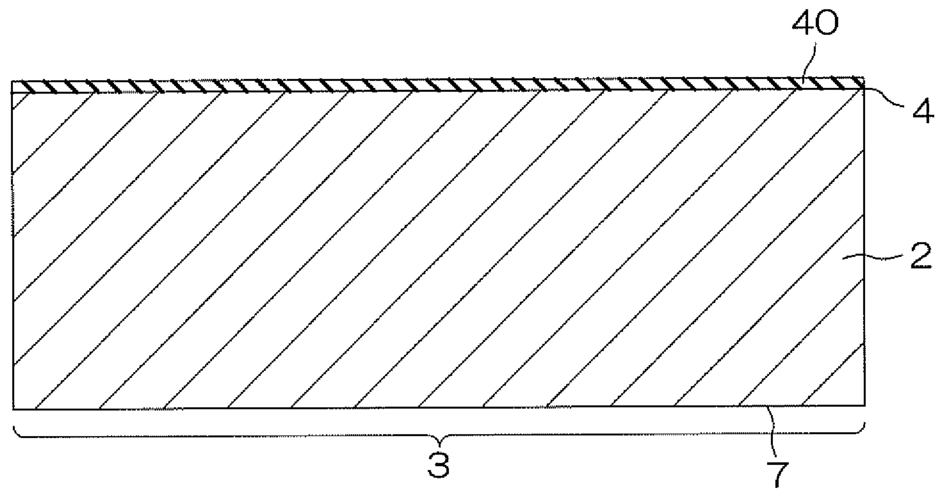
FIG. 18A(a) is a schematic sectional view showing a manufacturing step for the pressure sensor according to the seventh embodiment and shows a cutting plane on the same position as that in FIG. 17, while FIG. 18A(b) shows a cutting plane on the same position as that in FIG. 13(*b*) at the same point of time as that in FIG. 18A(a).
Figure 18A:
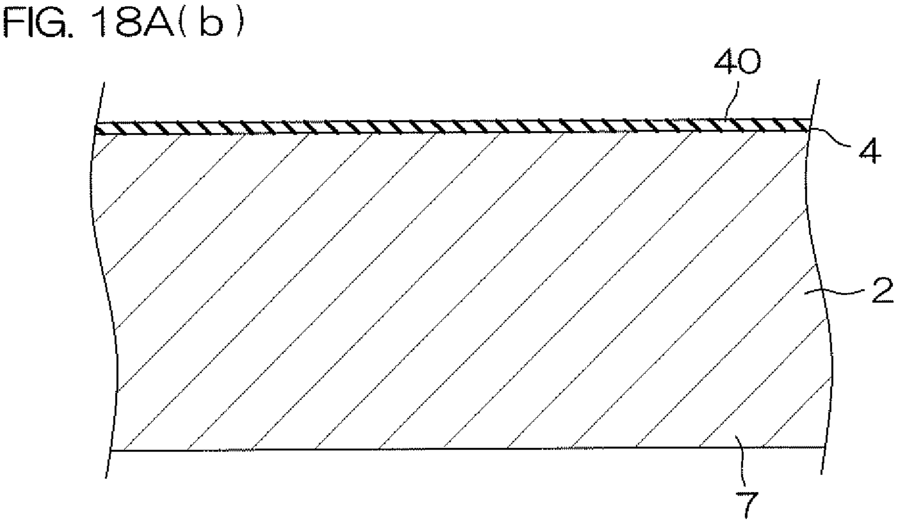
Figure 18B:
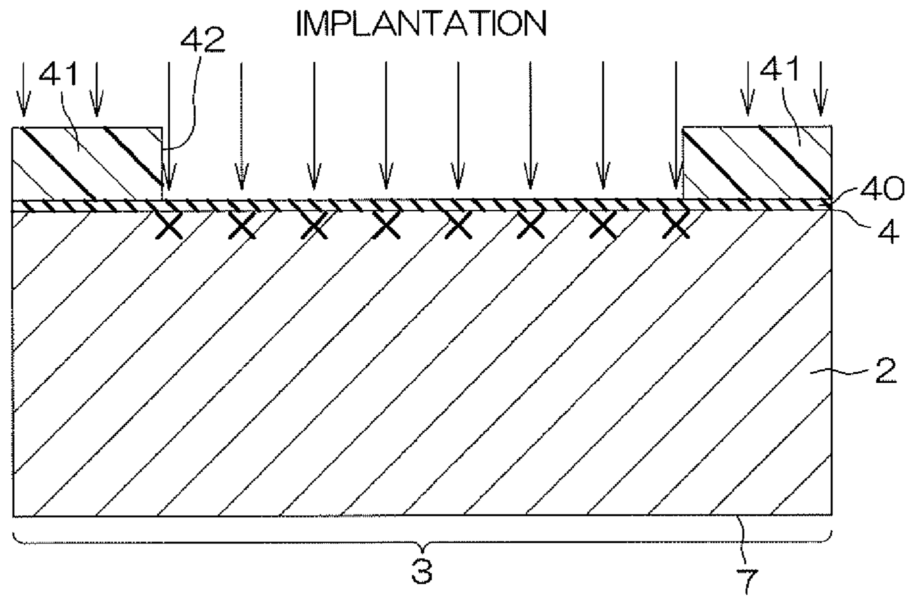
FIG. 18B(a) is a schematic sectional view showing a step subsequent to that in FIG. 18A(a), and FIG. 18B(b) is a plan view in the state of FIG. 18B(a).
Figure 18B:
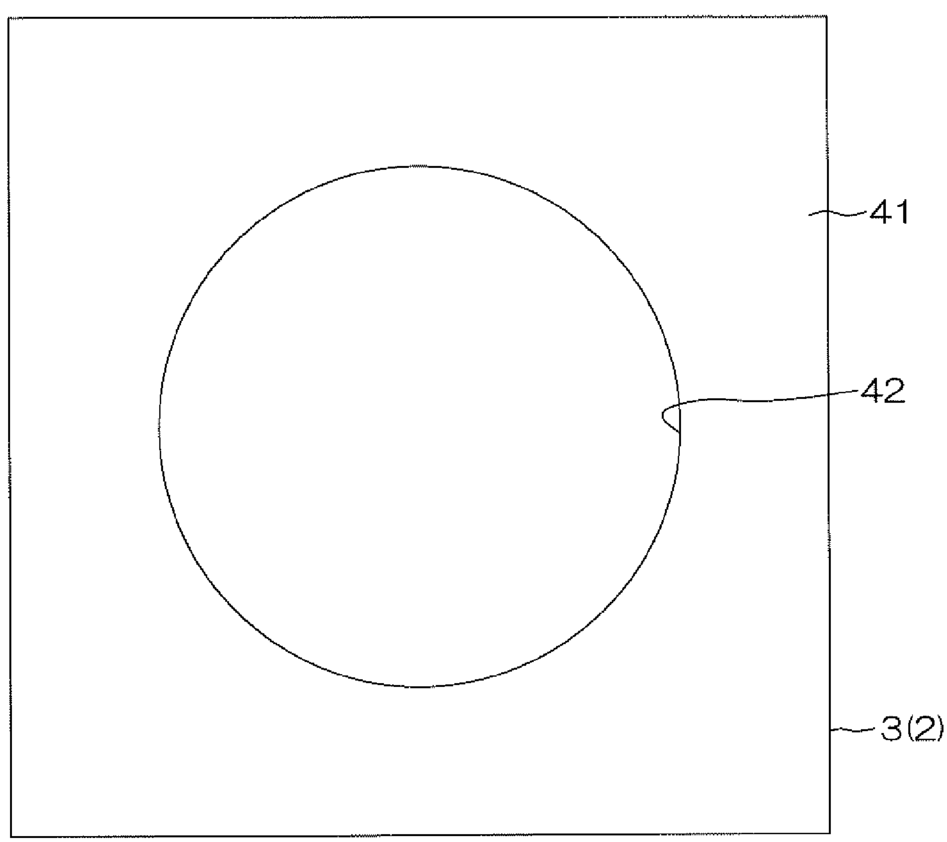
Figure 18E:
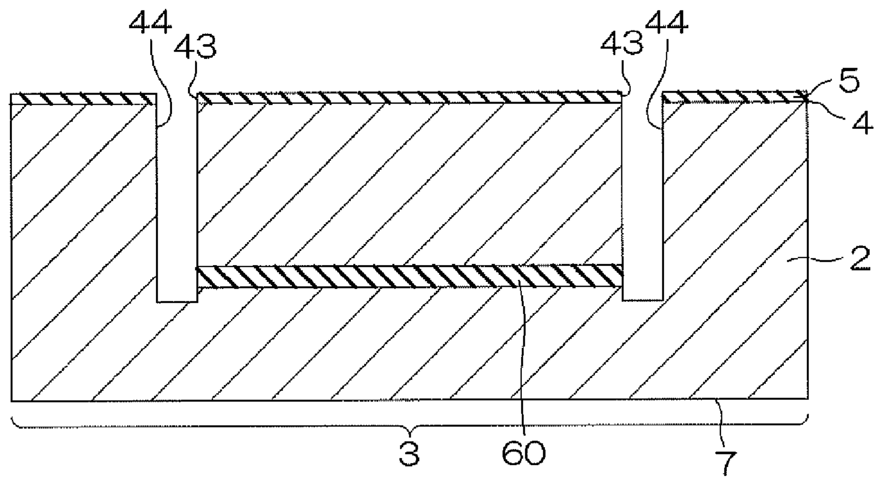
Figure 18E:
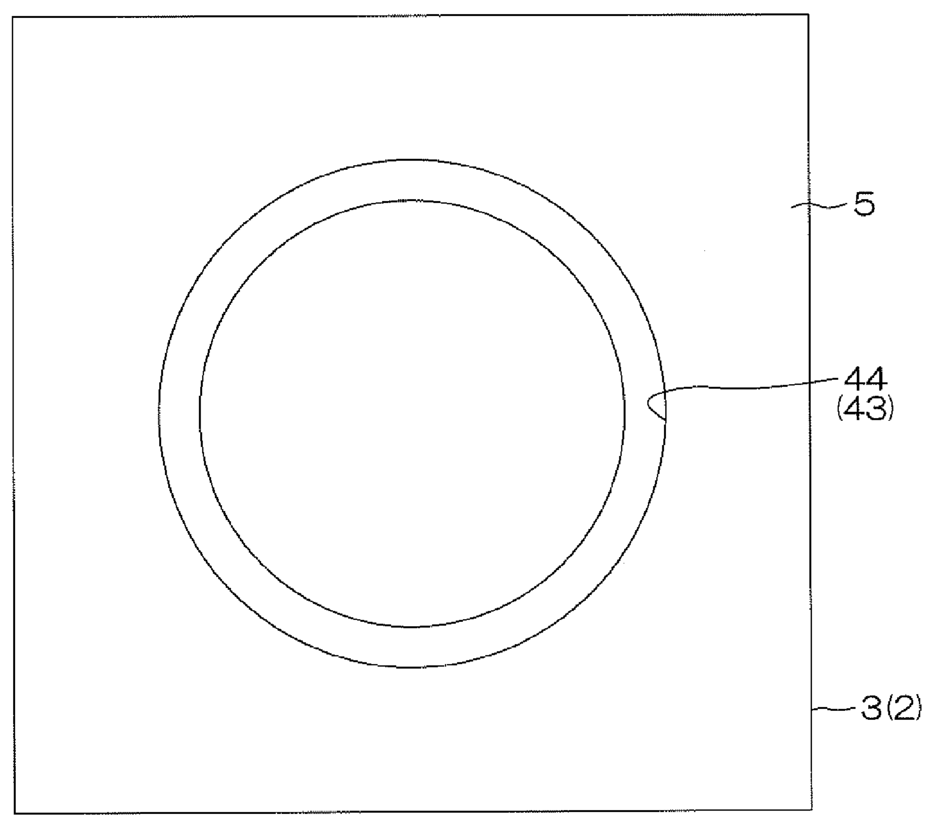
Figure 18F:
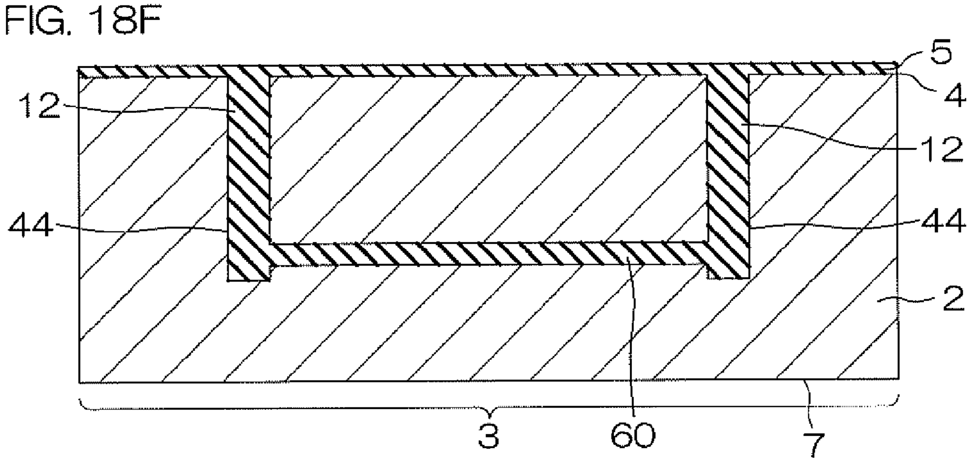
Figure 18G:
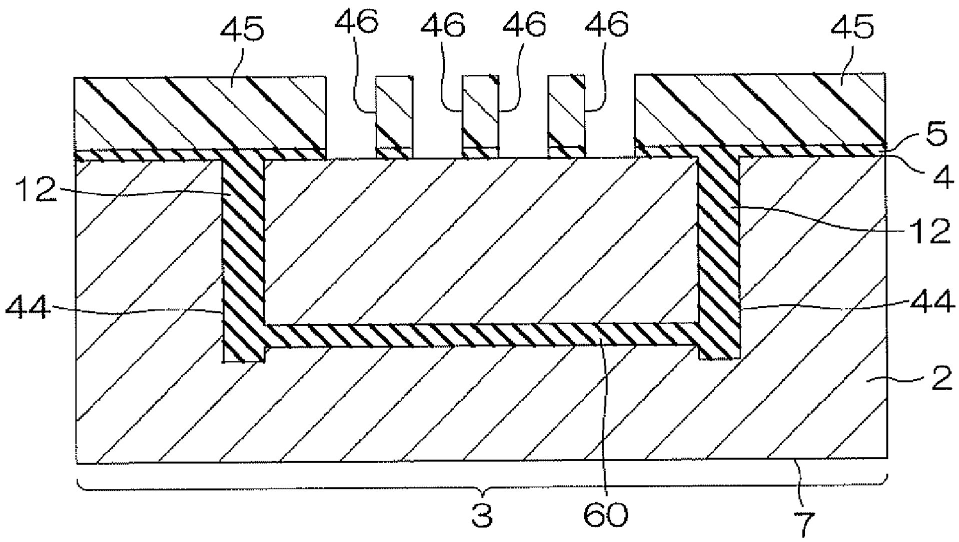
Figure 18G:
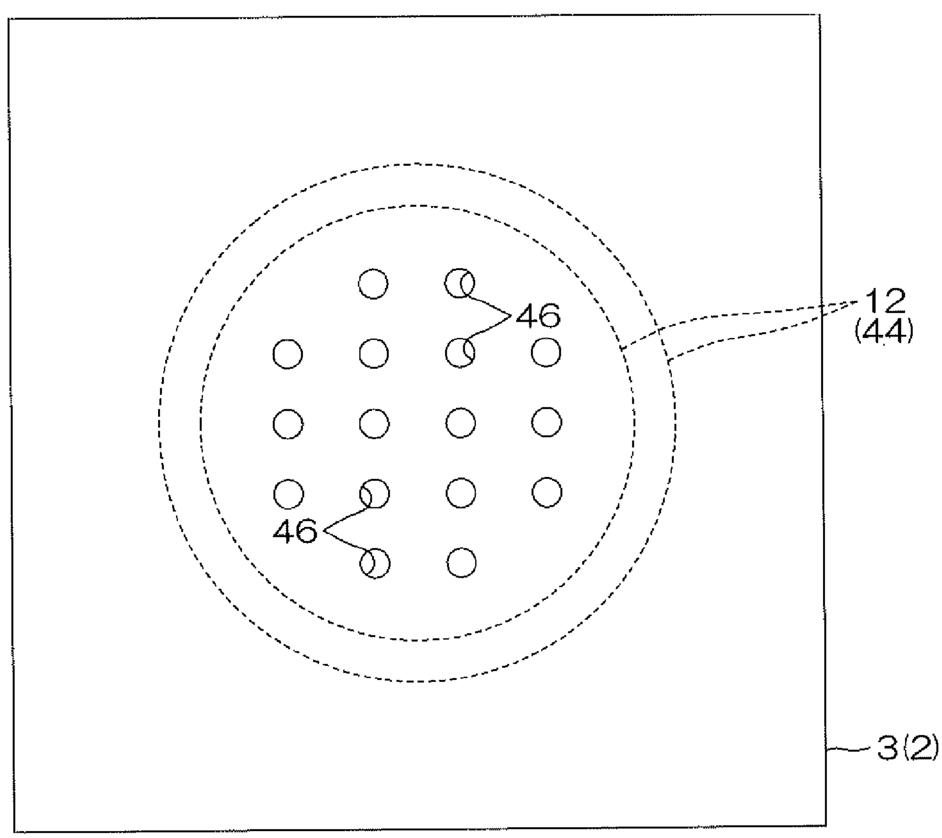
Figure 18H:
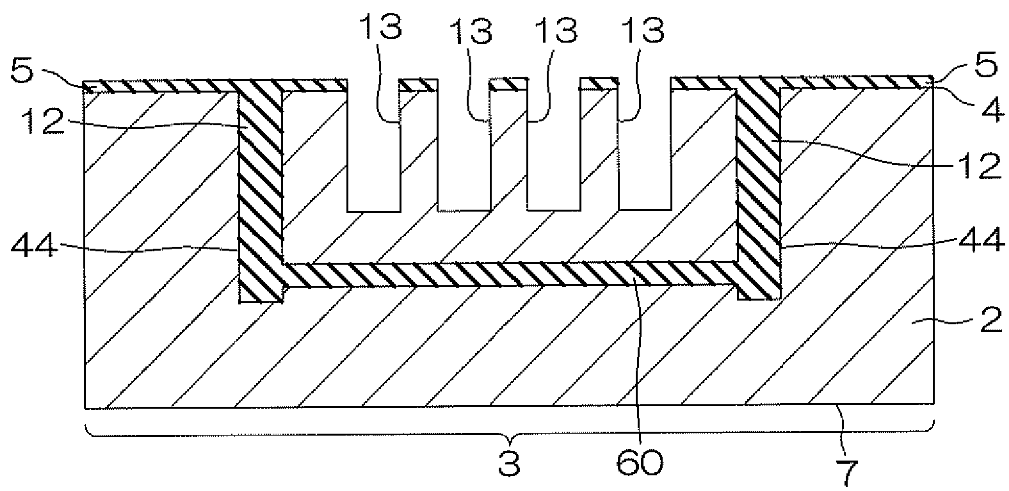
Figure 18H:
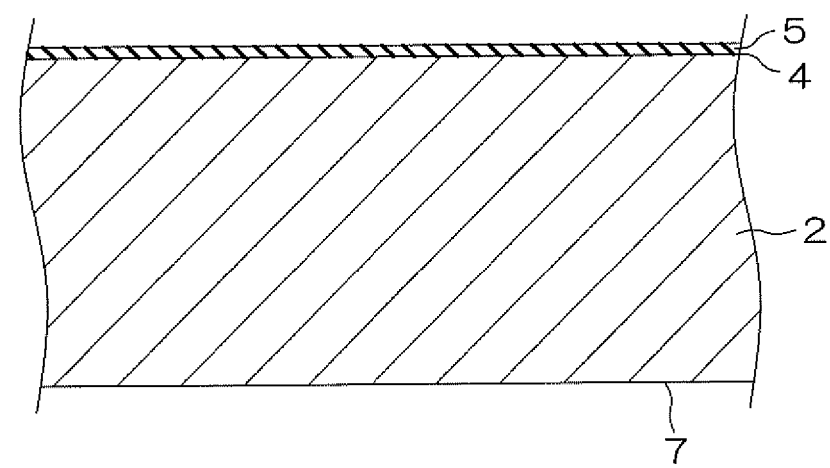
Figure 18:
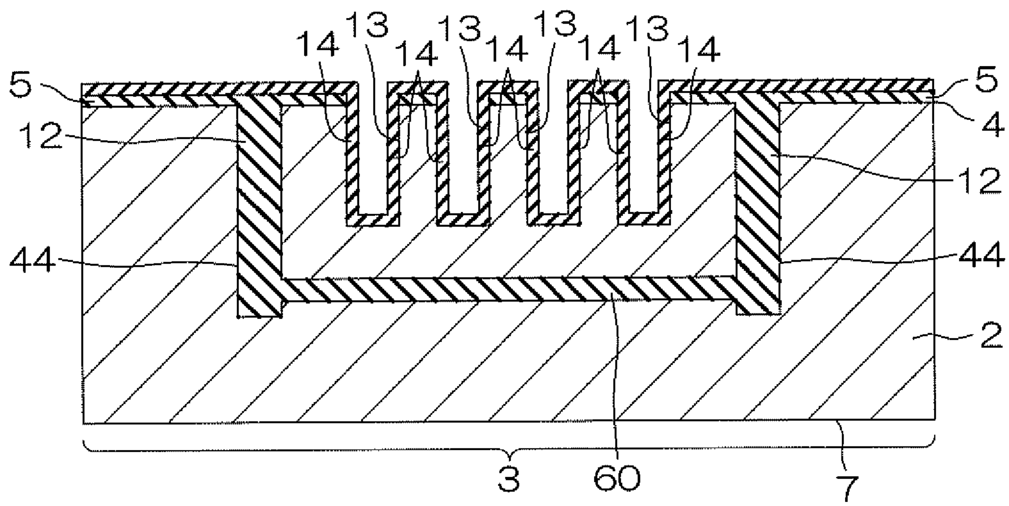
Figure 18:
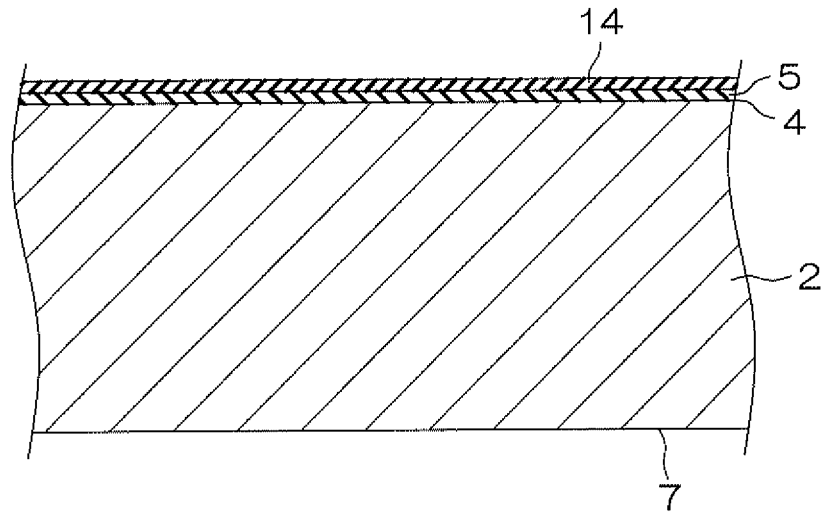
Figure 18J:
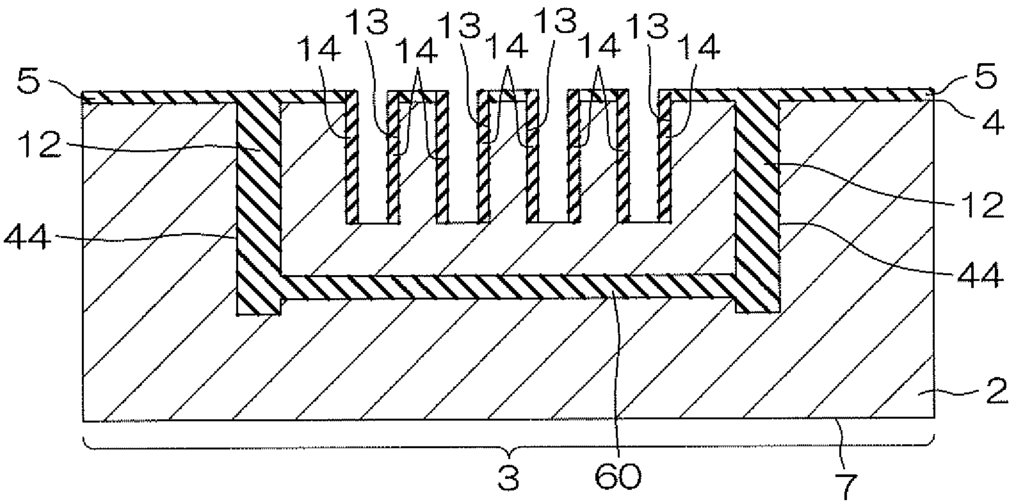
Figure 18J:
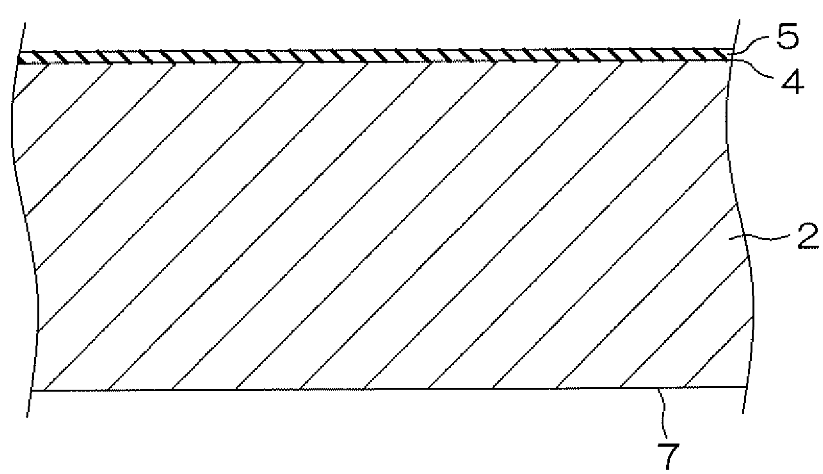
Figure 18K:
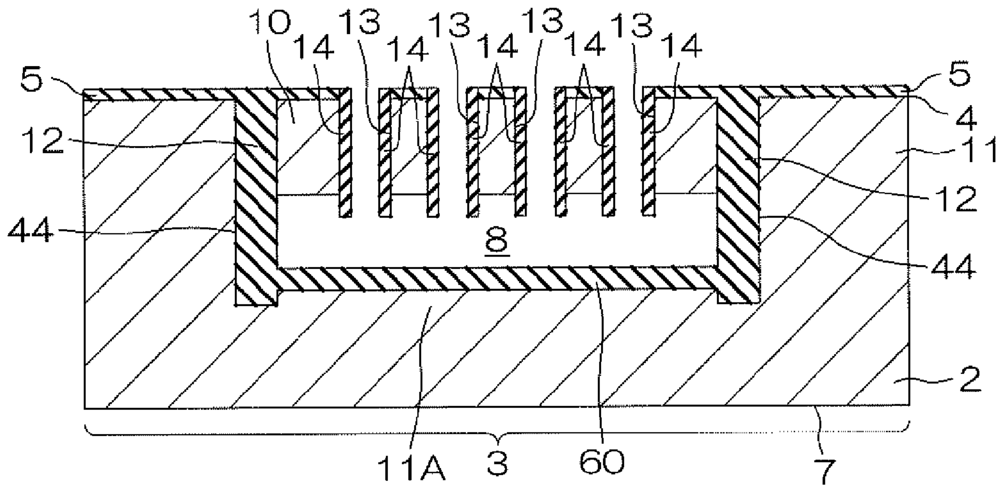
Figure 18K:
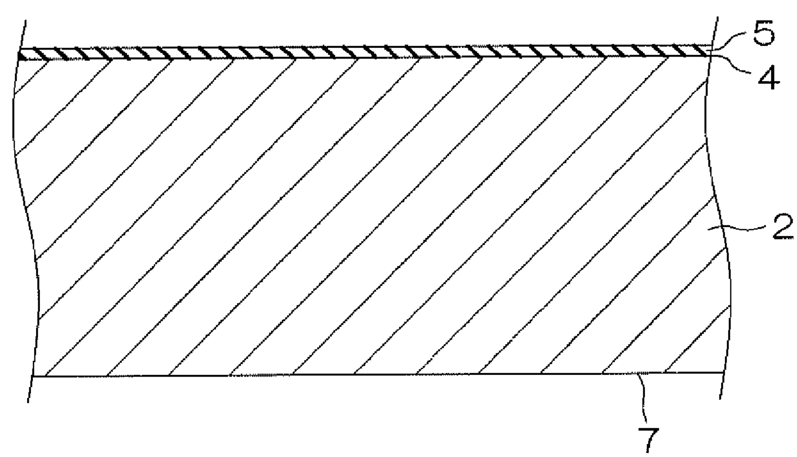
Figure 18L:
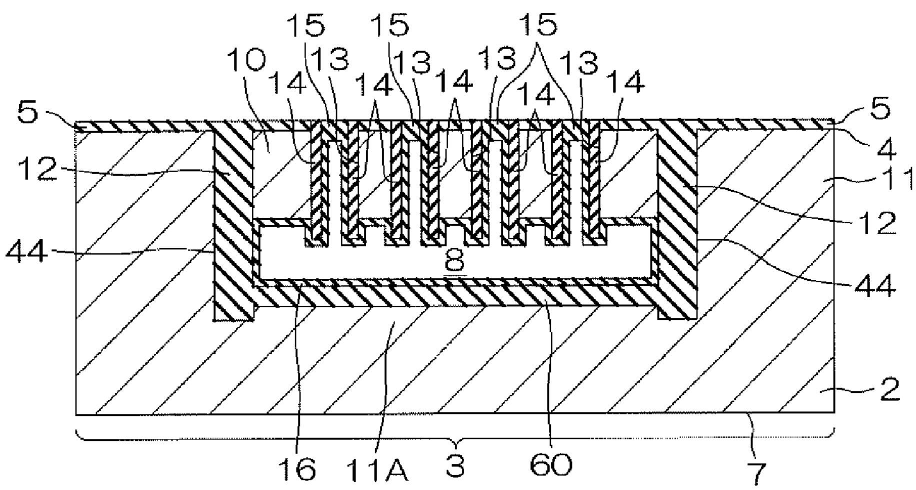
Figure 18L:
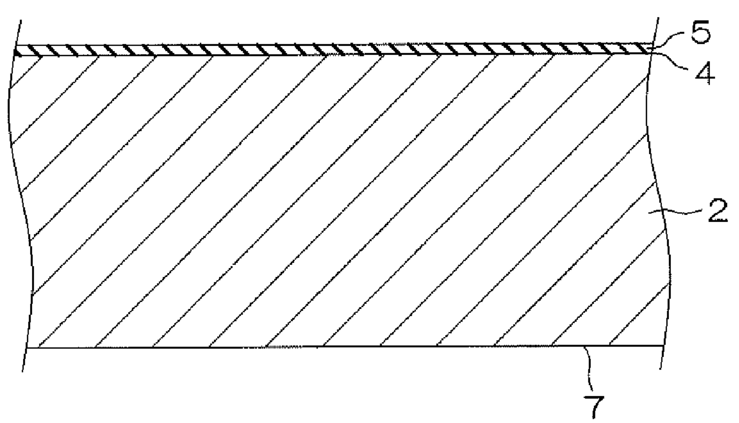
Figure 18N:
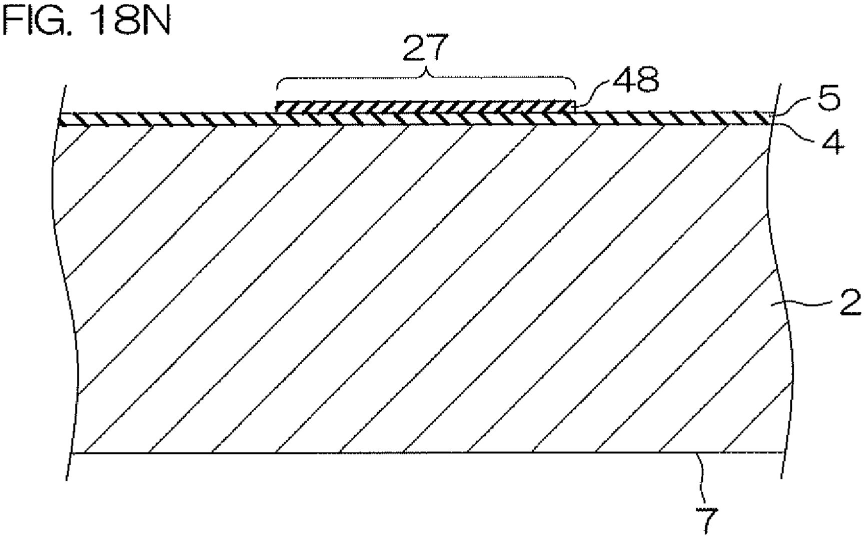
Figure 180A:
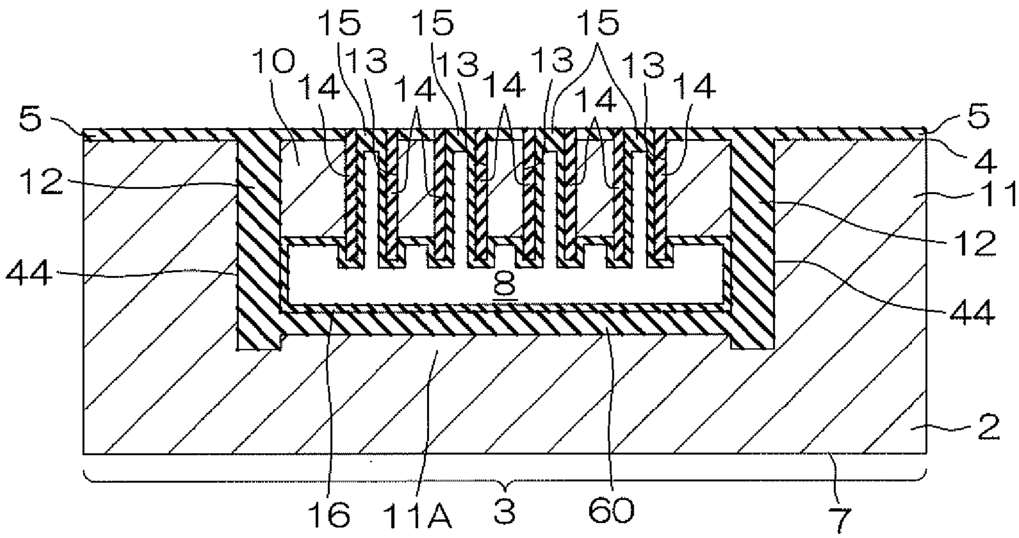
Figure 180B:
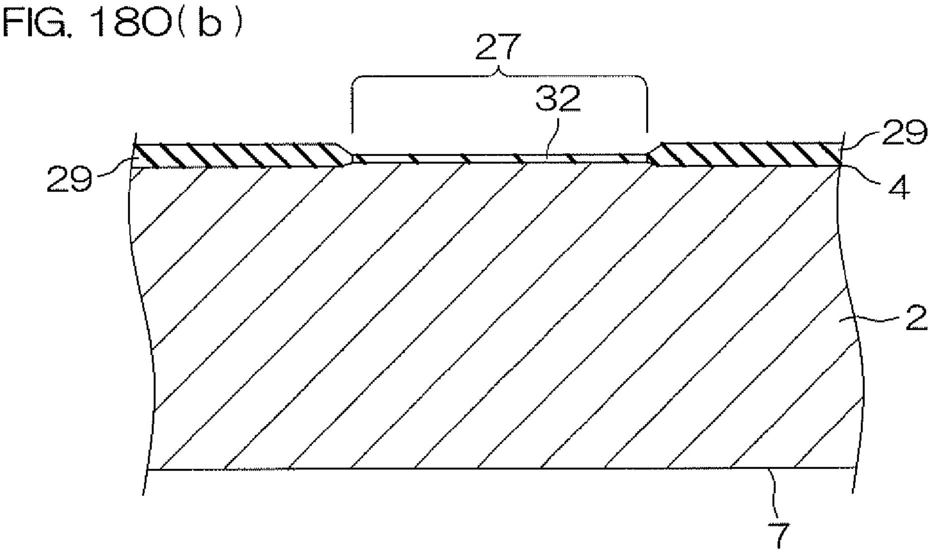

FIG. 18O(a) shows a cutting plane on the same position as that in FIG. 17 illustrating a step subsequent to that in FIG. 18N, and FIG. 18O(b) shows a cutting plane on the same position as that in FIG. 13(*b*) at the same point of time as that in FIG. 18O(a).

Figure 18P:
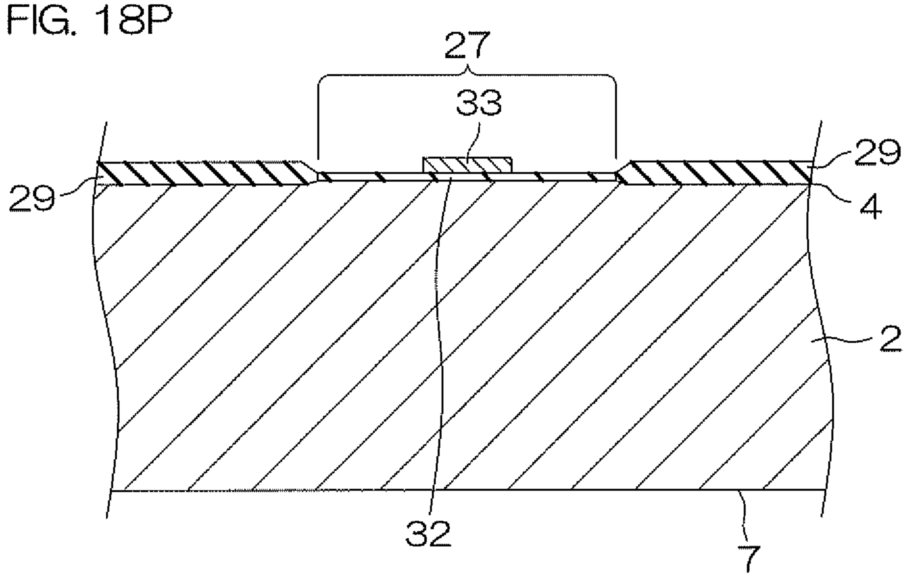

FIG. 18P is a schematic sectional view showing a step subsequent to that in FIG. 18O(b).

Figure 18Q:
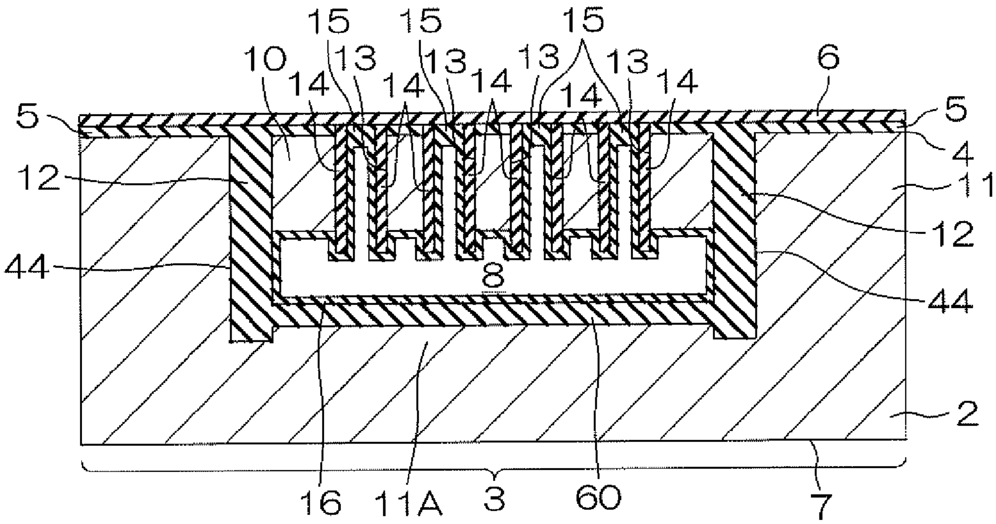
Figure 18Q:
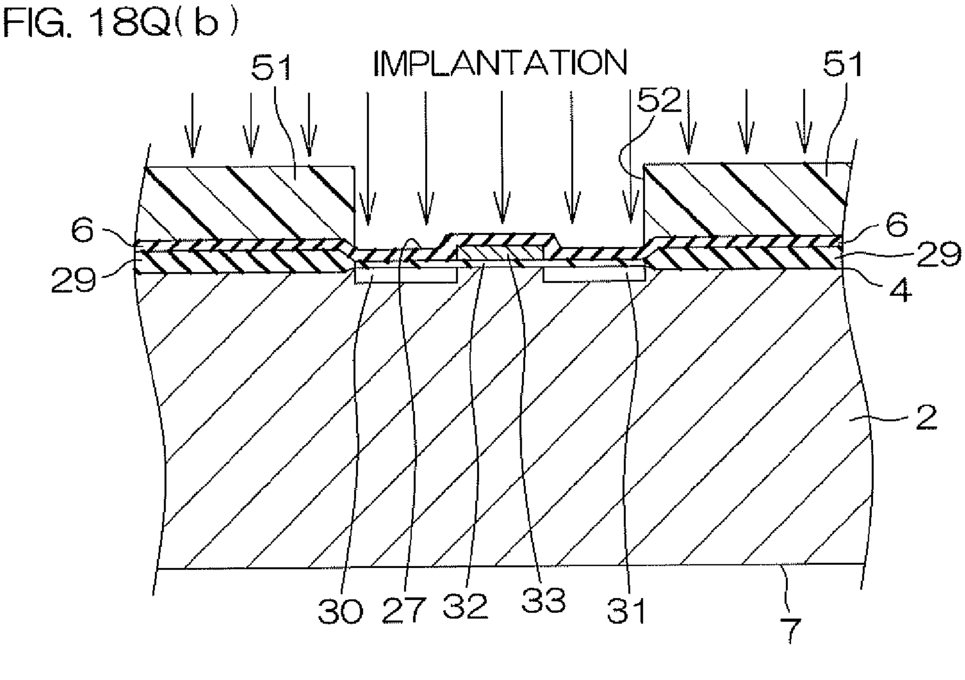

FIG. 18Q(a) shows a cutting plane on the same position as that in FIG. 17 illustrating a step subsequent to that in FIG. 18P, and FIG. 18Q(b) shows a cutting plane on the same position as that in FIG. 13(*b*) at the same point of time as that in FIG. 18Q(a).

Figure 19:
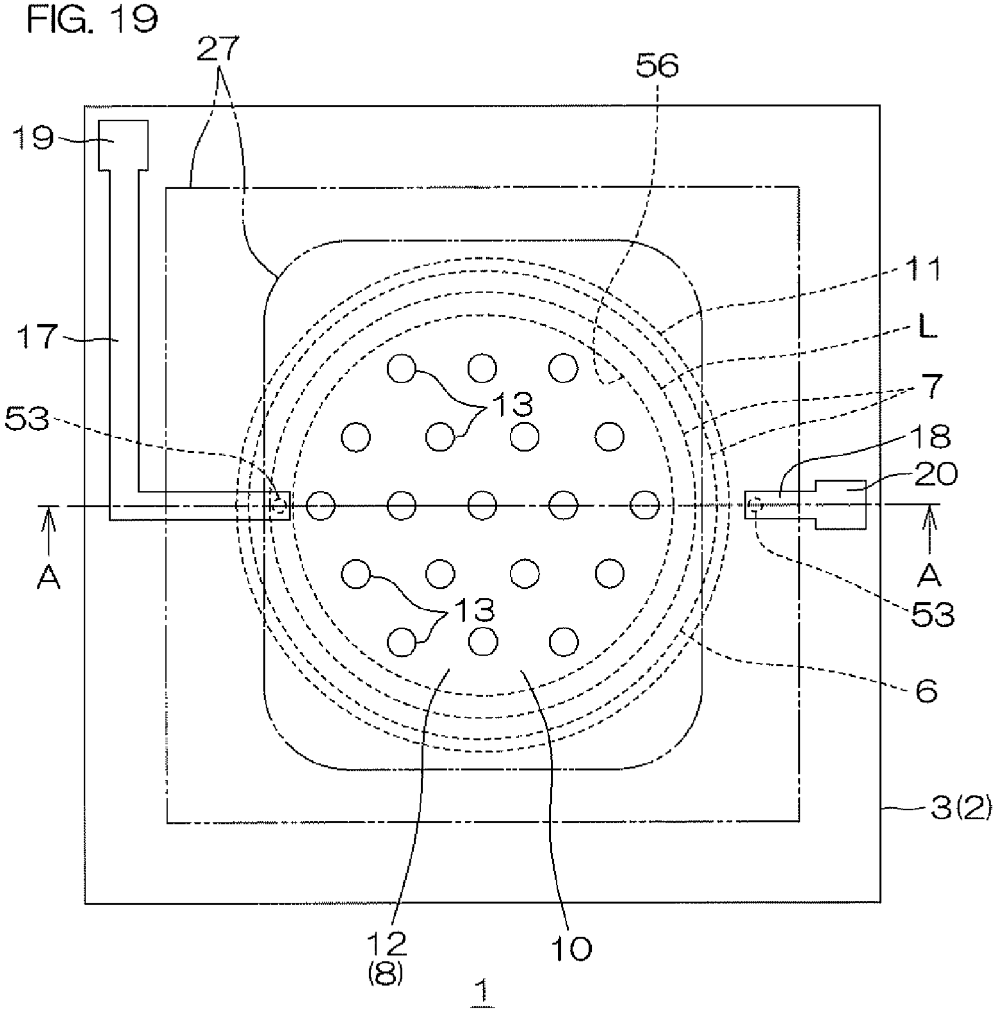

FIG. 19 is an enlarged plan view of a pressure sensor according to an eighth embodiment.

Figure 20A:
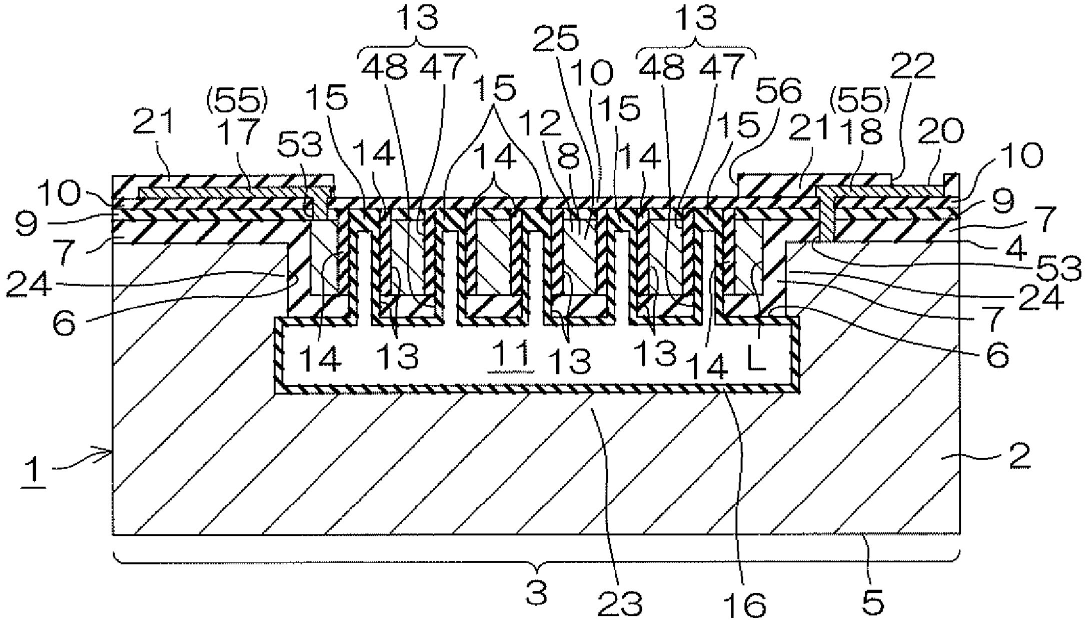
Figure 20B:
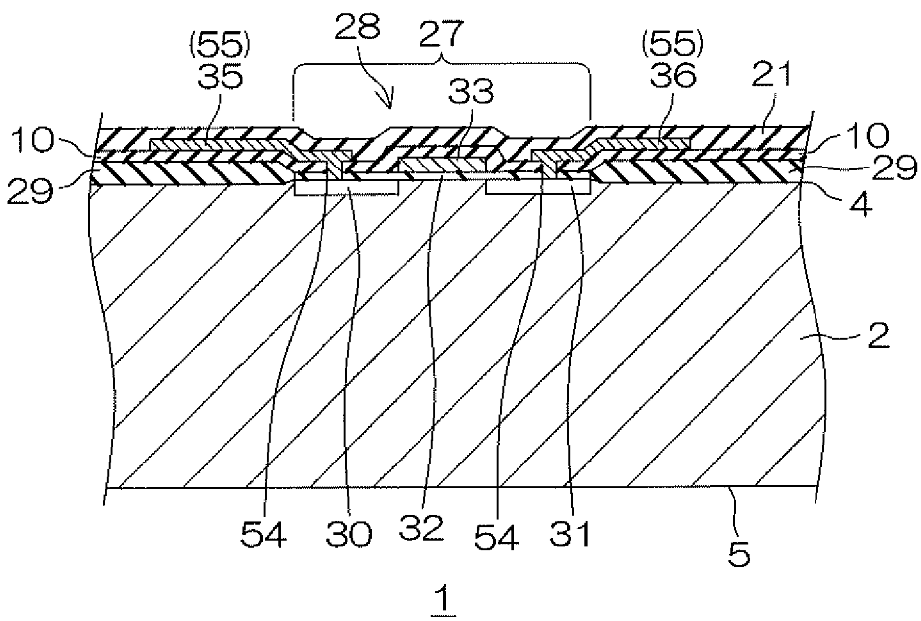

FIG. 20(*a*) is a sectional view along a cutting plane line A-A in FIG. 19, and FIG. 20(*b*) is a sectional view of a principal portion of the pressure sensor in an integrated circuit region of FIG. 19.

Figure 21A:
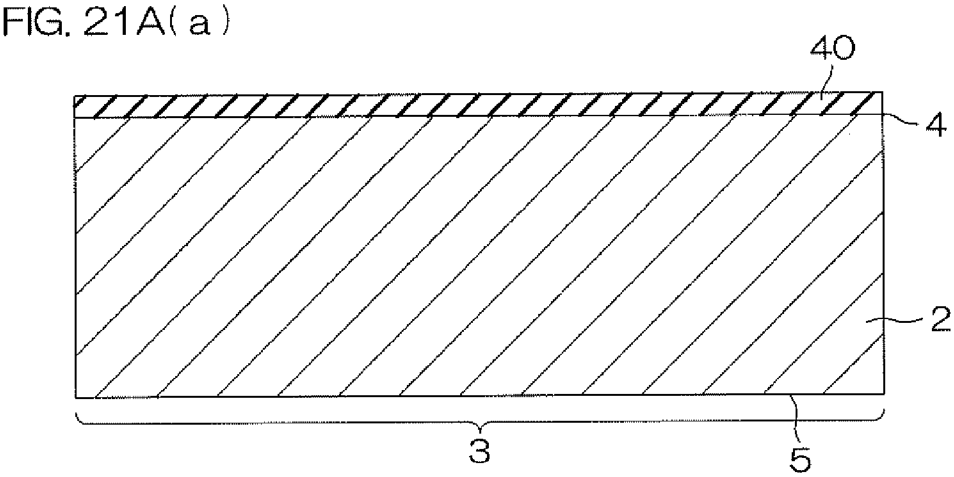
Figure 21A:
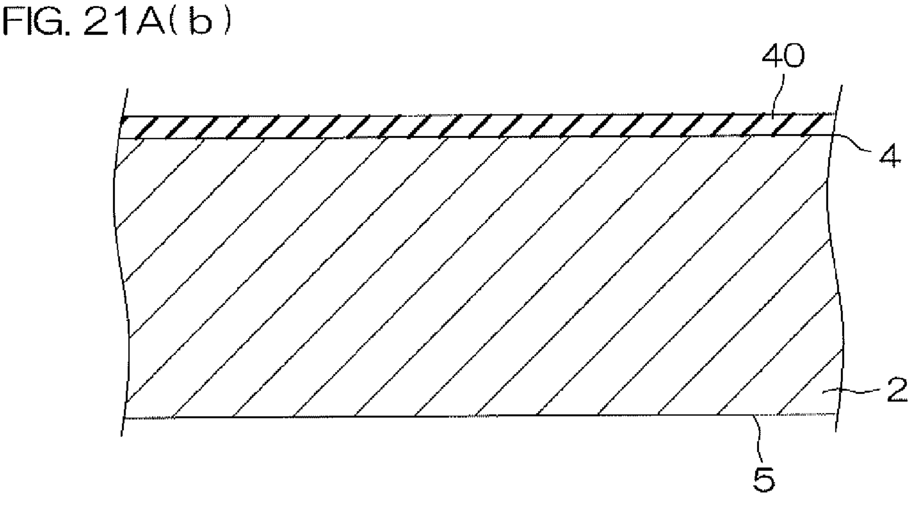

FIG. 21A(a) is a schematic sectional view showing a manufacturing step for the pressure sensor according to the eighth embodiment and shows a cutting plane on the same position as that in FIG. 20(*a*), while FIG. 21A(b) shows a cutting plane on the same position as that in FIG. 20(*b*) at the same point of time as that in FIG. 21A(a).

FIG. 21B(a) is a schematic sectional view showing a step subsequent to that in FIG. 21A(a), FIG. 21B(b) is a plan view in the state of FIG. 21B(a), and FIG. 21B(c) shows a cutting plane on the same position as that in FIG. 20(*b*) at the same point of time as that in FIG. 21B(a).

Figure 21C:
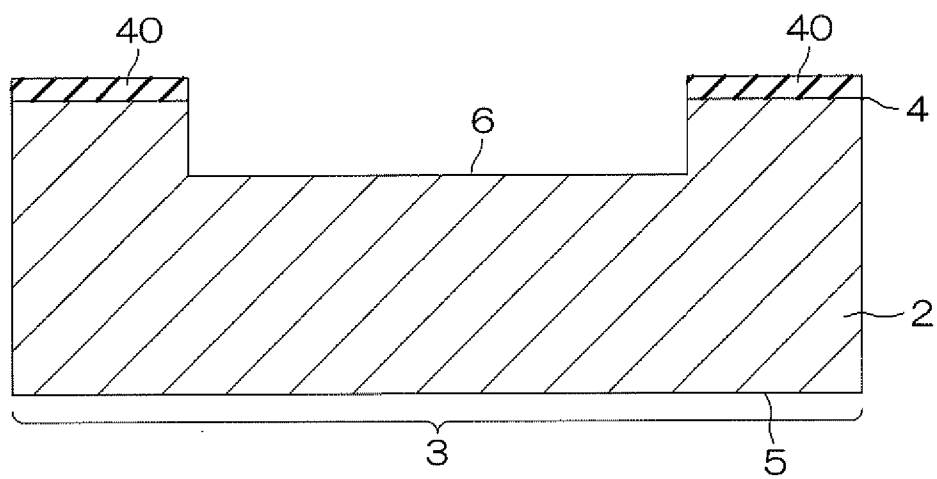

FIG. 21C is a schematic sectional view showing a step subsequent to that in FIG. 21B(a).

Figure 21D:
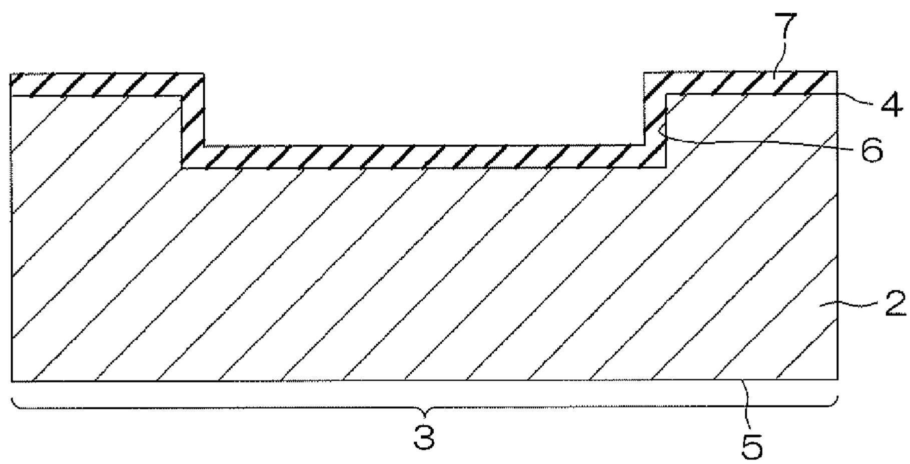
Figure 21D:
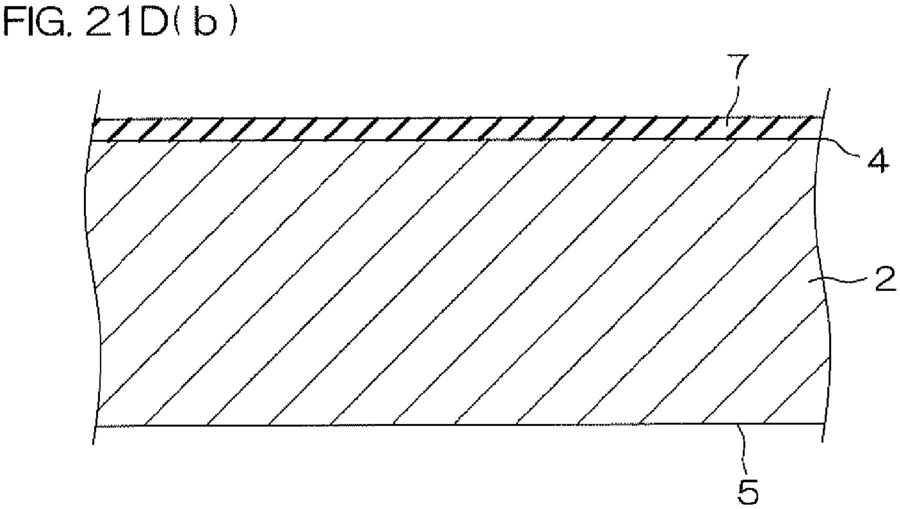

FIG. 21D(a) is a schematic sectional view showing a step subsequent to that in FIG. 21C, and FIG. 21D(b) shows a cutting plane on the same position as that in FIG. 20(*b*) at the same point of time as that in FIG. 21D(a).

Figure 21E:
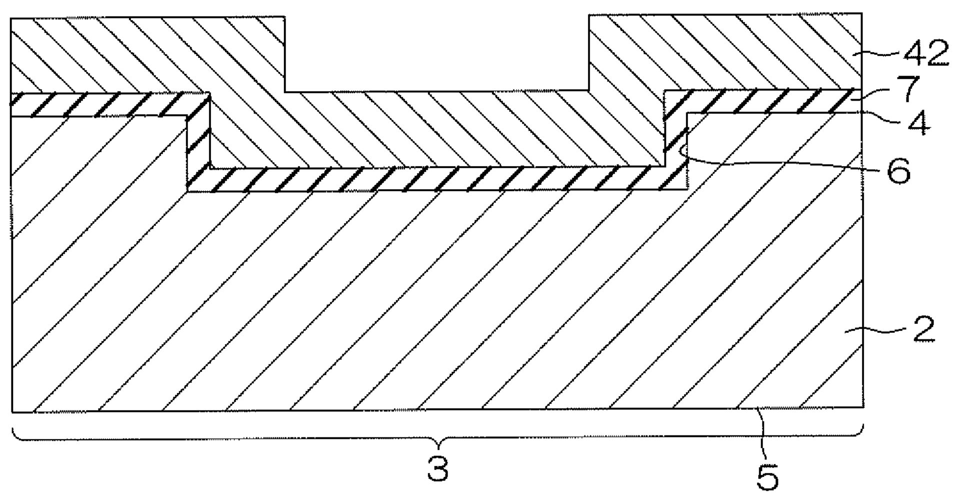
Figure 21E:
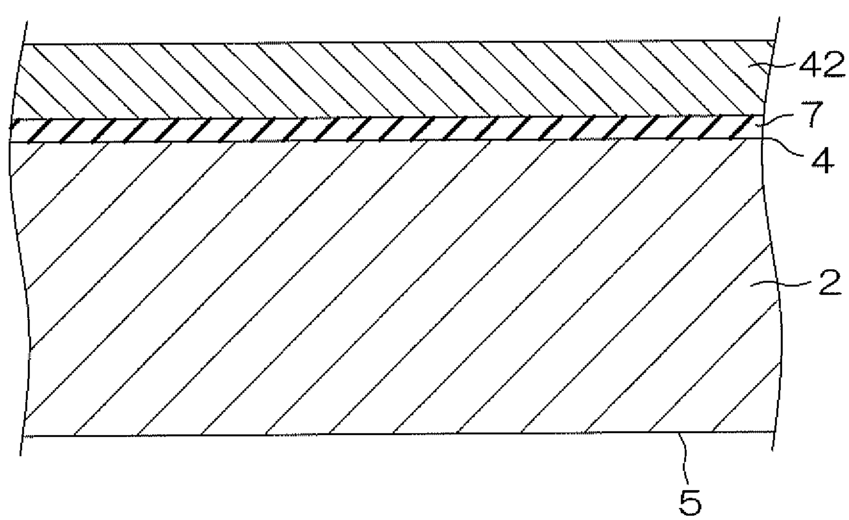

FIG. 21E(a) is a schematic sectional view showing a step subsequent to that in FIG. 21D(a), and FIG. 21E(b) shows a cutting plane on the same position as that in FIG. 20(*b*) at the same point of time as that in FIG. 21E(a).

Figure 21F:
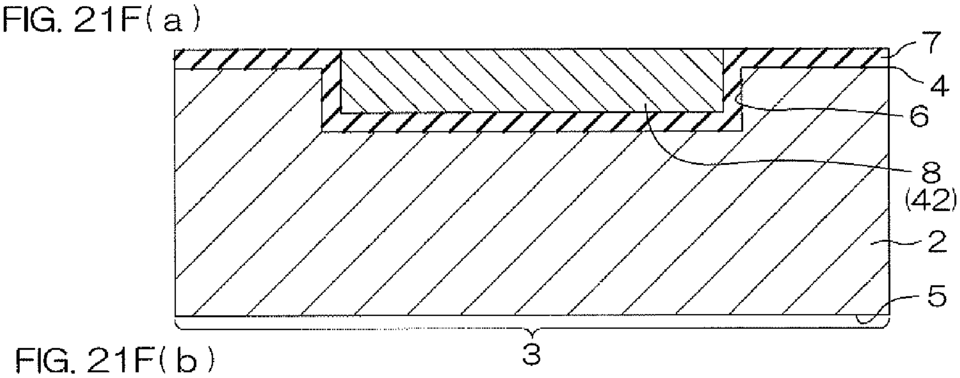
Figure 21F:
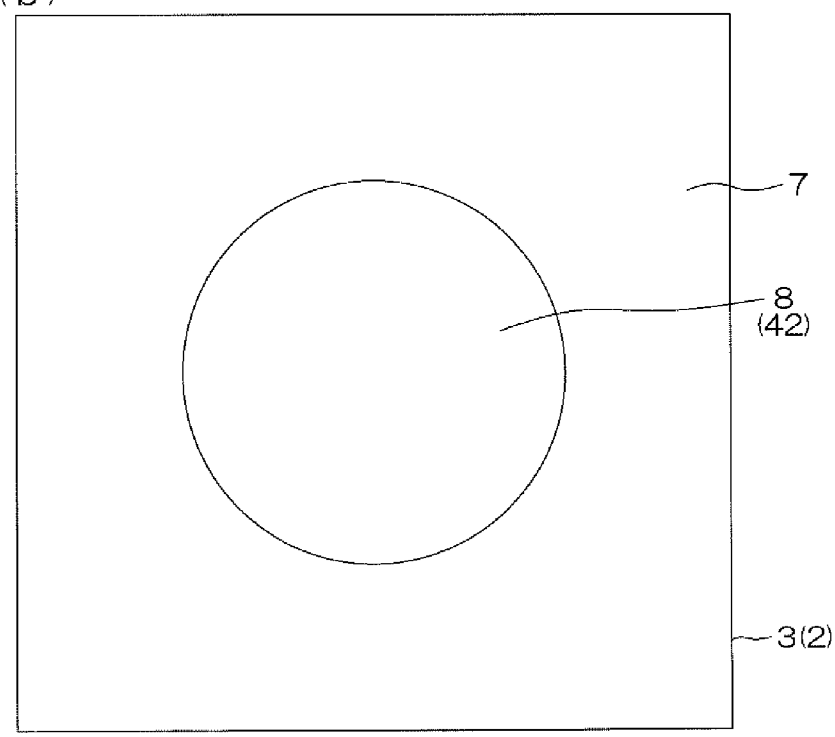
Figure 21F:
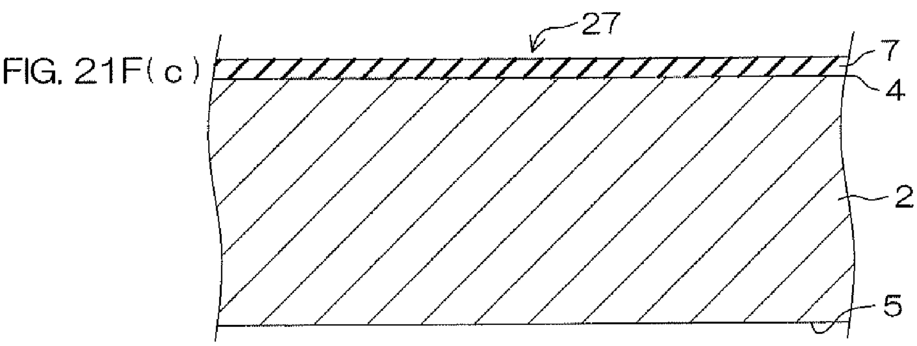

FIG. 21F(a) is a schematic sectional view showing a step subsequent to that in FIG. 21E(a), FIG. 21F(b) is a plan view in the state of FIG. 21F(a), and FIG. 21F(c) shows a cutting plane on the same position as that in FIG. 20(*b*) at the same point of time as that in FIG. 21F(a).

Figure 21G:
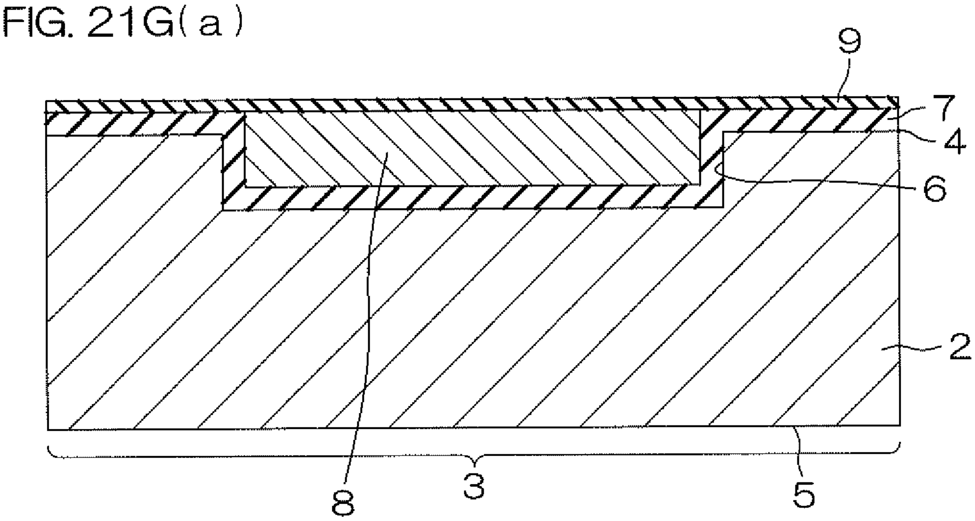
Figure 21G:
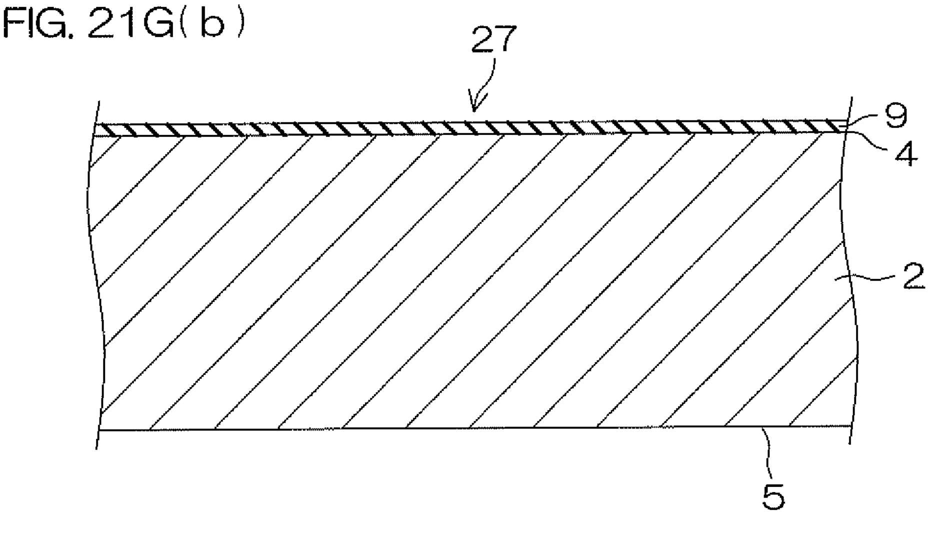

FIG. 21G(a) is a schematic sectional view showing a step subsequent to that in FIG. 21F(a), and FIG. 21G(b) shows a cutting plane on the same position as that in FIG. 20(*b*) at the same point of time as that in FIG. 21G(a).

Figure 21H:
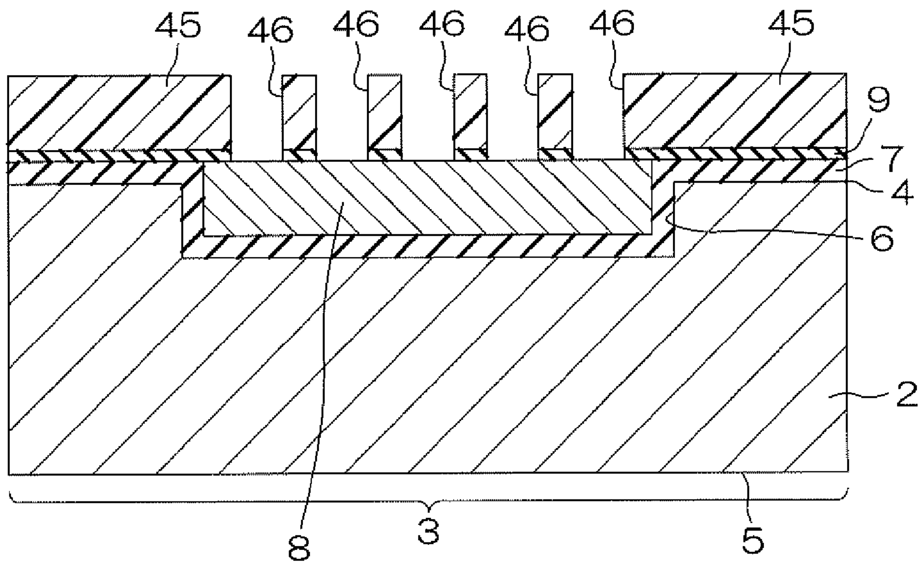
Figure 21H:
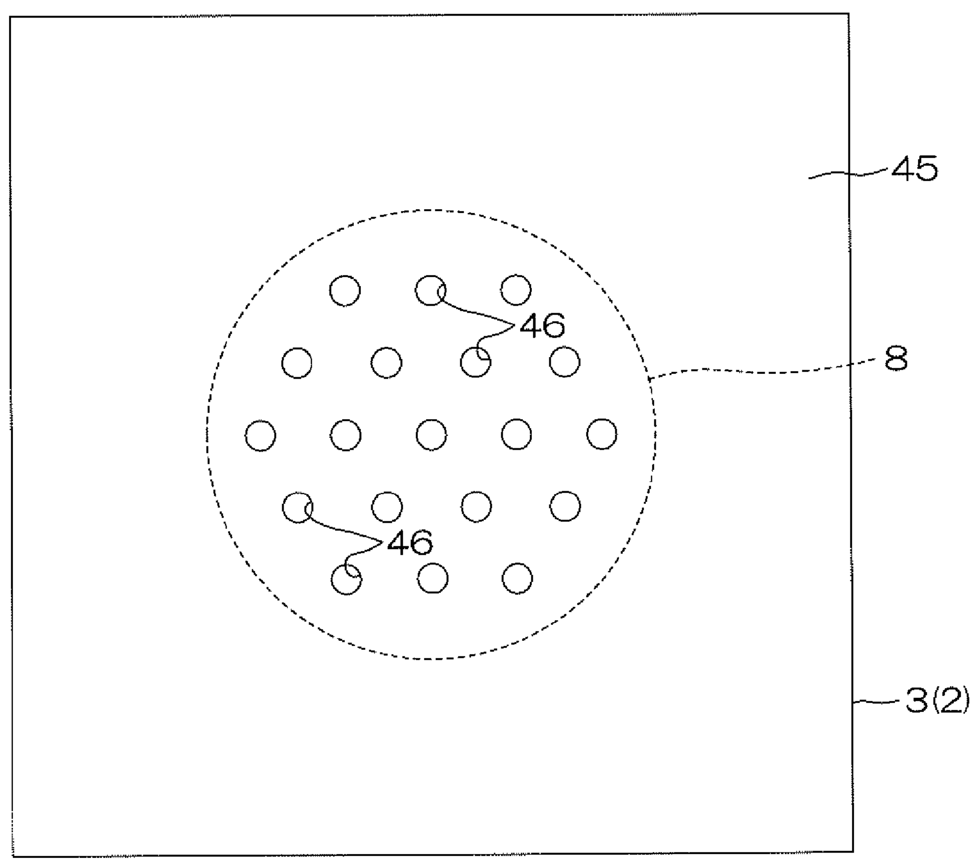
Figure 21:
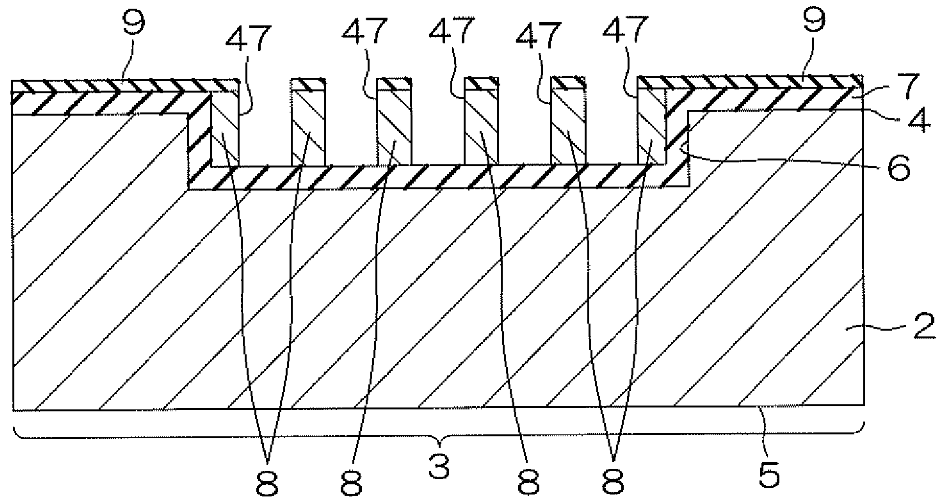
Figure 21:
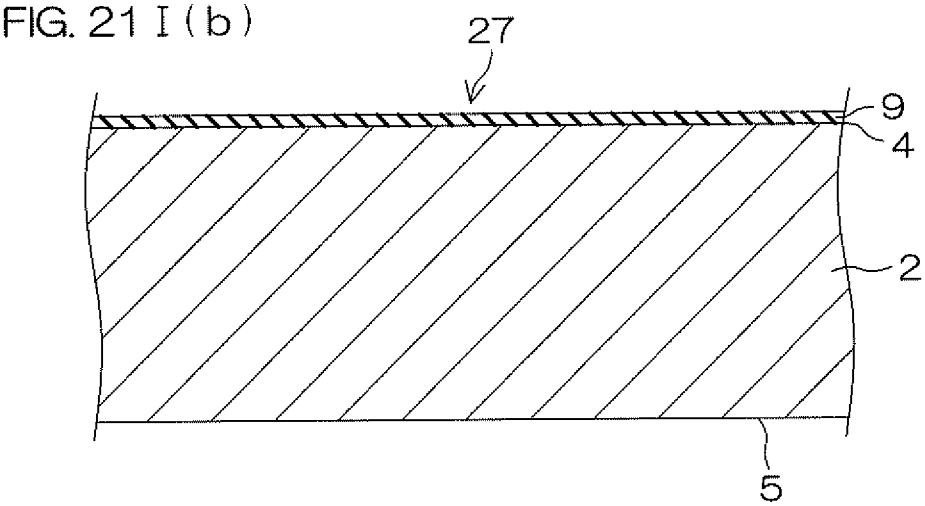

FIG. 21H(a) is a schematic sectional view showing a step subsequent to that in FIG. 21G(a), and FIG. 21H(b) is a plan view in the state of FIG. 21H(a).

FIG. 21I(a) is a schematic sectional view showing a step subsequent to that in FIG. 21H(a), and FIG. 21I(b) shows a cutting plane on the same position as that in FIG. 20(*b*) at the same point of time as that in FIG. 21I(a).

Figure 21J:
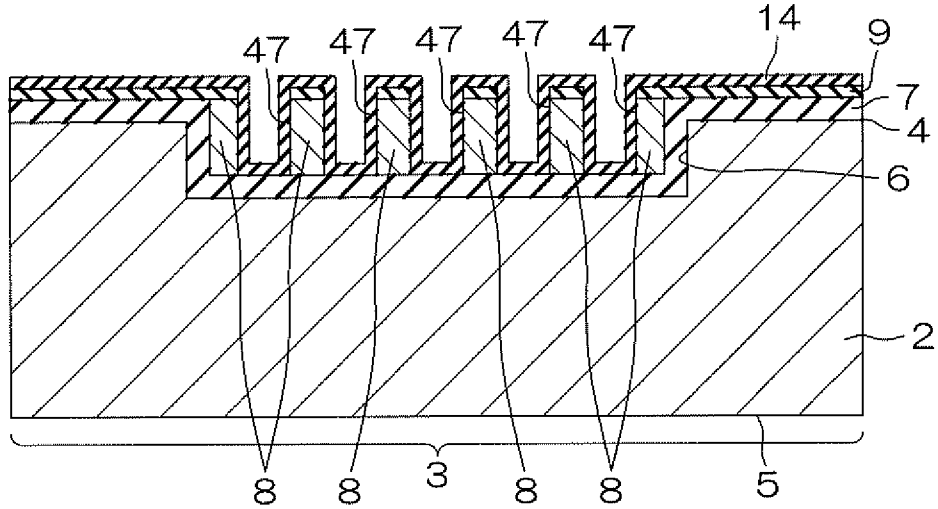
Figure 21J:
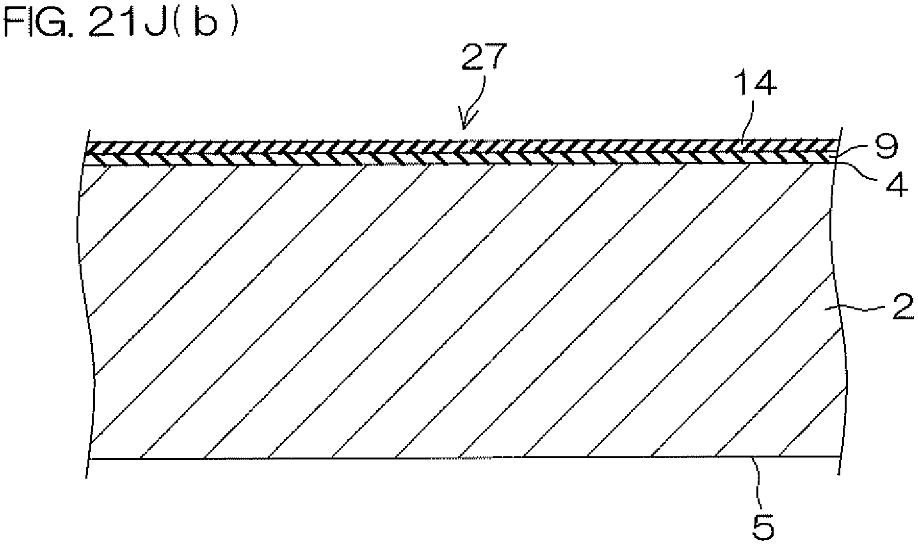

FIG. 21J(a) is a schematic sectional view showing a step subsequent to that in FIG. 21I(a), and FIG. 21J(b) shows a cutting plane on the same position as that in FIG. 20(*b*) at the same point of time as that in FIG. 21J(a).

Figure 21K:
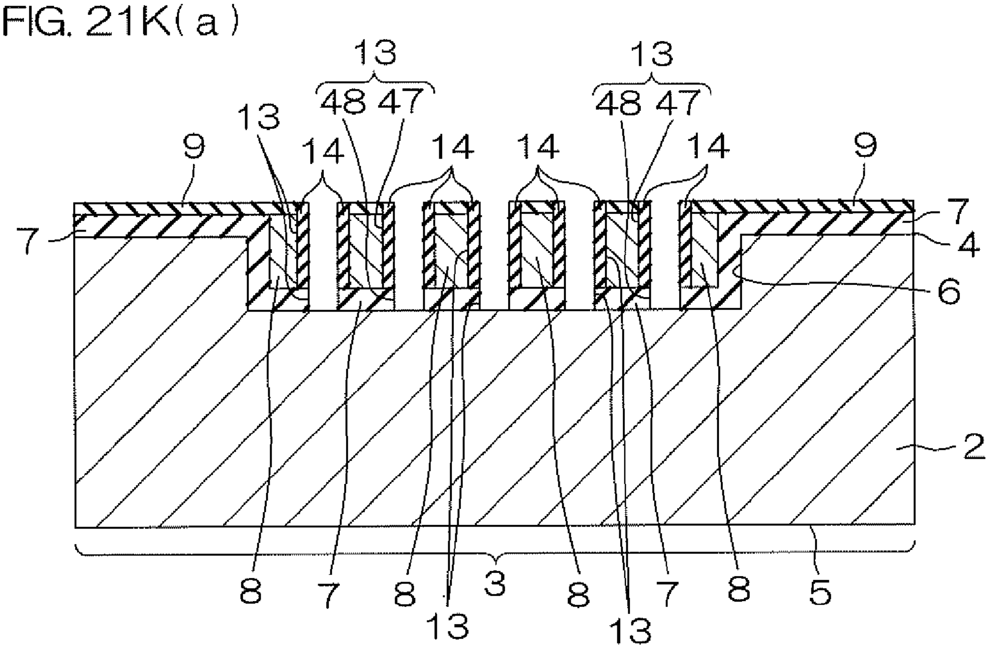
Figure 21K:
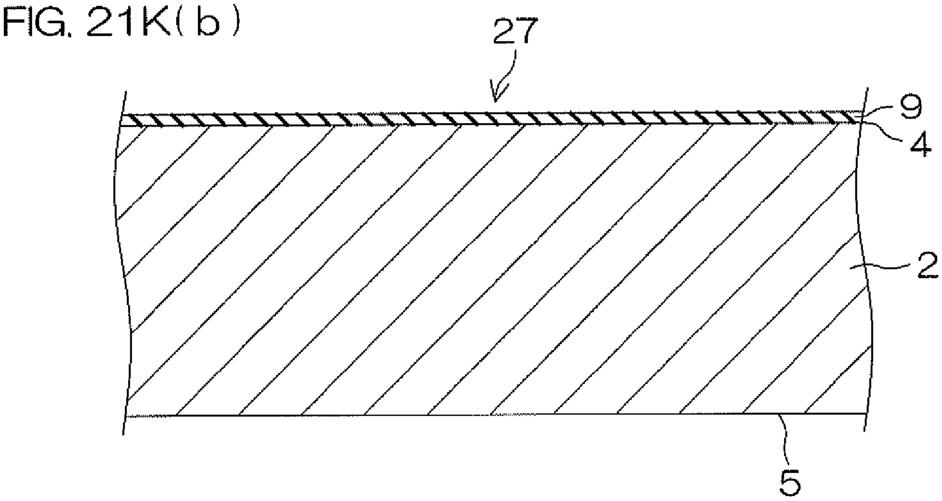

FIG. 21K(a) is a schematic sectional view showing a step subsequent to that in FIG. 21J(a), and FIG. 21K(b) shows a cutting plane on the same position as that in FIG. 20(*b*) at the same point of time as that in FIG. 21K(a).

Figure 21L:
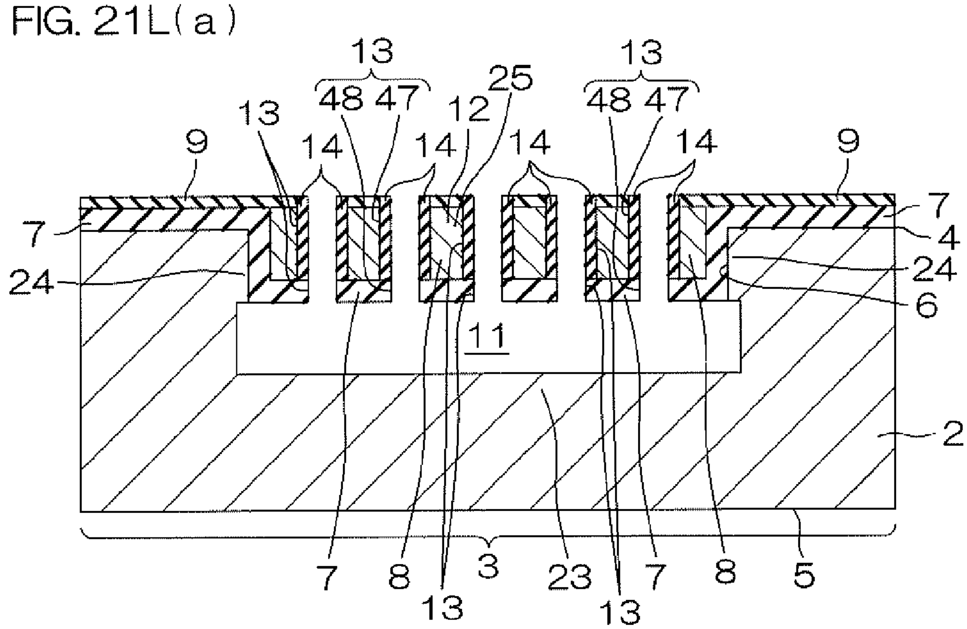
Figure 21L:
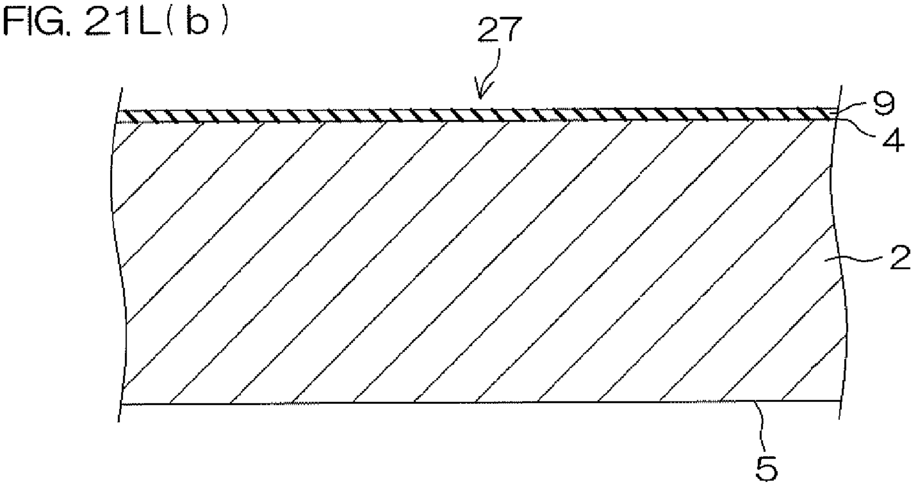

FIG. 21L(a) is a schematic sectional view showing a step subsequent to that in FIG. 21K(a), and FIG. 21L(b) shows a cutting plane on the same position as that in FIG. 20(*b*) at the same point of time as that in FIG. 21L(a).

Figure 21M:
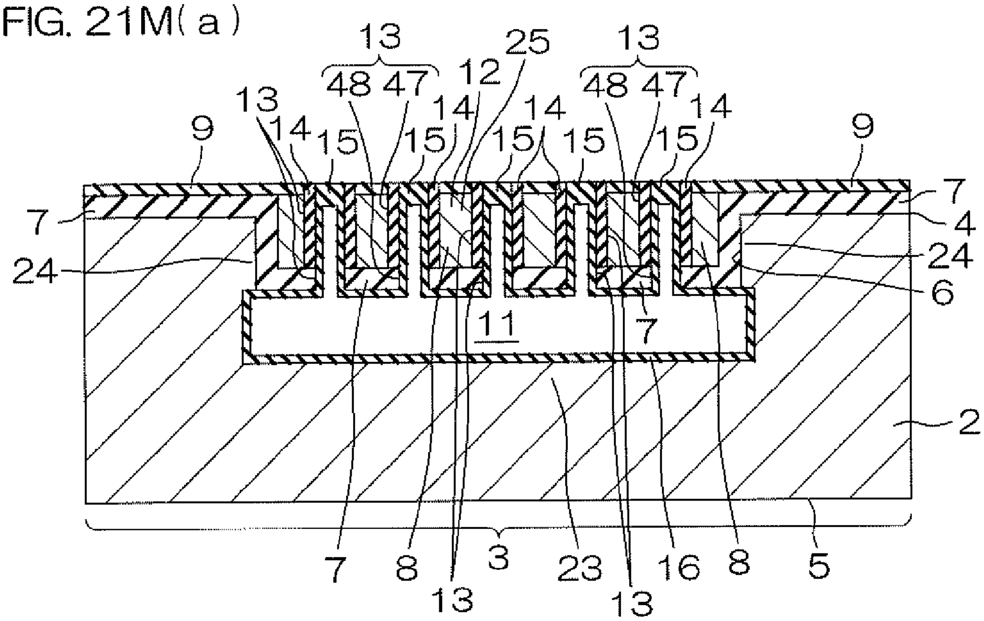
Figure 21M:
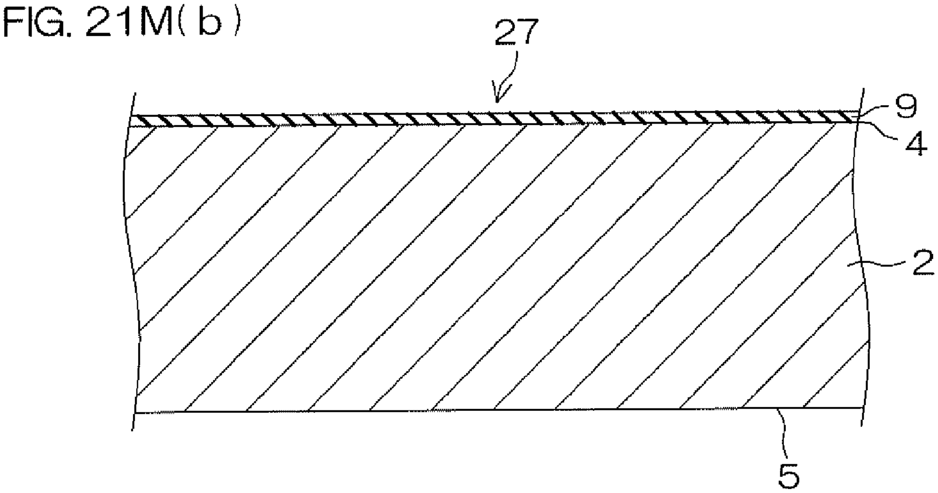

FIG. 21M(a) is a schematic sectional view showing a step subsequent to that in FIG. 21L(a), and FIG. 21M(b) shows a cutting plane on the same position as that in FIG. 20(*b*) at the same point of time as that in FIG. 21M(a).

Figure 21N:
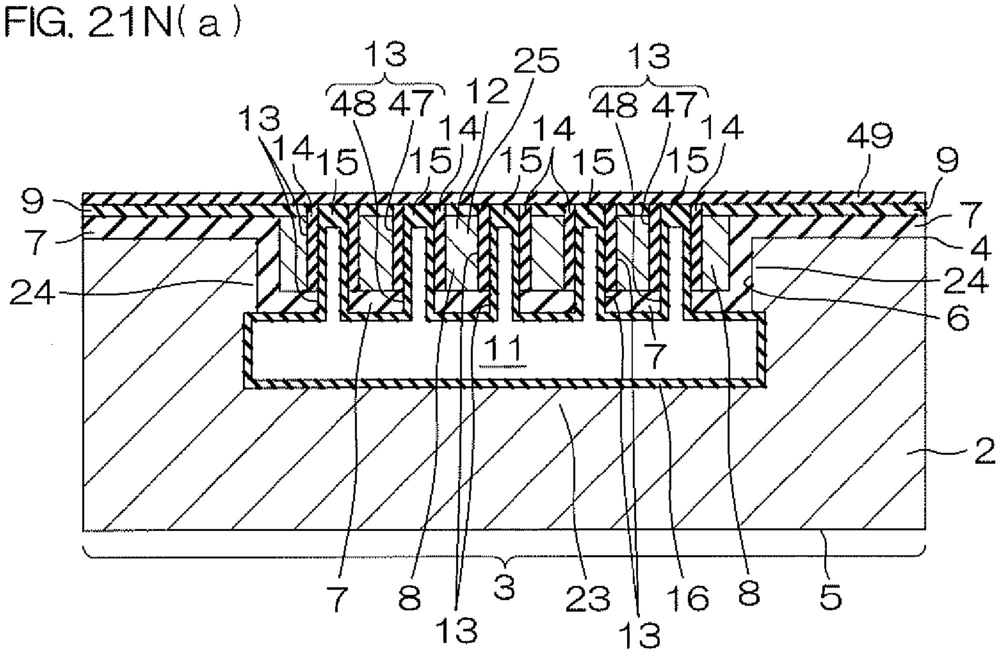
Figure 21N:
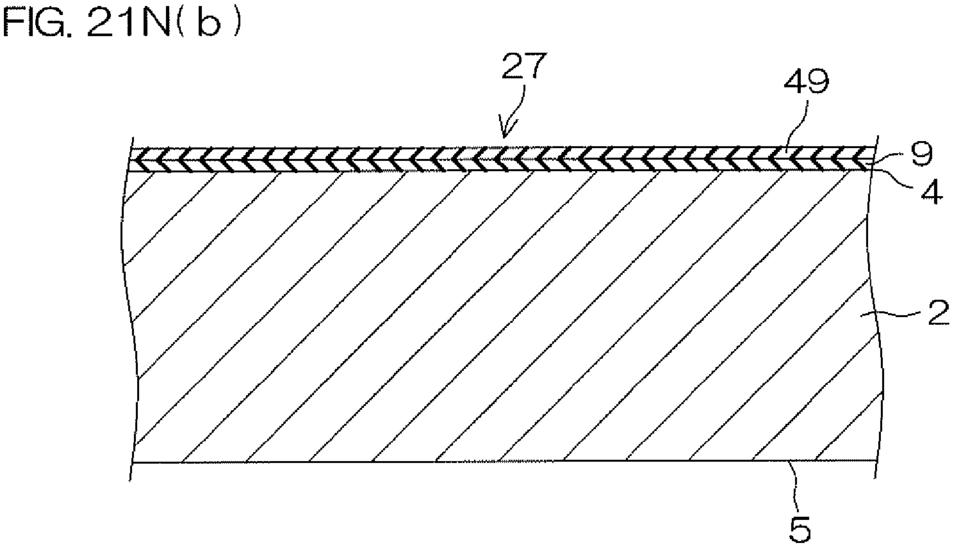
Figure 210:
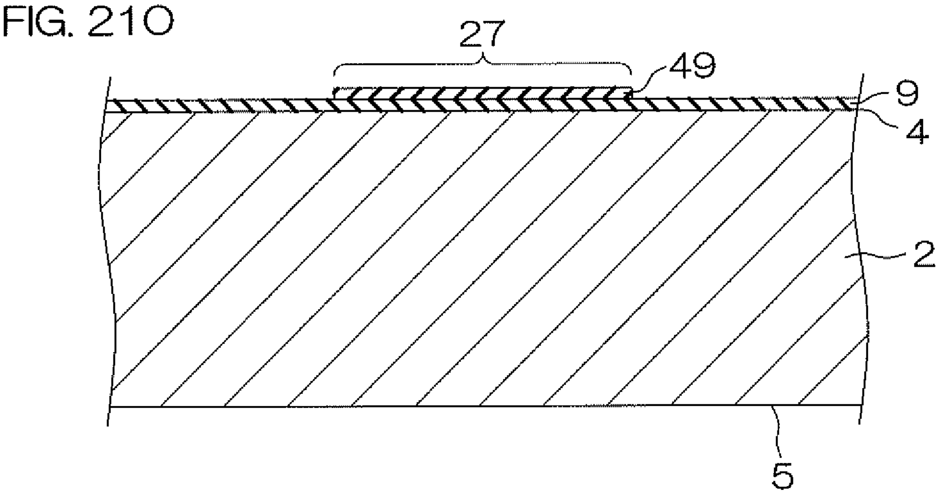

FIG. 21N(a) is a schematic sectional view showing a step subsequent to that in FIG. 21M(a), and FIG. 21N(b) shows a cutting plane on the same position as that in FIG. 20(*b*) at the same point of time as that in FIG. 21N(a).

FIG. 21O is a schematic sectional view showing a step subsequent to that in FIG. 21N(b).

Figure 21P:
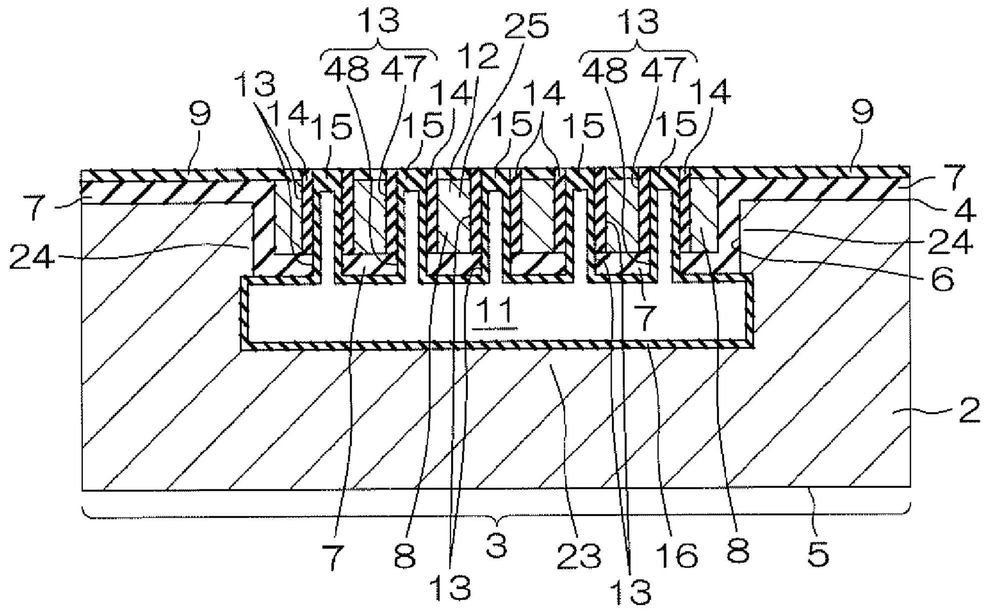
Figure 21P:
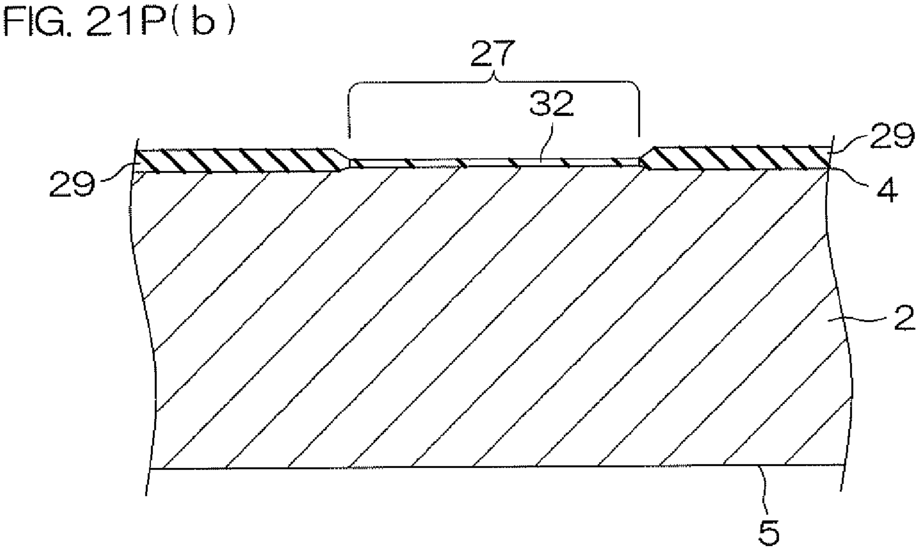

FIG. 21P(a) shows a cutting plane on the same position as that in FIG. 20(*a*) illustrating a step subsequent to that in FIG. 21O, and FIG. 21P(b) shows a cutting plane on the same position as that in FIG. 20(*b*) at the same point of time as that in FIG. 21P(a).

Figure 21Q:
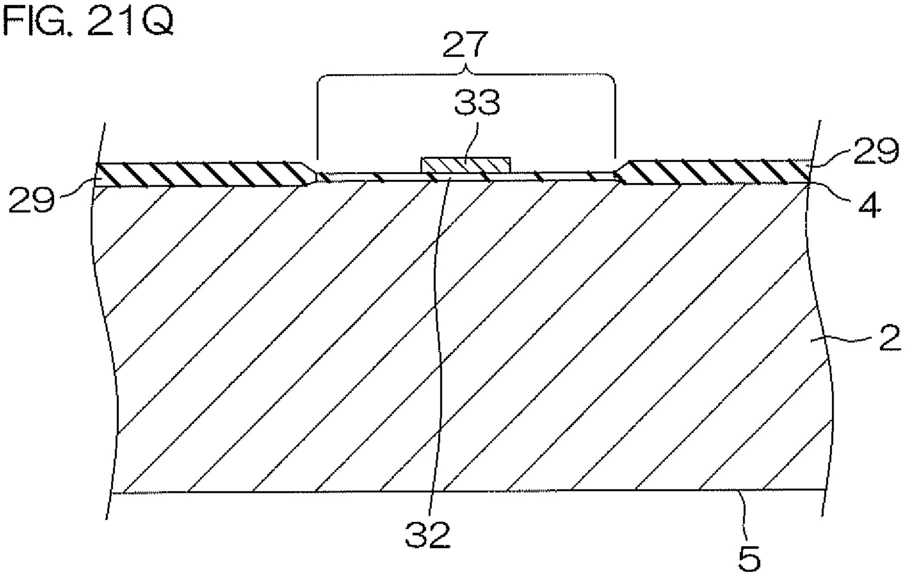

FIG. 21Q is a schematic sectional view showing a step subsequent to that in FIG. 21P(b).

Figure 21R:
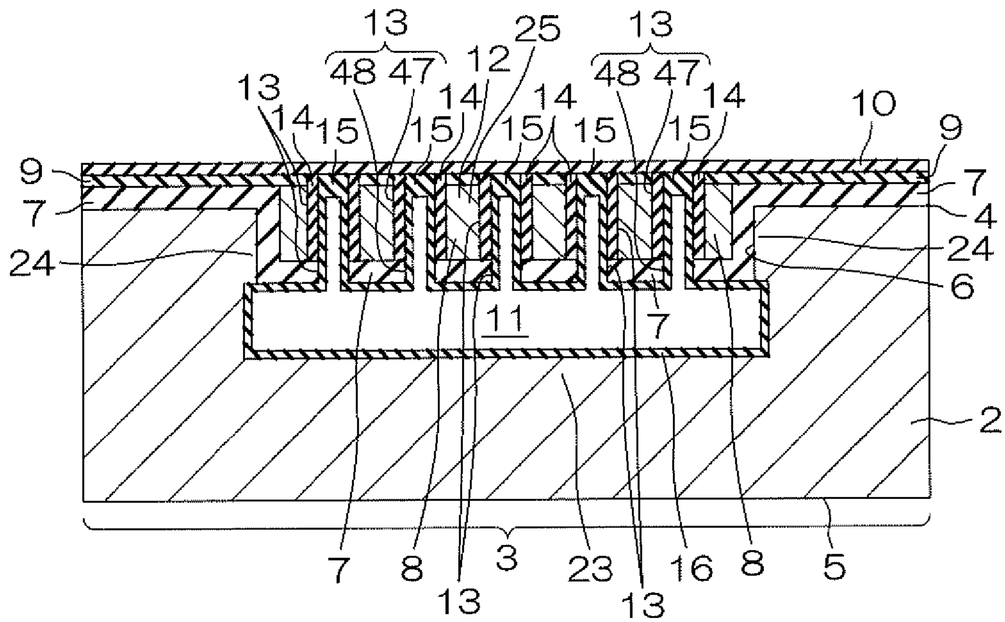
Figure 21R:
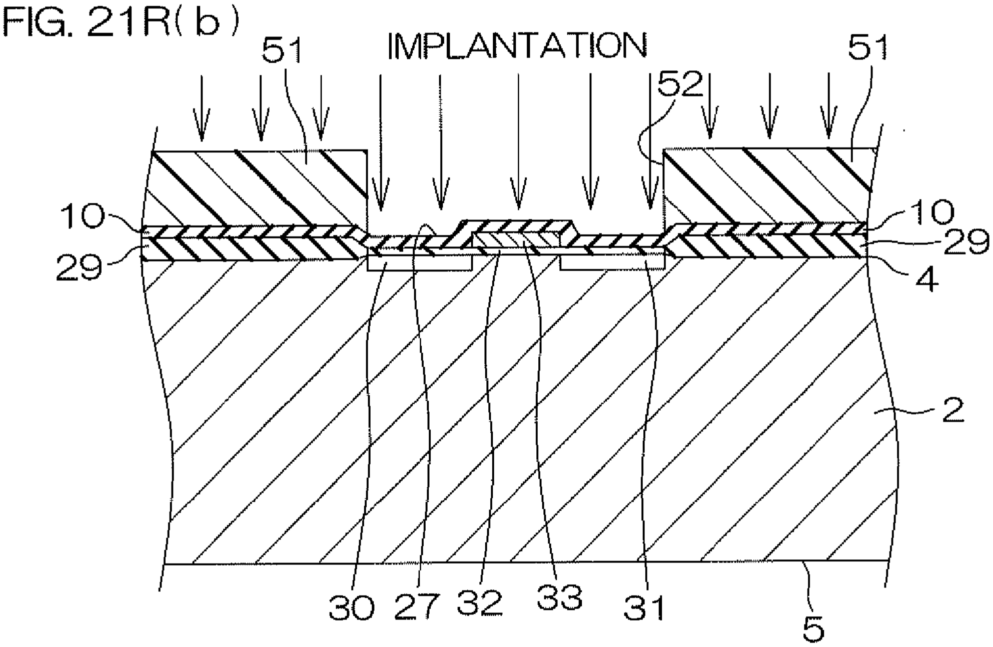

FIG. 21R(a) shows a cutting plane on the same position as that in FIG. 20(*a*) illustrating a step subsequent to that in FIG. 21Q, and FIG. 21R(b) shows a cutting plane on the same position as that in FIG. 20(*b*) at the same point of time as that in FIG. 21R(a).

Figure 22A:
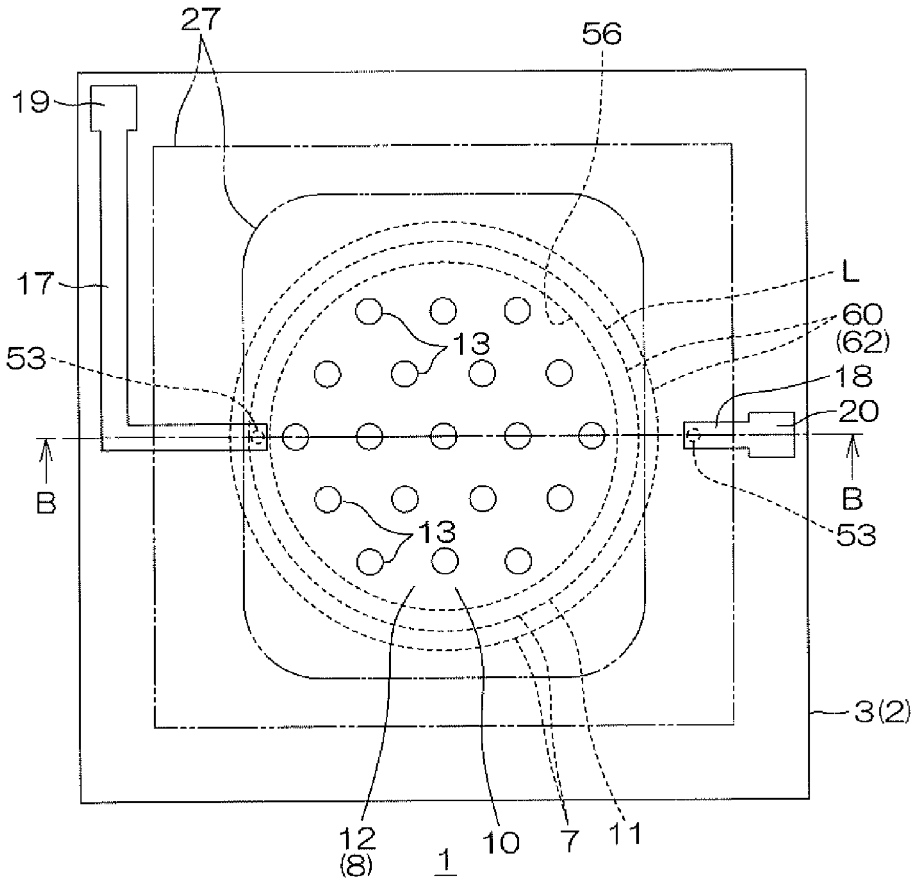
Figure 22B:
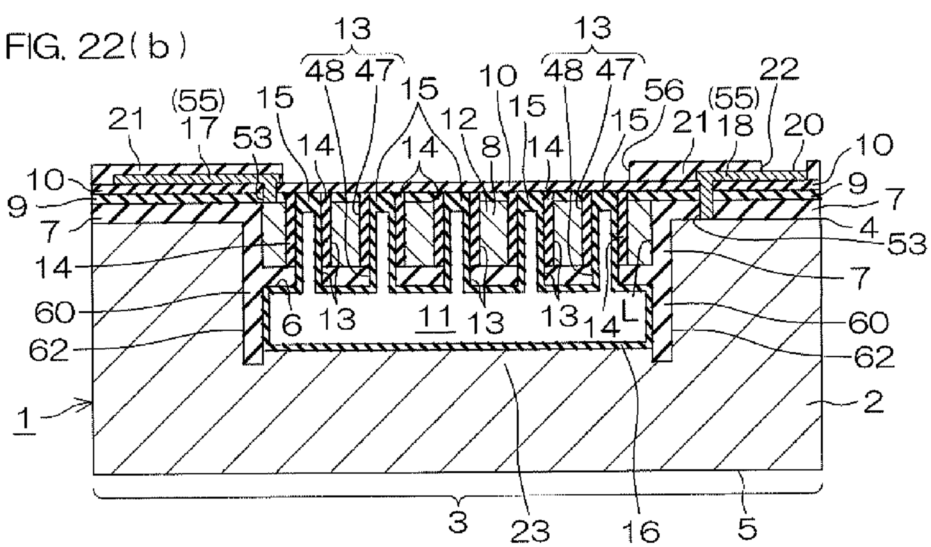

FIG. 22(*a*) is an enlarged plan view of a pressure sensor according to a ninth embodiment, and FIG. 22(*b*) is a sectional view along a cutting plane line B-B in FIG. 22(*a*).

Figure 23A:
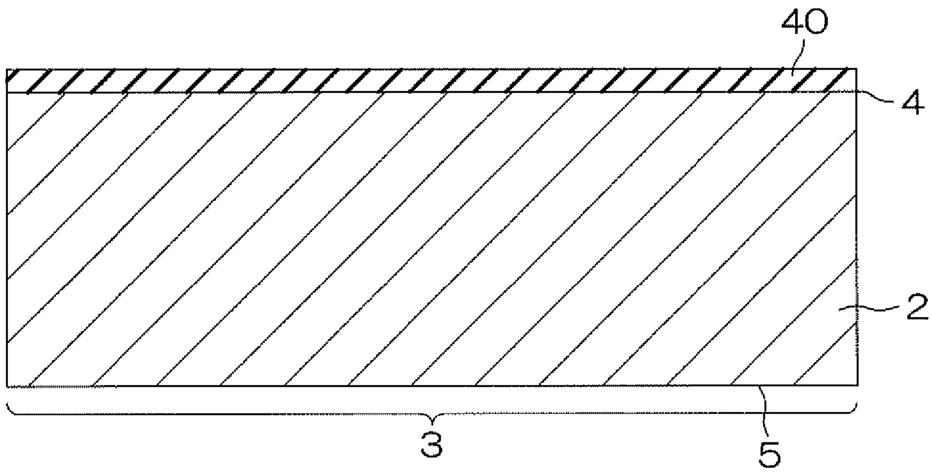
Figure 23A:
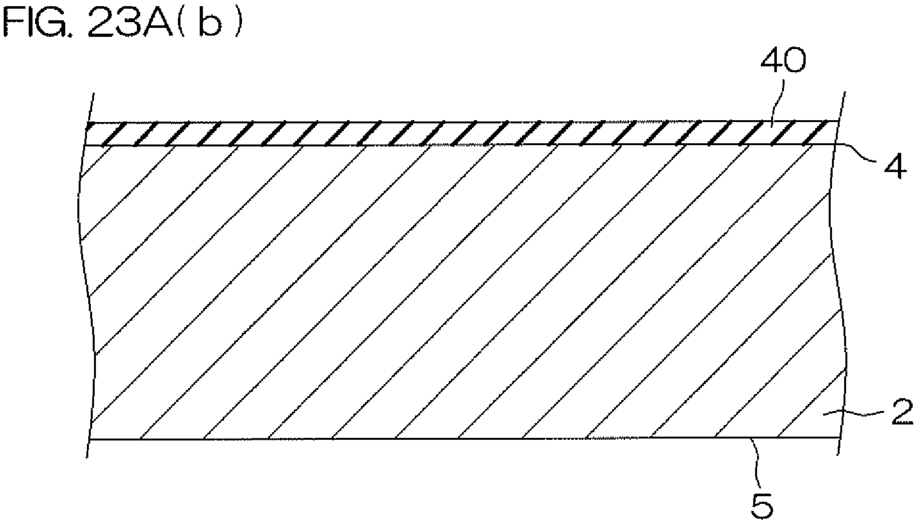

FIG. 23A(a) is a schematic sectional view showing a manufacturing step for the pressure sensor according to the ninth embodiment and shows a cutting plane on the same position as that in FIG. 22(*b*), while FIG. 23A(b) shows a cutting plane on the same position as that in FIG. 20(*b*) at the same point of time as that in FIG. 23A(a).

Figure 23B:
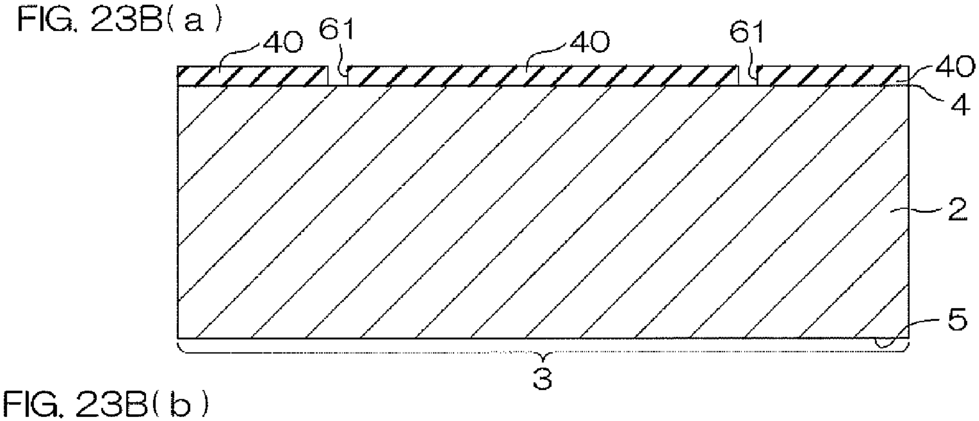
Figure 23B:
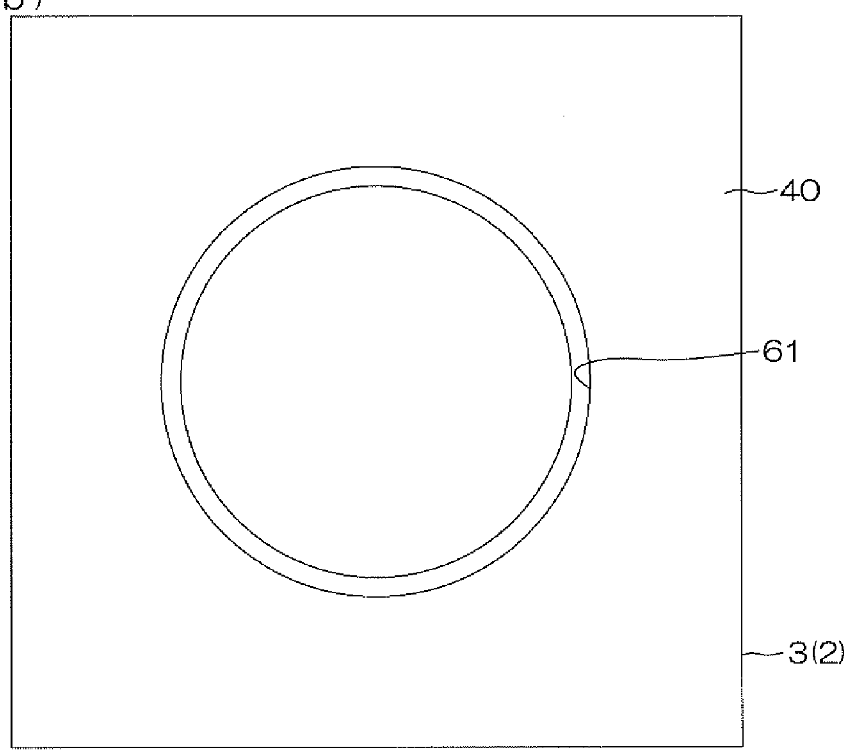
Figure 23B:
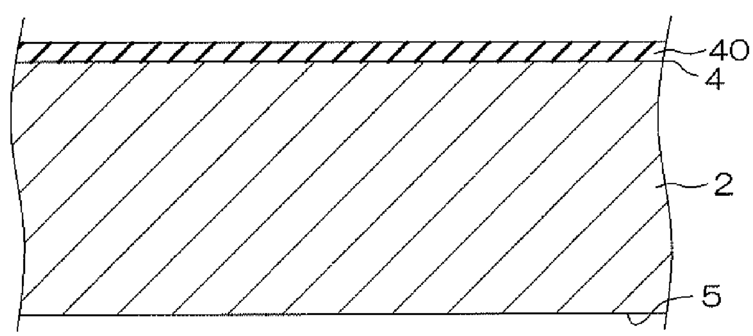

FIG. 23B(a) is a schematic sectional view showing a step subsequent to that in FIG. 23A(a), FIG. 23B(b) is a plan view in the state of FIG. 23B(a), and FIG. 23B(c) shows a cutting plane on the same position as that in FIG. 20(*b*) at the same point of time as that in FIG. 23B(a).

Figure 23C:
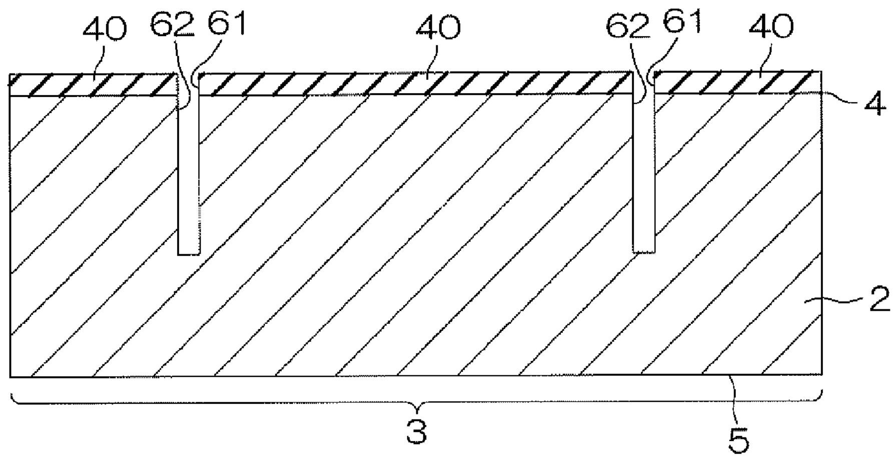
Figure 23C:
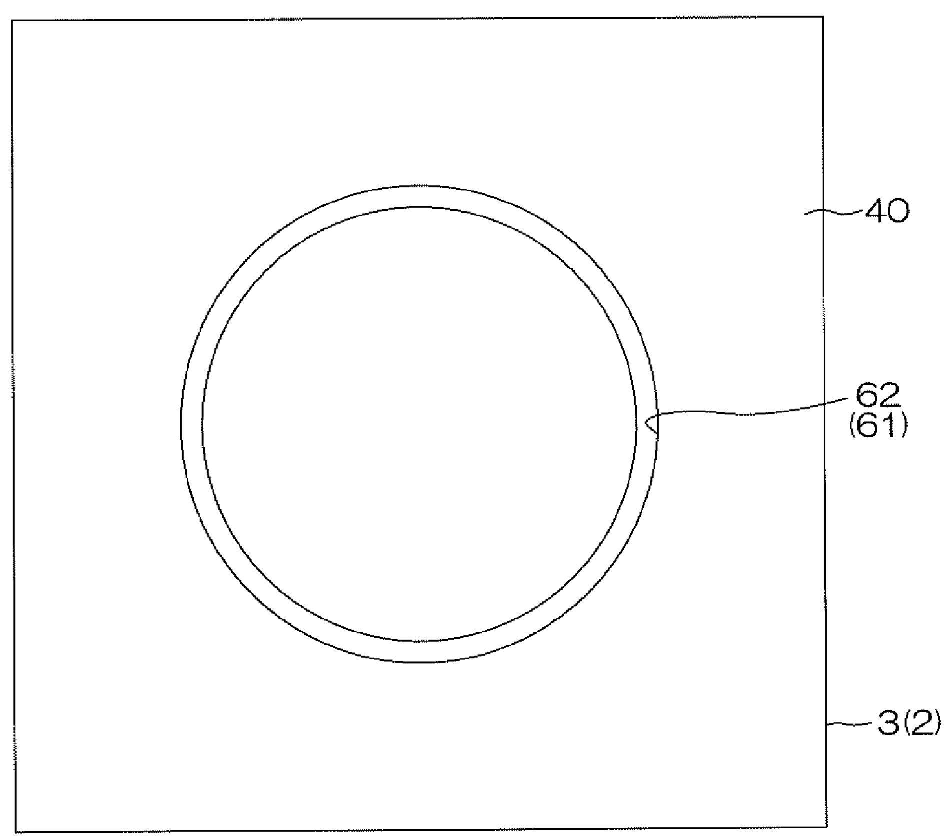

FIG. 23C(a) is a schematic sectional view showing a step subsequent to that in FIG. 23B(a), and FIG. 23C(b) is a plan view in the state of FIG. 23C(a).

Figure 23D:
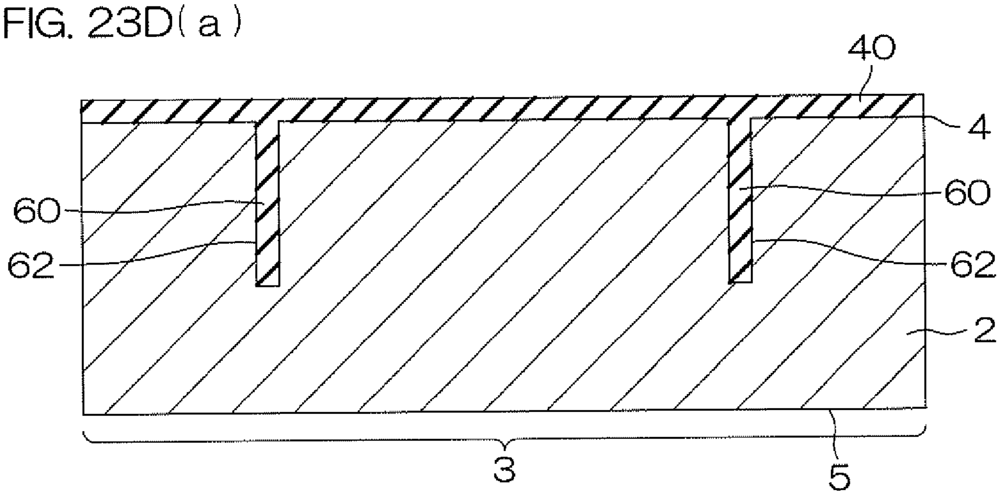
Figure 23D:
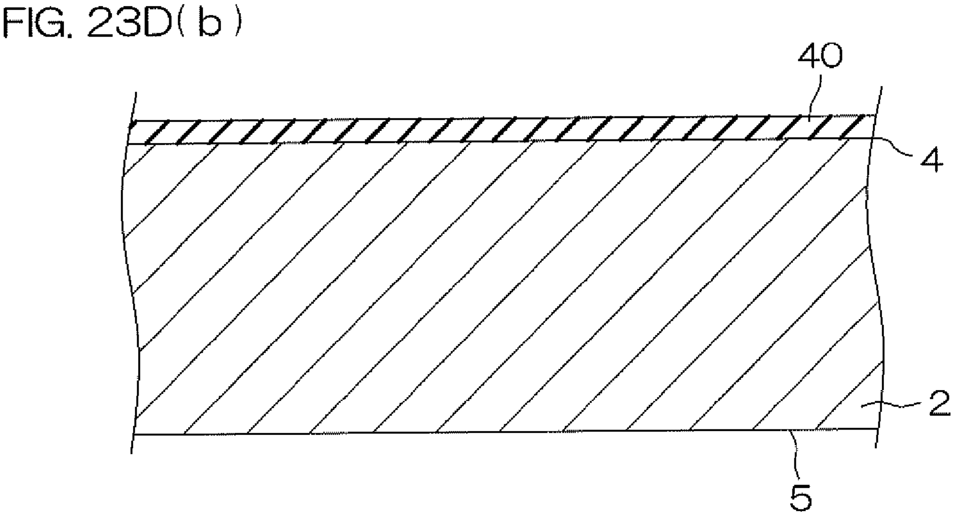

FIG. 23D(a) is a schematic sectional view showing a step subsequent to that in FIG. 23C(a), and FIG. 23D(b) shows a cutting plane on the same position as that in FIG. 20(*b*) at the same point of time as that in FIG. 23D(a).

Figure 23E:
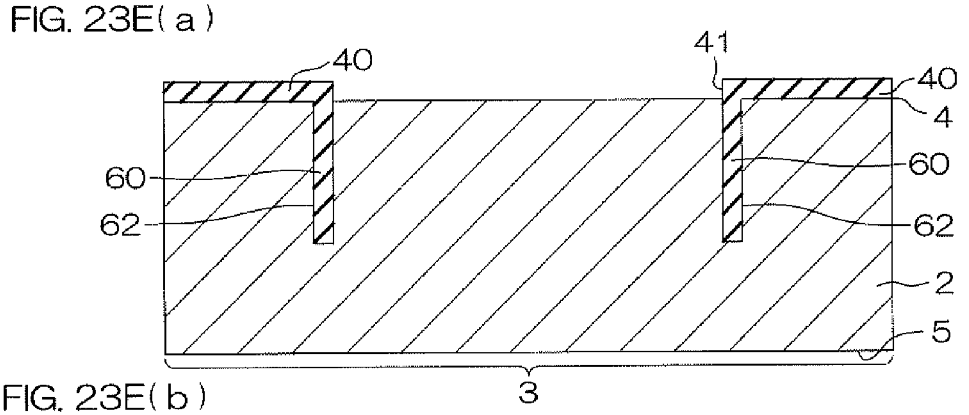
Figure 23E:
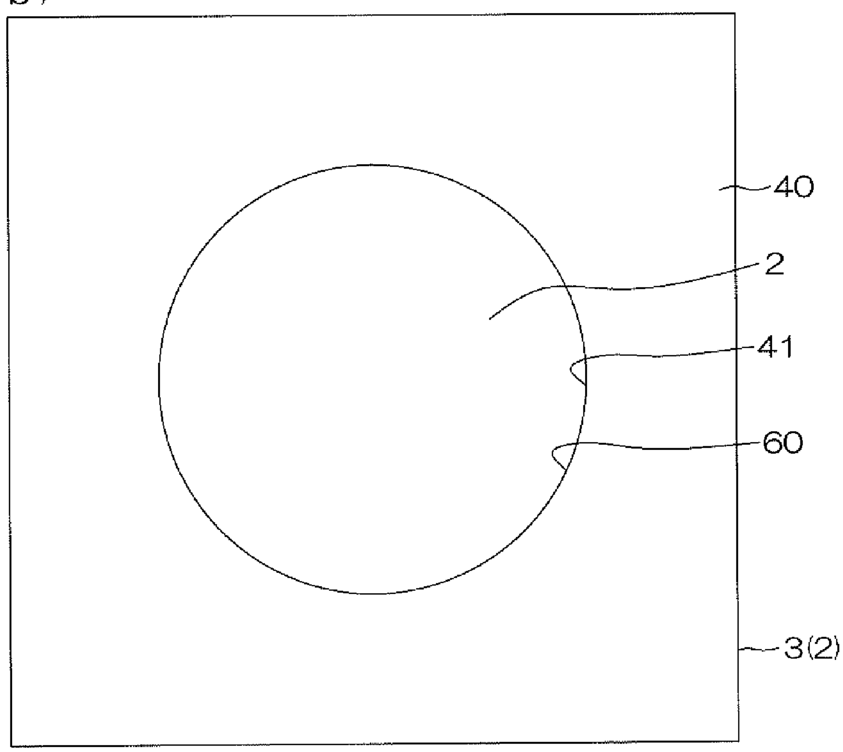
Figure 23E:
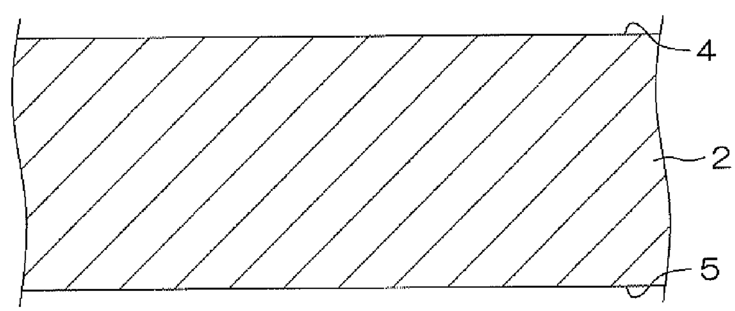

FIG. 23E(a) is a schematic sectional view showing a step subsequent to that in FIG. 23D(a), FIG. 23E(b) is a plan view in the state of FIG. 23E(a), and FIG. 23E(c) shows a cutting plane on the same position as that in FIG. 20(*b*) at the same point of time as that in FIG. 23E(a).

Figure 23F:
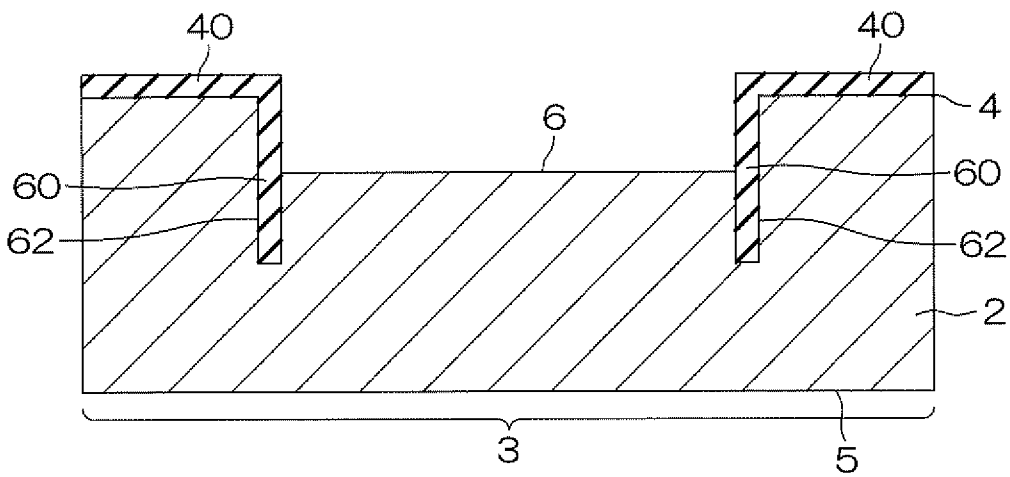

FIG. 23F is a schematic sectional view showing a step subsequent to that in FIG. 23E(a).

Figure 23G:
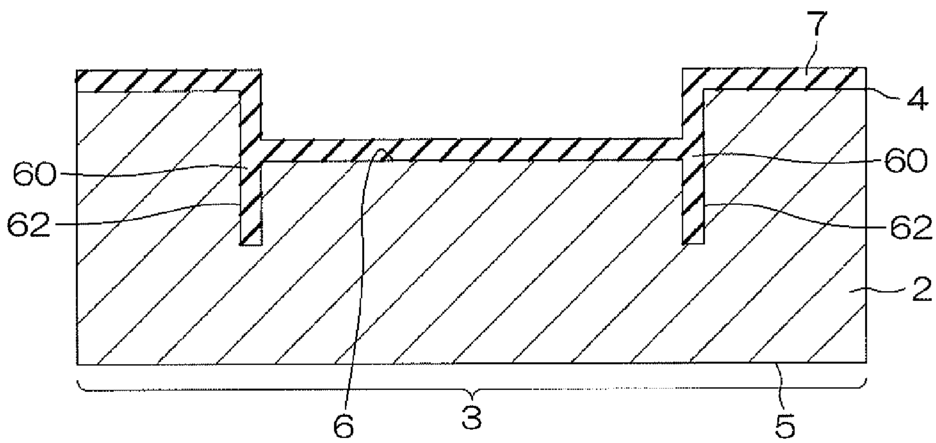
Figure 23G:
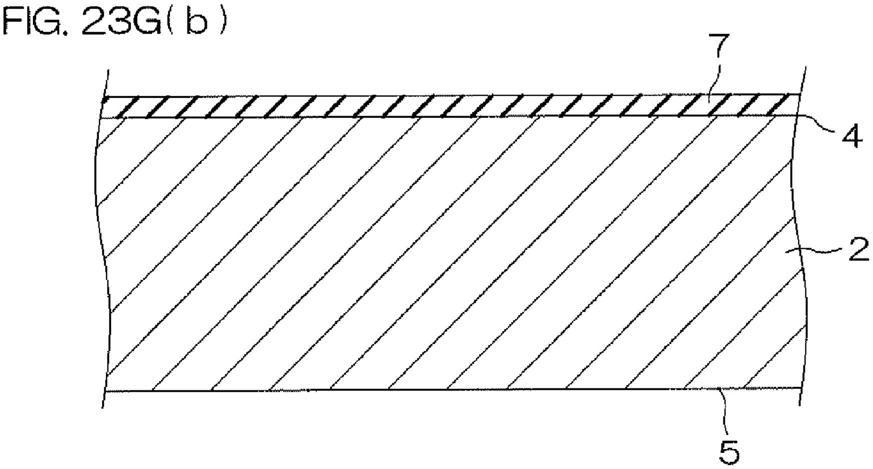
Figure 23:
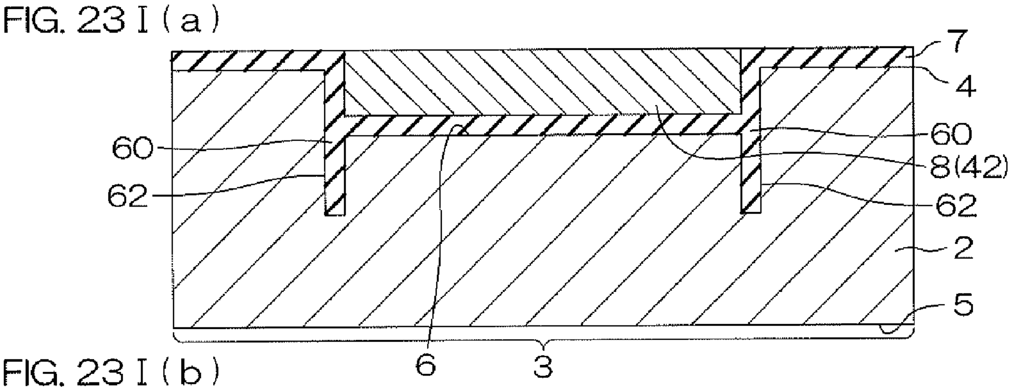
Figure 23:
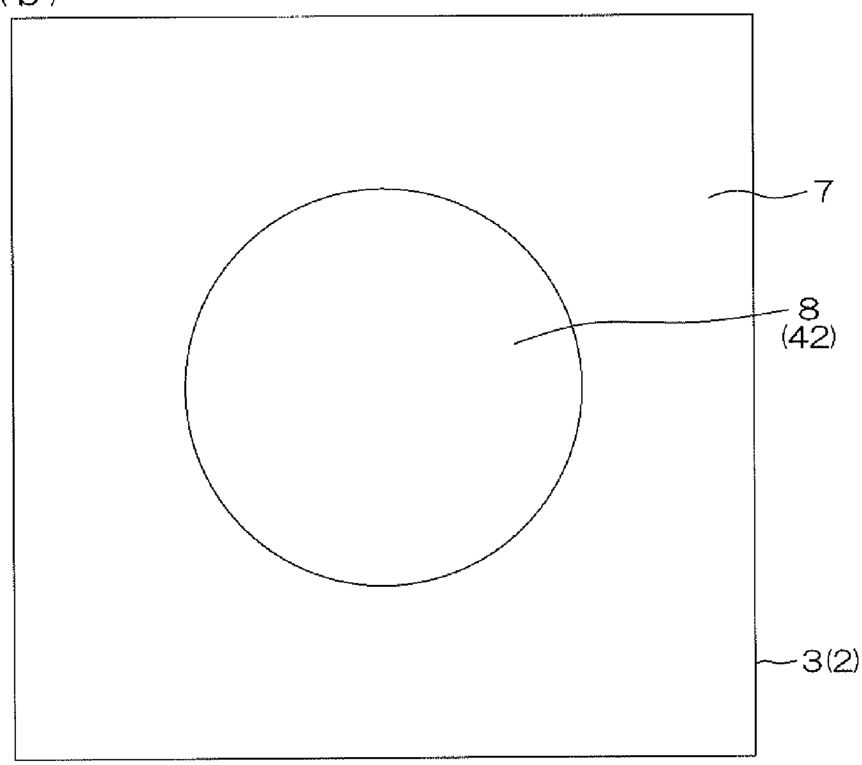
Figure 23:
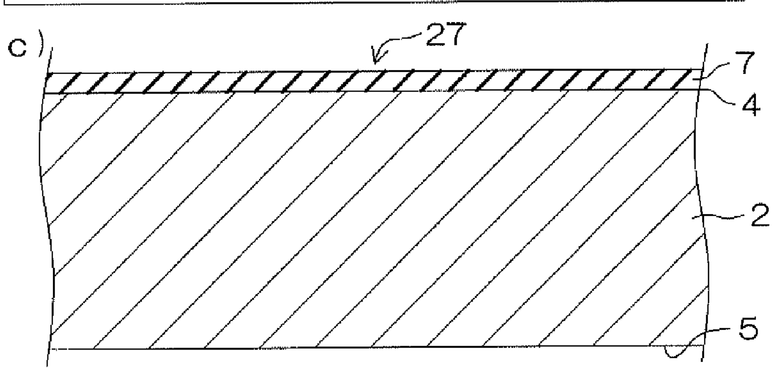

FIG. 23G(a) is a schematic sectional view showing a step subsequent to that in FIG. 23F, and FIG. 23G(b) shows a cutting plane on the same position as that in FIG. 20(*b*) at the same point of time as that in FIG. 23G(a).

FIG. 23H(a) is a schematic sectional view showing a step subsequent to that in FIG. 23G(a), and FIG. 23H(b) shows a cutting plane on the same position as that in FIG. 20(*b*) at the same point of time as that in FIG. 23H(a).

FIG. 23I(a) is a schematic sectional view showing a step subsequent to that in FIG. 23H(a), FIG. 23I(b) is a plan view in the state of FIG. 23I(a), and FIG. 23I(c) shows a cutting plane on the same position as that in FIG. 20(*b*) at the same point of time as that in FIG. 23I(a).

FIG. 23J(a) is a schematic sectional view showing a step subsequent to that in FIG. 23I(a), and FIG. 23J(b) shows a cutting plane on the same position as that in FIG. 20(*b*) at the same point of time as that in FIG. 23J(a).

Figure 23K:
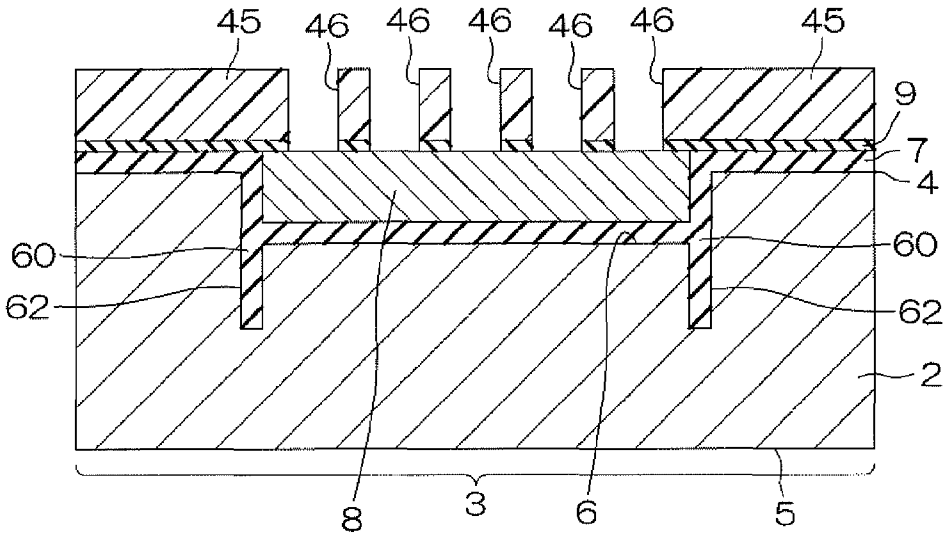
Figure 23K:
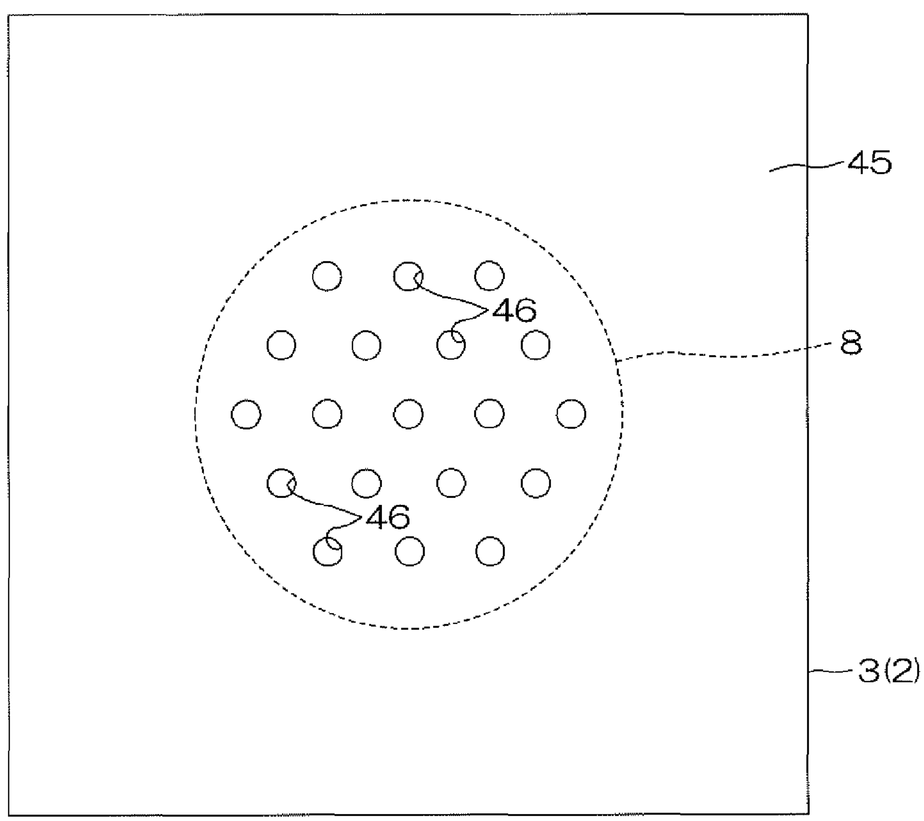

FIG. 23K(a) is a schematic sectional view showing a step subsequent to that in FIG. 23J(a), and FIG. 23K(b) is a plan view in the state of FIG. 23K(a).

Figure 23L:
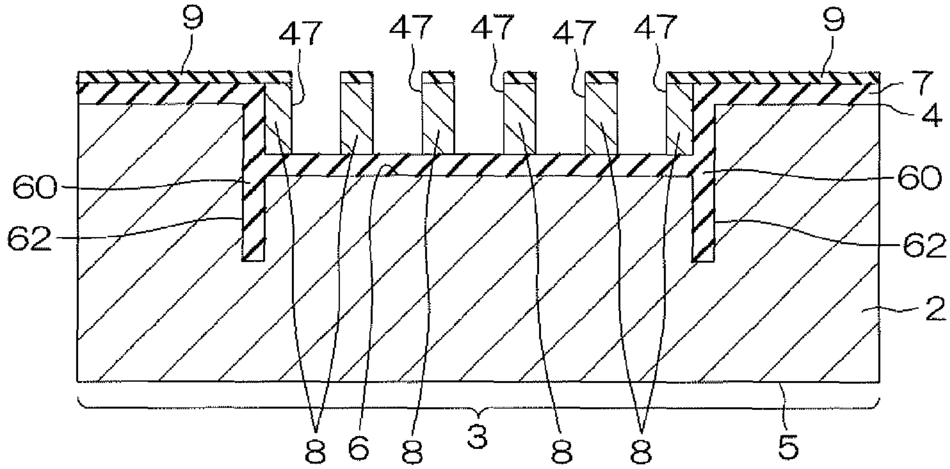
Figure 23L:
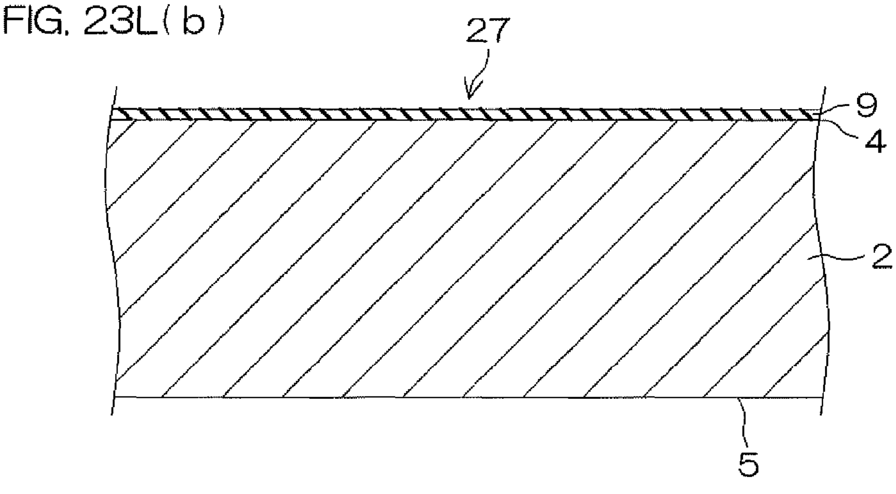
Figure 230A:
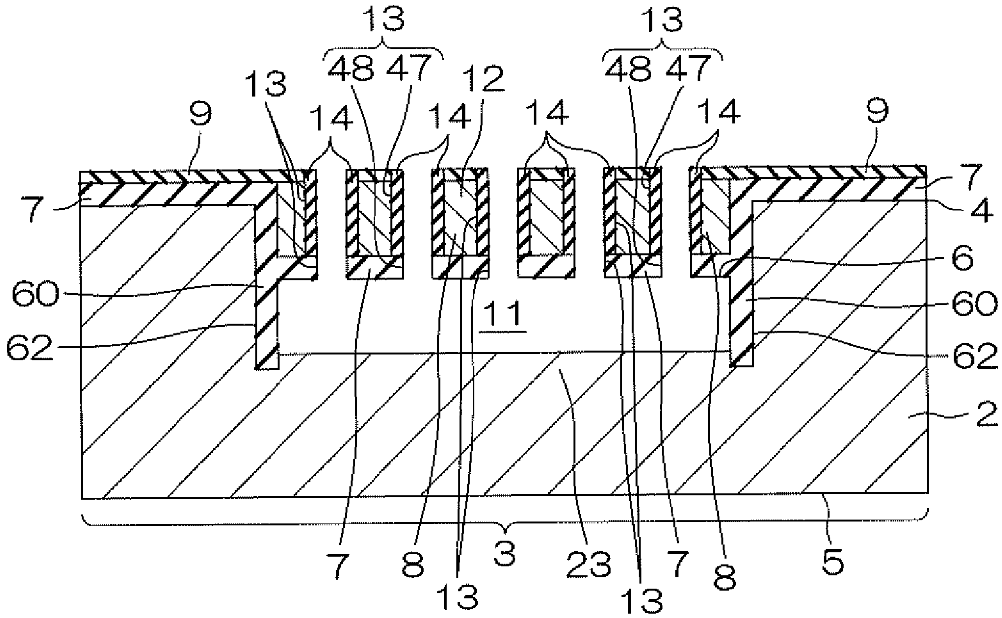
Figure 230B:
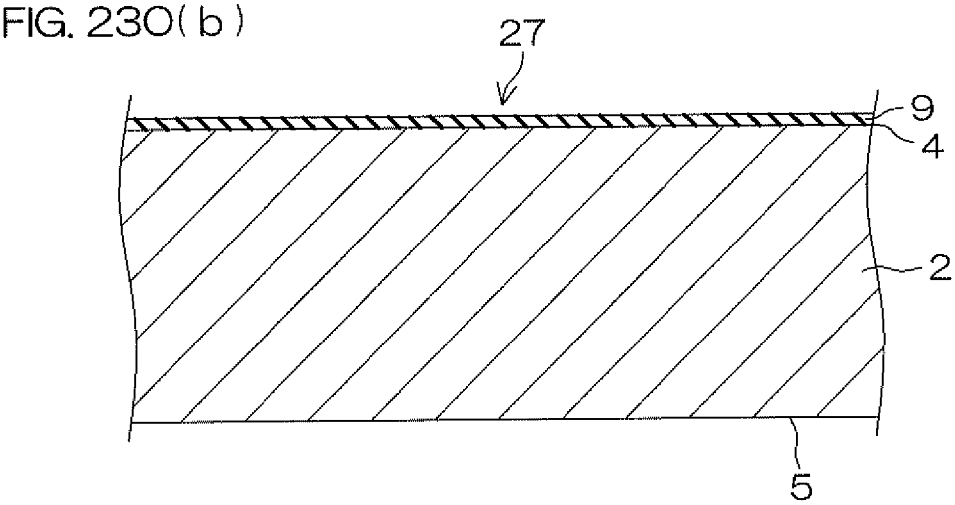

FIG. 23L(a) is a schematic sectional view showing a step subsequent to that in FIG. 23K(a), and FIG. 23L(b) shows a cutting plane on the same position as that in FIG. 20(*b*) at the same point of time as that in FIG. 23L(a).

FIG. 23M(a) is a schematic sectional view showing a step subsequent to that in FIG. 23L(a), and FIG. 23M(b) shows a cutting plane on the same position as that in FIG. 20(*b*) at the same point of time as that in FIG. 23M(a).

FIG. 23N(a) is a schematic sectional view showing a step subsequent to that in FIG. 23M(a), and FIG. 23N(b) shows a cutting plane on the same position as that in FIG. 20(*b*) at the same point of time as that in FIG. 23N(a).

FIG. 23O(a) is a schematic sectional view showing a step subsequent to that in FIG. 23N(a), and FIG. 23O(b) shows a cutting plane on the same position as that in FIG. 20(*b*) at the same point of time as that in FIG. 23O(a).

Figure 23P:
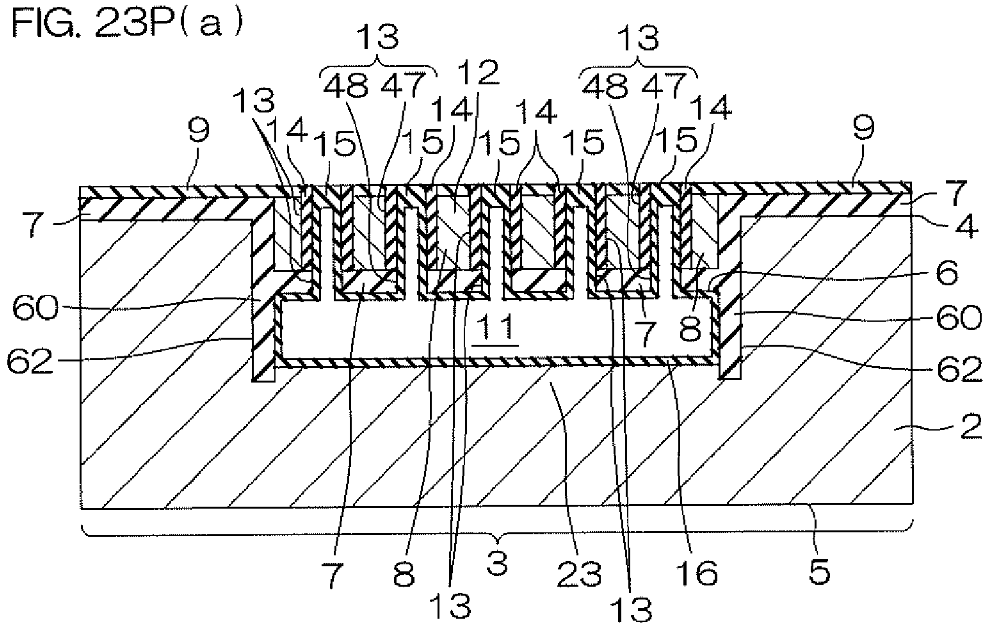
Figure 23P:
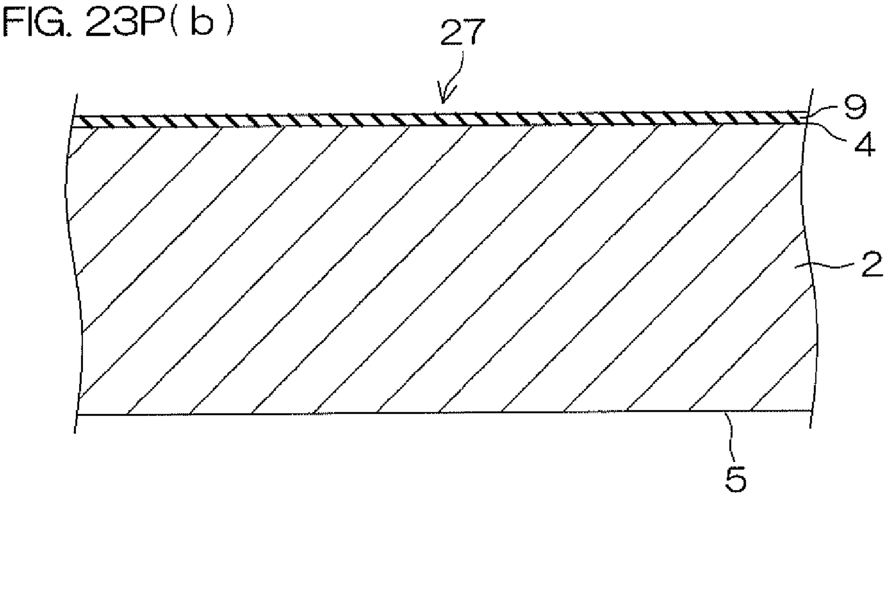

FIG. 23P(a) is a schematic sectional view showing a step subsequent to that in FIG. 23O(a), and FIG. 23P(b) shows a cutting plane on the same position as that in FIG. 20(*b*) at the same point of time as that in FIG. 23P(a).

Figure 23Q:
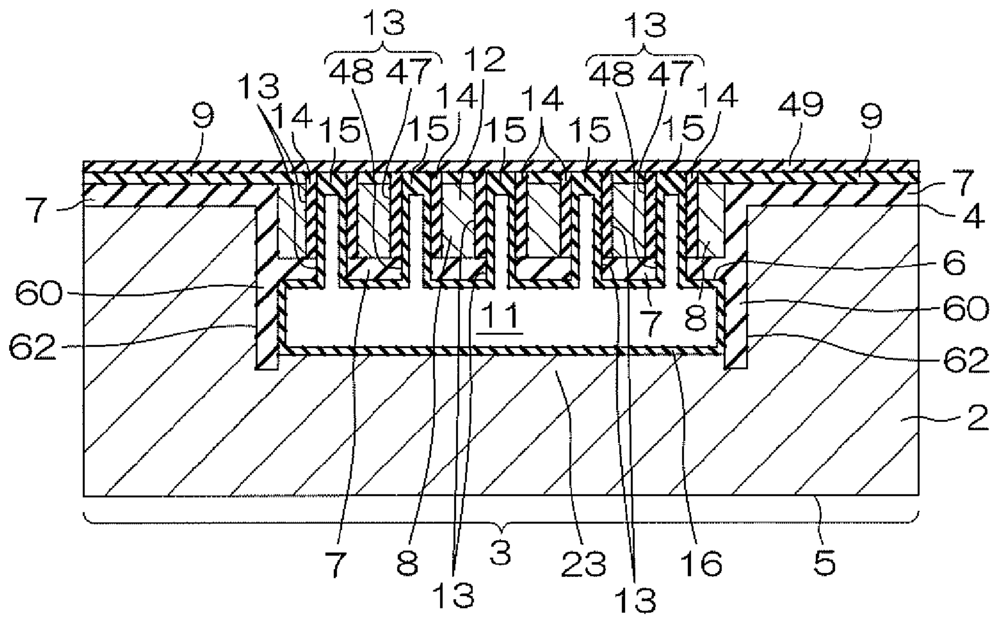
Figure 23Q:
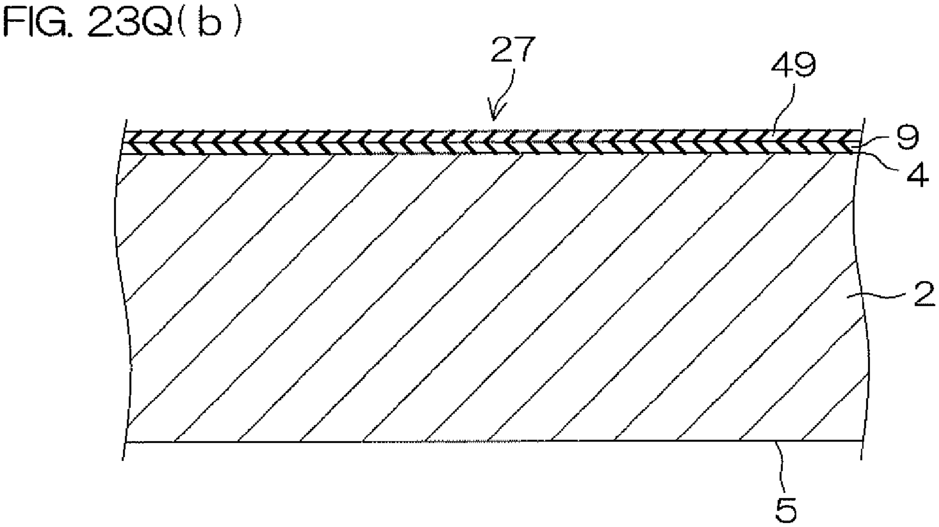

FIG. 23Q(a) is a schematic sectional view showing a step subsequent to that in FIG. 23P(a), and FIG. 23Q(b) shows a cutting plane on the same position as that in FIG. 20(*b*) at the same point of time as that in FIG. 23Q(a).

Figure 23R:
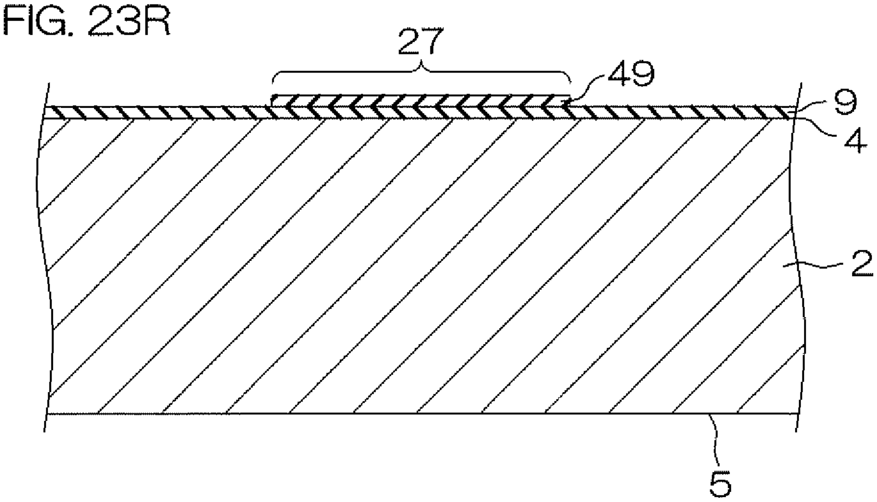

FIG. 23R is a schematic sectional view showing a step subsequent to that in FIG. 23Q(a).

Figure 23S:
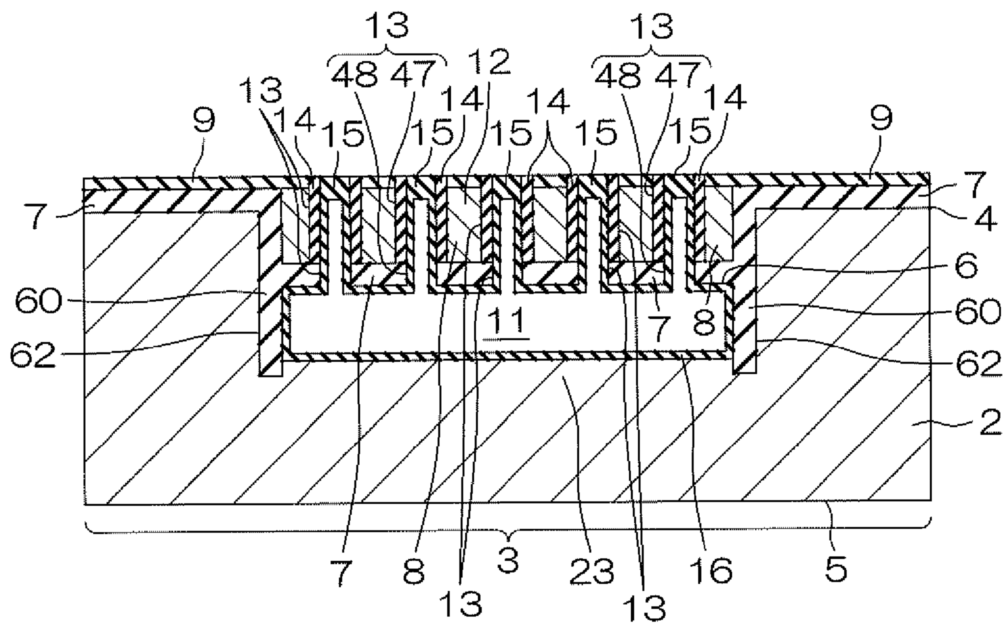
Figure 23S:
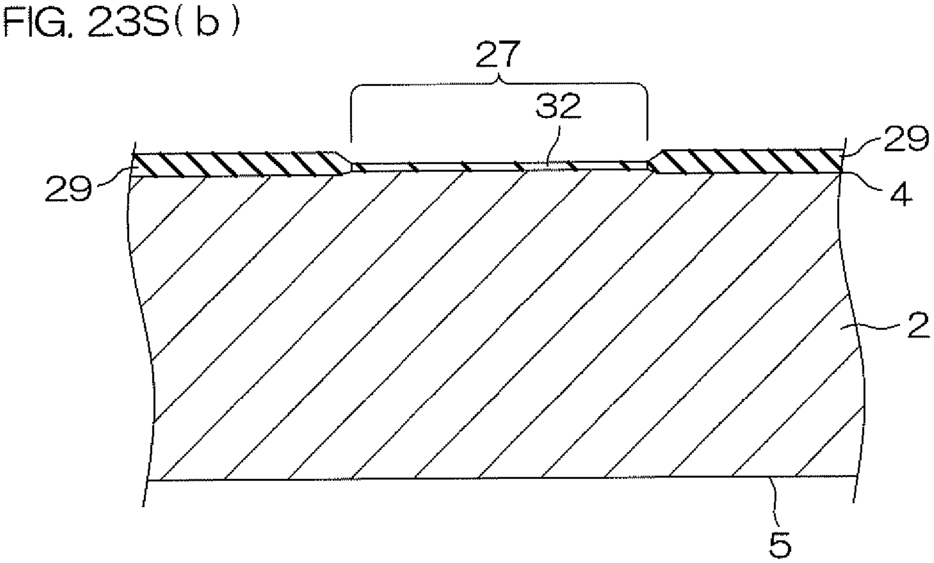

FIG. 23S(a) shows a cutting plane on the same position as that in FIG. 22(*b*) illustrating a step subsequent to that in FIG. 23R, and FIG. 23S(b) shows a cutting plane on the same position as that in FIG. 20(*b*) at the same point of time as that in FIG. 23S(a).

Figure 23T:
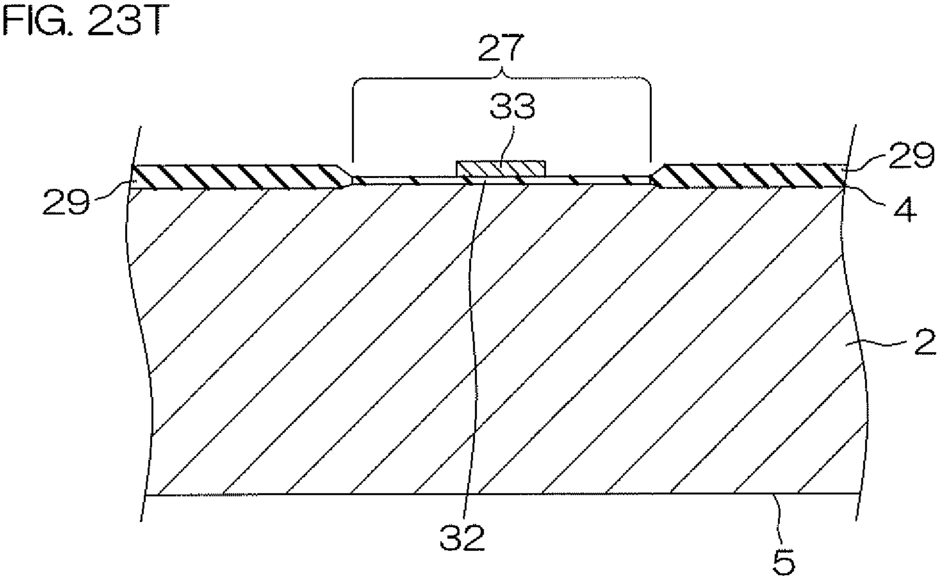

FIG. 23T is a schematic sectional view showing a step subsequent to that in FIG. 23S(b).

Figure 23U:
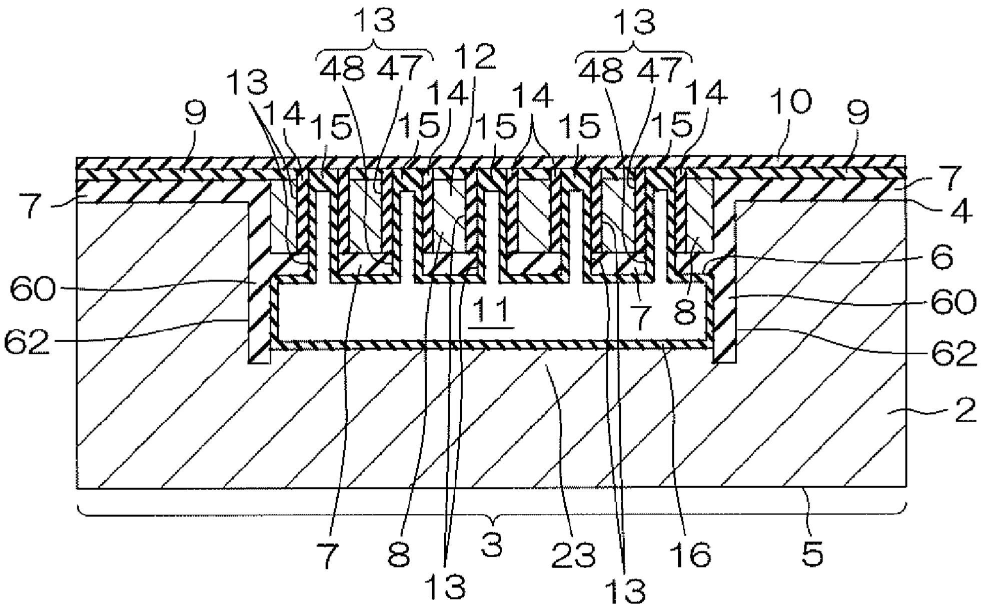
Figure 23U:
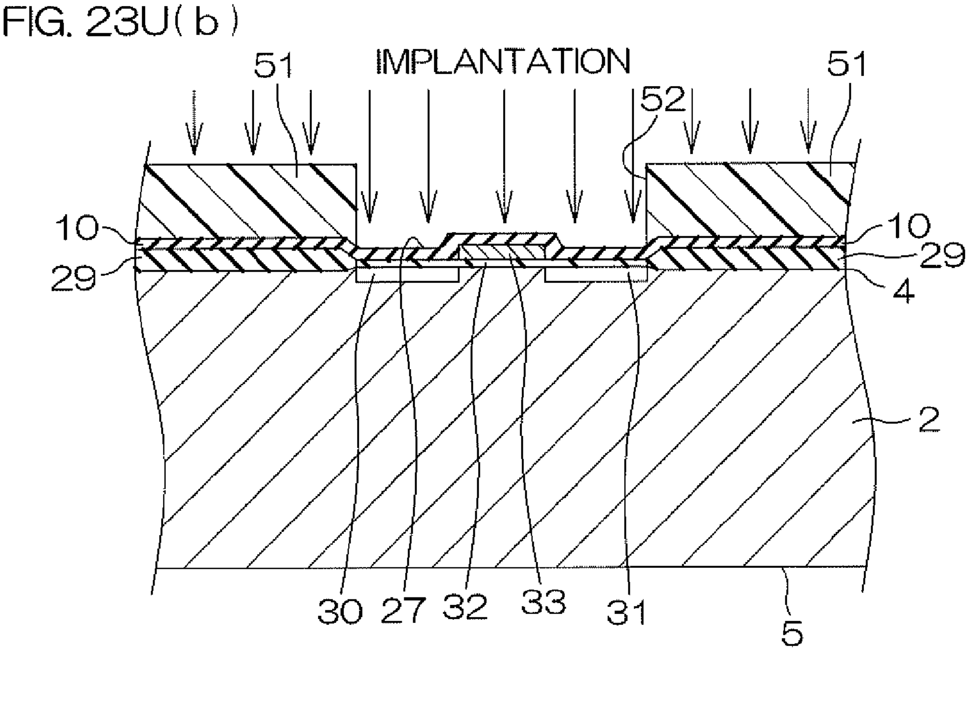

FIG. 23U(a) shows a cutting plane on the same position as that in FIG. 22(*b*) illustrating a step subsequent to that in FIG. 23T, and FIG. 23U(b) shows a cutting plane on the same position as that in FIG. 20(*b*) at the same point of time as that in FIG. 23U(a).

Figure 24A:
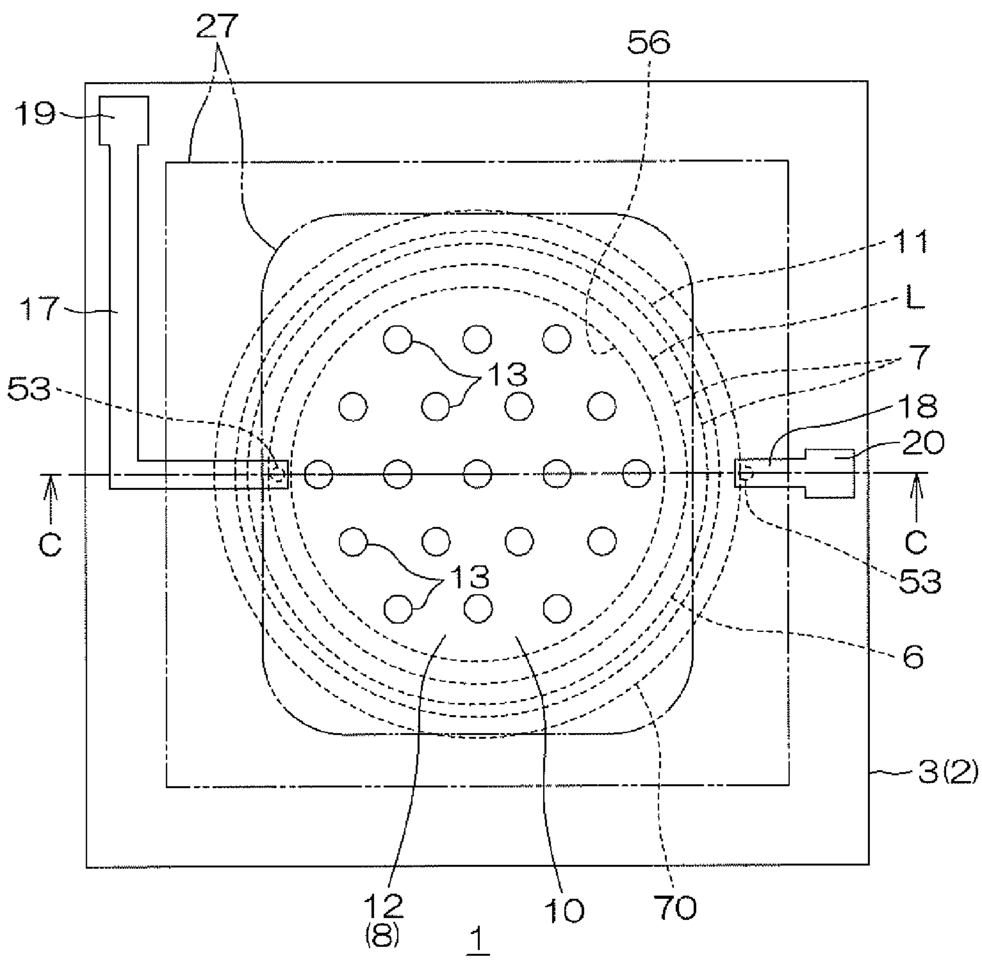
Figure 24B:
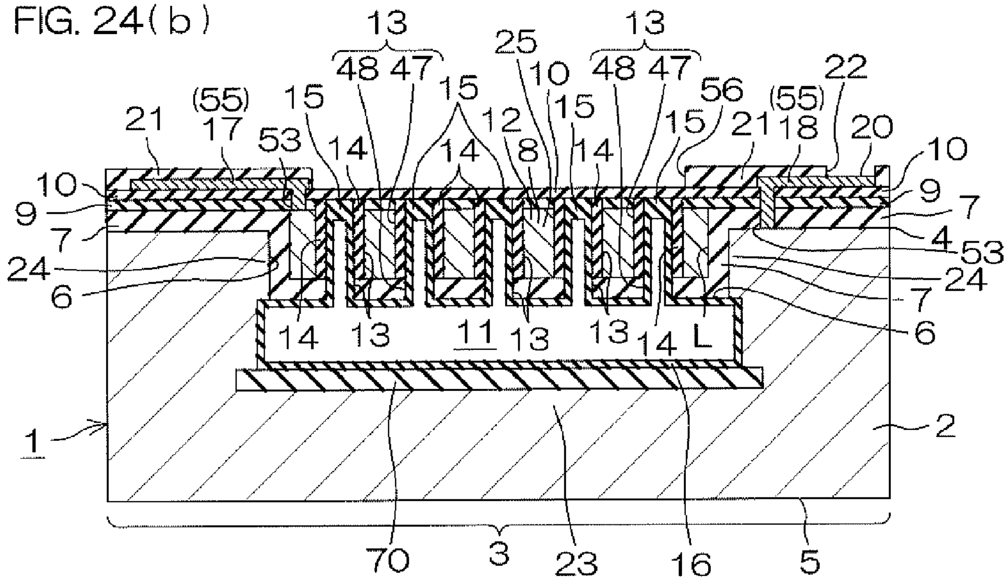

FIG. 24(*a*) is an enlarged plan view of a pressure sensor according to a tenth embodiment, and FIG. 24(*b*) is a sectional view along a cutting plane line C-C in FIG. 24(*a*).

FIG. 25A(a) is a schematic sectional view showing a manufacturing step for a pressure sensor according to a tenth embodiment and shows a cutting plane on the same position as that in FIG. 24(*b*), while FIG. 25A(b) shows a cutting plane on the same position as that in FIG. 20(*b*) at the same point of time as that in FIG. 25A(a).

FIG. 25B(a) is a schematic sectional view showing a step subsequent to that in FIG. 25A(a), and FIG. 25B(b) is a plan view in the state of FIG. 25B(a).

Figure 25C:
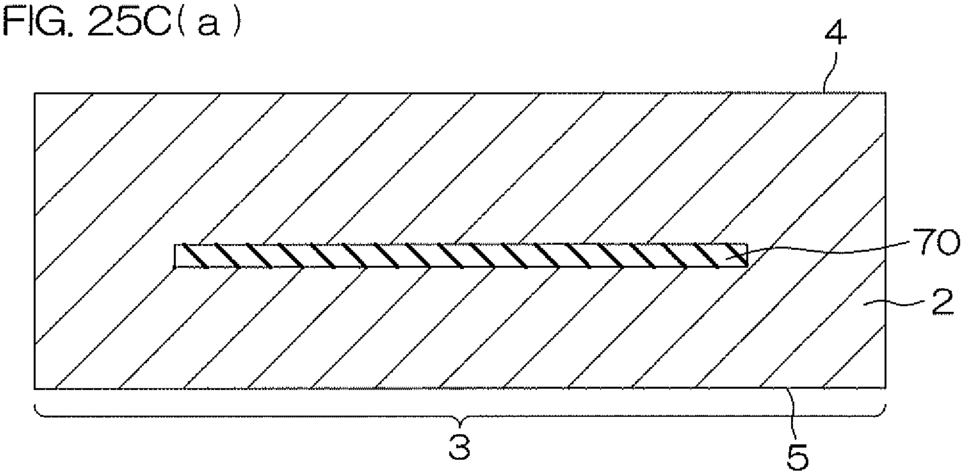
Figure 25C:
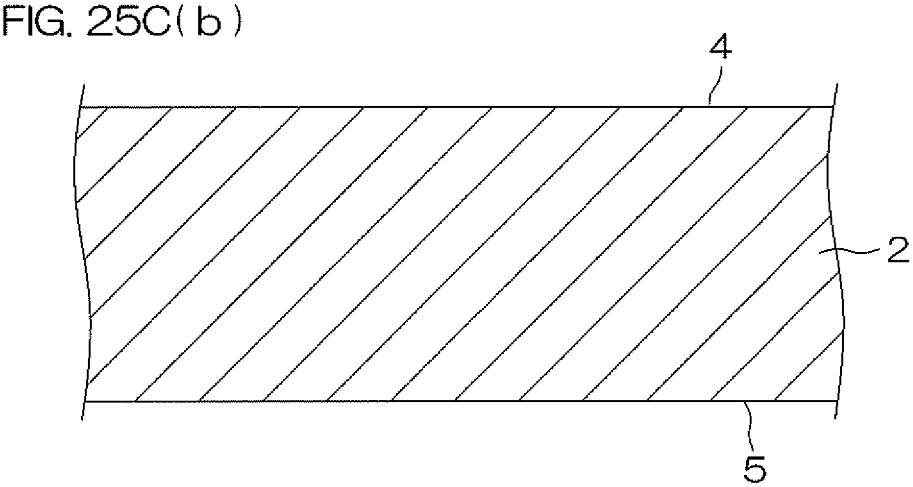

FIG. 25C(a) is a schematic sectional view showing a step subsequent to that in FIG. 25B(a), and FIG. 25C(b) shows a cutting plane on the same position as that in FIG. 20(*b*) at the same point of time as that in FIG. 25C(a).

Figure 25D:
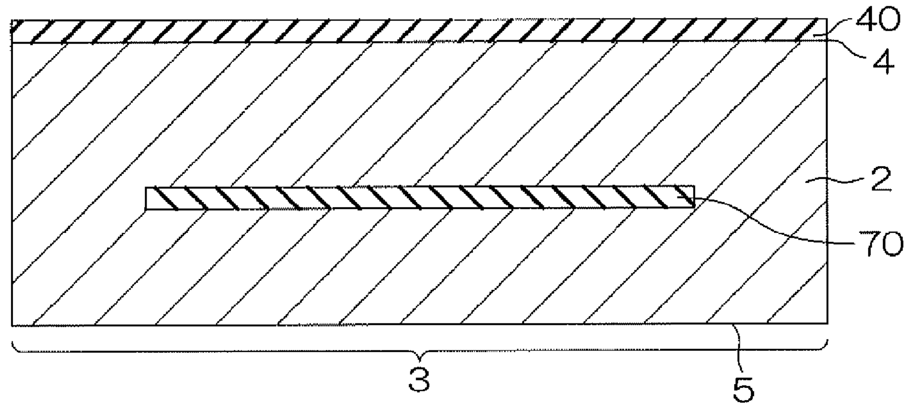
Figure 25D:
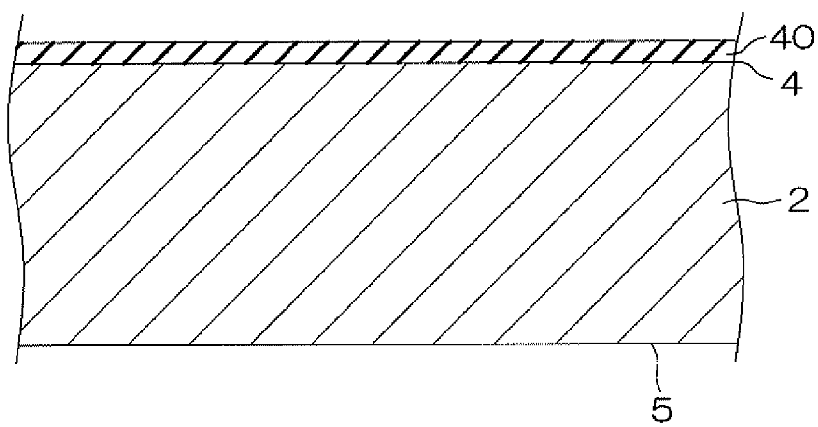

FIG. 25D(a) is a schematic sectional view showing a step subsequent to that in FIG. 25C(a), and FIG. 25D(b) shows a cutting plane on the same position as that in FIG. 20(*b*) at the same point of time as that in FIG. 25D(a).

FIG. 25E(a) is a schematic sectional view showing a step subsequent to that in FIG. 25D(a), FIG. 25E(b) is a plan view in the state of FIG. 25E(a), and FIG. 25E(c) shows a cutting plane on the same position as that in FIG. 20(*b*) at the same point of time as that in FIG. 25E(a).

Figure 25F:
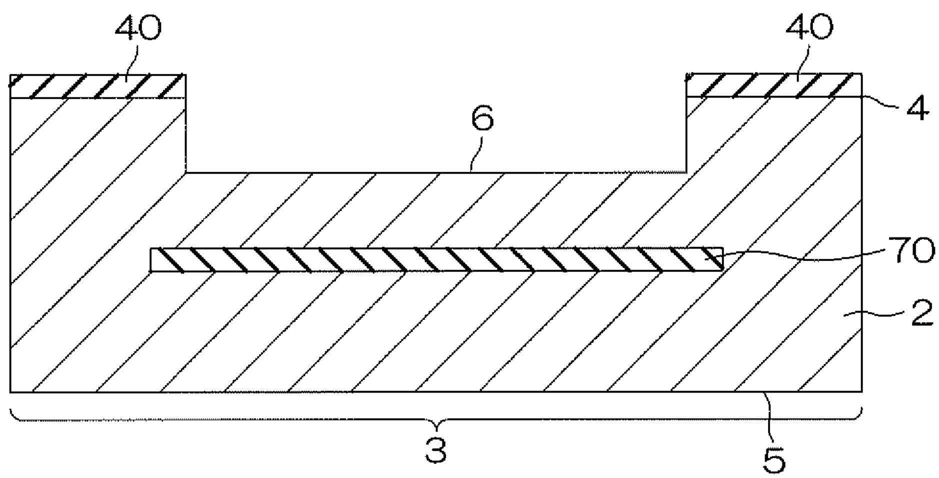

FIG. 25F is a schematic sectional view showing a step subsequent to that in FIG. 25E(a).

Figure 25G:
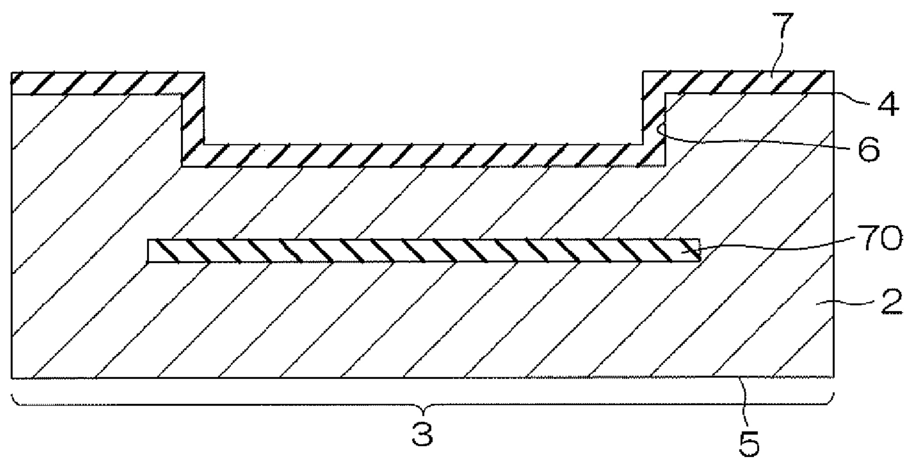
Figure 25G:
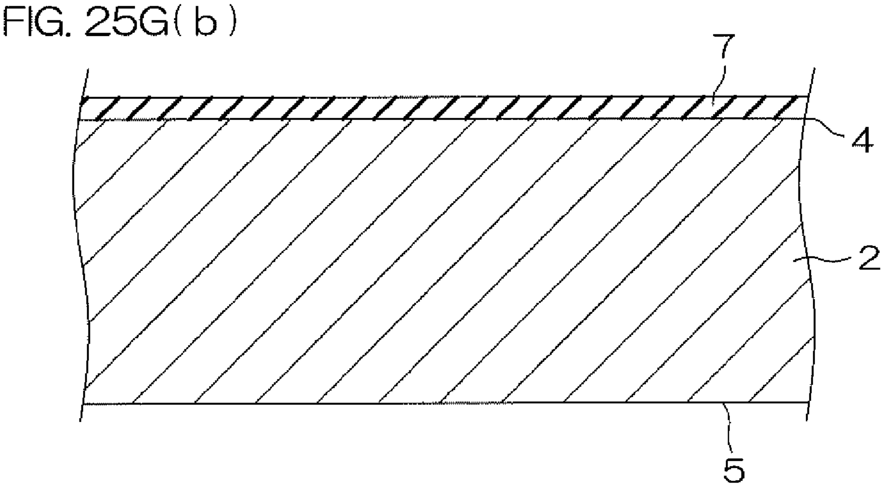
Figure 25:
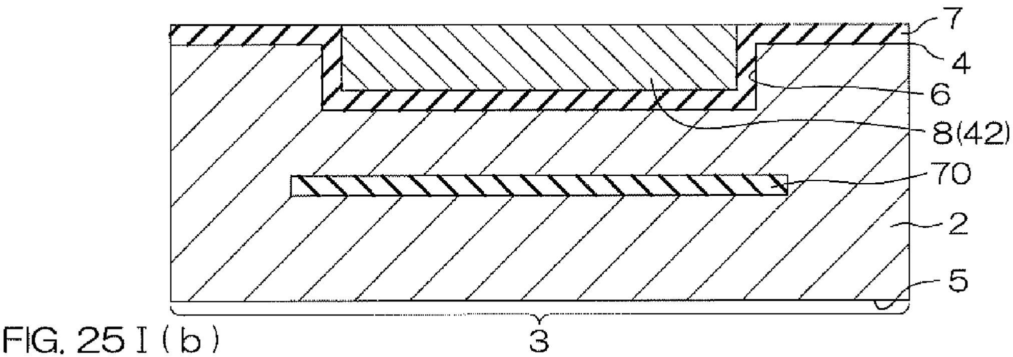
Figure 25:
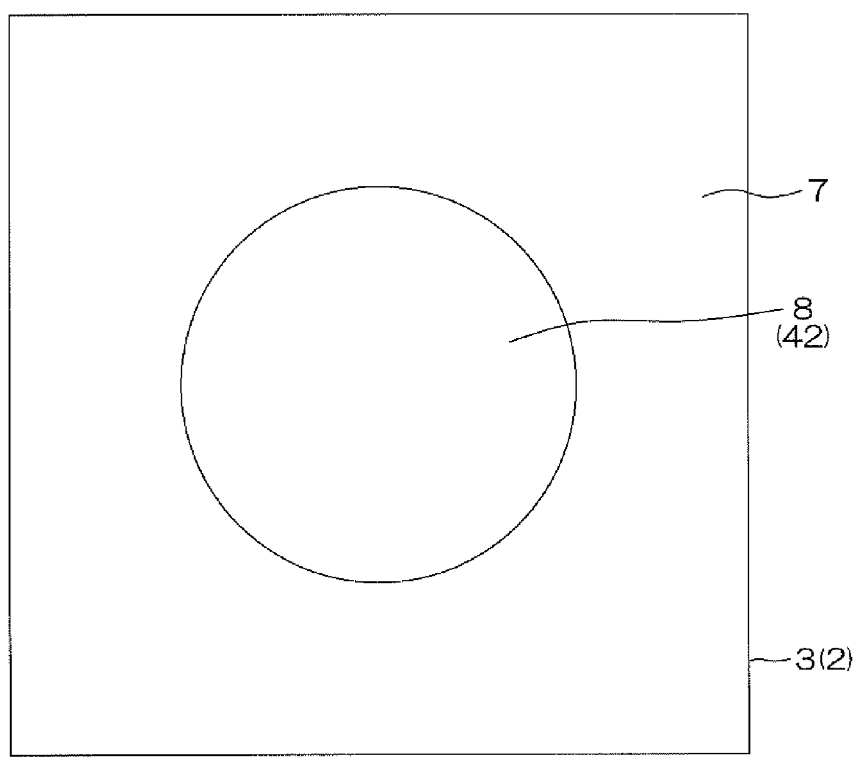
Figure 25:
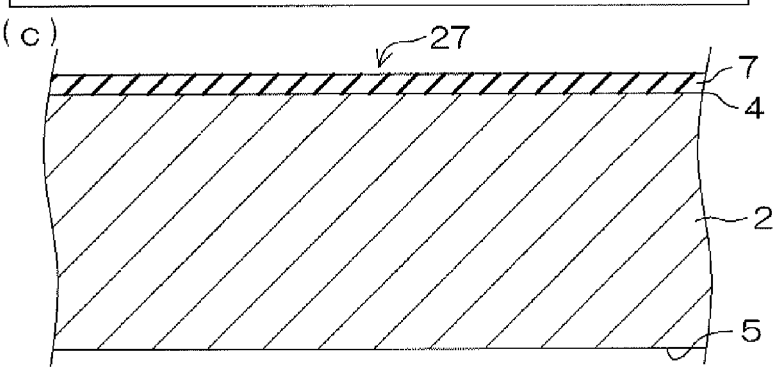

FIG. 25G(a) is a schematic sectional view showing a step subsequent to that in FIG. 25F, and FIG. 25G(b) shows a cutting plane on the same position as that in FIG. 20(*b*) at the same point of time as that in FIG. 25G(a).

FIG. 25H(a) is a schematic sectional view showing a step subsequent to that in FIG. 25G(a), and FIG. 25H(b) shows a cutting plane on the same position as that in FIG. 20(*b*) at the same point of time as that in FIG. 25H(a).

FIG. 25I(a) is a schematic sectional view showing a step subsequent to that in FIG. 25H(a), FIG. 25I(b) is a plan view in the state of FIG. 25I(a), and FIG. 25I(c) shows a cutting plane on the same position as that in FIG. 20(*b*) at the same point of time as that in FIG. 25I(a).

Figure 25J:
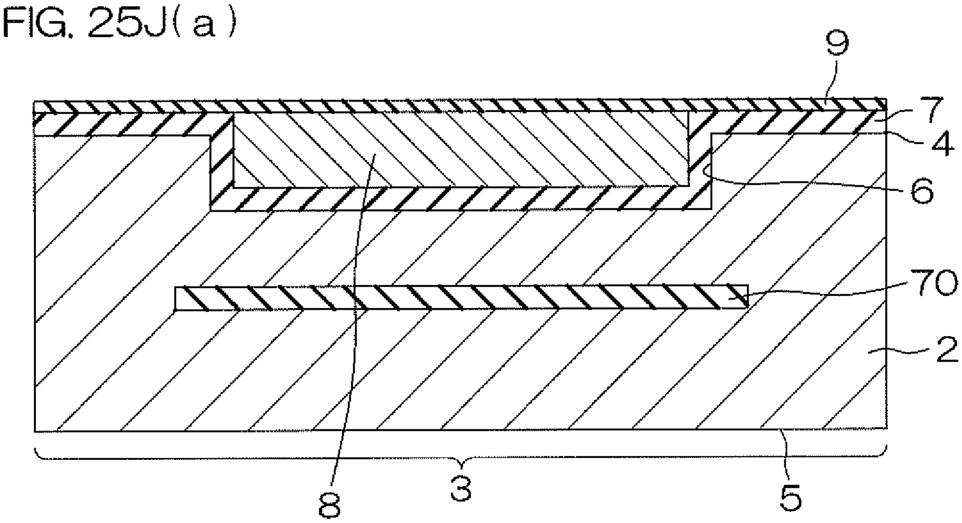
Figure 25J:
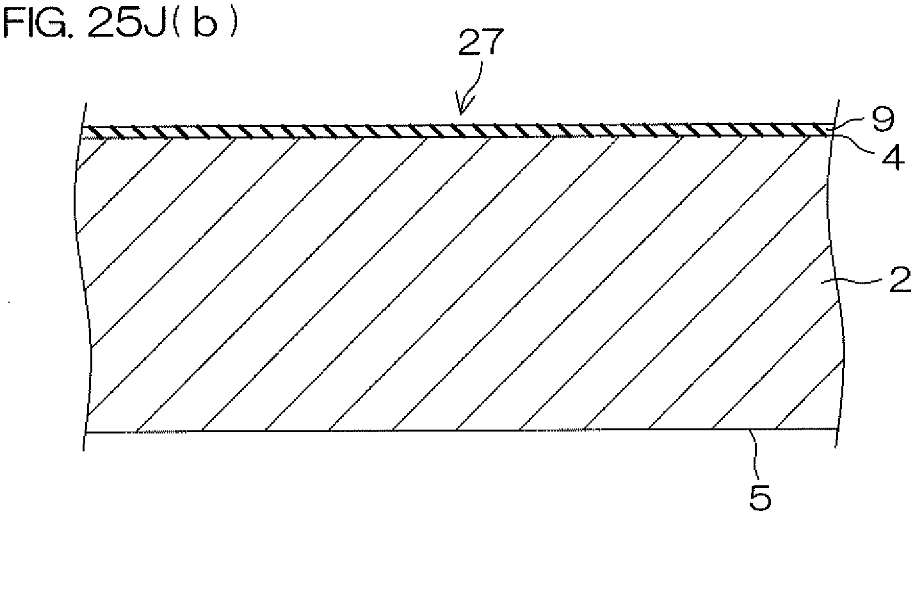

FIG. 25J(a) is a schematic sectional view showing a step subsequent to that in FIG. 25I(a), and FIG. 25J(b) shows a cutting plane on the same position as that in FIG. 20(*b*) at the same point of time as that in FIG. 25J(a).

Figure 25K:
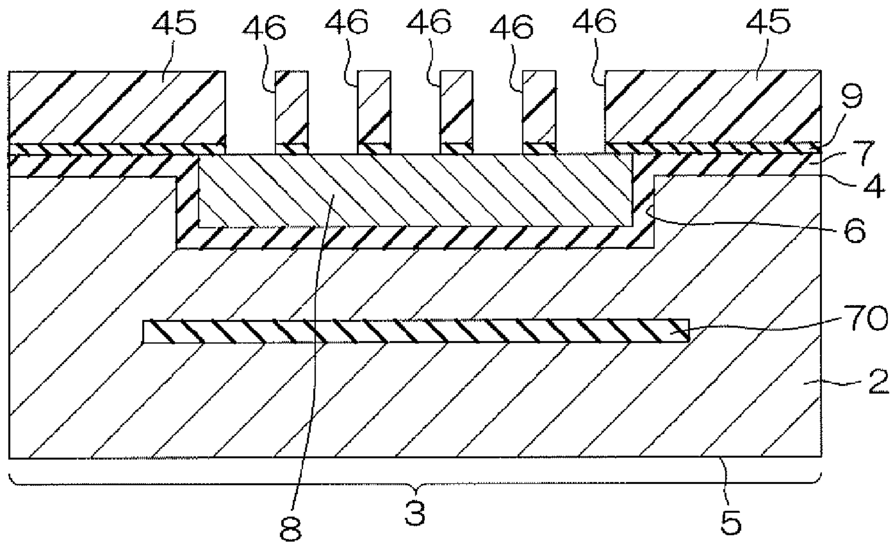
Figure 25K:
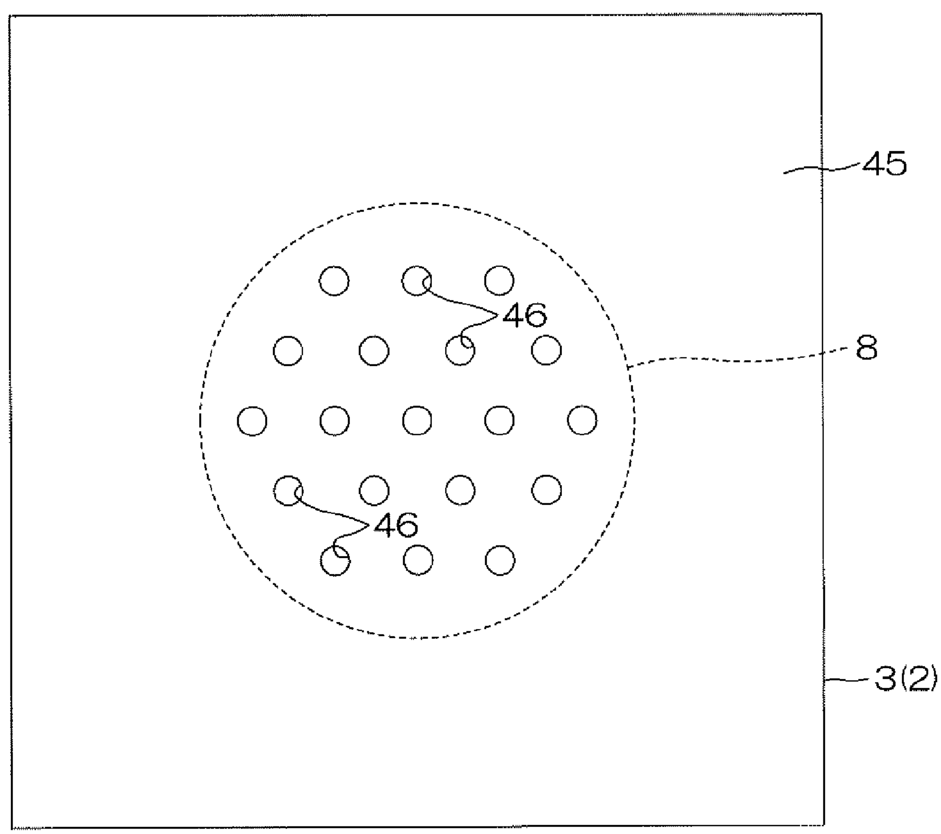

FIG. 25K(a) is a schematic sectional view showing a step subsequent to that in FIG. 25J(a), and FIG. 25K(b) is a plan view in the state of FIG. 25K(a).

Figure 25L:
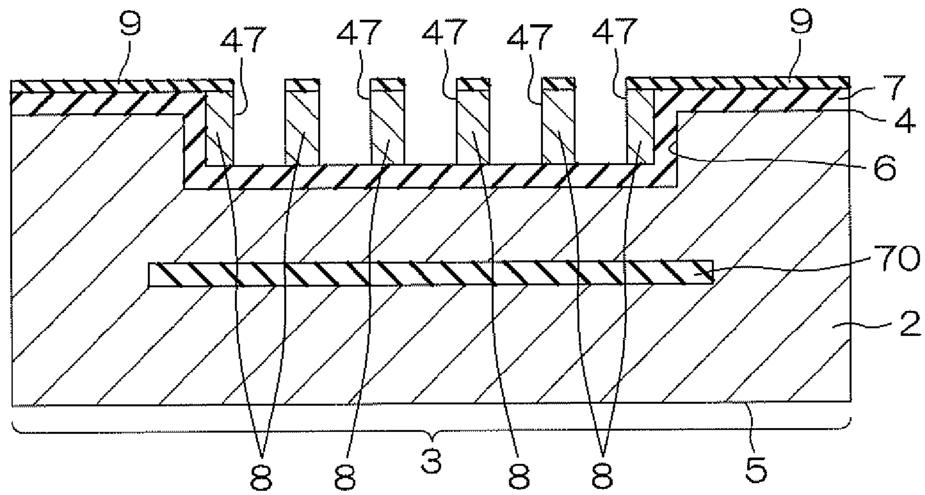
Figure 25L:
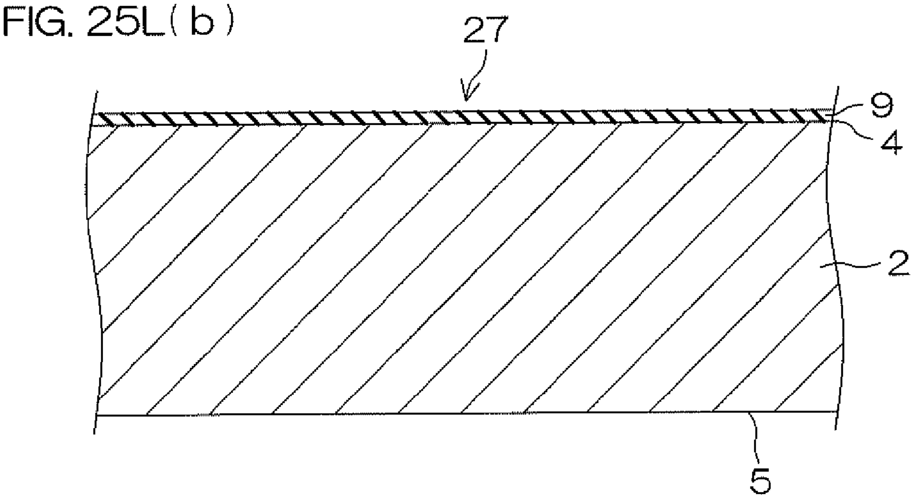

FIG. 25L(a) is a schematic sectional view showing a step subsequent to that in FIG. 25K(a), and FIG. 25L(b) shows a cutting plane on the same position as that in FIG. 20(*b*) at the same point of time as that in FIG. 25L(a).

Figure 25M:
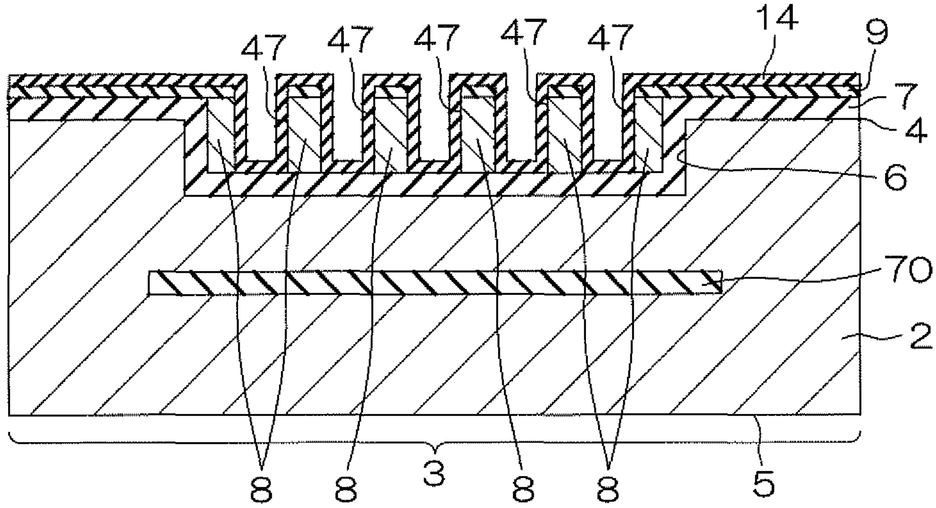
Figure 25M:
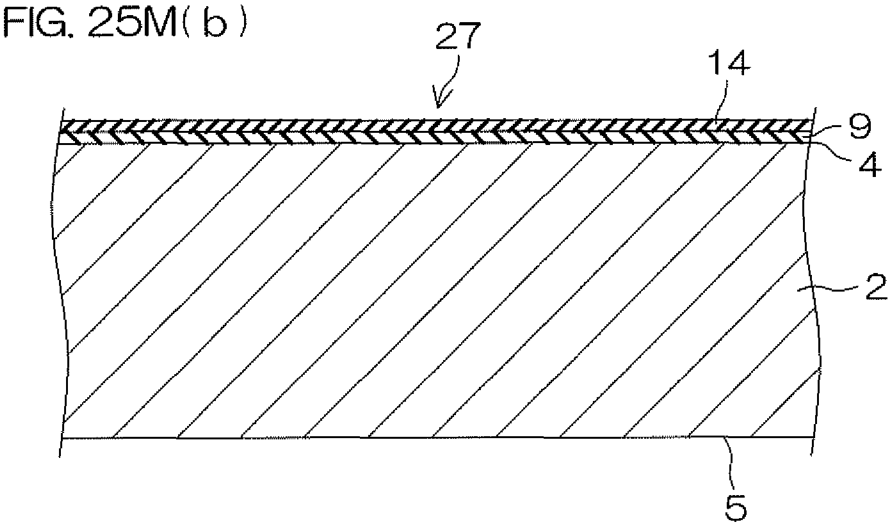

FIG. 25M(a) is a schematic sectional view showing a step subsequent to that in FIG. 25L(a), and FIG. 25M(b) shows a cutting plane on the same position as that in FIG. 20(*b*) at the same point of time as that in FIG. 25M(a).

Figure 25N:
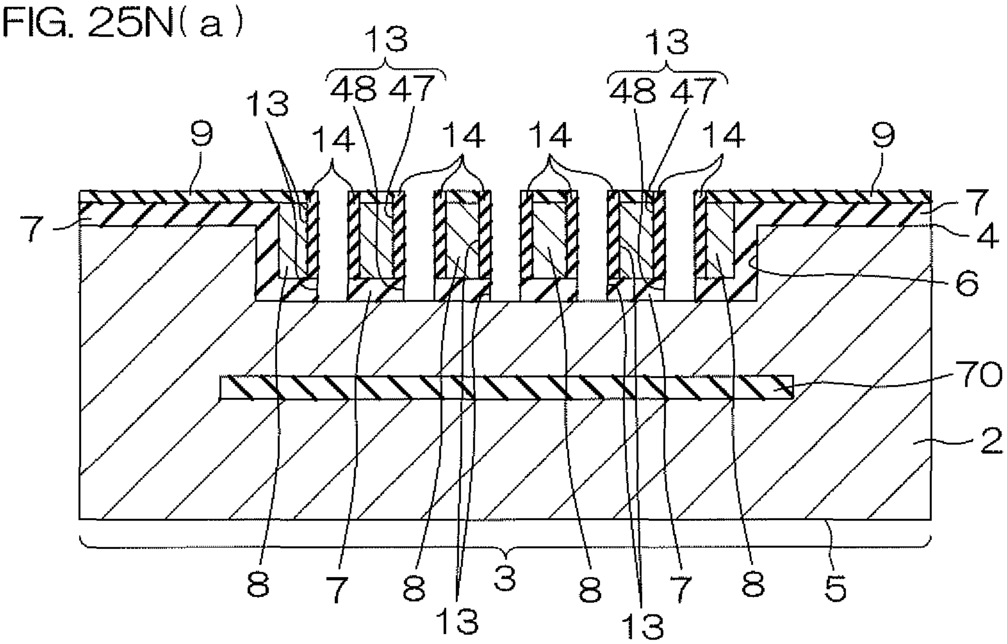
Figure 25N:
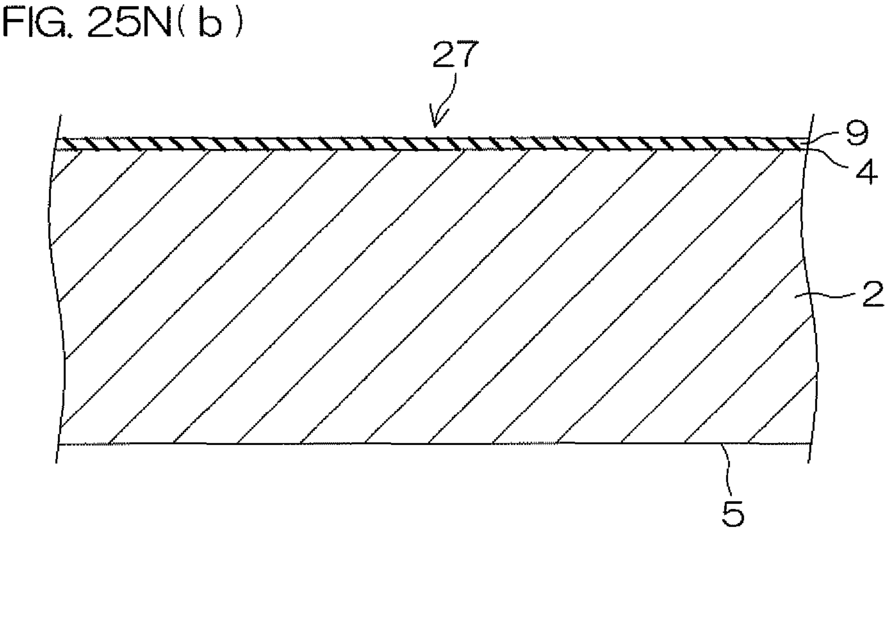
Figure 250A:
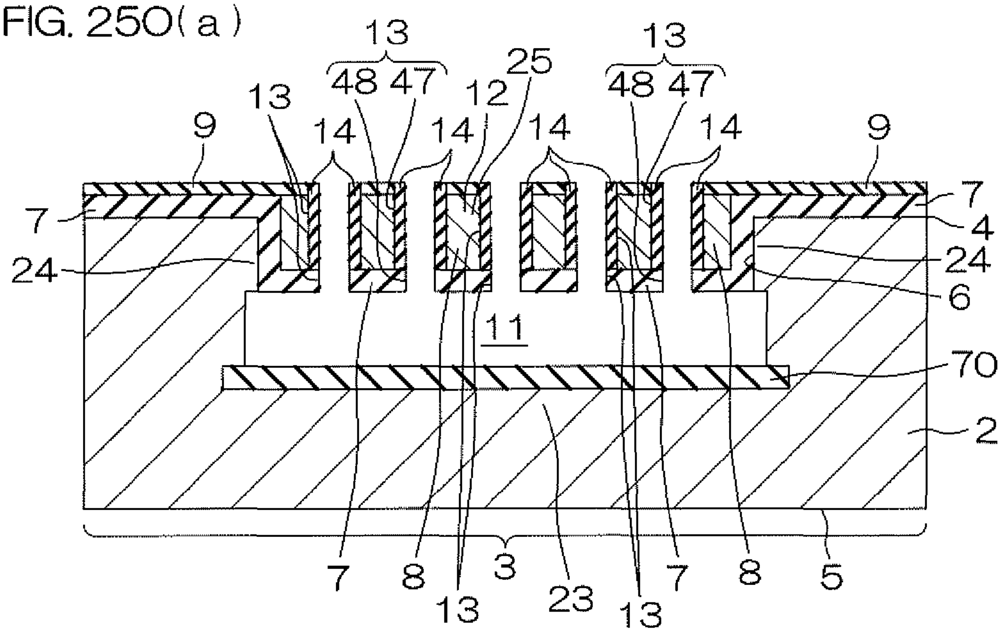
Figure 250B:
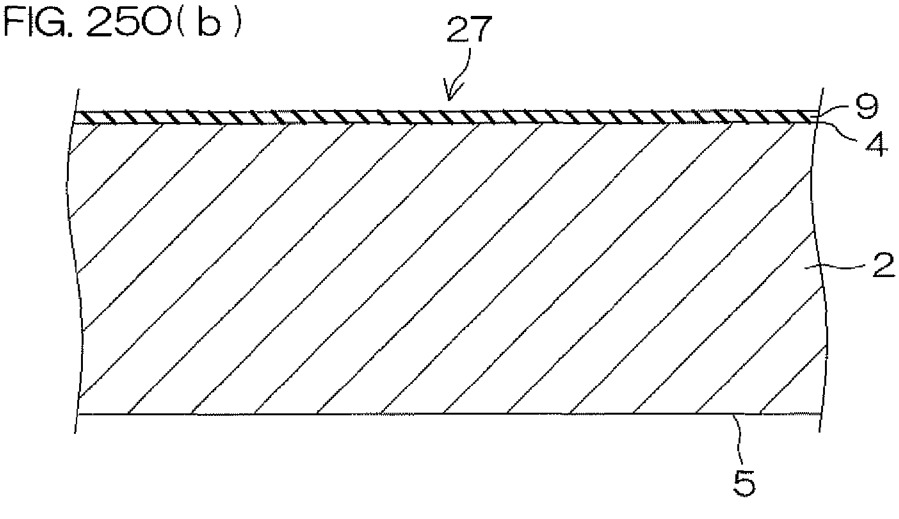

FIG. 25N(a) is a schematic sectional view showing a step subsequent to that in FIG. 25M(a), and FIG. 25N(b) shows a cutting plane on the same position as that in FIG. 20(*b*) at the same point of time as that in FIG. 25N(a).

FIG. 25O(a) is a schematic sectional view showing a step subsequent to that in FIG. 25N(a), and FIG. 25O(b) shows a cutting plane on the same position as that in FIG. 20(*b*) at the same point of time as that in FIG. 25O(a).

Figure 25P:
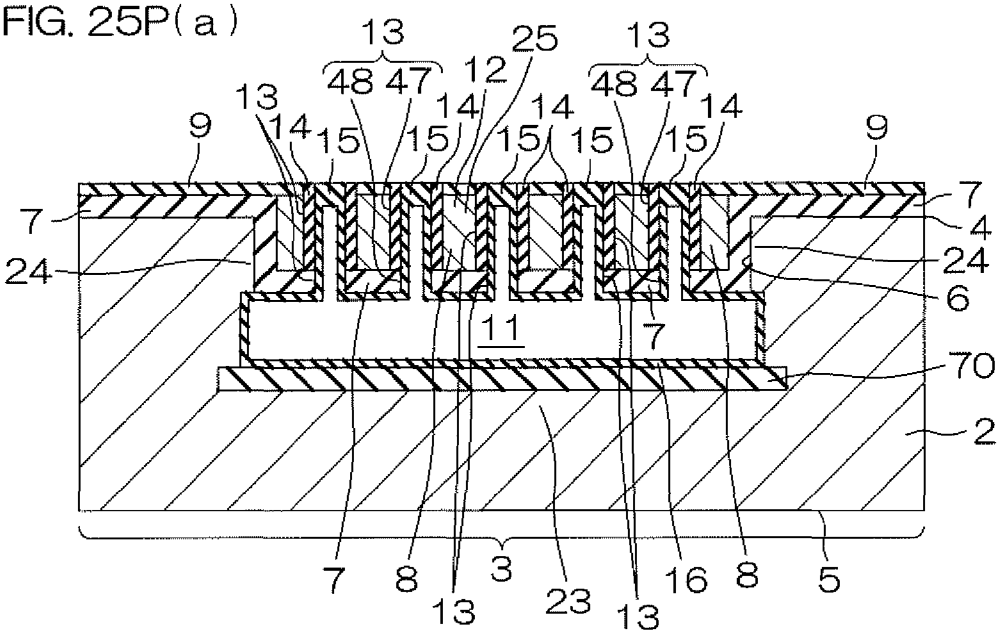
Figure 25P:
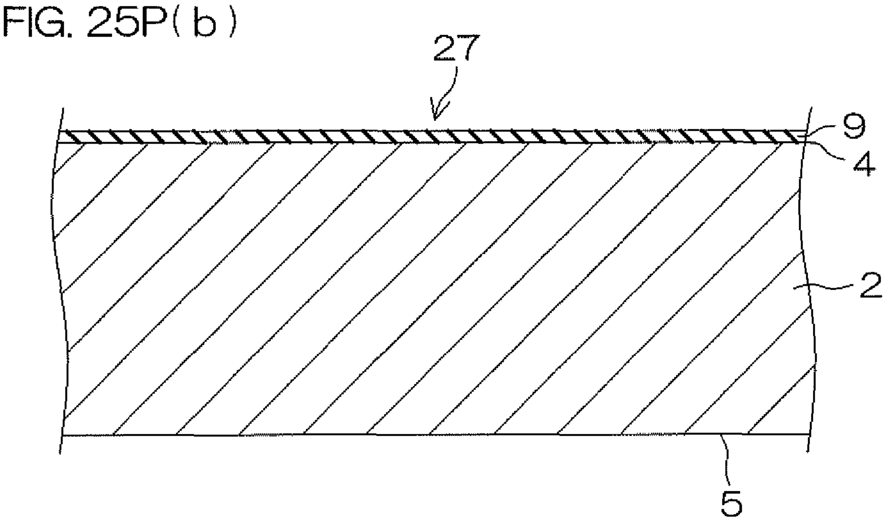

FIG. 25P(a) is a schematic sectional view showing a step subsequent to that in FIG. 25O(a), and FIG. 25P(b) shows a cutting plane on the same position as that in FIG. 20(*b*) at the same point of time as that in FIG. 25P(a).

FIG. 25Q(a) is a schematic sectional view showing a step subsequent to that in FIG. 25P(a), and FIG. 25Q(b) shows a cutting plane on the same position as that in FIG. 20(*b*) at the same point of time as that in FIG. 25Q(a).

Figure 25R:
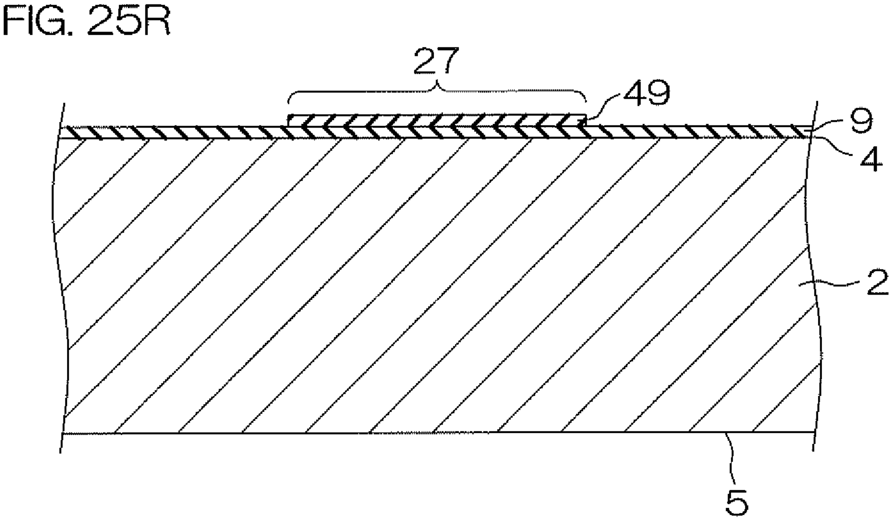

FIG. 25R is a schematic sectional view showing a step subsequent to that in FIG. 25Q(a).

Figure 25S:
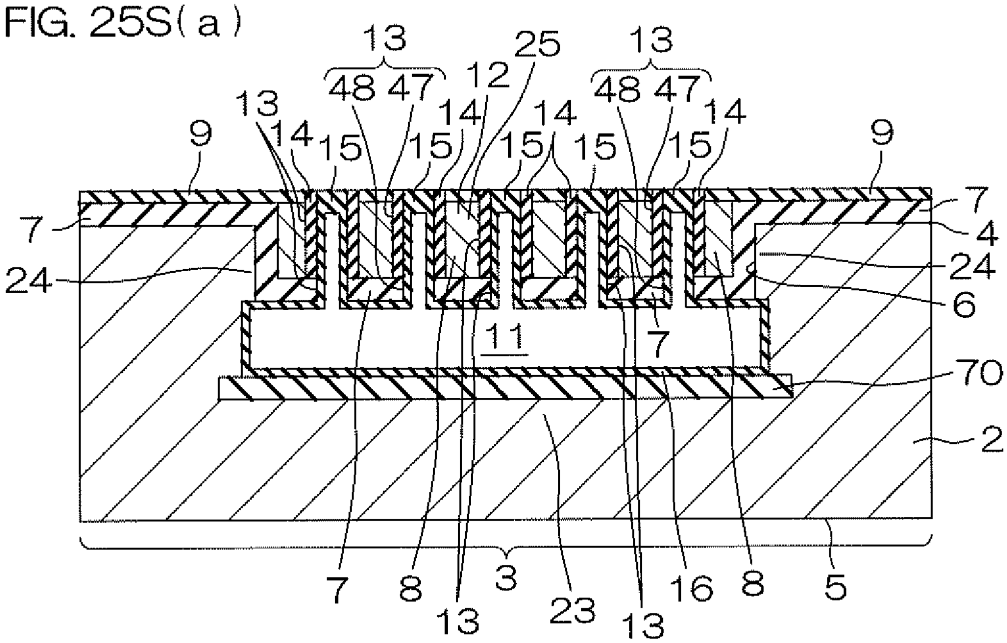
Figure 25S:
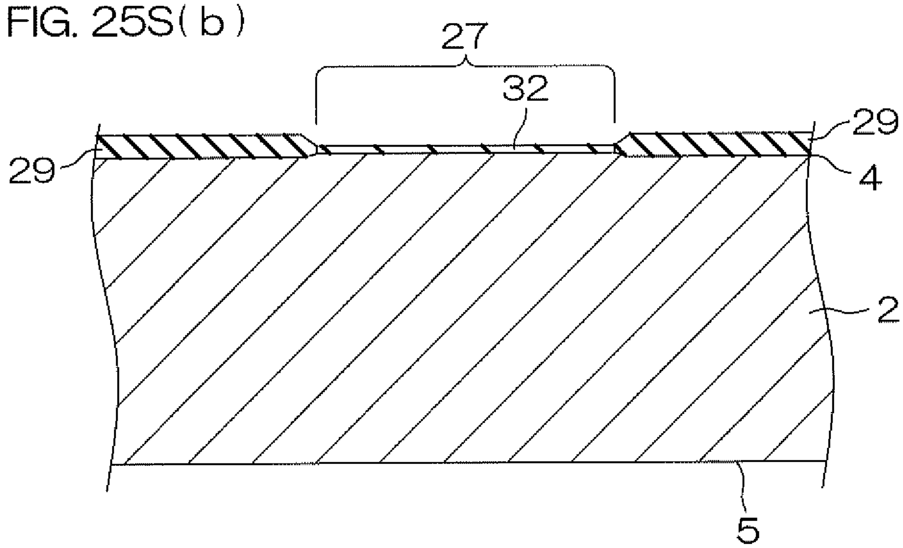

FIG. 25S(a) shows a cutting plane on the same position as that in FIG. 24(*b*) illustrating a step subsequent to that in FIG. 25R, and FIG. 25S(b) shows a cutting plane on the same position as that in FIG. 20(*b*) at the same point of time as that in FIG. 25S(a).

Figure 25T:
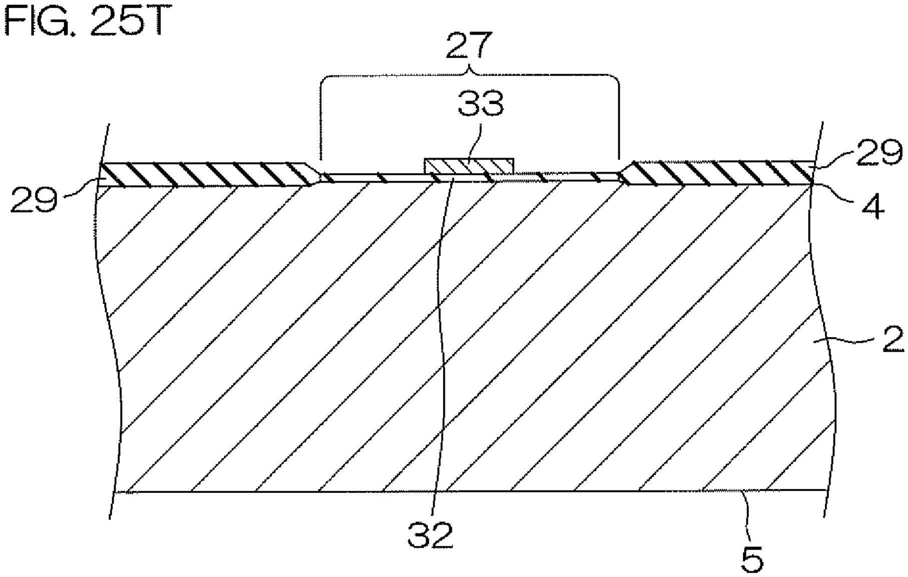

FIG. 25T is a schematic sectional view showing a step subsequent to that in FIG. 25S(b).

Figure 25U:
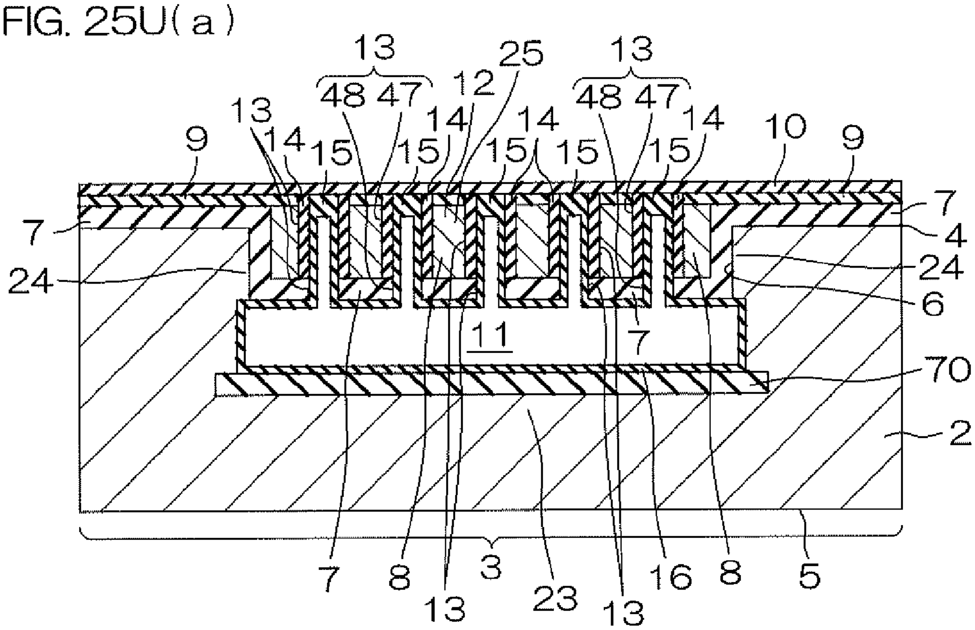
Figure 25U:
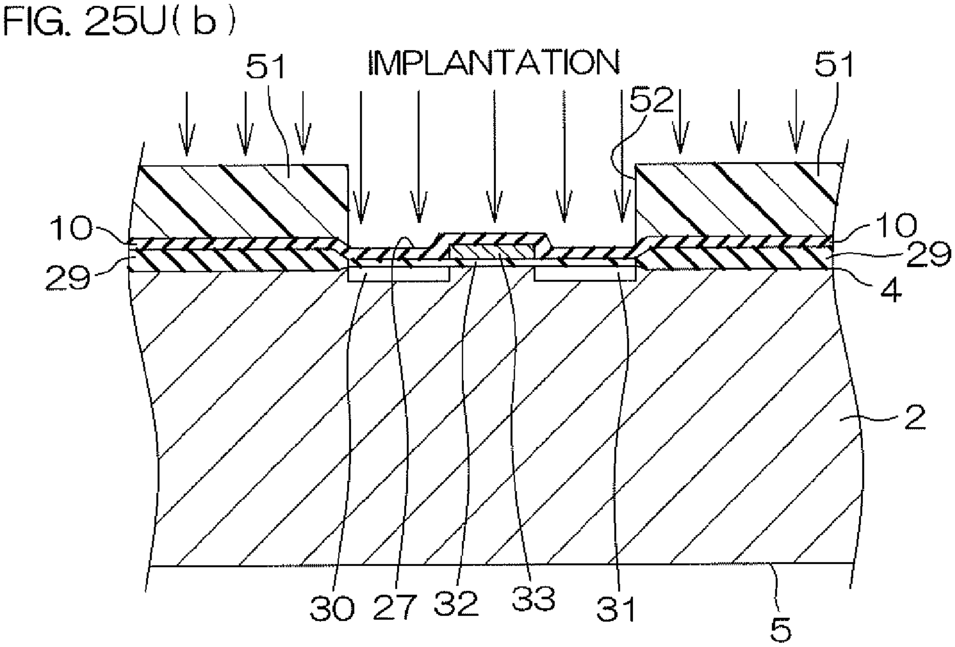

FIG. 25U(a) shows a cutting plane on the same position as that in FIG. 24(*b*) illustrating a step subsequent to that in FIG. 25T, and FIG. 25U(b) shows a cutting plane on the same position as that in FIG. 20(*b*) at the same point of time as that in FIG. 25U(b).

Figure 26A:
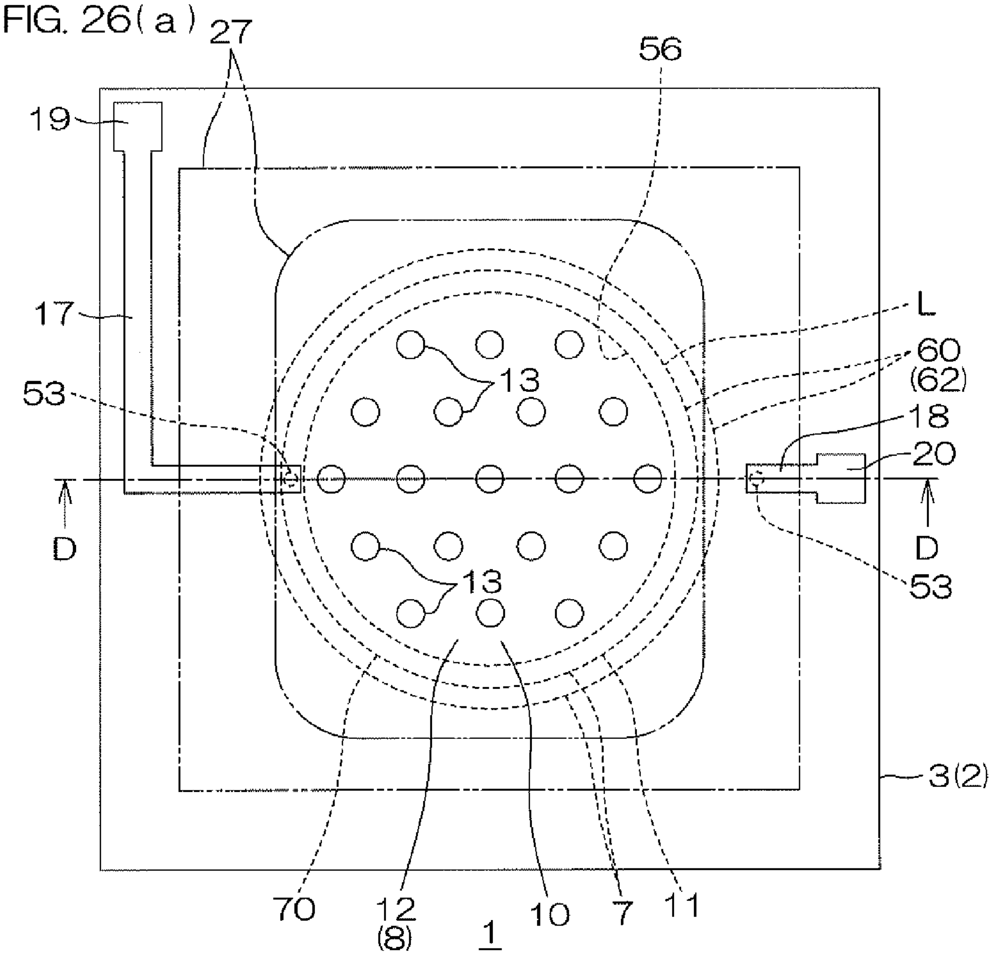
Figure 26B:
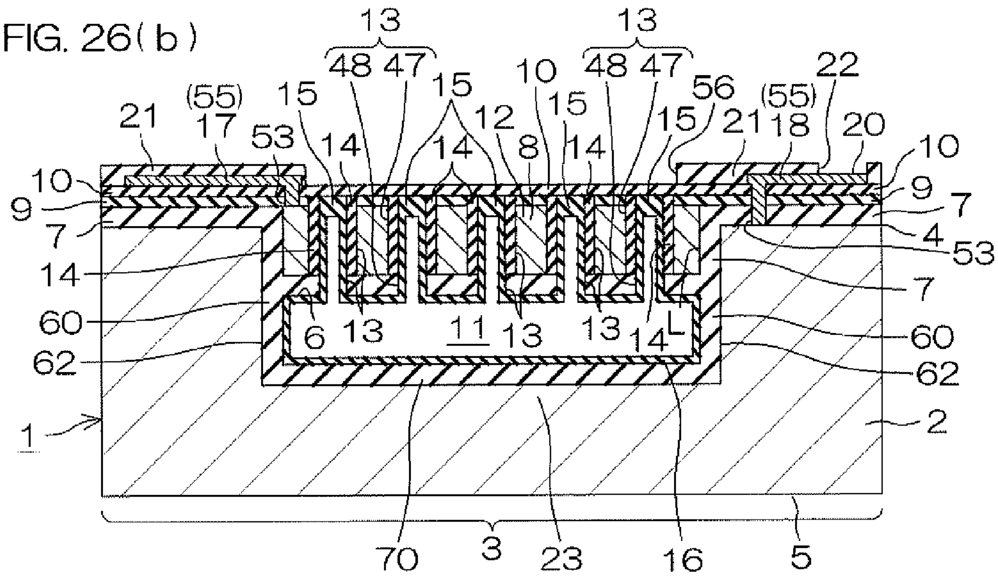

FIG. 26(*a*) is an enlarged plan view of a pressure sensor according to an eleventh embodiment, and FIG. 26(b) is a sectional view along a cutting plane line D-D in FIG. 26(*a*).

Figure 27A:
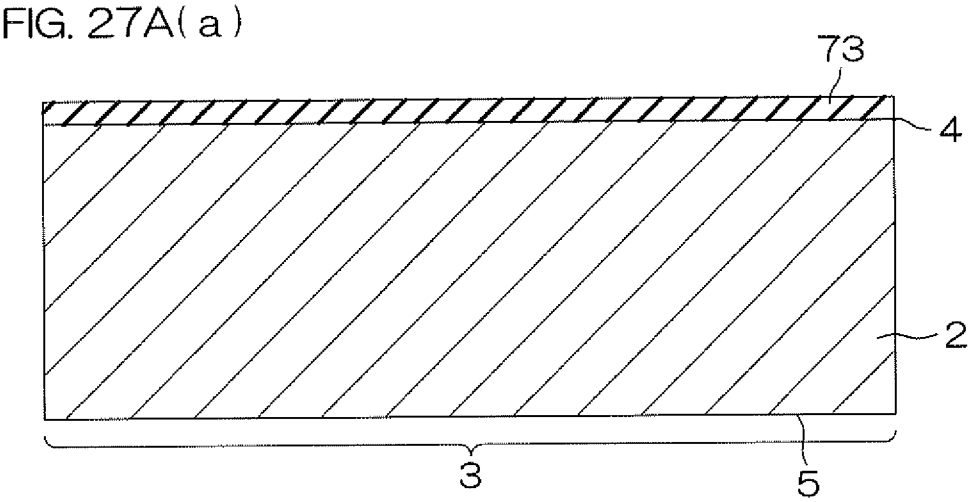
Figure 27A:
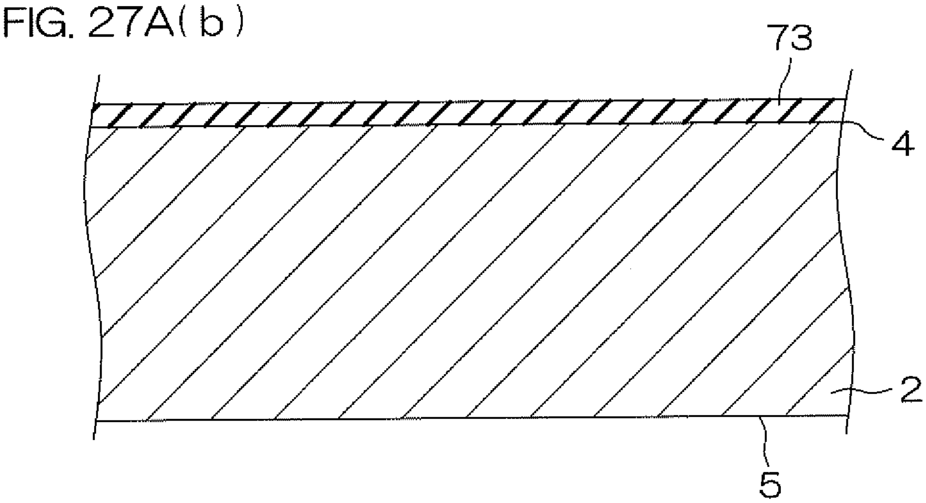

FIG. 27A(a) is a schematic sectional view showing a manufacturing step for the pressure sensor according to the eleventh embodiment and shows a cutting plane on the same position as that in FIG. 26(*b*), while FIG. 27A(b) shows a cutting plane on the on the same position as that in FIG. 20(*b*) at the same point of time as that in FIG. 27A(a).

Figure 27B:
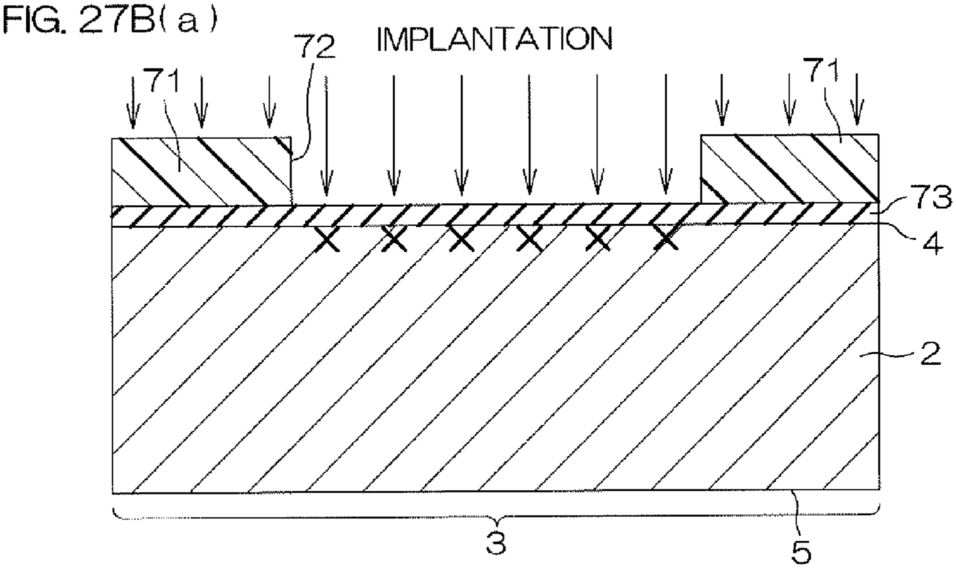
Figure 27B:
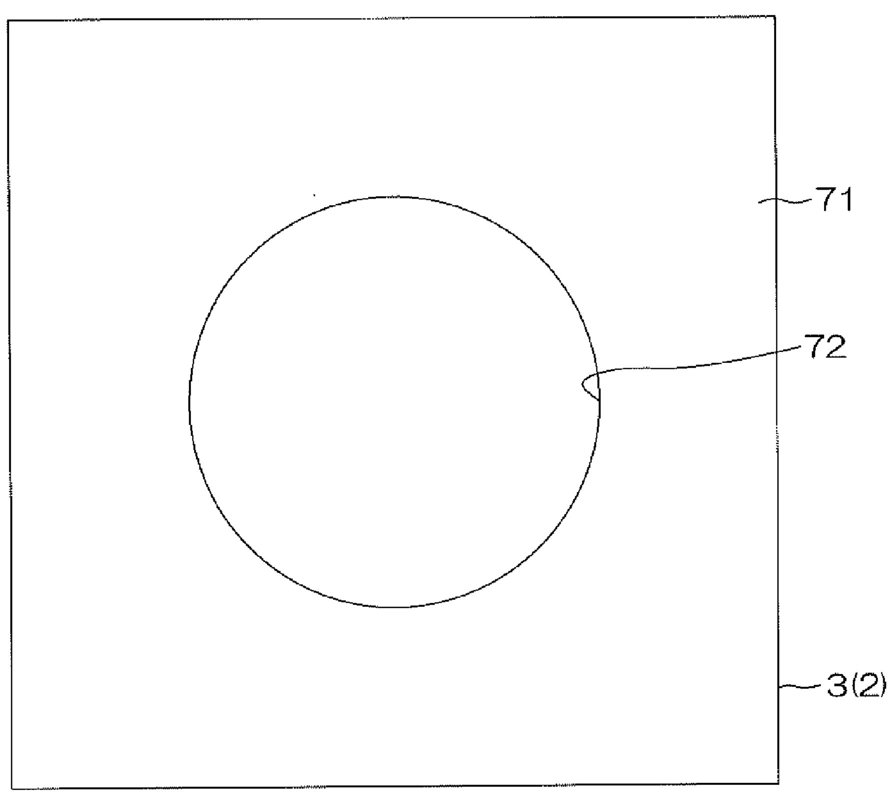

FIG. 27B(a) is a schematic sectional view showing a step subsequent to that in FIG. 27A(a), and FIG. 27B(b) is a plan view in the state of FIG. 27B(a).

Figure 27C:
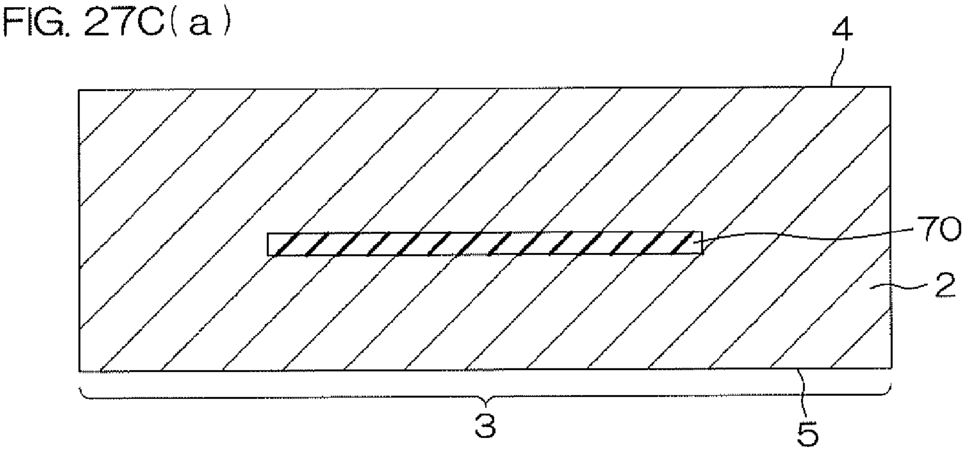
Figure 27C:
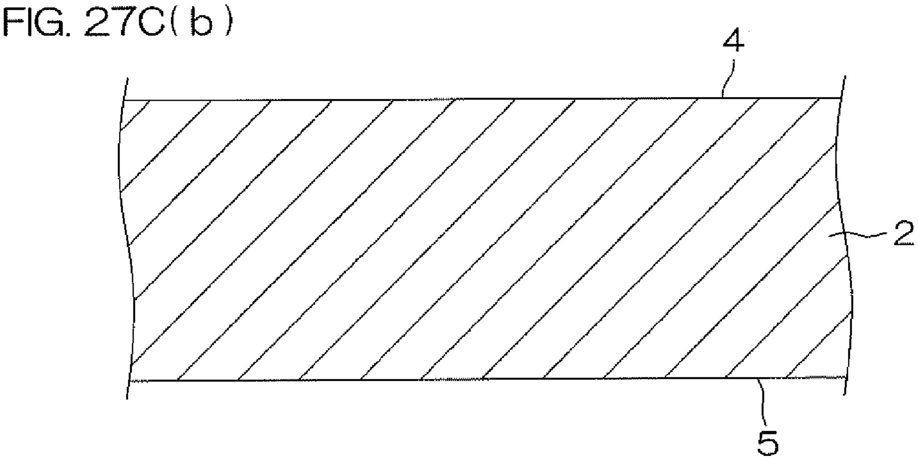

FIG. 27C(a) is a schematic sectional view showing a step subsequent to that in FIG. 27B(a), and FIG. 27C(b) shows a cutting plane on the same position as that in FIG. 20(*b*) at the same point of time as that in FIG. 27C(a).

Figure 27D:
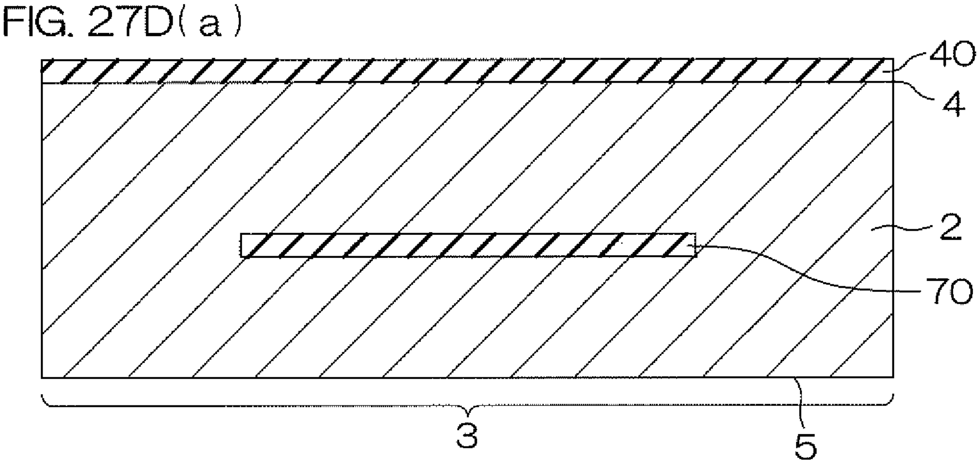
Figure 27D:
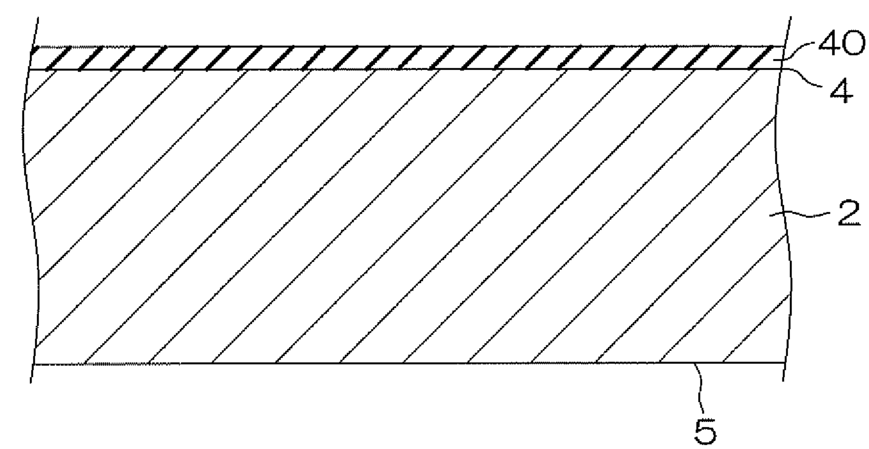
Figure 27E:
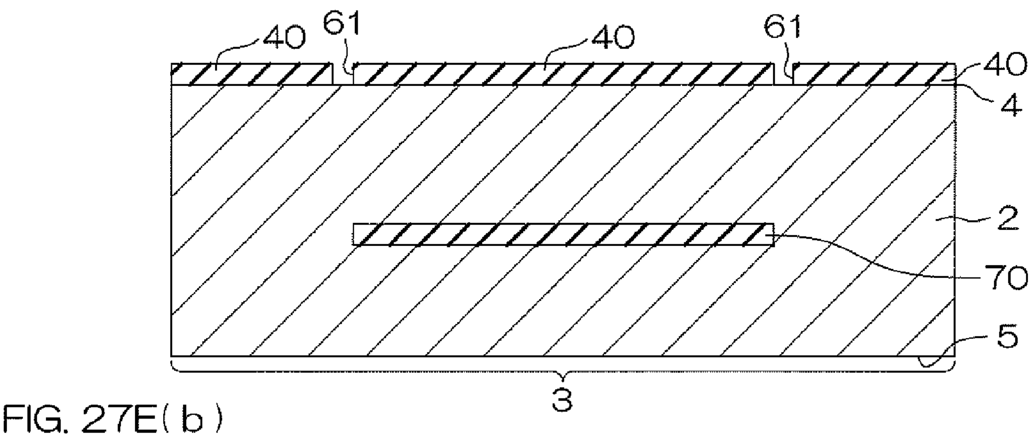
Figure 27E:
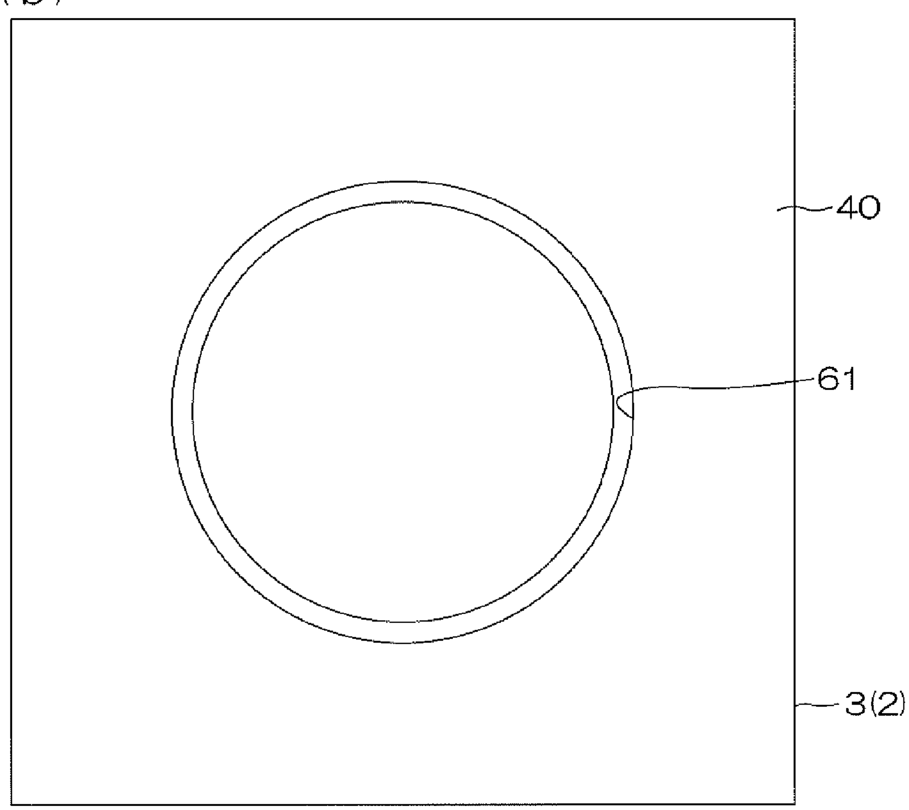
Figure 27E:
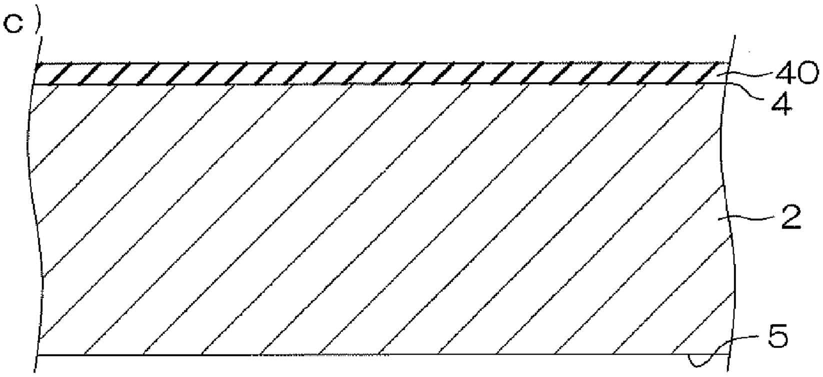
Figure 27G:
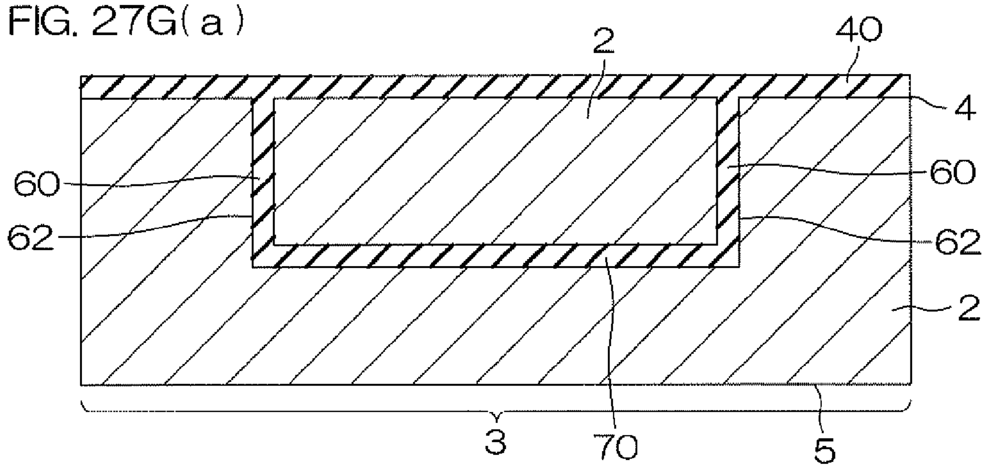
Figure 27G:
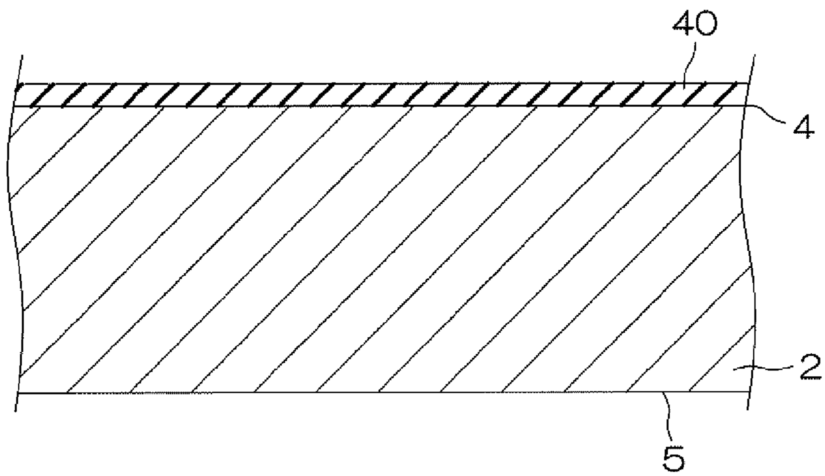
Figure 27:
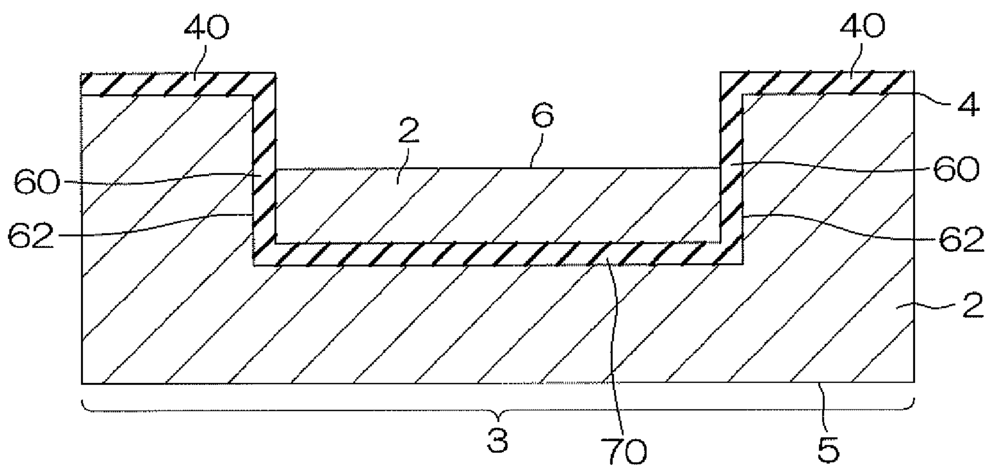

FIG. 27D(a) is a schematic sectional view showing a step subsequent to that in FIG. 27(*a*), and FIG. 27D(b) shows a cutting plane on the same position as that in FIG. 20(*b*) at the same point of time as that in FIG. 27D(a).

FIG. 27E(a) is a schematic sectional view showing a step subsequent to that in FIG. 27D(a), FIG. 27E(b) is a plan view in the state of FIG. 27E(a), and FIG. 27E(c) shows a cutting plane on the same position as that in FIG. 20(*b*) at the same point of time as that in FIG. 27E(a).

FIG. 27F(a) is a schematic sectional view showing a step subsequent to that in FIG. 27E(a), and FIG. 27F(b) is a plan view in the state of FIG. 27F(a).

FIG. 27G(a) is a schematic sectional view showing a step subsequent to that in FIG. 27F(a), and FIG. 27G(b) shows a cutting plane on the same position as that in FIG. 20(*b*) at the same point of time as that in FIG. 27G(a).

FIG. 27H(a) is a schematic sectional view showing a step subsequent to that in FIG. 27G(a), FIG. 27H(b) is a plan view in the state of FIG. 27H(a), and FIG. 27H(c) shows a cutting plane on the same position as that in FIG. 20(*b*) at the same point of time as that in FIG. 27H(a).

FIG. 27I is a schematic sectional view showing a step subsequent to that in FIG. 27H(a).

Figure 27J:
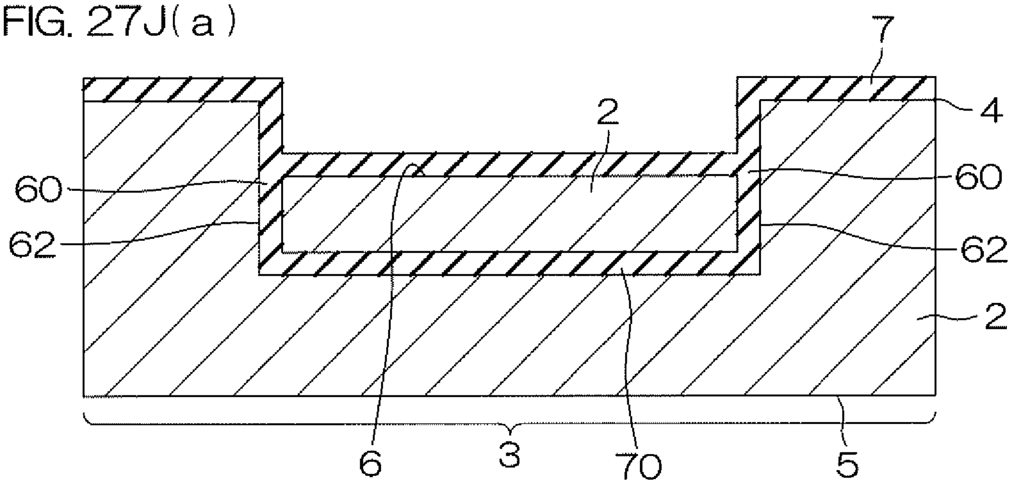
Figure 27J:
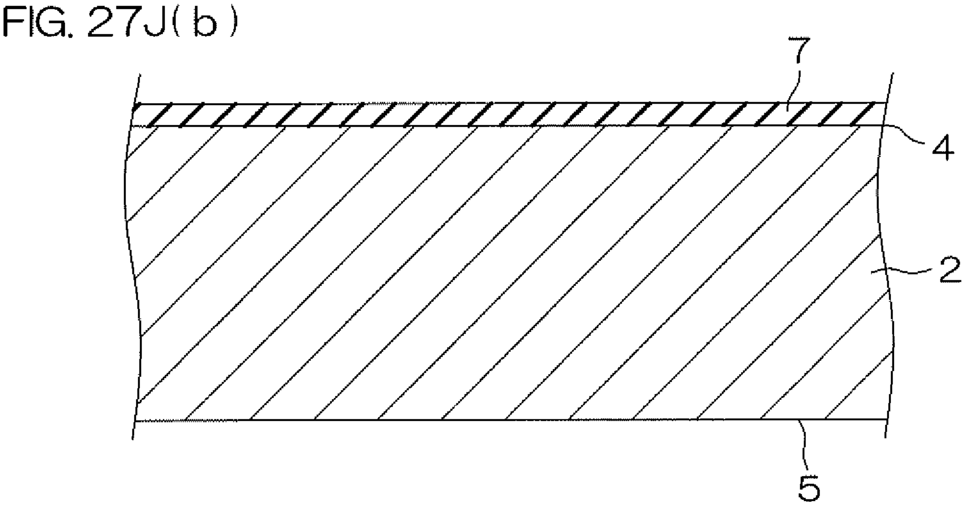

FIG. 27J(a) is a schematic sectional view showing a step subsequent to that in FIG. 27I, and FIG. 27J(b) shows a cutting plane on the same position as that in FIG. 20(*b*) at the same point of time as that in FIG. 27J(a).

Figure 27K:
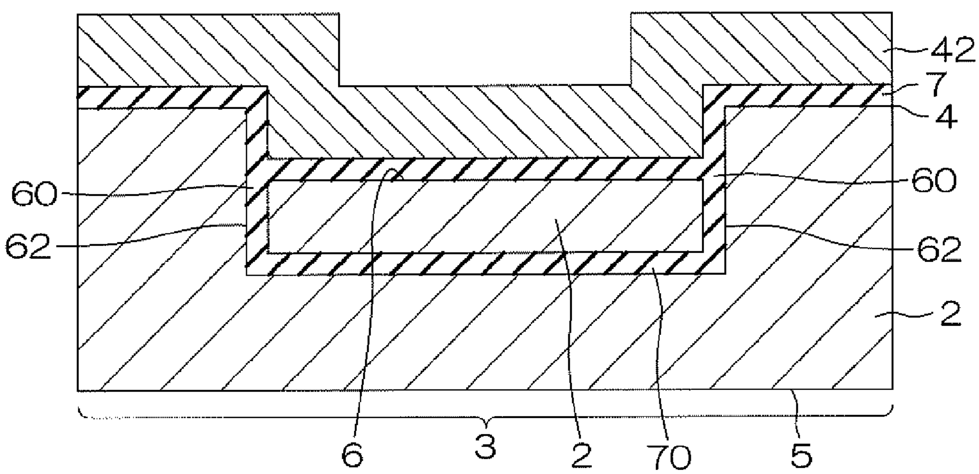
Figure 27K:
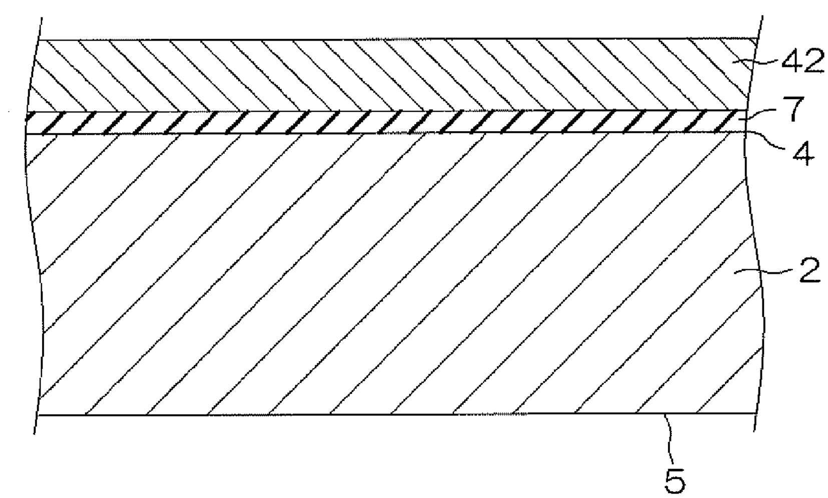

FIG. 27K(a) is a schematic sectional view showing a step subsequent to that in FIG. 27J(a), and FIG. 27K(b) shows a cutting plane on the same position as that in FIG. 20(*b*) at the same point of time as that in FIG. 27K(a).

Figure 27L:
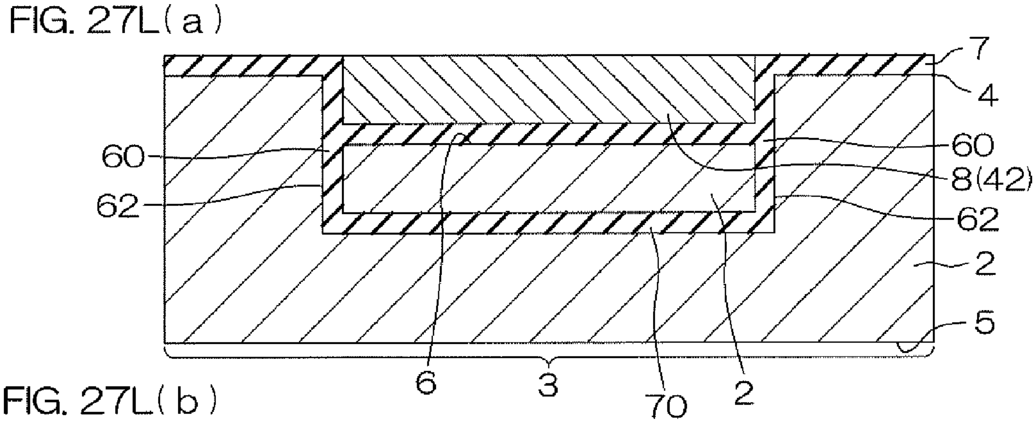
Figure 27L:
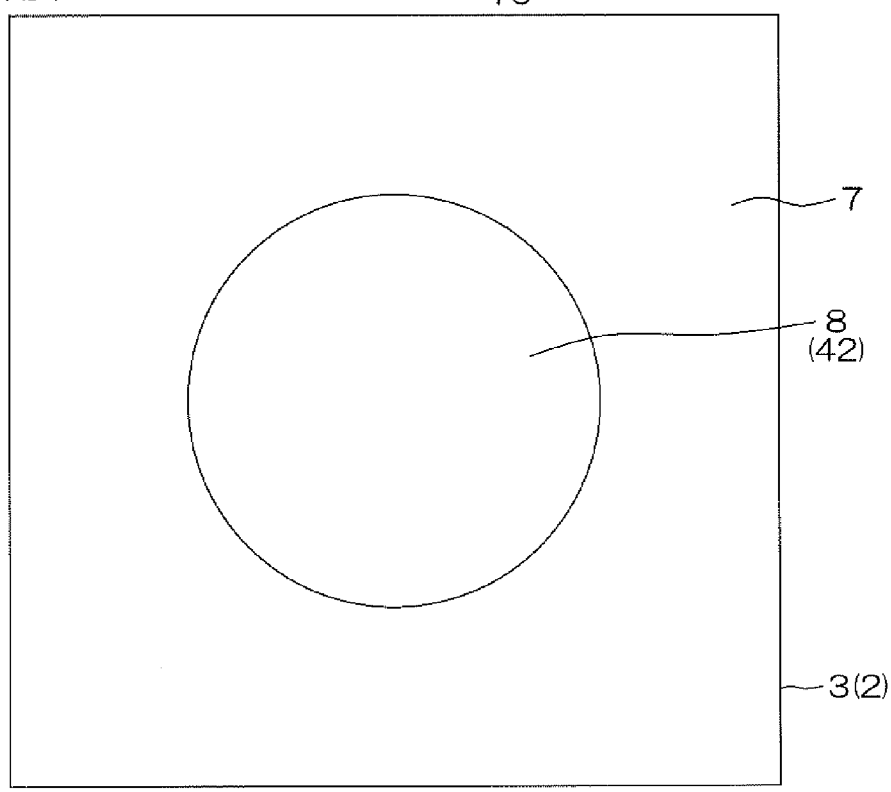
Figure 27L:
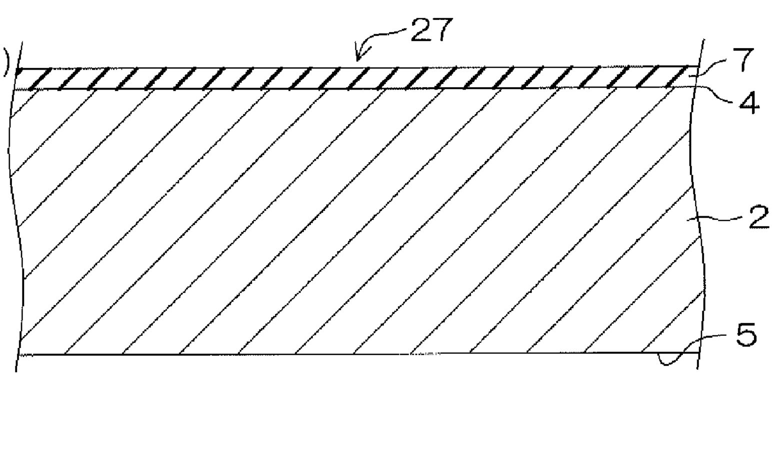

FIG. 27L(a) is a schematic sectional view showing a step subsequent to that in FIG. 27K(a), FIG. 27L(b) is a plan view in the state of FIG. 27L(a), and FIG. 27L(c) shows a cutting plane on the same position as that in FIG. 20(*b*) at the same point of time as that in FIG. 27L(a).

FIG. 27M(a) is a schematic sectional view showing a step subsequent to that in FIG. 27L(a), and FIG. 27M(b) shows a cutting plane on the same position as that in FIG. 20(*b*) at the same point of time as that in FIG. 27M(a).

Figure 27N:
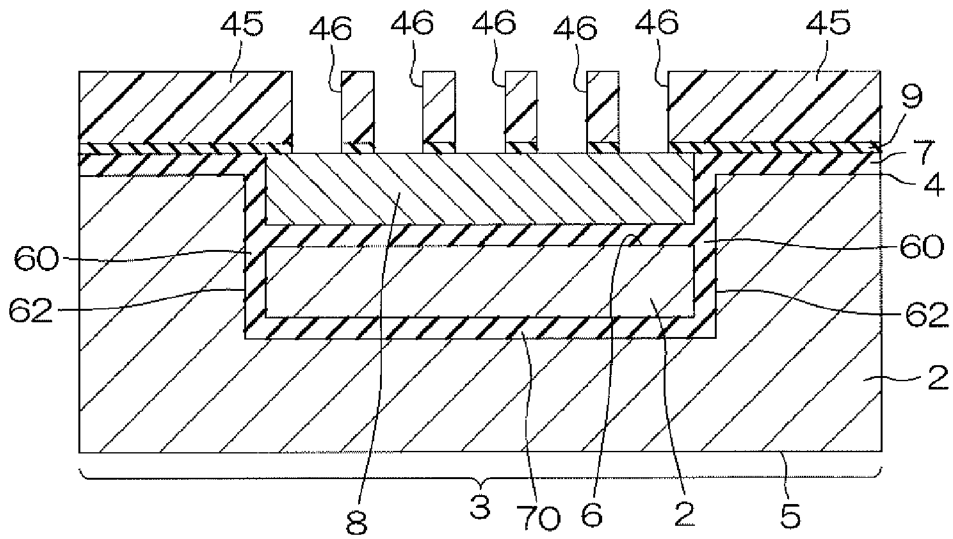
Figure 27N:
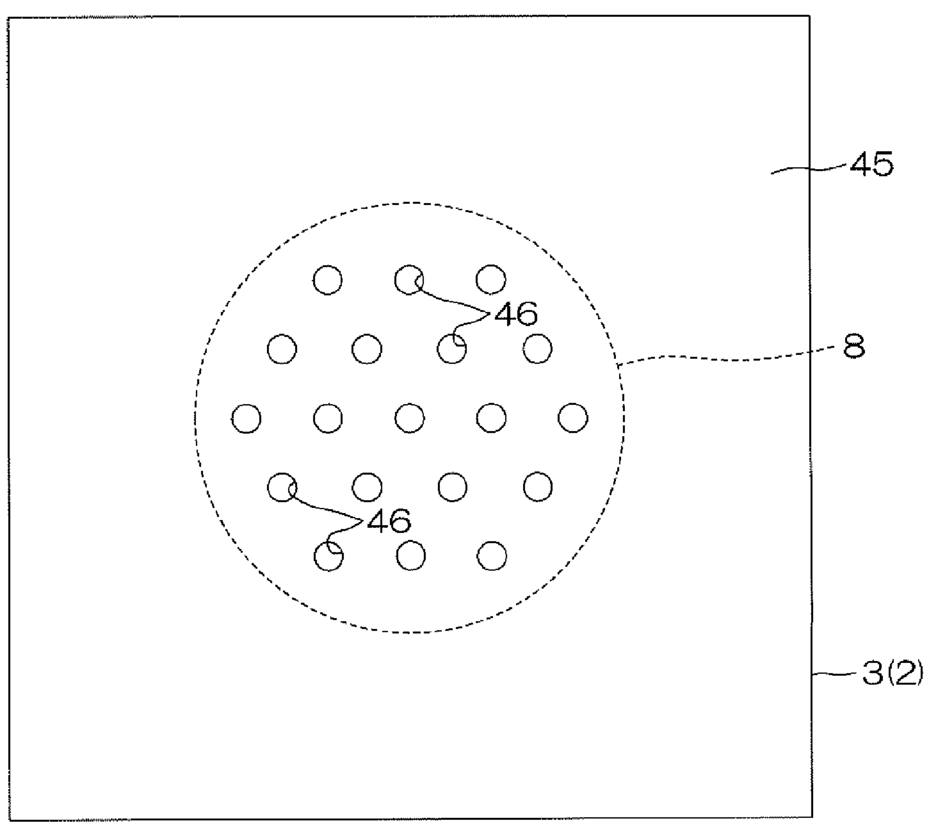
Figure 270A:
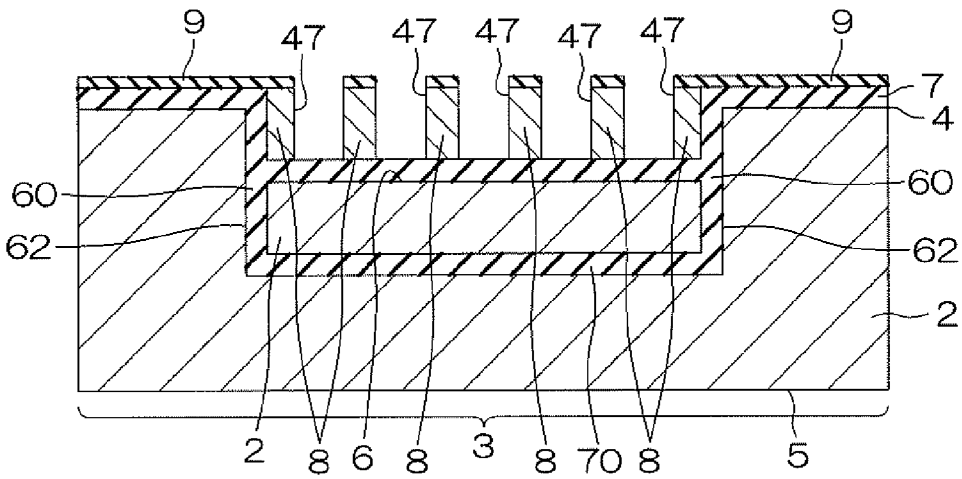
Figure 270B:
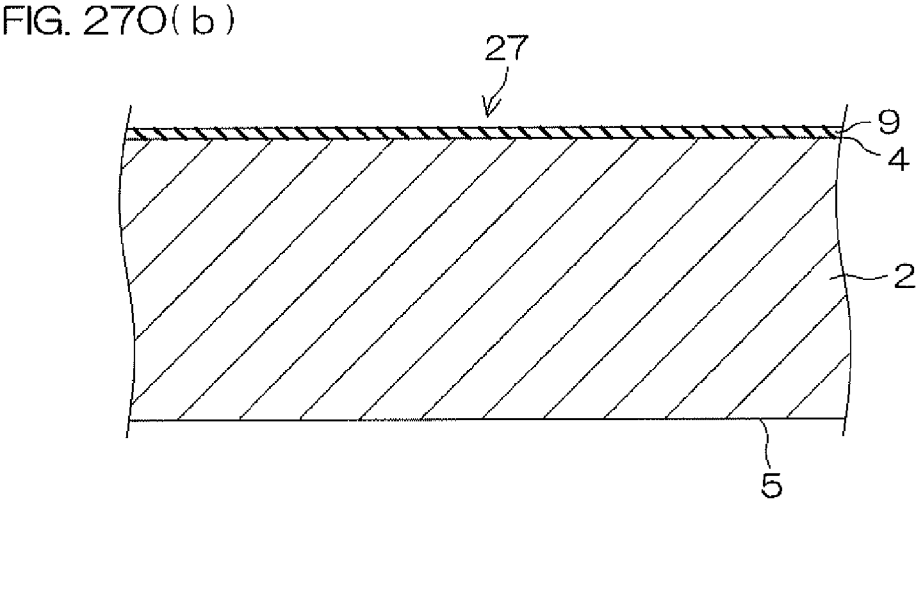

FIG. 27N(a) is a schematic sectional view showing a step subsequent to that in FIG. 27M(a), and FIG. 27N(b) shows a cutting plane on the same position as that in FIG. 20(*b*) at the same point of time as that in FIG. 27N(a).

FIG. 27O(a) is a schematic sectional view showing a step subsequent to that in FIG. 27N(a), and FIG. 27O(b) shows a cutting plane on the same position as that in FIG. 20(*b*) at the same point of time as that in FIG. 27O(a).

FIG. 27P(a) is a schematic sectional view showing a step subsequent to that in FIG. 27O(a), and FIG. 27P(b) shows a cutting plane on the same position as that in FIG. 20(*b*) at the same point of time as that in FIG. 27P(a).

Figure 27Q:
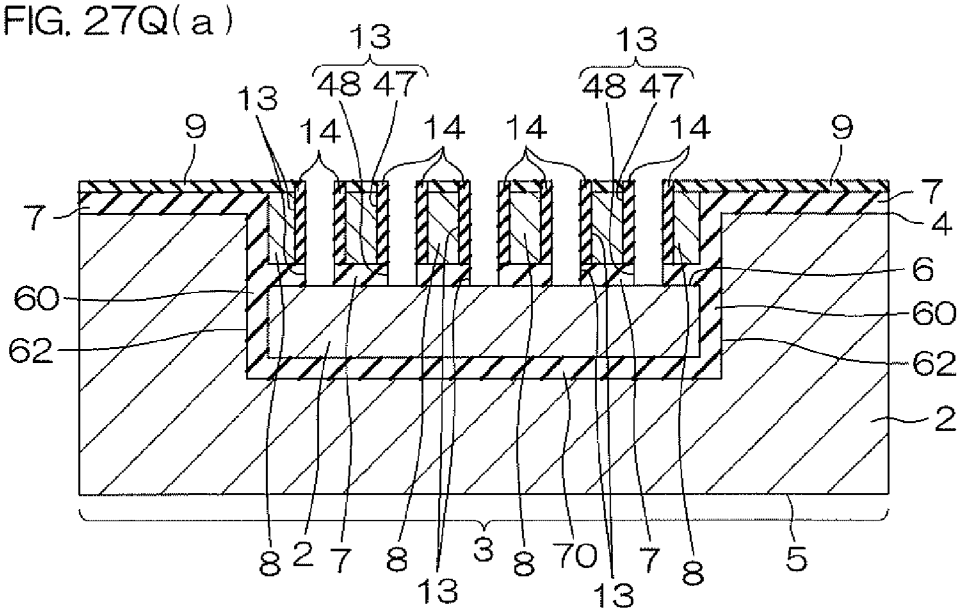
Figure 27Q:
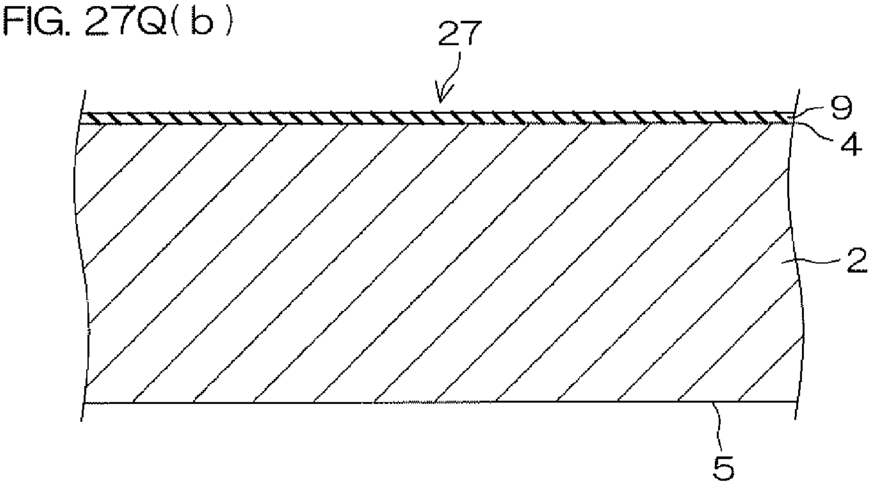

FIG. 27Q(a) is a schematic sectional view showing a step subsequent to that in FIG. 27P(a), and FIG. 27Q(b) shows a cutting plane on the same position as that in FIG. 20(*b*) at the same point of time as that in FIG. 27Q(a).

Figure 27R:
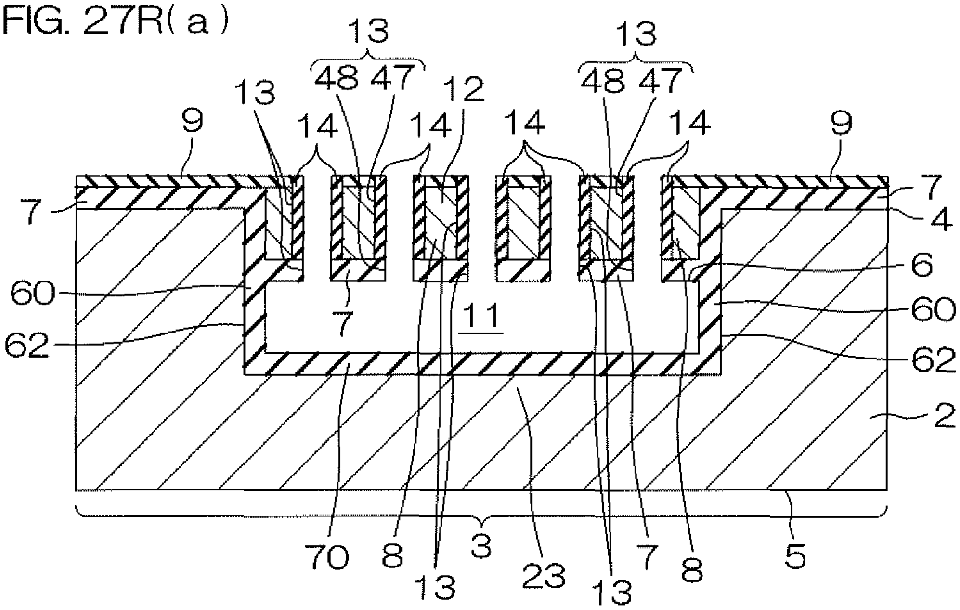
Figure 27R:
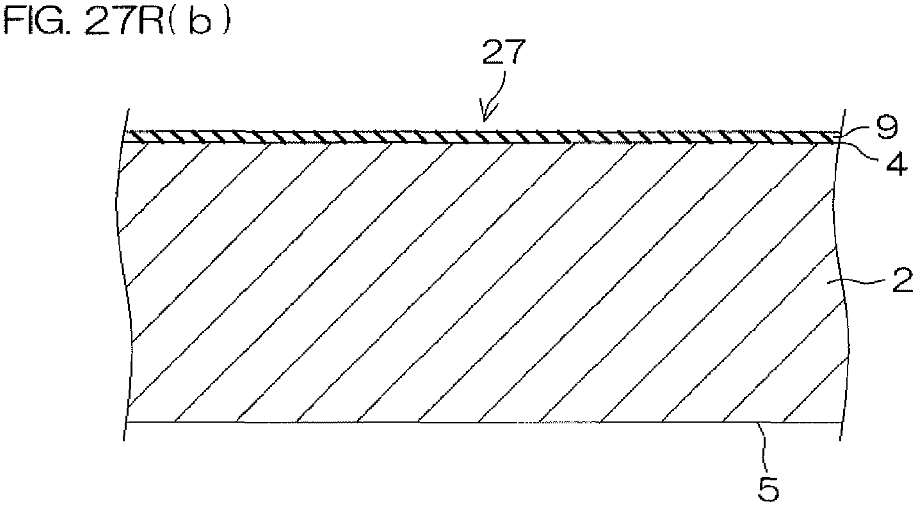

FIG. 27R(a) is a schematic sectional view showing a step subsequent to that in FIG. 27Q(a), and FIG. 27R(b) shows a cutting plane on the same position as that in FIG. 20(*b*) at the same point of time as that in FIG. 27R(a).

Figure 27S:
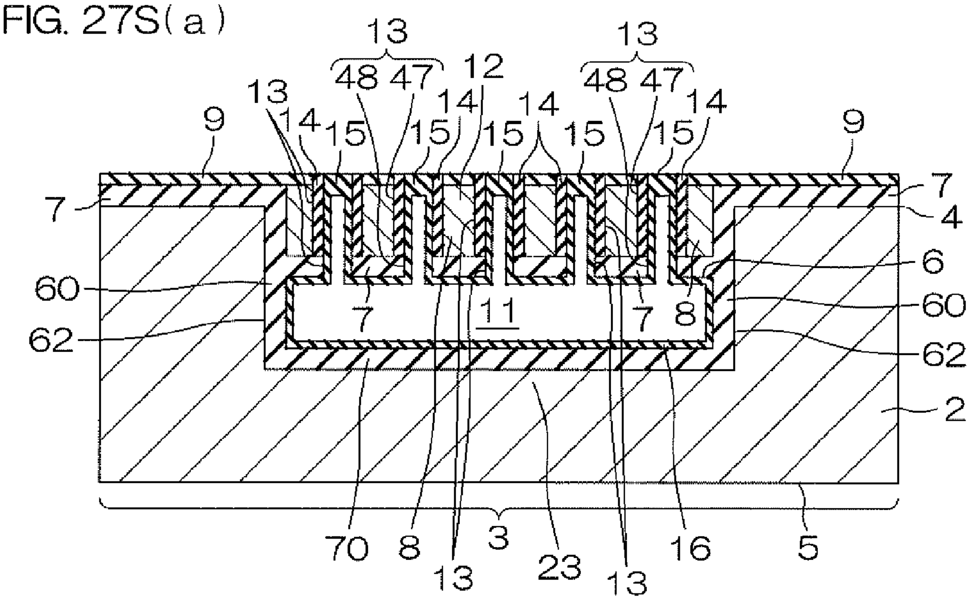
Figure 27S:
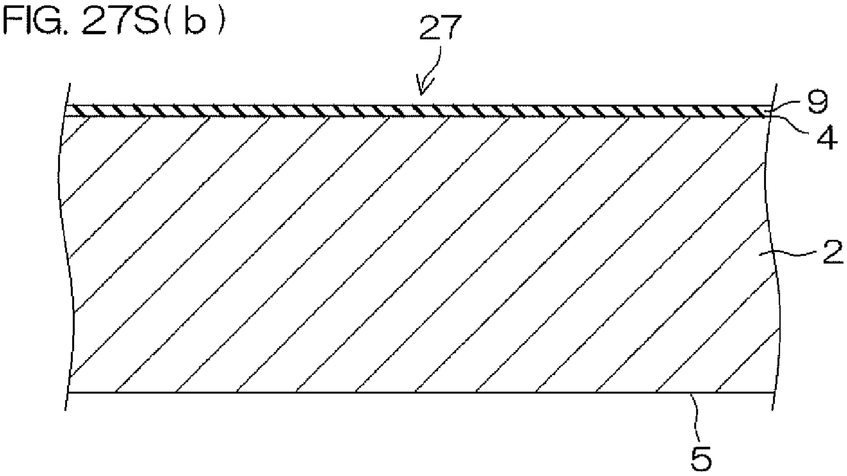

FIG. 27S(a) is a schematic sectional view showing a step subsequent to that in FIG. 27R(a), and FIG. 27S(b) shows a cutting plane on the same position as that in FIG. 20(*b*) at the same point of time as that in FIG. 27S(a).

Figure 27T:
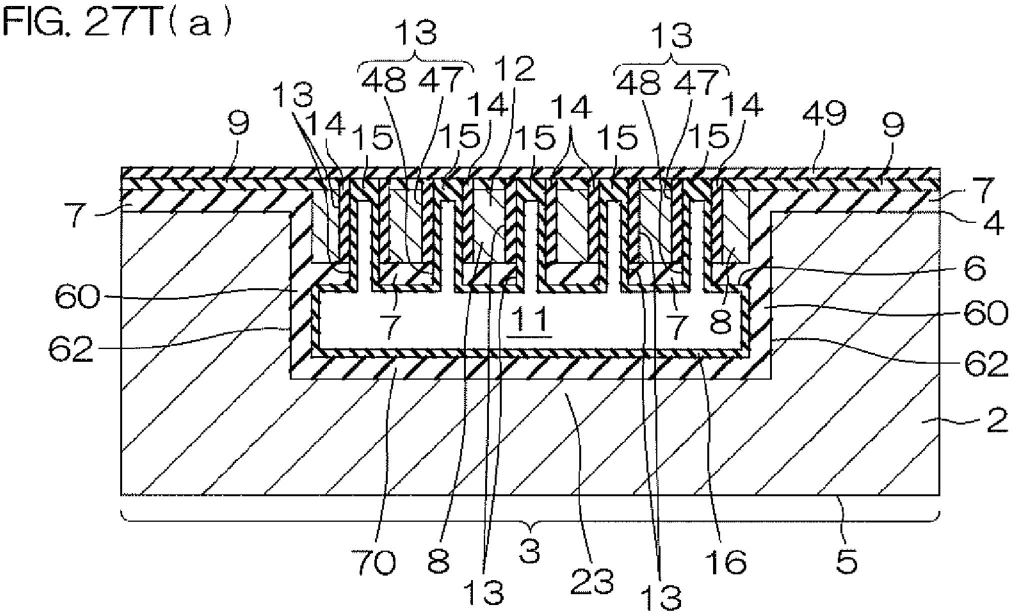
Figure 27T:
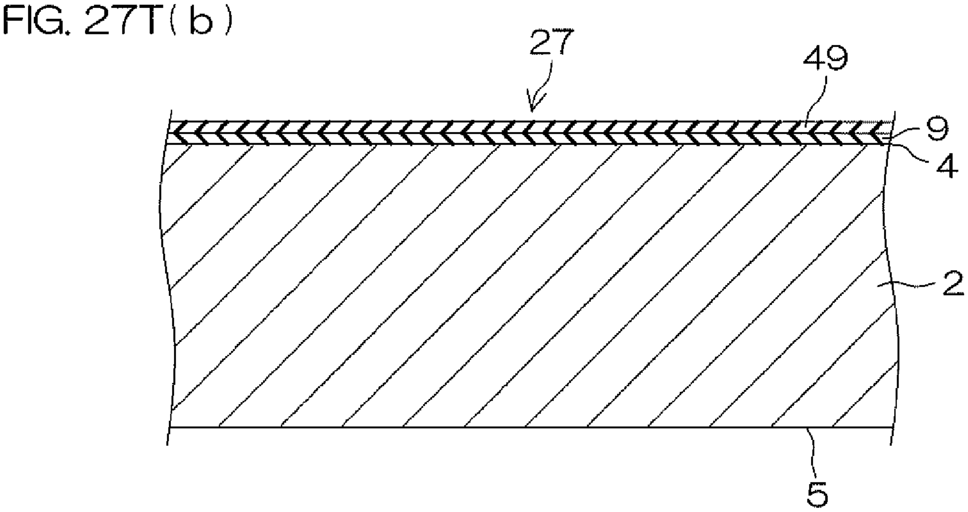

FIG. 27T(a) is a schematic sectional view showing a step subsequent to that in FIG. 27S(a), and FIG. 27T(b) shows a cutting plane on the same position as that in FIG. 20(*b*) at the same point of time as that in FIG. 27T(a).

Figure 27U:
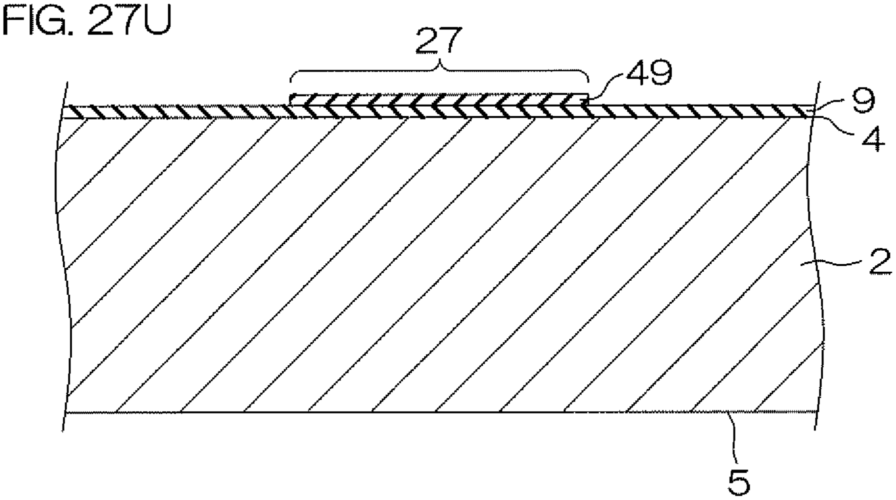

FIG. 27U is a schematic sectional view showing a step subsequent to that in FIG. 27T(b).

Figure 27V:
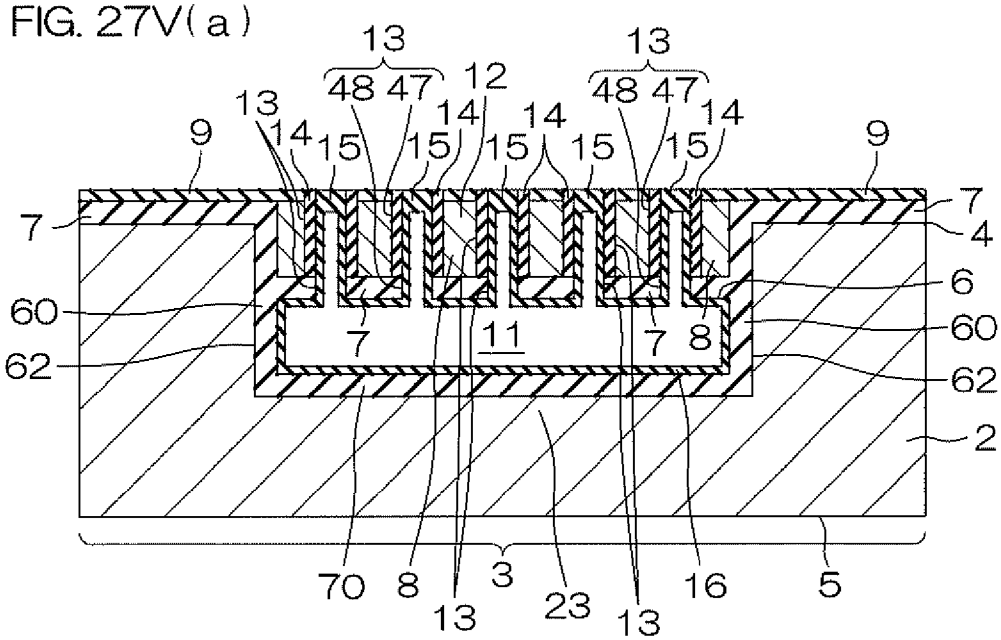
Figure 27V:
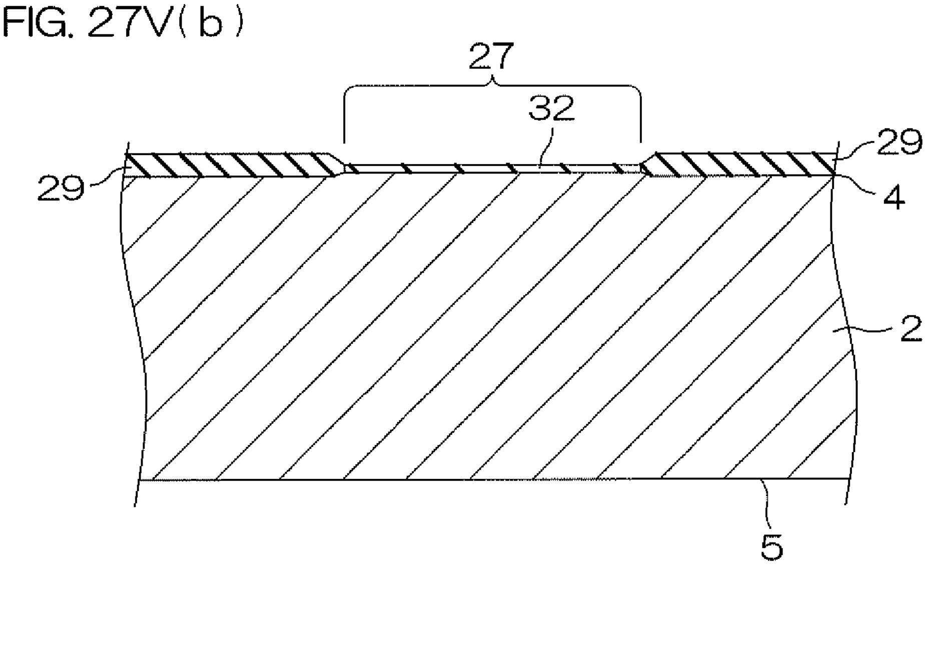

FIG. 27V(a) shows a cutting plane on the same position as that in FIG. 26(*b*) illustrating a step subsequent to that in FIG. 27U, and FIG. 27V(B) shows a cutting plane on the same position as that in FIG. 20(*b*) at the same point of time as that in FIG. 27V(a).

Figure 27W:
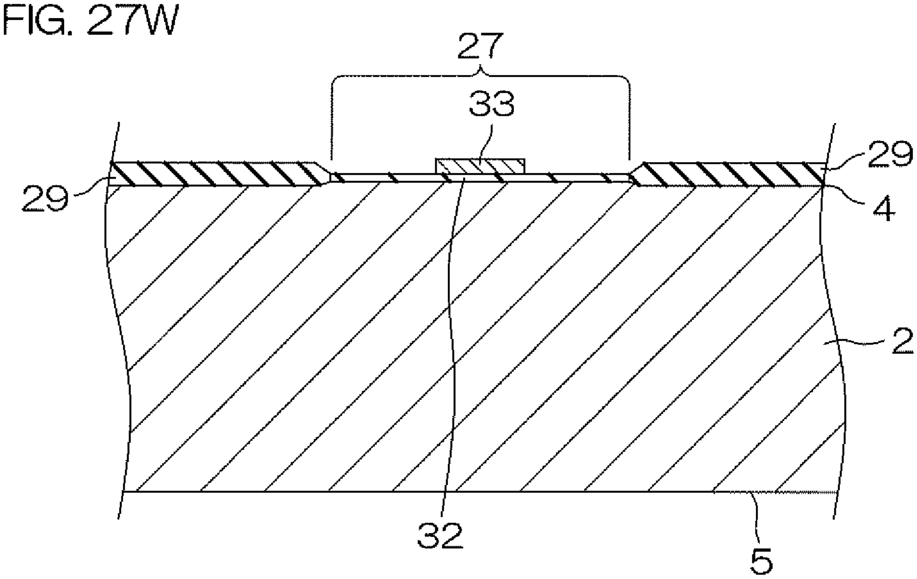

FIG. 27W is a schematic sectional view showing a step subsequent to that in FIG. 27V(b).

Figure 27X:
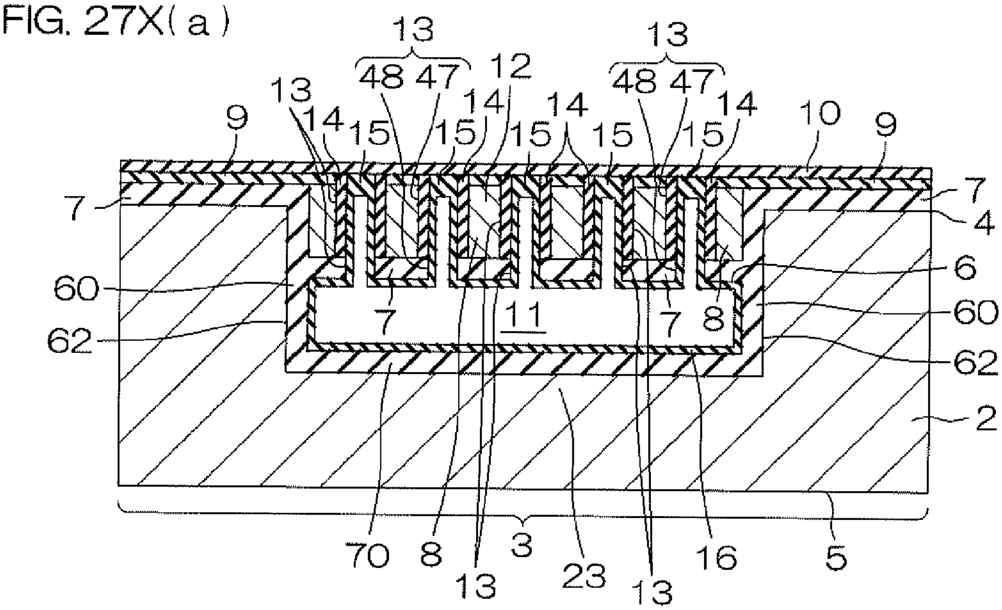
Figure 27X:
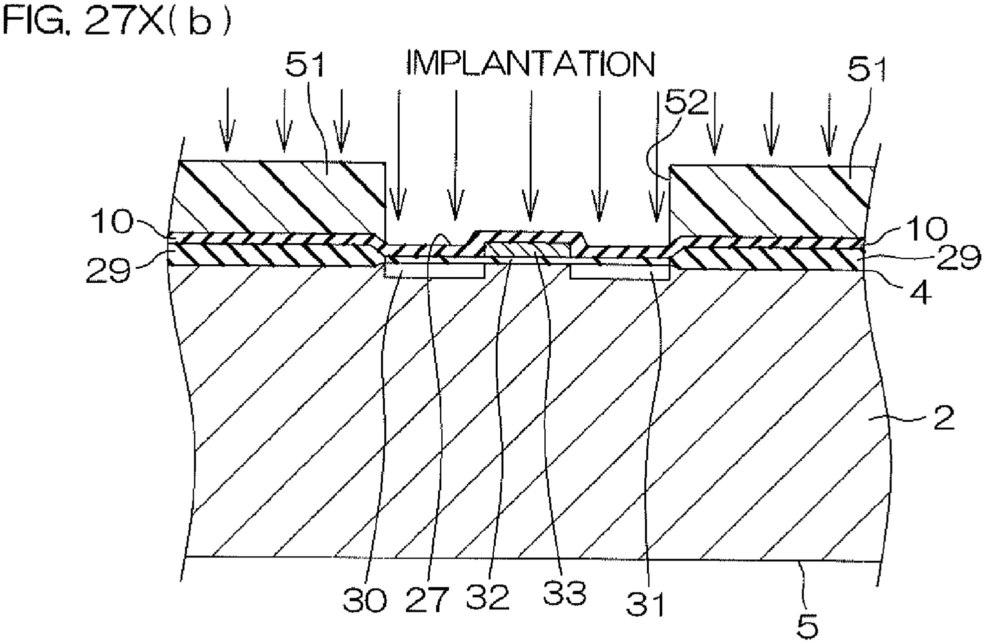

FIG. 27X(a) shows a cutting plane on the same position as that in FIG. 26(*b*) illustrating a step subsequent to that in FIG. 27W, and FIG. 27X(b) shows a cutting plane on the same position as that in FIG. 20(*b*) at the same point of time as that in FIG. 27X(a).

Figure 28A:
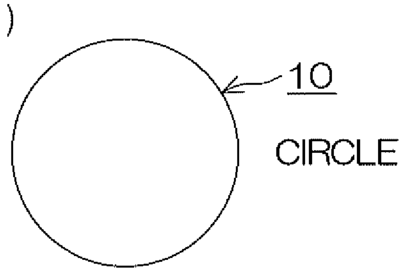
Figure 28B:
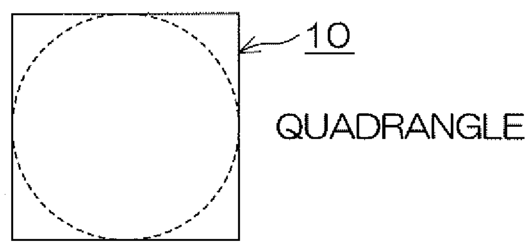
Figure 28C:
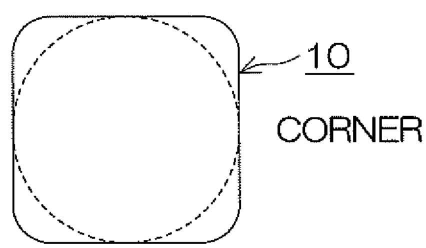

FIG. 28(*a*) is a plan view of a circular diaphragm, FIG. 28(*b*) is a plan view of a quadrangular diaphragm having right-angled four corners, and FIG. 28(*c*) is a plan view of a quadrangular diaphragm having rounded four corners.

Figure 29:
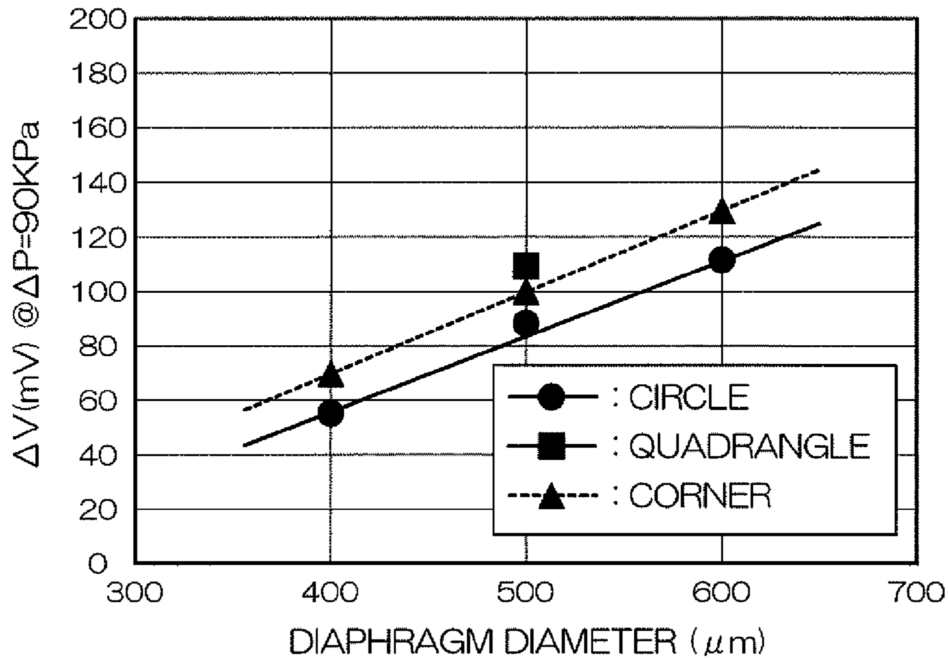

FIG. 29 is a graph showing the relation between diaphragm diameters and sensitivity of pressure sensors.

Figure 30:
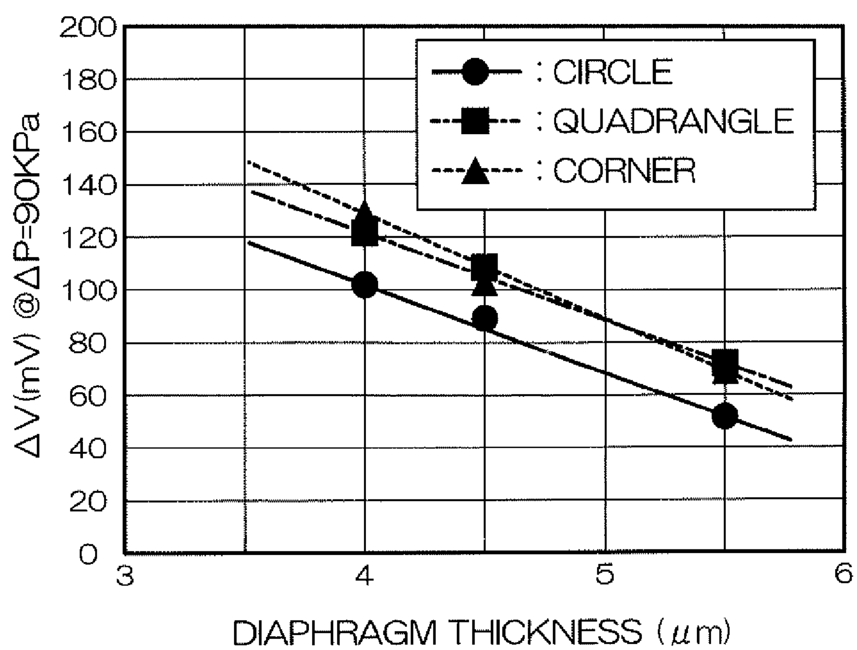

FIG. 30 is a graph showing the relation between diaphragm thicknesses and the sensitivity of the pressure sensors.

DESCRIPTION OF EMBODIMENTS

Figure 1:
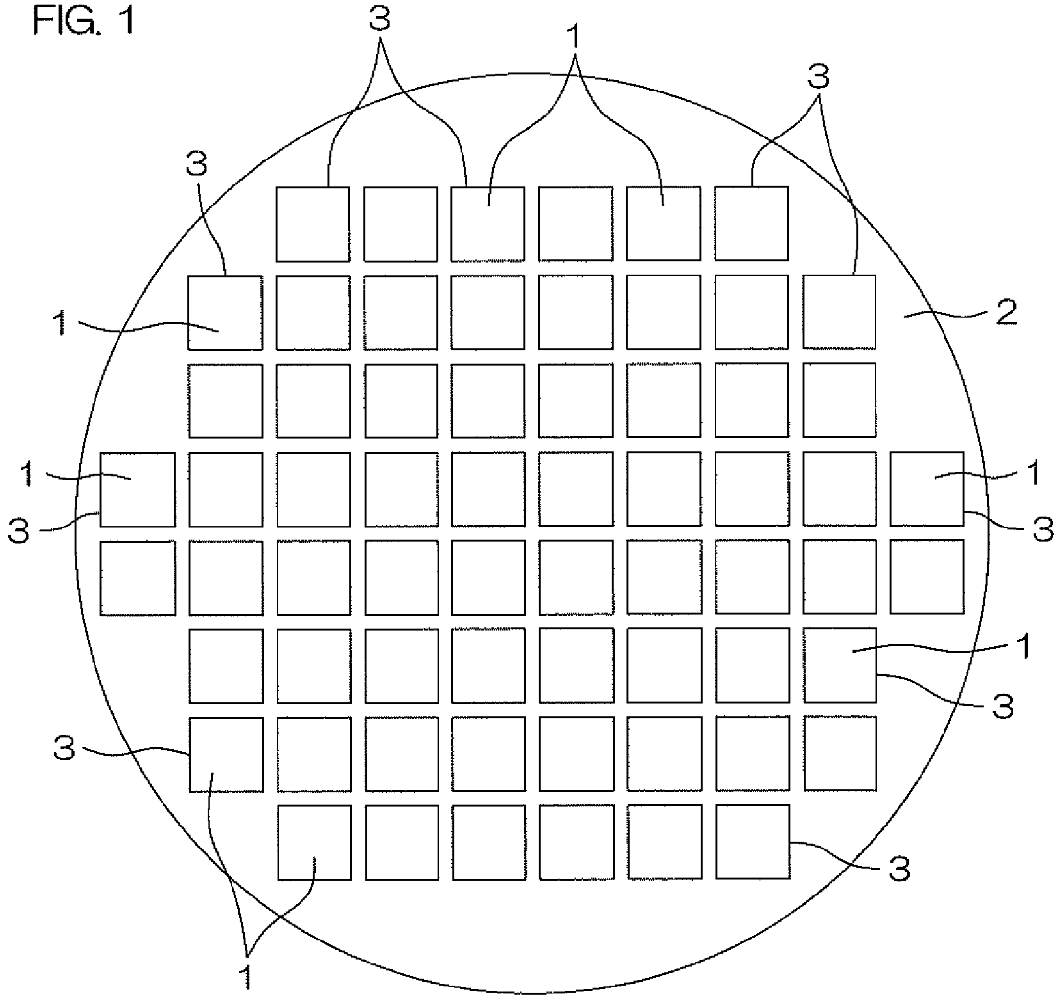
FIG. 1 is a schematic plan view of a silicon substrate employed in a manufacturing process for a pressure sensor according to an embodiment of the present invention.

Embodiments of the present invention are now described in detail with reference to the attached drawings. FIG. 1 is a schematic plan view of a silicon substrate employed in a manufacturing process for a pressure sensor according to one embodiment of the present invention. Specifically, a silicon substrate 2 is made of silicon crystal-grown with addition of a P-type or N-type impurity. The silicon substrate 2 is preferably a low-resistance one whose specific resistance is 5 to 100 mΩ·cm, for example.

A large number of pressure sensors 1 are collectively formed on one silicon substrate 2. The pressure sensors 1 are formed on a plurality of rectangular regions 3 regularly arrayed on the silicon substrate 2 respectively. In the example of FIG. 1, the respective rectangular regions 3 are generally square in plan view, and arrayed in the form of a matrix at intervals from one another.

The pressure sensors 1 may have a plurality of modes responsive to structures thereof and manufacturing methods therefor. Typical embodiments of the pressure sensors 1 are now described.

(1) First Embodiment

Figure 2:
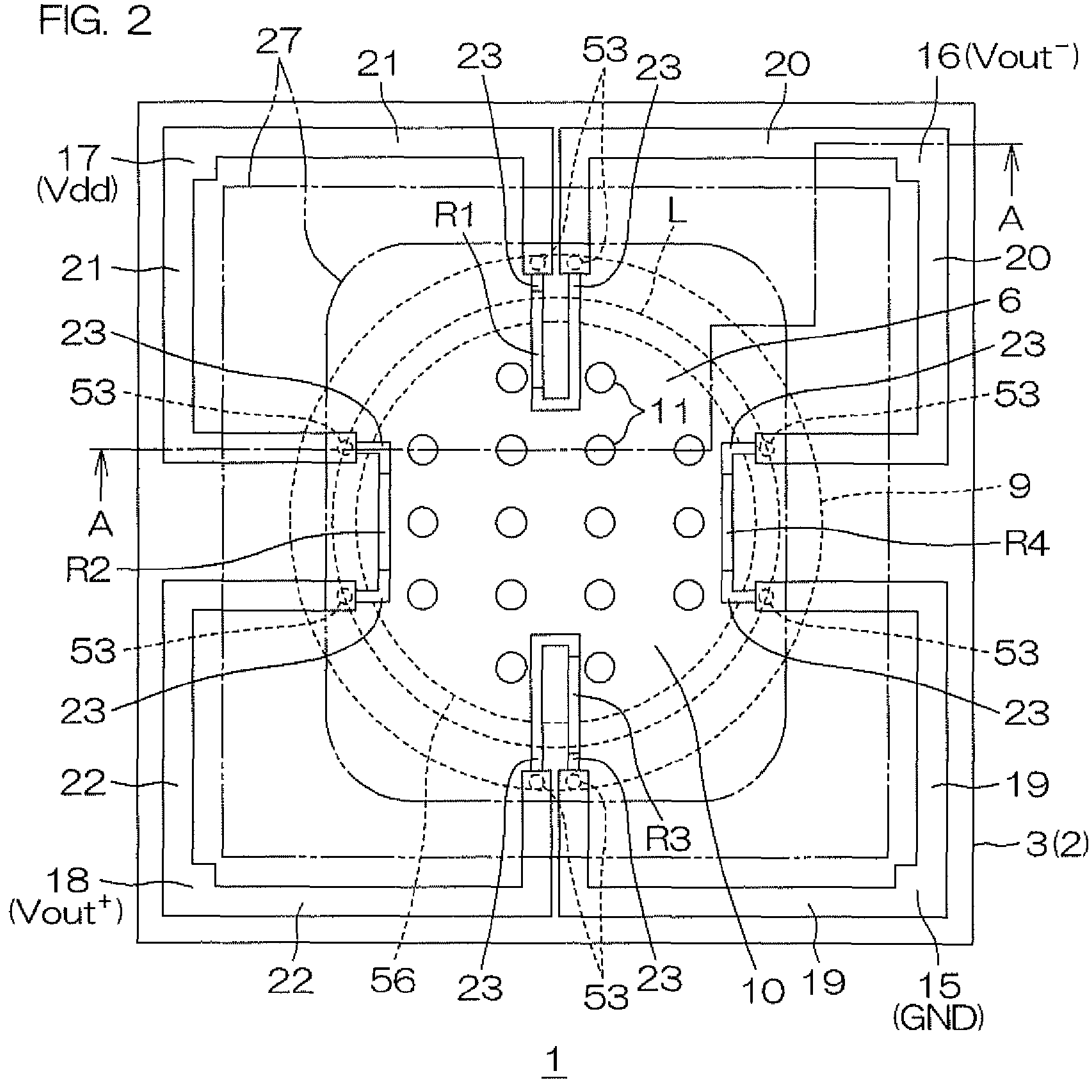
FIG. 2 is an enlarged plan view of a pressure sensor according to a first embodiment.
Figure 3A:
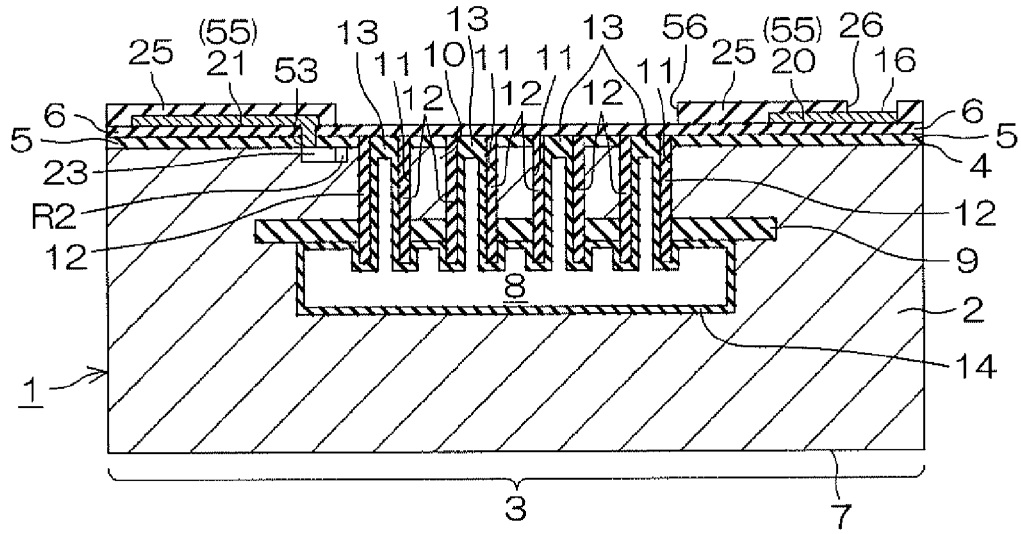
FIG. 3(*a*) is a sectional view along a cutting plane line A-A in FIG. 2, and FIG. 3(*b*) is a sectional view of a principal portion of the pressure sensor in an integrated circuit region of FIG. 2.
Figure 3B:
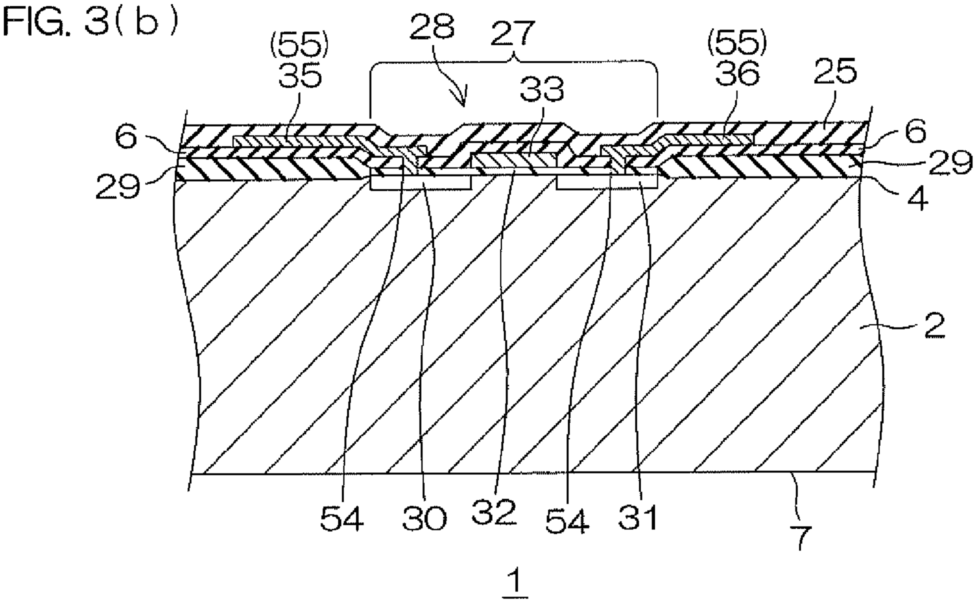
Figure 4:
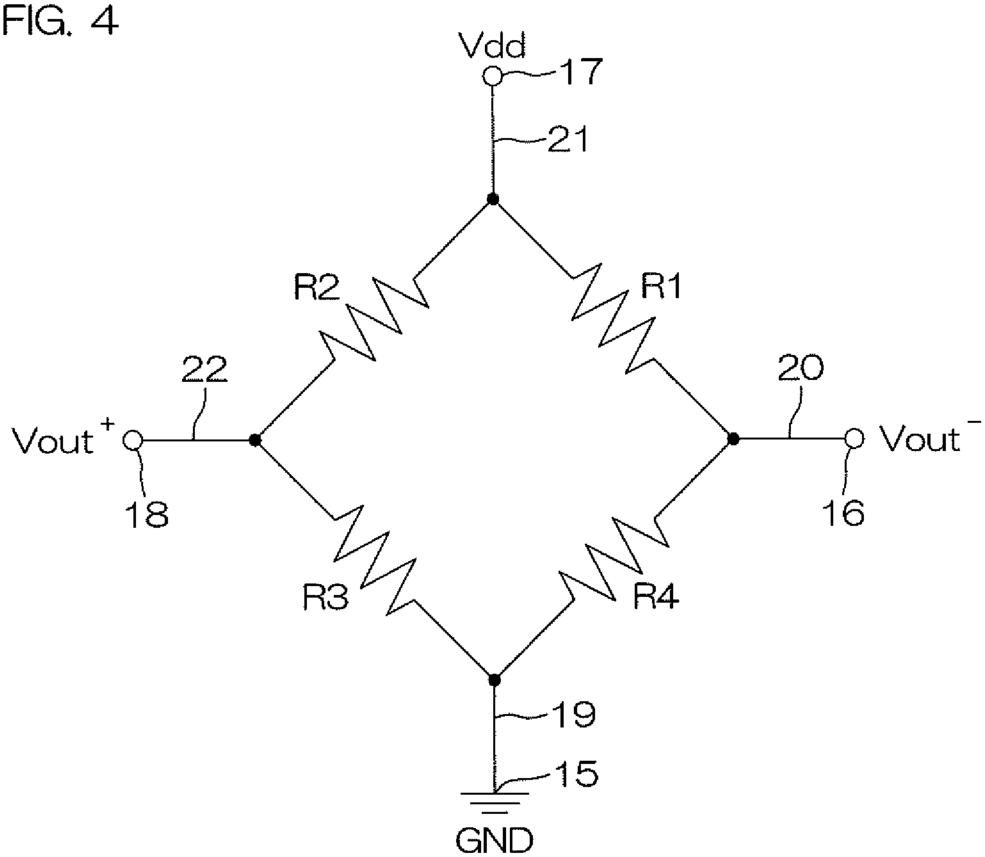
FIG. 4 is a circuit diagram of a bridge circuit constituted of metal wires and piezoresistors.

FIG. 2 is an enlarged plan view of a pressure sensor according to a first embodiment. FIG. 3(*a*) is a sectional view along a cutting plane line A-A in FIG. 2, and FIG. 3(*b*) is a sectional view of a principal portion of the pressure sensor in an integrated circuit region of FIG. 2. FIG. 4 is a circuit diagram of a bridge circuit constituted of metal wires and piezoresistors.

As shown in FIG. 3(*a*), each pressure sensor 1 includes a silicon substrate 2 having a magnitude corresponding to a rectangular region 3. A surface 4 of the silicon substrate 2 is covered with a covering layer 5. Further, an insulating layer 6 is formed on a surface of the covering layer 5. Each of the covering layer 5 and the insulating layer 6 is made of silicon oxide ($SiO_2$), for example. A back surface 7 of the silicon substrate 2 is an exposed surface.

A reference pressure chamber 8 is formed in the silicon substrate 2. According to this embodiment, the reference pressure chamber 8 is a flat cavity (a flat space) spreading parallelly to the surface 4 and the back surface 7 of the silicon substrate 2 and having a small height in the vertical direction (the thickness direction of the silicon substrate 2). In other words, the dimension of the reference pressure chamber 8 in the direction parallel to the surface 4 and the back surface 7 is larger than the dimension in the height direction. One reference pressure chamber 8 is formed in each pressure sensor 1. According to this embodiment, the reference pressure chamber 8 is provided in a circular shape (three-dimensionally in a cylindrical shape) in plan view. An etching stop layer 9, circular in plan view, partitioning the reference pressure chamber 8 from an upper side (the side of the surface 4) is formed in the silicon substrate 2. The etching stop layer 9 is larger in diameter than the reference pressure chamber 8.

The reference pressure chamber 8 is formed in the silicon substrate 2, whereby a portion (also including the etching stop layer 9) opposed to the reference pressure chamber 8 is more reduced in thickness than the remaining portion on the side of the surface 4 of the silicon substrate 2. Thus, the silicon substrate 2 has a diaphragm 10 circular in plan view on a side of the reference pressure chamber 8 closer to the surface 4. The diaphragm 10 is a thin film displaceable in a direction (the thickness direction of the silicon substrate 2) opposed to the reference pressure chamber 8. The diaphragm 10 is part of the silicon substrate 2, and formed on a surface layer portion of the silicon substrate 2 to partition the reference pressure chamber 8. The etching stop layer 9 is formed on a surface (a lower surface) of the diaphragm 10 facing the reference pressure chamber 8, and partially forms the diaphragm 10. A surface of the diaphragm 10 opposite to the lower surface is the surface 4 of the silicon substrate 2.

The diameter of the diaphragm 10 is generally identical to the diameter of the reference pressure chamber 8, and 200 to 600 μm in this embodiment. The thickness of the diaphragm 10 is 0.5 to 1 μm, for example. However, the thickness of the diaphragm 10 is exaggeratedly drawn in FIG. 3(*a*), in order to clearly show the structure. The diaphragm 10 is integrally supported by the remaining portion of the silicon substrate 2. According to this embodiment, the diaphragm 10 is arranged generally at the center of the rectangular region 3 in plan view (see FIG. 2).

In the diaphragm 10, a large number of through-holes 11 circular in plan view are formed at prescribed regular intervals over the whole area of a region inside the contour of the diaphragm 10 (in other words, the contour of the reference pressure chamber 8 in plan view) (see FIG. 2). According to this embodiment, the plurality of through-holes 11 are regularly arrayed in the form of a matrix along two directions intersecting with each other in plan view. All through-holes 11 pass through a portion (also including the covering layer 5 and the etching stop layer 9) between the covering layer 5 on the surface 4 of the silicon substrate 2 and the reference pressure chamber 8, and communicate with the reference pressure chamber 8. According to this embodiment, the diameter of each through-hole 11 is 0.5 μm, for example. According to this embodiment, further, the depth of each through-hole 11 is 2 to 7 μm, for example.

Inner wall surfaces of the through-holes 11 are covered with protective thin films 12 (sidewall layers, sidewall insulating layers) made of silicon oxide ($SiO_2$). In all through-holes 11, oxide films, made of silicon oxide ($SiO_2$), formed by CVD (Chemical Vapor Deposition) are charged and embedded inside the protective thin films 12. Thus, all through-holes 11 are filled up with fillers 13 (embedding materials) of the oxide films, and the flat space under the through-holes 11 is sealed as the reference pressure chamber 8 whose internal pressure is regarded as reference at a time of pressure detection. According to this embodiment, the reference pressure chamber 8 is held in a vacuum or decompressed state ($10^{-5}$ Torr, for example). The oxide films charged into the through-holes 11 form the fillers 13 filling up the respective through-holes 11 on respective upper portions of the through-holes 11. The oxide films further form a covering film 14 continuous with lower portions of the fillers 13. The covering film 14 reaches the interior of the reference pressure chamber 8, and covers the whole areas of inner wall surfaces of the reference pressure chamber 8.

As shown in FIG. 2, each pressure sensor 1 further includes piezoresistors R1 to R4 as strain gauges, metal terminals 15 to 18, and metal wires 19 to 22.

The piezoresistors R1 to R4 are diffused resistors formed on the surface layer portion (in the periphery of the surface 4) of the silicon substrate 2 by introducing an impurity such as boron (B) into the silicon substrate 2, and also referred to as "gauges". According to this embodiment, the four piezoresistors are arranged generally at regular intervals along the circumferential direction of the generally circular diaphragm 10. The pair of piezoresistors R1 and R3 opposed to each other through the center of the diaphragm 10 are in the form of bars extending along the radial direction of a circular contour L of the diaphragm 10, and formed to extend over the inside and outside of the diaphragm 10 in plan view. Another pair of piezoresistors R2 and R4 similarly opposed to each other through the center of the diaphragm 10 are in the form of bars extending along a tangential direction with respect to the contour L of the diaphragm 10, and formed to remain inside the diaphragm 10 in plan view.

Relay wires 23 are connected to both ends of each of the piezoresistors R1 to R4. The relay wires 23 are also formed on the surface layer portion of the silicon substrate 2 by introducing an impurity into the silicon substrate 2, similarly to the piezoresistors R1 to R4. The relay wires 23 are $P^+$ regions formed by introducing a P-type impurity in a high concentration, for example, and extend to the outside of the contour L of the diaphragm 10 from the connected piezoresistors.

The metal terminals 15 to 18 include a grounding terminal 15 (GND), a negative voltage output terminal 16 ($Vout^-$), a voltage application terminal 17 (Vdd) and a positive voltage output terminal 18 ($Vout^+$). The four metal terminals 15 to 18 are formed on the insulating layer 6 (see FIG. 3(*a*)), and arranged one by one on the four corners of the rectangular region 3. According to this embodiment, the metal terminals 15 to 18 are made of aluminum (Al).

The metal wires 19 to 22 are wires for forming a bridge circuit (Wheatstone bridge) shown in FIG. 4 by bridge-connecting the piezoresistors R1 to R4.

More specifically, the metal wire 19 is a grounding wire 19, connecting the piezoresistor R3 and the piezoresistor R4 with each other on the outside of the diaphragm 10, connected to the grounding terminal 15. The metal wire 20 is a negative output wire 20, connecting the piezoresistor R1 and the piezoresistor R4 with each other on the outside of the diaphragm 10, connected to the negative voltage output terminal 16. The metal wire 21 is a voltage application wire 21, connecting the piezoresistor R1 and the piezoresistor R2 with each other on the outside of the diaphragm 10, connected to the voltage application terminal 17. The metal wire 22 is a positive output wire 22, connecting the piezoresistor R2 and the piezoresistor R3 with each other on the outside of the diaphragm 10, connected to the positive voltage output terminal 18.

According to this embodiment, the metal wires 19 to 22 are made of aluminum (Al), and formed on the insulating layer 6 (see FIG. 3(*a*)). The metal wires 19 to 22 linearly extend from the corresponding piezoresistors along the diametral direction of the diaphragm 10, are generally perpendicularly bent around outer peripheral edges of the rectangular region 3, linearly extend along the outer peripheral edges of the rectangular region 3, and are connected to the corresponding metal terminals. The metal wires 19 to 22 and the piezoresistors R1 to R4 are relayed by the relay wires 23.

As shown in FIG. 3(*a*), the metal terminals 15 to 18 (the metal terminal 16 in FIG. 3(*a*)) and the metal wires 19 to 22 (the metal wires 20 and 21 in FIG. 3(*a*)) are covered with a passivation film 25 made of silicon nitride (SiN). Openings 26 exposing the metal terminals 15 to 18 as pads respectively are formed in the passivation film 25. Referring to FIG. 2, illustration of the passivation film 25 is omitted.

When the diaphragm 10 receives pressure (gas pressure, for example) from the side of the surface 4 of the silicon substrate 2 in the pressure sensor 1, pressure difference is caused between the interior and the exterior of the reference pressure chamber 8, whereby the diaphragm 10 is displaced in the thickness direction of the silicon substrate 2. Silicon crystals constituting the piezoresistors R1 to R4 are strained due to the displacement, to change the resistance values of the piezoresistors R1 to R4.

When constant bias voltage is supplied to the voltage application terminal 17, voltage between the output terminals 16 and 18 changes in response to the changes in the resistance values of the piezoresistors R1 to R4, as shown in FIG. 4. Therefore, the magnitude of the pressure caused in the pressure sensor 1 can be detected on the basis of the voltage change.

Referring to FIG. 2, an integrated circuit region 27 (a region surrounded by two-dot chain lines) is provided between the outer peripheral edges (more detailedly, portions linearly extending along the outer peripheral edges of the rectangular region 3 in the respective ones of the metal wires 19 to 22) of each rectangular region 3 of the silicon substrate 2 and the diaphragm 10. The integrated circuit region 27 is a generally rectangular annular region surrounding the diaphragm 10 in plan view. An integrated circuit portion 28 including integrated circuit devices (functional elements) such as transistors, resistors and others is formed on the integrated circuit region 27. In other words, the pressure sensor 1 includes the integrated circuit portion 28 formed on the silicon substrate 2 provided with the diaphragm 10 etc.

More specifically, the integrated circuit region 27 is isolated from other regions of the silicon substrate 2 by a LOCOS layer 29, as shown in FIG. 3(*b*). A source 30 and a drain 31 are formed on the surface layer portion of the silicon substrate 2 in the integrated circuit region 27, and a gate oxide film 32 is formed on a portion of the surface 4 of the silicon substrate 2 corresponding to the integrated circuit region 27, to extend over the source 30 and the drain 31. A gate electrode 33 is formed on the gate oxide film 32, to be opposed to a portion (a portion where a channel is formed) between the source 30 and the drain 31. The insulating layer 6 is formed on the LOCOS layer 29 and the gate oxide film 32, to cover the gate electrode 33.

A source-side metal wire 35 and a drain-side metal wire 36 are provided on a surface of the insulating layer 6. The source-side metal wire 35 passes through the insulating layer 6 and the gate oxide film 32 and is connected to the source 30. The drain-side metal wire 36 passes through the insulating layer 6 and the gate oxide film 32 and is connected to the drain 31.

The passivation film 25 is formed on the surface of the insulating layer 6, to cover the source-side metal wire 35 and the drain-side metal wire 36. An element group arranged on the integrated circuit region 27 is referred to as the integrated circuit portion 28.

Figure 5A:
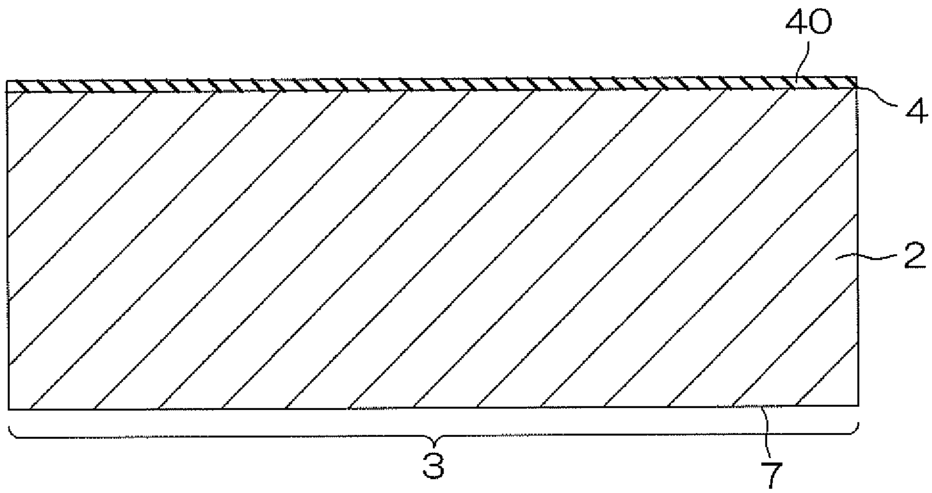
FIG. 5A(a) is a schematic sectional view showing a manufacturing step for the pressure sensor shown in FIGS. 2 and 3 and shows a cutting plane on the same position as that in FIG. 3(*a*), while FIG. 5A(b) shows a cutting plane on the same position as that in FIG. 3(*b*) at the same point of time as that in FIG. 5A(a).
Figure 5A:
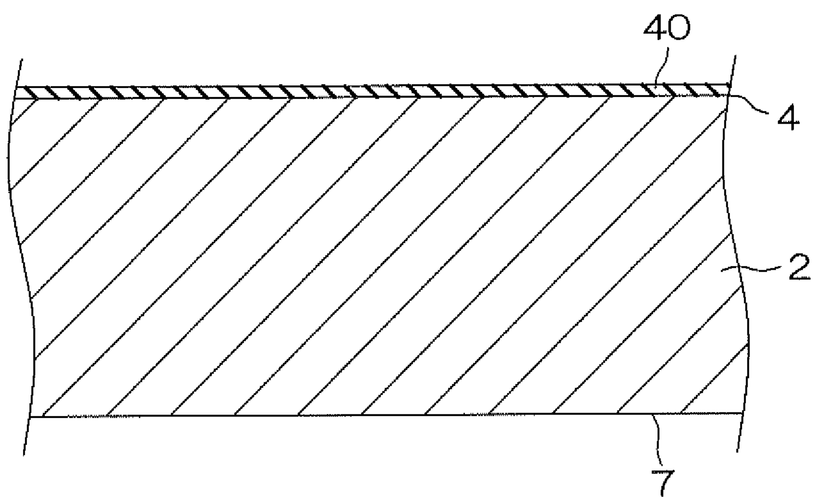

FIGS. 5A to 5O show manufacturing steps for the pressure sensor shown in FIGS. 2 and 3. In a case where two sectional views are shown in each of FIGS. 5A to 5O, the upper sectional view shows a cutting plane on the same position as that in FIG. 3(*a*), and the lower sectional view shows a cutting plane on the same position as that in FIG. 3(*b*).

In order to manufacture the pressure sensor 1, the silicon substrate 2 (a wafer) is prepared, as shown in FIG. 5A. According to this embodiment, the thickness of the silicon substrate 2 at this point of time is about 300 μm. More specifically, a state after selecting either a silicon substrate 2 having a diameter of 6 inches and a thickness of about 625 μm or a silicon substrate 2 having a diameter of 8 inches and a thickness of about 725 μm and reducing the thickness up to 300 μm is shown in FIG. 5A.

Then, an oxide film 40 having a thickness of several 100 Å is formed on the surface 4 of the silicon substrate 2 by thermal oxidation or CVD.

Figure 5B:
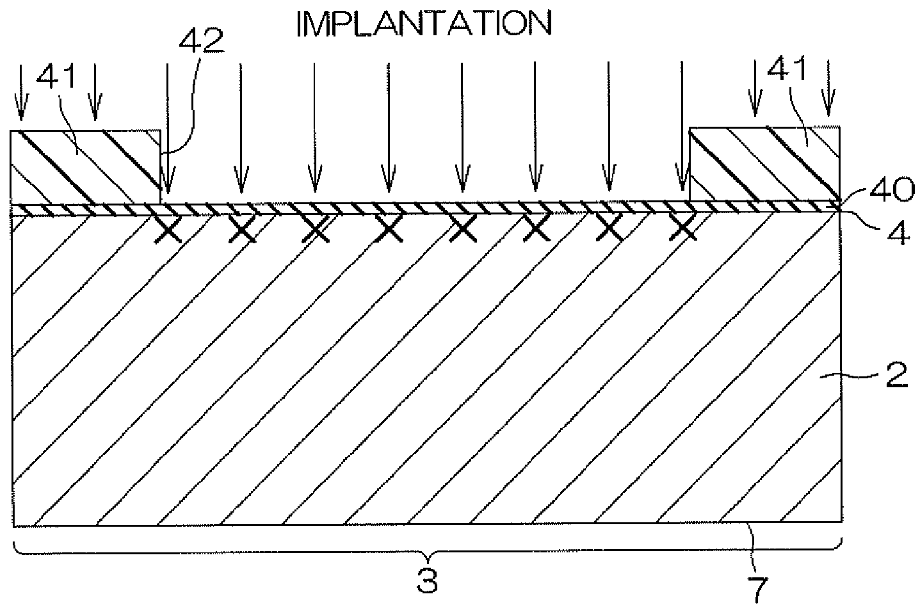
FIG. 5B(a) is a schematic sectional view showing a step subsequent to that in FIG. 5A(a), and FIG. 5B(b) is a plan view in the state of FIG. 5B(a).
Figure 5B:
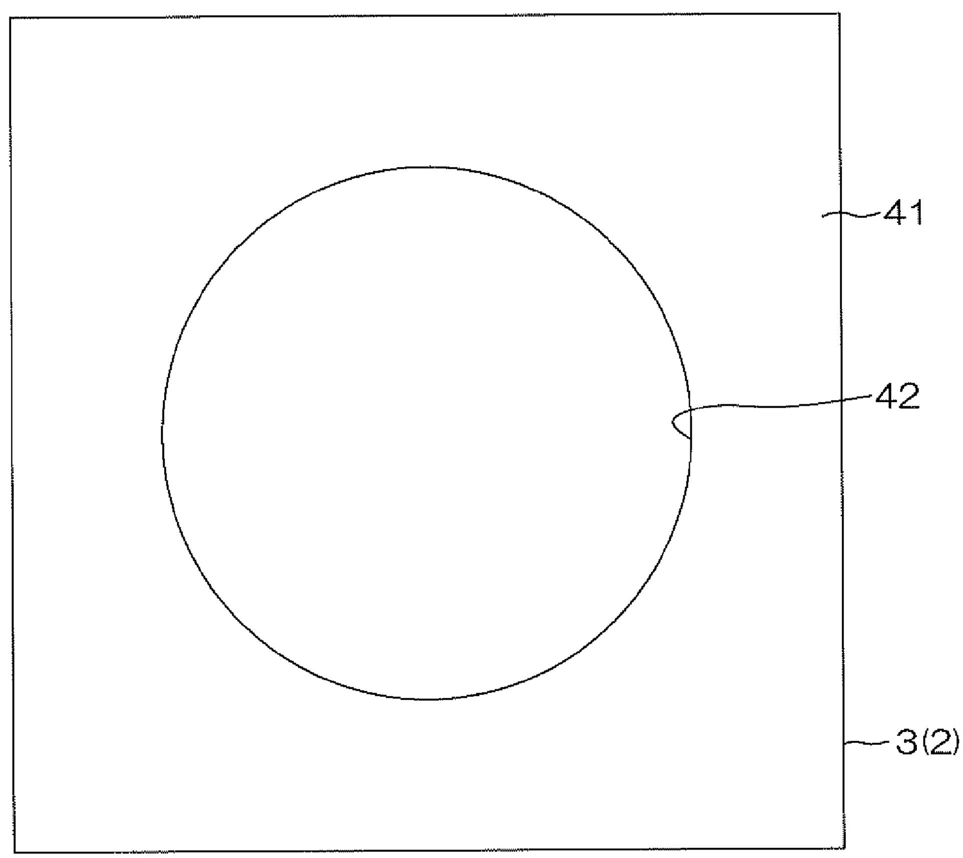

Then, a resist pattern 41 is formed on the oxide film 40 by photolithography, as shown in FIGS. 5B(a) and 5B(b). The resist pattern 41 has one circular opening 42 (see FIG. 5B(b)) corresponding to the etching stop layer 9 (see FIG. 3(*a*)). An impurity (nitrogen (N) ions or oxygen (O) ions, for example) is implanted into the surface layer portion (portions shown with "x" in FIG. 5B(a)) of the silicon substrate 2 by employing the resist pattern 41 as a mask (ion implantation). Acceleration voltage at the time of the ion implantation may be set to about 50 to 120 keV, for example. The oxide film 40 suppresses damage on the surface 4 resulting from the ion implantation.

Then, after the oxide film 40 and the resist pattern 41 are removed, treatment of epitaxially growing a semiconductor layer on the surface 4 of the silicon substrate 2 is performed. The silicon substrate 2 is heated at the time of the epitaxial growth, whereby the impurity ions implanted into the silicon substrate 2 are activated. Thus, the etching stop layer 9 made of silicon oxide ($SiO_2$) or silicon nitride (SiN) is formed on a position of a prescribed depth from the surface 4 of the silicon substrate 2, as shown in FIG. 5C(a). In the silicon substrate 2, a portion above the etching stop layer 9 (between the etching stop layer 9 and the surface 4) is an epitaxially grown silicon layer (an epitaxial layer). The thickness of the epitaxial layer is about 0.5 to 1 μm, for example.

The etching stop layer 9 can also be formed on a position of a prescribed depth (a depth of about 0.5 to 1 μm from the surface 4, for example) from the surface 4 of the silicon substrate 2 by only heat treatment (drive-in for diffusing the implanted ions) of the silicon substrate 2, in place of the epitaxial growth. In this case, the impurity ions (the oxygen ions or the nitrogen ions) are implanted into the position of the prescribed depth from the surface 4 of the silicon substrate 2 by increasing the acceleration voltage for the implantation when implanting the impurity ions (see FIG. 5B(a)). The acceleration voltage for the impurity ions is set to about 200 to 400 keV, for example. When the implanted ions are thereafter activated by performing drive-in, the etching stop layer 9 made of an oxide or a nitride is formed on the position of the prescribed depth from the surface 4 of the silicon substrate 2. Thereafter the oxide film 40 (see FIG. 5B(a)) is removed. In the case of applying only the drive-in in place of the epitaxial growth, the silicon substrate 2 can be reduced in thickness, due to the absence of the epitaxial layer.

Figure 5D:
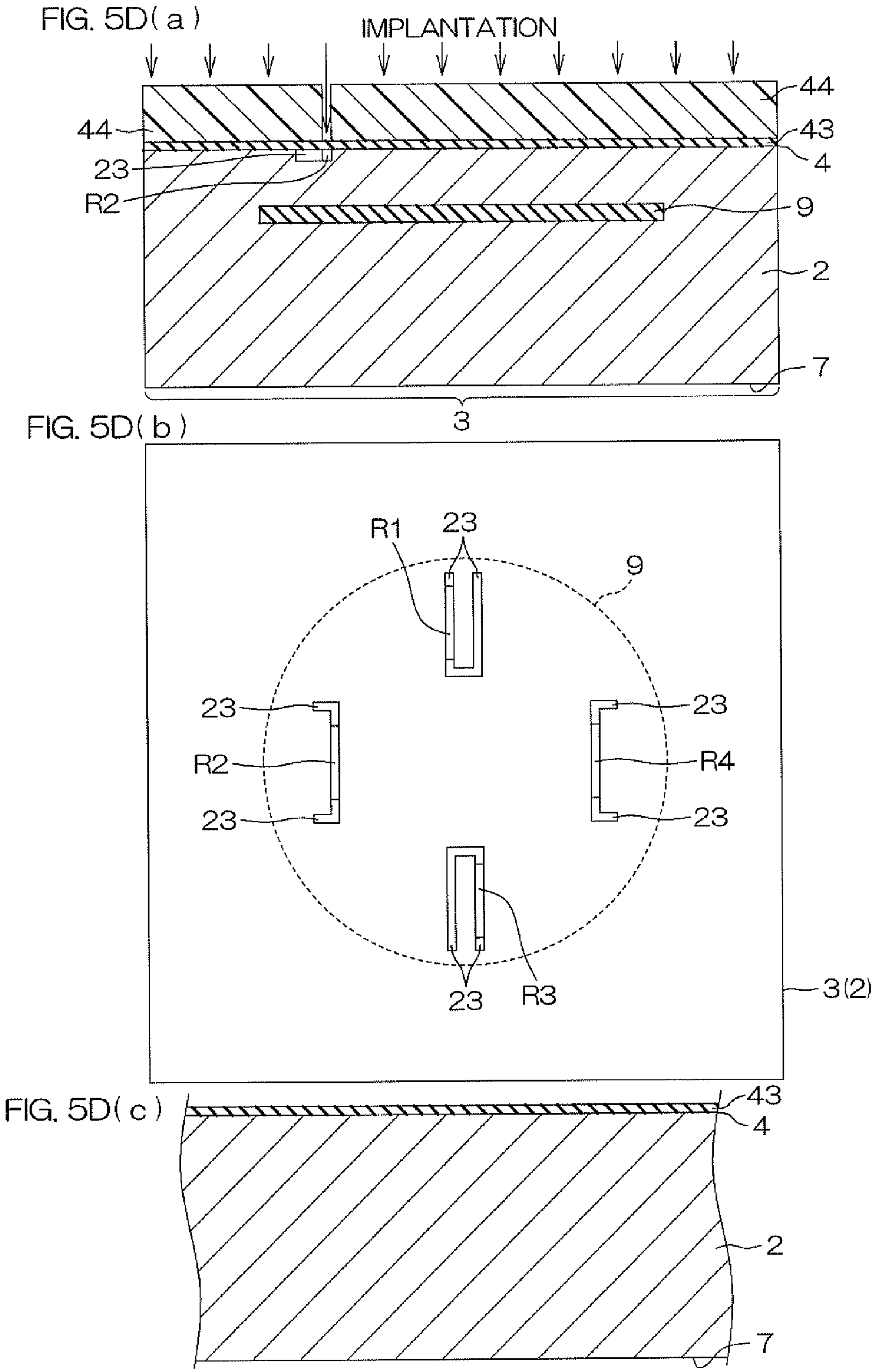
FIG. 5D(a) is a schematic sectional view showing a step subsequent to that in FIG. 5C(a), FIG. 5D(b) is a plan view in the state of FIG. 5D(a), and FIG. 5D(c) shows a cutting plane on the same position as that in FIG. 3(*b*) at the same point of time as that in FIG. 5D(a).

Then, an oxide film 43 having a thickness of several 100 Å is formed on the surface 4 of the silicon substrate 2 by thermal oxidation or CVD as shown in FIG. 5D(a), and an impurity (boron (B), for example) is thereafter implanted into the surface layer portion of the silicon substrate 2 through a mask 44 of a prescribed pattern. Then, the oxide film 43 and the mask 44 are removed, and drive-in is performed. The ions of the impurity implanted into the silicon substrate 2 are activated due to the drive-in, and the piezoresistors (gauges) R1 to R4 are formed on the surface layer portion of the silicon substrate 2 (see FIG. 5D(b) together). Referring to FIG. 5D(a), only the piezoresistor R2 is illustrated among the piezoresistors R1 to R4.

The relay wires (the $P^+$ regions) 23 are formed on the silicon substrate 2 through a procedure similar to that in the case of the piezoresistors R1 to R4, to be continuous with the respective ones of the piezoresistors R1 to R4. In other words, formation of an oxide film and a resist mask on the surface of the silicon substrate 2, implantation of P-type impurity ions (boron ions, for example), removal of the oxide film and the resist mask and drive-in are successively performed. In this case, the resist mask has openings corresponding to the patterns of the relay wires 23.

The steps of forming the piezoresistors R1 to R4 and the relay wires 23 may not be carried out immediately after the formation of the etching stop layer 9, but may be executed at another proper timing in subsequent steps.

Figure 5E:
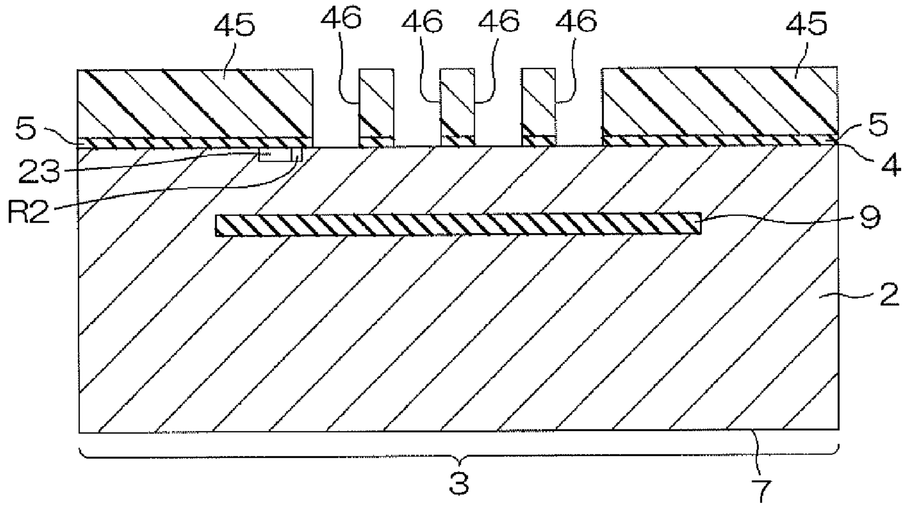
FIG. 5E(a) is a schematic sectional view showing a step subsequent to that in FIG. 5D(a), and FIG. 5E(b) is a plan view in the state of FIG. 5E(a).
Figure 5E:
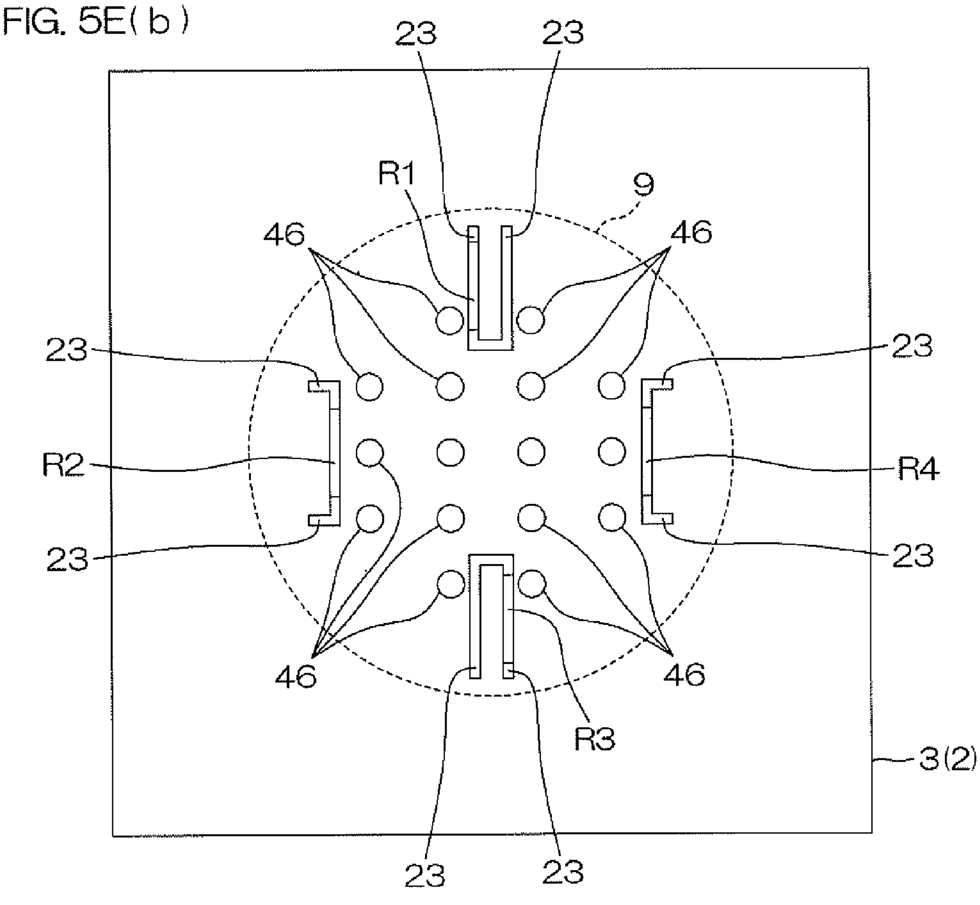

Then, the covering layer 5 made of silicon oxide ($SiO_2$) is formed on the surface 4 of the silicon substrate 2 by CVD, as shown in FIG. 5E(a).

Then, a resist pattern 45 is formed on the covering layer 5 by photolithography. The resist pattern 45 has a plurality of openings 46 corresponding to the plurality of through-holes 11 (see FIGS. 2 and 3(*a*)). When circularly forming the sections of the through-holes 11, the openings 46 are circularly formed in response thereto. The diameter of each opening 46 is about 0.5 μm, similarly to the through-holes 11. The respective openings 46 are formed on positions not overlapping with the piezoresistors R1 to R4 and the respective relay wires 23 in plan view (see FIG. 5E(b)).

Then, the covering layer 5 is selectively removed by plasma etching employing the resist pattern 45 as a mask. Thus, openings corresponding to the through-holes 11 are formed in the covering layer 5. A state upon termination of the plasma etching is shown in FIG. 5E.

Then, the silicon substrate 2 is dug down by anisotropic deep RIE (Reactive Ion Etching) employing the resist pattern 45 as a mask.

Figure 5F:
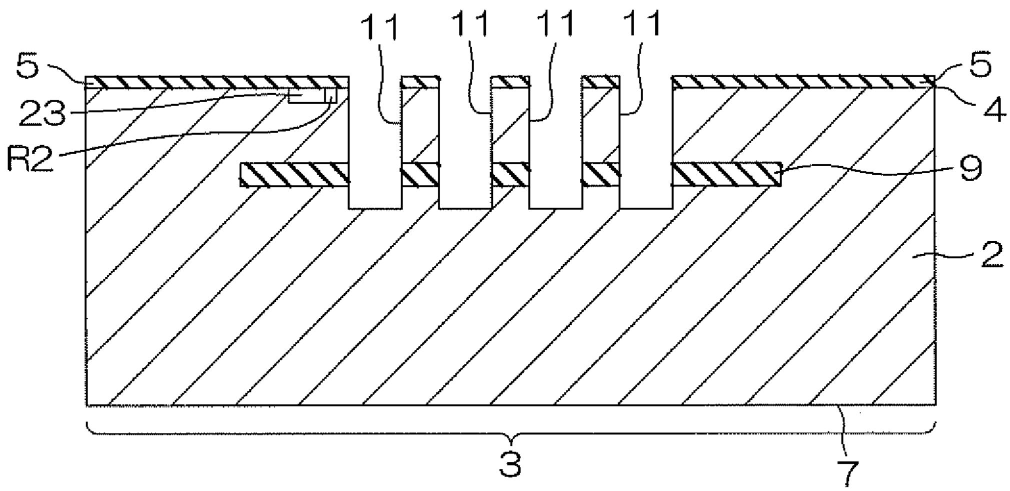
FIG. 5F(a) is a schematic sectional view showing a step subsequent to that in FIG. 5E(a), and FIG. 5F(b) shows a cutting plane on the same position as that in FIG. 3(*b*) at the same point of time as that in FIG. 5F(a).
Figure 5F:
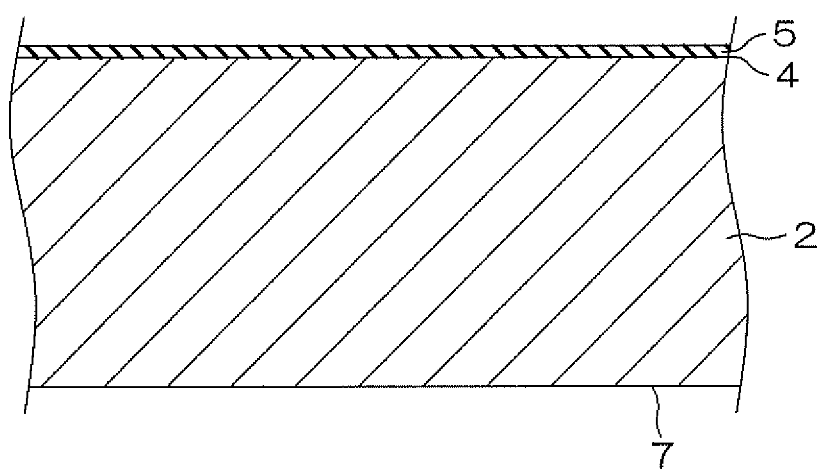

Thus, the through-holes 11 are formed on positions of the silicon substrate 2 coinciding with the respective openings 46 (in other words, selectively removed portions of the covering layer 5) of the resist pattern 45, as shown in FIG. 5F(a). When the openings 46 are circular, columnar recessed through-holes 11 extending downward from the covering layer 5 of the surface 4 are formed. Each through-hole 11 is formed to pass through the etching stop layer 9, so that a bottom surface of each through-hole 11 is positioned under the etching stop layer 9. At the time of the formation of the through-holes 11, the resist pattern 45 is simultaneously etched and reduced in thickness. After the formation of the through-holes 11, the remaining portions of the resist pattern 45 are peeled off.

The deep RIE for forming the through-holes 11 may be performed through the so-called Bosch process. In the Bosch process, a step of etching the silicon substrate 2 by using $SF_6$ (sulfur hexafluoride) and a step of forming a protective film on an etched surface by using $C_4F_8$ (perfluorocyclobutane) are alternately repeated. Thus, the silicon substrate 2 can be etched at a high aspect ratio.

Figure 5G:
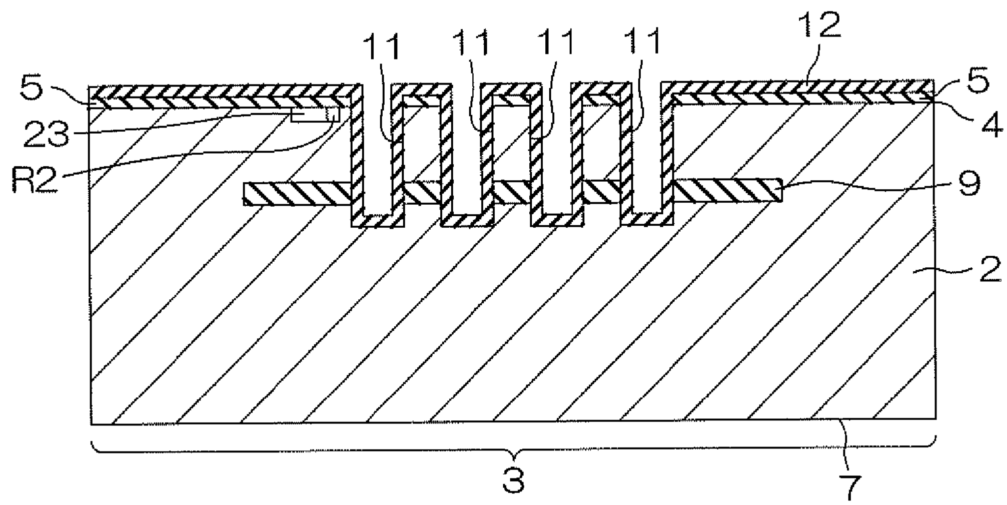
FIG. 5G(a) is a schematic sectional view showing a step subsequent to that in FIG. 5F(a), and FIG. 5G(b) shows a cutting plane on the same position as that in FIG. 3(*b*) at the same point of time as that in FIG. 5G(a).
Figure 5G:
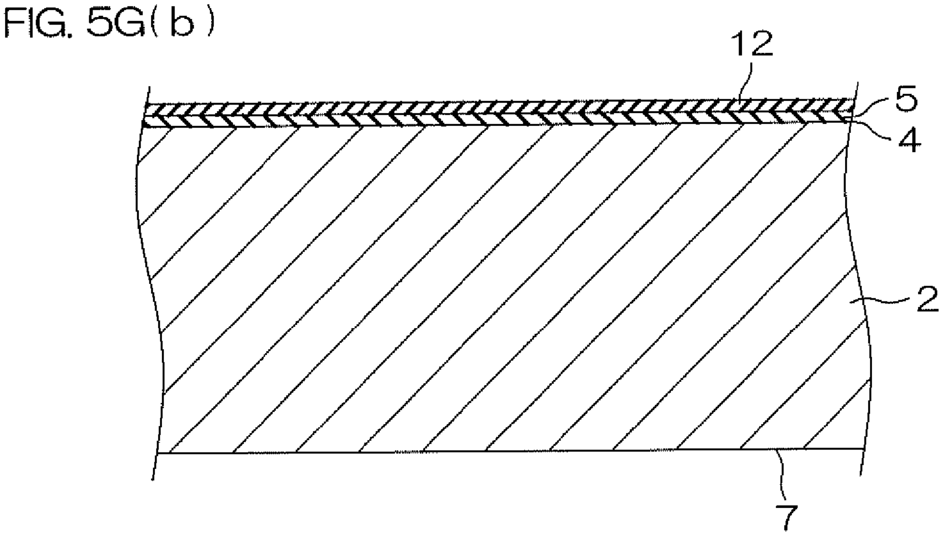

Then, the protective thin films 12 made of silicon oxide ($SiO_2$) are formed on the whole areas of inner surfaces (i.e. circumferential surfaces and bottom surfaces of the through-holes 11) partitioning the respective through-holes 11 on the silicon substrate 2 and the surface of the covering layer 5 by thermal oxidation or CVD, as shown in FIG. 5G(a). The thickness of the protective thin films 12 is about 1000 Å. At this point of time, the protective thin film 12 in each through-hole 11 is in the form of a tube (more specifically, in the form of a cylinder) passing through the etching stop layer 9 while covering a sidewall of the through-hole 11, and has a bottom surface portion on a lower end of the through-hole 11.

Figure 5H:
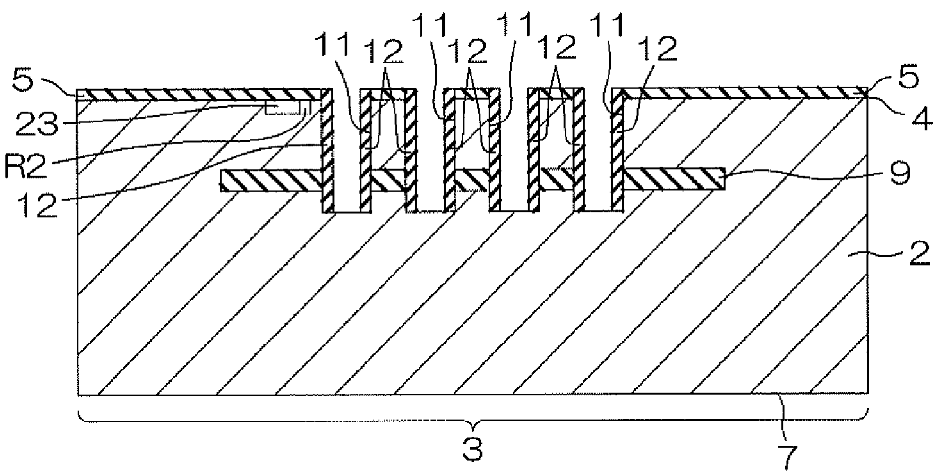
FIG. 5H(a) is a schematic sectional view showing a step subsequent to that in FIG. 5G(a), and FIG. 5H(b) shows a cutting plane on the same position as that in FIG. 3(*b*) at the same point of time as that in FIG. 5H(a).
Figure 5H:
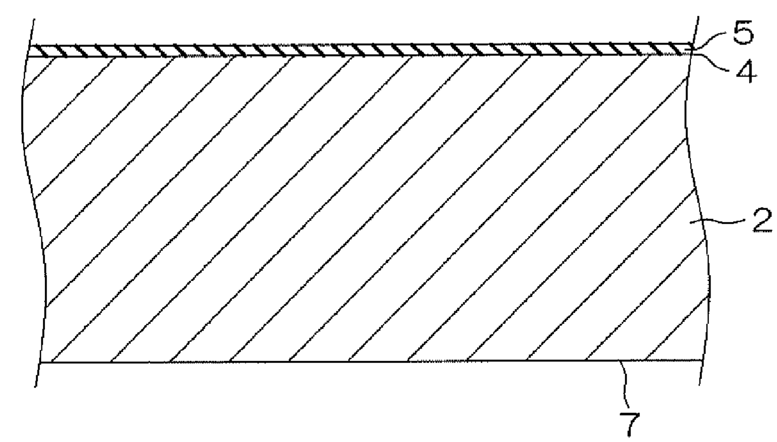
Figure 5:
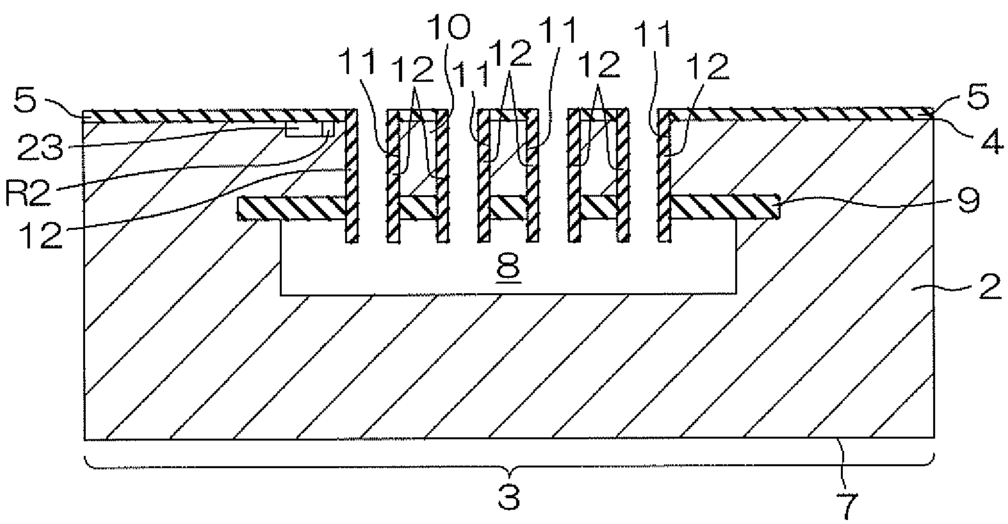
FIG. 5C(a) is a schematic sectional view showing a step subsequent to that in FIG. 5B(a), and FIG. 5C(b) shows a cutting plane on the same position as that in FIG. 3(*b*) at the same point of time as that in FIG. 5C(a).
FIG. 5I(a) is a schematic sectional view showing a step subsequent to that in FIG. 5H(a), and FIG. 5I(b) shows a cutting plane on the same position as that in FIG. 3(*b*) at the same point of time as that in FIG. 5I(a).
FIG. 5J(a) is a schematic sectional view showing a step subsequent to that in FIG. 5I(a), and FIG. 5J(b) shows a cutting plane on the same position as that in FIG. 3(*b*) at the same point of time as that in FIG. 5J(a).
FIG. 5K(a) is a schematic sectional view showing a step subsequent to that in FIG. 5J(a), and FIG. 5K(b) shows a cutting plane on the same position as that in FIG. 3(*b*) at the same point of time as that in FIG. 5K(a).
FIG. 5L is a schematic sectional view showing a step subsequent to that in FIG. 5K(b).
FIG. 5M(a) is a schematic sectional view on the same position as that in FIG. 3(*a*) showing a step subsequent to that in FIG. 5L, and FIG. 5M(b) shows a cutting plane on the same position as that in FIG. 3(*b*) at the same point of time as that in FIG. 5M(a).
FIG. 5N is a schematic sectional view showing a step subsequent to that in FIG. 5M(b).
FIG. 5O(a) is a schematic sectional view on the same position as that in FIG. 3(*a*) showing a step subsequent to that in FIG. 5N, and FIG. 5O(b) shows a cutting plane on the same position as that in FIG. 3(*b*) at the same point of time as that in FIG. 5O(a).
Figure 5:
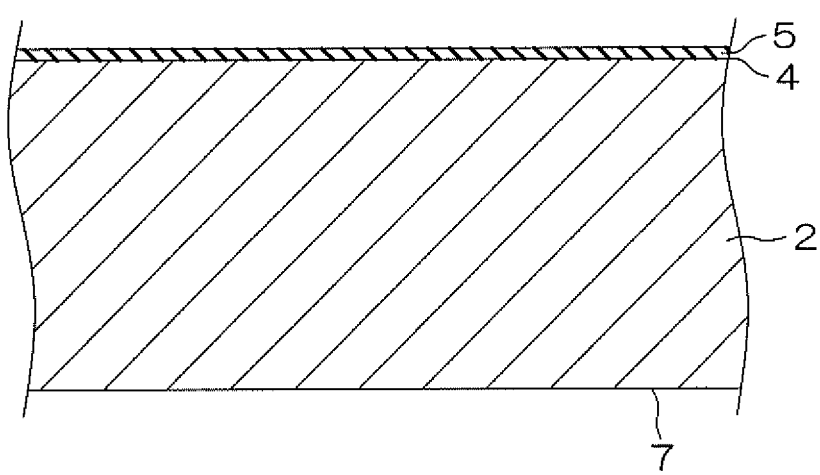

Then, portions (bottom surface portions of the cylindrical protective thin films 12) of the protective thin films 12 on the bottom surfaces of the through-holes 11 and on the surface of the covering layer 5 are removed by RIE, as shown in FIG. 5H(a). Thus, a crystal plane of the silicon substrate 2 is exposed from the bottom surfaces of the through-holes 11.

Then, an etchant is introduced into the respective through-holes 11 from the side of the surface 4 of the silicon substrate 2, as shown in FIG. 5I(a) (isotropic etching). For example, etching gas is introduced into the through-holes 11 in a case of applying dry etching such as plasma etching. In a case of applying wet etching, an etching solution is introduced into the through-holes 11. Thus, a substrate material around the bottom of each through-hole 11 (i.e., under the etching stop layer 9) in the silicon substrate 2 is isotropically etched by employing the covering layer 5 and the protective thin film 12 on the inner side surface of each through-hole 11 as masks. More specifically, the silicon substrate 2 is etched in the thickness direction thereof and a direction orthogonal to the thickness direction from the bottom of each through-hole 11 serving as a starting point. At this time, a substrate material on a side closer to the surface 4 than the etching stop layer 9 is not etched, due to the presence of the etching stop layer 9.

As a result of the isotropic etching, the reference pressure chamber 8 (the flat space) communicating with each through-hole 11 is formed under the etching stop layer 9 and around the bottom of each through-hole 11 in the silicon substrate 2. At the same time, the diaphragm 10 is formed on the etching stop layer 9. The depth (the dimension in the thickness direction of the silicon substrate 2) of the completed reference pressure chamber 8 is 10 to 15 μm, for example.

In the tubular protective thin film 12 formed on the inner wall of each through-hole 11, a portion under the etching stop layer 9 protrudes into the reference pressure chamber 8 from the etching stop layer 9, and is opposed to the bottom surface of the reference pressure chamber 8 from above. Therefore, the reference pressure chamber 8 is not completely cylindrical, but is concaved inward (downward) on the position of each through-hole 11 in a top surface portion thereof.

Figure 5J:
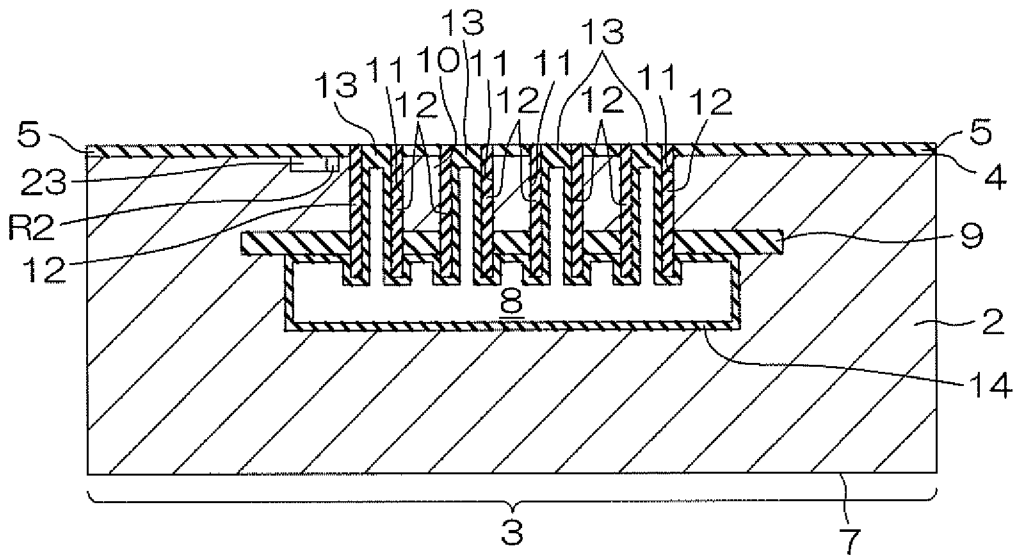
Figure 5J:
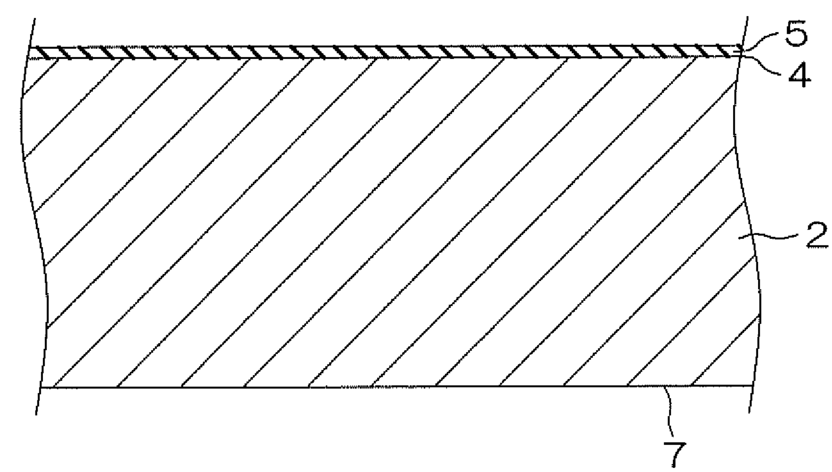

Then, the respective through-holes 11 are filled up with oxide films and blocked by CVD, as shown in FIG. 5J(a). More detailedly, the oxide films are formed on upper portions on inner side portions of the protective thin films 12 present on the circumferential surfaces of the through-holes 11, to fill up the through-holes 11. The oxide films are the aforementioned fillers 13. In other words, the fillers 13 are arranged in the respective through-holes 11 in this step. The respective through-holes 11 are so filled up that the reference pressure chamber 8 is sealed in a vacuum state.

The oxide films for filling up the through-holes 11 do not remain only in the through-holes 11, but reach the interior of the reference pressure chamber 8 from the bottoms of the through-holes 11 continuously with the fillers 13 as the aforementioned covering film 14, to cover the whole areas of the inner wall surfaces of the reference pressure chamber 8. The reference pressure chamber 8, having the sufficient depth (10 to 15 μm), is not filled up with the covering film 14. As the diameter of the through-holes 11 is reduced, the through-holes 11 are quickly filled up, whereby the covering film 14 is reduced in thickness.

Then, a step of forming the integrated circuit portion 28 (see FIG. 3(*b*)) on the integrated circuit region 27 is executed. The integrated circuit region 27 is a region of the silicon substrate 2 other than the region where the reference pressure chamber 8 and the diaphragm 10 are formed.

Figure 5K:
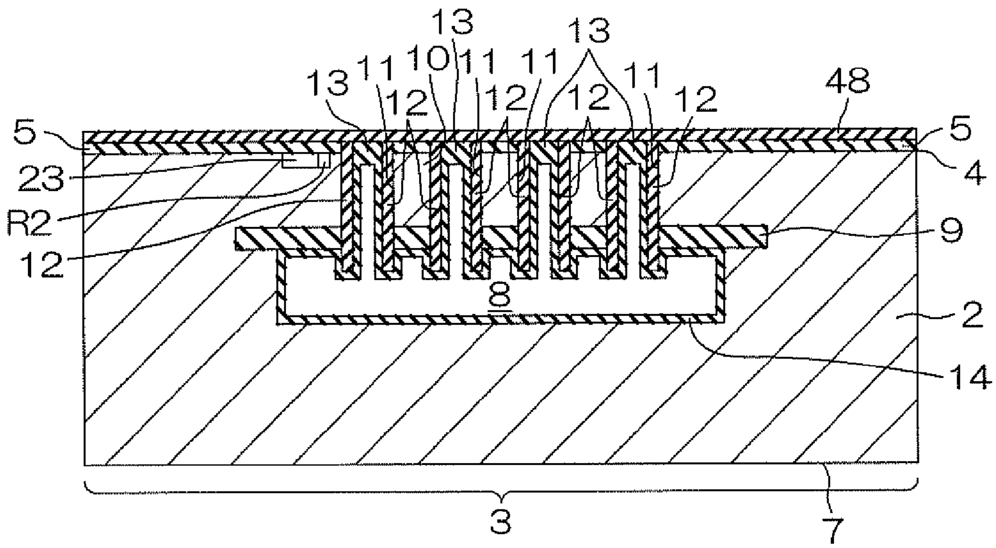
Figure 5K:
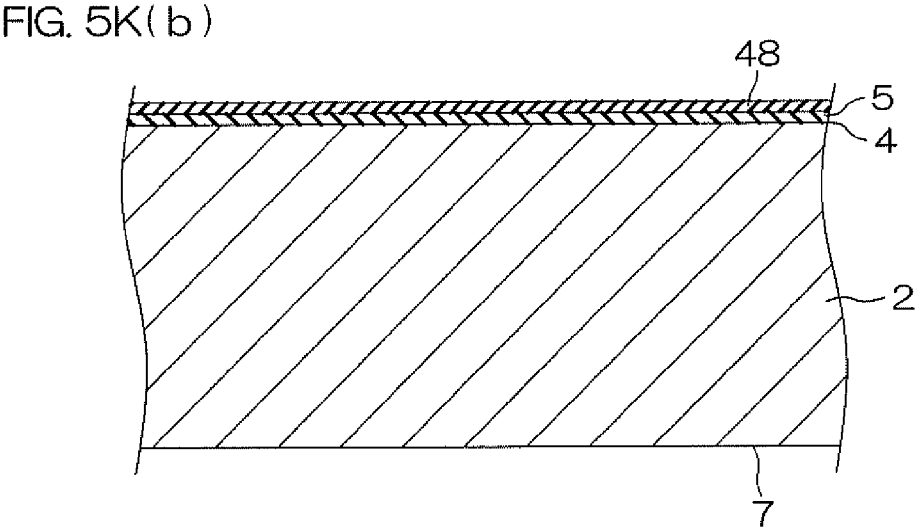

First, a nitride film 48 made of silicon nitride (SiN) is formed on the surface of the covering layer 5 of the silicon substrate 2, as shown in FIG. 5K.

Figure 5L:
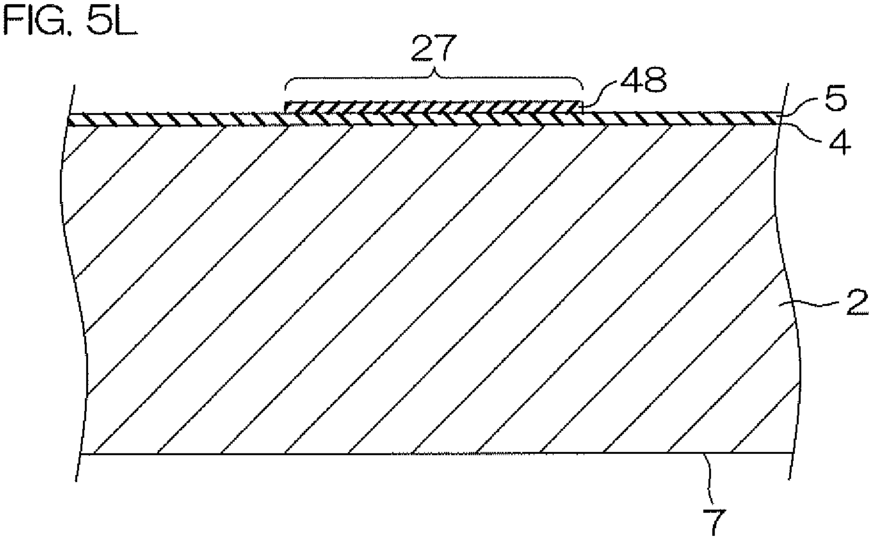

Then, the nitride film 48 is selectively removed by plasma etching through a mask (not shown) of a prescribed pattern, as shown in FIG. 5L. As a result, the nitride film 48 remains only on a portion planned to become the integrated circuit region 27.

Figure 5M:
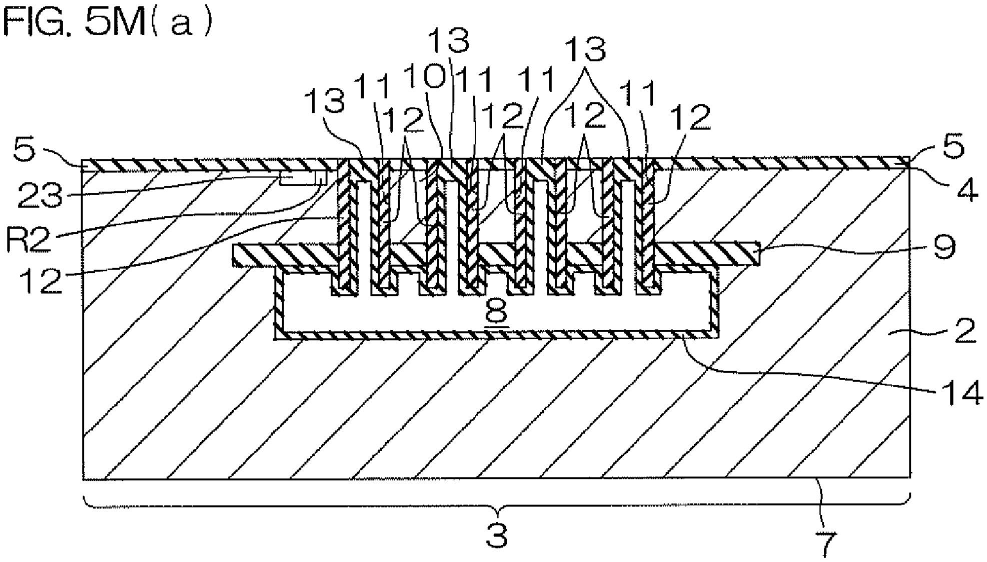
Figure 5M:
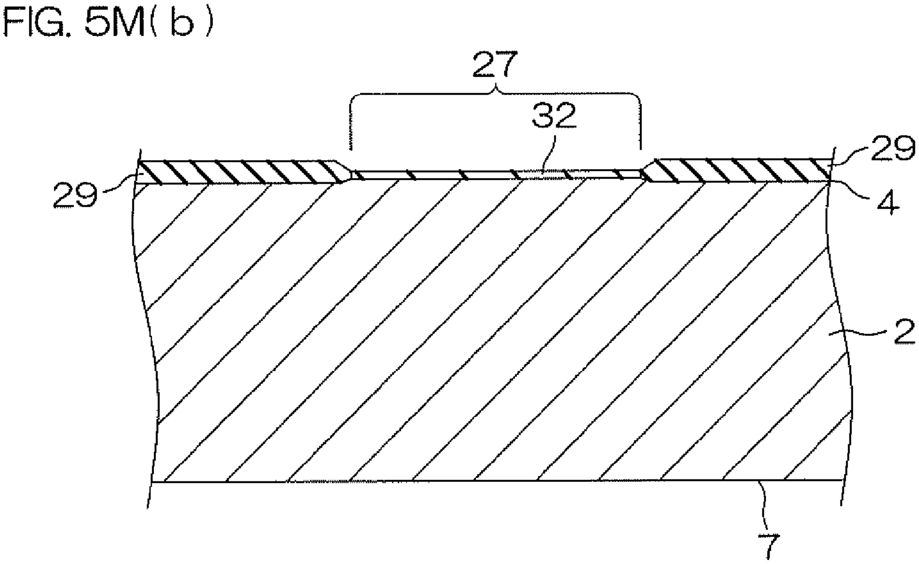

Then, the remaining nitride film 48 is employed as a mask to form the LOCOS layer 29 around the nitride film 48 by thermally oxidizing a surface portion of the silicon substrate 2 around the same. Thereafter the nitride film 48 and the covering layer 5 under the same are removed, and the aforementioned gate oxide film 32 is newly formed by thermal oxidation, for example. A state upon formation of the oxide film 32 is shown in FIG. 5M(b). The region (the region isolated by the LOCOS layer 29) of the silicon substrate 2 where the gate oxide film 32 is formed becomes the integrated circuit region 27.

Figure 5N:
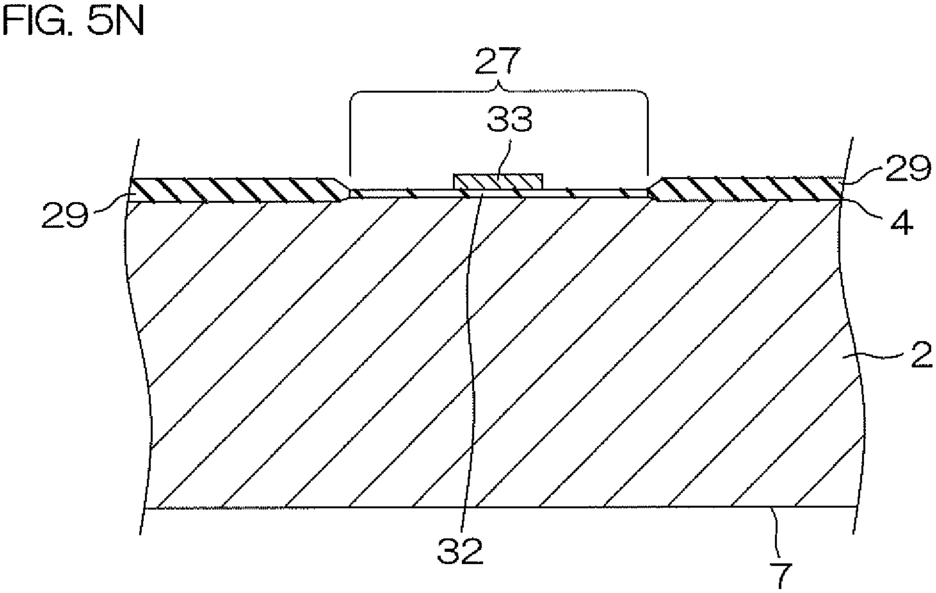
Figure 50A:
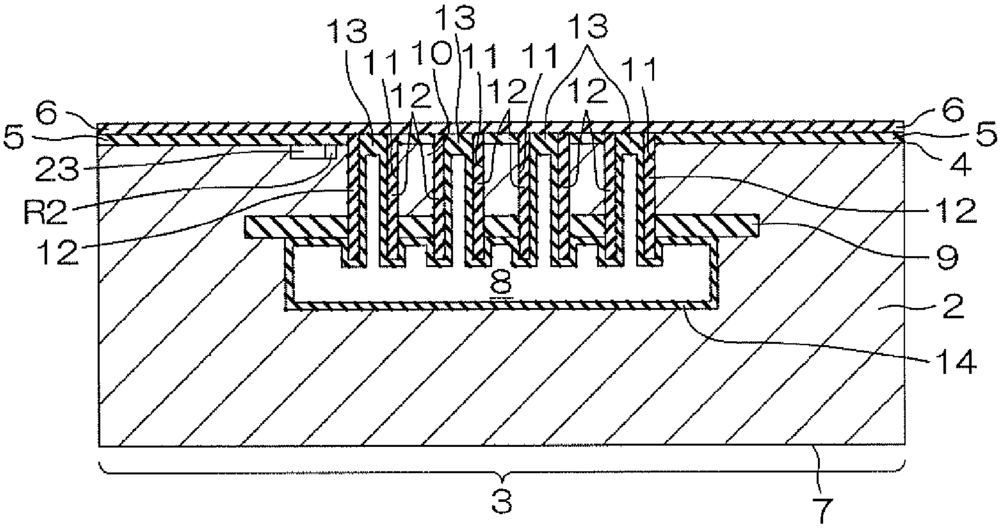
Figure 50B:
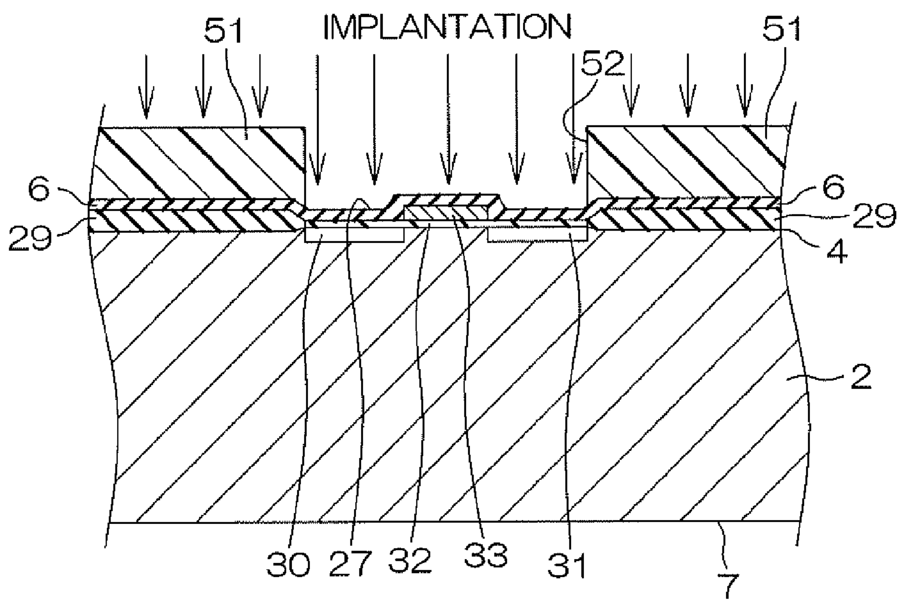

Then, a polysilicon film is deposited on the gate oxide film 32 in the integrated circuit region 27. The polysilicon film is patterned by photolithography, whereby the gate electrode 33 is formed on the gate oxide film 33, as shown in FIG. 5N.

Then, a resist pattern 51 is formed on the surface of the silicon substrate 2, as shown in FIG. 5O(b). The resist pattern 51 has one opening 52 corresponding to the integrated circuit region 27. Then, an impurity (ions of arsenic (As), for example) is implanted into the surface layer portion of the silicon substrate 2 by employing the resist pattern 51 and the gate electrode 33 as masks. Thus, the source 30 and the drain 31 are formed on the surface layer portion of the silicon substrate 2 in the integrated circuit region 27, on regions opposed to each other through the gate electrode 33.

After the resist pattern 51 is removed, the insulating layer 6 covering the surface of the silicon substrate 2 is formed by CVD. More specifically, the insulating layer 6 is formed to cover the covering layer 5 shown in FIG. 5O(a) as well as the LOCOS layer 29 and the gate oxide film 32 shown in FIG. 5O(b).

Then, an opening (a contact hole) 53 is formed by photolithography to pass through the insulating layer 6 and the covering layer 5, as shown in FIG. 3(*a*). The opening 53 is formed on a position exposing part of the relay wires 23 continuous with the piezoresistors R1 to R4. At the same time, contact holes 54 for the source 30 and the drain 31 are formed, as shown in FIG. 3(*b*). The contact holes 54 are formed to pass through the insulating layer 6 and the gate oxide film 32, to partially expose the source 30 and the drain 31 respectively. Although not shown, a contact hole linked with the gate electrode 33 is formed to pass through the insulating layer 6 in the same step.

Then, aluminum is deposited on the insulating layer 6 by sputtering, and an aluminum deposition film 55 is formed. The aluminum deposition film 55 is connected to the respective ones of the piezoresistors R1 to R4, the source 30, the drain 31 and the gate electrode 33 through the contact holes 53, 54 etc.

Then, a resist pattern (not shown) is formed on the aluminum deposition film 55 by photolithography, and the aluminum deposition film 55 is thereafter selectively removed by plasma etching employing the resist pattern as a mask. Thus, the metal terminals 15 to 18 and the metal wires 19 to 22 are simultaneously formed (see FIG. 2). Further, the metal wires (the aforementioned source-side metal wire 35, a drain-side metal wire 36 etc.) and metal terminals (not shown) linked with the respective ones of the source 30, the drain 31 and the gate electrode 33 of the integrated circuit portion 28 are also simultaneously formed. Thereafter the resist pattern is peeled off.

Then, the passivation film 25 is formed on the insulating layer 6 by CVD. Thereafter the openings 26 exposing the metal terminals 15 to 18 (also including unshown metal terminals on the side of the integrated circuit portion 28) as pads respectively are formed in the passivation film 25 by photolithography and etching, as shown in FIG. 3(*a*). FIG. 3(*a*) shows the opening 26 exposing the metal terminal 16.

Further, an opening 56 exposing a region of the insulating layer 6 surrounding all through-holes 11 is formed in the passivation film 25 by photolithography and etching. The opening 56 is brought into a circular shape which is a shape similar to that of the reference pressure chamber 8 in plan view, for example.

Thus, the pressure sensor 1 according to the first embodiment shown in FIGS. 2 and 3 is obtained. The opening 56 is formed in the passivation film 25 to expose the diaphragm 10 from the opening 56, so that the diaphragm 10 easily warps. When the passivation film 25 is present on the diaphragm 10, the diaphragm 10 hardly warps, and sensitivity of the pressure sensor 1 lowers.

According to the first embodiment, the substrate material is etched by the etchant introduced into the through-holes 11 under the etching stop layer 9 in the silicon substrate 2, as shown in FIG. 5I(a). Thus, the reference pressure chamber 8 is formed under the etching stop layer 9, while the diaphragm 10 is formed on the etching stop layer 9. At this time, the diaphragm 10 is cut off from the etchant introduced into the reference pressure chamber 8 by the etching stop layer 9. Thus, the diaphragm 10 is not etched, whereby the thickness of the diaphragm 10 can be correctly set to a target thickness. Therefore, the pressure sensor 1 (see FIG. 3(*a*)) capable of attaining improvement of sensitivity and capable of suppressing dispersion in sensitivity can be simply manufactured.

According to this embodiment, the reference pressure chamber 8 and the diaphragm 10 can be formed through a small number of steps employing only one silicon substrate 2 without bonding two silicon substrates 2 to each other, whereby a low-cost and miniature (thin) pressure sensor 1 can be simply manufactured. Particularly in a case of forming the pressure sensor 1 by bonding two silicon substrates 2 to each other, leakage easily takes place on the joint between the two silicon substrates 2. According to this embodiment, on the other hand, the diaphragm 10 which is a movable component is part of the silicon substrate 2 so that the reference pressure chamber 8 can be maintained as a sealed space causing no leakage, whereby a highly reliable pressure sensor 1 can be provided.

Further, the reference pressure chamber 8 under the etching stop layer 9 can be sealed by arranging the fillers 13 in the through-holes 11, as shown in FIG. 5J(a). Thus, the completed pressure sensor 1 (see FIG. 3(*a*)) can detect pressure received by the diaphragm 10 as a relative magnitude with respect to the pressure (reference pressure) in the reference pressure chamber 8.

In addition, the protective thin films 12 are formed on the sidewalls of the through-holes 11 as shown in FIG. 5I(a), whereby the etchant introduced into the through-holes 11 in the etching step can be prevented from etching the sidewalls of the through-holes 11.

When the material for the silicon substrate 2 on lower end sides of the through-holes 11 is isotropically etched, the protective thin films 12 cylindrically formed while covering the sidewalls of the through-holes 11 protrude into the reference pressure chamber 8 from the etching stop layer 9. Thus, when the diaphragm 10 on the etching stop layer 9 remarkably warps toward the inner portion of the reference pressure chamber 8, the protective thin films 12 come into contact with the bottom surface of the reference pressure chamber 8, to regulate excess deformation of the diaphragm 10. Therefore, damage of the diaphragm 10 can be prevented.

The integrated circuit portion 28 is formed on the integrated circuit region 27 as shown in FIG. 3(*b*), whereby the pressure sensor 1 and the integrated circuit portion 28 can be formed on the same silicon substrate 2 (more detailedly, in each rectangular region 3 of FIG. 1) at once. In particular, the diaphragm 10 is so formed by employing part of the silicon substrate 2 that the pressure sensor 1 is formed while maintaining a state where the surface 4 of the silicon substrate 2 is flat (see FIG. 3(*a*)), whereby the integrated circuit portion 28 can also be formed on the flat surface 4 of each rectangular region 3 on the region other than the diaphragm 10. Thus, it becomes possible to form a body portion (the portion where the diaphragm 10 is formed) of the pressure sensor 1 and the integrated circuit portion 28 (LSI) by one chip (one-chip implementation) (see FIG. 2). The integrated circuit portion 28 may include a circuit processing output signals from the piezoresistors, for example.

(2) Second Embodiment

While a second embodiment is now described, the same reference signs are assigned to portions of the second embodiment corresponding to the portions described with reference to the first embodiment, and description thereof is omitted. In relation to manufacturing steps for a pressure sensor 1 according to the second embodiment, detailed description is omitted as to those identical to the manufacturing steps described with reference to the first embodiment.

Figure 6A:
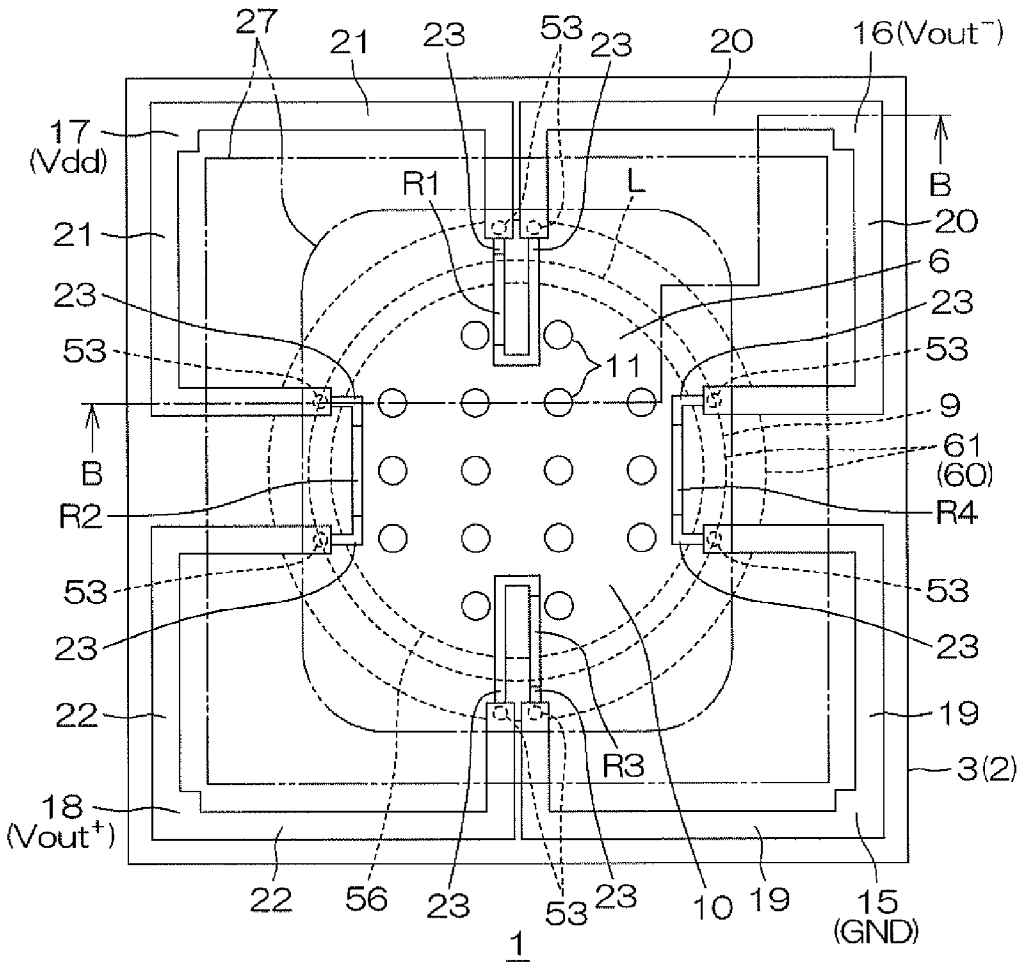
FIG. 6(*a*) is an enlarged plan view of a pressure sensor according to a second embodiment, and FIG. 6(*b*) is a sectional view along a cutting plane line B-B in FIG. 6(*a*).
Figure 6B:
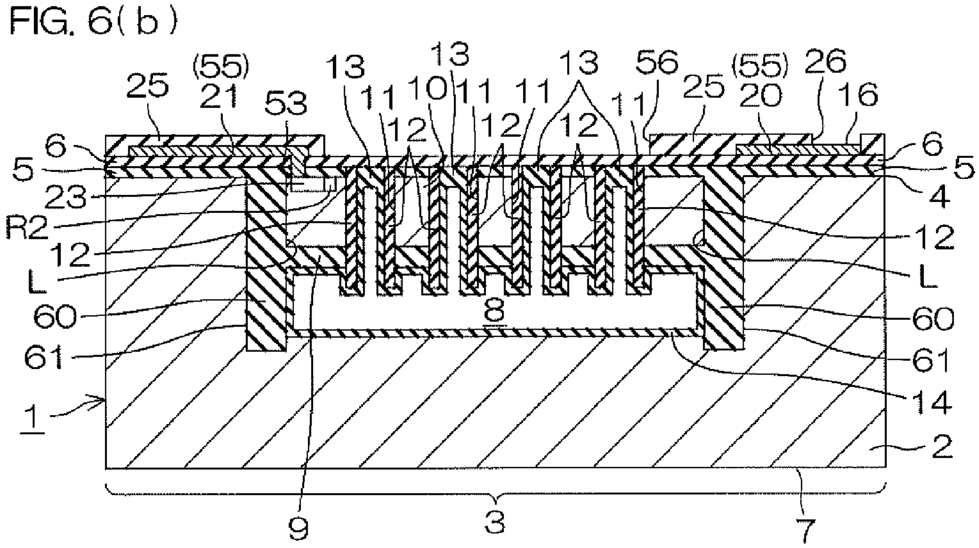

FIG. 6(*a*) is an enlarged plan view of the pressure sensor according to the second embodiment, and FIG. 6(*b*) is a sectional view along a cutting plane line B-B in FIG. 6(*a*).

The pressure sensor 1 according to the second embodiment is provided with a separation layer 60 (an isolation layer) surrounding a diaphragm 10 as shown in FIG. 6, in addition to the structure (see FIG. 3(*a*)) of the first embodiment.

The separation layer 60 is an annular vertical wall partitioning the diaphragm 10 in plan view, and an inner peripheral edge of the separation layer 60 and a contour L of the diaphragm 10 coincide with each other, as shown in FIG. 6(*b*).

The separation layer 60 extends in a silicon substrate 2 up to a position deeper than a bottom surface of a reference pressure chamber 8 continuously from a covering layer 5 on a surface 4 of the silicon substrate 2. Therefore, the separation layer 60 partitions not only the diaphragm 10, but also the reference pressure chamber 8. Further, the separation layer 60 is linked with an etching stop layer 9 on an intermediate position in the vertical direction (the thickness direction of the silicon substrate 2) thereof. With reference to the etching stop layer 9, the etching stop layer 9 is linked with the separation layer 60 to divide the interior of the separation layer 60 into two in the vertical direction.

Therefore, the reference pressure chamber 8 is present under the diaphragm 10 (also including the etching stop layer 9) in the thickness direction of the silicon substrate 2 and the separation layer 60 is present on the outside of the diaphragm 10 in a direction orthogonal to the thickness direction, whereby the diaphragm 10 is separated from other portions of the silicon substrate 2.

Figure 7A:
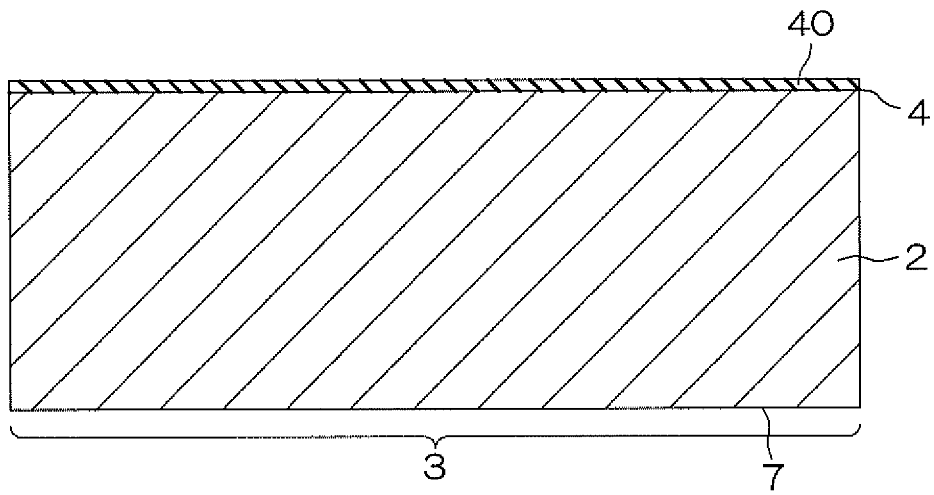
FIG. 7A(a) is a schematic sectional view showing a manufacturing step for the pressure sensor shown in FIG. 6 and shows a cutting plane on the same position as that in FIG. 6(*b*), while FIG. 7A(b) is a sectional view of a principal portion of the pressure sensor on an integrated circuit region of FIG. 6(*a*) at the same point of time as that in FIG. 7A(a).
Figure 7A:
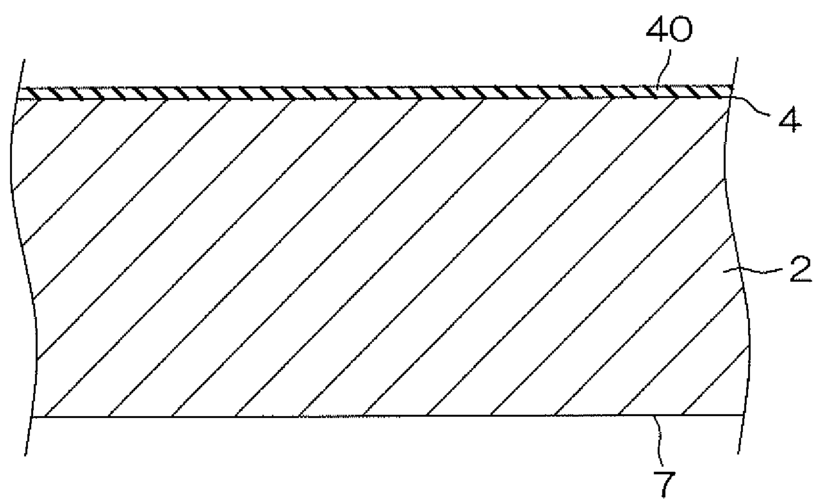
Figure 7B:
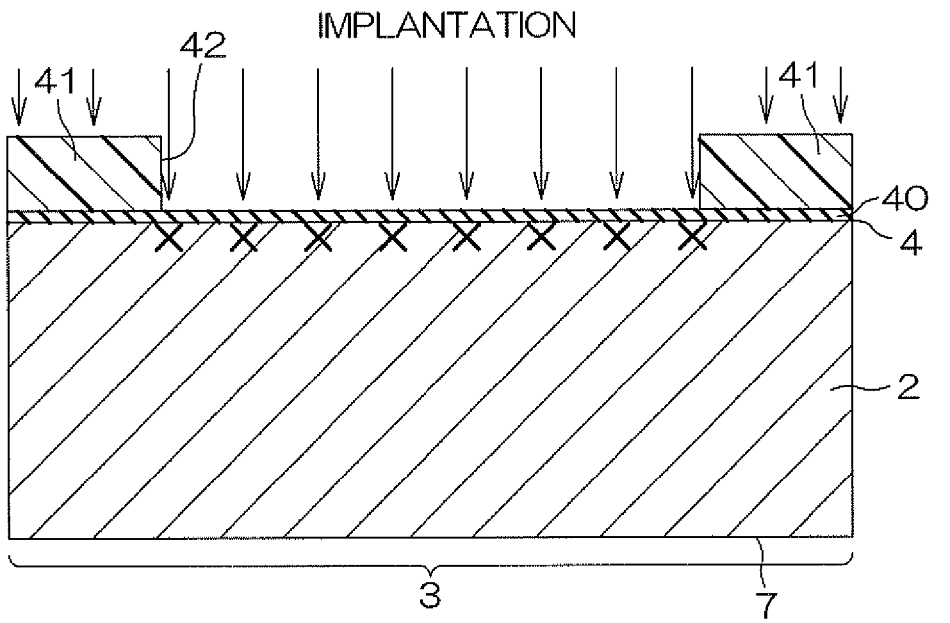
FIG. 7B(a) is a schematic sectional view showing a step subsequent to that in FIG. 7A(a), and FIG. 7B(b) is a plan view in the state of FIG. 7B(a).
Figure 7B:
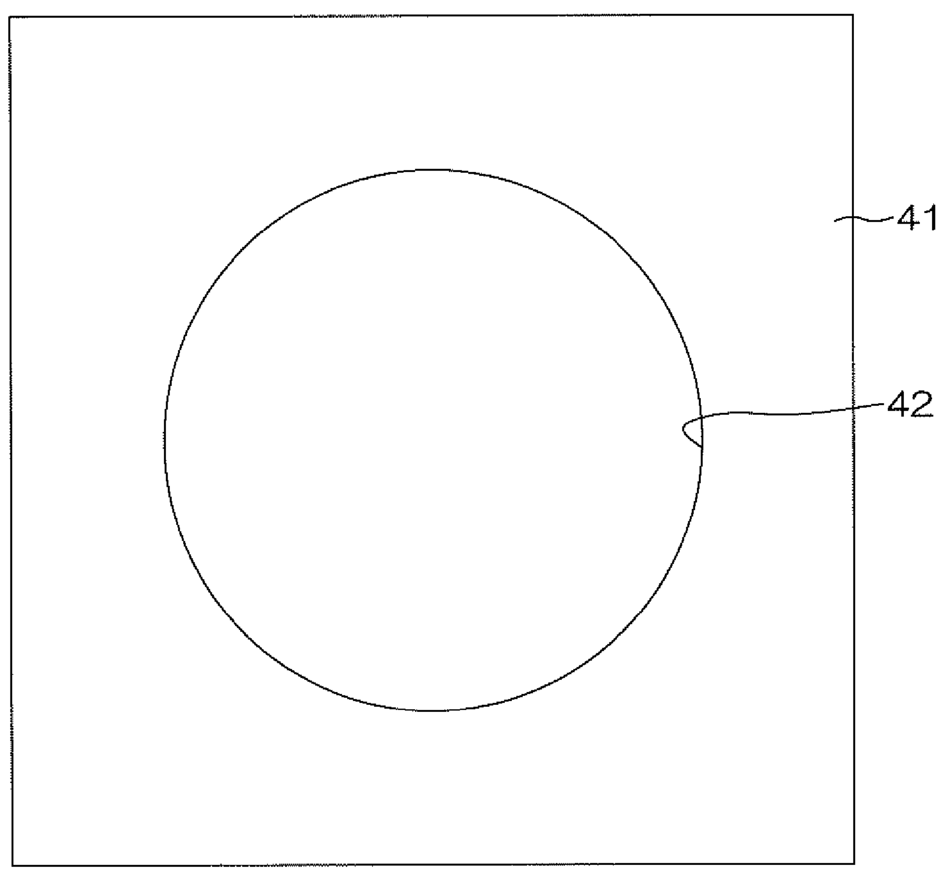
Figure 7C:
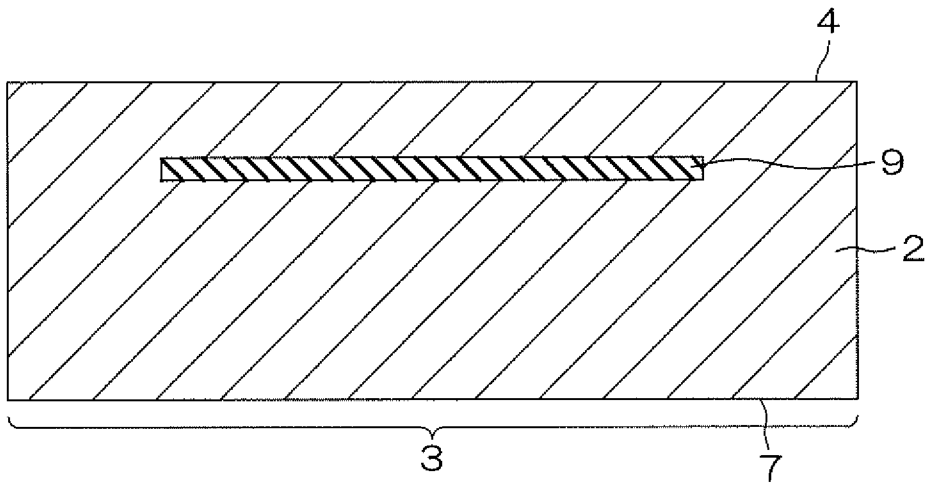
FIG. 7C(a) is a schematic sectional view showing a step subsequent to that in FIG. 7B(a), and FIG. 7C(b) shows a cutting plane on the same position as that in FIG. 7A(b) at the same point of time as that in FIG. 7C(a).
Figure 7C:
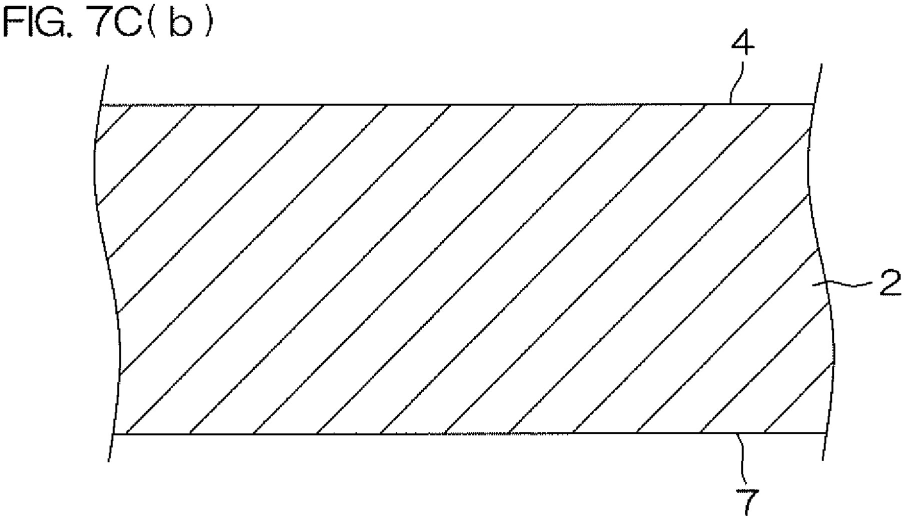
Figure 7E:
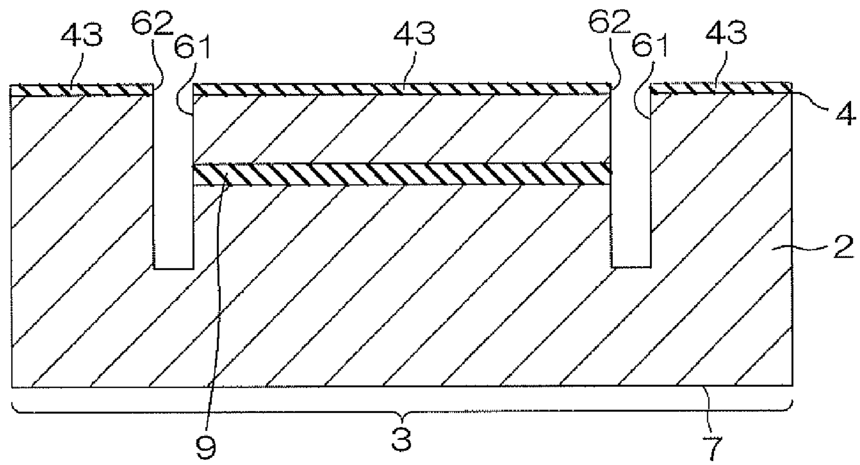
FIG. 7E(a) is a schematic sectional view showing a step subsequent to that in FIG. 7(*a*), and FIG. 7E(b) is a plan view in the state of FIG. 7E(a).
Figure 7E:
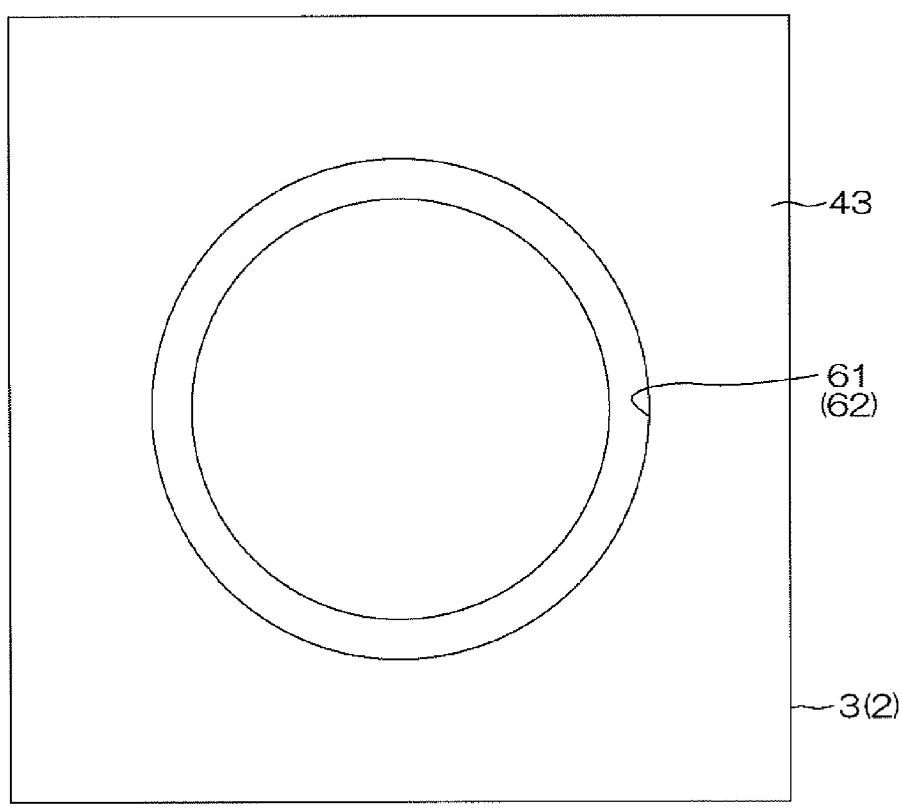
Figure 7F:
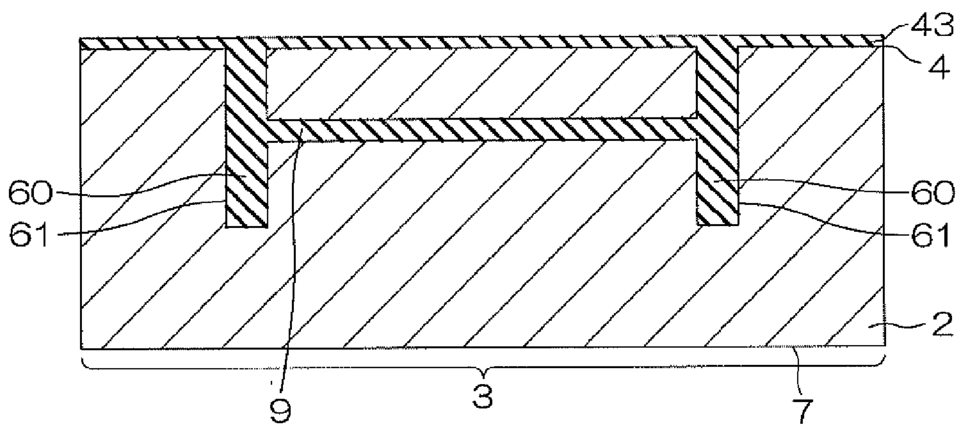
FIG. 7F is a schematic sectional view showing a step subsequent to that in FIG. 7E(a).
Figure 7G:
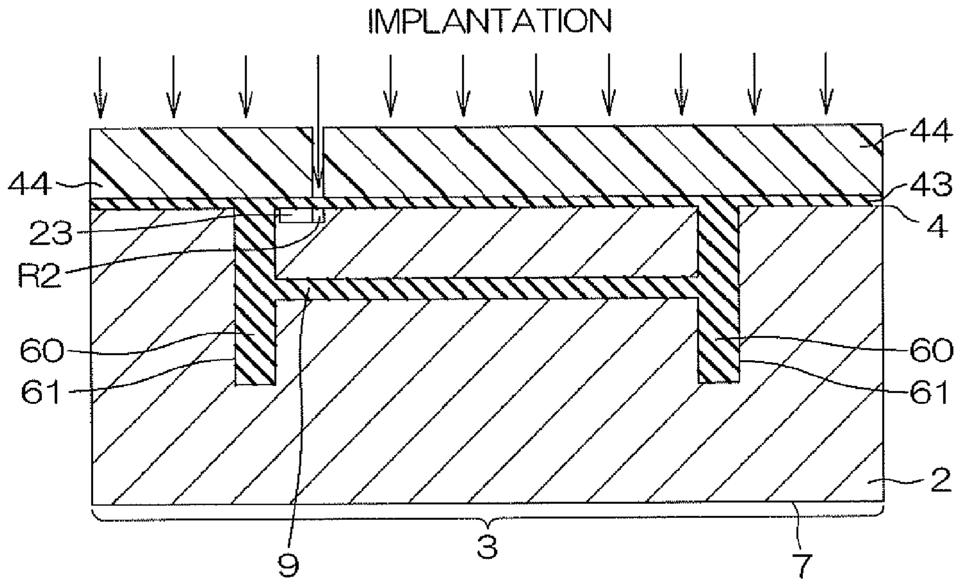
FIG. 7G(a) is a schematic sectional view showing a step subsequent to that in FIG. 7F, and FIG. 7G(b) is a plan view in the state of FIG. 7G(a).
Figure 7G:
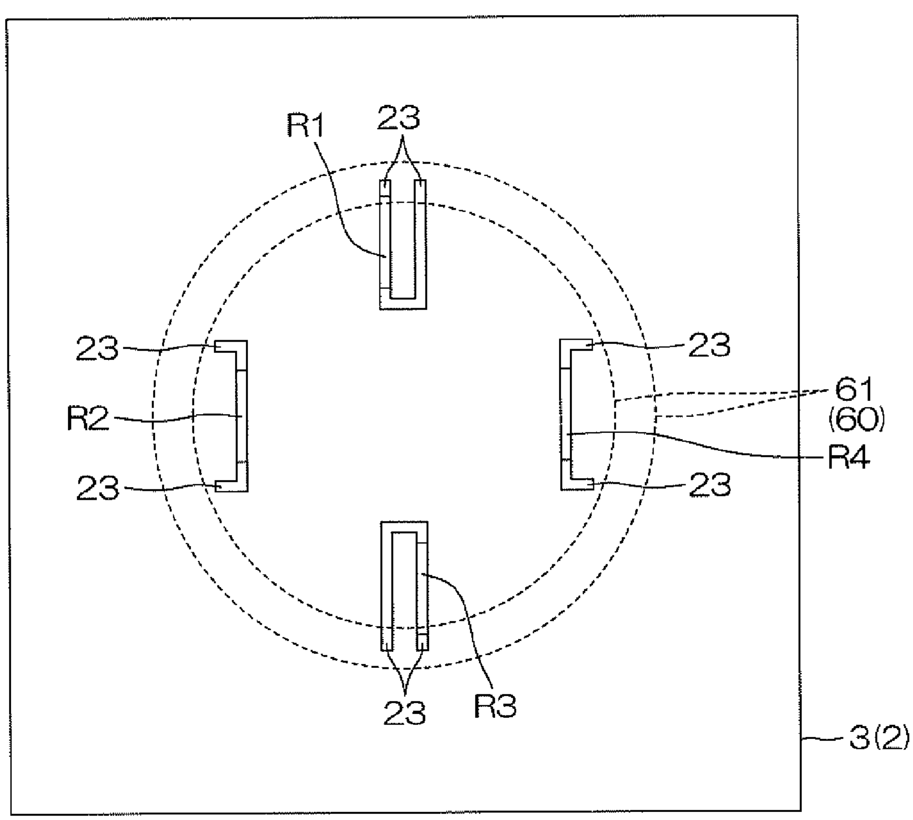
Figure 7H:
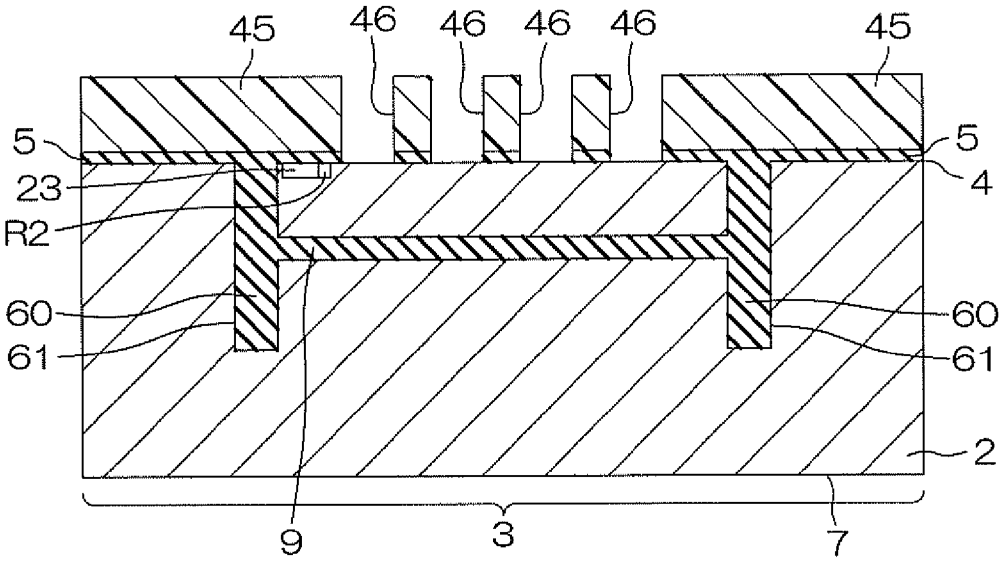
FIG. 7H(a) is a schematic sectional view showing a step subsequent to that in FIG. 7G(a), and FIG. 7H(b) is a plan view in the state of FIG. 7H(a).
Figure 7H:
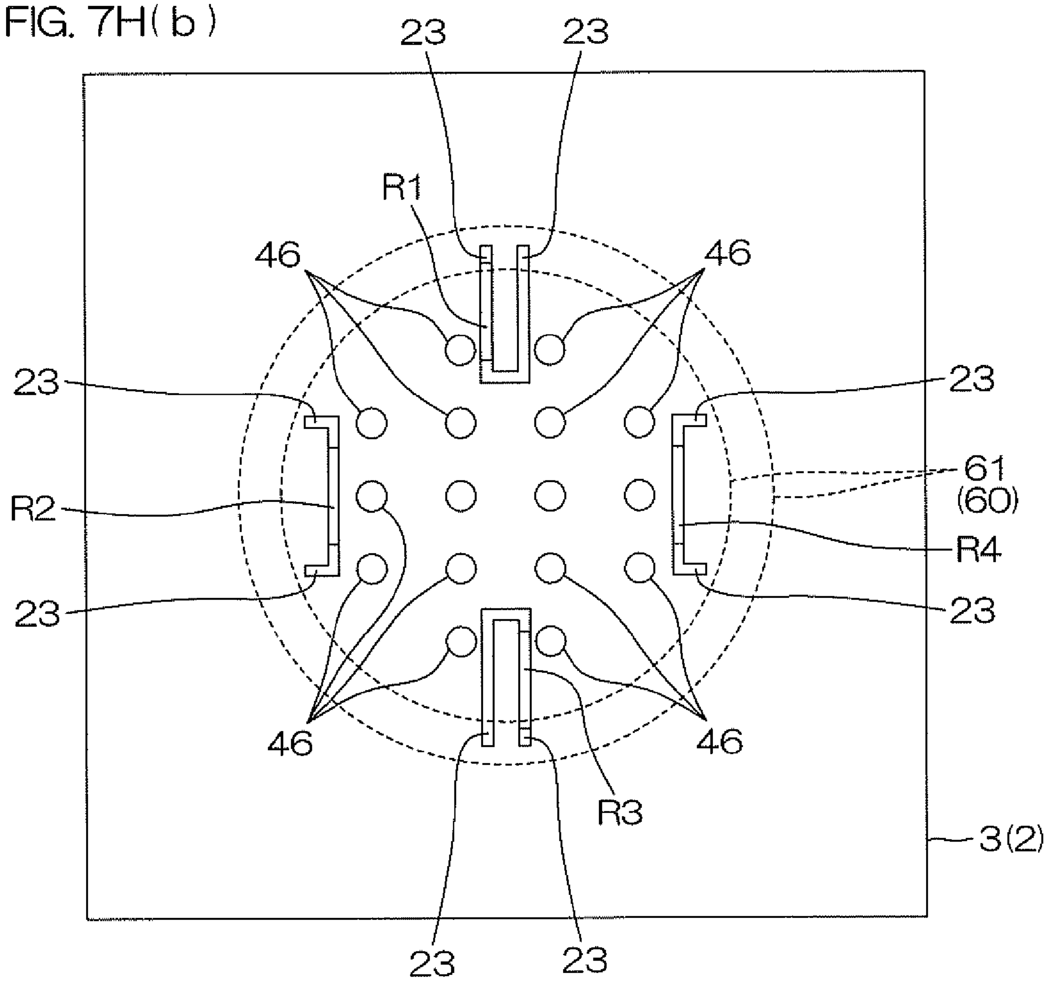
Figure 7:
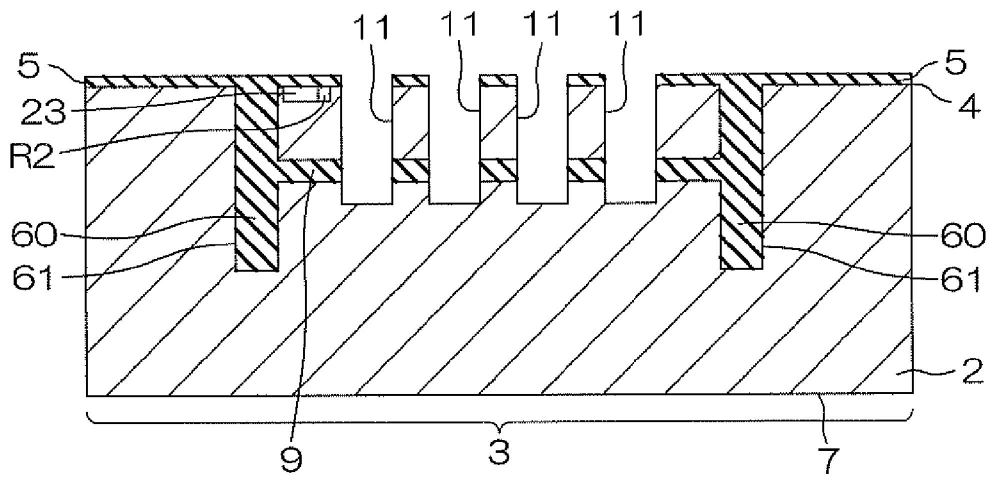
FIG. 7D(a) is a schematic sectional view showing a step subsequent to that in FIG. 7C(a), FIG. 7D(b) is a plan view in the state of FIG. 7D(a), and FIG. 7D(c) shows a cutting plane on the same position as that in FIG. 7A(b) at the same point of time as that in FIG. 7D(a).
FIG. 7I(a) is a schematic sectional view showing a step subsequent to that in FIG. 7H(a), and FIG. 7I(b) shows a cutting plane on the same position as that in FIG. 7A(b) at the same point of time as that in FIG. 7I(a).
FIG. 7J(a) is a schematic sectional view showing a step subsequent to that in FIG. 7I(a), and FIG. 7J(b) shows a cutting plane on the same position as that in FIG. 7A(b) at the same point of time as that in FIG. 7J(a).
FIG. 7K(a) is a schematic sectional view showing a step subsequent to that in FIG. 7J(a), and FIG. 7K(b) shows a cutting plane on the same position as that in FIG. 7A(b) at the same point of time as that in FIG. 7K(a).
FIG. 7L(a) is a schematic sectional view showing a step subsequent to that in FIG. 7K(a), and FIG. 7L(b) shows a cutting plane on the same position as that in FIG. 7A(b) at the same point of time as that in FIG. 7L(a).
FIG. 7M(a) is a schematic sectional view showing a step subsequent to that in FIG. 7L(a), and FIG. 7M(b) shows a cutting plane on the same position as that in FIG. 7A(b) at the same point of time as that in FIG. 7M(a).
FIG. 7N(a) is a schematic sectional view showing a step subsequent to that in FIG. 7M(a), and FIG. 7N(b) shows a cutting plane on the same position as that in FIG. 7A(b) at the same point of time as that in FIG. 7N(a).
FIG. 7O is a schematic sectional view showing a step subsequent to that in FIG. 7N(b).
FIG. 7P(a) is a schematic sectional view on the same position as that in FIG. 6(*b*) showing a step subsequent to that in FIG. 7O, and FIG. 7P(b) shows a cutting plane on the same position as that in FIG. 7A(b) at the same point of time as that in FIG. 7P(a).
FIG. 7Q is a schematic sectional view showing a step subsequent to that in FIG. 7P(b).
FIG. 7R(a) is a schematic sectional view on the same position as that in FIG. 6(*b*) showing a step subsequent to that in FIG. 7Q, and FIG. 7R(b) shows a cutting plane on the same position as that in FIG. 7A(b) at the same point of time as that in FIG. 7R(a).
Figure 7:
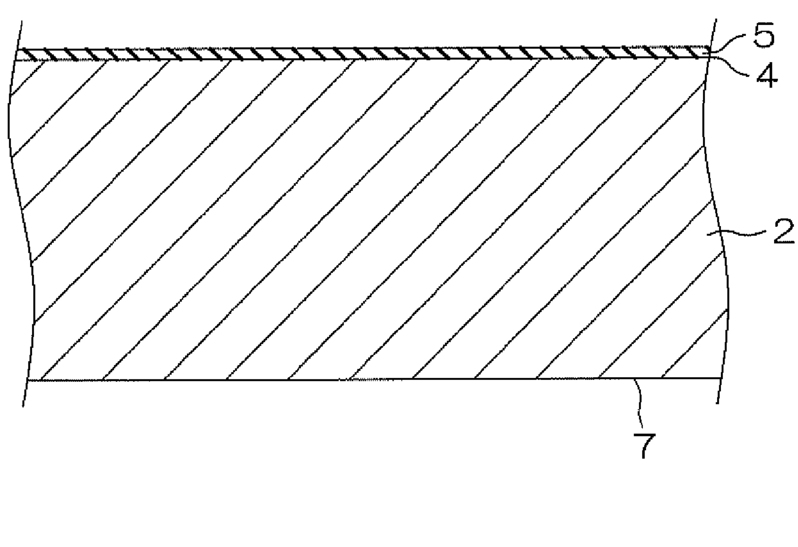
Figure 7K:
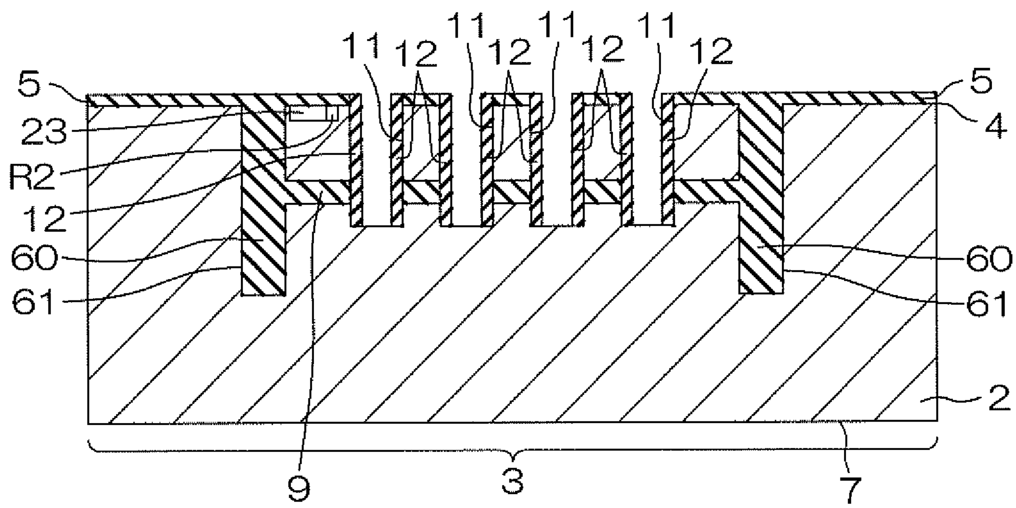
Figure 7K:
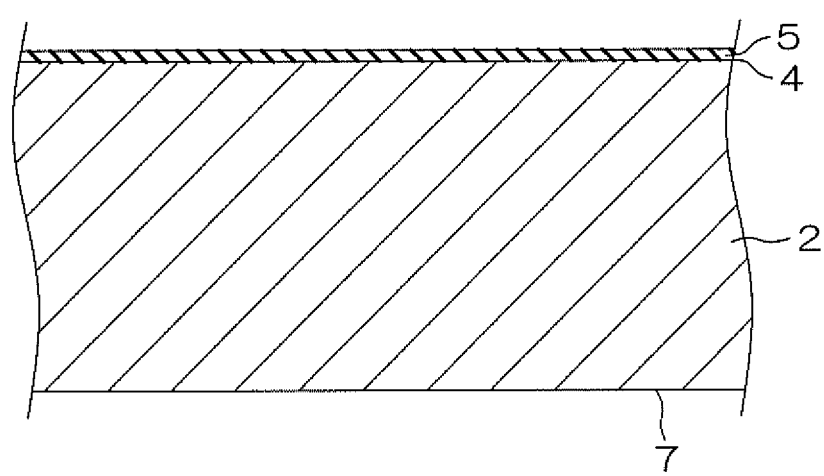
Figure 7L:
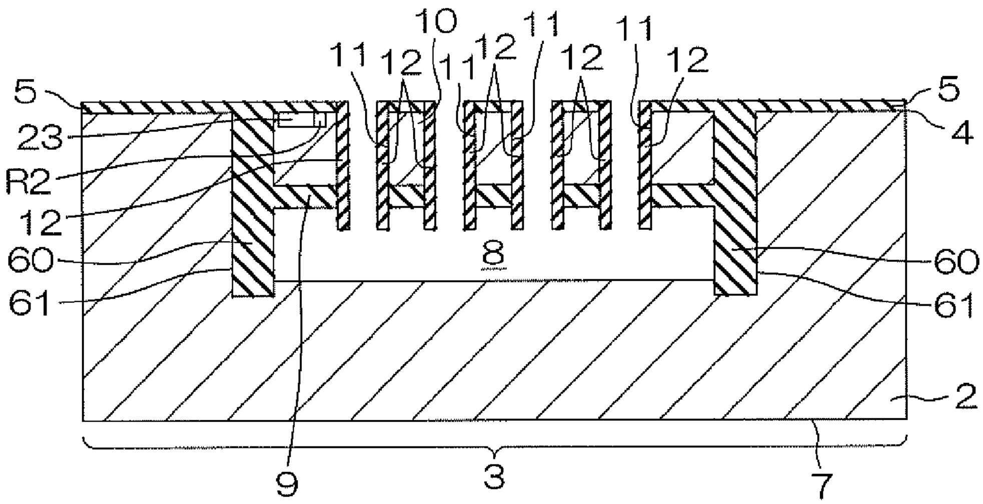
Figure 7L:
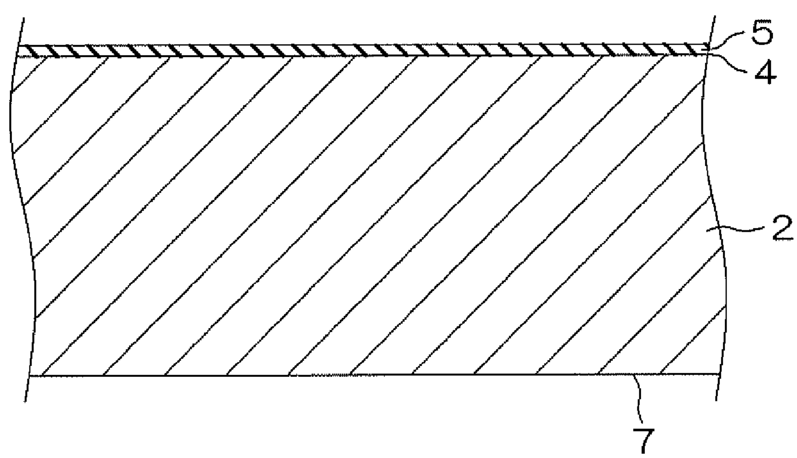
Figure 7M:
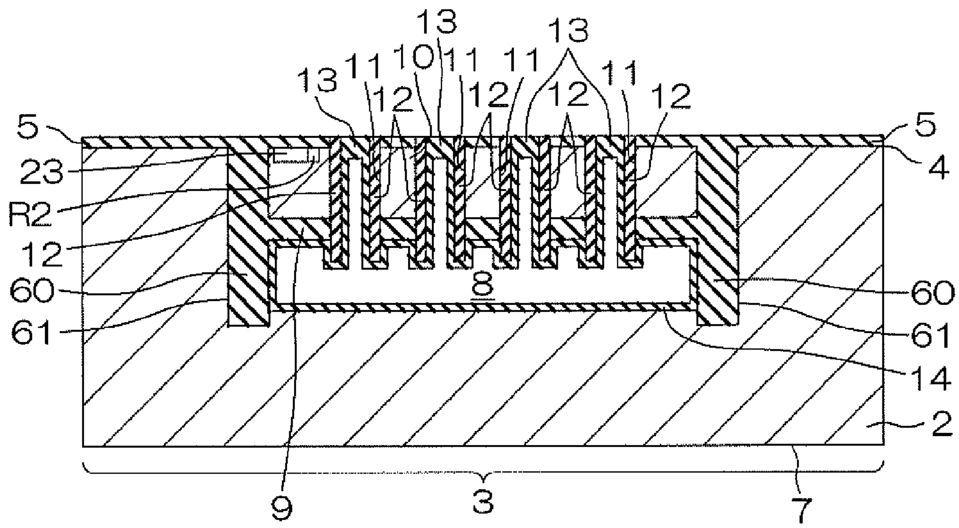
Figure 7M:
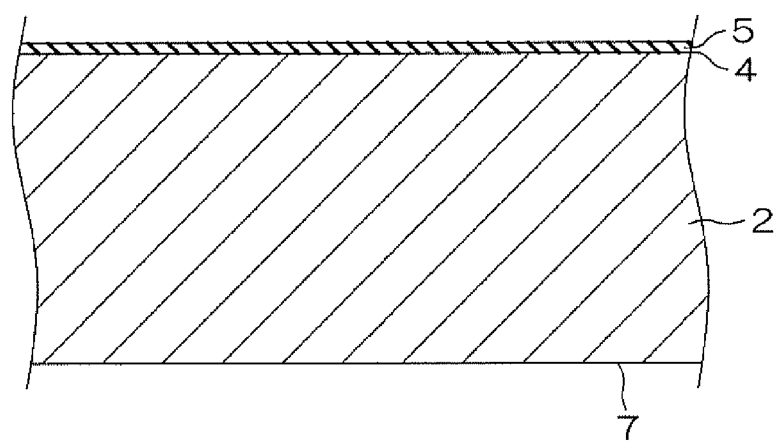
Figure 7N:
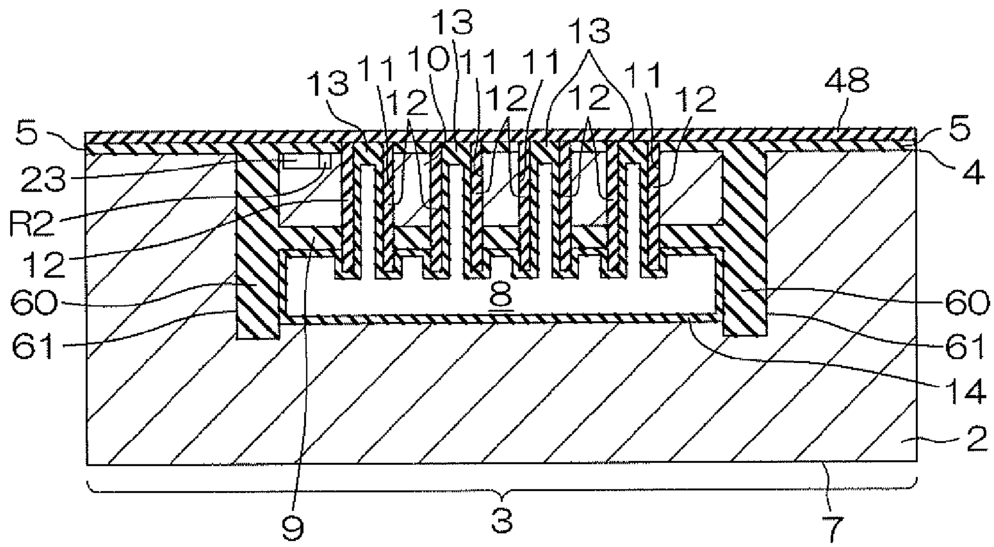
Figure 7N:
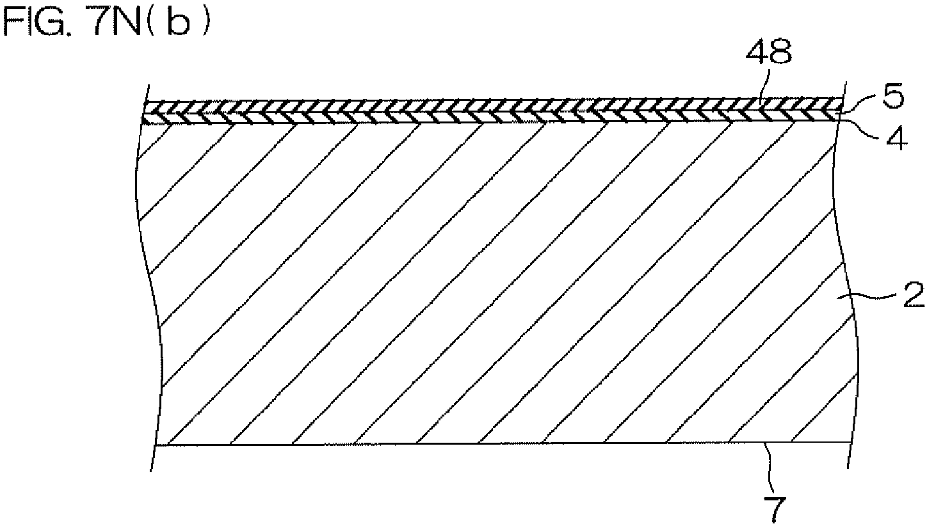
Figure 70:
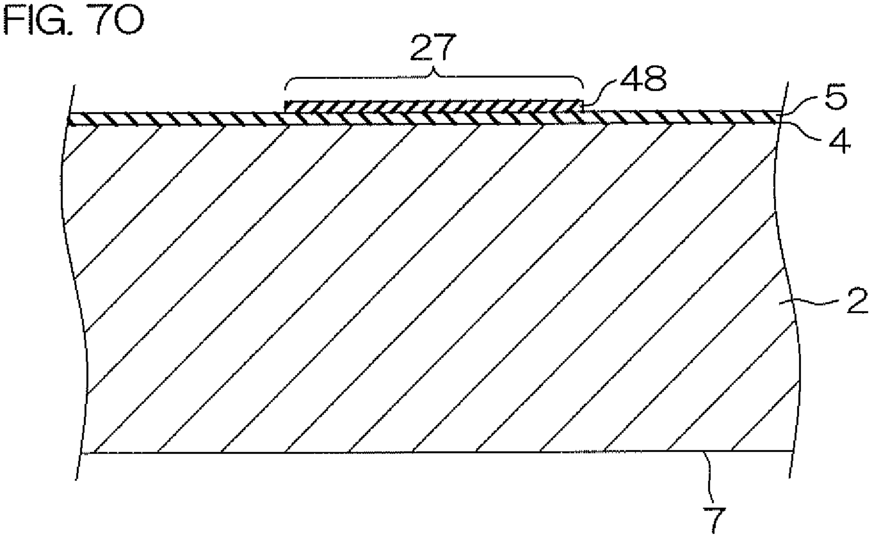
Figure 7Q:
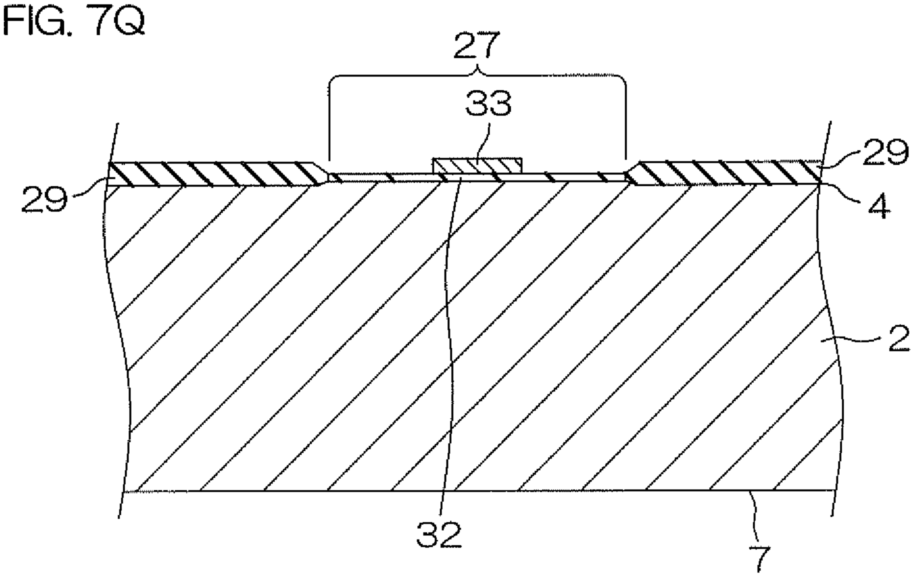
Figure 7R:
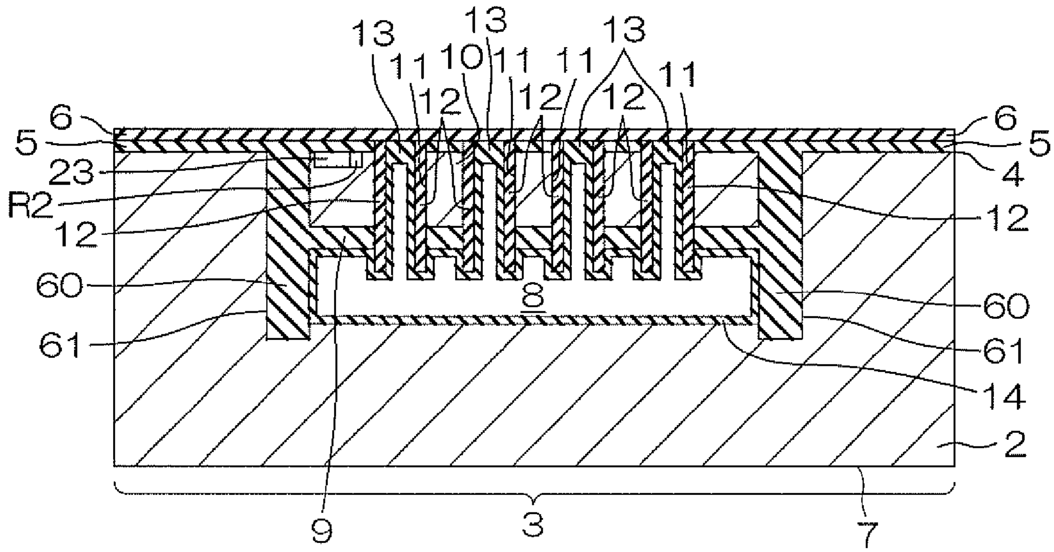
Figure 7R:
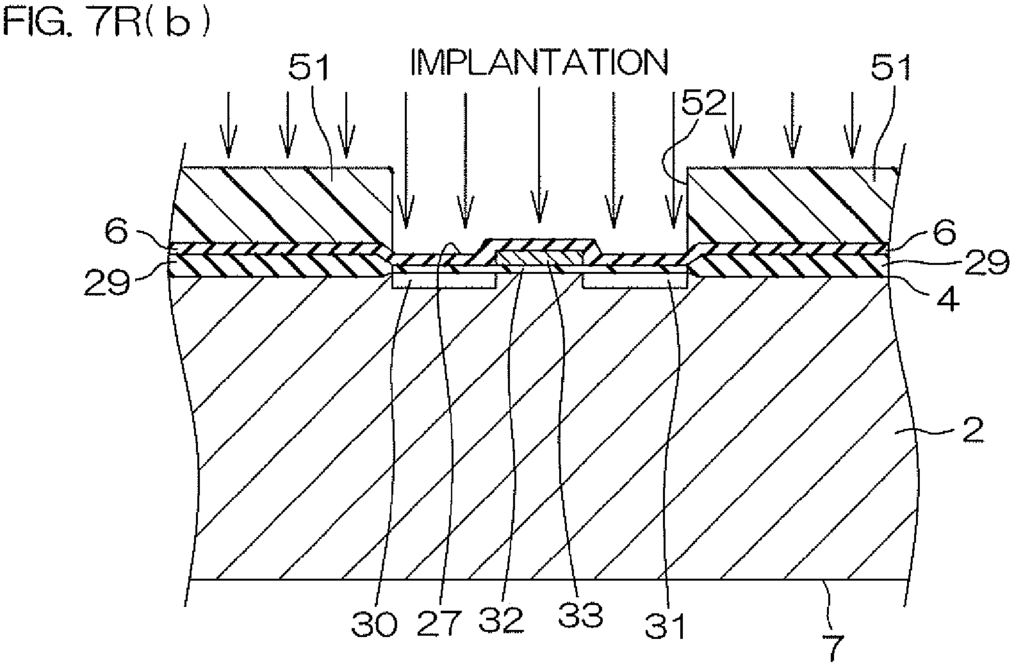

FIGS. 7A to 7R show manufacturing steps for the pressure sensor shown in FIG. 6. In a case where two sectional views are shown in each of FIGS. 7A to 7R, the upper sectional view shows a cutting plane on the same position as that in FIG. 6(*b*), and the lower sectional view shows a cutting plane on the same position as that in FIG. 3(*b*).

In order to manufacture the pressure sensor 1 according to the second embodiment, the silicon substrate 2 is prepared as shown in FIG. 7A, and an oxide film 40 is formed on the surface 4 of the silicon substrate 2, as described with reference to FIG. 5A.

Then, referring to FIG. 7B, impurity ions are implanted into a surface layer portion of the silicon substrate 2 by employing a resist pattern 41 as a mask, as described with reference to FIG. 5B.

Then, referring to FIG. 7C, epitaxial growth is performed as described with reference to FIG. 5C, and the etching stop layer 9 is formed on a position of a prescribed depth from the surface 4 of the silicon substrate 2. In a case where acceleration voltage for the implantation has been high, only drive-in may be performed in place of the epitaxial growth, as described above.

Then, referring to FIG. 7D, an oxide film 43 is formed on the surface 4 of the silicon substrate 2, and an unshown resist pattern is formed on the oxide film 43 by photolithography. The resist pattern has an annular opening corresponding to the separation layer 60 (see FIG. 6).

Then, the oxide film 43 is selectively removed by plasma etching employing the resist pattern (not shown) as a mask. A state upon termination of the plasma etching is shown in FIG. 7D, and an annular opening 62 is formed in the oxide film 43.

Then, the silicon substrate 2 is dug down by anisotropic deep RIE employing the oxide film 43 as a mask, and an annular trench 61 is formed in the silicon substrate 2, as shown in FIG. 7E. The annular trench 61 is an annular vertical groove, chips an outer peripheral edge portion of the etching stop layer 9 over the whole periphery. Through-holes 11 are formed in a region where the etching stop layer 9 is present (see FIG. 6(*b*)), and hence the annular trench 61 is formed to surround a region planned to be provided with the through-holes 11 on the surface 4 of the silicon substrate 2. Further, the annular trench 61 is formed to be deeper than a portion (see FIG. 6(*b*)) planned to become a bottom surface of the reference pressure chamber 8 in the silicon substrate 2.

Then, the annular trench 61 is filled up with an oxide film by CVD, as shown in FIG. 7F. The oxide film present in the annular trench 61 is the aforementioned separation layer 60. In other words, the separation layer 60 is embedded in the annular trench 61 in this step. At this time, the oxide film so projects from the annular trench 61 that the surface of the oxide film 43 is irregularized, the surface of the oxide film 43 is flattened by resist etchback.

Subsequent steps are identical to the steps of the first embodiment subsequent to that in FIG. 5D.

In other words, referring to FIG. 7G, piezoresistors R1 to R4 and relay wires 23 are first formed on the surface layer portion of the silicon substrate 2, as described with reference to FIG. 5D. At a point of time when the formation of the piezoresistors R1 to R4 and the relay wires 23 is completed, the oxide film 43 (also including the aforementioned mask 44) has been removed. The step of forming the piezoresistors R1 to R4 and the relay wires 23 may not be carried out immediately after the formation of the etching stop layer 9, but may be executed at another proper timing in subsequent steps.

Then, the covering layer 5 is formed on the surface 4 of the silicon substrate 2 by CVD, and the covering layer 5 is thereafter selectively removed by plasma etching employing a resist pattern 45 formed on the covering layer 5 by photolithography as a mask, as shown in FIG. 7, as described with reference to FIG. 5E. A state upon termination of the plasma etching is shown in FIG. 7H.

Then, the silicon substrate 2 is dug down by anisotropic deep RIE employing the resist pattern 45 as a mask as described with reference to FIG. 5F, and the through-holes 11 passing through the etching stop layer 9 are formed, while the remaining portions of the resist pattern 45 are peeled off, as shown in FIG. 7I(a).

Then, protective thin films 12 are formed on circumferential surfaces and bottom surfaces of the trough-holes 11 and a surface of the covering layer 5 by thermal oxidation or CVD as shown in FIG. 7J(a), as described with reference to FIG. 5G.

Then, portions of the protective thin films 12 on the bottom surfaces of the through-holes 11 and the surface of the covering layer 5 are removed by RIE as shown in FIG. 7K(a), as described with reference to FIG. 5H.

Then, the reference pressure chamber 8 is formed under the etching stop layer 9 and around the bottom of each through-hole 11 and the diaphragm 10 is formed on the etching stop layer 9 in the silicon substrate 2 by isotropic etching as shown in FIG. 7L(a), as described with reference to FIG. 5I. While a substrate material on a side closer to the surface 4 than the etching stop layer 9 is not etched due to the presence of the etching stop layer 9, a substrate material on the outside of the separation layer 60 is not etched either in the direction orthogonal to the thickness direction of the silicon substrate 2, due to the presence of the separation layer 60.

Then, fillers 13 are arranged in the through-holes 11, and the whole areas of inner wall surfaces of the reference pressure chamber 8 are covered with a covering film 14 as shown in FIG. 7M(a), as described with reference to FIG. 5J.

Then, a step of forming an integrated circuit portion 28 (see FIG. 3(*b*)) on an integrated circuit region 27 is executed.

First, a nitride film 48 is formed on the surface of the covering layer 5 on the silicon substrate 2 as shown in FIG. 7N, as described with reference to FIG. 5K.

Then, the nitride film 48 remains only on a portion planned to become the integrated circuit region 27 by plasma etching through a mask (not shown) of a prescribed pattern as shown in FIG. 7O, as described with reference to FIG. 5L.

Then, a LOCOS layer 29 is formed and a gate oxide film 32 is thereafter formed as shown in FIG. 7P(b), as described with reference to FIG. 5M.

Then, a gate electrode 33 is formed on the gate oxide film 32 as shown in FIG. 7Q, as described with reference to FIG. 5M.

Then, a source 30 and a drain 31 are formed on the surface layer portion of the silicon substrate 2 in the integrated circuit region 27 as shown in FIG. 7R(b), as described with reference to FIG. 5O.

Thereafter an insulating layer 6 is formed, and metal terminals 15 to 18 and metal wires 19 to 22 (see FIG. 6(*a*)) are simultaneously formed as shown in FIG. 6, as described with reference to FIG. 3. At the same time, metal wires (the aforementioned source-side metal wire 35, a drain-side metal wire 36 etc., see FIG. 3(*b*)) and metal terminals (not shown) linked with the respective ones of the source 30, the drain 31 and the gate electrode 33 of the integrated circuit portion 28 are also formed. Further, a passivation film 25 is formed on the insulating layer 6, and openings 26 exposing the metal terminals 14 to 18 (also including unshown metal terminals on the side of the integrated circuit portion 28) as pads respectively and an opening 56 are formed in the passivation film 25 (see FIG. 6(*b*)).

Thus, the pressure sensor 1 according to the second embodiment is obtained.

According to the second embodiment, the following effects can be attained in addition to the effects described with reference to the first embodiment:

In other words, the diaphragm 10 and the reference pressure chamber 8 are partitioned by the separation layer 60 and formed in the direction orthogonal to the thickness direction of the silicon substrate 2 in the etching steps (see FIGS. 7J to 7L), whereby the diaphragm 10 can be precisely formed in target dimensions. Therefore, a pressure sensor 1 capable of attaining improvement of sensitivity and capable of suppressing dispersion in sensitivity can be manufactured. Further, the etching of the reference pressure chamber 8 stops on the separation layer 60, whereby not only the diaphragm 10 but also the reference pressure chamber 8 can be precisely formed in target dimensions in the direction orthogonal to the thickness direction of the silicon substrate 2.

(3) Third Embodiment

While a third embodiment is now described, the same reference signs are assigned to portions of the third embodiment corresponding to the portions described with reference to the first embodiment, and description thereof is omitted. In relation to manufacturing steps for a pressure sensor 1 according to the third embodiment, detailed description is omitted as to those identical to the manufacturing steps described with reference to the first embodiment.

Figure 8A:
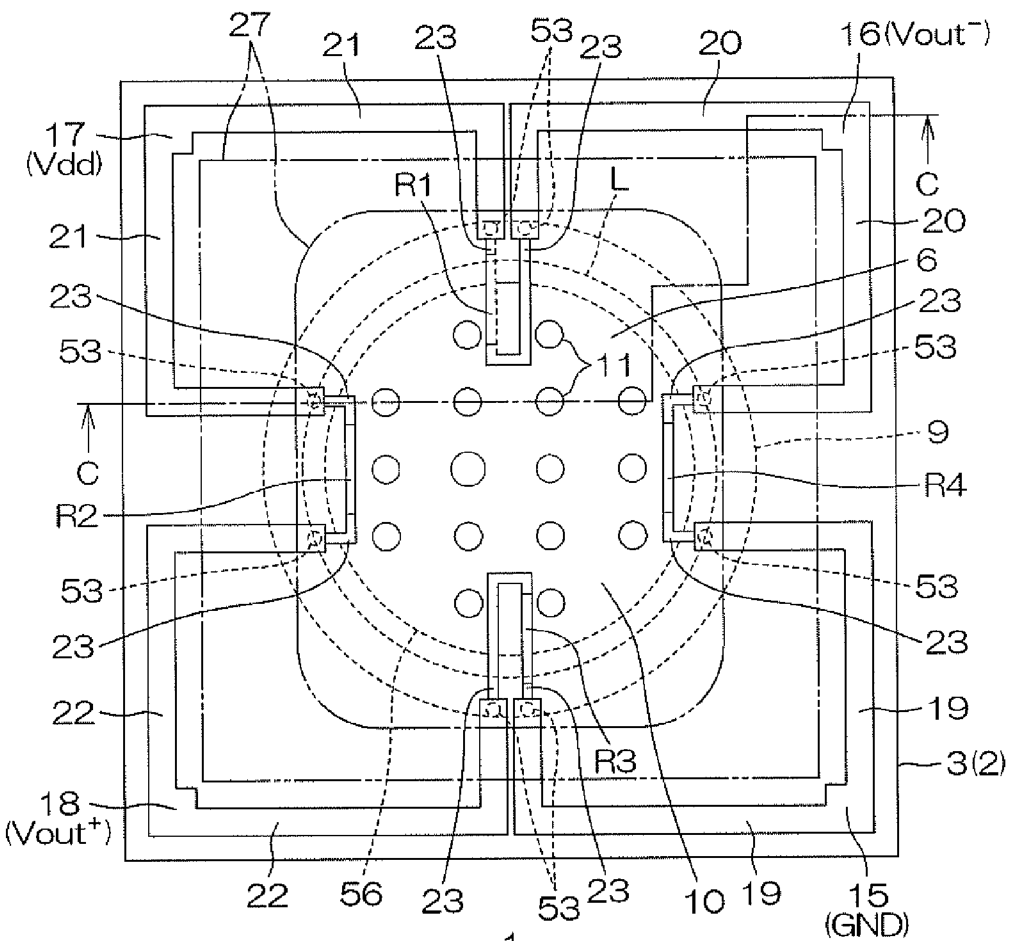
FIG. 8(*a*) is an enlarged plan view of a pressure sensor according to a third embodiment, and FIG. 8(*b*) is a sectional view along a cutting plane line C-C in FIG. 8(*a*).
Figure 8B:
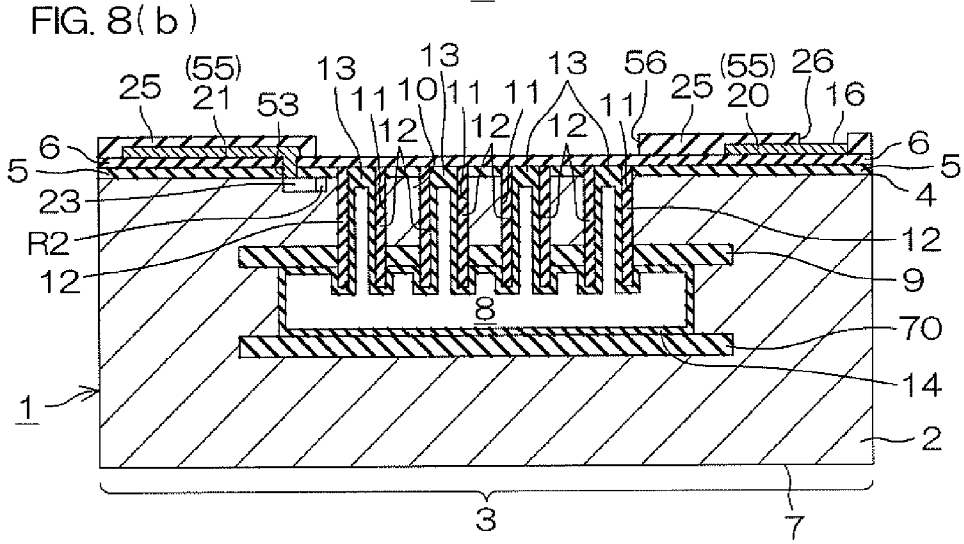

FIG. 8(*a*) is an enlarged plan view of the pressure sensor according to the third embodiment, and FIG. 8(*b*) is a sectional view along a cutting plane line C-C in FIG. 8(*a*).

The pressure sensor 1 according to the third embodiment is provided with a second etching stop layer 70 on a position (a position deeper than an etching stop layer 9) partitioning a bottom surface of a reference pressure chamber 8 a shown in FIG. 8(*b*), in addition to the structure (see FIG. 3(*a*)) of the first embodiment. The bottom surface of the reference pressure chamber 8 is a surface opposed to the etching stopper layer 9 from below in inner wall surfaces of the reference pressure chamber 8.

The second etching stop layer 70 is in the form of a circle in plan view having the same magnitude as the etching stop layer 9 (hereinafter referred to as "first etching stop layer 9" for the convenience of illustration). The first etching stop layer 9 and the second etching stop layer 70 are vertically opposed to each other at an interval corresponding to the vertical dimension (the depth) of the reference pressure chamber 8.

Figure 9A:
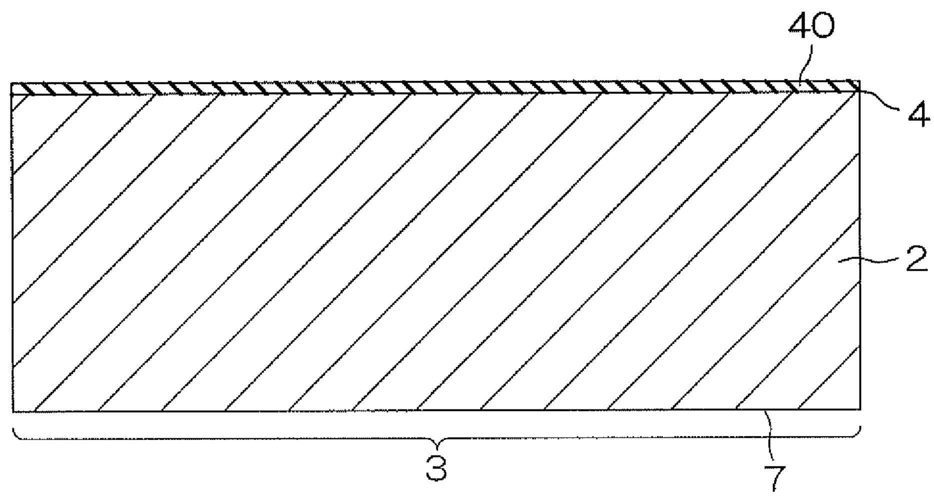
FIG. 9A(a) is a schematic sectional view showing a manufacturing step for the pressure sensor shown in FIG. 8 and shows a cutting plane on the same position as that in FIG. 8(*b*), while FIG. 9A(b) is a sectional view of a principal portion of the pressure sensor in an integrated circuit region of FIG. 8(*a*) at the same point of time as that in FIG. 9A(a).
Figure 9A:
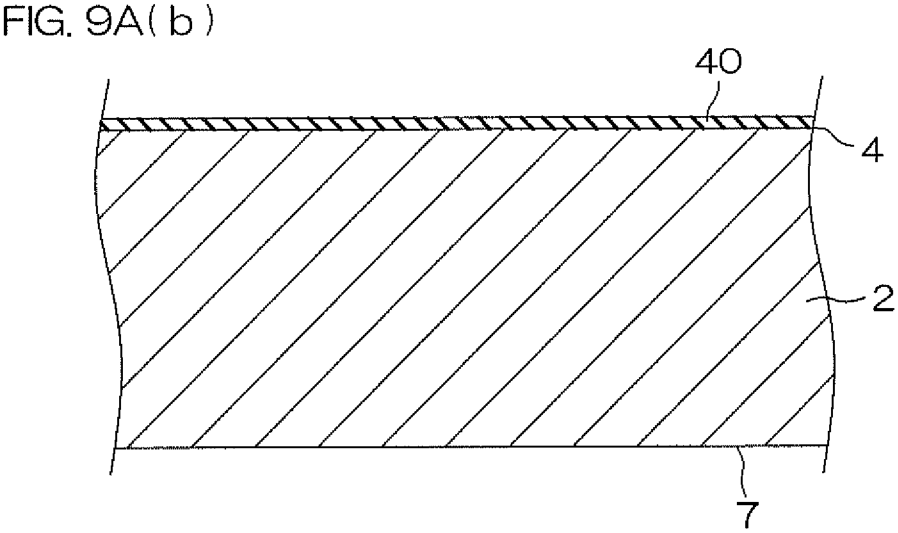
Figure 9B:
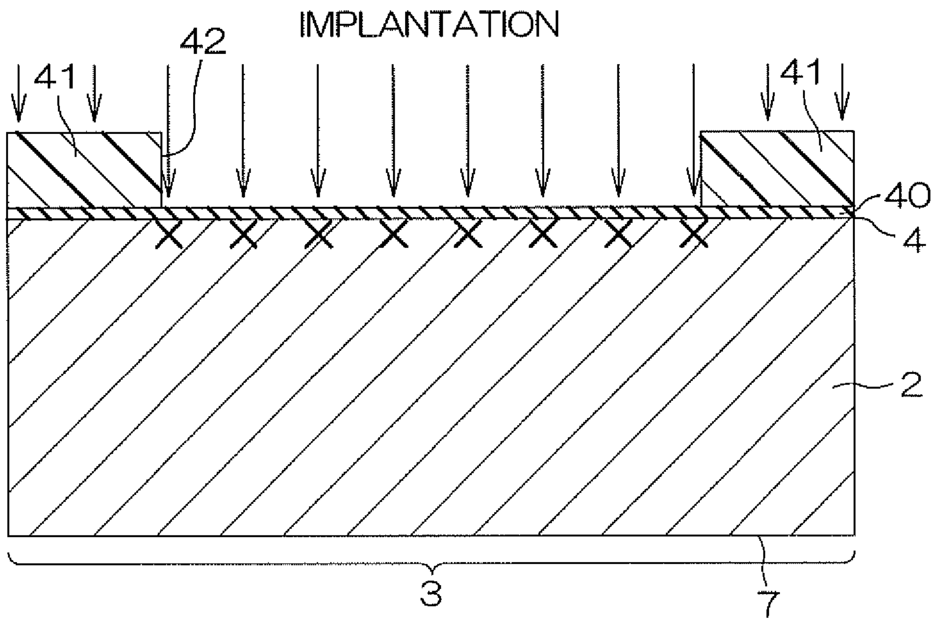
FIG. 9B(a) is a schematic sectional view showing a step subsequent to that in FIG. 9A(a), and FIG. 9B(b) is a plan view in the state of FIG. 9B(a).
Figure 9B:
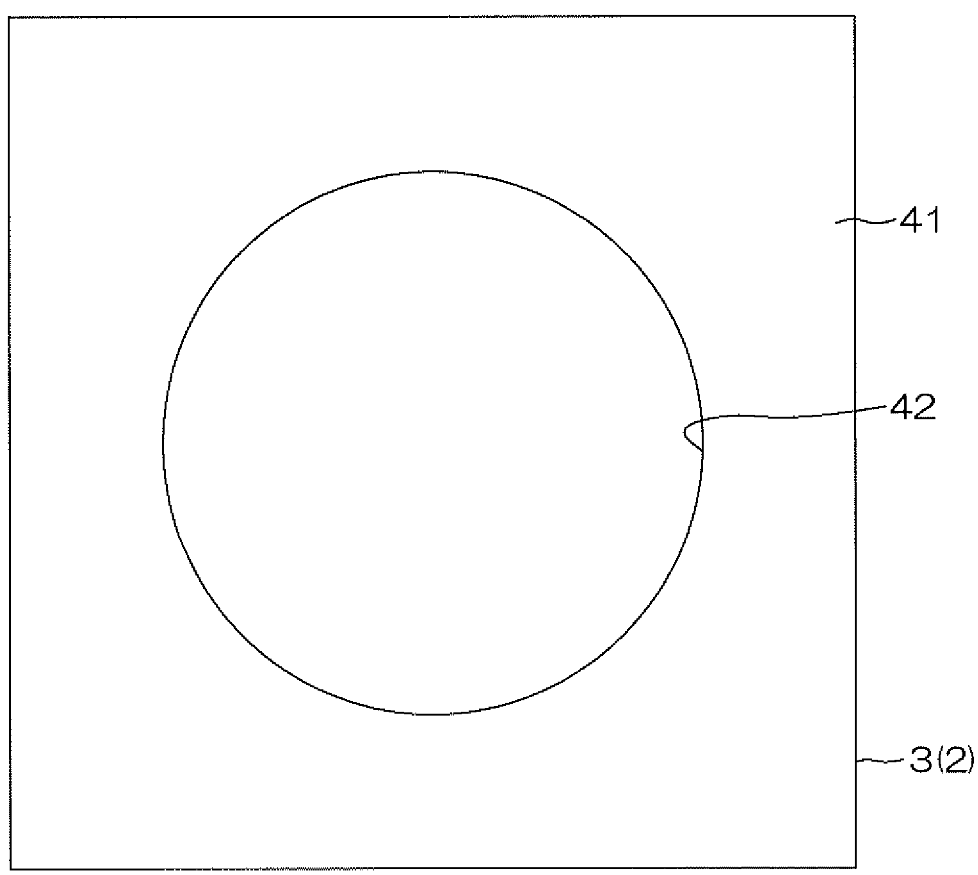
Figure 9C:
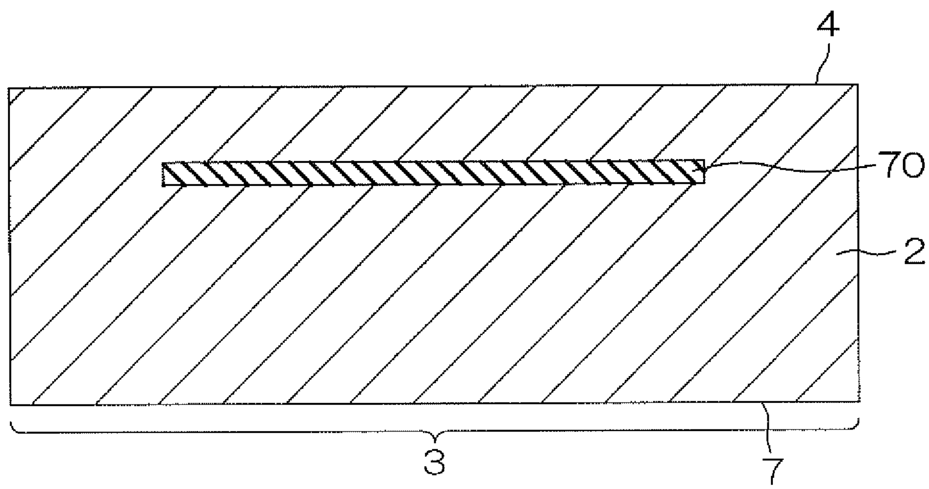
FIG. 9C(a) is a schematic sectional view showing a step subsequent to that in FIG. 9B(a), and FIG. 9C(b) shows a cutting plane on the same position as that in FIG. 9A(b) at the same point of time as that in FIG. 9C(a).
Figure 9C:
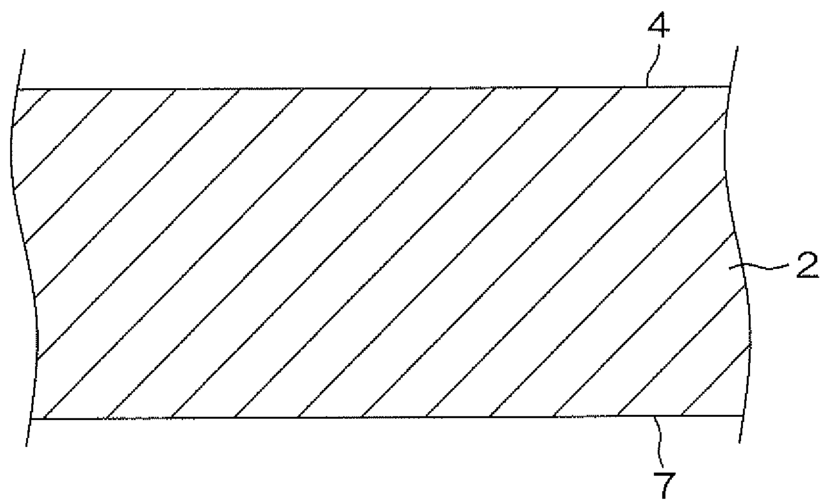
Figure 9D:
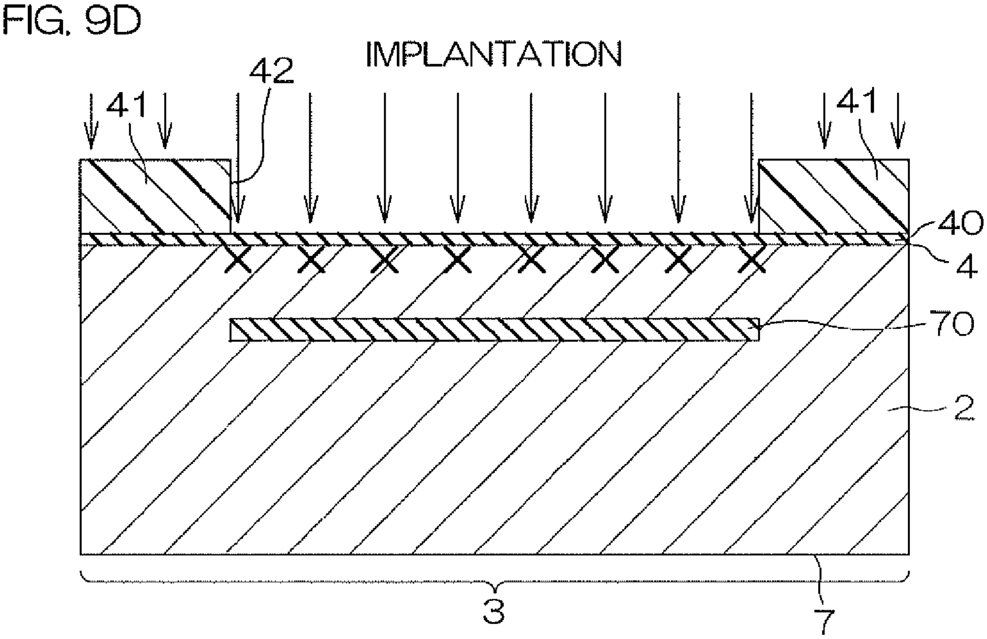
FIG. 9D is a schematic sectional view showing a step subsequent to that in FIG. 9C(a).
Figure 9E:
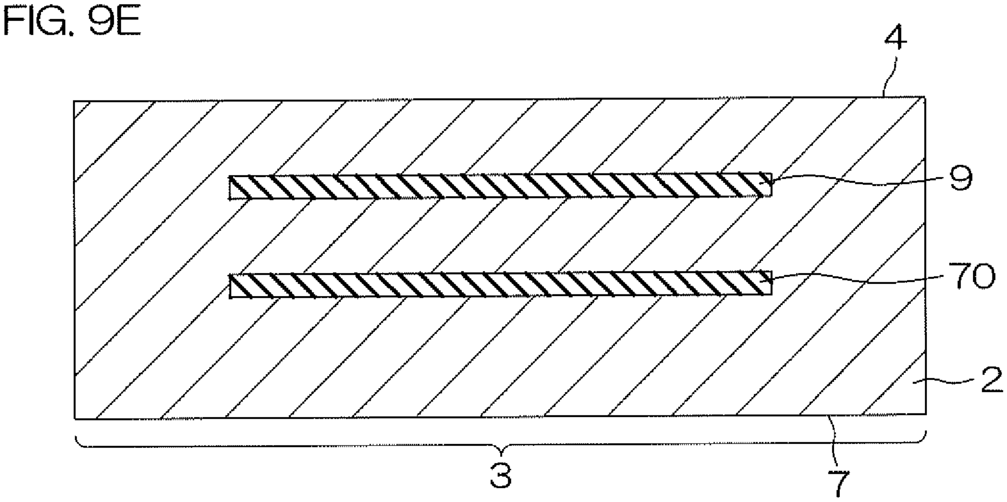
FIG. 9E is a schematic sectional view showing a step subsequent to that in FIG. 9D.
Figure 9F:
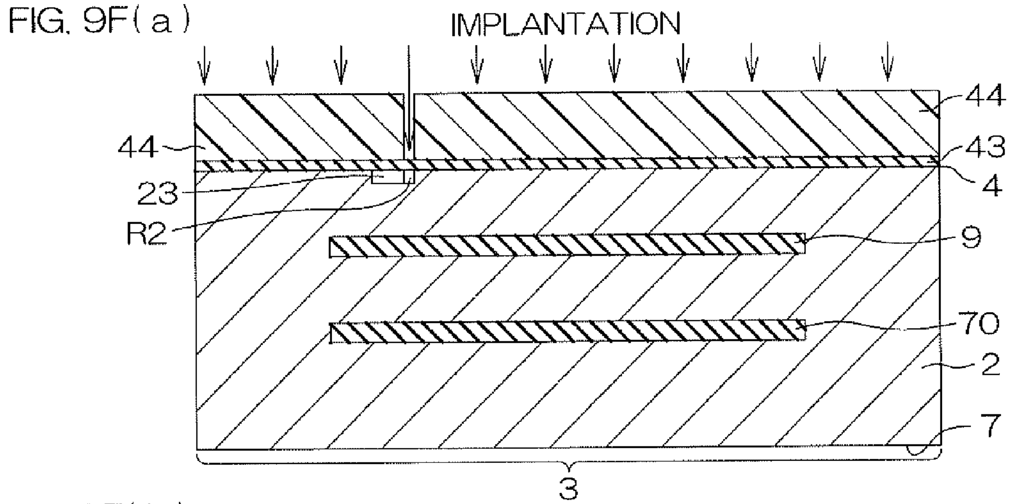
FIG. 9F(a) is a schematic sectional view showing a step subsequent to that in FIG. 9E, FIG. 9F(b) is a plan view in the state of FIG. 9F(a), and FIG. 9F(c) shows a cutting plane on the same position as that in FIG. 9A(b) at the same point of time as that in FIG. 9F(a).
Figure 9F:
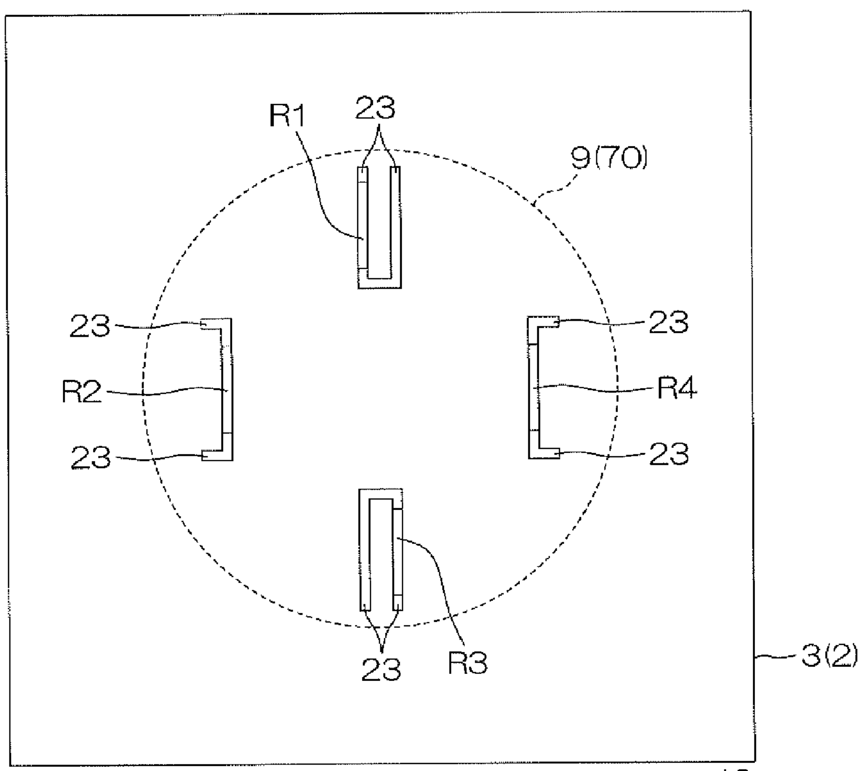
Figure 9F:
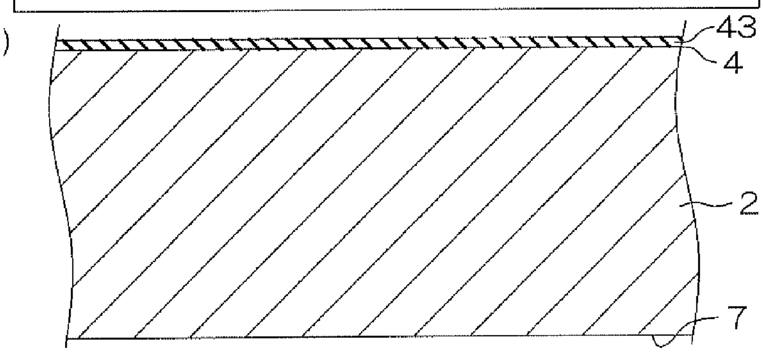
Figure 9G:
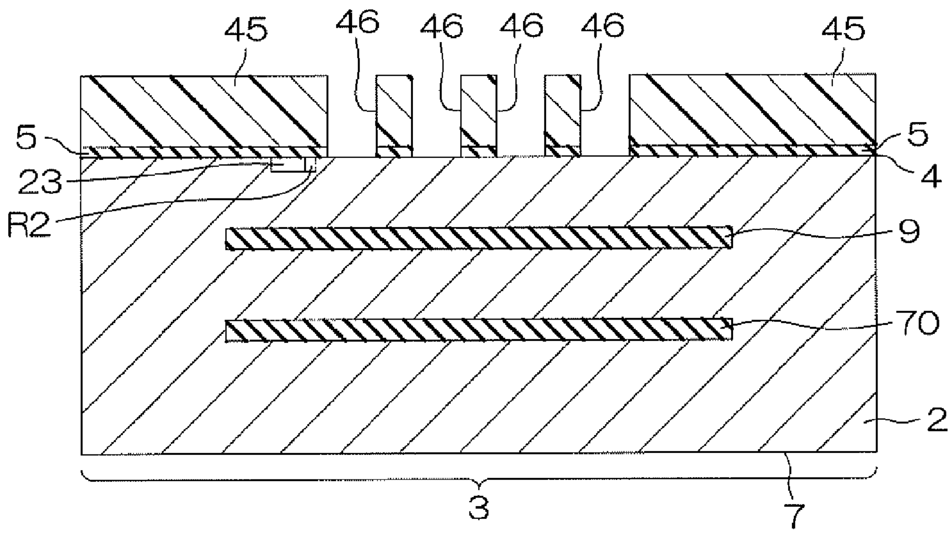
FIG. 9G(a) is a schematic sectional view showing a step subsequent to that in FIG. 9F(a), and FIG. 9G(b) is a plan view in the state of FIG. 9G(a).
Figure 9G:
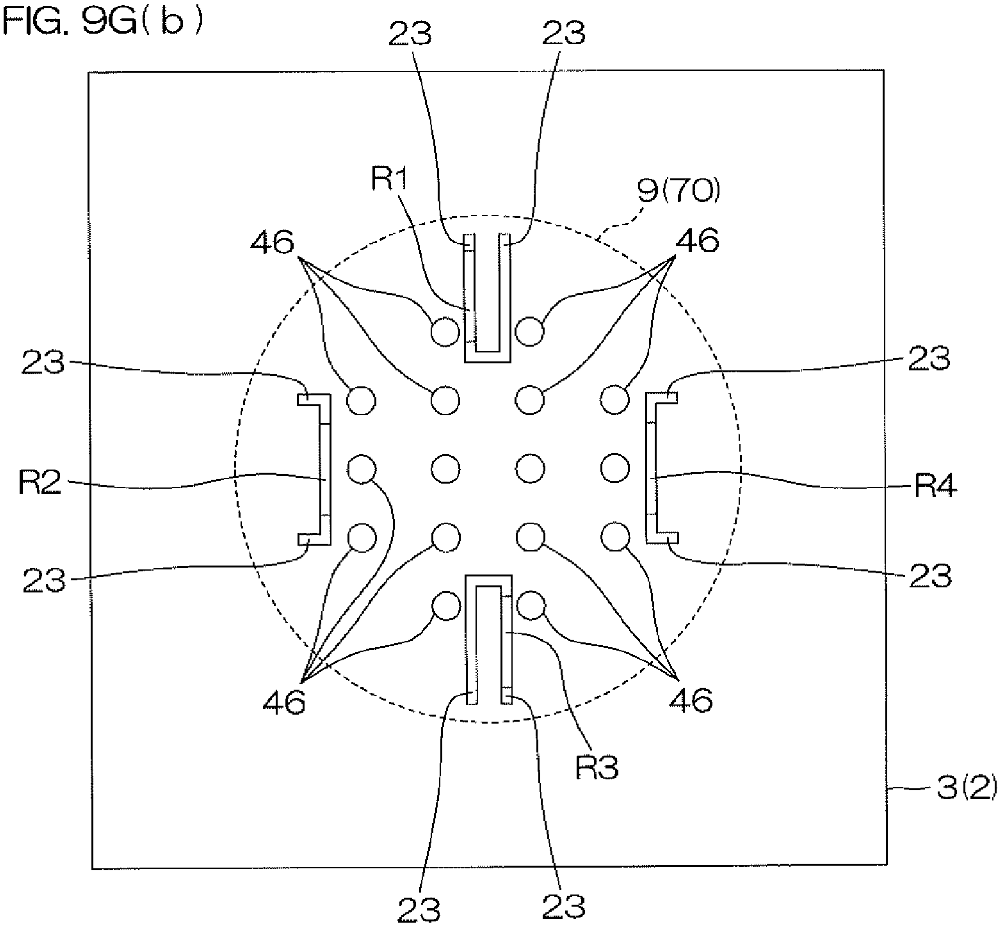
Figure 9H:
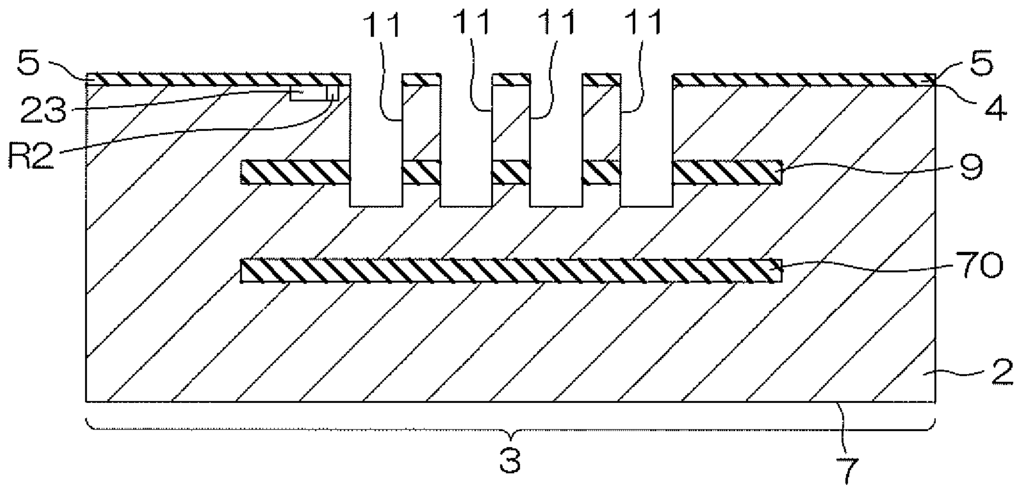
FIG. 9H(a) is a schematic sectional view showing a step subsequent to that in FIG. 9G(a), and FIG. 9H(b) shows a cutting plane on the same position as that in FIG. 9A(b) at the same point of time as that in FIG. 9H(a).
Figure 9H:
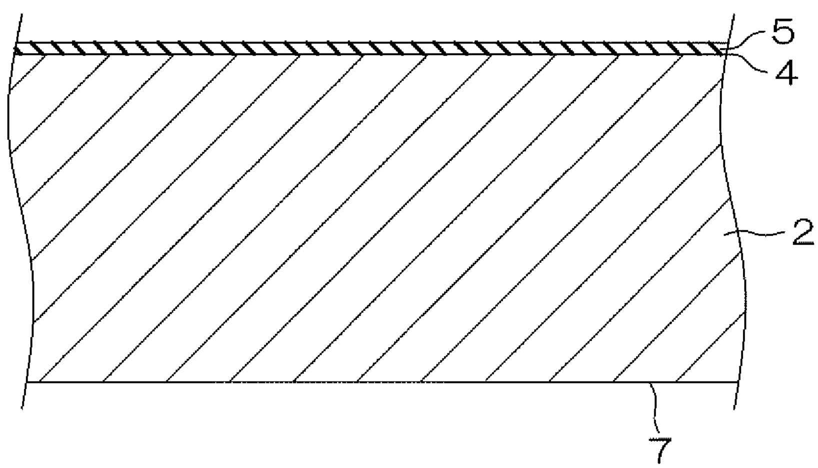
Figure 9I:
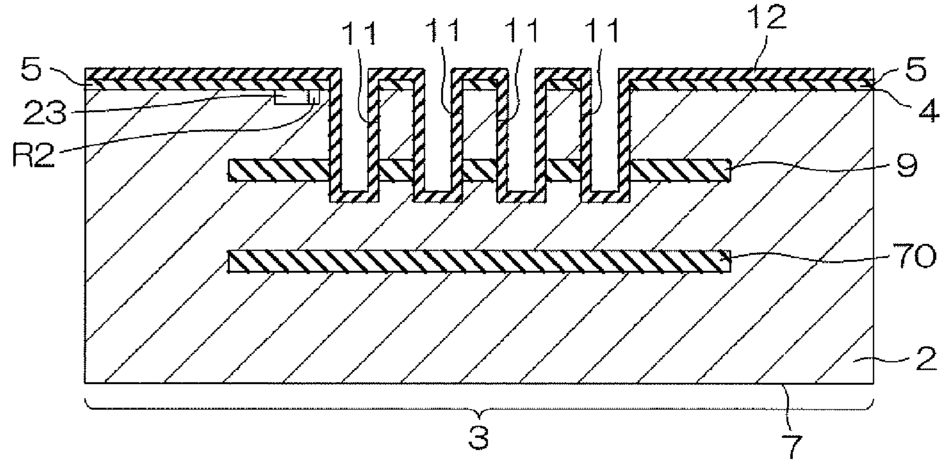
FIG. 9I(a) is a schematic sectional view showing a step subsequent to that in FIG. 9H(a), and FIG. 9I(b) shows a cutting plane on the same position as that in FIG. 9A(b) at the same point of time as that in FIG. 9I(a).
Figure 9I:
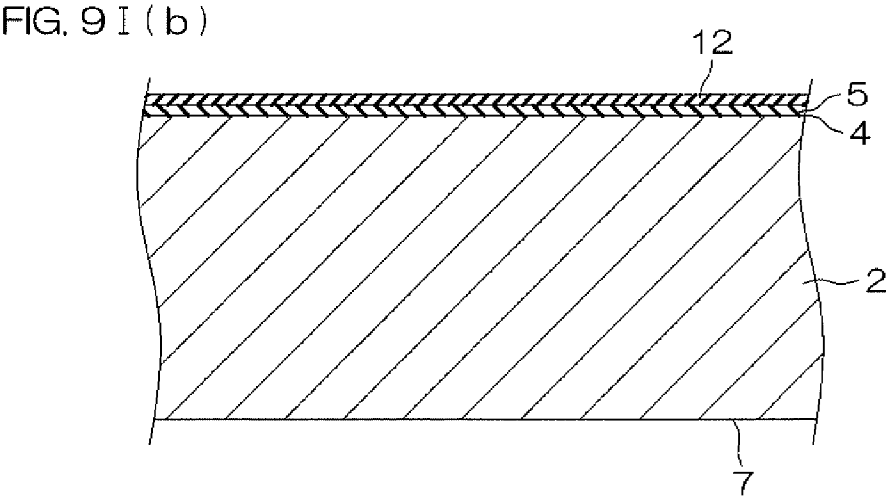
Figure 9J:
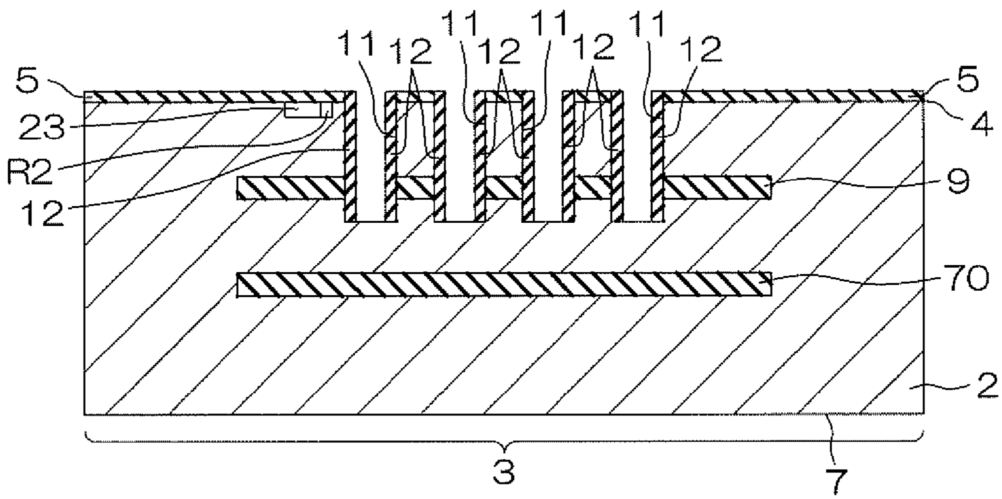
FIG. 9J(a) is a schematic sectional view showing a step subsequent to that in FIG. 9I(a), and FIG. 9J(b) shows a cutting plane on the same position as that in FIG. 9A(b) at the same point of time as that in FIG. 9J(a).
Figure 9J:
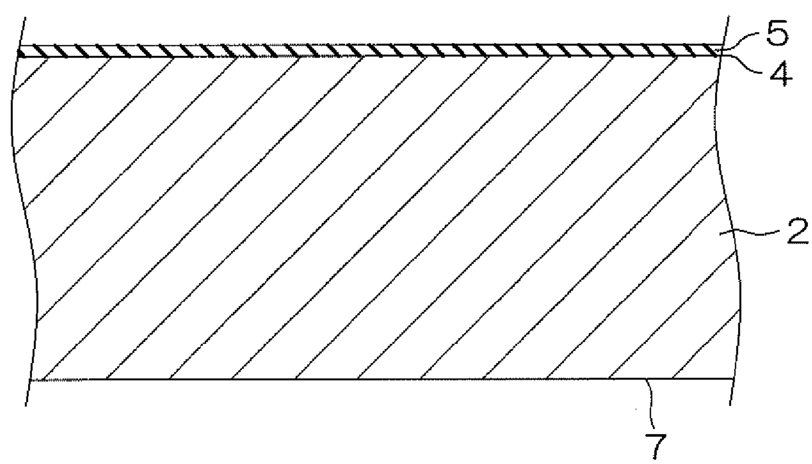
Figure 9K:
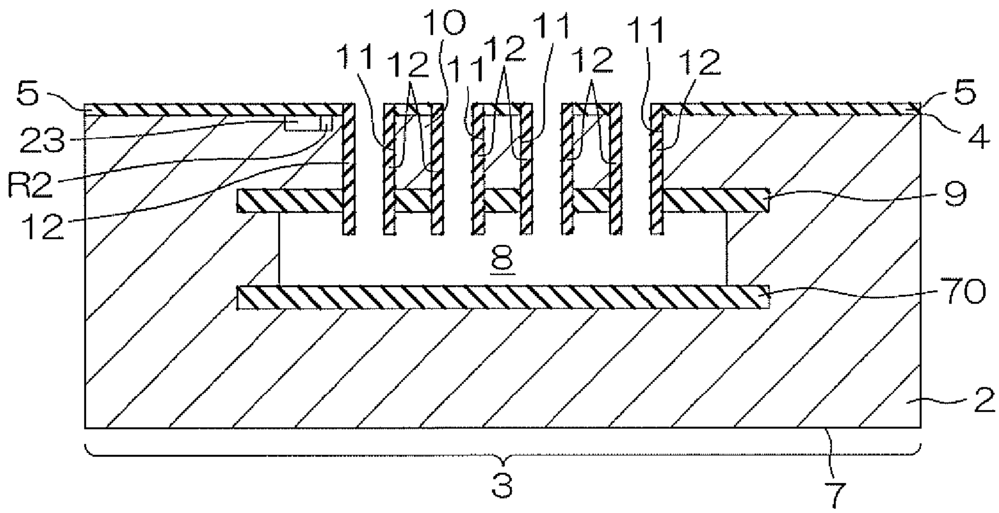
FIG. 9K(a) is a schematic sectional view showing a step subsequent to that in FIG. 9J(a), and FIG. 9K(b) shows a cutting plane on the same position as that in FIG. 9A(b) at the same point of time as that in FIG. 9K(a).
Figure 9K:
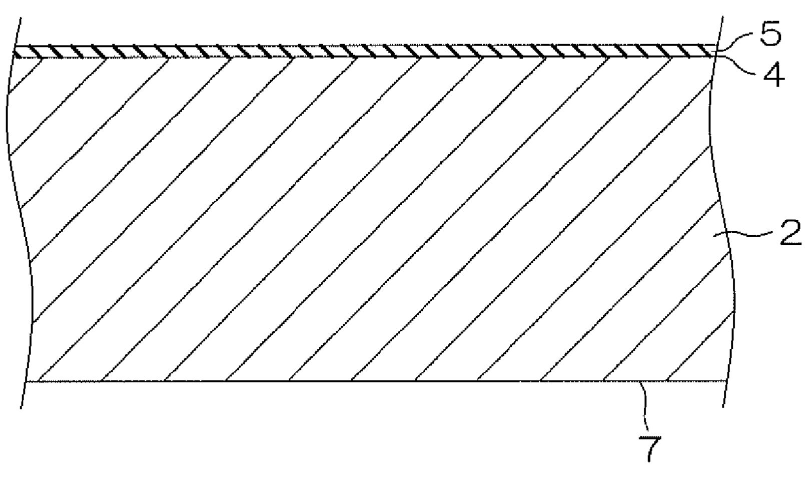
Figure 9L:
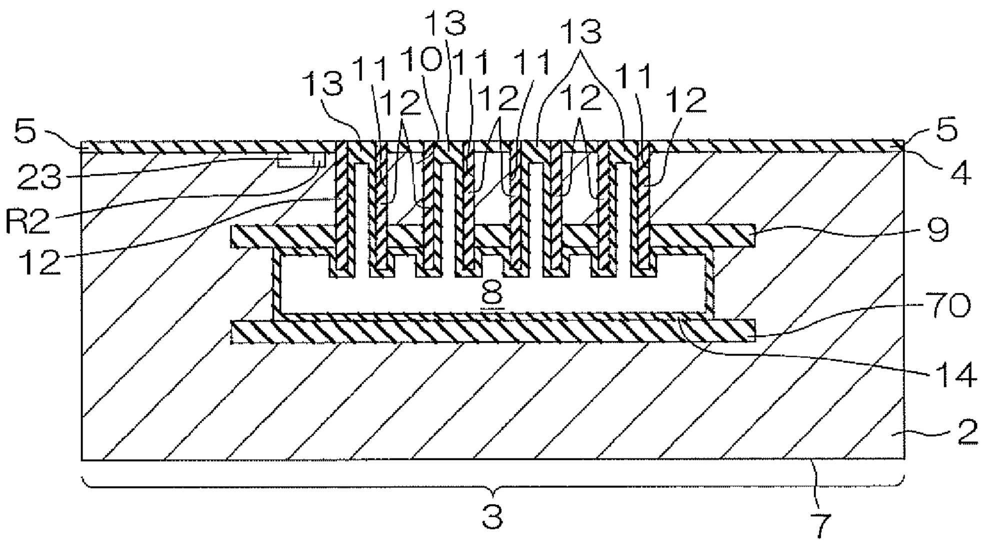
FIG. 9L(a) is a schematic sectional view showing a step subsequent to that in FIG. 9K(a), and FIG. 9L(b) shows a cutting plane on the same position as that in FIG. 9A(b) at the same point of time as that in FIG. 9L(a).
Figure 9L:
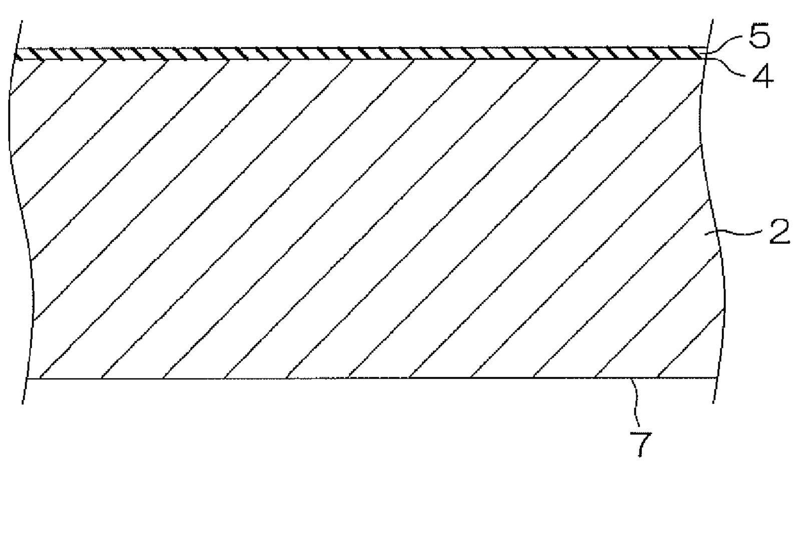
Figure 9M:
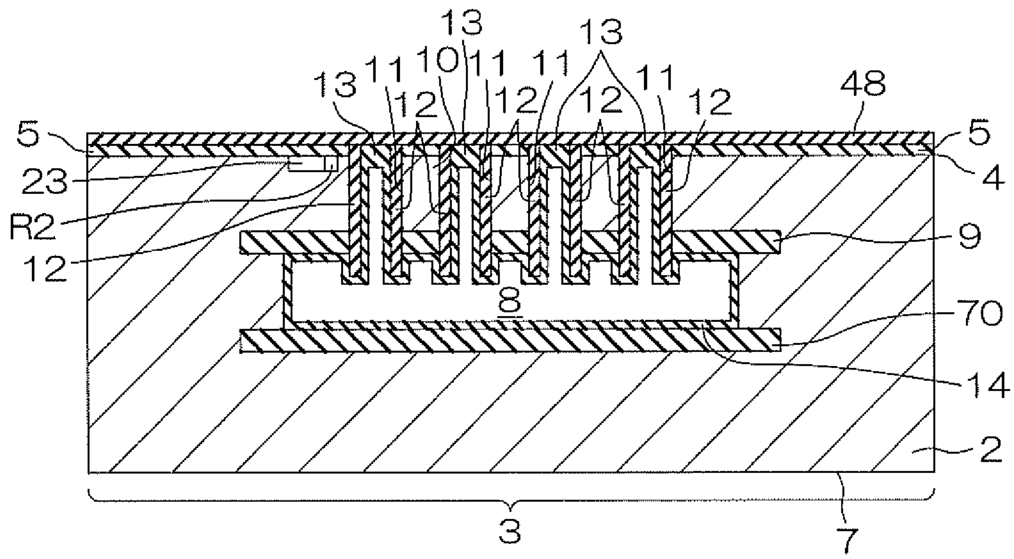
FIG. 9M(a) is a schematic sectional view showing a step subsequent to that in FIG. 9L(a), and FIG. 9M(b) shows a cutting plane on the same position as that in FIG. 9A(b) at the same point of time as that in FIG. 9M(a).
Figure 9M:
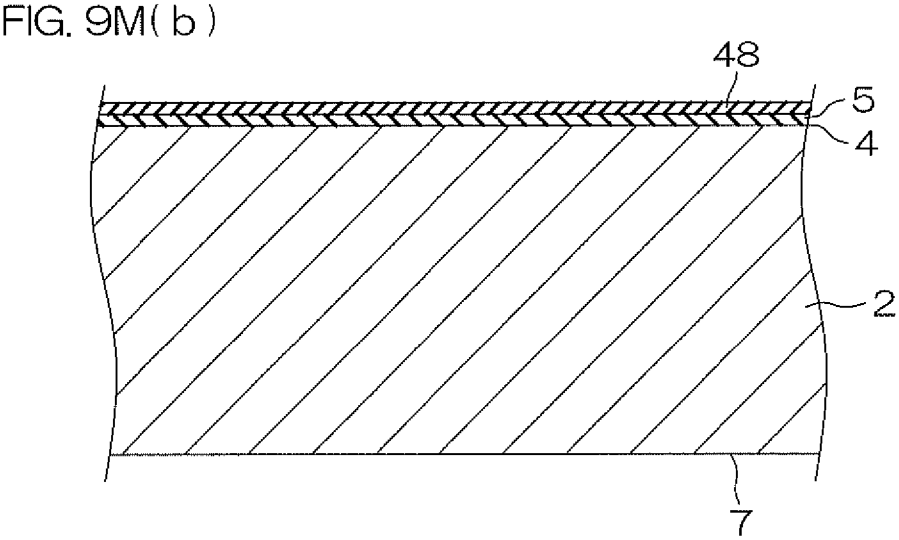
Figure 9N:
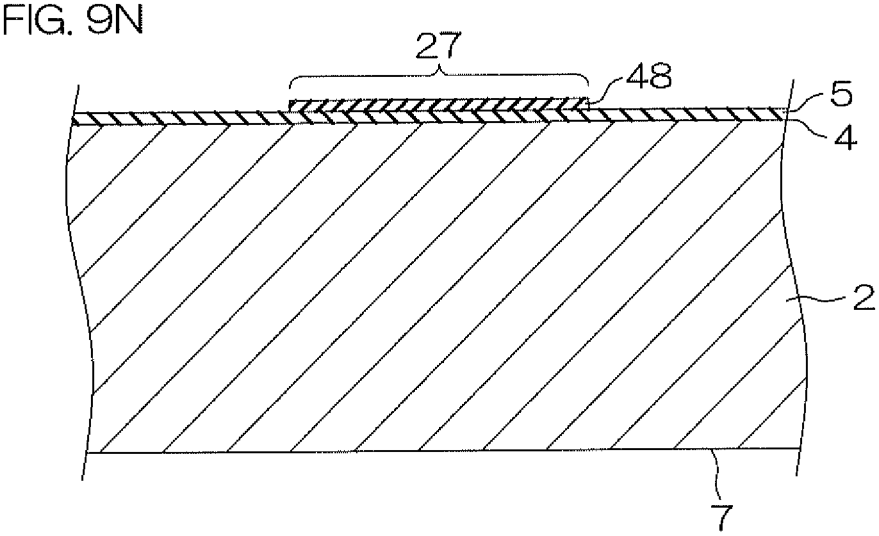
FIG. 9N is a schematic sectional view showing a step subsequent to that in FIG. 9M(b).
Figure 90A:
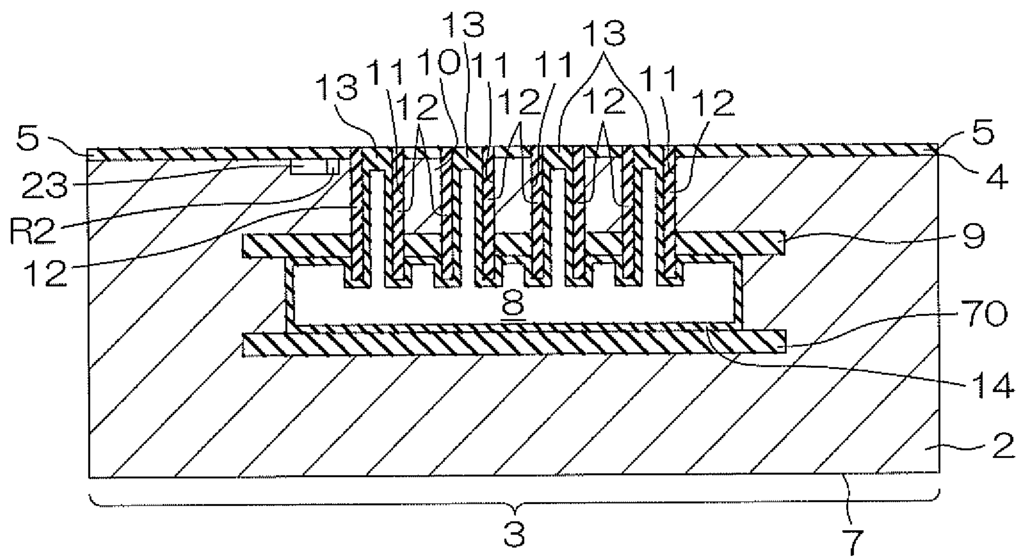
Figure 90B:
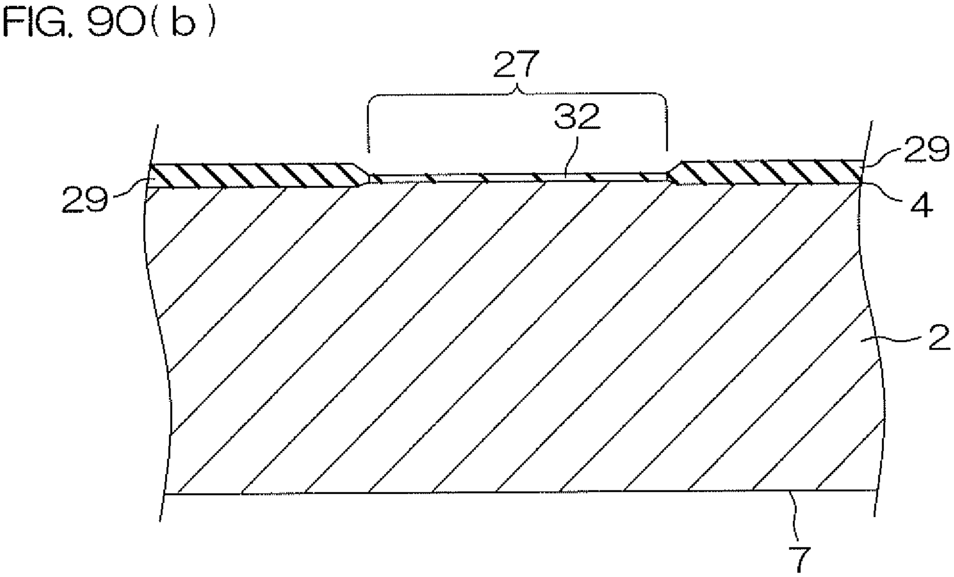
Figure 9P:
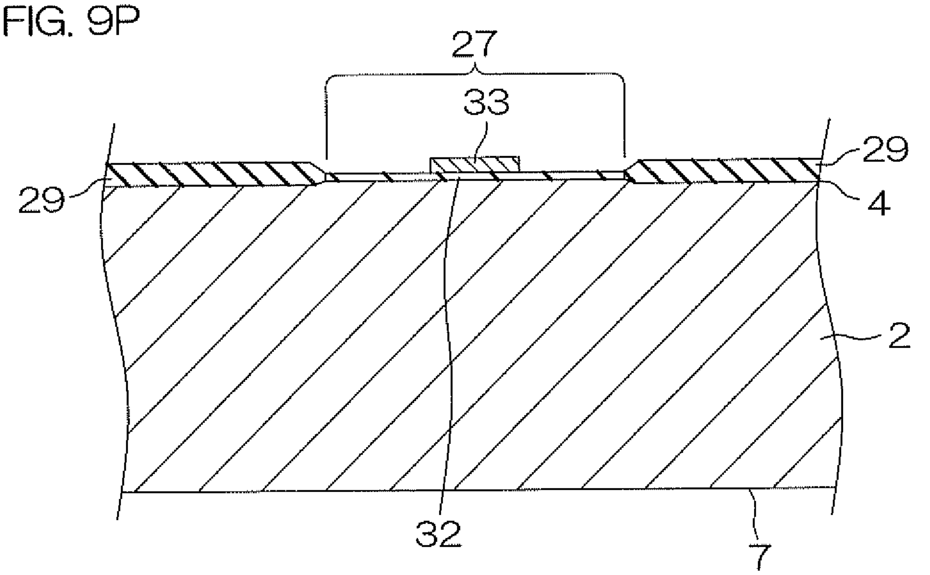
FIG. 9P is a schematic sectional view showing a step subsequent to that in FIG. 9O(b).
Figure 9Q:
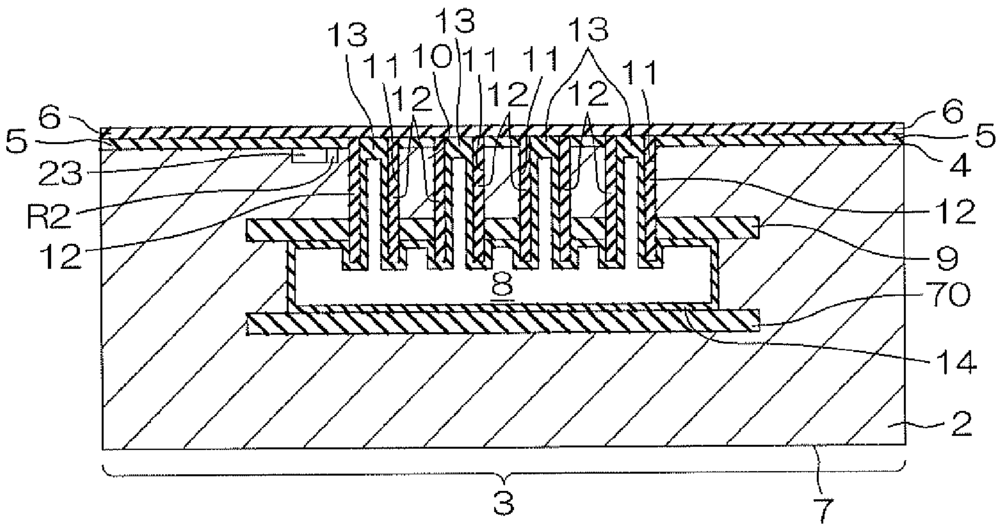
FIG. 9Q(a) is a schematic sectional view on the same position as that in FIG. 8(*b*) showing a step subsequent to that in FIG. 9P, and FIG. 9Q(b) shows a cutting plane on the same position as that in FIG. 9A(b) at the same point of time as that in FIG. 9Q(a).
Figure 9Q:
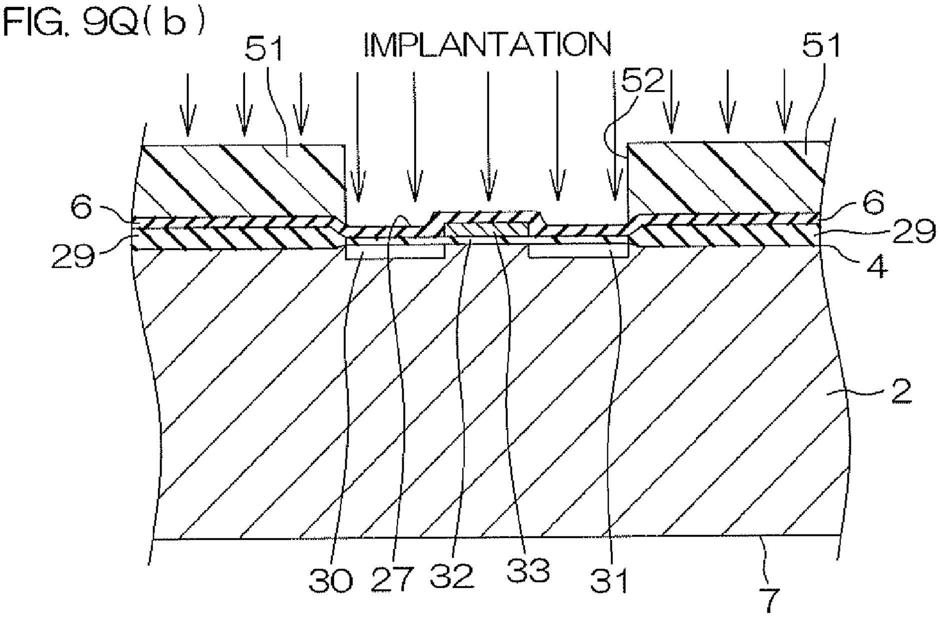

FIGS. 9A to 9Q show manufacturing steps for the pressure sensor shown in FIG. 8. In a case where two sectional views are shown in each of FIGS. 9A to 9Q, the upper sectional view shows a cutting plane on the same position as that in FIG. 8(*b*), and the lower sectional view shows a cutting plane on the same position as that in FIG. 3(*b*).

In order to manufacture the pressure sensor 1 according to the third embodiment, a silicon substrate 2 is prepared as shown in FIG. 9A, and an oxide film 40 is formed on a surface 4 of the silicon substrate 2, as described with reference to FIG. 5A.

Then, referring to FIG. 9B, impurity ions (oxygen ions or nitrogen ions) are implanted into a surface layer portion of the silicon substrate 2 by employing a resist pattern 41 as a mask, as described with reference to FIG. 5B.

Then, referring to FIG. 9C, epitaxial growth is performed, as described with reference to FIG. 5C. At this time, the second etching stop layer 70 is formed on a position of a prescribed depth from the surface 4 of the silicon substrate 2. The position where the second etching stop layer 70 is formed is a position of such a depth (a depth of 10 to 17 μm from the surface 4, for example) that a bottom surface of the reference pressure chamber 8 is planned to be formed in the silicon substrate 2 (see FIG. 8(*b*)).

Then, referring to FIG. 9D, impurity ions (oxygen ions or nitrogen ions) are implanted into the surface layer portion (a portion on a side closer to the surface 4 than the second etching stop layer 70) of the silicon substrate 2 again by employing a newly provided resist pattern 41 as a mask.

Then, referring to FIG. 9E, epitaxial growth is performed again. At this time, the first etching stop layer 9 is formed in the silicon substrate 2 on a position, on a side closer to the surface 4 than the second etching stop layer 70, at a prescribed depth (0.5 to 1 μm, for example) from the surface 4.

In a case where acceleration voltage for the implantation has been high, only drive-in may be performed in place of the epitaxial growth, as described above. If only the drive-in is performed in each of the case of forming the first etching stop layer 9 and the case of forming the second etching stop layer 70, however, the acceleration voltage for the implantation for forming the second etching stop layer 70 must be set higher than the acceleration voltage for the implantation for forming the first etching stop layer 9. Then, the respective etching stop layers are so formed in the silicon substrate 2 that the second etching stop layer 70 is located on a position deeper than the first etching stop layer 9.

Subsequent steps are identical to the steps of the first embodiment subsequent to that in FIG. 5D.

In other words, referring to FIG. 9F, piezoresistors R1 to R4 and relay wires 23 are first formed on the surface layer portion of the silicon substrate 2, as described with reference to FIG. 5D. At a point of time when the formation of the piezoresistors R1 to R4 and the relay wires 23 is completed, the oxide film 43 (also including the aforementioned mask 44) has been removed. The step of forming the piezoresistors R1 to R4 and the relay wires 23 may not be carried out immediately after the formation of the etching stop layers 9 and 70, but may be executed at another proper timing in subsequent steps.

Then, a covering layer 5 is formed on the surface 4 of the silicon substrate 2 by CVD, and the covering layer 5 is thereafter selectively removed by plasma etching employing a resist pattern 45 formed on the covering layer 5 by photolithography as a mask, as shown in FIG. 9G, as described with reference to FIG. 5E. A state upon termination of the plasma etching is shown in FIG. 9G.

Then, the silicon substrate 2 is dug down by anisotropic deep RIE employing the resist pattern 45 as a mask as described with reference to FIG. 5F, and through-holes 11 passing through the etching stop layer 9 are formed, while the remaining portions of the resist pattern 45 are peeled off, as shown in FIG. 9H(a). A bottom surface of each through-hole 11 is present on a position of a depth between the first etching stop layer 9 and the second etching stop layer 70.

Then, protective thin films 12 are formed on circumferential surfaces and the bottom surfaces of the trough-holes 11 and a surface of the covering layer 5 by thermal oxidation or CVD as shown in FIG. 9I(a), as described with reference to FIG. 5G.

Then, portions of the protective thin films 12 on the bottom surfaces of the through-holes 11 and the surface of the covering layer 5 are removed by RIE as shown in FIG. 9J(a), as described with reference to FIG. 5H.

Then, the reference pressure chamber 8 is formed in the silicon substrate 2 between the first etching stop layer 9 and the second etching stop layer 70 and around the bottom of each through-hole 11 by isotropic etching as shown in FIG. 9K(a), as described with reference to FIG. 5I. At the same time, a diaphragm 10 is formed on the first etching stop layer 9. While a substrate material on a side closer to the surface 4 than the first etching stop layer 9 is not etched due to the presence of the first etching stop layer 9, a substrate material on a side closer to a back surface 7 than the second etching stop layer 70 is not etched either due to the presence of the second etching stop layer 70.

Then, fillers 13 are arranged in the respective through-holes 11 and the whole areas of inner wall surfaces of the reference pressure chamber 8 are covered with a covering film 14 as shown in FIG. 9L(a), as described with reference to FIG. 5J.

Then, a step of forming an integrated circuit portion 28 (see FIG. 3(*b*)) on an integrated circuit region 27 is executed.

First, a nitride film 48 is formed on the surface of the covering layer 5 of the silicon substrate 2 as shown in FIG. 9M, as described with reference to FIG. 5K.

Then, the nitride film 48 remains only on a portion planned to become the integrated circuit region 27 by plasma etching through a mask (not shown) of a prescribed pattern as shown in FIG. 9N, as described with reference to FIG. 5L.

Then, a LOCOS layer 29 is formed and a gate oxide film 32 is thereafter formed as shown in FIG. 9O(*b*), as described with reference to FIG. 5M.

Then, a gate electrode 33 is formed on the gate oxide film 32 as shown in FIG. 9P, as described with reference to FIG. 5N.

Then, a source 30 and a drain 31 are formed on the surface layer portion of the silicon substrate 2 on the integrated circuit region 27 as shown in FIG. 9Q(b), as described with reference to FIG. 5O.

Thereafter an insulating layer 6 is formed, and metal terminals 15 to 18 and metal wires 19 to 22 (see FIG. 8(*a*)) are simultaneously formed as shown in FIG. 8, as described with reference to FIG. 3. At the same time, metal wires (the aforementioned source-side metal wire 35, a drain-side metal wire 36 etc., see FIG. 3(*b*)) and metal terminals (not shown) linked with the respective ones of the source 30, the drain 31 and the gate electrode 33 of the integrated circuit portion 28 are also formed. Further, a passivation film 25 is formed on the insulating layer 6, and openings 26 exposing the metal terminals 14 to 18 (also including unshown metal terminals on the side of the integrated circuit portion 28) as pads respectively and an opening 56 are formed in the passivation film 25 (see FIG. 8(*b*)).

Thus, the pressure sensor 1 according to the third embodiment is obtained.

According to the third embodiment, the following effect can be attained, in addition to the effects described with reference to the first embodiment:

In other words, the reference pressure chamber 8 is partitioned by the first etching stop layer 9 and the second etching stop layer 70 and formed in the thickness direction of the silicon substrate 2 in the etching steps (FIGS. 9I to 9K), whereby the reference pressure chamber 8 can be precisely formed in a target depth dimension.

(4) Fourth Embodiment

While a fourth embodiment is now described, the same reference signs are assigned to portions of the fourth embodiment corresponding to the portions described with reference to the first to third embodiments, and description thereof is omitted. In relation to manufacturing steps for a pressure sensor 1 according to the fourth embodiment, detailed description is omitted as to those identical to the manufacturing steps described with reference to the first to third embodiments.

FIG. 10(*a*) is an enlarged plan view of the pressure sensor according to the fourth embodiment, and FIG. 10(*b*) is a sectional view along a cutting plane line D-D in FIG. 10(*a*).

The pressure sensor 1 according to the fourth embodiment is provided with the separation layer 60 of the second embodiment and the second etching stop layer 70 of the third embodiment as shown in FIG. 10, in addition to the structure (see FIG. 3(*a*)) of the first embodiment.

The separation layer 60 extends in a silicon substrate 2 up to a position deeper than the second etching stop layer 70. Therefore, the separation layer 60 is linked with a first etching stop layer 9 on an intermediate position in the vertical direction (the thickness direction of the silicon substrate 2) thereof, and also linked with the second etching stop layer 70 on a lower end portion thereof. The second etching stop layer 70 is linked with the separation layer 60 to cover the interior of the separation layer 60 from below.

Therefore, a diaphragm 10 is separated from other portions of the silicon substrate 2. A reference pressure chamber 8 is partitioned by the first etching stop layer 9 and the second etching stop layer 70 in the thickness direction of the silicon substrate 2, and further partitioned by the separation layer 60 in a direction orthogonal to the thickness direction.

Figure 11A:
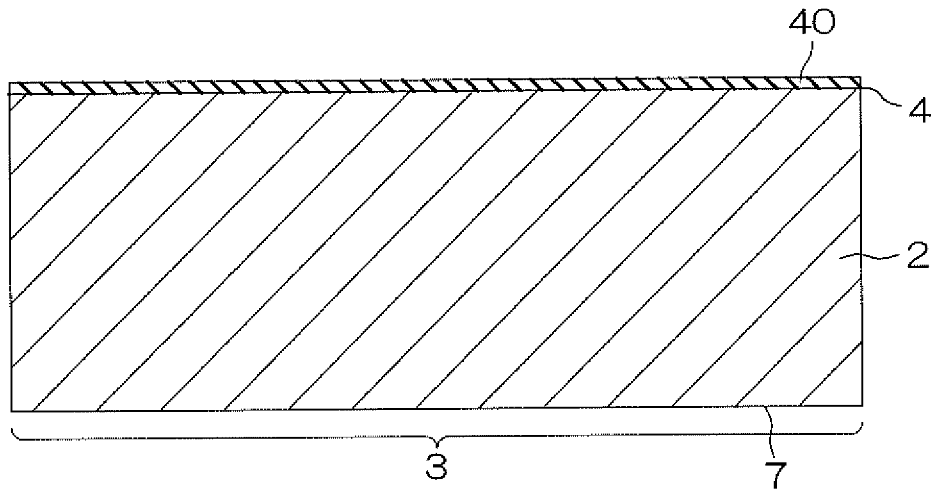
FIG. 11A(a) is a schematic sectional view showing a manufacturing step for the pressure sensor shown in FIG. 10 and shows a cutting plane on the same position as that in FIG. 10(*b*), while FIG. 11A(b) is a sectional view of a principal portion of the pressure sensor in an integrated circuit region of FIG. 10(*a*) at the same point of time as that in FIG. 11A(a).
Figure 11A:
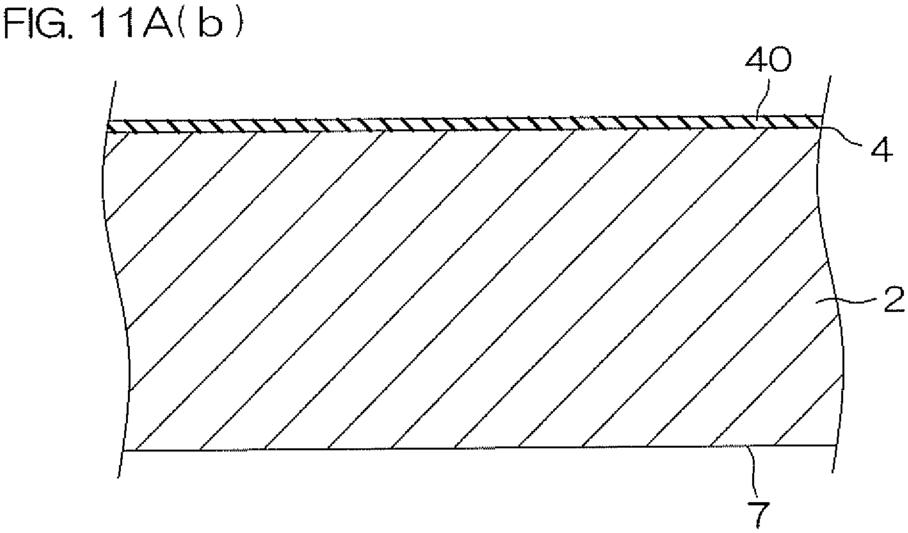
Figure 11B:
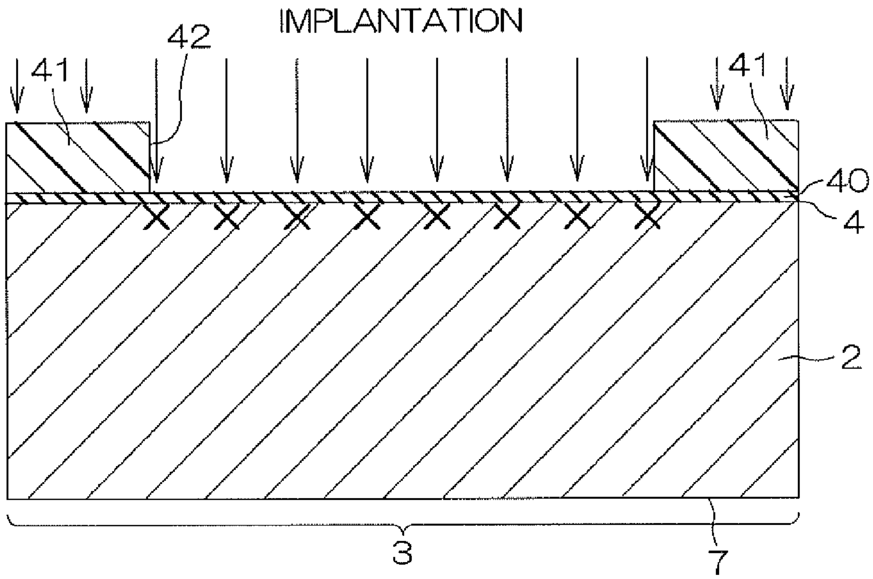
FIG. 11B(a) is a schematic sectional view showing a step subsequent to that in FIG. 11A(a), and FIG. 11B(b) is a plan view in the state of FIG. 11B(a).
Figure 11B:
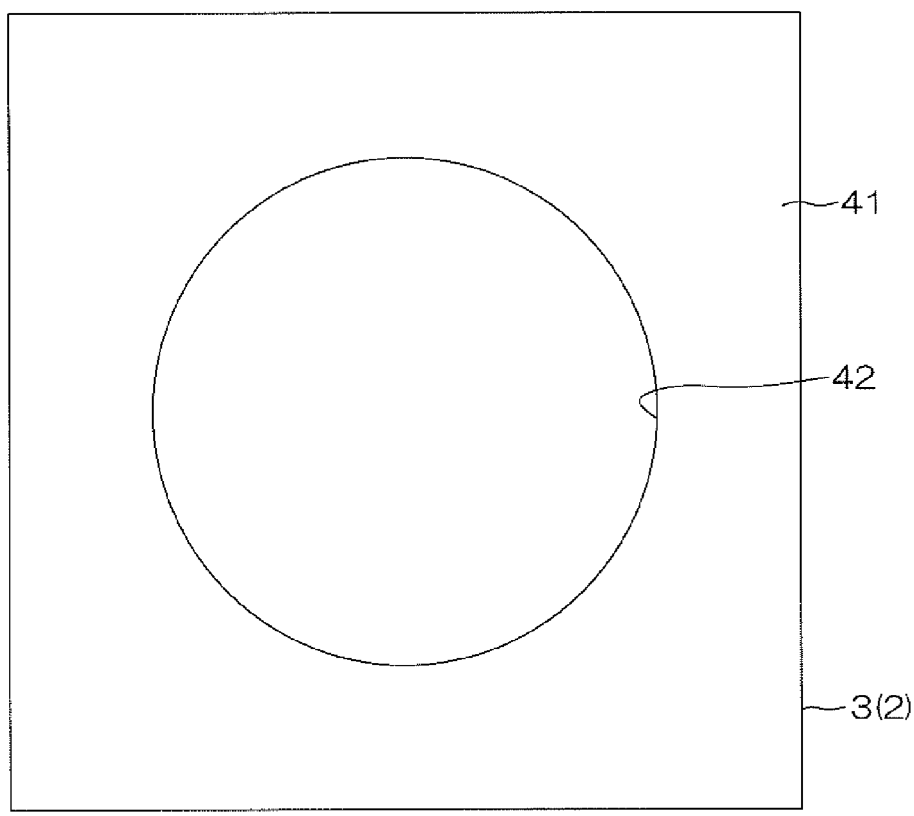
Figure 11C:
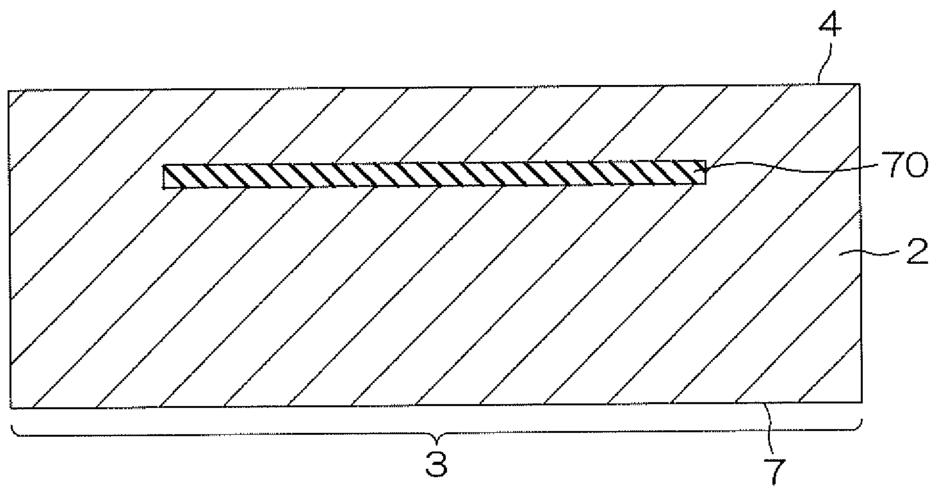
FIG. 11C(a) is a schematic sectional view showing a step subsequent to that in FIG. 11B(a), and FIG. 11C(b) shows a cutting plane on the same position as that in FIG. 11A(b) at the same point of time as that in FIG. 11C(a).
Figure 11C:
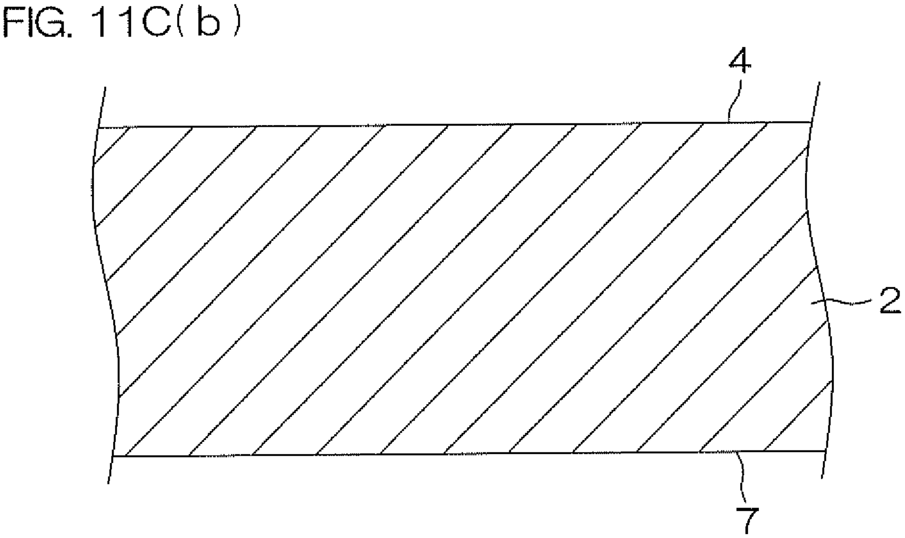
Figure 11D:
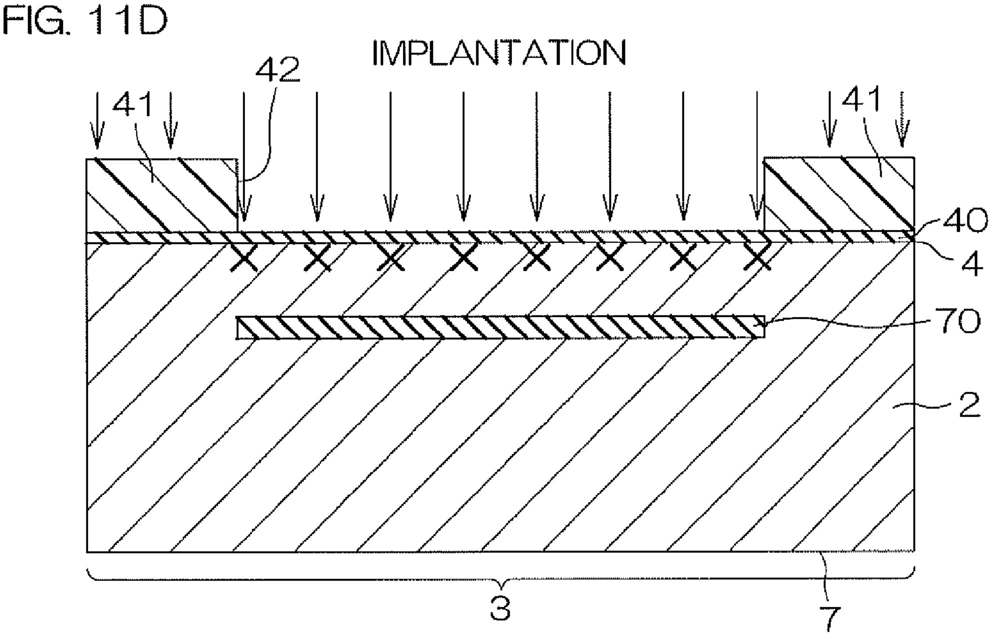
FIG. 11D is a schematic sectional view showing a step subsequent to that in FIG. 11C(a).
Figure 11E:
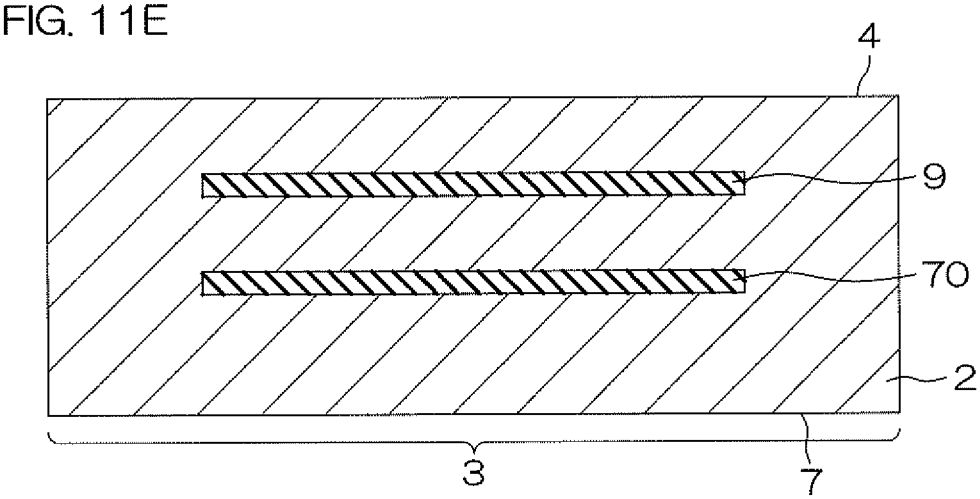
FIG. 11E is a schematic sectional view showing a step subsequent to that in FIG. 11D.
Figure 11F:
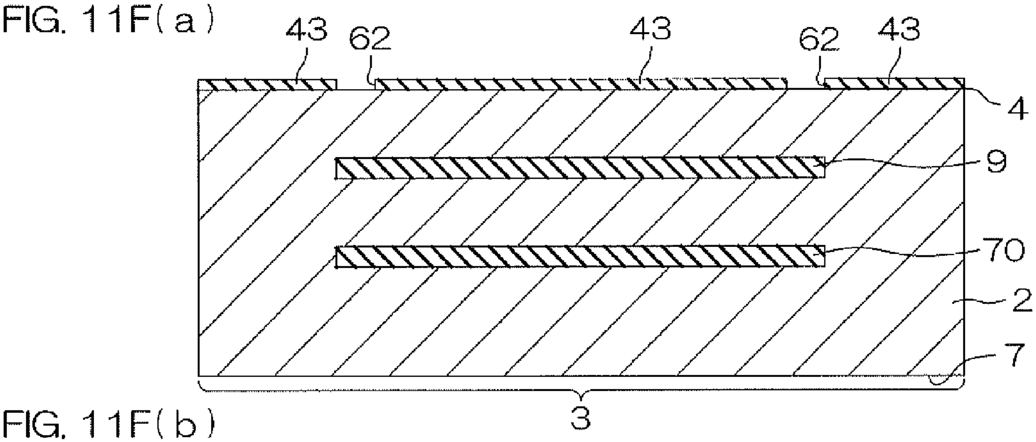
FIG. 11F(a) is a schematic sectional view showing a step subsequent to that in FIG. 11E, FIG. 11F(b) is a plan view in the state of FIG. 11F(a), and FIG. 11F(c) shows a cutting plane on the same position as that in FIG. 11A(b) at the same point of time as that in FIG. 11F(a).
Figure 11F:
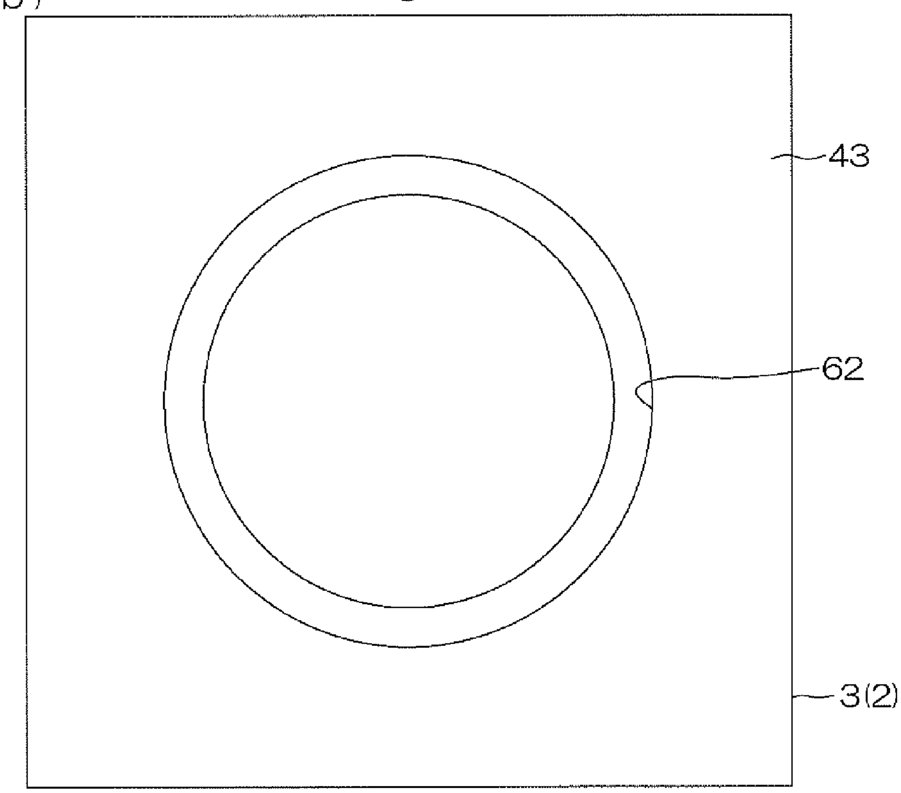
Figure 11F:
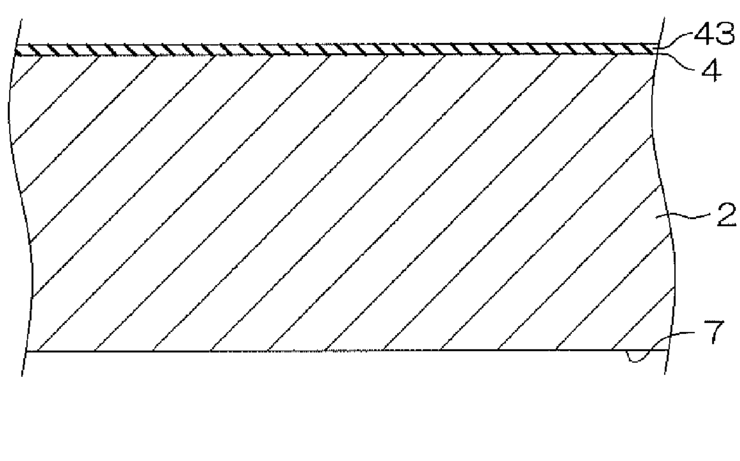
Figure 11G:
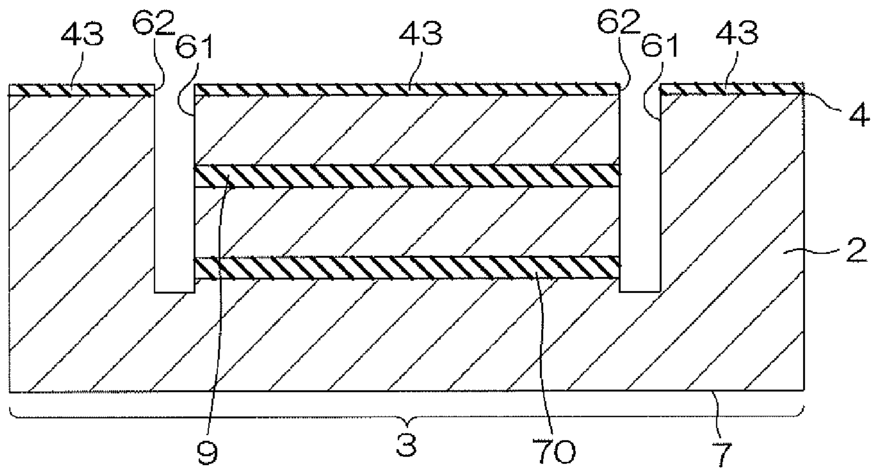
FIG. 11G(a) is a schematic sectional view showing a step subsequent to that in FIG. 11F(a), and FIG. 11G(b) is a plan view in the state of FIG. 11G(a).
Figure 11G:
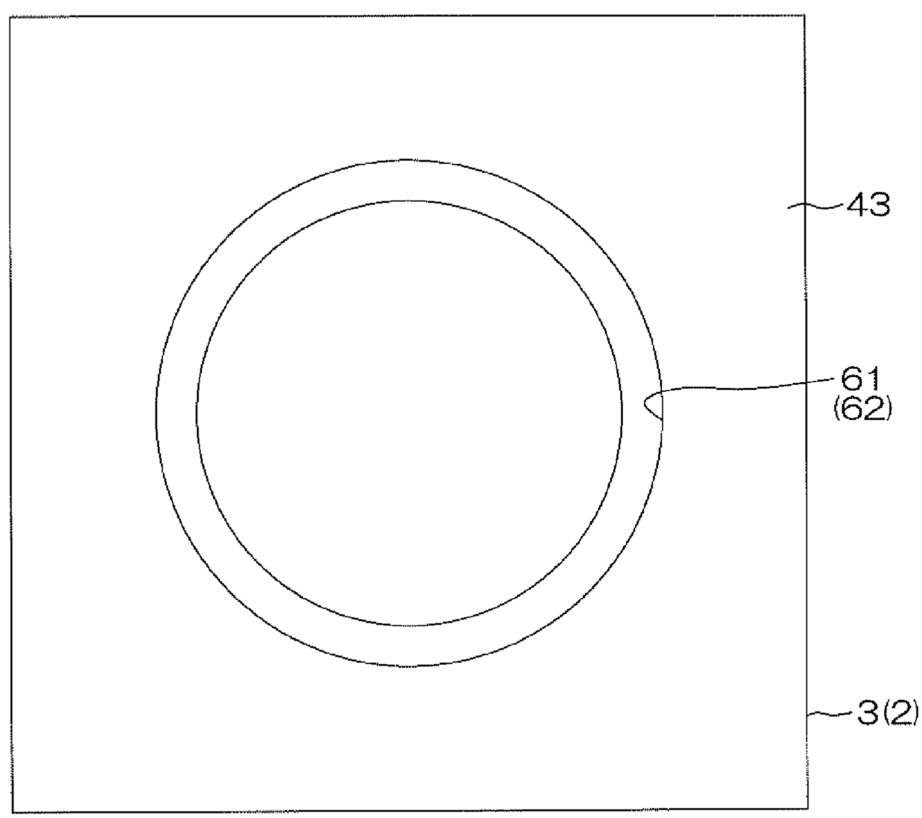
Figure 11H:
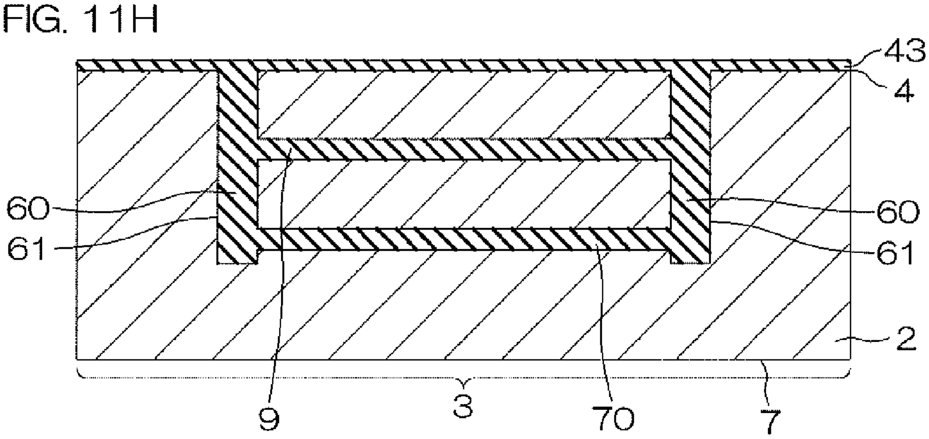
FIG. 11H is a schematic sectional view showing a step subsequent to that in FIG. 11G(a).
Figure 11:
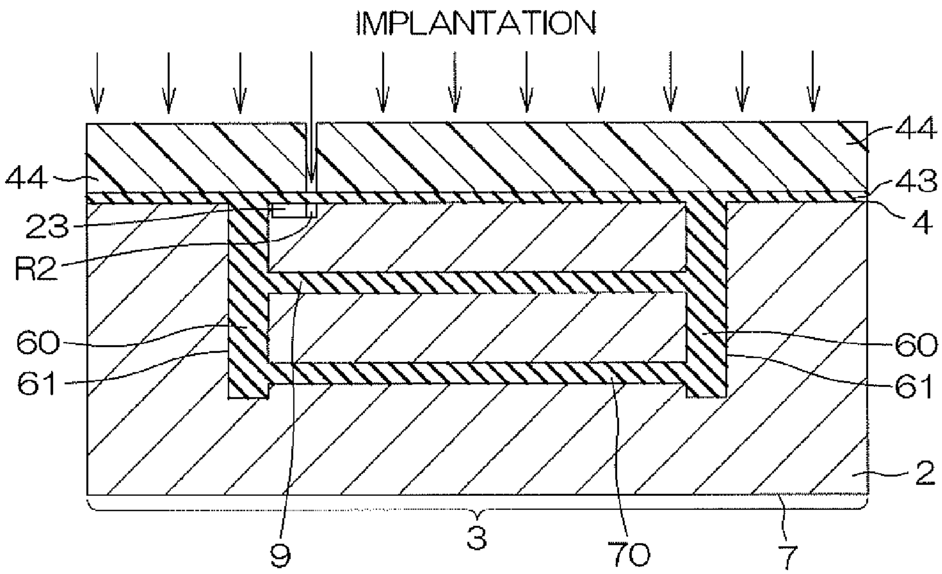
FIG. 11I(a) is a schematic sectional view showing a step subsequent to that in FIG. 11H, and FIG. 11I(b) is a plan view in the state of FIG. 11I(a).
FIG. 11J(a) is a schematic sectional view showing a step subsequent to that in FIG. 11I(a), and FIG. 11J(b) is a plan view in the state of FIG. 11J(a).
FIG. 11K(a) is a schematic sectional view showing a step subsequent to that in FIG. 11J(a), and FIG. 11K(b) shows a cutting plane on the same position as that in FIG. 11A(b) at the same point of time as that in FIG. 11K(a).
FIG. 11L(a) is a schematic sectional view showing a step subsequent to that in FIG. 11K(a), and FIG. 11L(b) shows a cutting plane on the same position as that in FIG. 11A(b) at the same point of time as that in FIG. 11L(a).
FIG. 11M(a) is a schematic sectional view showing a step subsequent to that in FIG. 11L(a), and FIG. 11M(b) shows a cutting plane line on the same position as that in FIG. 11A(b) at the same point of time as that in FIG. 11M(a).
FIG. 11N(a) is a schematic sectional view showing a step subsequent to that in FIG. 11M(a), and FIG. 11N(b) shows a cutting plane on the same position as that in FIG. 11A(b) at the same point of time as that in FIG. 11N(a).
FIG. 11O(a) is a schematic sectional view showing a step subsequent to that in FIG. 11N(a), and FIG. 11O(b) shows a cutting plane on the same position as that in FIG. 11A(b) at the same point of time as that in FIG. 11O(a).
FIG. 11P(a) is a schematic sectional view showing a step subsequent to that in FIG. 11O(a), and FIG. 11P(b) shows a cutting plane on the same position as that in FIG. 11A(b) at the same point of time as that in FIG. 11P(a).
FIG. 11Q is a schematic sectional view showing a step subsequent to that in FIG. 11P(b).
FIG. 11R(a) is a schematic sectional view on the same position as that in FIG. 10(*b*) showing a step subsequent to that in FIG. 11Q, and FIG. 11R(b) shows a cutting plane on the same position as that in FIG. 11A(b) at the same point of time as that in FIG. 11R(a).
FIG. 11S is a schematic sectional view showing a step subsequent to that in FIG. 11R(b).
FIG. 11T(a) is a schematic sectional view on the same position as that in FIG. 10(*b*) showing a step subsequent to that in FIG. 11S, and FIG. 11T(b) shows a cutting plane on the same position as that in FIG. 11A(b) at the same point of time as that in FIG. 11T(a).
Figure 11:
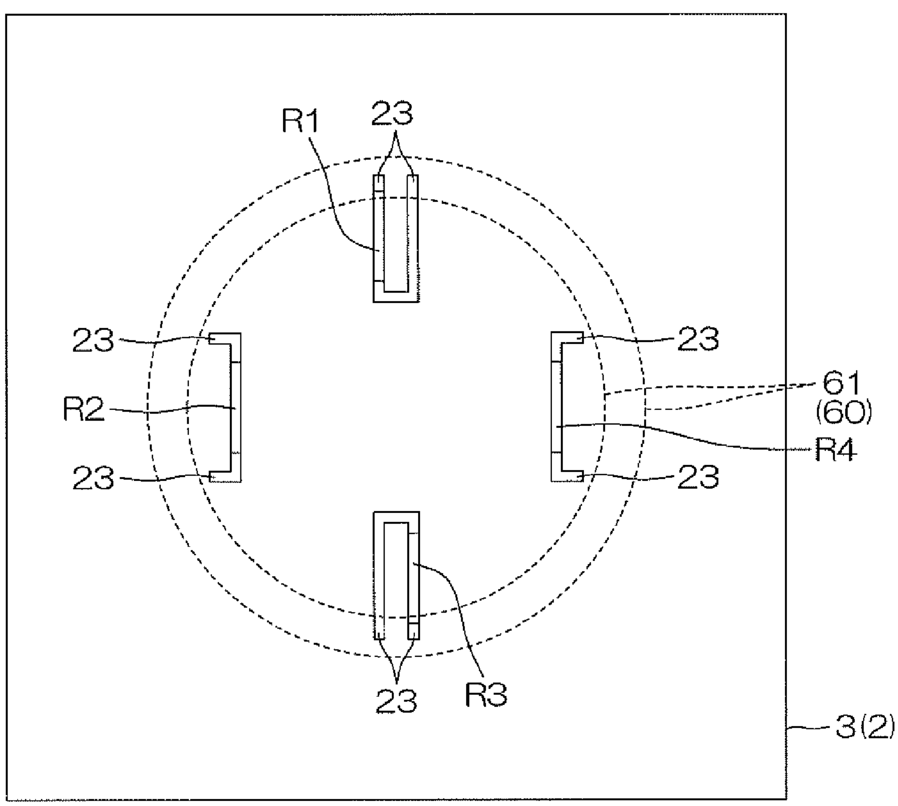
Figure 11J:
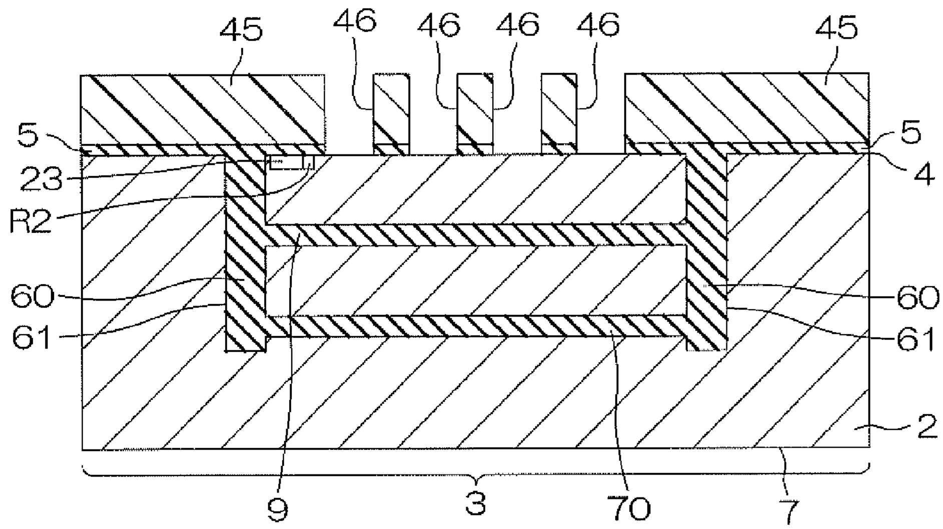
Figure 11J:
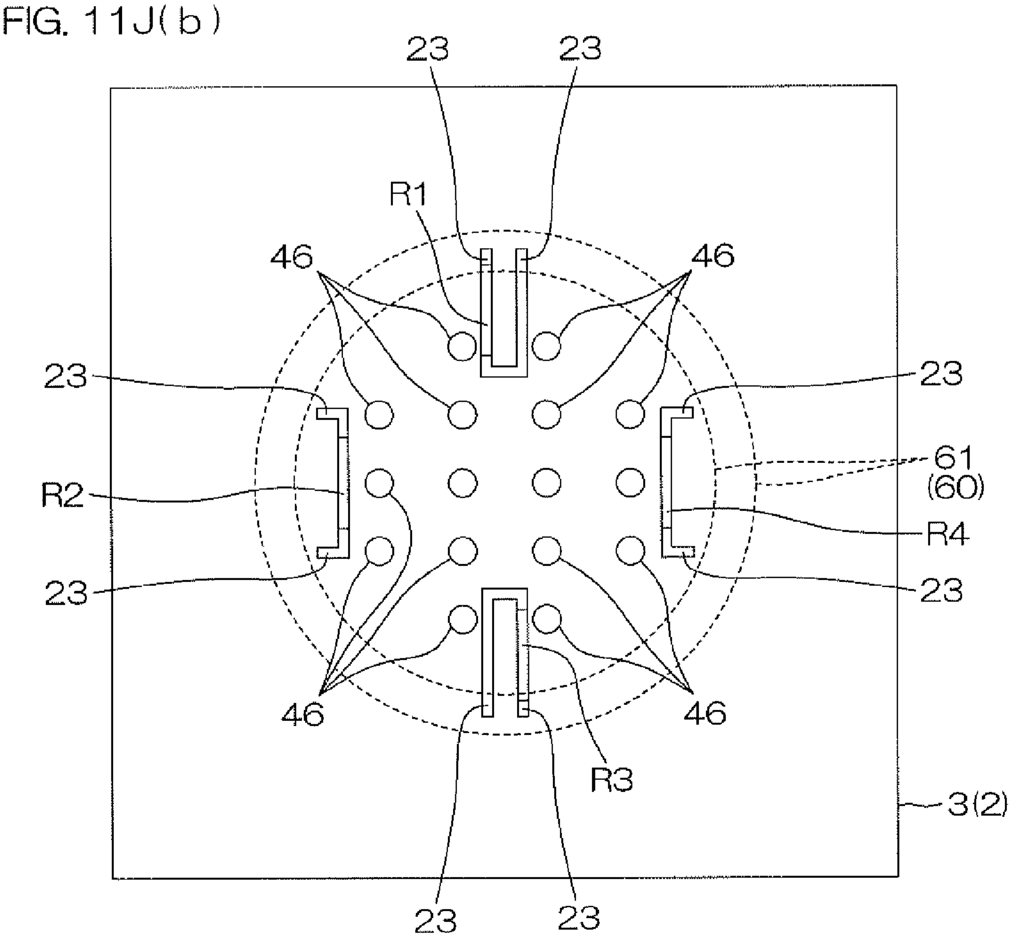
Figure 11K:
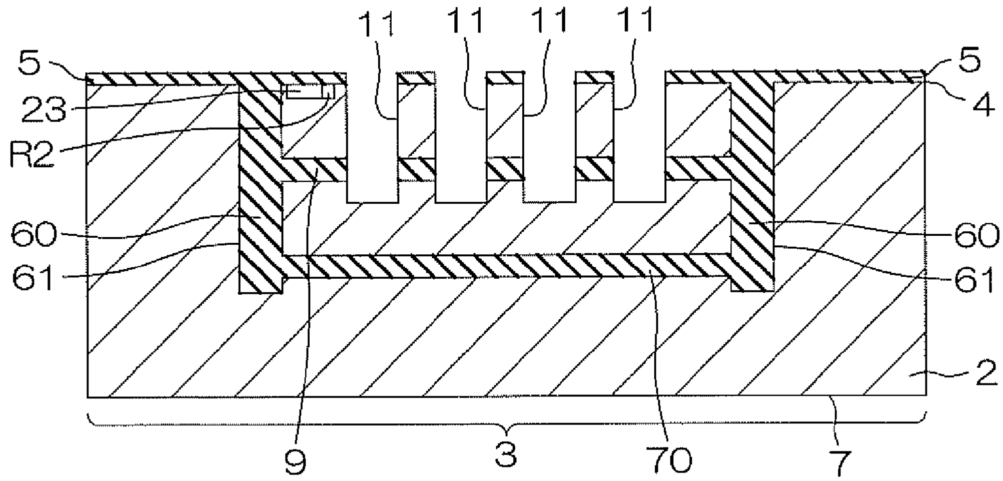
Figure 11K:
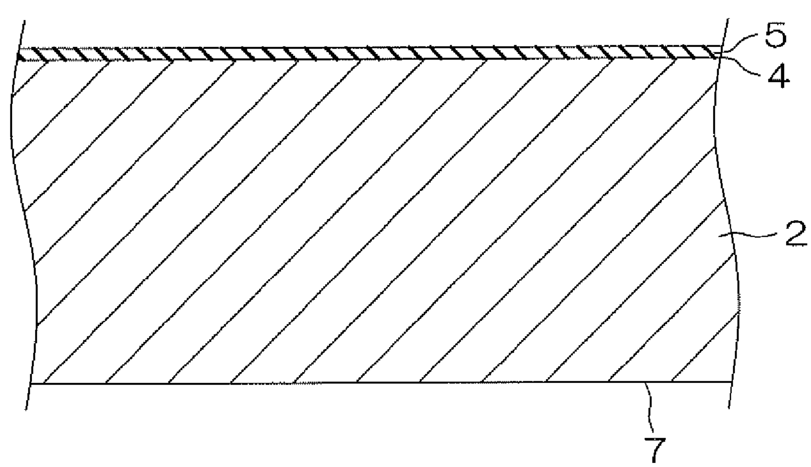
Figure 11L:
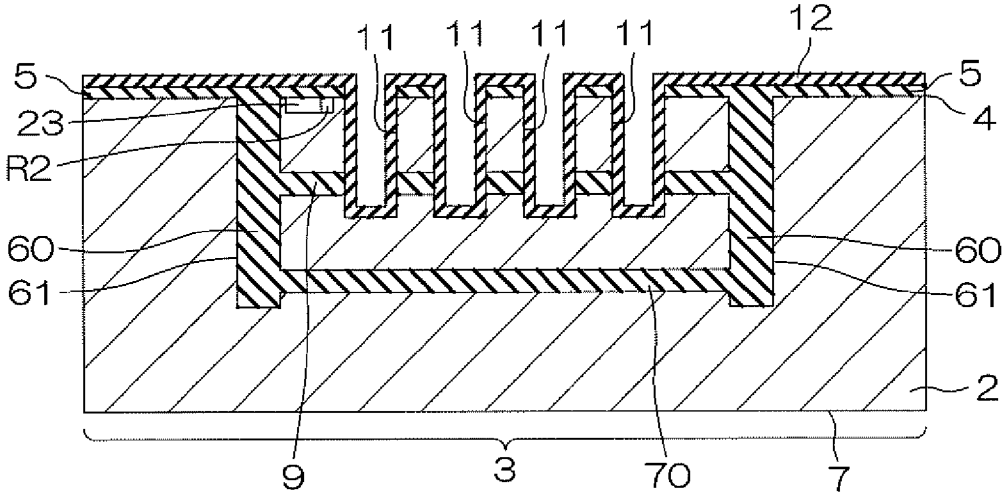
Figure 11L:
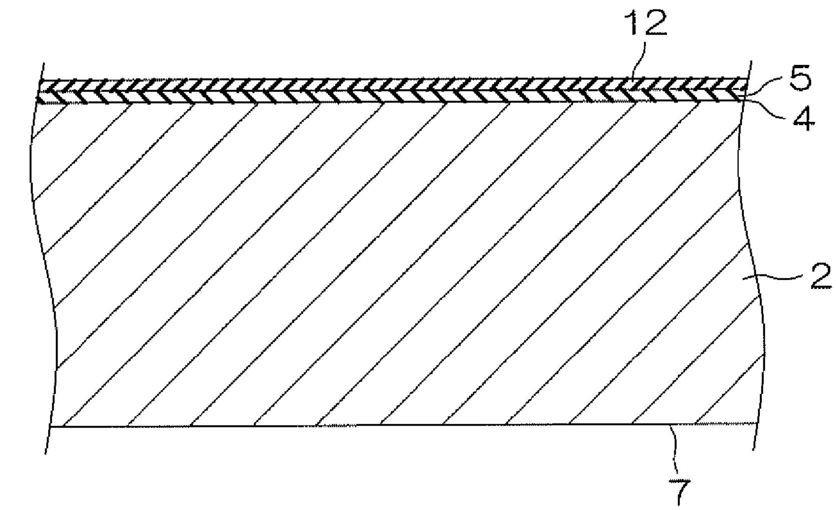
Figure 11N:
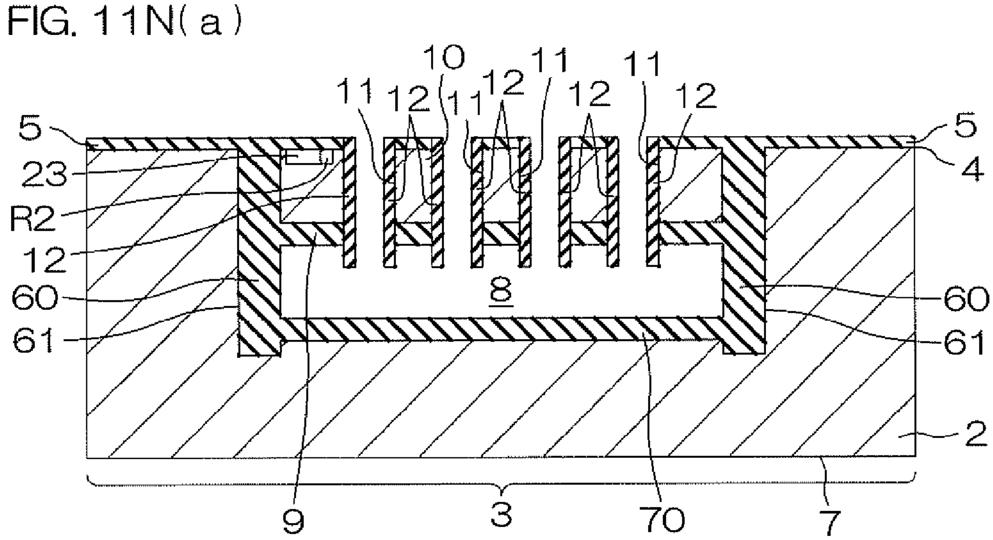
Figure 11N:
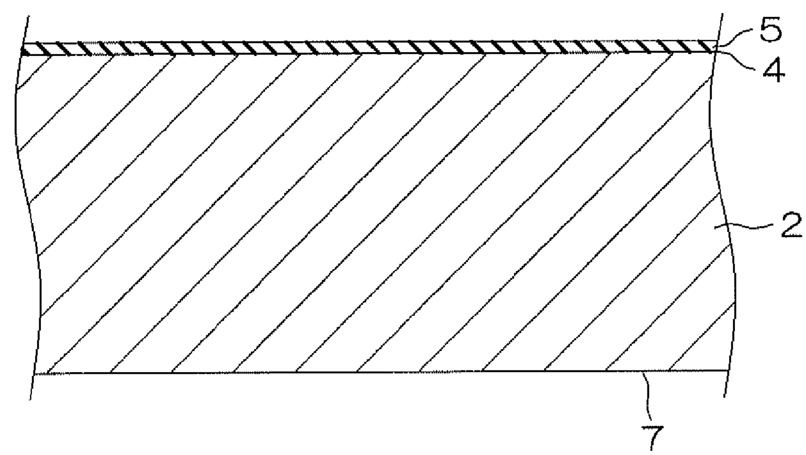
Figure 110A:
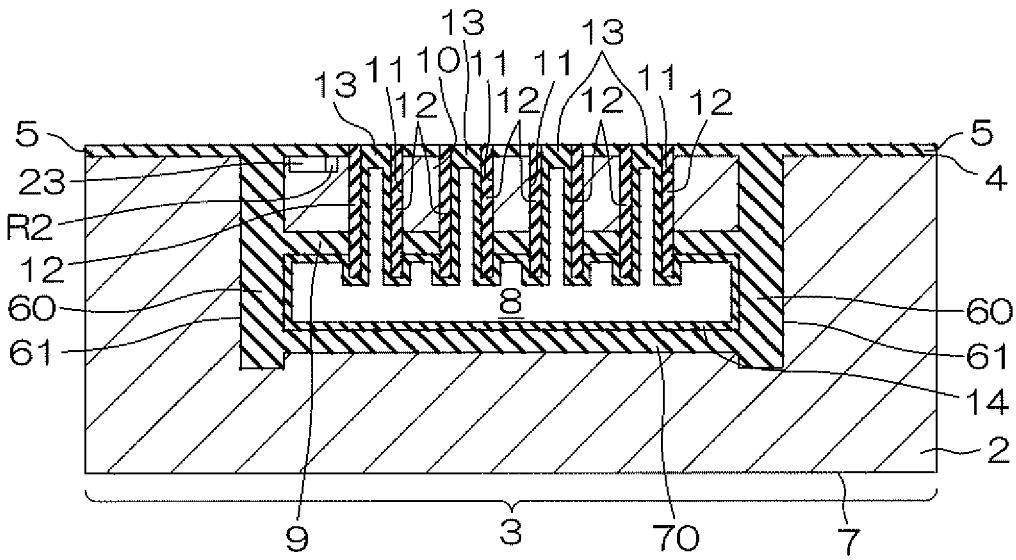
Figure 110B:
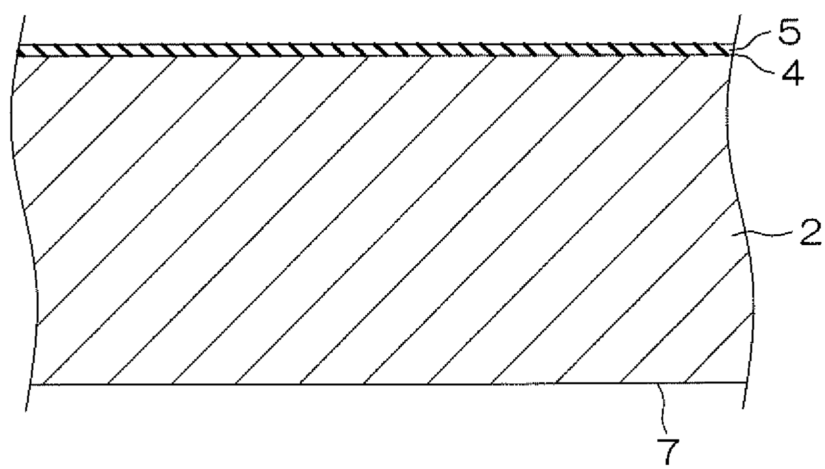
Figure 11P:
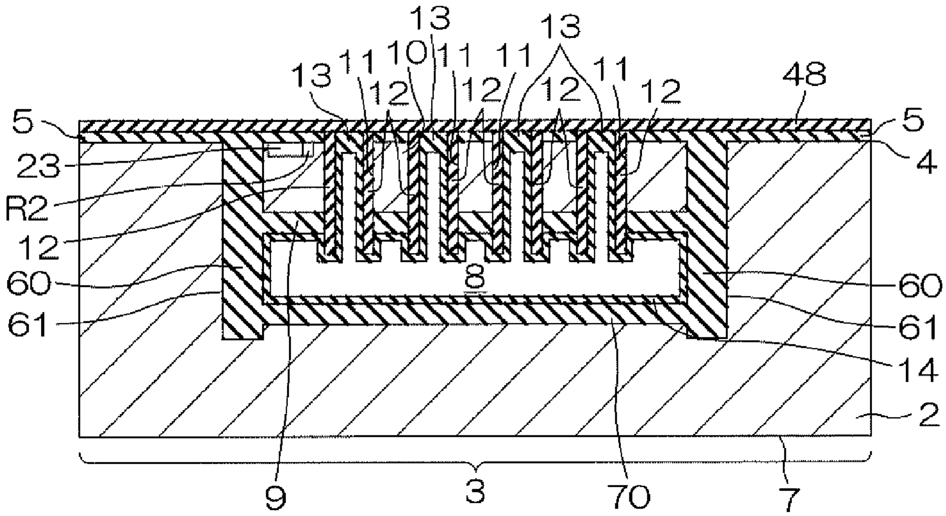
Figure 11P:
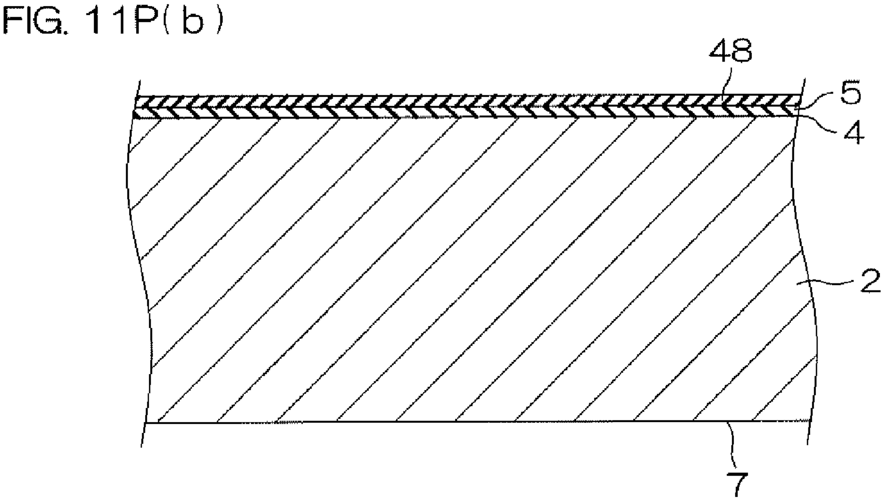
Figure 11Q:
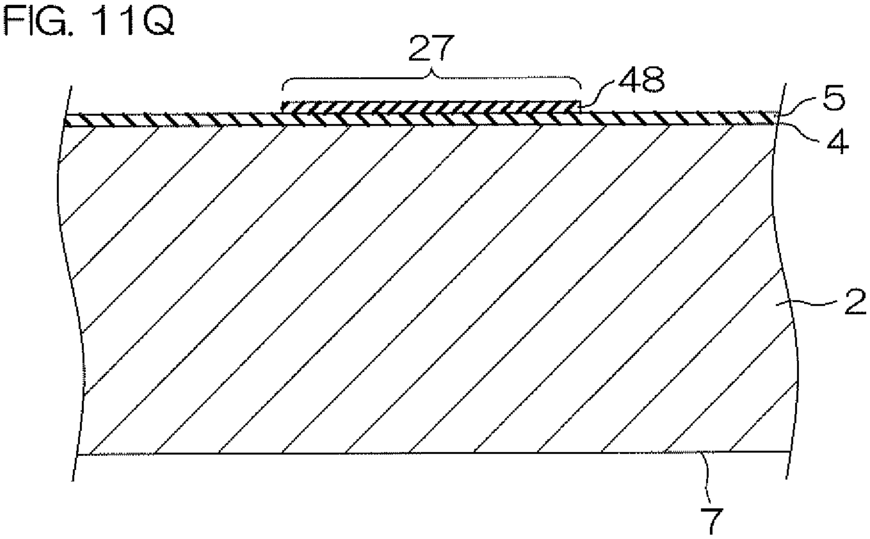
Figure 11R:
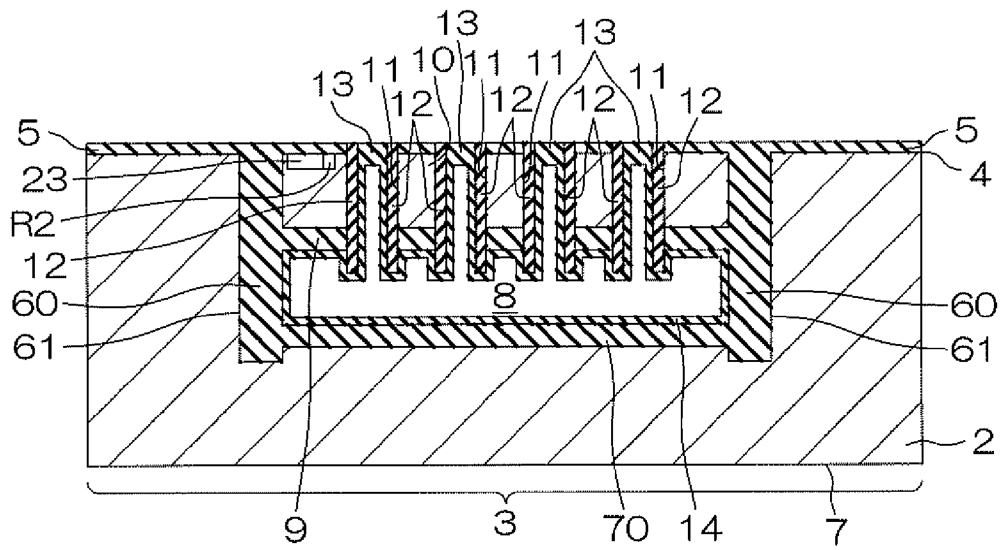
Figure 11R:
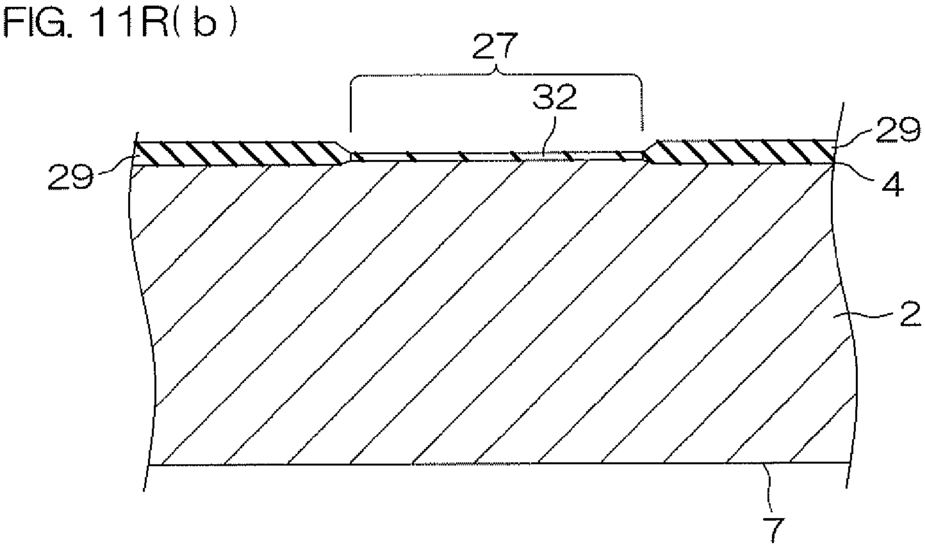
Figure 11S:
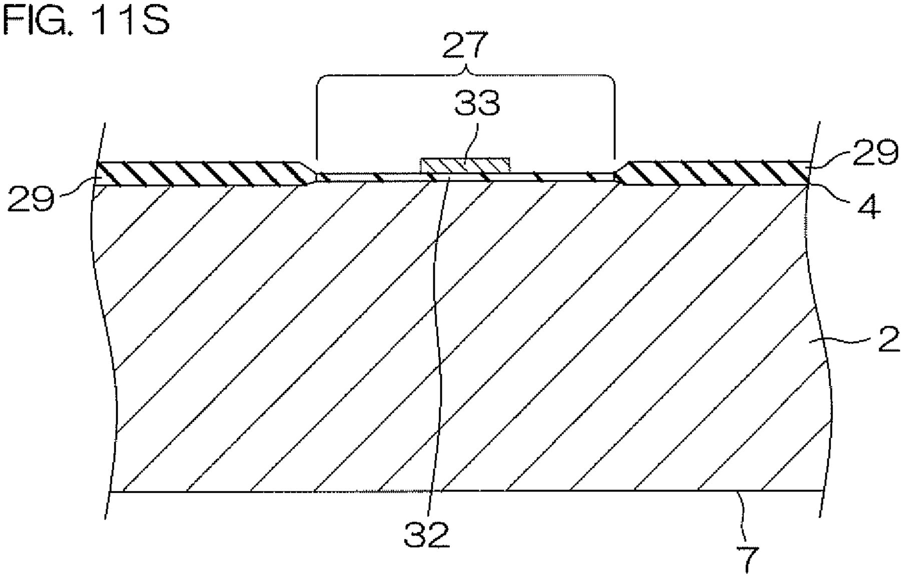
Figure 11T:
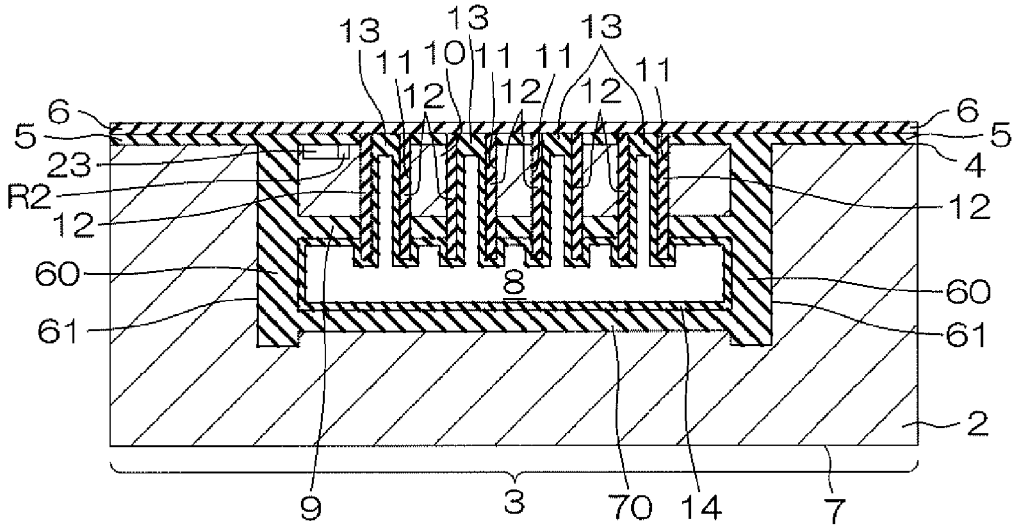
Figure 11T:
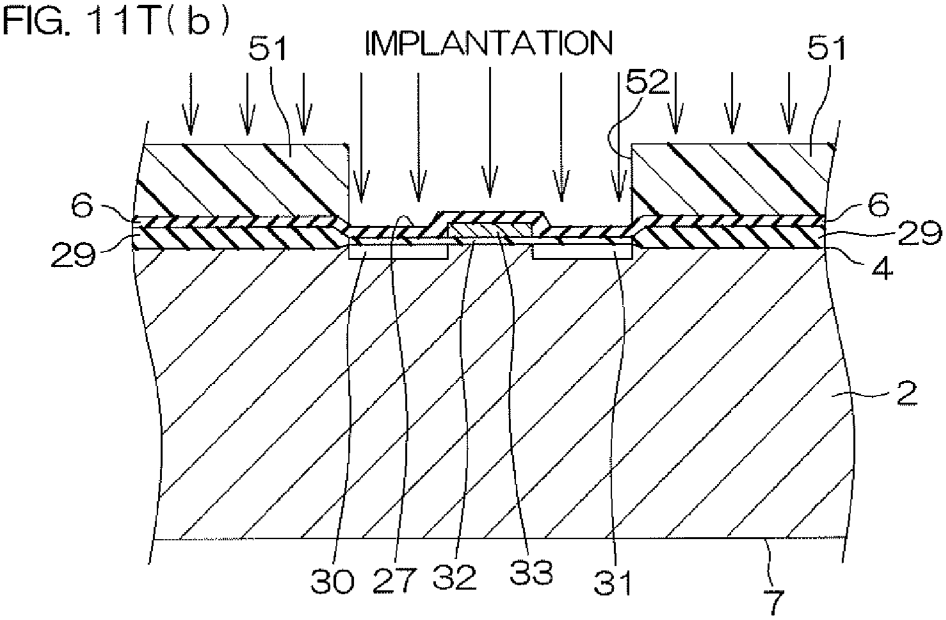

FIGS. 11A to 11T show manufacturing steps for the pressure sensor shown in FIG. 10. In a case where two sectional views are shown in each of FIGS. 11A to 11T, the upper sectional view shows a cutting plane on the same position as that in FIG. 10(*b*), and the lower sectional view shows a cutting plane on the same position as that in FIG. 3(*b*).

In order to manufacture the pressure sensor 1 according to the fourth embodiment, the silicon substrate 2 is prepared as shown in FIG. 11A, and an oxide film 40 is formed on a surface 4 of the silicon substrate 2, as described with reference to FIG. 9A.

Then, referring to FIG. 11B, impurity ions are implanted into a surface layer portion of the silicon substrate 2 by employing a resist pattern 41 as a mask, as described with reference to FIG. 9B.

Then, referring to FIG. 11C, the second etching stop layer 70 is formed on a position of a prescribed depth from the surface 4 of the silicon substrate 2, as described with reference to FIG. 9C.

Then, referring to FIG. 11D, impurity ions are implanted into the surface layer portion of the silicon substrate 2 again by employing a newly provided resist pattern 41 as a mask, as described with reference to FIG. 9D.

Then, referring to FIG. 11E, the first etching stop layer 9 is formed on a position, on a side closer to the surface 4 than the second etching stop layer 70, at a prescribed depth from the surface 4, as described with reference to FIG. 9E.

Then, referring to FIG. 11F, an oxide film 43 is formed on the surface 4 of the silicon substrate 2, and an unshown resist pattern is formed on the oxide film 43, as described with reference to FIG. 7D. The resist pattern has an annular opening corresponding to the separation layer 60 (see FIG. 10).

Then, the oxide film 43 is selectively removed by plasma etching employing the resist pattern (not shown) as a mask, and an annular opening 62 is formed in the oxide film 43. A state upon termination of the plasma etching is shown in FIG. 11F.

Then, the silicon substrate 2 is dug down by anisotropic deep RIE employing the oxide film 43 as a mask as described with reference to FIG. 7E, and an annular trench 61 is formed, as shown in FIG. 11G(a). The annular trench 61 is deeper than the second etching stop layer 70, and chips outer peripheral edge portions of the respective ones of the first etching stop layer 9 and the second etching stop layer 70 over the whole peripheries.

Then, the annular trench 61 is filled up with an oxide film, and the separation layer 60 is embedded in the annular trench 61 as shown in FIG. 11H(a), as described with reference to FIG. 7F. Further, a surface of the oxide film 43 is flattened by resist etchback, as described above.

Subsequent steps are identical to the steps of the first embodiment subsequent to that in FIG. 5D.

In other words, referring to FIG. 11I, piezoresistors R1 to R4 and relay wires 23 are first formed on the surface layer portion of the silicon substrate 2, as described with reference to FIG. 5D. At a point of time when the formation of the piezoresistors R1 to R4 and the relay wires 23 is completed, the oxide film 43 (also including the aforementioned mask 44) has been removed. The step of forming the piezoresistors R1 to R4 and the relay wires 23 may not be carried out immediately after the formation of the etching stop layers 9 and 70, but may be executed at another proper timing in subsequent steps.

Then, a covering layer 5 is formed on the surface 4 of the silicon substrate 2 by CVD, and the covering layer 5 is thereafter selectively removed by plasma etching employing a resist pattern 45 formed on the covering layer 5 by photolithography as a mask, as shown in FIG. 11J, as described with reference to FIG. 5E. A state upon termination of the plasma etching is shown in FIG. 11J.

Then, the silicon substrate 2 is dug down by anisotropic deep RIE employing the resist pattern 45 as a mask as described with reference to FIG. 5F, and through-holes 11 passing through the first etching stop layer 9 are formed while remaining portions of the resist pattern 45 are removed, as shown in FIG. 11K(a). A bottom surface of each through-hole 11 is present on a position of a depth between the first etching stop layer 9 and the second etching stop layer 70.

Then, protective thin films 12 are formed on circumferential surfaces and the bottom surfaces of the trough-holes 11 and the surface of the covering layer 5 by thermal oxidation or CVD as shown in FIG. 11L(a), as described with reference to FIG. 5G.

Then, portions of the protective thin films 12 on the bottom surfaces of the through-holes 11 and the surface of the covering layer 5 are removed by RIE as shown in FIG. 11M(a), as described with reference to FIG. 5H.

Then, the reference pressure chamber 8 is formed in the silicon substrate 2 between the first etching stop layer 9 and the second etching stop layer 70 and around the bottom of each through-hole 11 by isotropic etching as shown in FIG. 11N(a), as described with reference to FIG. 5I. At the same time, the diaphragm 10 is formed on the first etching stop layer 9. While a substrate material on a side closer to the surface 4 than the first etching stop layer 9 is not etched due to the presence of the first etching stop layer 9, a substrate material on a side closer to a back surface 7 than the second etching stop layer 70 is not etched either due to the presence of the second etching stop layer 70.

Then, fillers 13 are arranged in the respective through-holes 11 and the whole areas of inner wall surfaces of the reference pressure chamber 8 are covered with a covering film 14 as shown in FIG. 11O(a), as described with reference to FIG. 5J.

Then, a step of forming an integrated circuit portion 28 (see FIG. 3(*b*)) on an integrated circuit region 27 is executed.

First, a nitride film 48 is formed on the surface of the covering layer 5 of the silicon substrate 2 as shown in FIG. 11P, as described with reference to FIG. 5K.

Then, the nitride film 48 remains only on a portion planned to become the integrated circuit region 27 by plasma etching through a mask (not shown) of a prescribed pattern as shown in FIG. 11Q, as described with reference to FIG. 5L.

Then, a LOCOS layer 29 is formed and a gate oxide film 32 is thereafter formed as shown in FIG. 11R(b), as described with reference to FIG. 5M.

Then, a gate electrode 33 is formed on the gate oxide film 32 as shown in FIG. 11S, as described with reference to FIG. 5N.

Then, a source 30 and a drain 31 are formed on the surface layer portion of the silicon substrate 2 in the integrated circuit region 27 as shown in FIG. 11T(b), as described with reference to FIG. 5O.

Thereafter an insulating layer 6 is formed, and metal terminals 15 to 18 and metal wires 19 to 22 (see FIG. 10(*a*)) are simultaneously formed as shown in FIG. 10, as described with reference to FIG. 3. At the same time, metal wires (the aforementioned source-side metal wire 35, a drain-side metal wire 36 etc., see FIG. 3(*b*)) and metal terminals (not shown) linked with the respective ones of the source 30, the drain 31 and the gate electrode 33 of the integrated circuit portion 28 are also formed. Further, a passivation film 25 is formed on the insulating layer 6, and openings 26 exposing the metal terminals 14 to 18 (also including unshown metal terminals on the side of the integrated circuit portion 28) as pads respectively and an opening 56 are formed in the passivation film 25 (see FIG. 10(*b*)).

Thus, the pressure sensor 1 according to the fourth embodiment is obtained.

According to the fourth embodiment, the effects attained in the first to third embodiments can be achieved. In particular, the reference pressure chamber 8 can be formed in target dimensions in the respective ones of the thickness direction of the silicon substrate 2 and the direction orthogonal to the thickness direction.

(5) Fifth Embodiment

Figure 12:
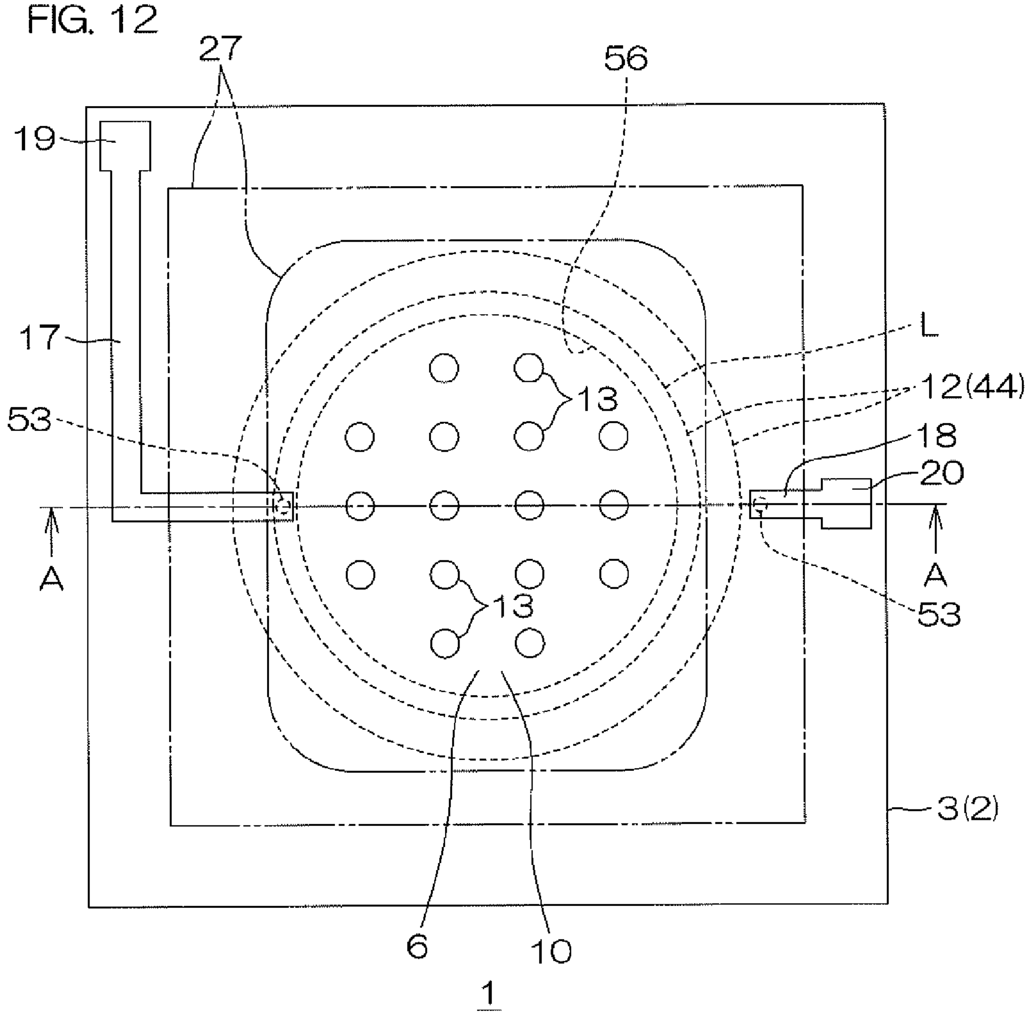
FIG. 12 is an enlarged plan view of a pressure sensor according to a fifth embodiment.

FIG. 12 is an enlarged plan view of a pressure sensor according to a fifth embodiment.

FIG. 13(*a*) is a sectional view along a cutting plane line A-A in FIG. 12 in the case of the pressure sensor according to the fifth embodiment, and FIG. 13(*b*) is a sectional view of a principal portion of the pressure sensor in an integrated circuit region of FIG. 12.

As shown in FIG. 13(*a*), each pressure sensor 1 includes a silicon substrate 2 having a magnitude corresponding to a rectangular region 3. A surface 4 of the silicon substrate 2 is covered with a covering layer 5. Further, an insulating layer 6 is formed on a surface of the covering layer 5. Each of the covering layer 5 and the insulating layer 6 is made of silicon oxide ($SiO_2$), for example. A back surface 7 of the silicon substrate 2 is an exposed surface.

A reference pressure chamber 8 is formed in the silicon substrate 2. According to this embodiment, the reference pressure chamber 8 is a flat cavity (a flat space) spreading parallelly to the surface 4 and the back surface 7 of the silicon substrate 2 and having a small height in the vertical direction (the thickness direction of the silicon substrate 2). In other words, the dimension of the reference pressure chamber 8 in the direction parallel to the surface 4 and the back surface 7 is larger than the dimension in the height direction. One reference pressure chamber 8 is formed in each pressure sensor 1. According to this embodiment, the reference pressure chamber 8 is provided in a circular shape (three-dimensionally in a cylindrical shape) in plan view. A first etching stop layer 9 forming an insulating layer, circular in plan view, partitioning the reference pressure chamber 8 from an upper side (the side of the surface 4) is formed in the silicon substrate 2. The diameter of the first etching stop layer 9 is generally identical to the diameter of the reference pressure chamber 8.

The reference pressure chamber 8 is formed in the silicon substrate 2, whereby a portion (also including the etching stop layer 9) opposed to the reference pressure chamber 8 is smaller in thickness than the remaining portion on the side of the surface 4 of the silicon substrate 2. Thus, the silicon substrate 2 has a diaphragm 10 circular in plan view on a side of the reference pressure chamber 8 closer to the surface 4. The diaphragm 10 is a thin film displaceable in the direction (the thickness direction of the silicon substrate 2) opposed to the reference pressure chamber 8. The diaphragm 10 is part of the silicon substrate 2, and formed on a surface layer portion of the silicon substrate 2 to partition the reference pressure chamber 8 from above. The first etching stop layer 9 is formed on a ceiling surface which is a surface of the diaphragm 10 opposed to the reference pressure chamber 8 in inner wall surfaces of the reference pressure chamber 8, and partially forms the diaphragm 10. In the inner wall surfaces of the reference pressure chamber 8, a bottom surface is opposed to the ceiling surface from below.

The diameter of the diaphragm 10 is generally identical to the diameter of the reference pressure chamber 8, and 200 to 600 μm in this embodiment. The thickness of the diaphragm 10 is 0.5 to 1 μm, for example. However, the thickness of the diaphragm 10 is exaggeratedly drawn in FIG. 13(*a*), in order to clearly show the structure. The diaphragm 10 is integrally supported by another portion (referred to as a remaining portion 11) of the silicon substrate 2. According to this embodiment, the diaphragm 10 is arranged generally at the center of the rectangular region 3 in plan view (see FIG. 12).

An isolation layer 12 surrounding the diaphragm 10 is formed on the silicon substrate 2.

The isolation layer 12 is an annular vertical wall partitioning the diaphragm 10 in plan view, and an inner peripheral edge of the isolation layer 12 and a contour L of the diaphragm 10 coincide with each other (see FIG. 12).

The isolation layer 12 extends in the silicon substrate 2 up to a position deeper than a bottom surface of the reference pressure chamber 8 continuously from the covering layer 5 on the surface 4 of the silicon substrate 2. The isolation layer 12 partitions the reference pressure chamber 8 and the diaphragm 10 in a direction orthogonal to the thickness direction of the silicon substrate 2.

The reference pressure chamber 8 is present under the diaphragm 10 in the thickness direction of the silicon substrate 2 and the isolation layer 12 is present on the outside of the diaphragm 10 in the direction orthogonal to the thickness direction, whereby the diaphragm 10 is isolated from another portion (the remaining portion 11) of the silicon substrate 2.

A large number of through-holes 13 circular in plan view are formed in the diaphragm 10 at prescribed regular intervals over the whole area inside the contour L of the diaphragm 10 (in other words, the inner peripheral edge of the isolation layer 12) (see FIG. 12). According to this embodiment, the plurality of through-holes 13 are regularly arrayed in the form of a matrix along two directions intersecting with each other in plan view. All through-holes 13 pass through a portion (also including the covering layer 5 and the first etching stop layer 9) of the silicon substrate 2 between the covering layer 5 on the surface 4 and the reference pressure chamber 8, and communicate with the reference pressure chamber 8. According to this embodiment, the diameter of each through-hole 13 is 0.5 μm, for example. According to this embodiment, further, the depth of each through-hole 13 is 2 to 7 μm, for example.

Inner wall surfaces of the through-holes 13 are covered with protective thin films 14 (sidewall insulating layers) made of silicon oxide ($SiO_2$). In all through-holes 13, oxide films made of silicon oxide ($SiO_2$) formed by CVD (Chemical Vapor Deposition) are charged and embedded inside the protective thin films 12. Thus, all through-holes 13 are filled up with fillers 15 (embedding materials) of the oxide films, and the reference pressure chamber 8 under the through-holes 13 is sealed as the reference pressure chamber whose internal pressure is regarded as reference at a time of pressure detection. According to this embodiment, the reference pressure chamber 8 is held in a vacuum or decompressed state ($10^{-5}$ Torr, for example). The oxide films charged into the through-holes 13 form the fillers 15 filling up the respective through-holes 13 on respective upper portions of the through-holes 13. These oxide films further form a covering film 16 continuous with lower portions of the fillers 15. The covering film 16 reaches the interior of the reference pressure chamber 8, and covers the whole areas of the inner wall surfaces of the reference pressure chamber 8.

In each pressure sensor 1, a first metal wire 17 (a first wire) is connected to the diaphragm 10, and a second metal wire 18 (a second wire) is connected to the remaining portion 11 of the silicon substrate 2 isolated from the diaphragm 10 by the isolation layer 12. The first metal wire 17 and the second metal wire 18 are made of aluminum (Al) in this embodiment, and provided on the insulating layer 6. The first metal wire 17 passes through the insulating layer 6 and the covering layer 5, and is connected to the diaphragm 10. The second metal wire 18 passes through the insulating layer 6 and the covering layer 5, and is connected to the remaining portion 11.

As shown in FIG. 12, a first metal terminal 19 is connected to the first metal wire 17, and a second metal terminal 20 is connected to the second metal wire 18. The first metal terminal 19 and the second metal terminal 20 are made of aluminum (Al) in this embodiment, and formed on the insulating layer 6 (see FIG. 13(*a*)). The first metal terminal 19 is arranged on any one of the four corners of the rectangular region 3 in plan view. The second metal terminal 20 is arranged in the vicinity of a generally central position of one side of the rectangular region 3 in the longitudinal direction.

The first metal wire 17 linearly extends along the diametral direction of the diaphragm 10, is generally perpendicularly bent around an outer peripheral edge of the rectangular region 3, linearly extends along the outer peripheral edge of the rectangular region 3, and is connected to the first metal terminal 19. The second metal wire 18 linearly extends along the diametral direction of the diaphragm 10, and is connected to the second metal terminal 20.

As shown in FIG. 13(*a*), the first metal wire 17, the second metal wire 18, the first metal terminal 19 and the second metal terminal 20 are covered with a passivation film 21 made of silicon nitride (SiN). However, the first metal terminal 19 does not appear on the cutting plane of FIG. 13(*a*). Openings 22 exposing the first metal terminal 19 and the second metal terminal 20 as pads respectively are formed in the passivation film 21. Referring to FIG. 12, illustration of the passivation film 21 is omitted.

In the pressure sensor 1, such a capacitor structure (a capacitor) is formed that the diaphragm 10 serves as a movable electrode and a portion of the remaining portion 11 opposed to the diaphragm 10 from below through the reference pressure chamber 8 serves as a fixed electrode 11A. The diaphragm 10 and the fixed electrode 11A are insulated by the isolation layer 12.

Bias voltage is supplied to the respective ones of the first metal terminal 19 and the second metal terminal 20, and potential difference between the movable electrode (the diaphragm 10) and the fixed electrode 11A is constant. When the diaphragm 10 receives pressure (gas pressure, for example) from the side of the surface 4 of the silicon substrate 2, pressure difference is caused between the interior and the exterior of the reference pressure chamber 8, whereby the diaphragm 10 is displaced in the thickness direction of the silicon substrate 2. Following this, the interval (the depth of the reference pressure chamber 8) between the diaphragm 10 and the fixed electrode 11A changes, and capacitance between the diaphragm 10 and the fixed electrode 11A changes. The magnitude of pressure caused in the pressure sensor 1 can be detected on the basis of the change in the capacitance. In other words, the pressure sensor 1 is a capacitance pressure sensor.

Referring to FIG. 12, an integrated circuit region 27 (a region surrounded by two-dot chain lines) is provided between the outer peripheral edge (more detailedly, a portion of the first metal wire 17 linearly extending along the outer peripheral edge of the rectangular region 3) of each rectangular region 3 of the silicon substrate 2 and the diaphragm 10. The integrated circuit region 27 is a generally rectangular annular region surrounding the diaphragm 10 in plan view. An integrated circuit portion 28 including integrated circuit devices (functional elements) such as transistors, resistors and others is formed in the integrated circuit region 27. In other words, the pressure sensor 1 includes the integrated circuit portion 28 formed on the silicon substrate 2 provided with the diaphragm 10 etc.

More specifically, the integrated circuit region 27 is isolated from other regions of the silicon substrate 2 by a LOCOS layer 29, as shown in FIG. 13(*b*). A source 30 and a drain 31 are formed on the surface layer portion of the silicon substrate 2 in the integrated circuit region 27, and a gate oxide film 32 is formed on a portion of the surface 4 of the silicon substrate 2 corresponding to the integrated circuit region 27, to extend over the source 30 and the drain 31. A gate electrode 33 is formed on the gate oxide film 32, to be opposed to a portion (a portion where a channel is formed) between the source 30 and the drain 31. The insulating layer 6 is formed on the LOCOS layer 29 and the gate oxide film 32, to cover the gate electrode 33.

A source-side metal wire 35 and a drain-side metal wire 36 are provided on a surface of the insulating layer 6. The source-side metal wire 35 passes through the insulating layer 6 and the gate oxide film 32 and is connected to the source 30. The drain-side metal wire 36 passes through the insulating layer 6 and the gate oxide film 32 and is connected to the drain 31.

The passivation film 21 is formed on the surface of the insulating layer 6, to cover the source-side metal wire 35 and the drain-side metal wire 36. An element group arranged on the integrated circuit region 27 is referred to as the integrated circuit portion 28.

Figure 14A:
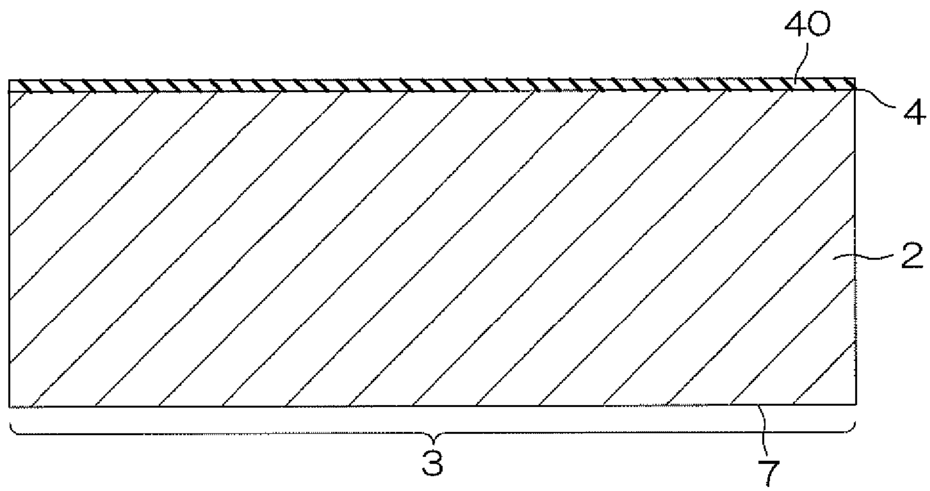
FIG. 14A(a) is a schematic sectional view showing a manufacturing step for the pressure sensor according to the fifth embodiment and shows a cutting plane on the same position as that in FIG. 13(*a*), while FIG. 14A(b) shows a cutting plane on the same position as that in FIG. 13(*b*) at the same point of time as that in FIG. 14A(a).
Figure 14A:
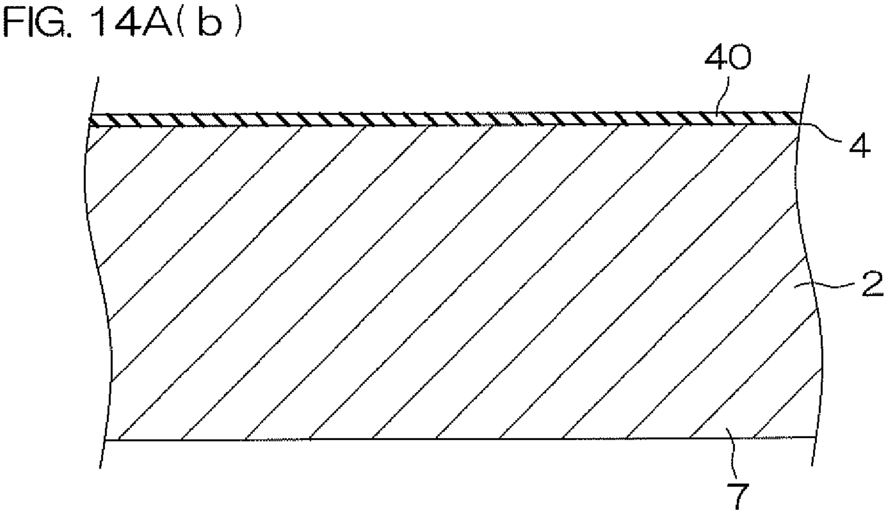
Figure 14C:
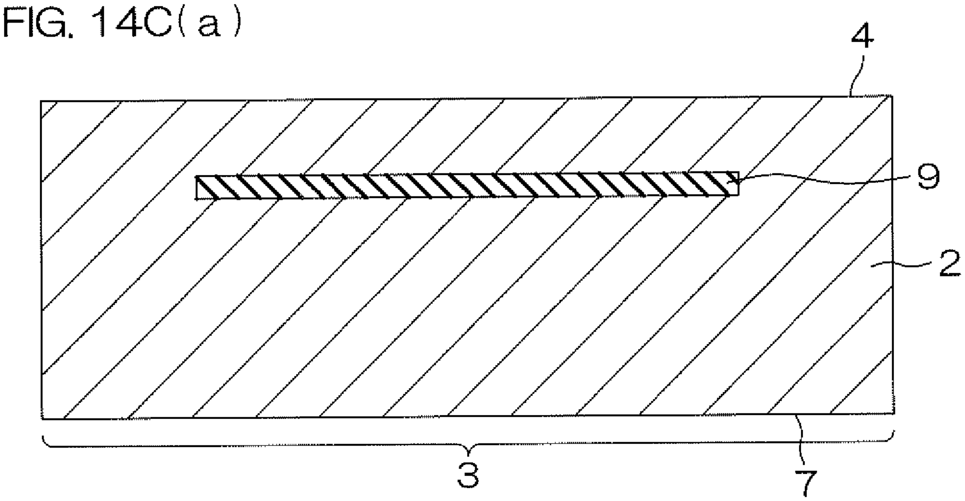
FIG. 14C(a) is a schematic sectional view showing a step subsequent to that in FIG. 14B(a), and FIG. 14C(b) shows a cutting plane on the same position as that in FIG. 13(*b*) at the same point of time as that in FIG. 14C(a).
Figure 14C:
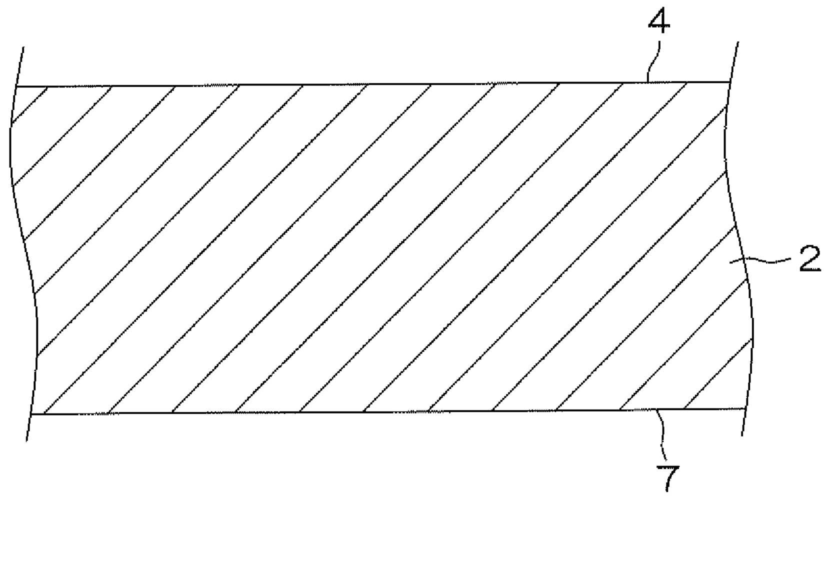
Figure 14D:
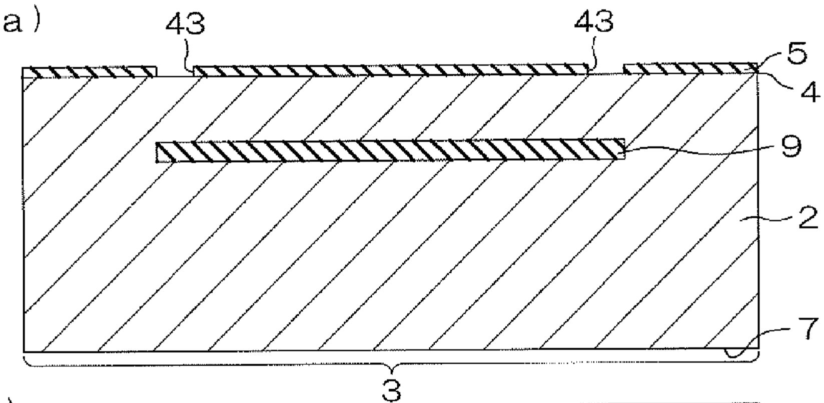
FIG. 14D(a) is a schematic sectional view showing a step subsequent to that in FIG. 14C(a), FIG. 14D(b) is a plan view in the state of FIG. 14D(a), and FIG. 14D(c) shows a cutting plane on the same position as that in FIG. 13(*b*) at the same point of time as that in FIG. 14D(a).
Figure 14D:
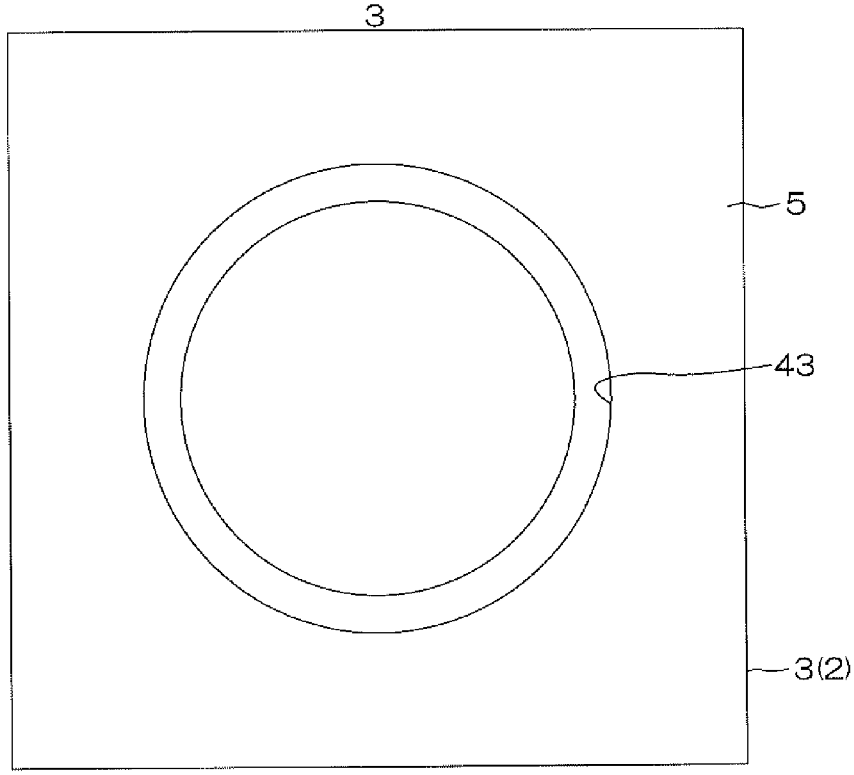
Figure 14D:
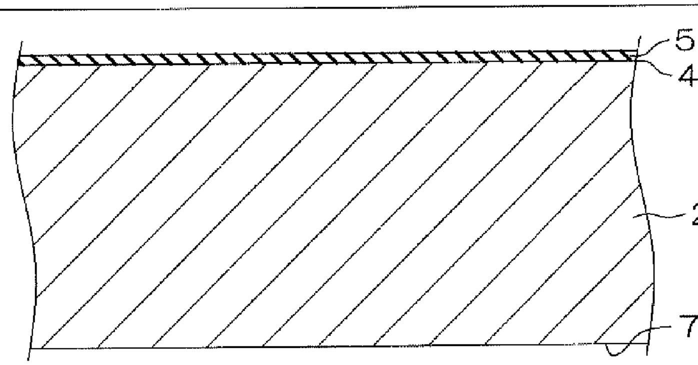
Figure 14E:
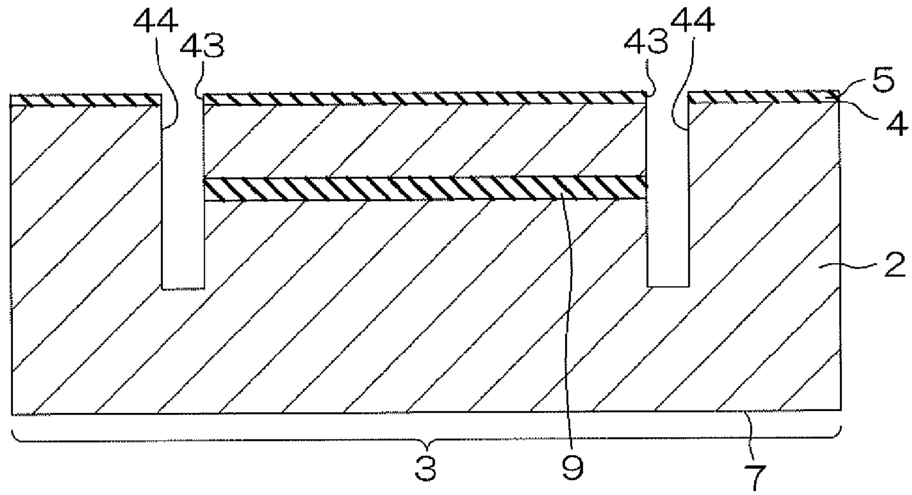
FIG. 14E(a) is a schematic sectional view showing a step subsequent to that in FIG. 14D(a), and FIG. 14E(b) is a plan view in the state of FIG. 14E(a).
Figure 14E:
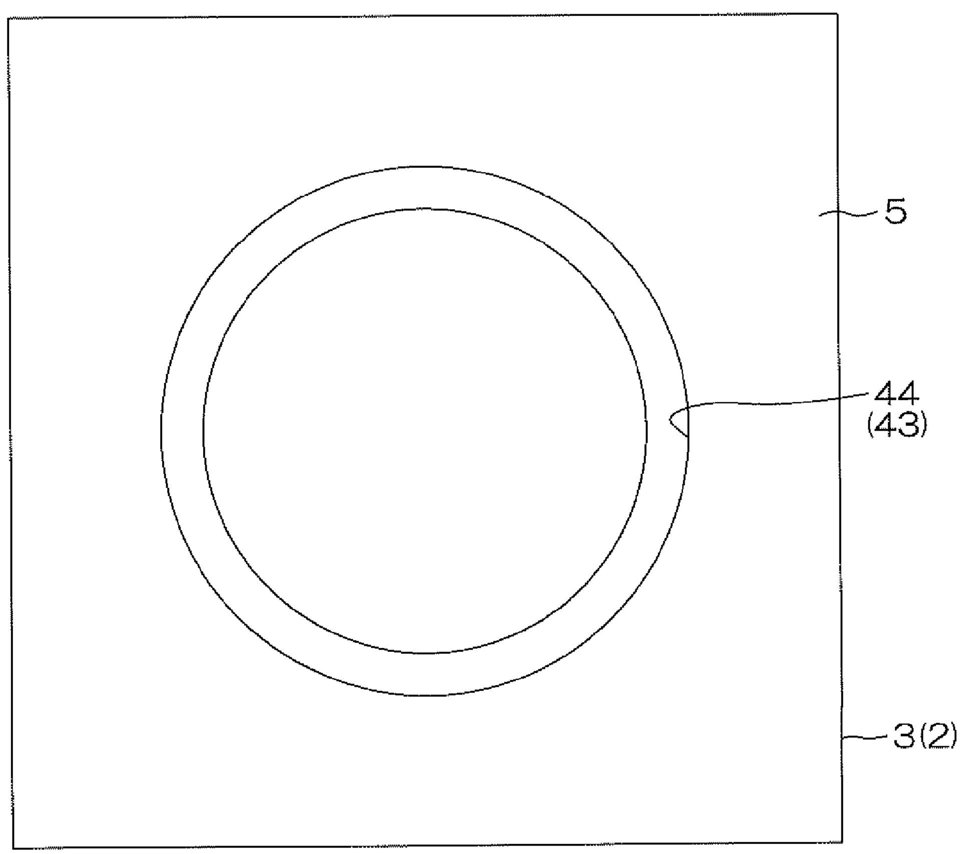
Figure 14F:
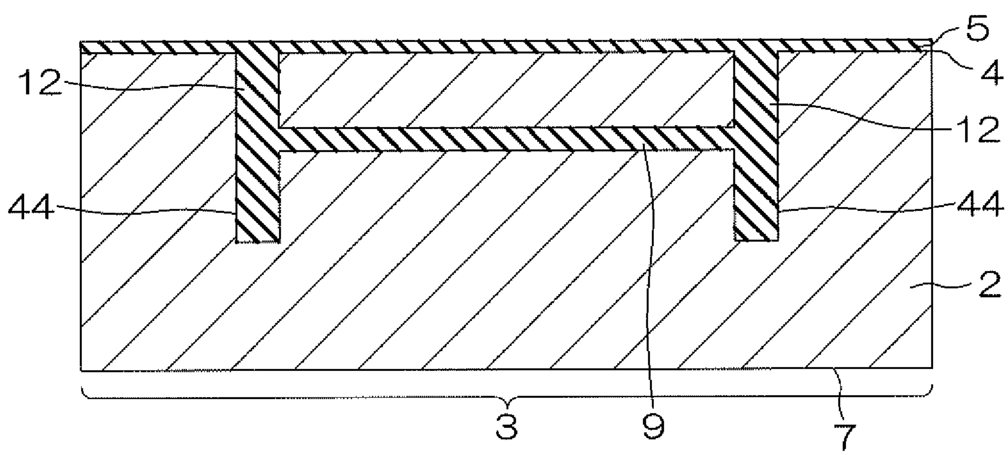
FIG. 14F is a schematic sectional view showing a step subsequent to that in FIG. 14E(a).
Figure 14:
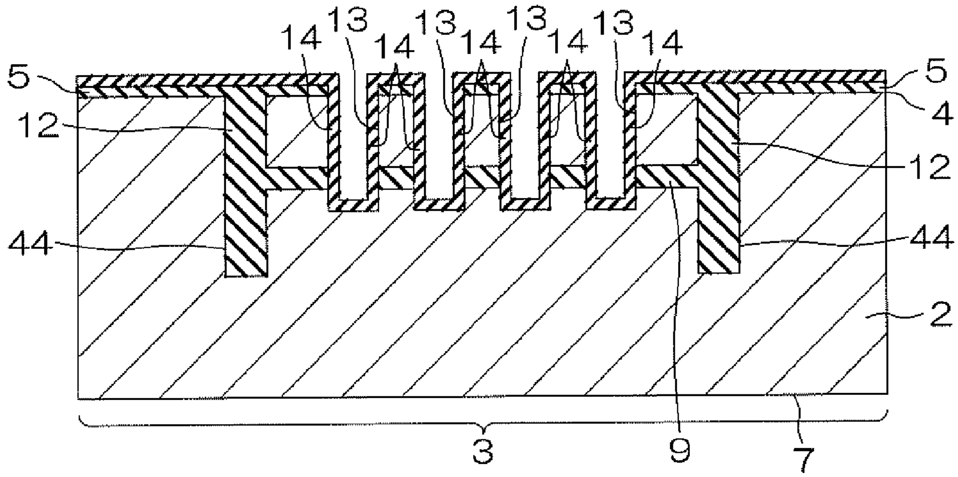
FIG. 14B(a) is a schematic sectional view showing a step subsequent to that in FIG. 14A(a), and FIG. 14B(b) is a plan view in the state of FIG. 14B(a).
FIG. 14G(a) is a schematic sectional view showing a step subsequent to that in FIG. 14F, and FIG. 14G(b) is a plan view in the state of FIG. 14G(a).
FIG. 14H(a) is a schematic sectional view showing a step subsequent to that in FIG. 14G(a), and FIG. 14H(b) shows a cutting plane on the same position as that in FIG. 13(*b*) at the same point of time as that in FIG. 14H(a).
FIG. 14I(a) is a schematic sectional view showing a step subsequent to that in FIG. 14H(a), and FIG. 14I(b) shows a cutting plane on the same position as that in FIG. 13(*b*) at the same point of time as that in FIG. 14I(a).
FIG. 14J(a) is a schematic sectional view showing a step subsequent to that in FIG. 14I(a), and FIG. 14J(b) shows a cutting plane on the same position as that in FIG. 13(*b*) at the same point of time as that in FIG. 14J(a).
FIG. 14K(a) is a schematic sectional view showing a step subsequent to that in FIG. 14J(a), and FIG. 14K(b) shows a cutting plane on the same position as that in FIG. 13(*b*) at the same point of time as that in FIG. 14K(a).
FIG. 14L(a) is a schematic sectional view showing a step subsequent to that in FIG. 14K(a), and FIG. 14L(b) shows a cutting plane on the same position as that in FIG. 13(*b*) at the same point of time as that in FIG. 14L(a).
FIG. 14M(a) is a schematic sectional view showing a step subsequent to that in FIG. 14L(a), and FIG. 14M(b) shows a cutting plane on the same position as that in FIG. 13(*b*) at the same point of time as that in FIG. 14M(a).
FIG. 14N is a schematic sectional view showing a step subsequent to that in FIG. 14M(b).
FIG. 14O(a) shows a cutting plane on the same position as that in FIG. 13(*a*) illustrating a step subsequent to that in FIG. 14N, and FIG. 14O(b) shows a cutting plane on the same position as that in FIG. 13(*b*) at the same point of time as that in FIG. 14O(a).
FIG. 14P is a schematic sectional view showing a step subsequent to that in FIG. 14O(b).
FIG. 14Q(a) shows a cutting plane on the same position as that in FIG. 13(*a*) illustrating a step subsequent to that in FIG. 14P, and FIG. 14Q(b) shows a cutting plane on the same position as that in FIG. 13(*b*) at the same point of time as that in FIG. 14Q(a).
Figure 14:
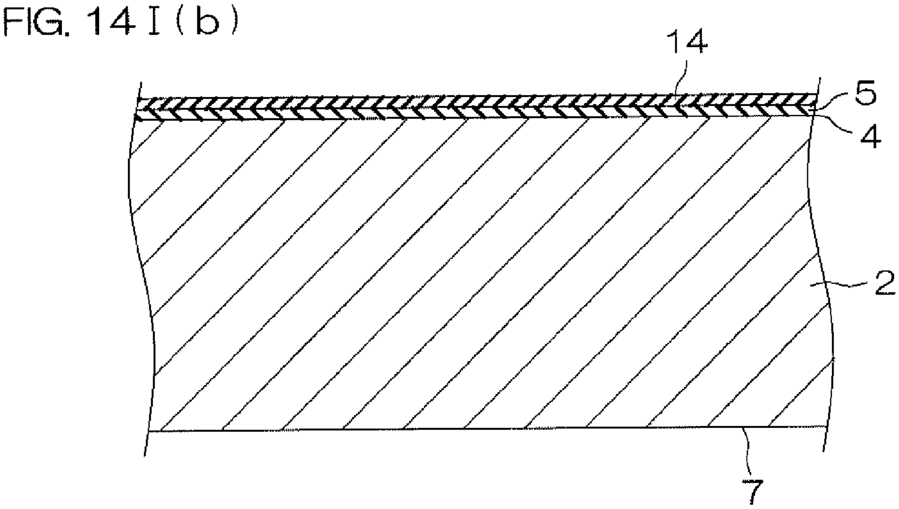
Figure 14J:
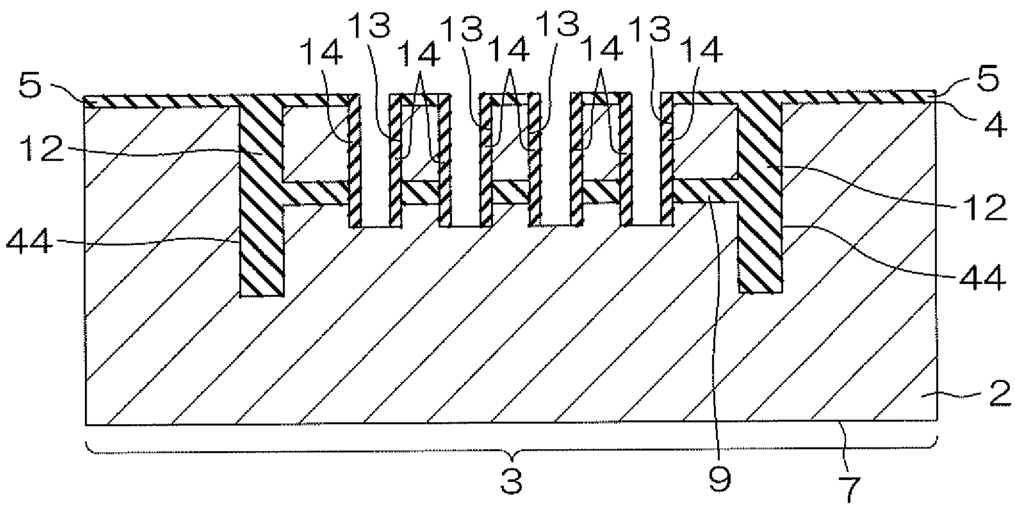
Figure 14J:
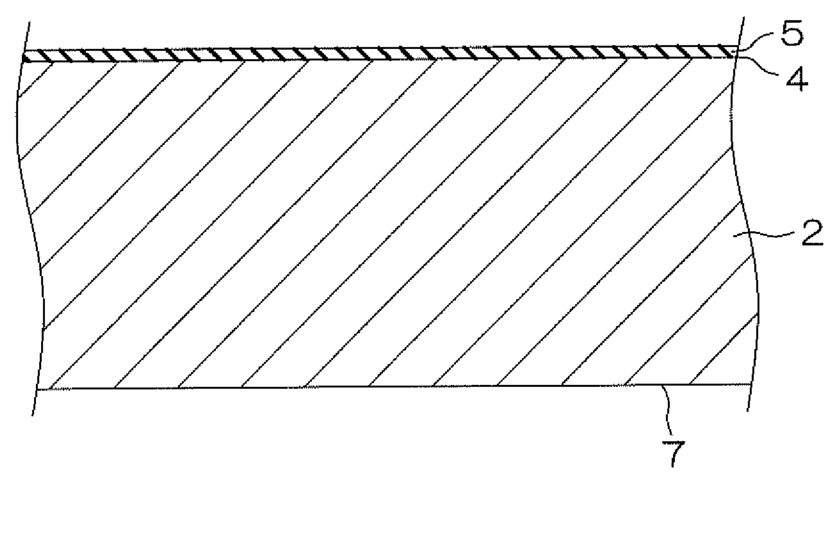
Figure 14L:
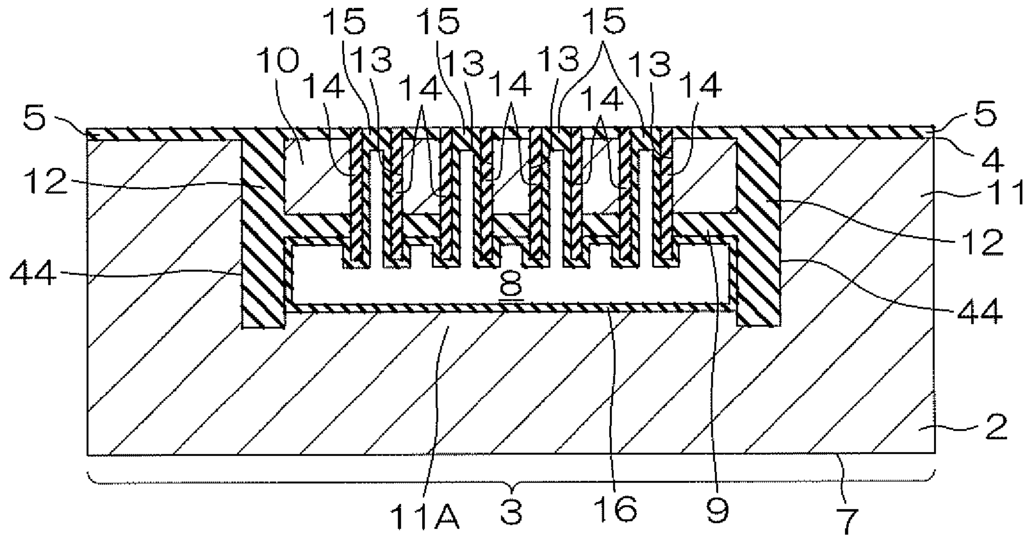
Figure 14L:
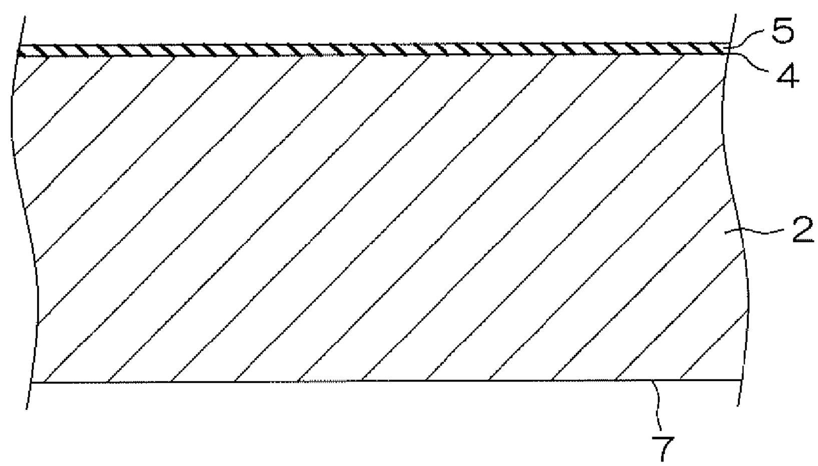
Figure 14M:
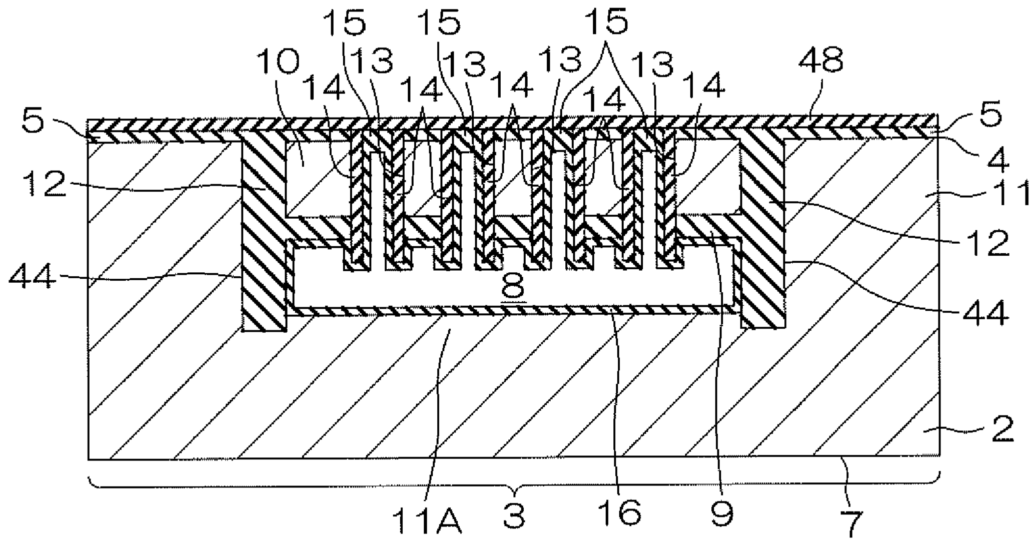
Figure 14M:
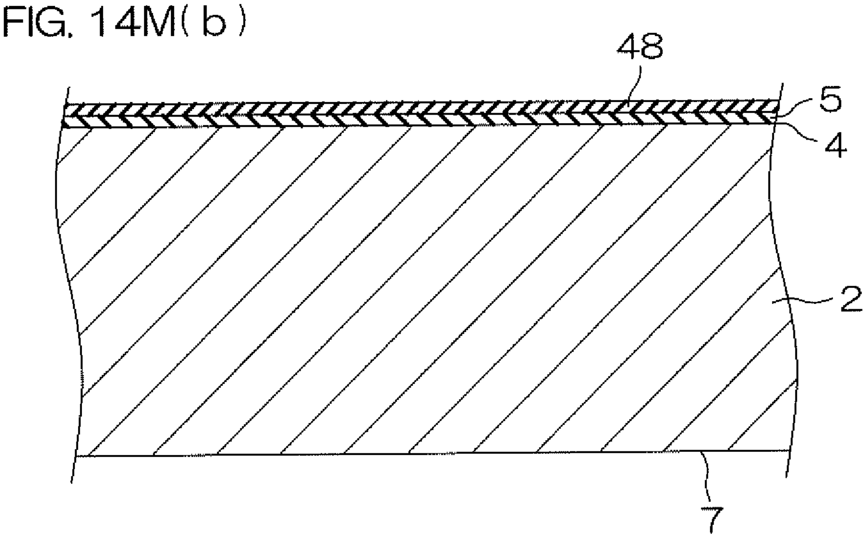
Figure 14N:
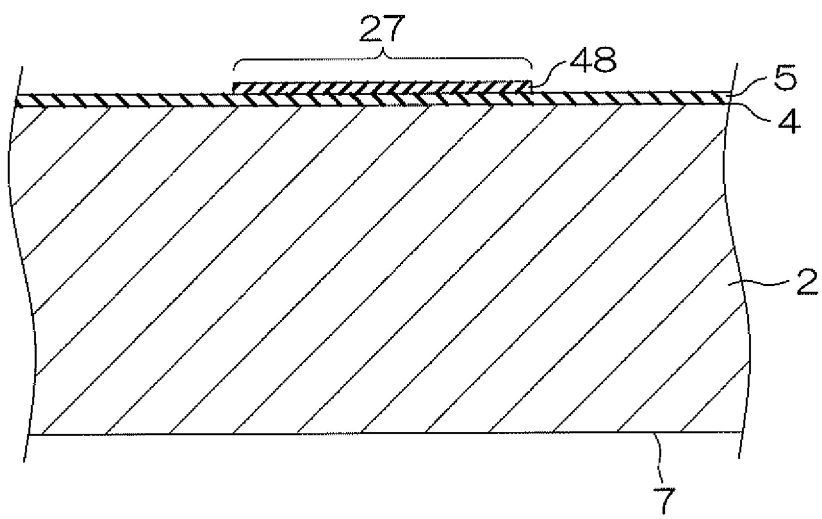
Figure 140A:
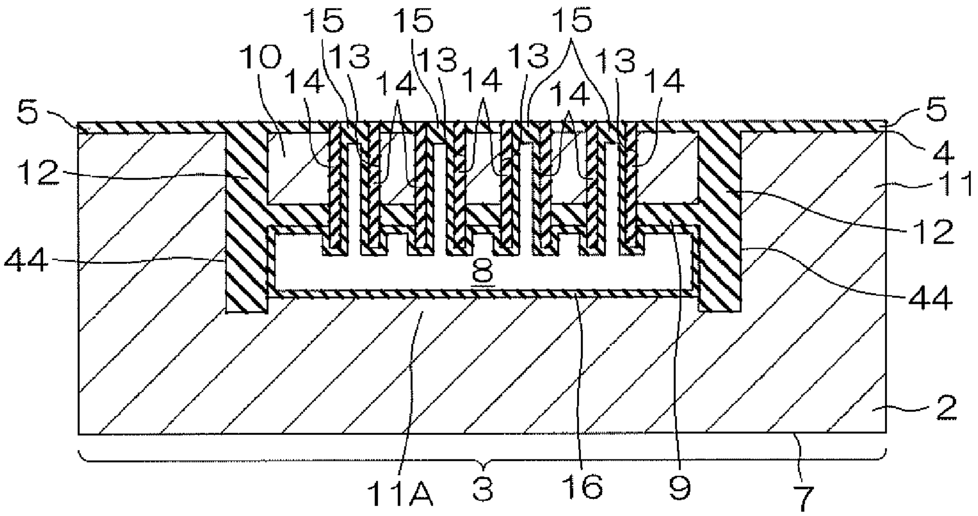
Figure 140B:
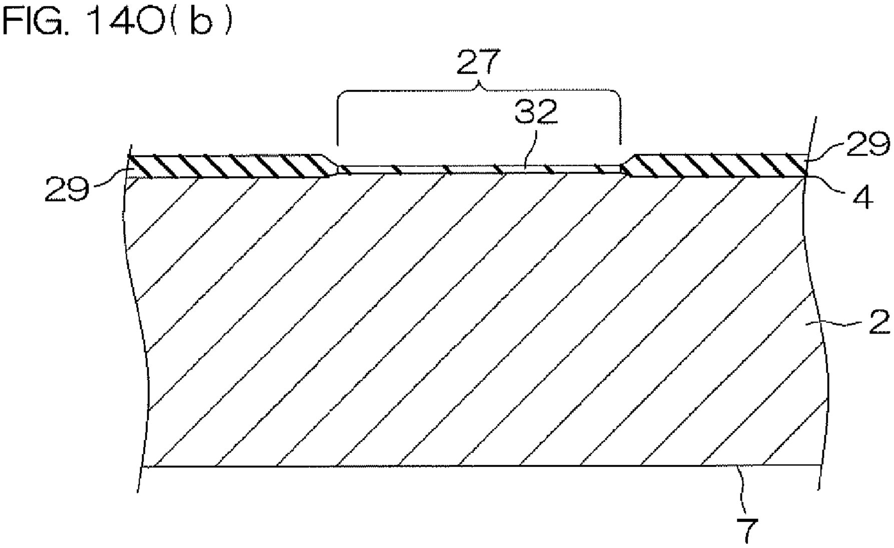
Figure 14P:
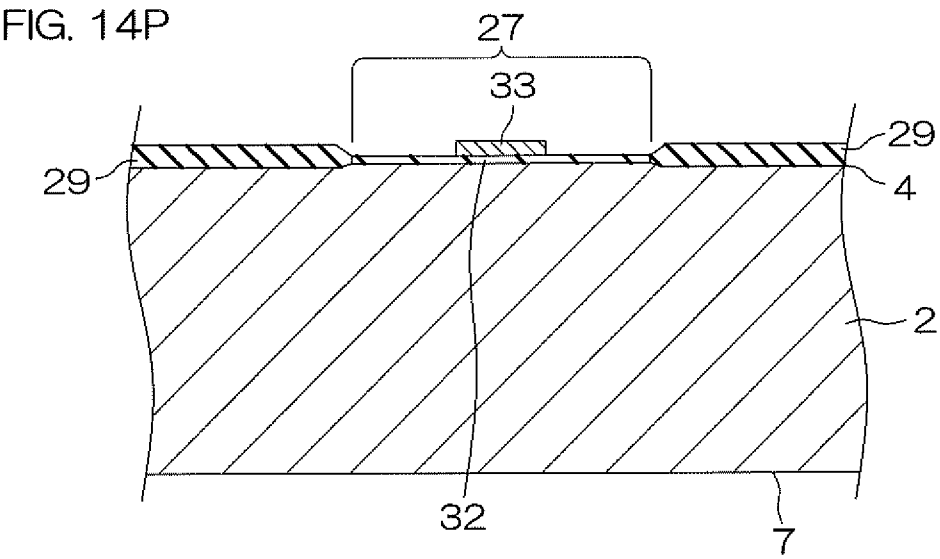
Figure 14Q:
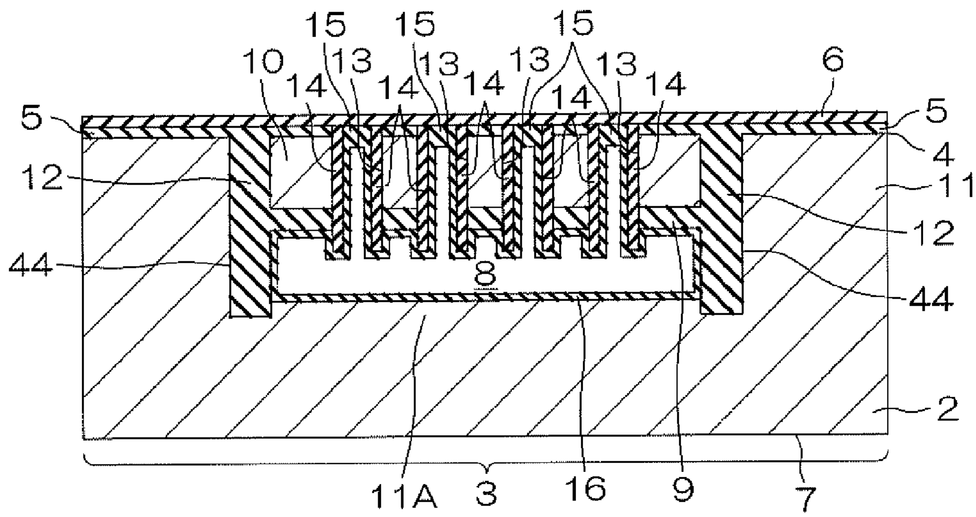
Figure 14Q:
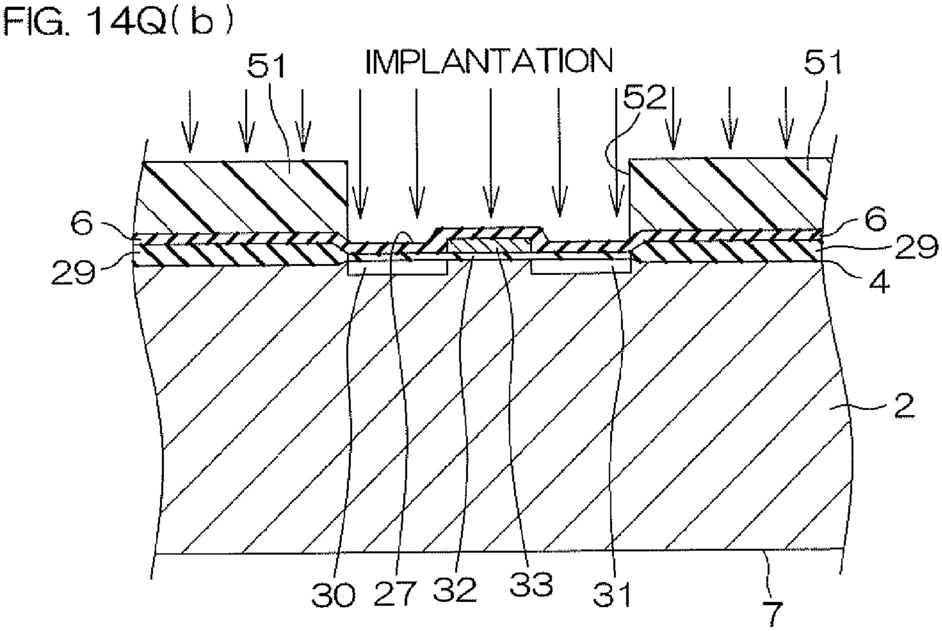

FIGS. 14A to 14Q show manufacturing steps for the pressure sensor according to the fifth embodiment. In a case where two sectional views are shown in each of FIGS. 14A to 14Q, the upper sectional view shows a cutting plane on the same position as that in FIG. 13(*a*), and the lower sectional view shows a cutting plane on the same position as that in FIG. 13(*b*).

In order to manufacture the pressure sensor 1, the silicon substrate 2 (a wafer) is prepared, as shown in FIG. 14A. According to this embodiment, the thickness of the silicon substrate 2 at this point of time is about 300 μm. More specifically, a state after selecting either a silicon substrate 2 having a diameter of 6 inches and a thickness of about 625 μm or a silicon substrate 2 having a diameter of 8 inches and a thickness of about 725 μm and reducing the thickness up to 300 μm is shown in FIG. 14A.

Then, an oxide film 40 having a thickness of several 100 Å is formed on the surface 4 of the silicon substrate 2 by thermal oxidation or CVD.

Then, a resist pattern 41 is formed on the oxide film 40 by photolithography, as shown in FIG. 14(*a*). The resist pattern 41 has one circular opening 42 (see FIG. 14B(b)) corresponding to the first etching stop layer 9 (see FIG. 13(*a*)). An impurity (nitrogen (N) ions or oxygen (O) ions, for example) is implanted into the surface layer portion (portions shown with "x" in FIG. 14B(a)) of the silicon substrate 2 by employing the resist pattern 41 as a mask (ion implantation). Acceleration voltage at the time of the ion implantation may be set to about 50 to 120 keV, for example. The oxide film 40 suppresses damage on the surface 4 resulting from the ion implantation.

Then, after the oxide film 40 and the resist pattern 41 are removed, treatment of epitaxially growing a semiconductor layer on the surface 4 of the silicon substrate 2 is performed. The silicon substrate 2 is heated at the time of the epitaxial growth, whereby the impurity ions implanted into the silicon substrate 2 are activated. Thus, the first etching stop layer 9 made of silicon oxide ($SiO_2$) or silicon nitride (SiN) is formed on a position of a prescribed depth from the surface 4 of the silicon substrate 2, as shown in FIG. 14C(a). In the silicon substrate 2, a portion (between the etching stop layer 9 and the surface 4) above the etching stop layer 9 is an epitaxially grown silicon layer (an epitaxial layer). The thickness of the epitaxial layer is about 0.5 to 1 μm, for example.

The first etching stop layer 9 can also be formed on a position of a prescribed depth (a depth of about 0.5 to 1 μm from the surface 4, for example) from the surface 4 of the silicon substrate 2 by only heat treatment (drive-in for diffusing the implanted ions) of the silicon substrate 2, in place of the epitaxial growth. In this case, the impurity ions (the oxygen ions or the nitrogen ions) are implanted into the position of the prescribed depth from the surface 4 of the silicon substrate 2 by increasing the acceleration voltage for the implantation when implanting the impurity ions (see FIG. 14B(a)). The acceleration voltage for the impurity ions is set to about 200 to 400 keV, for example. When the implanted ions are thereafter activated by performing drive-in, the first etching stop layer 9 made of an oxide or a nitride is formed on the position of the prescribed depth from the surface 4 of the silicon substrate 2. Thereafter the oxide film 40 (see FIG. 14B(b)) is removed. In the case of applying only the drive-in in place of the epitaxial growth, the silicon substrate 2 can be reduced in thickness, due to the absence of the epitaxial layer.

Then, the covering layer 5 made of silicon oxide ($SiO_2$) is formed on the surface 4 of the silicon substrate 2 by thermal oxidation or CVD, and an unshown resist pattern is formed on the covering layer 5 by photolithography. The resist pattern has an annular opening corresponding to the isolation layer 12 (see FIGS. 12 and 13(*a*)).

Then, the covering layer 5 is selectively removed by plasma etching employing the resist pattern (not shown) as a mask. A state upon termination of the plasma etching is shown in FIG. 14D, and an annular opening 43 is formed in the covering layer 5.

Then, the silicon substrate 2 is dug down by anisotropic deep RIE (Reactive Ion Etching) employing the covering layer 5 as a mask, and an annular trench 44 is formed, as shown FIG. 14E. The annular trench 44 is an annular vertical groove, and chips an outer peripheral edge portion of the first etching stop layer 9 over the whole periphery. Therefore, the annular trench 44 is formed to surround at least a prescribed region above the first etching stop layer 9 in the silicon substrate 2. Further, the annular trench 44 is formed to be deeper than a portion (see FIG. 13(*a*)) planned to become a bottom surface of the reference pressure chamber 8 in the silicon substrate 2. Therefore, the annular trench 44 is formed to be deeper than the first etching stop layer 9 planned to be positioned on the ceiling surface of the reference pressure chamber 8.

Then, the annular trench 44 is filled up with an oxide film by CVD, as shown in FIG. 14F. The oxide film present in the annular trench 44 is the aforementioned isolation layer 12. In other words, the isolation layer 12 is embedded in the annular trench 44 in this step. At this time, the oxide film so projects from the annular trench 44 that the surface of the covering layer 5 is irregularized, the surface of the covering layer 5 is flattened by resist etchback.

Then, a resist pattern 45 is formed on the covering layer 5 by photolithography, as shown in FIG. 14G(a). The resist pattern 45 has a plurality of openings 46 corresponding to the plurality of through-holes 13 (see FIGS. 12 and 13(*a*)). When circularly forming sections of the through-holes 13, the openings 46 are circularly formed correspondingly thereto. The diameter of each opening 46 is about 0.5 μm, similar to the through-holes 13. All openings 46 are formed inside the annular trench 44 (the isolation layer 12) in plan view (see FIG. 14G(b)).

Then, the covering layer 5 is selectively removed by plasma etching employing the resist pattern 45 as a mask. Thus, openings corresponding to the through-holes 13 are formed in the covering layer 5. A state upon termination of the plasma etching is shown in FIG. 14G.

Then, the silicon substrate 2 is dug down by anisotropic deep RIE employing the resist pattern 45 as a mask.

Thus, the through-holes 13 are formed on positions coinciding with the respective openings 46 (in other words, selectively removed portions of the covering layer 5) of the resist pattern 45 in the silicon substrate 2, as shown in FIG. 14H(a). When the openings 46 are circular, columnar recessed through-holes 13 extending downward with a prescribed depth from the covering layer 5 of the surface 4 are formed. Each through-hole 13 is formed to pass through the first etching stop layer 9, so that a bottom surface of each through-hole 13 is positioned above a bottom surface (on a shallow position) of the annular trench 44 (the isolation layer 12). The through-holes 13 are formed in a prescribed region surrounded by the annular trench 44 (the isolation layer 12). At the time of the formation of the through-holes 13, the resist pattern 45 is simultaneously etched and reduced in thickness. After the formation of the through-holes 13, the remaining portions of the resist pattern 45 are peeled off.

The deep RIE for forming the through-holes 13 may be performed through the so-called Bosch process. In the Bosch process, a step of etching the silicon substrate 2 by using $SF_6$ (sulfur hexafluoride) and a step of forming a protective film on an etched surface by using $C_4F_8$ (perfluorocyclobutane) are alternately repeated. Thus, the silicon substrate 2 can be etched at a high aspect ratio.

Then, protective thin films 14 made of silicon oxide ($SiO_2$) are formed on the whole areas of inner surfaces (i.e. circumferential surfaces and bottom surfaces of the through-holes 13) partitioning the respective through-holes 13 on the silicon substrate 2 and the surface of the covering layer 5 by thermal oxidation or CVD, as shown in FIG. 14I(a). The thickness of the protective thin films 14 is about 1000 Å. At this point of time, the protective thin film 14 in each through-hole 13 is in the form of a tube (more specifically, in the form of a cylinder) passing through the first etching stop layer 9 while covering a sidewall of the through-hole 13, and has a bottom surface portion on a lower end of the through-hole 13.

Then, portions (bottom surface portions in the cylindrical protective thin films 14) of the protective thin films 14 on the bottom surfaces of the through-holes 13 and the surface of the covering layer 5 are removed by RIE, as shown in FIG. 14J(a). Thus, a crystal plane of the silicon substrate 2 is exposed from the bottom surfaces of the through-holes 13.

Then, an etchant is introduced into the respective through-holes 13 from the side of the surface 4 of the silicon substrate 2, as shown in FIG. 14K(a). For example, etching gas is introduced into the through-holes 13 in a case of applying dry etching such as plasma etching. In a case of applying wet etching, an etching solution is introduced into the through-holes 13. Thus, a substrate material under the first etching stop layer 9 (more strictly, around the bottom of each through-hole 13) is isotropically etched in the silicon substrate 2 by employing the covering layer 5 and the protective thin film on the inner side surface of each through-hole 13 as masks. More specifically, the silicon substrate 2 is etched in the thickness direction and a direction orthogonal to the thickness direction from the bottom of each through-hole 11 serving as a starting point. While a substrate material on a side closer to the surface 4 than the first etching stop layer 9 is not etched due to the presence of the first etching stop layer 9, a substrate material on the outside of the isolation layer 12 is not etched either in the direction orthogonal to the thickness direction of the silicon substrate 2, due to the presence of the isolation layer 12.

As a result of the isotropic etching, the reference pressure chamber 8 (the flat space) communicating with each through-hole 13 is formed in the silicon substrate 2 under the first etching stop layer 9. At the same time, the diaphragm 10 is formed above the first etching stop layer 9.

The depth (a dimension in the thickness direction of the silicon substrate 2) of the reference pressure chamber 8 can be adjusted in response to the quantity of introduction of the etching solution. The depth of the reference pressure chamber 8 can also be adjusted in response to the interval between the adjacent through-holes 13. When the interval between the through holes 13 is narrow in this case, for example, spaces spreading from the adjacent through-holes 13 so continue that the reference pressure chamber 8 is formed by relatively short-time etching. Therefore, the height of the reference pressure chamber 8 relatively decreases. When the interval between the through-holes 13 is wide, on the other hand, the etching must be performed for a relatively long time until spaces spreading from the adjacent through-holes 13 are linked with one another. The height of the reference pressure chamber 8 increases in response thereto.

Thus, the interval between the diaphragm 10 (the movable electrode) and the remaining portion 11 (the fixed electrode 11A) can be controlled by adjusting the depth of the reference pressure chamber 8, and sensitivity of the pressure sensor 1 (see FIG. 13(*a*)) can be adjusted in response thereto.

As a result of the isotropic etching, a substrate material around the bottom of each through-hole 13 is etched. Thus, a portion of the tubular protective thin film 14 formed on the inner wall of each through-hole 13 under (on a bottom side of) the first etching stop layer 9 protrudes into the reference pressure chamber 8 from the diaphragm 10 and is opposed to the bottom surface of the reference pressure chamber 8 from above at a prescribed interval in a state upon completion of the reference pressure chamber 8. Therefore, the reference pressure chamber 8 is not completely cylindrical, but is concaved inward (downward) on the position of each through-hole 13 in a top surface portion thereof.

Then, each through-hole 13 is filled up with an oxide film and blocked by CVD, as shown in FIG. 14L(a). More detailedly, oxide films are formed on upper portions on inner side portions of the protective thin films 14 present on the circumferential surfaces of the through-holes 13, to fill up the through-holes 13. The oxide films are the aforementioned fillers 15. In other words, the fillers 15 are arranged in the respective through-holes 13 in this step. The respective through-holes 11 are so filled up that the reference pressure chamber 8 is sealed in a vacuum state. While the oxide films so project from the through-holes 13 that the surface of the covering layer 5 is irregularized at this time, the surface of the covering layer 5 is flattened by resist etchback. The surface of the covering layer 5 is remarkably irregularized as the through-holes 13 are increased in diameter.

The oxide films for filling up the through-holes 13 do not remain only in the through-holes 13, but reach the interior of the reference pressure chamber 8 from the bottoms of the through-holes 13 continuously with the fillers 15 as the aforementioned covering film 16, to cover the whole areas of the inner wall surfaces of the reference pressure chamber 8. The reference pressure chamber 8, having the sufficient depth (10 to 15 μm, for example), is not filled up with the covering film 16. As the diameter of the through-holes 13 is reduced, the through-holes 13 are quickly filled up, whereby the covering film 16 is reduced in thickness.

Then, a step of forming an integrated circuit portion 28 (see FIG. 13(*b*)) on an integrated circuit region 27 is executed. The integrated circuit region 27 is a region of the silicon substrate 2 other than the region where the reference pressure chamber 8 and the diaphragm 10 are formed.

First, a nitride film 48 made of silicon nitride (SiN) is formed on the surface of the covering layer 5 of the silicon substrate 2, as shown in FIG. 14M.

Then, the nitride film 48 is selectively removed by plasma etching through a mask (not shown) of a prescribed pattern, as shown in FIG. 14N. As a result, the nitride film 48 remains only on a portion planned to become the integrated circuit region 27.

Then, the remaining nitride film 48 is employed as a mask to form the LOCOS layer 29 around the nitride film 48 by thermally oxidizing a surface portion of the silicon substrate 2 around the same. Thereafter the nitride film 48 and the covering layer 5 under the same are removed, and the aforementioned gate oxide film 32 is newly formed by thermal oxidation, for example. A state upon formation of the oxide film 32 is shown in FIG. 14O(*b*). The region (the region isolated by the LOCOS layer 29) of the silicon substrate 2 where the gate oxide film 32 is formed becomes the integrated circuit region 27.

Then, a polysilicon film is deposited on the gate oxide film 32 in the integrated circuit region 27. The polysilicon film is patterned by photolithography, whereby the gate electrode 33 is formed on the gate oxide film 32, as shown in FIG. 14P.

Then, a resist pattern 51 is formed on the surface of the silicon substrate 2, as shown in FIG. 14Q(b). The resist pattern 51 has one opening 52 corresponding to the integrated circuit region 27. Then, an impurity (ions of arsenic (As), for example) is implanted into the surface layer portion of the silicon substrate 2 by employing the resist pattern 51 and the gate electrode 33 as masks. Thus, the source 30 and the drain 31 are formed on the surface layer portion of the silicon substrate 2 in the integrated circuit region 27, on regions opposed to each other through the gate electrode 33.

After the resist pattern 51 is removed, the insulating layer 6 covering the surface of the silicon substrate 2 is formed by CVD. More specifically, the insulating layer 6 is formed to cover the covering layer 5 shown in FIG. 14Q(a) as well as the LOCOS layer 29 and the gate oxide film 32 shown in FIG. 14Q(b).

Then, an opening (a contact hole) 53 is formed by photolithography to pass through the insulating layer 6 and the covering layer 5, as shown in FIG. 13(*a*). The opening 53 is formed on a position exposing part of the diaphragm 10. At the same time, another contact hole 53 is formed to pass through the insulating layer 6 and the covering layer 5. The contact hole 53 is formed on a position partially exposing the remaining portion 11. At the same time, contact holes 54 for the source 30 and the drain 31 are formed, as shown in FIG. 13(*b*). The contact holes 64 are formed to pass through the insulating layer 6 and the gate oxide film 32 and to partially expose the source 30 and the drain 31. Although not shown, a contact hole linked with the gate electrode 33 is formed to pass through the insulating layer 6 in the same step.

Then, aluminum is deposited on the insulating layer 6 by sputtering, and an aluminum deposition film 55 is formed. The aluminum deposition film 55 is connected to the respective ones of the diaphragm 10, the remaining portion 11, the source 30, the drain 31 and the gate electrode 33 through the contact holes 53, 54 etc.

Then, a resist pattern (not shown) is formed on the aluminum deposition film 55 by photolithography, and the aluminum deposition film 55 is thereafter selectively removed by plasma etching employing the resist pattern as a mask. Thus, the first metal wire 17, the second metal wire 18, the first metal terminal 19 and the second metal terminal 20 are simultaneously formed (see FIG. 12). At this time, the first metal wire 17 is connected to the diaphragm 10 through the corresponding contact hole 53, and the second metal wire 18 is connected to the remaining portion 11 through the corresponding contact hole 53 (see FIG. 13(*a*)). At the same time, metal wires (the aforementioned source-side metal wire 35, a drain-side metal wire 36 etc.) and metal terminals (not shown) linked with the respective ones of the source 30, the drain 31 and the gate electrode 33 of the integrated circuit portion 28 are also formed. Thereafter the resist pattern is peeled off.

Then, the passivation film 21 is formed on the insulating layer 6 by CVD. Thereafter openings 22 exposing the first metal terminal 19 and the second metal terminal 20 (also including unshown metal terminals on the side of the integrated circuit portion 28) as pads respectively are formed in the passivation film 21 by photolithography and etching, as shown in FIG. 13(*a*). FIG. 13(*a*) shows the opening 22 exposing the second metal terminal 20.

Further, an opening 56 exposing a region (i.e., generally the whole area of the diaphragm 10) of the insulating layer 6 surrounding all through-holes 13 is formed in the passivation film 21 by photolithography and etching. The opening 56 has a shape similar to that of the reference pressure chamber 8 in plan view, for example.

Thus, the pressure sensor 1 according to the fifth embodiment is obtained. The opening 56 is formed in the passivation film 21 to expose the diaphragm 10 from the opening 56, so that the diaphragm 10 easily warps. When the passivation film 21 is present on the diaphragm 10, the diaphragm 10 hardly warps, and sensitivity of the pressure sensor 1 lowers.

According to the fifth embodiment, the substrate material is so etched by the etchant introduced into the through-holes 13 passing through the first etching stop layer 9 that the reference pressure chamber 8 is formed under the first etching stop layer 9 in the silicon substrate 2, as shown in FIG. 14K(a). On the other hand, the diaphragm 10 is formed on the first etching stop layer 9.

At this time, the diaphragm 10 is cut off from the etchant in the reference pressure chamber 8 by the first etching stop layer 9. Thus, the diaphragm 10 is not eroded by the etchant for forming the reference pressure chamber 8, whereby the thickness of the diaphragm 10 can be precisely set to a target thickness.

At this time, further, the isolation layer 12 embedded in the annular trench 44 formed to be deeper than the first etching stop layer 9 surrounds the diaphragm 10 present on the prescribed region above the first etching stop layer 9. Thus, the diaphragm 10 is partitioned by the isolation layer 12 in the direction orthogonal to the thickness direction of the silicon substrate 2, whereby the diaphragm 10 can be precisely formed in target dimensions. The isolation layer 12 isolates the diaphragm 10 from another remaining portion 11 of the silicon substrate 2. Thus, the diaphragm 10 and the remaining portion 11 are insulated, whereby a capacitor structure can be formed by the diaphragm 10 and the fixed electrode 11A of the remaining portion 11.

At this time, further, the top surface of the reference pressure chamber 8 is partitioned by the first etching stop layer 9, whereby the reference pressure chamber 8 can be precisely formed in target dimensions.

Thus, a pressure sensor 1 (see FIG. 13(*a*)) capable of attaining improvement of sensitivity and capable of suppressing dispersion in sensitivity can be simply manufactured.

According to this method, the reference pressure chamber 8 and the diaphragm 10 can be formed through a small number of steps employing only one silicon substrate 2 without bonding two silicon substrates 2 to each other, whereby a low-cost and miniature (thin) pressure sensor 1 can be simply manufactured. In a case of forming the pressure sensor 1 by bonding two silicon substrates 2 to each other, for example, leakage easily takes place on the joint between the two silicon substrates 2. According to this embodiment, on the other hand, the diaphragm 10 which is a movable component is part of the silicon substrate 2, whereby the reference pressure chamber 8 can be maintained as a sealed space causing no leakage. Further, the diaphragm 10 and the fixed electrode 11A of the remaining portion 11 are insulated by the isolation layer 12. Thus, a highly reliable pressure sensor 1 can be constituted of one silicon substrate 2.

The reference pressure chamber 8 under the first etching stop layer 9 can be sealed by arranging the fillers 15 in the through-holes 13, as shown in FIG. 14L(a). Thus, pressure in the reference pressure chamber 8 is so set to reference pressure that the completed pressure sensor 1 can detect pressure received by the diaphragm 10 as relative pressure with respect to the reference pressure.

The isolation layer 12 extends in the silicon substrate 2 up to the position deeper than the bottom surface of the reference pressure chamber 8, whereby not only the diaphragm 10 but also the reference pressure chamber 8 is partitioned by the isolation layer 12 in the direction orthogonal to the thickness direction of the silicon substrate 2. Thus, both of the diaphragm 10 and the reference pressure chamber 8 can be formed in target dimensions. In other words, dimensions of the fixed electrode 11A (the portion partitioning the bottom surface of the reference pressure chamber 8) opposed to the diaphragm 10 in the silicon substrate 2 are correctly decided. Therefore, capacitance of the capacitor structure formed by the diaphragm 10 and the fixed electrode 11A can be precisely controlled to a design value. Thus, dispersion in sensitivity of the pressure sensor 1 can be suppressed.

The pressure sensor 1 of a simple structure having the respective ones of the remaining portion 11 (the fixed electrode 11A) and the diaphragm 10 on the same silicon substrate 2 as electrodes can be simply manufactured by connecting the first metal wire 17 to the diaphragm 10 and connecting the second metal wire 18 to the remaining portion 11, as shown in FIG. 13(*a*). In particular, the silicon substrate 2 of a high concentration is so employed that the respective ones of the diaphragm 10 and the remaining portion 11 (the fixed electrode 11A) can be employed as the electrodes as such, whereby labor of providing electrodes by separately performing ion implantation on the respective ones of the diaphragm 10 and the remaining portion 11 can be saved.

The protective thin films 14 are previously formed on the sidewalls of the through-holes 13 in the etching step as shown in FIG. 14K(a), whereby the etchant introduced into the through-holes 13 in the etching step can be prevented from etching the sidewalls (portions to become the diaphragm 10) of the through-holes 13.

When isotropically etching the material for the silicon substrate 2 on lower end sides of the through-holes 13, the protective thin films 14 protrude into the reference pressure chamber 8 from the diaphragm 10. Thus, when the diaphragm 10 remarkably warps toward the side of the reference pressure chamber 8, the protective thin films 14 come into contact with the inner wall surfaces of the reference pressure chamber 8, to regulate excess deformation of the diaphragm 10. Therefore, damage of the diaphragm 10 can be prevented.

The integrated circuit portion 28 is formed on the integrated circuit region 27 (see FIG. 12), whereby the pressure sensor 1 and the integrated circuit portion 28 can be formed on the same silicon substrate 2 (more strictly, on each rectangular region 3) (see FIG. 13(*b*)).

Particularly, referring to FIG. 13(*a*), the diaphragm 10 is so constituted of part of the silicon substrate 2 that the pressure sensor 1 is formed while maintaining such a state that the surface 4 of the silicon substrate 2 is flat, whereby the integrated circuit portion 28 can also be formed on a region other than the diaphragm 10 on the flat surface 4 of each rectangular region 3. Thus, it becomes possible to form a body portion (the portion where the diaphragm 10 is formed) of the pressure sensor 1 and the integrated circuit portion 28 (LSI) by one chip (one-chip implementation) (see FIG. 12).

(6) Sixth Embodiment

While a sixth embodiment is now described, the same reference signs are assigned to portions of the sixth embodiment corresponding to the portions described with reference to the fifth embodiment, and description thereof is omitted. In relation to manufacturing steps for a pressure sensor 1 according to the sixth embodiment, detailed description is omitted as to those identical to the manufacturing steps described with reference to the fifth embodiment.

Figure 15:
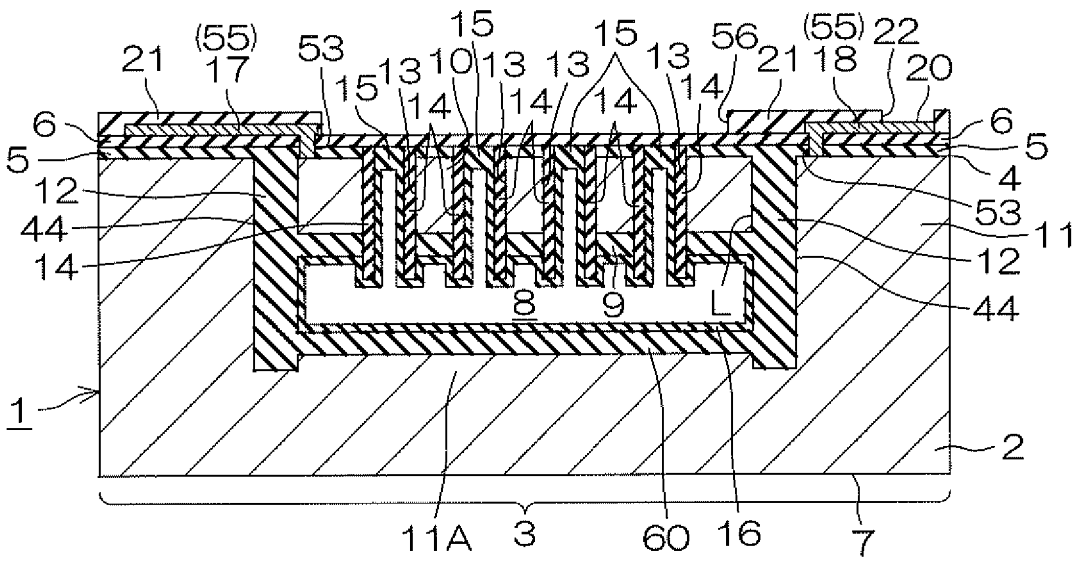
FIG. 15 is a sectional view along the cutting plane line A-A in FIG. 12 in a case of a pressure sensor according to a sixth embodiment.

FIG. 15 is a sectional view along the cutting plane line A-A in FIG. 12, in the case of the pressure sensor according to the sixth embodiment.

The pressure sensor 1 according to the sixth embodiment is provided with a second etching stop layer 60 on a position (a position deeper than a first etching stop layer 9) partitioning a bottom surface of a reference pressure chamber 8 as shown in FIG. 15, in addition to the structure (see FIG. 13(*a*)) of the fifth embodiment. The bottom surface of the reference pressure chamber 8 is a surface opposed to the first etching stop layer 9 from below in inner wall surfaces of the reference pressure chamber 8.

The second etching stop layer 60 is an insulating layer circular in plan view, having the same magnitude as the first etching stop layer 9. The first etching stop layer 9 and the second etching stop layer 60 are vertically opposed to each other at an interval corresponding to the vertical dimension (the depth) of the reference pressure chamber 8.

An isolation layer 12 extends in a silicon substrate 2 up to a position deeper than the second etching stop layer 60. Therefore, the isolation layer 12 is linked with the first etching stop layer 9 on an intermediate position in the vertical direction (the thickness direction of the silicon substrate 2) thereof, and also linked with the second etching stop layer 60 on a lower end portion thereof. The second etching stop layer 60 is linked with the isolation layer 12 to cover the interior of the isolation layer 12 from below.

Therefore, the diaphragm 10 is isolated from another remaining portion 11 of the silicon substrate 2. The reference pressure chamber 8 is partitioned by the first etching stop layer 9 and the second etching stop layer 60 in the thickness direction of the silicon substrate 2, and further partitioned by the isolation layer 12 in a direction orthogonal to the thickness direction.

Figure 16A:
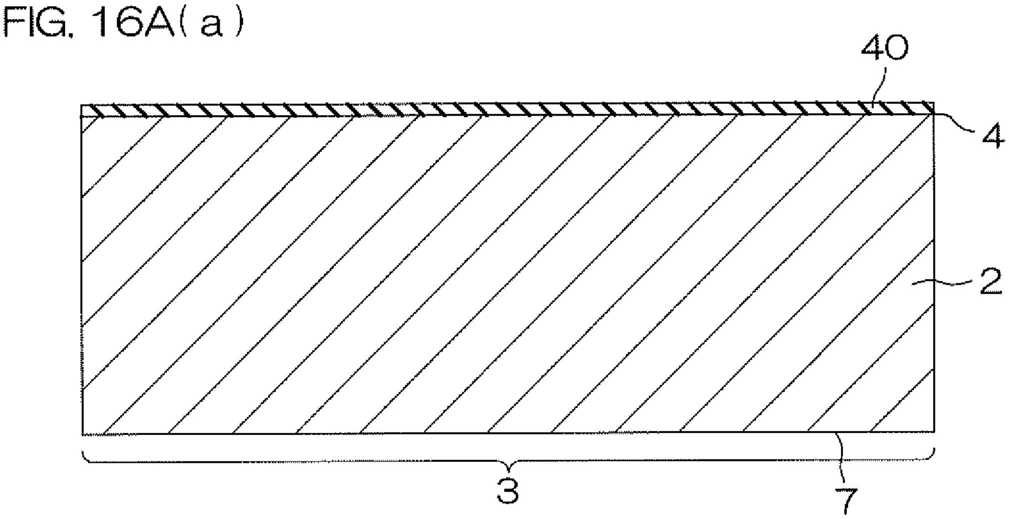
FIG. 16A(a) is a schematic sectional view showing a manufacturing step for the pressure sensor according to the sixth embodiment and shows a cutting plane on the same position as that in FIG. 15, while FIG. 16A(b) shows a cutting plane on the same position as that in FIG. 13(*b*) at the same point of time as that in FIG. 16A(a).
Figure 16A:
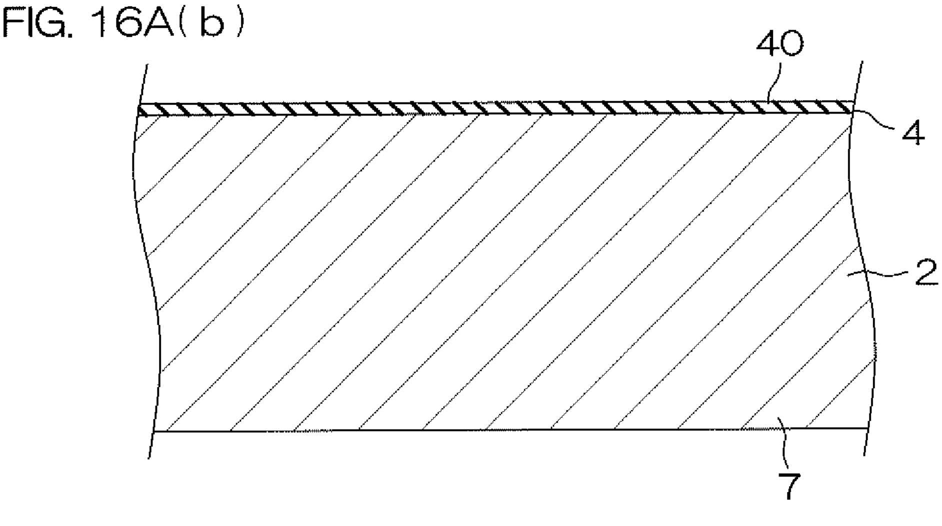
Figure 16B:
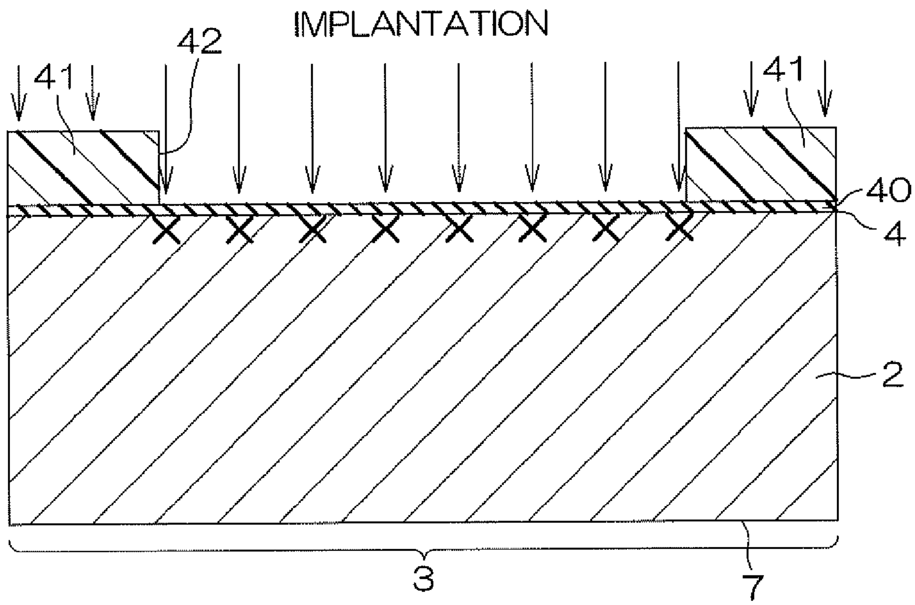
FIG. 16B(a) is a schematic sectional view showing a step subsequent to that in FIG. 16A(a), and FIG. 16B(b) is a plan view in the state of FIG. 16B(a).
Figure 16B:
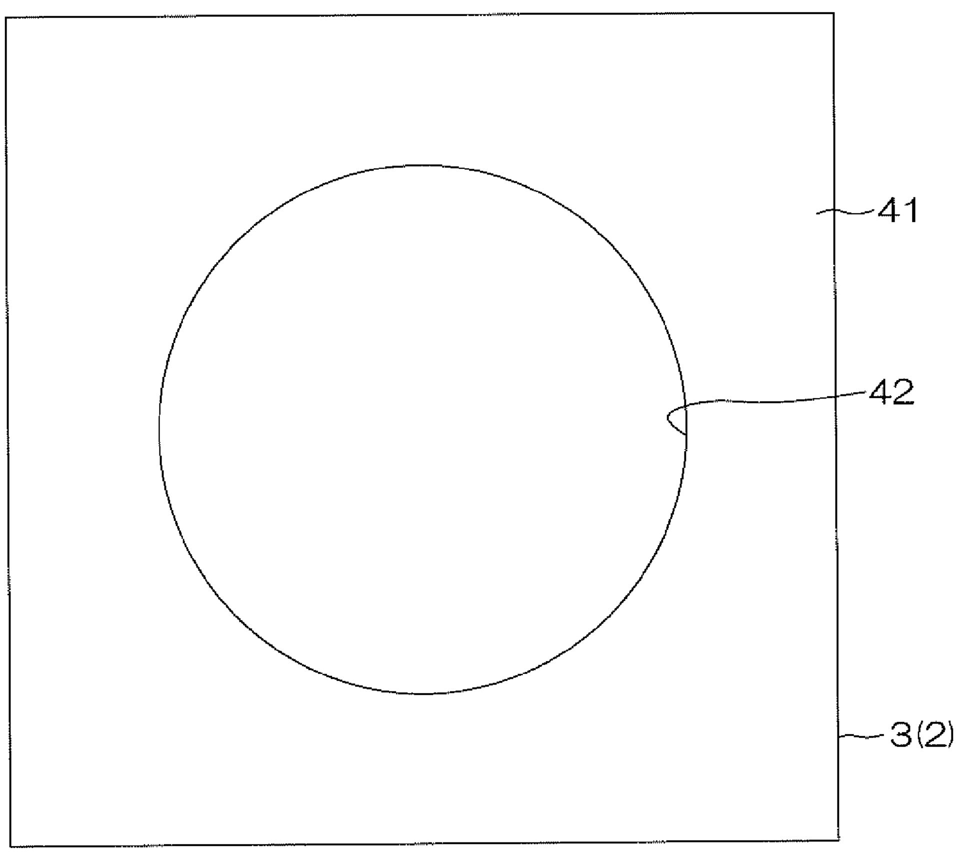
Figure 16C:
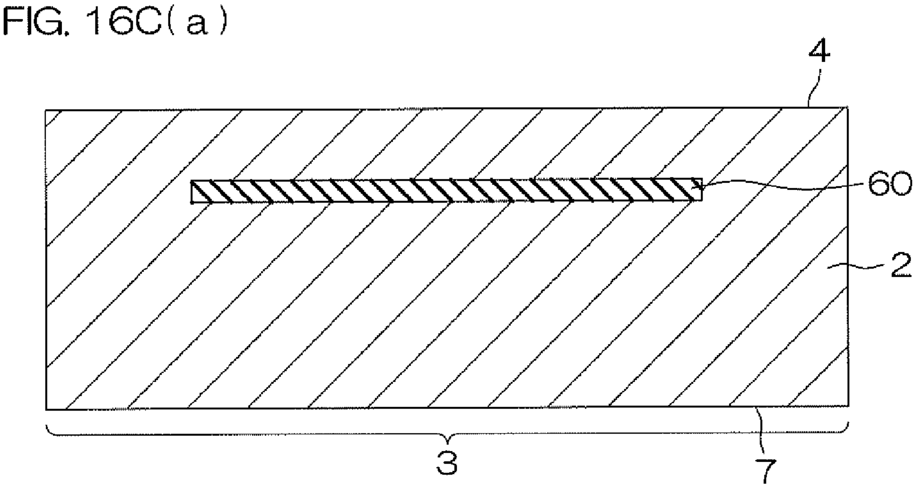
FIG. 16C(a) is a schematic sectional view showing a step subsequent to that in FIG. 16B(a), and FIG. 16C(b) shows a cutting plane on the same position as that in FIG. 13(*b*) at the same point of time as that in FIG. 16C(a).
Figure 16C:
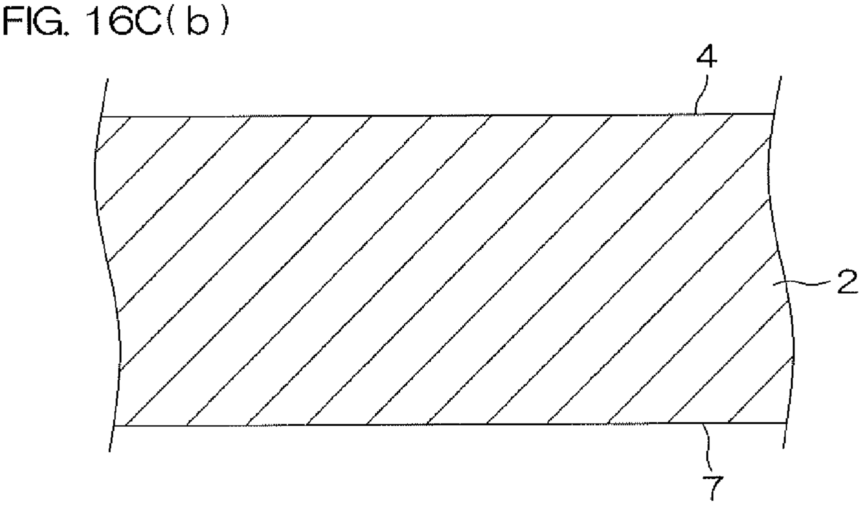
Figure 16D:
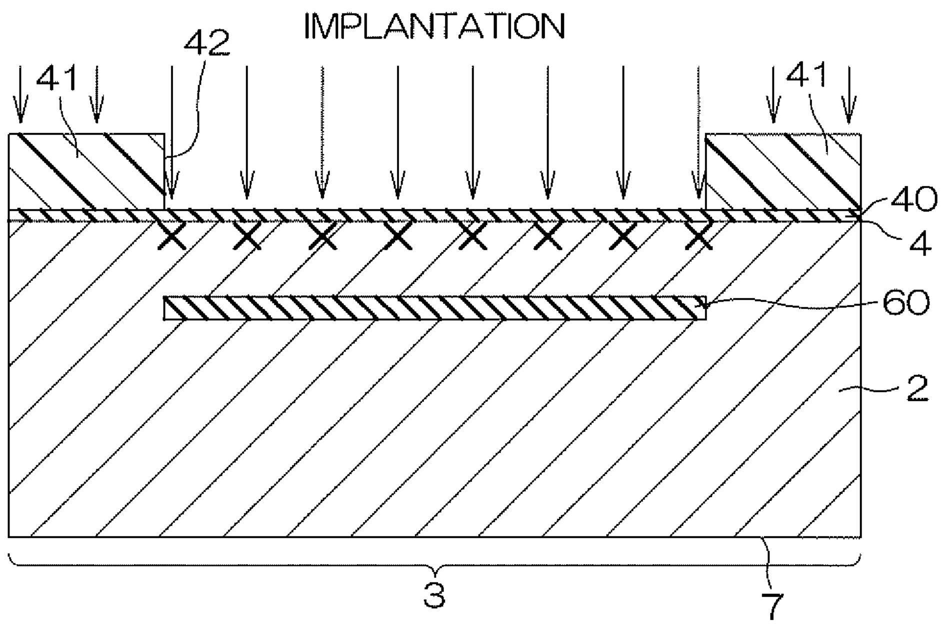
FIG. 16D is a schematic sectional view showing a step subsequent to that in FIG. 16C(a).
Figure 16E:
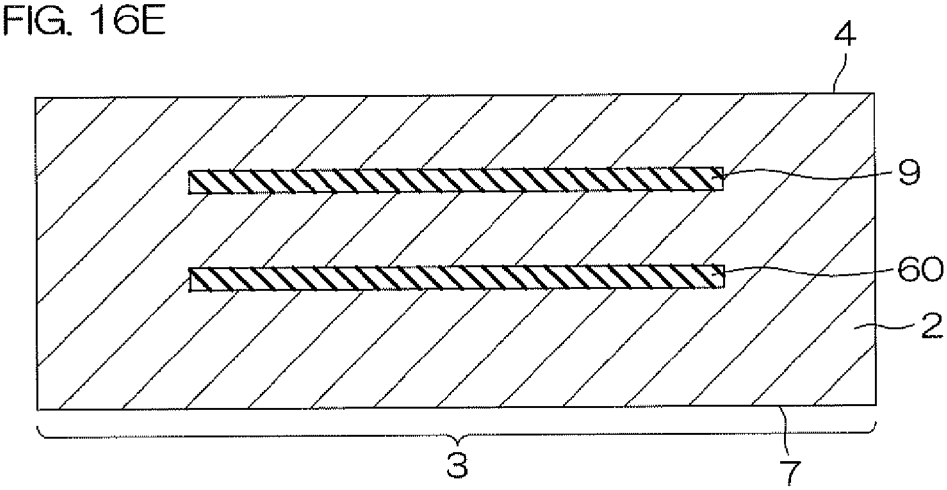
FIG. 16E is a schematic sectional view showing a step subsequent to that in FIG. 16D.
Figure 16F:
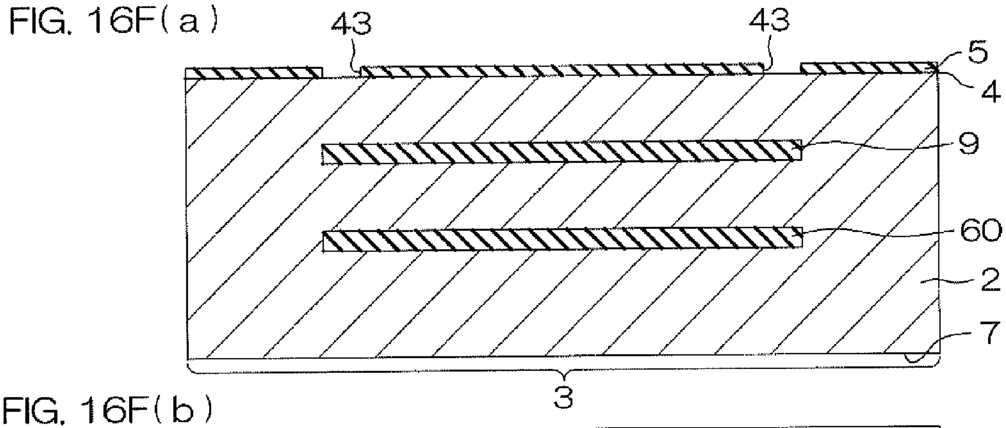
FIG. 16F(a) is a schematic sectional view showing a step subsequent to that in FIG. 16E, FIG. 16F(b) is a plan view in the state of FIG. 16F(a), and FIG. 16F(c) shows a cutting plane on the same position as that in FIG. 13(*b*) at the same point of time as that in FIG. 16F(a).
Figure 16F:
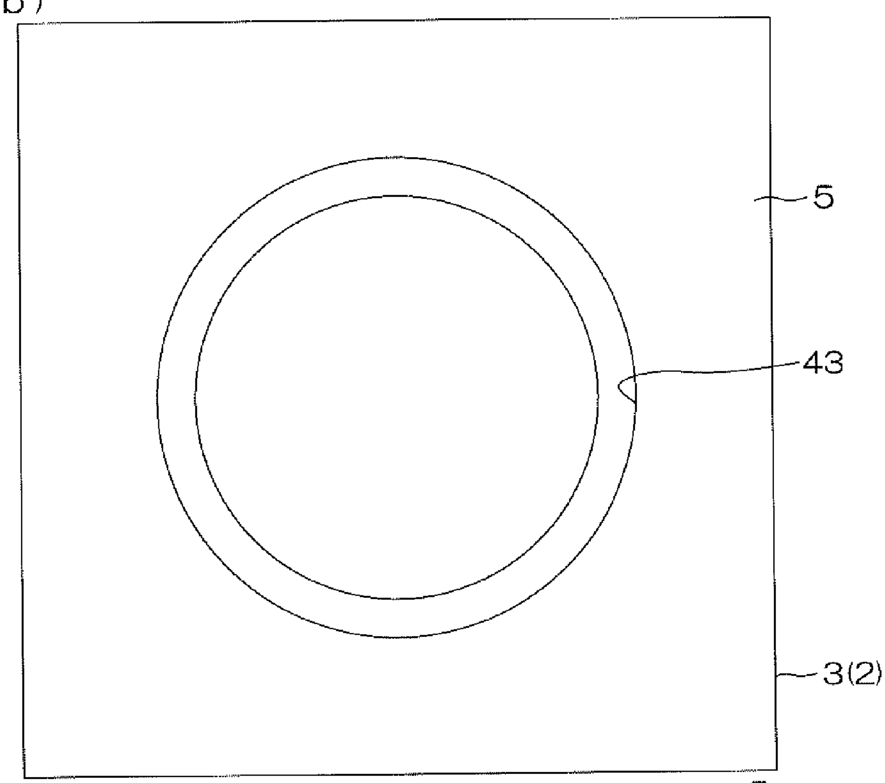
Figure 16F:
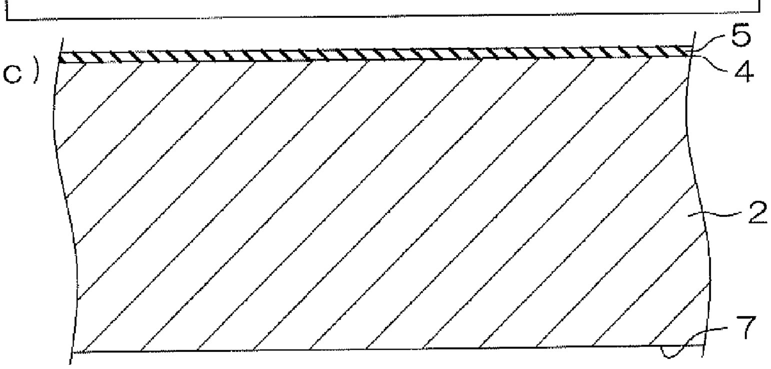
Figure 16G:
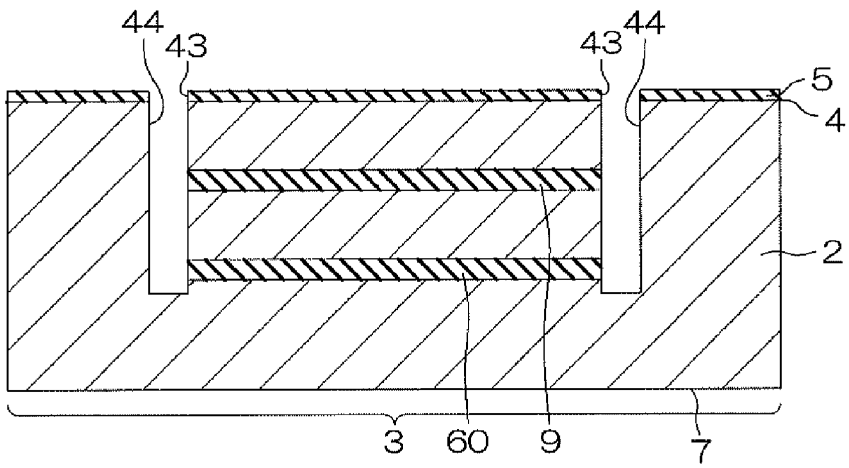
FIG. 16G(a) is a schematic sectional view showing a step subsequent to that in FIG. 16F(a), and FIG. 16G(b) is a plan view in the state of FIG. 16G(a).
Figure 16G:
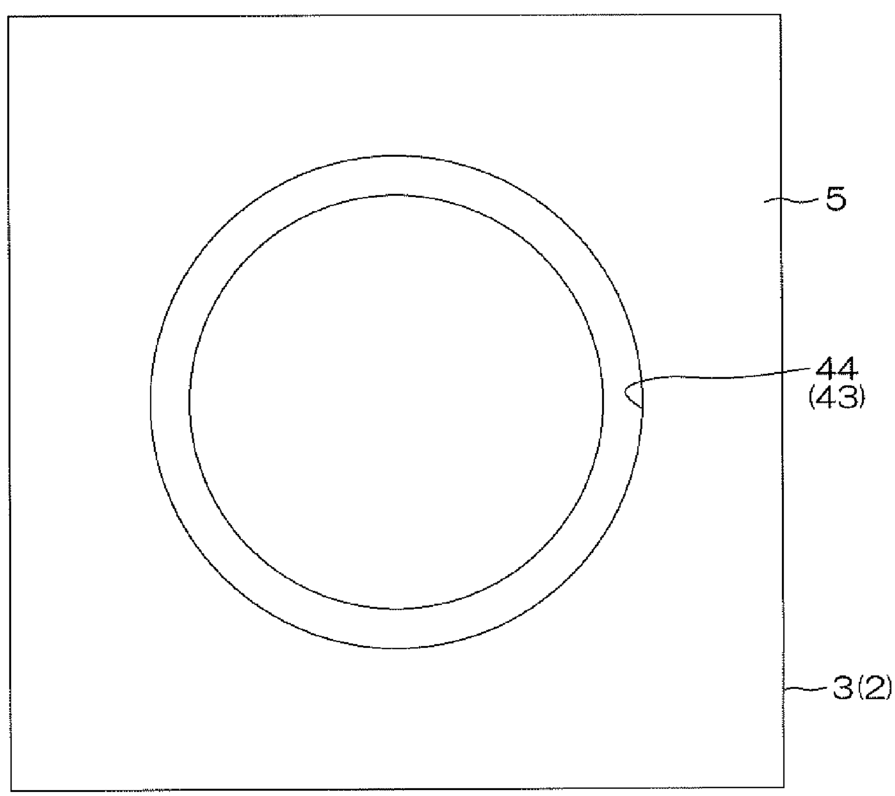
Figure 16H:
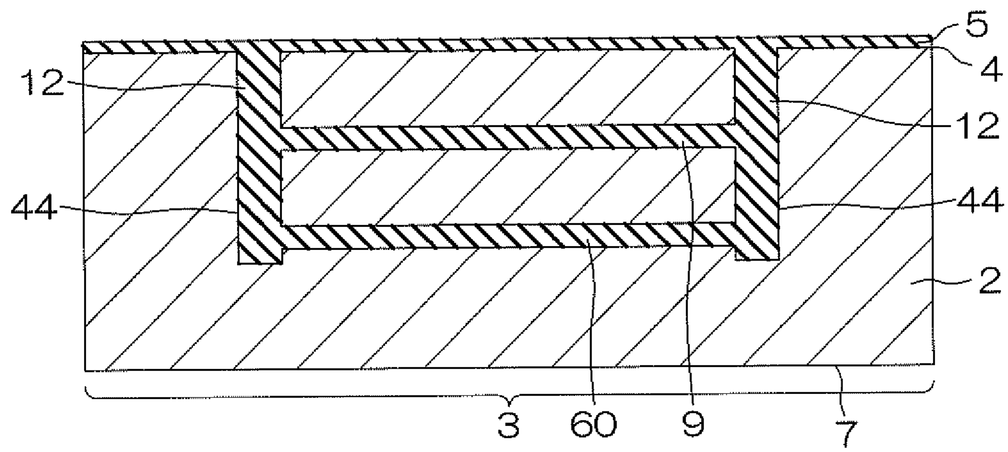
FIG. 16H is a schematic sectional view showing a step subsequent to that in FIG. 16G(a).
Figure 16:
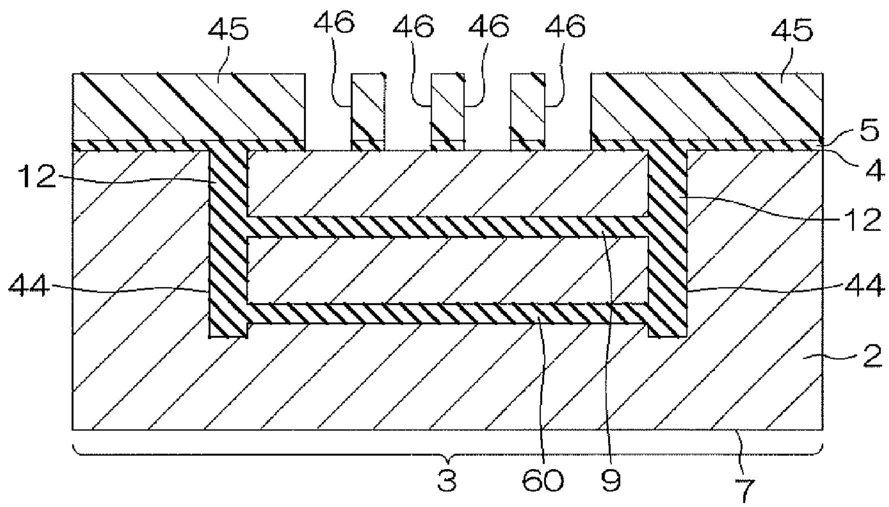
FIG. 16I(a) is a schematic sectional view showing a step subsequent to that in FIG. 16H, and FIG. 16I(b) is a plan view in the state of FIG. 16I(a).
FIG. 16J(a) is a schematic sectional view showing a step subsequent to that in FIG. 16I(a), and FIG. 16J(b) shows a cutting plane on the same position as that in FIG. 13(*b*) at the same point of time as that in FIG. 16J(a).
FIG. 16K(a) is a schematic sectional view showing a step subsequent to that in FIG. 16J(a), and FIG. 16K(b) shows a cutting plane on the same position as that in FIG. 13(*b*) at the same point of time as that in FIG. 16K(a).
FIG. 16L(a) is a schematic sectional view showing a step subsequent to that in FIG. 16K(a), and FIG. 16L(b) shows a cutting plane on the same position as that in FIG. 13(*b*) at the same point of time as that in FIG. 16L(a).
FIG. 16M(a) is a schematic sectional view showing a step subsequent to that in FIG. 16L(a), and FIG. 16M(b) shows a cutting plane on the same position as that in FIG. 13(*b*) at the same point of time as that in FIG. 16M(a).
FIG. 16N(a) is a schematic sectional view showing a step subsequent to that in FIG. 16M(a), and FIG. 16N(b) shows a cutting plane on the same position as that in FIG. 13(*b*) at the same point of time as that in FIG. 16N(a).
FIG. 16O(a) is a schematic sectional view showing a step subsequent to that in FIG. 16N(a), and FIG. 16O(b) shows a cutting plane on the same position as that in FIG. 13(*b*) at the same point of time as that in FIG. 16O(a).
FIG. 16P is a schematic sectional view showing a step subsequent to that in FIG. 16O(b).
FIG. 16Q(a) shows a cutting plane on the same position as that in FIG. 15 showing a step subsequent to that in FIG. 16P, and FIG. 16Q(b) shows a cutting plane on the same position as that in FIG. 13(*b*) at the same point of time as that in FIG. 16Q(a).
FIG. 16R is a schematic sectional view showing a step subsequent to that in FIG. 16Q(b).
FIG. 16S(a) shows a cutting plane on the same position as that in FIG. 15 illustrating a step subsequent to that in FIG. 16R, and FIG. 16S(b) shows a cutting plane on the same position as that in FIG. 13(*b*) at the same point of time as that in FIG. 16S(a).
Figure 16:
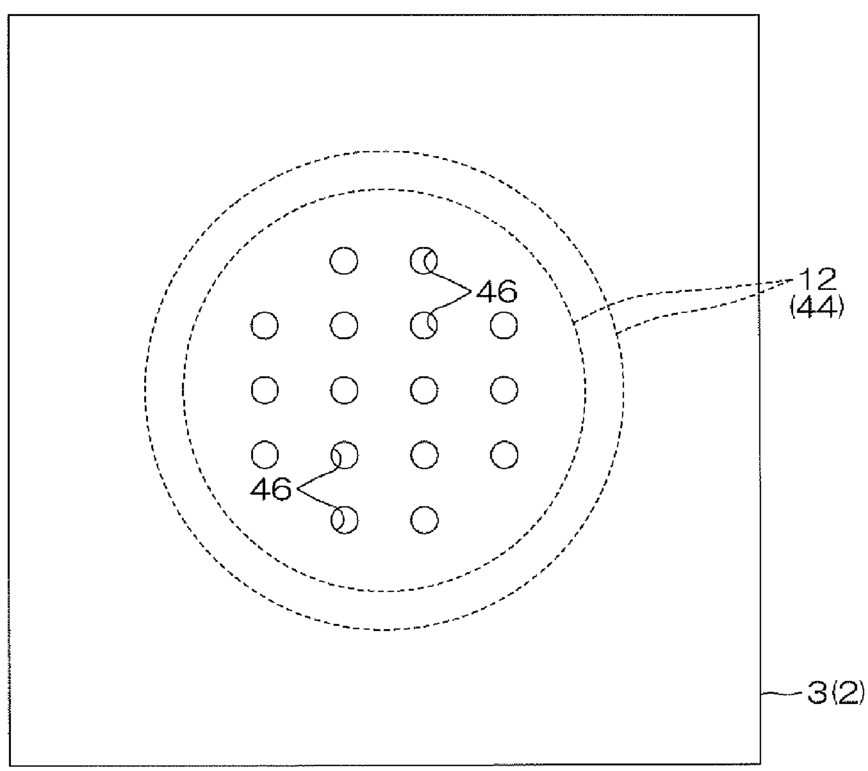
Figure 16J:
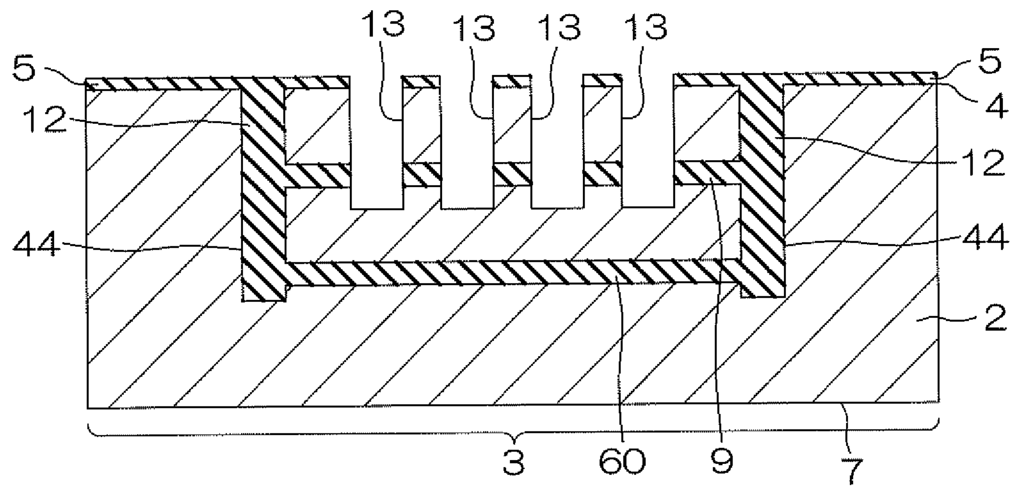
Figure 16J:
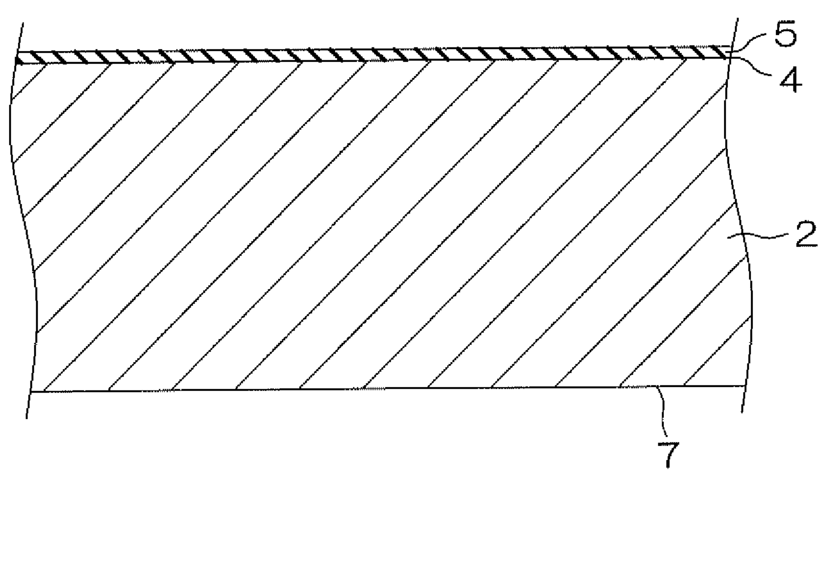
Figure 16K:
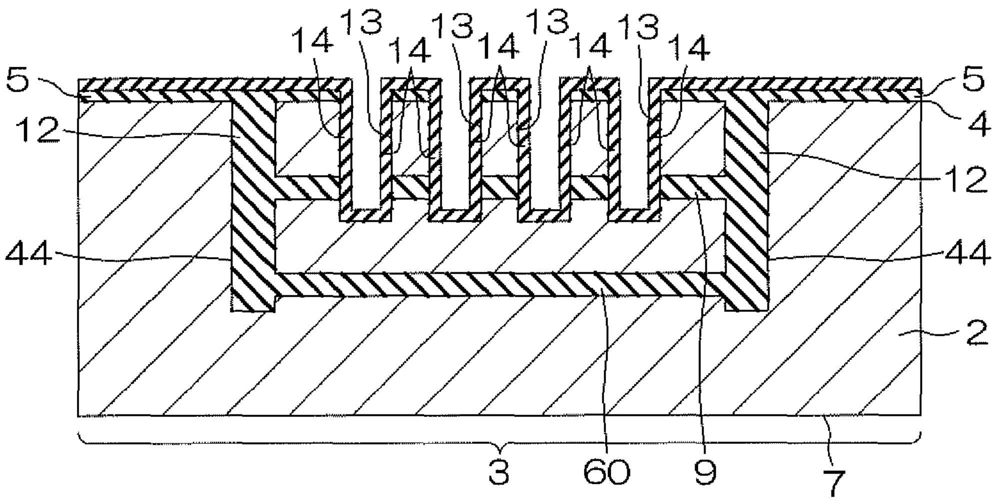
Figure 16K:
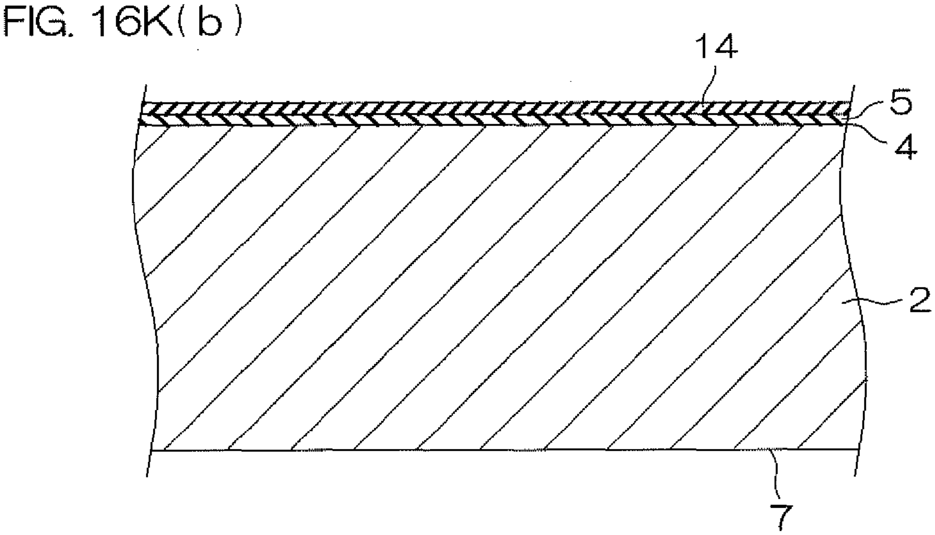
Figure 16L:
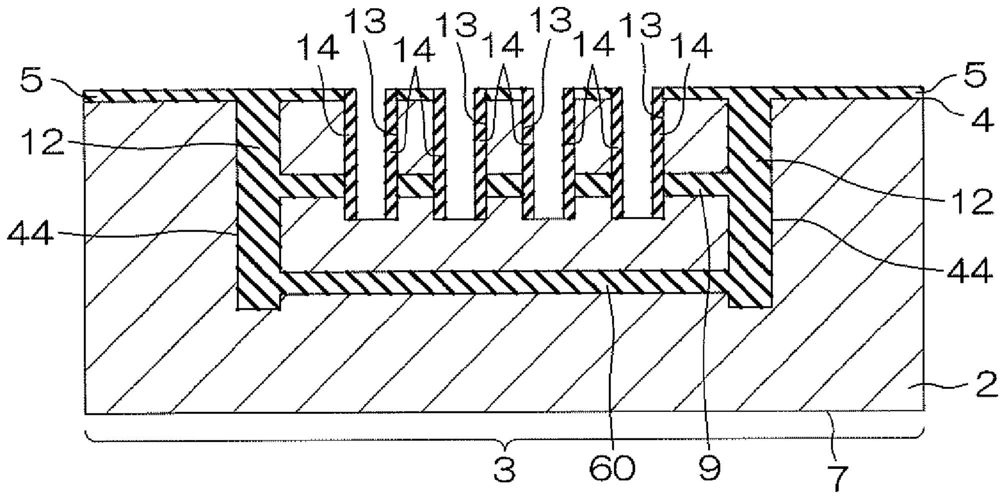
Figure 16L:
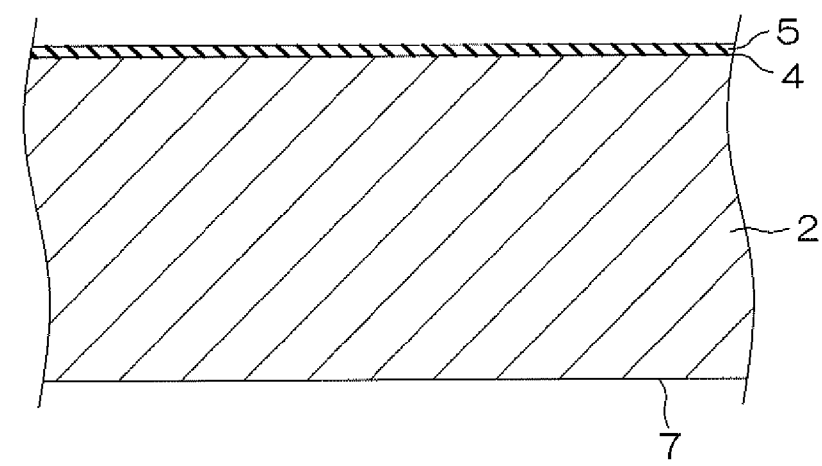
Figure 16M:
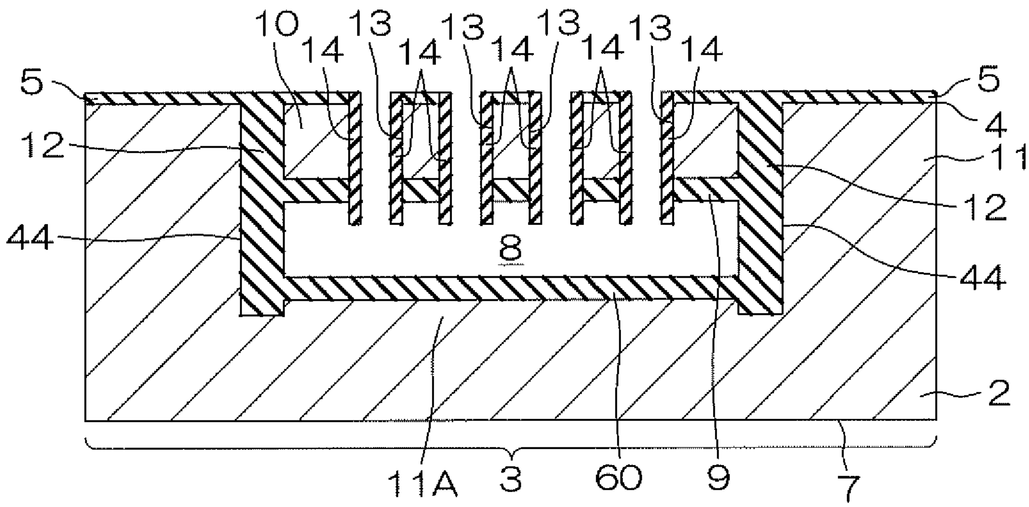
Figure 16M:
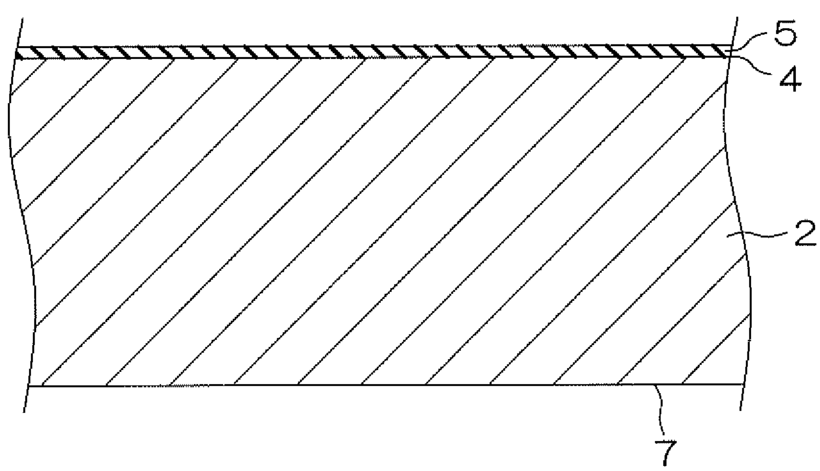
Figure 16P:
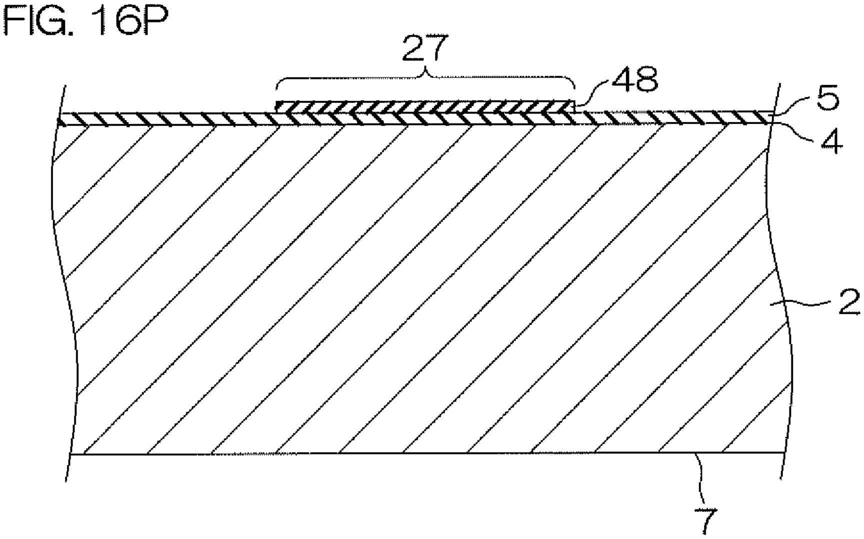
Figure 16Q:
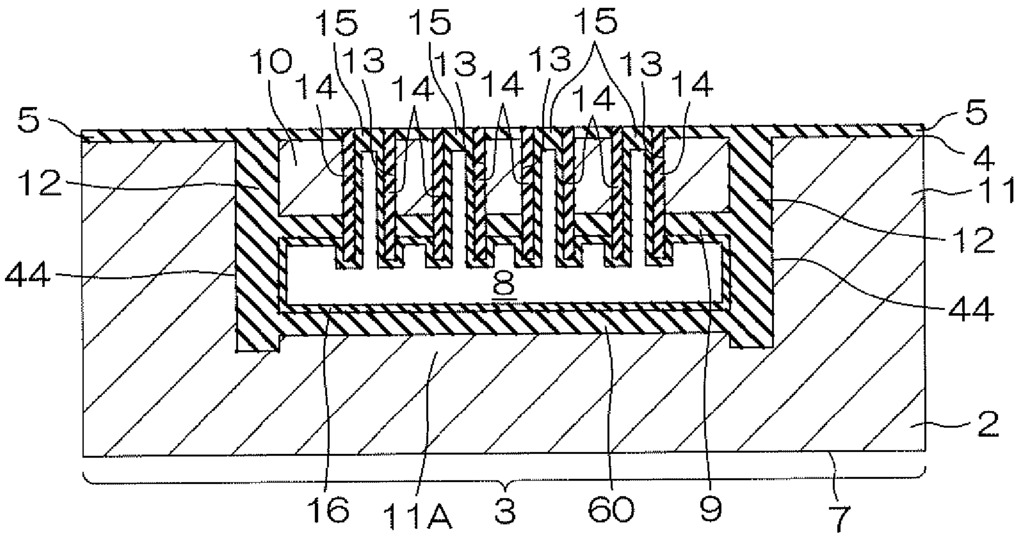
Figure 16Q:
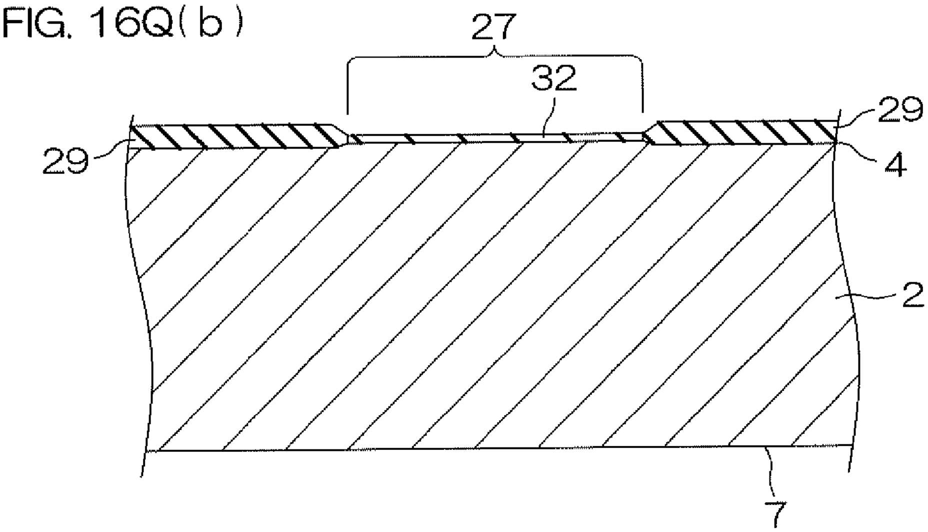
Figure 16R:
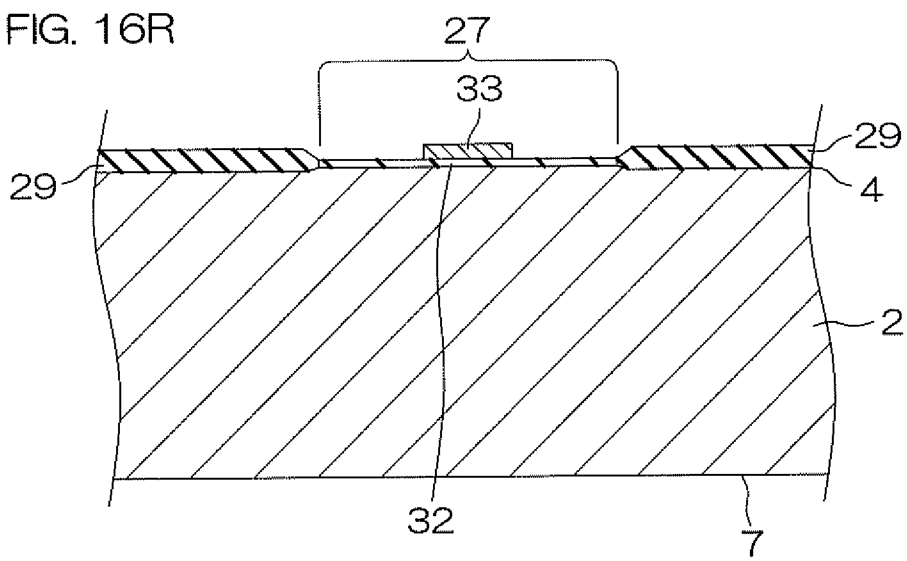
Figure 16S:
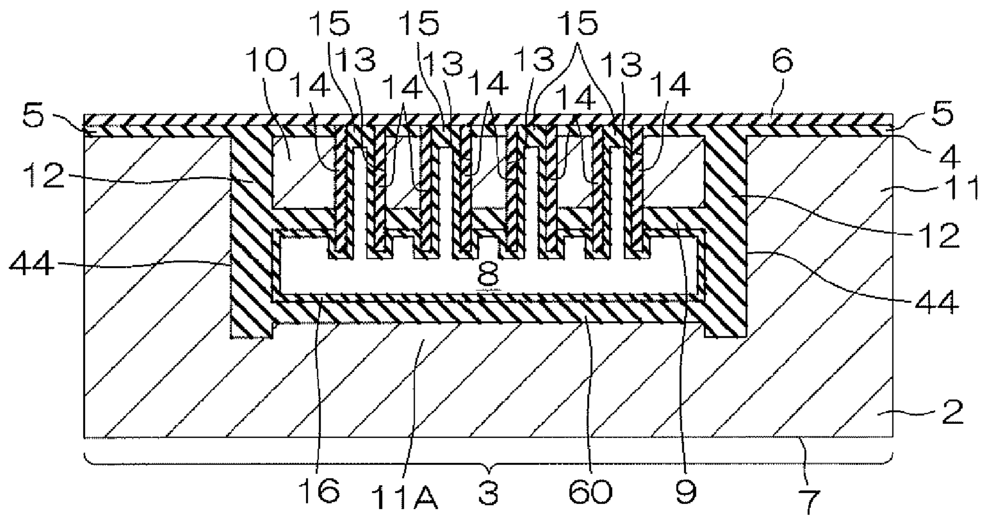
Figure 16S:
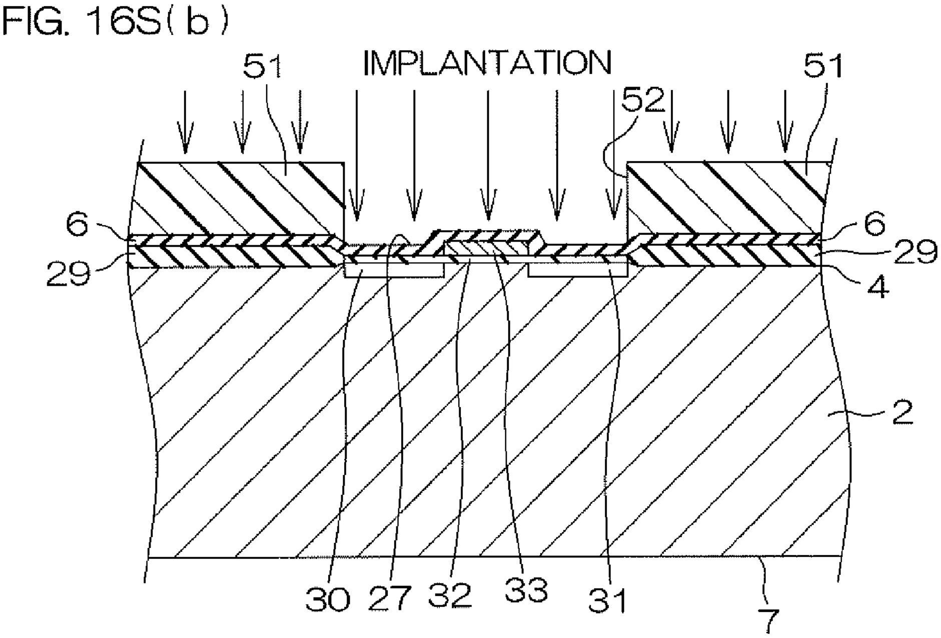

FIGS. 16A to 16S show manufacturing steps for the pressure sensor according to the sixth embodiment. In a case where two sectional views are shown in each of FIGS. 16A to 16S, the upper sectional view shows a cutting plane on the same position as that in FIG. 15, and the lower sectional view shows a cutting plane on the same position as that in FIG. 13(*b*).

In order to manufacture the pressure sensor 1 according to the sixth embodiment, the silicon substrate 2 is prepared as shown in FIG. 16A, and an oxide film 40 is formed on a surface 4 of the silicon substrate 2, as described with reference to FIG. 14A.

Then, referring to FIG. 16B, to FIG. 16B, impurity ions (nitrogen ions or oxygen ions) are implanted into a surface layer portion of the silicon substrate 2 by employing a resist pattern 41 as a mask, as described with reference to FIG. 14B. Acceleration voltage at the time of the ion implantation is 50 to 120 keV, for example.

Then, referring to FIG. 16C, epitaxial growth is performed, as described with reference to FIG. 14C. At this time, the second etching stop layer 60 is formed on a position of a prescribed depth (a depth of 10 to 17 μm, for example) from the surface 4 of the silicon substrate 2. The position where the second etching stop layer 60 is formed is a position of a depth (a depth of 10 to 17 μm from the surface 4, for example) planned to be provided with the bottom surface of the reference pressure chamber 8 in the silicon substrate 2 (see FIG. 15).

Then, referring to FIG. 16D, impurity ions (nitrogen ions or oxygen ions) are implanted into the surface layer portion (a portion on a side of the surface 4 shallower than the second etching stop layer 6) of the silicon substrate 2 again by employing a newly provided resist pattern 41 as a mask. Acceleration voltage at the time of the ion implantation is 50 to 120 keV, for example.

Then, referring to FIG. 16E, epitaxial growth is performed again. At this time, the first etching stop layer 9 is formed on a position, closer to the side of the surface 4 than the second etching stop layer 60, of a prescribed depth (0.5 to 1 μm, for example) from the surface 4 in the silicon substrate 2.

In a case where the acceleration voltage for the implantation has been high (in a case where the acceleration voltage has been 200 to 400 keV, for example), only drive-in may be performed in place of the epitaxial growth, as described above. If only the drive-in is performed in each of the case of forming the first etching stop layer 9 and the case of forming the second etching stop layer 60, however, the acceleration voltage for the implantation for forming the second etching stop layer 60 must be set higher than the acceleration voltage for the implantation for forming the first etching stop layer 9. Then, the respective etching stop layers are so formed in the silicon substrate 2 that the second etching stop layer 60 is located on a position deeper than the first etching stop layer 9.

Then, referring to FIG. 16F, a covering layer 5 is formed on the surface 4 of the silicon substrate 2, and an unshown resist pattern is formed on the covering layer 5 by photolithography, as described with reference to FIG. 14D. The resist pattern has an annular opening corresponding to the isolation layer 12 (see FIG. 15).

Then, the covering layer 5 is selectively removed by plasma etching employing the resist pattern (not shown) as a mask, and an annular opening 43 is formed in the covering layer 5. A state upon termination of the plasma etching is shown in FIG. 16F.

Then, the silicon substrate 2 is dug down by anisotropic deep RIE employing the covering layer 5 as a mask as described with reference to FIG. 14E, and an annular trench 44 is formed, as shown in FIG. 16G(a). The annular trench 44 is deeper than the second etching stop layer 60, and chips outer peripheral edge portions of the respective ones of the first etching stop layer 9 and the second etching stop layer 60 over the whole peripheries.

Then, the annular trench 44 is filled up with an oxide film, and the isolation layer 12 is embedded in the annular trench 44 as shown in FIG. 16H, as described with reference to FIG. 14F. Further, a surface of the covering layer 5 is flattened by resist etchback, as described above.

Subsequent steps are identical to the steps of the fifth embodiment subsequent to that in FIG. 14G.

In other words, referring to FIG. 16I, the covering layer 5 is first selectively removed by plasma etching employing a resist pattern 45 formed on the covering layer 5 by photolithography as a mask, as described with reference to FIG. 14G. A state upon termination of the plasma etching is shown in FIG. 16I.

Then, the silicon substrate 2 is dug down by anisotropic deep RIE employing the resist pattern 45 as a mask as described with reference to FIG. 14H, and through-holes 13 passing through the first etching stop layer 9 from the surface of the silicon substrate 2 are formed, as shown in FIG. 16J(a). A bottom surface of each through-hole 13 is on a position of a depth between the first etching stop layer 9 and the second etching stop layer 60.

Then, protective thin films 14 are formed on circumferential surfaces and the bottom surfaces of the through-holes 13 and the surface of the covering layer 5 by thermal oxidation or CVD as shown in FIG. 16K(a), as described with reference to FIG. 14I.

Then, portions of the protective thin films 14 on the bottom surfaces of the through-holes 13 and the surface of the covering layer 5 are removed by RIE as shown in FIG. 16L(a), as described with reference to FIG. 14J.

Then, an etchant is introduced into the respective through-holes 13 and a substrate material under the first etching stop layer 9 is isotropically etched as shown in FIG. 16M(a), as described with reference to FIG. 14K. Thus, the reference pressure chamber 8 is formed between the first etching stop layer 9 and the second etching stop layer 60 and around the bottom of each through-hole 13 in the silicon substrate 2. At the same time, a diaphragm 10 is formed on the first etching stop layer 9.

While a substrate material on a side closer to the surface 4 than the first etching stop layer 9 is not etched due to the presence of the first etching stop layer 9, a substrate material on a side closer to a back surface 7 than the second etching stop layer 60 is not etched either due to the presence of the second etching stop layer 60. Further, a substrate material on the outside of the isolation layer 12 is not etched either in the direction orthogonal to the thickness direction of the silicon substrate 2, due to the presence of the isolation layer 12.

Then, fillers 15 are arranged in the respective through-holes 13 while the whole areas of inner wall surfaces of the reference pressure chamber 8 are covered with a covering film 16 as shown in FIG. 16N(a), as described with reference to FIG. 14L.

Then, a step of forming an integrated circuit portion 28 (see FIG. 13(*b*)) on an integrated circuit region 27 is executed.

First, a nitride film 48 is formed on the surface of the covering layer 5 of the silicon substrate 2 as shown in FIG. 16O, as described with reference to FIG. 14M.

Then, the nitride film 48 remains only on a portion planned to become the integrated circuit region 27 by plasma etching through a mask (not shown) of a prescribed pattern as shown in FIG. 16P, as described with reference to FIG. 14N.

Then, a LOCOS layer 29 is formed and a gate oxide film 32 is thereafter formed as shown in FIG. 16Q(b), as described with reference to FIG. 14O.

Then, a gate electrode 33 is formed on the gate oxide film 32 as shown in FIG. 16R, as described with reference to FIG. 14P.

Then, a source 30 and a drain 31 are formed on the surface layer portion of the silicon substrate 2 in the integrated circuit region 27 as shown in FIG. 16S, as described with reference to FIG. 14Q.

Thereafter an insulating layer 6 is formed, and a first metal wire 17, a second metal wire 18, a first metal terminal 19 and a second metal terminal 20 (see FIG. 12) are formed as shown in FIG. 15, as described with reference to FIG. 13. At the same time, metal wires (the aforementioned source-side metal wire 35, a drain-side metal wire 36 etc., see FIG. 13(*b*)) and metal terminals (not shown) linked with the respective ones of the source 30, the drain 31 and the gate electrode 33 of the integrated circuit portion 28 are also formed. Further, a passivation film 21 is formed on the insulating layer 6, and openings 26 exposing the first metal terminal 19 and the second metal terminal 20 (also including unshown metal terminals on the side of the integrated circuit portion 28) as pads respectively and an opening 56 are formed in the passivation film 21.

Thus, the pressure sensor 1 according to the sixth embodiment is obtained.

According to the sixth embodiment, the following effects can be attained in addition to the effects described with reference to the fifth embodiment:

As shown in FIG. 16M(a), the substrate material is so etched by the etchant introduced into the through-holes 13 passing through the first etching stop layer 9 that the reference pressure chamber 8 is formed between the first etching stop layer 9 and the second etching stop layer 60 in the silicon substrate 2 in the etching step. On the other hand, the diaphragm 10 is formed on the first etching stop layer 9.

At this time, the reference pressure chamber 8 is held and partitioned by the first etching stop layer 9 and the second etching stop layer 60 in the thickness direction of the silicon substrate 2, whereby the opposed distance between a movable electrode (the diaphragm 10) and a fixed electrode 11A (the remaining portion 11) can be controlled by precisely forming the reference pressure chamber 8 in target dimensions. Therefore, a pressure sensor 1 capable of attaining improvement of sensitivity and capable of suppressing dispersion in sensitivity can be simply manufactured.

As described with reference to FIGS. 16B to 16E, further, the nitrogen ions or the oxygen ions implanted into the silicon substrate 2 are activated by heat treatment when forming the first etching stop layer 9 and the second etching stop layer 60. Thus, the first etching stop layer 9 and the second etching stop layer 60 consisting of nitride films or oxide films can be formed.

Referring to FIG. 15, the first etching stop layer 9 and the second etching stop layer 60 are insulating layers. Thus, capacitance between the diaphragm 10 and the bottom surface of the reference pressure chamber 8 can be increased, whereby the sensitivity can be improved. This effect can be attained when either one of the first etching stop layer 9 and the second etching stop layer 60 is an insulating layer.

(7) Seventh Embodiment

While a seventh embodiment is now described, the same reference signs are assigned to portions of the seventh embodiment corresponding to the portions described with reference to the fifth and sixth embodiments, and description thereof is omitted. In relation to manufacturing steps for a pressure sensor 1 according to the seventh embodiment, detailed description is omitted as to those identical to the manufacturing steps described with reference to the fifth and sixth embodiments.

FIG. 17 is a sectional view along the cutting plane line A-A in FIG. 12 in the case of the pressure sensor according to the seventh embodiment.

The pressure sensor 1 according to the seventh embodiment is provided with a second etching stop layer 60 (see FIG. 15) in place of the first etching stop layer 9 in the structure (see FIG. 13(*a*)) of the fifth embodiment.

In this case, a reference pressure chamber 8 and a diaphragm 10 are adjacent to each other through a covering film 16 in the thickness direction of a silicon substrate 2, and the reference pressure chamber 8 and the diaphragm 10 are isolated from another remaining portion 11 of the silicon substrate 2 by an isolation layer 12 and the second etching stop layer 60.

FIGS. 18A to 18Q show manufacturing steps for the pressure sensor according to the seventh embodiment. In a case where two sectional views are shown in each of FIGS. 18A to 18Q, the upper sectional view shows a cutting plane on the same position as that in FIG. 17, and the lower sectional view shows a cutting plane on the same position as that in FIG. 13(*b*).

In order to manufacture the pressure sensor 1 according to the seventh embodiment, the silicon substrate 2 is prepared as shown in FIG. 18A, and an oxide film 40 is formed on a surface 4 of the silicon substrate 2, as described with reference to FIG. 14A.

Then, referring to FIG. 18B, impurity ions (nitrogen ions or oxygen ions) are implanted into a surface layer portion of the silicon substrate 2 by employing a resist pattern 41 as a mask, as described with reference to FIG. 14B. Acceleration voltage at the time of the ion implantation is 50 to 120 keV.

Then, referring to FIG. 18C, epitaxial growth is performed, as described with reference to FIG. 14C. At this time, the second etching stop layer 60 is formed on a position of a prescribed depth (a depth of 10 to 17 μm, for example) from the surface 4 of the silicon substrate 2. The position where the second etching stop layer 70 is formed is a position of such a depth (a depth of 10 to 17 μm, for example) that a bottom surface of the reference pressure chamber 8 is planned to be formed on the silicon substrate 2 (see FIG. 17).

Subsequent steps are identical to the steps of the fifth embodiment subsequent to that in FIG. 14D.

In other words, referring to FIG. 18D, a covering layer 5 is formed on the surface 4 of the silicon substrate 2, the covering layer 5 is selectively removed by plasma etching employing an unshown resist pattern as a mask, and an annular opening 43 is formed in the covering layer 5, as described with reference to FIG. 14D.

Then, the silicon substrate 2 is dug down by anisotropic deep RIE employing the covering layer 5 as a mask as described with reference to FIG. 14E, and an annular trench 44 is formed, as shown in FIG. 18E(a). The annular trench 44 is deeper than the second etching stop layer 60, chips an outer peripheral edge portion of the second etching stop layer 60 over the whole periphery, and surrounds a prescribed region of the silicon substrate 2 above the second etching stop layer 60.

Then, the annular trench 44 is filled up with an oxide film, and the isolation layer 12 is embedded in the annular trench 44 as shown in FIG. 18F, as described with reference to FIG. 14F. Further, the surface of the covering layer 5 is flattened by resist etchback, as described above.

Then, referring to FIG. 18G, the covering layer 5 is selectively removed by plasma etching employing a resist pattern 45 formed on the covering layer 5 by photolithography as a mask, as described with reference to FIG. 14G. A state upon termination of the plasma etching is shown in FIG. 18G.

Then, the silicon substrate 2 is dug down by anisotropic deep RIE employing the resist pattern 45 as a mask as described with reference to FIG. 14H, and through-holes 13 concaved from a side of the surface 4 of the silicon substrate 2 are formed, as shown in FIG. 18H(a). Further, the remaining portions of the resist pattern 45 are peeled off. A bottom surface of each through-hole 13 is present on a position shallower than the second etching stop layer 60.

Then, protective thin films 14 are formed on circumferential surfaces and the bottom surfaces of the through-holes 13 and the surface of the covering layer 5 by thermal oxidation or CVD as shown in FIG. 18I(a), as described with reference to FIG. 14I.

Then, portions of the protective thin films 14 on the bottom surfaces of the through-holes 13 and the surface of the covering layer 5 are removed by RIE as shown in FIG. 18J(a), as described with reference to FIG. 14J.

Then, an etchant is introduced into the respective through-holes 13 and a substrate material under each through-hole 13 (around the bottom of each through-hole 13) is isotropically etched as shown in FIG. 18K(a), as described with reference to FIG. 14K. Thus, the reference pressure chamber 8 is formed in the silicon substrate 2 above the second etching stop layer 60 and around the bottom of each through-hole 13. At the same time, the diaphragm 10 is formed above the reference pressure chamber 8. A substrate material on a side closer to a back surface 7 than the second etching stop layer 60 is not etched, due to the presence of the second etching stop layer 60. Further, a substrate material on the outside of the isolation layer 12 is not etched either in a direction orthogonal to the thickness direction of the silicon substrate 2, due to the presence of the isolation layer 12.

Then, fillers 15 are arranged in the respective through-holes 13, and the whole areas of inner wall surfaces of the reference pressure chamber 8 are covered with the covering film 16 as shown in FIG. 18L(a), as described with reference to FIG. 14L.

Then, a step of forming an integrated circuit portion 28 (see FIG. 13(*b*)) on an integrated circuit region 27 is executed.

First, a nitride film 48 is formed on the surface of the covering layer 5 of the silicon substrate 2 as shown in FIG. 18M, as described with reference to FIG. 14M.

Then, the nitride film 48 remains only on a portion planned to become the integrated circuit region 27 by plasma etching through a mask (not shown) of a prescribed pattern as shown in FIG. 18N, as described with reference to FIG. 141N.

Then, a LOCOS layer 29 is formed and a gate oxide film 32 is thereafter formed as shown in FIG. 18O(*b*), as described with reference to FIG. 14O.

Then, a gate electrode 33 is formed on the gate oxide film 32 as shown in FIG. 18P, as described with reference to FIG. 14P.

Then, a source 30 and a drain 31 are formed on the surface layer portion of the silicon substrate 2 in the integrated circuit region 27 as shown in FIG. 18Q, as described with reference to FIG. 14Q.

Thereafter an insulating layer 6 is formed, and a first metal wire 17, a second metal wire 18, a first metal terminal 19 and a second metal terminal 20 (see FIG. 12) are formed as shown in FIG. 17, as described with reference to FIG. 13. At the same time, metal wires (the aforementioned source-side metal wire 35, a drain-side metal wire 36 etc., see FIG. 13(*b*)) and metal terminals (not shown) linked with the respective ones of the source 30, the drain 31 and the gate electrode 33 of the integrated circuit portion 28 are also formed. Further, a passivation film 21 is formed on the insulating layer 6, and openings 22 exposing the first metal terminal 19 and the second metal terminal 20 (also including unshown metal terminals on the side of the integrated circuit portion 28) as pads respectively and an opening 56 are formed in the passivation film 21.

Thus, the pressure sensor 1 according to the seventh embodiment is obtained.

According to the seventh embodiment, the following effects can be attained in addition to the effects described with reference to the fifth and sixth embodiments:

As shown in FIG. 18K(a), the substrate material under the through-holes 13 is etched by the etchant introduced into the through-holes 13 shallower than the second etching stop layer 60 in the silicon substrate 2 in the etching step, whereby the reference pressure chamber 8 is formed on the second etching stop layer 60. On the other hand, the diaphragm 10 is formed on the reference pressure chamber 8.

At this time, the bottom of the reference pressure chamber 8 is partitioned by the second etching stop layer 60 in the thickness direction of the silicon substrate 2, whereby the reference pressure chamber 8 can be formed in target dimensions. Therefore, a pressure sensor 1 capable of attaining improvement of sensitivity and capable of suppressing dispersion in sensitivity can be simply manufactured.

(8) Eighth Embodiment

FIG. 19 is an enlarged plan view of a pressure sensor according to an eighth embodiment. FIG. 20(*a*) is a sectional view along a cutting plane line A-A in FIG. 19, and FIG. 20(*b*) is a sectional view of a principal portion of the pressure sensor in an integrated circuit region of FIG. 19.

As shown in FIG. 20(*a*), each pressure sensor 1 includes a silicon substrate 2 of a magnitude corresponding to a rectangular region 3. A recess portion 6 concaved toward the side of a back surface 5 of the silicon substrate 2 is formed on a surface 4 of the silicon substrate 2. The recess portion 6 is provided in a circular shape (three-dimensionally in a cylindrical shape) in plan view. A bottom surface of the recess portion 6 is flat, and extends parallelly to the surface 4. The back surface 5 of the silicon substrate 2 is an exposed surface.

The surface 4 (also including a portion partitioning the recess portion 6) of the silicon substrate 2 is covered with an insulating layer 7 made of silicon oxide ($SiO_2$). The insulating layer 7 also covers a side surface (a cylindrical surface) and the bottom surface of the recess portion 6. A polysilicon layer 8 (a conductor layer) is embedded in the recess portion 6. The polysilicon layer 8 is provided in a columnar shape remaining inside the recess portion 6. The polysilicon layer 8 is flat in the thickness direction of the silicon substrate 2. A top surface of the polysilicon layer 8 and a surface of the insulating layer 7 in a region other than the recess portion 6 are generally flush with each other. The polysilicon layer 8 is made of polysilicon reduced in resistance by adding a P-type or N-type impurity. Specific resistance of the polysilicon layer 8 is 5 to 500 mΩ·cm, for example.

A covering layer 9 is formed on both of the top surface of the polysilicon layer 8 and the surface of the insulating layer 7 in the region other than the recess portion 6. Further, a surface insulating layer 10 is formed on a surface of the covering layer 9. Both of the covering layer 9 and the surface insulating layer 10 are made of silicon oxide ($SiO_2$), for example.

In the silicon substrate 2, a reference pressure chamber 11 is formed under the recess portion 6. Therefore, the polysilicon layer 8 is positioned immediately above the reference pressure chamber 11 (on the side of the surface 4) through the insulating layer 7 provided on the bottom of the recess portion 6.

According to this embodiment, the reference pressure chamber 11 is a flat cavity (a flat space) spreading parallelly to the surface 4 and the back surface 5 of the silicon substrate 2 and having a small height in the vertical direction (the thickness direction of the silicon substrate 2). In other words, the dimension of the reference pressure chamber 11 in the direction parallel to the surface 4 and the back surface 7 is larger than the vertical dimension. One reference pressure chamber 11 is formed in each pressure sensor 1. According to this embodiment, the reference pressure chamber 11 is provided in a circular shape (three-dimensionally in a cylindrical shape) in plan view. The insulating layer 7 provided on the bottom of the recess portion 6 partitions the reference pressure chamber 11 from the upper side (the side of the surface 4).

The diameter of the reference pressure chamber 11 is slightly larger than the diameter of the recess portion 6. In a direction orthogonal to the thickness direction of the silicon substrate 2, therefore, the reference pressure chamber 11 is formed to reach a region wider than the polysilicon layer 8 provided in the recess portion 6. In other words, a forming region of the reference pressure chamber 11 includes a forming region of the polysilicon layer 8 in plan view. Thus, an outer peripheral region (an outer region opposite to the polysilicon layer 8) of the insulating layer 7 provided on the cylindrical surface of the recess portion 6 in the silicon substrate 2 becomes an outer peripheral film portion 24 having a thickness generally equal to that of the polysilicon layer 8. Therefore, a movable film 25 including the polysilicon layer 8, the insulating layer 7 provided on the cylindrical surface of the recess portion 6 and the outer peripheral film portion 24 is constituted. The movable film 25 is a thin film having a thickness generally equal to that of the polysilicon layer 8. The whole of the movable film 25 is displaceable in a direction opposed to the reference pressure chamber 11. The polysilicon layer 8 is positioned on a central region of the movable film 25 inside the outer peripheral film portion 24.

The polysilicon layer 8 constitutes a diaphragm 12 circular in plan view. The diaphragm 12 is formed on a surface layer portion of the silicon substrate 2 to partition the reference pressure chamber 11 from above. The diaphragm 12 is a thin film displaceable in the direction (the thickness direction of the silicon substrate 2) opposed to the reference pressure chamber 11. The diaphragm 12 partially forms the movable film 25, and is positioned on the central region of the movable film 25.

The diameter of the diaphragm 12 is slightly smaller than the diameter of the reference pressure chamber 11, and 500 to 600 μm in this embodiment. The thickness of the diaphragm 12 is 0.5 to 1 μm, for example. However, the thickness of the diaphragm 12 is exaggeratedly drawn in FIG. 20(*a*), in order to clearly show the structure.

The insulating layer 7 provided on the side surface and the bottom surface of the recess portion 6 is in contact with the whole area of a peripheral end surface of the diaphragm 12 and the whole area of a lower surface. The silicon substrate 2 supports a peripheral edge portion of the diaphragm 12 through the insulating layer 7 arranged in the recess portion 6. In this state, the diaphragm 12 is embedded in the silicon substrate 2, and isolated from the silicon substrate 2 by the insulating layer 7. According to this embodiment, the diaphragm 12 is arranged generally at the center of the rectangular region 3 (the pressure sensor 1) in plan view (see FIG. 19).

A large number of through-holes 13 circular in plan view are formed in the diaphragm 12 at prescribed regular intervals over the whole area inside a contour L of the diaphragm 12 (see FIG. 19). According to this embodiment, the plurality of through-holes 13 are regularly arrayed in the form of a matrix along two directions intersecting with each other in plan view. All through-holes 13 pass through a portion (also including the polysilicon layer 8, the covering layer 9 and the insulating layer 7 on the bottom of the recess portion 6) between the covering layer 9 on the surface of the diaphragm 12 and the reference pressure chamber 11, and communicate with the reference pressure chamber 11. According to this embodiment, the diameter of each through-hole 13 is 0.5 μm, for example. According to this embodiment, the depth of each through-hole 13 is 2 to 20 μm, for example.

Inner wall surfaces of the through-holes 13 are covered with protective thin films 14 (sidewall insulating layers) made of silicon oxide ($SiO_2$). The protective thin films 14 are provided in the form of tubes (in the form of cylinders here) to cover the inner wall surfaces of the through-holes 13, and so arranged in the through-holes 13 as not to project into the reference pressure chamber 11.

In all through-holes 13, oxide films, made of silicon oxide ($SiO_2$), formed by CVD (Chemical Vapor Deposition) are charged and embedded inside the protective thin films 14. Thus, all through-holes 13 are filled up with fillers 15 (embedding materials) of the oxide films, and the flat space under the through-holes 13 is sealed as the reference pressure chamber 11 whose internal pressure is regarded as reference at a time of pressure detection. According to this embodiment, the reference pressure chamber 11 is held in a vacuum or decompressed state ($10^{-5}$ Torr, for example). The oxide films charged into the through-holes 13 form the fillers 15 filling up the respective through-holes 13 on respective upper portions of the through-holes 13. These oxide films further form a covering film 16 continuous with lower portions of the fillers 15. The covering film 16 reaches the interior of the reference pressure chamber 11, and covers the whole areas of inner wall surfaces of the reference pressure chamber 11.

In each pressure sensor 1, a first metal wire 17 (a first wire) is connected to the diaphragm 12, and a second metal wire 18 (a second wire) is connected to the silicon substrate 2 isolated from the diaphragm 12 by the insulating layer 7. According to this embodiment, the first metal wire 17 and the second metal wire 18 are made of aluminum (Al), and provided on the surface insulating layer 10. The first metal wire 17 passes through the surface insulating layer 10 and the covering layer 9, and is connected to the diaphragm 12. The second metal wire 18 passes through the surface insulating layer 10, the covering layer 9 and the insulating layer 7, and is connected to the silicon substrate 2.

As shown in FIG. 19, a first metal terminal 19 is connected to the first metal wire 17, and a second metal terminal 20 is connected to the second metal wire 18. According to this embodiment, the first metal terminal 19 and the second metal terminal 20 are made of aluminum (Al), and formed on the surface insulating layer 10 (see FIG. 20(*a*)). The first metal terminal 19 is arranged on any one of the four corners of the rectangular region 3 in plan view. The second metal terminal 20 is arranged in the vicinity of a generally central position of one side of the rectangular region 3 in the longitudinal direction.

The first metal wire 17 linearly extends along the diametral direction of the diaphragm 12, is generally perpendicularly bent around an outer peripheral edge of the rectangular region 3, linearly extends along the outer peripheral edge of the rectangular region 3, and is connected to the first metal terminal 19. The second metal wire 18 linearly extends along the diametral direction of the diaphragm 12, and is connected to the second metal terminal 20.

As shown in FIG. 20(*a*), the first metal wire 17, the second metal wire 18, the first metal terminal 19 and the second metal terminal 20 are covered with a passivation film 21 made of silicon nitride (SiN). However, the first metal terminal 19 does not appear on the cutting plane of FIG. 20(*a*). Openings 22 exposing the first metal terminal 19 and the second metal terminal 20 as pads respectively are formed in the passivation film 21. Referring to FIG. 19, illustration of the passivation film 21 is omitted.

In the pressure sensor 1, such a capacitor structure (a capacitor) is formed that the diaphragm 12 serves as a movable electrode and the silicon substrate 2 serves as a fixed electrode. More specifically, an opposed portion of the silicon substrate 2 opposed to the diaphragm 12 from below through the reference pressure chamber 11 forms a fixed electrode portion 23.

When bias voltage is supplied to the respective ones of the first metal terminal 19 and the second metal terminal 20, potential difference between the movable electrode (the diaphragm 12) and the fixed electrode portion 23 becomes constant. When the diaphragm 12 receives pressure (gas pressure, for example) from the side of the surface 4 of the silicon substrate 2, pressure difference is caused between the interior and the exterior of the reference pressure chamber 11 (between both surfaces of the diaphragm 12), whereby the overall movable film 25 including the diaphragm 12 is displaced in the thickness direction of the silicon substrate 2. In the movable film 25, the diaphragm 12 present on a central region thereof is most remarkably displaced (warps) at this time. Following this, the interval (the depth of the reference pressure chamber 11) between the diaphragm 12 and the fixed electrode portion 23 changes, and capacitance between the diaphragm 12 and the fixed electrode portion 23 changes. The magnitude of pressure caused in the pressure sensor 1 can be detected on the basis of the change in the capacitance. In other words, the pressure sensor 1 is a capacitance pressure sensor.

The diaphragm 12 is embedded in the silicon substrate 2 to be brought in such a structure that only the peripheral edge portion of the diaphragm 12 is supported by the silicon substrate 2, whereby parasitic capacitance can be suppressed small by minimizing opposed areas of the diaphragm 12 and the fixed electrode portion 23.

Referring to FIG. 19, an integrated circuit region 27 (a region surrounded by two-dot chain lines) is provided between the outer peripheral edge (more detailedly, a portion of the first metal wire 17 linearly extending along the outer peripheral edge of the rectangular region 3) of each rectangular region 3 of the silicon substrate 2 and the diaphragm 12. The integrated circuit region 27 is a generally rectangular annular region surrounding the diaphragm 12 in plan view. An integrated circuit portion 28 including integrated circuit devices (functional elements) such as transistors, resistors and others is formed in the integrated circuit region 27. In other words, the pressure sensor 1 includes the integrated circuit portion 28 formed on the silicon substrate 2 provided with the diaphragm 12 etc.

More specifically, the integrated circuit region 27 is isolated from other regions of the silicon substrate 2 by a LOCOS layer 29, as shown in FIG. 20(*b*). A source 30 and a drain 31 are formed on the surface layer portion of the silicon substrate 2 in the integrated circuit region 27, and a gate oxide film 32 is formed on a portion of the surface 4 of the silicon substrate 2 corresponding to the integrated circuit region 27, to extend over the source 30 and the drain 31. A gate electrode 33 is formed on the gate oxide film 32, to be opposed to a portion (a portion where a channel is formed) between the source 30 and the drain 31. The surface insulating layer 10 is formed on the LOCOS layer 29 and the gate oxide film 32, to cover the gate electrode 33.

A source-side metal wire 35 and a drain-side metal wire 36 are provided on a surface of the surface insulating layer 10. The source-side metal wire 35 is connected to the source 30 through the surface insulating layer 10 and the gate oxide film 32. The drain-side metal wire 36 is connected to the drain 31 through the surface insulating layer 10 and the gate oxide film 32.

The passivation film 21 is formed on the surface of the surface insulating layer 10, to cover the source-side metal wire 35 and the drain-side metal wire 36. An element group arranged on the integrated circuit region 27 is referred to as the integrated circuit portion 28.

FIGS. 21A to 21R show manufacturing steps for the pressure sensor according to the eighth embodiment. In a case where two sectional views are shown in each of FIGS. 21A to 21R, the upper sectional view shows a cutting plane on the same position as that in FIG. 20(*a*), and the lower sectional view shows a cutting plane on the same position as that in FIG. 20(*b*).

In order to manufacture the pressure sensor 1, the silicon substrate 2 (a wafer) is prepared, as shown in FIG. 21A. According to this embodiment, the thickness of the silicon substrate 2 at this point of time is about 300 μm. More specifically, a state after selecting either a silicon substrate 2 having a diameter of 6 inches and a thickness of about 625 μm or a silicon substrate 2 having a diameter of 8 inches and a thickness of about 725 μm and reducing the thickness up to 300 μm is shown in FIG. 21A.

Then, an oxide film 40 having a thickness of several 100 Å is formed on the surface 4 of the silicon substrate 2 by thermal oxidation or CVD, and an unshown resist pattern is formed on the oxide film 40 by photolithography. The resist pattern has a circular opening corresponding to the recess portion 6 (see FIG. 20(*a*)).

Then, the oxide film 40 is selectively removed by plasma etching employing the resist pattern (not shown) as a mask. A state upon termination of the plasma etching is shown in FIG. 21B, and a circular opening 41 is formed in the oxide film 40.

Then, the silicon substrate 2 is dug down by anisotropic etching (CDE (Chemical Dry Etching), for example) employing the oxide film 40 as a mask, and the recess portion 6 is formed in the silicon substrate 2, as shown in FIG. 21C. The depth of the recess portion 6 is about 1 μm here. Thereafter the oxide film 40 is removed.

Then, the insulating layer 7 is formed on the surface 4 of the silicon substrate 2 by thermal oxidation or CVD, as shown in FIG. 21D. At this time, the insulating layer 7, covering the overall surfaces of the silicon substrate 2, is formed also on inner wall surfaces (the side surface and the bottom surface) of the recess portion 6.

Then, a polysilicon film 42 made of polysilicon is formed on the surface of the insulating layer 7 by CVD, as shown in FIG. 21E. A thickness dimension of the polysilicon film 42 is generally identical to the depth dimension (about 1 μm) of the recess portion 6.

Then, an impurity (phosphorus (P) ions or boron (B) ions, for example) is implanted into the polysilicon film 42 (ion implantation). Thereafter heat treatment is performed on the silicon substrate 2. Thus, the polysilicon film 42 is reduced in resistance.

Then, the polysilicon film 42 projecting to the outside of the recess portion 6 is polished and removed by CMP (Chemical Mechanical Polishing), as shown in FIG. 4F(a). Thus, the polysilicon film 42 enters a state present only in the recess portion 6 and embedded in the recess portion 6 as the polysilicon layer 8. In this state, the surface of the insulating layer 7 in the region other than the recess portion 6 is exposed, and generally flush with an upper surface of the polysilicon layer 8.

Thereafter the insulating layer 7 (see FIG. 21F(c)) on the side of the integrated circuit region 27 is removed.

Then, the covering layer 9 made of silicon oxide ($SiO_2$) is formed on the surface of the insulating layer 7 in the region other than the recess portion 6, the top surface of the polysilicon layer 8 and the surface 4 of the silicon substrate 2 on the side of the integrated circuit region 27 by thermal oxidation or CVD, as shown in FIG. 21G.

Then, a resist pattern 45 is formed on the covering layer 9 by photolithography, as shown in FIG. 21H(a). The resist pattern 45 has a plurality of openings 46 corresponding to the plurality of through-holes 13 (see FIGS. 19 and 20(*a*)). When circularly forming sections of the through-holes 13, the openings 46 are circularly formed in response thereto. The diameter of each opening 46 is about 0.5 μm, similarly to the through-holes 13. All openings 46 are formed inside the polysilicon layer 8 in plan view (see FIG. 21H(b)).

Then, the covering layer 9 is selectively removed by plasma etching employing the resist pattern 45 as a mask. Thus, openings corresponding to the through-holes 13 are formed in the covering layer 9. A state upon termination of the plasma etching is shown in FIG. 21H.

Then, the polysilicon layer 8 is dug down by anisotropic deep RIE (Reactive Ion Etching) employing the resist pattern 45 as a mask.

Thus, first hoe portions 47 are formed on positions of the polysilicon layer 8 coinciding with the respective openings 46 (in other words, portions selectively removed from the covering layer 9) of the resist pattern 45, as shown in FIG. 21I(a). When the openings 46 are circular, columnar recessed first hole portions 47 are formed. The first hole portions 47 extend downward with a depth reaching the insulating layer 7 on the bottom of the recess portion 6 from the covering layer 9 on the surface of the polysilicon layer 8, and are so formed that bottom surfaces of the respective first hole portions 47 coincide with the surface of the insulating layer 7 on the bottom of the recess portion 6. In other words, the first hole portions 47 do not pass through the insulating layer 7. At the time of the formation of the first hole portions 47, the resist pattern 45 is simultaneously etched and reduced in thickness. After the formation of the first hole portions 47, remaining portions of the resist pattern 45 are peeled off.

The deep RIE for forming the first hole portions 47 may be performed through the so-called Bosch process. In the Bosch process, a step of etching the polysilicon layer 8 by using $SF_6$ (sulfur hexafluoride) and a step of forming a protective film on an etched surface by using $C_4F_8$ (perfluorocyclobutane) are alternately repeated. Thus, the polysilicon layer 8 can be etched at a high aspect ratio.

Then, the protective thin films 14 made of silicon oxide ($SiO_2$) are formed on the whole areas of inner side walls of the polysilicon layer 8 partitioning the respective first hole portions 47 (i.e. circumferential surfaces and bottom surfaces of the first hole portions 47) and the surface of the covering layer 9 by thermal oxidation or CVD, as shown in FIG. 21J(a). The thickness of the protective thin films 14 is about 1000 Å. At this point of time, the protective thin film 14 in each first hole portion 47 is in the form of a tube (more specifically, in the form of a cylinder) covering the inner sidewall of the first hole portion 47, and has a bottom surface portion on a lower end of the first hole portion 47.

Then, portions of the protective thin films 14 on the bottom surfaces of the first hole portions 47 (bottom surface portions of the cylindrical protective thin films 14) and the surface of the covering layer 9 are removed by RIE, as shown in FIG. 21K(a). At the same time, a portion immediately under each first hole portion 47 is removed in the insulating layer 7 on the bottom of the recess portion 6. Thus, second hole portions 48 passing through the insulating layer 7 in regions inside the protective thin films 14 on the inner sidewalls of the first hole portions 47 are formed immediately under the respective first hole portions 47. At this time, the first hole portions 47 and the second hole portions 48 vertically aligning with one another communicate with one another. Thus, the through-holes 13 passing through the polysilicon layer 8 and the insulating layer 7 (the insulating layer 7 on the bottom of the recess portion 6) from the surface of the polysilicon layer 8 are completed.

In the state where the second hole portions 48 are formed and the through-holes 13 are completed, a crystal plane of the silicon substrate 2 is exposed from the bottom surfaces of the through-holes 13 (also the bottom surfaces of the second hole portions 48).

Then, an etchant is introduced into the respective through-holes 13 from the side of the surface 4 of the silicon substrate 2, as shown in FIG. 21L(a) (isotropic etching). For example, etching gas is introduced into the through-holes 13 in a case of applying dry etching such as plasma etching. In a case of applying wet etching, an etching solution is introduced into the through-holes 13. Thus, a substrate material under the insulating layer 7 on the bottom of the recess portion 6 (more strictly, around the bottom of each through-hole 13) is isotropically etched in the silicon substrate 2 by employing the covering layer 9, the protective thin films 14 on the inner side surfaces of the respective first hole portions 47 (the through-holes 13) and the insulating layer 7 as masks. More specifically, the silicon substrate 2 is etched in the thickness direction and a direction orthogonal to the thickness direction from the bottom of each through-hole 13 serving as a starting point. The polysilicon layer 8 is covered with the covering layer 9, the protective thin films 14 and the insulating layer 7, and hence the polysilicon layer 8 above the insulating layer 7 is not etched.

As a result of the isotropic etching, the reference pressure chamber 11 communicating with each through-hole 13 is formed under the insulating layer 7 on the bottom of the recess portion 6 in the silicon substrate 2. At the same time, the polysilicon layer 8 above the reference pressure chamber 11 becomes the diaphragm 12. The depth (the dimension in the thickness direction of the silicon substrate 2) of the completed reference pressure chamber 11 is 10 to 15 μm, for example. At the time of the isotropic etching, the material for the silicon substrate 2 under the insulating layer 7 is so etched that the reference pressure chamber 11 reaches a region wider than the polysilicon layer 8 of the recess portion 6, and the reference pressure chamber 11 is formed to reach the region wider than the polysilicon layer 8 in the direction orthogonal to the thickness direction of the silicon substrate 2. As a result, the aforementioned outer peripheral film portion 24 is formed, and the aforementioned movable film 25 is constituted of the polysilicon layer 8, the insulating layer 7 provided on the circumferential surface of the recess portion 6 and the outer peripheral film portion 24.

The depth of the reference pressure chamber 11 can be adjusted in response to the quantity of introduction of the etchant. The depth of the reference pressure chamber 11 can also be adjusted in response to the interval between the adjacent through-holes 13. When the interval between the through holes 13 is narrow in this case, for example, spaces spreading from the adjacent through-holes 13 so continue that the reference pressure chamber 11 is formed by relatively short-time etching. Therefore, the height of the reference pressure chamber 11 relatively decreases. When the interval between the through-holes 13 is wide, on the other hand, the etching must be performed for a relatively long time until spaces spreading from the adjacent through-holes 13 link with one another. The height of the reference pressure chamber 11 increases in response thereto.

Thus, the interval between the diaphragm 12 (the movable electrode) and the fixed electrode portion 23 of the silicon substrate 2 can be controlled by adjusting the depth of the reference pressure chamber 8, and sensitivity of the pressure sensor 1 (see FIG. 20(*a*)) can be adjusted in response thereto.

Members above the insulating layer 7 are not etched, whereby the cylindrical protective thin film 14 in each through-hole 13 (the first hole portion 47) does not project into the reference pressure chamber 11 in the state where the reference pressure chamber 11 is completed. Therefore, a top surface of the reference pressure chamber 11 is flat, and the reference pressure chamber 11 has a generally complete cylindrical shape.

Then, the respective through-holes 13 are filled up and blocked with oxide films by CVD, as shown in FIG. 21M(a). More detailedly, the oxide films are formed on upper portions in inner side portions of the protective thin films 14 on the circumferential surfaces of the first hole portions 47 constituting the through-holes 13, to fill up the through-holes 13. The oxide films are the aforementioned fillers 15. In other words, the fillers 15 are embedded in the respective through-holes 13 in this step. The respective through-holes 13 are filled up, whereby the reference pressure chamber 11 is sealed in a vacuum state. While the oxide films so project from the through-holes 13 that the surface of the covering layer 9 is irregularized at this time, the surface of the covering layer 9 is flattened by resist etchback. The surface of the covering layer 9 is remarkably irregularized as the through-holes 13 are increased in diameter.

The oxide films for filling up the through-holes 13 do not remain only in the through-holes 13, but reach the interior of the reference pressure chamber 11 from the bottoms of the through-holes 13 continuously with the fillers 15 as the aforementioned covering film 16, to cover the whole areas of the inner wall surfaces of the reference pressure chamber 13. The reference pressure chamber 11, having the sufficient depth (10 to 15 μm), is not filled up with the covering film 16. As the diameter of the through-holes 13 is reduced, the through-holes 13 are quickly filled up, whereby the covering film 16 is reduced in thickness.

Then, a step of forming the integrated circuit portion 28 (see FIG. 20 (*b*)) on the integrated circuit region 27 is executed. The integrated circuit region 27 is a region of the silicon substrate 2 other than the region where the reference pressure chamber 11 and the diaphragm 12 are formed.

First, a nitride film 49 made of silicon nitride (SiN) is formed on the surface of the covering layer 9 of the silicon substrate 2, as shown in FIG. 21N.

Then, the nitride film 49 is selectively removed by plasma etching through a mask (not shown) of a prescribed pattern, as shown in FIG. 21O. As a result, the nitride film 49 remains only on a portion planned to become the integrated circuit region 27.

Then, the remaining nitride film 49 is employed as a mask for forming the LOCOS layer 29 around the nitride film 49 by oxidizing a surface portion of the silicon substrate 2 around the same. Thereafter the nitride film 49 and the covering layer 9 under the same are removed, and the gate oxide film 32 is newly formed by thermal oxidation, for example. The state upon formation of the gate oxide film 32 is shown in FIG. 21P(b). A region (a region separated by the LOCOS layer 29) of the silicon substrate 2 provided with the gate oxide film 32 becomes the integrated circuit region 27.

Then, a polysilicon film is deposited on the gate oxide film 32 in the integrated circuit region 27. The gate electrode 33 is formed on the gate oxide film 32 by patterning the polysilicon film by photolithography, as shown in FIG. 21Q.

Then, a resist pattern 51 is formed on the surface of the silicon substrate 2, as shown in FIG. 21R(b). The resist pattern 51 has one opening 52 corresponding to the integrated circuit region 27. Then, an impurity (arsenic (As) ions, for example) is implanted into the surface layer portion of the silicon substrate 2 by employing the resist pattern 51 and the gate electrode 33 as masks. Thus, the source 30 and the drain 31 are formed on the surface layer portion of the silicon substrate 2 in the integrated circuit region 27, on regions opposed to each other through the gate electrode 33.

After the resist pattern 51 is removed, the surface insulating layer 10 covering the surface of the silicon substrate 2 is formed by CVD. More specifically, the surface insulating layer 10 is formed to cover the covering layer 9 shown in FIG. 21R(a) as well as the LOCOS layer 29 and the gate oxide film 32 shown in FIG. 21R(b). The surface insulating layer 10 is made of silicon oxide, for example.

Then, an opening (a contact hole) 53 is formed to pass through the surface insulating layer 10 and the covering layer 9 by photolithography, as shown in FIG. 20(*a*). The contact hole 53 is formed on a position partially exposing the diaphragm 12. At the same time, another contact hole 53 is formed to pass through the covering layer 9 and the insulating layer 7. The contact hole 53 is formed on a position partially exposing the silicon substrate 2. Further, contact holes 54 for the source 30 and the drain 31 are formed at the same time, as shown in FIG. 20(*b*). The contact holes 54 are formed to pass through the surface insulating layer 10 and the gate oxide film 32 and to partially expose the source 30 and the drain 31 respectively. Although not shown, a contact hole linked with the gate electrode 33 is formed to pass through the surface insulating layer 10 in the same step.

Then, aluminum is deposited on the surface insulating layer 10 by sputtering, and an aluminum deposition film 55 is formed. The aluminum deposition film 55 is connected to the respective ones of the diaphragm 12, the silicon substrate 2, the source 30, the drain 31 and the gate electrode 33 through the contact holes 53, 54 etc.

Then, a resist pattern (not shown) is formed on the aluminum deposition film 55 by photolithography, and the aluminum deposition film 55 is thereafter selectively removed by plasma etching employing the resist pattern as a mask. Thus, the first metal wire 17, the second metal wire 18, the first metal terminal 19 and the second metal terminal 20 are simultaneously formed (see FIG. 19). At this time, the first metal wire 17 is connected to the diaphragm 12 through the corresponding contact hole 53, and the second metal wire 18 is connected to the silicon substrate 2 through the corresponding contact hole 53 (see FIG. 20(*a*)). Further, metal wires (the source-side metal wire 35, the drain-side metal wire 36 etc.) and metal terminals (not shown) linked with the respective ones of the source 30, the drain 31 and the gate electrode 33 of the integrated circuit portion 28 are also formed at the same time. Thereafter the resist pattern is peeled off.

Then, the passivation film 21 is formed on the surface insulating layer 10 by CVD. Thereafter the openings 22 exposing the first metal terminal 19 and the second metal terminal 20 (also including unshown metal terminals on the side of the integrated circuit portion 28) as pads respectively are formed in the passivation film 21 by photolithography and etching, as shown in FIG. 20(*a*). The opening 22 exposing the second metal terminal 20 is illustrated in FIG. 20(*a*).

Further, an opening 56 exposing a region surrounding all through-holes 13 (i.e. generally the whole area of the diaphragm 12) in the surface insulating layer 10 is formed in the passivation film 21 by photolithography and etching. The opening 56 has a shape similar to that of the reference pressure chamber 11 in plan view, for example, and is brought into a circular shape here (see FIG. 19).

Thus, the pressure sensor 1 according to the eighth embodiment is obtained. The opening 56 is formed in the passivation film 21 to expose the diaphragm 12 from the opening 56, so that the diaphragm 12 easily warps. When the passivation film 21 is present on the diaphragm 12, the diaphragm 12 hardly warps, and sensitivity of the pressure sensor 1 lowers.

The step of forming the integrated circuit portion 28 may be executed between the step (see FIG. 21G(b)) of forming the covering layer 9 on the surface 4 of the silicon substrate 2 on the side of the integrated circuit region 27 and the step (FIG. 21H) of forming the resist pattern 45 on the covering layer 9 in order to form the reference pressure chamber 11 (this also applies to subsequent embodiments).

According to the eighth embodiment, the insulating layer 7 is formed on the inner wall surfaces of the recess portion 6 formed in the silicon substrate 2 (see FIG. 21D(a)) and the polysilicon layer 8 is embedded in the recess portion 6 (see FIG. 21E(a)), whereby the polysilicon layer 8 and the silicon substrate 2 can be insulated by the insulating layer 7 (see FIG. 21F(a)). The etchant is so introduced into the through-holes 13 passing through the polysilicon layer 8 and the insulating layer 7 that the reference pressure chamber 11 is formed under the insulating layer 7, as shown in FIG. 21L(a). On the other hand, the polysilicon layer 8 in the recess portion 6 becomes the diaphragm 12 deformed in response to pressure fluctuation.

Therefore, the reference pressure chamber 11 and the diaphragm 12 can be formed through a small number of steps employing only one silicon substrate 2 without bonding two silicon substrates 2 to each other, whereby a low-cost and miniature pressure sensor 1 (see FIG. 20(*a*)) can be simply manufactured.

The diaphragm 12 and the silicon substrate 2 are so insulated by the insulating layer 7 that the diaphragm 12 is not eroded by the etchant etching the substrate material under the insulating layer 7, whereby the thickness of the diaphragm 12 can be precisely formed in a target dimension. Therefore, a pressure sensor 1 capable of attaining improvement of sensitivity and capable of suppressing dispersion in sensitivity can be simply manufactured.

As shown in FIG. 21M(a), the reference pressure chamber 11 under the through-holes 13 can be sealed by embedding the fillers 15 in the through-holes 13. Thus, pressure in the reference pressure chamber 11 is so set to reference pressure that the completed pressure sensor 1 can detect pressure received by the diaphragm 12 as relative pressure with respect to the reference pressure, as shown in FIG. 20(*a*).

The material for the silicon substrate 2 under the insulating layer 7 is so etched that the reference pressure chamber 11 reaches the region wider than the recess portion 6 (see FIG. 21L(a)). When the pressure sensor 1 is completed, therefore, the movable film 25 having the diaphragm 12 and the outer peripheral film portion 24 formed on the periphery thereof is formed above the reference pressure chamber 11. The diaphragm 12, positioned on a central region inside the outer peripheral film portion 24, is remarkably displaced when the movable film 25 warps. Thus, responsibility of the diaphragm 12 to small pressure fluctuation improves. Therefore, sensitivity of the pressure sensor 1 can be improved.

The through-holes 13 are constituted of the first hole portions 47 and the second hole portions 48. The protective thin films 14 are formed on the inner sidewalls of the first hole portions 47, whereby the inner sidewalls (portions to become the diaphragm 12) of the first hole portions 47 can be prevented from being eroded by the etchant introduced into the through-holes 13 (see FIG. 21L(a)). Thus, dispersion in area of the diaphragm 12 (the polysilicon layer 8) can be suppressed.

The through-holes 13 are completed by forming the second hole portions 48 passing through the insulating layer 7 after forming the protective thin films 14 on the inner sidewalls of the first hole portions 47 (see FIG. 21K(a)), whereby the protective thin films 14 do not protrude into the reference pressure chamber 11 from the through-holes 13 in the state where the through-holes 13 are completed. Therefore, no fluctuation of capacitance resulting from protrusion of the protective thin films 14 takes place. Thus, capacitance between the diaphragm 12 and the fixed electrode portion 23 on the bottom surface of the reference pressure chamber 11 can be settled without taking influence by the protective thin films 14 into consideration, whereby design is simplified. As a result, a pressure sensor 1 capable of attaining improvement of sensitivity and capable of suppressing dispersion in sensitivity can be simply manufactured.

The integrated circuit portion 28 is formed on the integrated circuit region 27 other than the region of the silicon substrate 2 where the reference pressure chamber 11 is formed as shown in FIG. 20(*b*), whereby the pressure sensor 1 and the integrated circuit portion 28 can be formed on the same silicon substrate 2 (more detailedly, each rectangular region 3 of FIG. 1). In particular, the diaphragm 12 is embedded in the silicon substrate 2 (see FIG. 20(*a*)) to constitute the pressure sensor 1 while maintaining such a state that the surface 4 of the silicon substrate 2 is flat, whereby the integrated circuit portion 28 can also be formed on the region of the flat surface 4 of each rectangular region 3 other than the diaphragm 12. Thus, it becomes possible to form a body portion (the portion where the diaphragm 12 is formed) of the pressure sensor 1 and the integrated circuit portion 28 (LSI) by one chip (one-chip implementation) (see FIG. 19).

(9) Ninth Embodiment

While a ninth embodiment is now described, the same reference signs are assigned to portions of the ninth embodiment corresponding to the portions described with reference to the eighth embodiment, and description thereof is omitted. In relation to manufacturing steps for a pressure sensor 1 according to the ninth embodiment, detailed description is omitted as to those identical to the manufacturing steps described with reference to the eighth embodiment.

FIG. 22(*a*) is an enlarged plan view of the pressure sensor according to the ninth embodiment, and FIG. 22(*b*) is a sectional view along a cutting plane line B-B in FIG. 22(*a*).

The pressure sensor 1 according to the ninth embodiment is provided with an etching stop layer 60 as shown in FIG. 22(*b*), in addition to the structure (see FIG. 20(*a*)) of the eighth embodiment. The etching stop layer 60 is formed to partition respective side surfaces of a reference pressure chamber 11 and a diaphragm 12.

The etching stop layer 60 forms a cylindrical vertical wall surrounding the reference pressure chamber 11 and the diaphragm 12 in plan view (see FIG. 22(*a*)). Thus, the respective side surfaces of the reference pressure chamber 11 and the diaphragm 12 are partitioned by the etching stop layer 60. An inner peripheral edge of the etching stop layer 60 and a contour L of the diaphragm 12 coincide with each other in plan view.

The etching stop layer 60 is continuous with an insulating layer 7 covering a surface 4 of a silicon substrate 2, and extends toward a deep portion of the silicon substrate 2. More specifically, the etching stop layer 60 extends in the silicon substrate 2 up to a position deeper than a bottom surface of the reference pressure chamber 11. Further, the etching stop layer 60 is linked with the insulating layer 7 provided on a bottom of a recess portion 6 on an intermediate position in the vertical direction thereof (the thickness direction of the silicon substrate 2). In other words, the insulating layer 7 provided on the bottom of the recess portion 6 is linked with the intermediate position of the etching stop layer 60 in the vertical direction to divide the etching stop layer 60 into two in the vertical direction. In the etching stop layer 60, a portion above the insulating layer 7 provided on the bottom of the recess portion 6 covers a side surface (a cylindrical inner peripheral surface) of the recess portion 6.

The reference pressure chamber 11 is present under the diaphragm 12 (also including the insulating layer 7 on the bottom of the recess portion 6) and the etching stop layer 60 is present on the outside of the diaphragm 12, whereby the diaphragm 12 is electrically isolated from the silicon substrate 2.

FIGS. 23A to 23U show manufacturing steps for the pressure sensor according to the ninth embodiment. In a case where two sectional views are shown in each of FIGS. 23A to 23U, the upper sectional view shows a cutting plane on the same position as that in FIG. 22(*a*), and the lower sectional view shows a cutting plane on the same position as that in FIG. 20(*b*).

In order to manufacture the pressure sensor 1 according to the ninth embodiment, the silicon substrate 2 is prepared as shown in FIG. 23A, and an oxide film 40 is formed on the surface 4 of the silicon substrate 2, as described with reference to FIG. 21A.

Then, an unshown resist pattern is formed on the oxide film 40 by photolithography. The resist pattern has an annular opening corresponding to the etching stop layer 60 (see FIG. 22).

Then, the oxide film 40 is selectively removed by plasma etching employing the resist pattern (not shown) as a mask. A state upon termination of the plasma etching is shown in FIG. 23B, and an annular opening 61 is formed in the oxide film 40.

Then, the silicon substrate 2 is dug down by anisotropic deep RIE employing the oxide film 40 as a mask, and an annular trench 62 is formed in the silicon substrate 2, as shown in FIG. 23C. The annular trench 62 is an annular vertical groove. The annular trench 62 is formed to surround a region of the surface 4 of the silicon substrate 2 planned to be provided with the recess portion 6 (i.e. the diaphragm 12) (see FIG. 22(*b*)). Further, the annular trench 62 is formed to be deeper than a portion (see FIG. 22(*b*)) of the silicon substrate 2 planned to become the bottom surface of the reference pressure chamber 11.

Then, the annular trench 62 is filled up with an oxide film by CVD, as shown in FIG. 23D. The oxide film present in the annular trench 62 is the etching stop layer 60. In other words, the etching stop layer 60 is embedded in the annular trench 62 in this step. At this time, the oxide film so projects from the annular trench 62 that a surface of the oxide film 40 is irregularized, the surface of the oxide film 40 is flattened by resist etchback.

Subsequent steps are identical to the steps of the eighth embodiment subsequent to that in FIG. 21B.

In other words, an unshown resist pattern is first formed on the oxide film 40 by photolithography. The resist pattern has an opening corresponding to the recess portion 6 (see FIG. 22(*b*)). The recess portion 6 is circular here, and hence the opening of the resist pattern is circular.

Then, the oxide film 40 is selectively removed by plasma etching employing the resist pattern (not shown) as a mask as described with reference to FIG. 21B, and a circular opening 41 is formed in the oxide film 40 when the plasma etching terminates, as shown in FIG. 23E. The contour of the opening 41 and the inner peripheral edge of the etching stop layer 60 coincide with each other in plan view.

Then, the silicon substrate 2 is dug down by anisotropic etching (CDE, for example) employing the oxide film 40 as a mask as described with reference to FIG. 21C, and the recess portion 6 having a depth of about 1 μm is formed inside the etching stop layer 60, as shown in FIG. 23F. The recess portion 6 is formed to be shallower than the depth of a lower end of the etching stop layer 60. Thereafter the oxide film 40 on the surface 4 of the silicon substrate 2 is removed. At this time, the etching stop layer 60 above the bottom of the recess portion 6 is continuously present, and partitions a circumferential surface of the recess portion 6.

Then, the insulating layer 7 is formed on the surface 4 of the silicon substrate 2 by thermal oxidation or CVD as shown in FIG. 23G, as described with reference to FIG. 21D. At this time, the insulating layer 7 is formed also on inner wall surfaces of the recess portion 6. However, the etching stop layer 60 is already present on the circumferential surface of the recess portion 6 and functions as the insulating layer 7, and hence the insulating layer 7 is newly formed on the bottom surface of the recess portion 6 this time.

Then, a polysilicon film 42 is formed on the surface of the insulating layer 7 by CVD as shown in FIG. 23H, as described with reference to FIG. 21E.

Then, an impurity is implanted into the polysilicon film 42, and heat treatment is thereafter performed on the silicon substrate 2. Thus, the polysilicon film 42 is reduced in resistance.

Then, the polysilicon film 42 projecting to the outside of the recess portion 6 is polished and removed as shown in FIG. 23I(a) as described with reference to FIG. 21F, whereby the remaining polysilicon film 42 enters a state embedded in the recess portion 6 as the polysilicon layer 8. Thereafter the insulating layer 7 (see FIG. 23I(c)) on the side of an integrated circuit region 27 is removed.

Then, a covering layer 9 made of silicon oxide ($SiO_2$) is formed on the surface of the insulating layer 7 in a region other than the recess portion 6, a top surface of the polysilicon layer 8 and the surface 4 of the silicon substrate 2 on the side of the integrated circuit region 27 by thermal oxidation or CVD as shown in FIG. 23J, as described with reference to FIG. 21G.

Then, the covering layer 9 is selectively removed by plasma etching employing a resist pattern 45 formed on the covering layer 9 by photolithography as a mask as shown in FIG. 23K, as described with reference to FIG. 21H(a).

Then, the polysilicon layer 8 is dug down by anisotropic deep RIE employing the resist pattern 45 as a mask.

Thus, first hole portions 47 are formed in the polysilicon layer 8 and remaining portions of the resist pattern 45 are peeled off as shown in FIG. 23L(a), as described with reference to FIG. 21I(a).

Then, protective thin films 14 are formed on circumferential surfaces and bottom surfaces of the first hole portions 47 as well as the surface of the covering layer 9 by thermal oxidation or CVD as shown in FIG. 23M(a), as described with reference to FIG. 21J(a).

Then, second hole portions 48 are formed immediately under the respective first hole portions 47 by RIE and through-holes 13 are completed as shown in FIG. 23N(a), as described with reference to FIG. 21K(a).

Then, an etchant is introduced into the respective through-holes 13 and a substrate material under the insulating layer 7 on the bottom of the recess portion 6 is isotropically etched in the silicon substrate 2 as shown in FIG. 23O(a), as described with reference to FIG. 21L(a). While the polysilicon layer 8 is not etched as described above, a substrate material on the outside of the etching stop layer 60 is not etched either in a direction orthogonal to the thickness direction of the silicon substrate 2, due to the presence of the etching stop layer 60.

Then, the reference pressure chamber 11 is formed as a result of the isotropic etching. At this time, the polysilicon layer 8 above the reference pressure chamber 11 becomes the diaphragm 12. In the direction orthogonal to the thickness direction of the silicon substrate 2, the reference pressure chamber 11 and the diaphragm 12 are partitioned by the etching stop layer 60.

Then, fillers 15 are embedded in the respective through holes 13 by CVD as shown in FIG. 23P(a), as described with reference to FIG. 21M(a). Further, the surface of the covering layer 9 is flattened by resist etchback.

Then, a step of forming an integrated circuit portion 28 (see FIG. 20(*b*)) on the integrated circuit region 27 is executed.

First, a nitride film 49 is formed on the surface of the covering layer 9 of the silicon substrate 2 as shown in FIG. 23Q, as described with reference to FIG. 21N.

Then, the nitride film 49 remains only on a portion planned to become the integrated circuit region 27 by plasma etching through a mask (not shown) of a prescribed pattern as shown in FIG. 23R, as described with reference to FIG. 21O.

Then, a LOCOS layer 29 is formed and a gate oxide film 32 is thereafter formed as shown in FIG. 23S(b), as described with reference to FIG. 21P.

Then, a gate electrode 33 is formed on the gate oxide film 32 as shown in FIG. 23T, as described with reference to FIG. 21Q.

Then, a source 30 and a drain 31 are formed on a surface layer portion of the silicon substrate 2 on the integrated circuit region 27 as shown in FIG. 23U(b), as described with reference to FIG. 21R.

Thereafter a surface insulating layer 10 is formed, and a first metal wire 17, a second metal wire 18, a first metal terminal 19 and a second metal terminal 20 (see FIG. 22(*a*)) are formed as shown in FIG. 22, as described with reference to FIG. 20. At the same time, metal wires (a source-side metal wire 35, a drain-side metal wire 36 and the like, see FIG. 20(*b*)) and metal terminals (not shown) linked with the respective ones of the source 30, the drain 31 and the gate electrode 33 of the integrated circuit portion 28 are also formed. A passivation film 21 is formed on the surface insulating layer 10, and openings 22 exposing the first metal terminal 19 and the second metal terminal 20 (also including unshown metal terminals on the side of the integrated circuit portion 28) as pads respectively and an opening 56 are formed in the passivation film 21.

Thus, the pressure sensor 1 according to the ninth embodiment is obtained.

According to the ninth embodiment, the following effects can also be achieved in addition to the effects attained according to the eighth embodiment:

According to the ninth embodiment, the diaphragm 12 in the recess portion 6 is partitioned by the etching stop layer 60 of the annular trench 62, as shown in FIG. 22(*b*). Further, lateral etching at the time of forming the reference pressure chamber 11 stops on the etching stop layer 60 (see FIG. 23O(a)).

Thus, both of the diaphragm 12 and the reference pressure chamber 11 are partitioned by the etching stop layer 60, whereby the respective ones of the diaphragm 12 and the reference pressure chamber 11 can be precisely formed in target dimensions. Therefore, a pressure sensor 1 capable of attaining improvement of sensitivity and capable of suppressing dispersion in sensitivity can be simply manufactured.

(10) Tenth Embodiment

While a tenth embodiment is now described, the same reference signs are assigned to portions of the tenth embodiment corresponding to the portions described with reference to the eighth embodiment, and description thereof is omitted. In relation to manufacturing steps for a pressure sensor 1 according to the tenth embodiment, detailed description is omitted as to those identical to the manufacturing steps described with reference to the eighth embodiment.

FIG. 24(*a*) is an enlarged plan view of the pressure sensor according to the tenth embodiment, and FIG. 24(*b*) is a sectional view along a cutting plane line C-C in FIG. 24(*a*).

In the pressure sensor 1 according to the tenth embodiment, a second etching stop layer 70 is provided on a position partitioning a bottom surface of a reference pressure chamber 11 as shown in FIG. 24(*b*), in addition to the structure (see FIG. 20(*a*)) of the eighth embodiment. The bottom surface of the reference pressure chamber 11 is a surface opposed to an insulating layer 7 on a bottom of a recess portion 6 in inner wall surfaces of the reference pressure chamber 11.

The second etching stop layer 70 is a circular insulating layer larger in diameter than the reference pressure chamber 11 in plan view. The insulating layer 7 on the bottom of the recess portion 6 and the second etching stop layer 70 are vertically opposed to each other at an interval corresponding to the vertical dimension (the depth dimension) of the reference pressure chamber 11. Therefore, the reference pressure chamber 11 is held and partitioned by the insulating layer 7 on the bottom of the recess portion 6 and the second etching stop layer 70 in the vertical direction.

FIGS. 25A to 25U show manufacturing steps for the pressure sensor according to the tenth embodiment. In a case where two sectional views are shown in each of FIGS. 25A to 25U, the upper sectional view shows a cutting plane on the same position as that in FIG. 24(*a*), and the lower sectional view shows a cutting plane on the same position as that in FIG. 20(*b*).

In order to manufacture the pressure sensor 1 according to the tenth embodiment, a silicon substrate 2 is prepared, and an oxide film 73 having a thickness of several 100 Å is formed on a surface 4 of the silicon substrate 2, as shown in FIG. 25A.

Then, a resist pattern 71 is formed on the oxide film 73 by photolithography, as shown in FIG. 25B(a). The resist pattern 71 has one round opening 72 (see FIG. 25B(b)) corresponding to the second etching stop layer 70 (see FIG. 24(*b*)). Then, an impurity (nitrogen (N) ions or oxygen (O) ions, for example) is implanted into a surface layer portion (portions shown with "x" in FIG. 25B(a)) of the silicon substrate 2 by employing the resist pattern 71 as a mask (ion implantation). Acceleration voltage at the time of the ion implantation may be set to about 20 to 120 keV, for example. The oxide film 73 suppresses damage on the surface 4 resulting from the ion implantation.

Then, after the oxide film 73 and the resist pattern 71 are removed, treatment of epitaxially growing a semiconductor layer on the surface 4 of the silicon substrate 2 is performed. The silicon substrate 2 is heated at the time of the epitaxial growth, whereby the impurity ions implanted into the silicon substrate 2 are activated. Thus, the second etching stop layer 70 made of silicon oxide ($SiO_2$) or silicon nitride (SiN) is formed on a position of a prescribed depth from the surface 4 of the silicon substrate 2, as shown in FIG. 25C(a). The position of the prescribed depth is a position of a depth planned to be provided with the bottom surface of the reference pressure chamber 11 in the silicon substrate 2 (see FIG. 24(*b*)). In the silicon substrate 2, a portion (between the second etching stop layer 70 and the surface 4) above the second etching stop layer 70 is an epitaxially grown silicon layer (an epitaxial layer). The thickness of the epitaxial layer is about 10 to 17 μm, for example.

The second etching stop layer 70 can also be formed on the position of the prescribed depth (the depth of about 10 to 17 μm from the surface 4, for example) from the surface 4 of the silicon substrate 2 by only heat treatment (drive-in for diffusing the implanted ions) of the silicon substrate 2, in place of the epitaxial growth. In this case, the impurity ions (the oxygen ions or the nitrogen ions) are implanted into the position of the prescribed depth from the surface 4 of the silicon substrate 2 by increasing the acceleration voltage for the implantation when implanting the impurity ions (see FIG. 25B(a)). The acceleration voltage for the impurity ions is set to about 200 to 1000 keV, for example. When the implanted ions are thereafter activated by performing drive-in, the second etching stop layer 70 made of an oxide or a nitride is formed on the position of the prescribed depth from the surface 4 of the silicon substrate 2. Thereafter the oxide film 73 (see FIG. 25B(a)) is removed. In the case of applying only the drive-in in place of the epitaxial growth, the silicon substrate 2 can be reduced in thickness, due to the absence of the epitaxial layer.

Subsequent steps are identical to the steps of the eighth embodiment subsequent to that in FIG. 21A.

In other words, an oxide film 40 is first formed on the surface 4 of the silicon substrate 2 as shown in FIG. 25D, as described with reference to FIG. 21A, and an unshown resist pattern is formed on the oxide film 40 by photolithography. The resist pattern has a circular opening corresponding to the recess portion 6 (see FIG. 24(*b*)).

Then, the oxide film 40 is selectively removed by plasma etching employing the resist pattern (not shown) as a mask, and a circular opening 41 is formed in the oxide film 40 upon termination of the plasma etching, as shown in FIG. 25E, as described with reference to FIG. 21B.

Then, the silicon substrate 2 is dug down by anisotropic etching (CDE, for example) employing the oxide film 40 as a mask as described with reference to FIG. 21C, and the recess portion 6 having a depth of about 1 μm is formed, as shown in FIG. 25F.

Then, the insulating layer 7 is formed on the surface 4 of the silicon substrate 2 by thermal oxidation or CVD as show in FIG. 25G, as described with reference to FIG. 21D. At this time, the insulating layer 7 is formed also on inner wall surfaces (a circumferential surface and a bottom surface) of the recess portion 6.

Then, a polysilicon film 42 is formed on the surface of the insulating layer 7 by CVD as shown in FIG. 25H, as described with reference to FIG. 21E.

Then, an impurity is implanted into the polysilicon film 42, and heat treatment is thereafter performed on the silicon substrate 2. Thus, the polysilicon film 42 is reduced in resistance.

Then, the polysilicon film 42 projecting to the outside of the recess portion 6 is polished and removed as shown in FIG. 25I(a) as described with reference to FIG. 21F, whereby the remaining polysilicon film 42 enters a state embedded in the recess portion 6 as the polysilicon layer 8. Thereafter the insulating layer 7 (see FIG. 25I(c)) on a side of an integrated circuit region 27 is removed.

Then, a covering layer 9 made of silicon oxide ($SiO_2$) is formed on the surface of the insulating layer 7 on a region other than the recess portion 6, a top surface of the polysilicon layer 8 and the surface 4 of the silicon substrate 2 on the side of the integrated circuit region 27 by thermal oxidation or CVD as shown in FIG. 25J, as described with reference to FIG. 21G.

Then, the covering layer 9 is selectively removed by plasma etching employing a resist pattern 45 formed on the covering layer 9 by photolithography as shown in FIG. 25K, as described with reference to FIG. 21H(a).

Then, the polysilicon layer 8 is dug down by anisotropic deep RIE employing the resist pattern 45 as a mask.

Thus, first hole portions 47 are formed in the polysilicon layer 8 and remaining portions of the resist pattern 45 are peeled off as shown in FIG. 25L(a), as described with reference to FIG. 21I(a).

Then, protective thin films 14 are formed on circumferential surfaces and bottom surfaces of the first hole portions 47 as well as the surface of the covering layer 9 by thermal oxidation or CVD as shown in FIG. 25M(a), as described with reference to FIG. 21J(a).

Then, second hole portions 48 are formed immediately under the respective first hole portions 47 by RIE and through-holes 13 are completed as shown in FIG. 25N(a), as described with reference to FIG. 21K(a).

Then, an etchant is introduced into the respective through-holes 13 as shown in FIG. 25O(a) as described with reference to FIG. 21L(a), and a substrate material under the insulating layer 7 on the bottom of the recess portion 6 is isotropically etched in the silicon substrate 2. While the polysilicon layer 8 is not etched here as described above, a substrate material under the second etching stop layer 70 is not etched in the silicon substrate 2 either, due to the presence of the second etching stop layer 70.

Then, the reference pressure chamber 11 is formed as a result of the isotropic etching. At this time, the polysilicon layer 8 above the reference pressure chamber 11 becomes a diaphragm 12. In the thickness direction of the silicon substrate 2, the reference pressure chamber 11 is held and partitioned by the insulating layer 7 on the bottom of the recess portion 6 and the second etching stop layer 70. An outer peripheral film portion 24 is formed at the same time when the diaphragm 12 is formed, whereby a movable film 25 is formed.

Then, fillers 15 are embedded in the respective through-holes 13 by CVD as shown in FIG. 25P(a), as described with reference to FIG. 21M(a). Further, the surface of the covering layer 9 is flattened by resist etchback.

Then, a step of forming an integrated circuit portion 28 (see FIG. 20(*b*)) on the integrated circuit region 27 is executed.

First, a nitride film 49 is formed on the surface of the covering layer 9 of the silicon substrate 2 as shown in FIG. 25Q, as described with reference to FIG. 21N.

Then, the nitride film 49 remains only on a portion planned to become the integrated circuit region 27 by plasma etching through a mask (not shown) of a prescribed pattern as shown in FIG. 25R, as described with reference to FIG. 21O.

Then, a LOCOS layer 29 is formed and a gate oxide film 32 is thereafter formed as shown in FIG. 25S(b), as described with reference to FIG. 21P.

Then, a gate electrode 33 is formed on the gate oxide film 32 as shown in FIG. 25T, as described with reference to FIG. 21Q.

Then, a source 30 and a drain 31 are formed on the surface layer portion of the silicon substrate 2 on the integrated circuit region 27 as shown in FIG. 25U(b), as described with reference to FIG. 21R.

Thereafter a surface insulating layer 10 is formed, and a first metal wire 17, a second metal wire 18, a first metal terminal 19 and a second metal terminal 20 (see FIG. 24(*a*)) are formed as shown in FIG. 24, as described with reference to FIG. 20. At the same time, metal wires (a source-side metal wire 35, a drain-side metal wire 36 and the like, see FIG. 20(*b*)) and metal terminals (not shown) linked with the respective ones of the source 30, the drain 31 and the gate electrode 33 of the integrated circuit portion 28 are also formed. A passivation film 21 is formed on the surface insulating layer 10, and openings 22 exposing the first metal terminal 19 and the second metal terminal 20 (also including unshown metal terminals on the side of the integrated circuit portion 28) as pads respectively and an opening 56 are formed in the passivation film 21, as shown in FIG. 24(*b*).

Thus, the pressure sensor 1 according to the tenth embodiment is obtained.

According to the tenth embodiment, the following effects can also be achieved in addition to the effects attained according to the eighth embodiment:

According to the tenth embodiment, the second etching stop layer 70 is formed on the bottom surface of the reference pressure chamber 11 in the silicon substrate 2.

In this case, a substrate material for the silicon substrate 2 under the second etching stop layer 70 is not eroded by the etchant when introducing the etchant into the through-holes 13 and etching the material for the silicon substrate 2 under the insulating layer 7 (see FIG. 25O(a)). Therefore, the reference pressure chamber 11 is held and partitioned by the insulating layer 7 and the second etching stop layer 70, whereby the reference pressure chamber 11 can be precisely formed in target dimensions. In other words, the distance between the diaphragm 12 (the polysilicon layer 8) and the bottom surface (a fixed electrode portion 23) of the reference pressure chamber 11 can be precisely customized to a design value, whereby dispersion in capacitance therebetween can be suppressed. Therefore, a pressure sensor 1 capable of attaining improvement of sensitivity and capable of suppressing dispersion in sensitivity can be simply manufactured.

(11) Eleventh Embodiment

While an eleventh embodiment is now described, the same reference signs are assigned to portions of the eleventh embodiment corresponding to the portions described with reference to the eighth to tenth embodiments, and description thereof is omitted. In relation to manufacturing steps for a pressure sensor 1 according to the eleventh embodiment, detailed description is omitted as to those identical to the manufacturing steps described with reference to the eighth to tenth embodiments.

FIG. 26(*a*) is an enlarged plan view of the pressure sensor according to the eleventh embodiment, and FIG. 26(*b*) is a sectional view along a cutting plane line D-D in FIG. 26(*a*).

The pressure sensor 1 according to the eleventh embodiment is provided with the etching stop layer 60 of the second embodiment and the second etching stop layer 70 of the third embodiment as shown in FIG. 26(*b*), in addition to the structure (see FIG. 20(*a*)) of the eighth embodiment. The etching stop layer 60 is hereinafter referred to as "first etching stop layer 60" for the convenience of illustration.

The first etching stop layer 60 extends in a silicon substrate 2 up to the depth of the second etching stop layer 70. The first etching stop layer 60 is linked with an insulating layer 7 on a bottom of a recess portion 6 on an intermediate position in the vertical direction (the thickness direction of the silicon substrate 2) thereof, and also linked with the second etching stop layer 70 on a lower end portion thereof. The second etching stop layer 70 is linked with the first etching stop layer 60 to cover the interior of the first etching stop layer 60 from below.

Therefore, a diaphragm 12 is separated from the silicon substrate 2. A reference pressure chamber 11 is partitioned by the insulating layer 7 on the bottom of the recess portion 6 and the second etching stop layer 70 in the thickness direction of the silicon substrate 2, and further partitioned by the first etching stop layer 60 in a direction orthogonal to the thickness direction.

FIGS. 27A to 27X show manufacturing steps for the pressure sensor according to the eleventh embodiment. In a case where two sectional views are shown in each of FIGS. 27A to 27X, the upper sectional view shows a cutting plane on the same position as that in FIG. 26(*b*), and the lower sectional view shows a cutting plane on the same position as that in FIG. 20(*b*).

In order to manufacture the pressure sensor 1 according to the eleventh embodiment, an oxide film 73 is formed on a surface 4 of the silicon substrate 2 as shown in FIG. 27A, as described with reference to FIG. 25A.

Then, an impurity is implanted into a surface layer portion of the silicon substrate 2 by employing a resist pattern 71 formed on the oxide film 73 as a mask as shown in FIG. 27B(a), as described with reference to FIG. 25B(a).

Then, after the oxide film 73 and the resist latter 71 are removed, treatment of epitaxially growing a semiconductor layer on the surface 4 of the silicon substrate 2 is performed, and the second etching stop layer 70 is formed on a position of a prescribed depth from the surface 4 of the silicon substrate 2 as shown in FIG. 27C(a), as described with reference to FIG. 25C. In a case where acceleration voltage for the implantation has been high, only drive-in may be performed in place of the epitaxial growth.

Subsequent steps are identical to the steps of the ninth embodiment subsequent to that in FIG. 23A.

In other words, an oxide film 40 is first formed on the surface 4 of the silicon substrate 2 as shown in FIG. 27D, as described with reference to FIG. 23A.

Then, an unshown resist pattern is formed on the oxide film 40 by photolithography. The resist pattern has an annular opening corresponding to the etching stop layer 60 (see FIG. 26).

Then, the oxide film 40 is selectively removed by plasma etching employing the resist pattern (not shown) as a mask, as described with reference to FIG. 23B. A state upon termination of the plasma etching is shown in FIG. 27E, and an annular opening 61 is formed in the oxide film 40.

Then, the silicon substrate 2 is dug down by anisotropic deep RIE employing the oxide film 40 as a mask as described with reference to FIG. 23C, and an annular trench 62 is formed, as shown in FIG. 27F. The annular trench 62 is formed to surround a region where the recess portion 6 (i.e. the diaphragm 12) is planned to be formed on the surface 4 of the silicon substrate 2 (see FIG. 26(*b*)). Further, the annular trench 62 is formed to be deeper than a portion (see FIG. 26(*b*)) of the silicon substrate 2 planned to become a bottom surface of the reference pressure chamber 11. A lower end portion of the formed annular trench 62 coincides with a peripheral edge portion of the second etching stop layer 70.

Then, the etching stop layer 60 is embedded in the annular trench 62 by CVD as shown in FIG. 27G, as described with reference to FIG. 23D. At this time, a surface of the oxide film 40 is flattened by resist etchback.

Then, an unshown resist pattern is formed on the oxide film 40 by photolithography. The resist pattern has a circular opening corresponding to the recess portion 6 (see FIG. 26(*b*)).

Then, the oxide film 40 is selectively removed by plasma etching employing the resist pattern (not shown) as a mask and a circular opening 41 is formed in the oxide film 40 upon termination of the plasma etching as shown in FIG. 27H, as described with reference to FIG. 23E. The contour of the opening 41 and an inner peripheral edge of the etching stop layer 60 coincide with each other in plan view.

Then, the silicon substrate 2 is dug down by anisotropic etching (CDE, for example) employing the oxide film 40 as a mask as described with reference to FIG. 23F, and the recess portion 6 having a depth of about 1 μm is formed inside the etching stop layer 60, as shown in FIG. 27I. Thereafter the oxide film 40 on the surface 4 of the silicon substrate 2 is removed. At this time, the etching stop layer 60 above the bottom of the recess portion 6 is continuously present.

Then, the insulating layer 7 is formed on the surface 4 of the silicon substrate 2 by thermal oxidation or CVD as shown in FIG. 27J(a), as described with reference to FIG. 23G. At this time, the insulating layer 7 is formed also on inner wall surfaces of the recess portion 6. However, the etching stop layer 60 is already present on a circumferential surface of the recess portion 6 and functions as the insulating layer 7, and hence the insulating layer 7 is newly formed on a bottom surface of the recess portion 6 this time.

Then, a polysilicon film 42 is formed on a surface of the insulating layer 7 by CVD as shown in FIG. 27K, as described with reference to FIG. 23H.

Then, an impurity is implanted into the polysilicon film 42, and heat treatment is thereafter performed on the silicon substrate 2. Thus, the polysilicon film 42 is reduced in resistance.

Then, the polysilicon film 42 projecting to the outside of the recess portion 6 is polished and removed as shown in FIG. 27L(a) as described with reference to FIG. 23I(a), whereby the remaining polysilicon film 42 enters a state embedded in the recess portion 6 as the polysilicon layer 8. Thereafter the insulating layer 7 (see FIG. 27L(c)) on a side of an integrated circuit region 27 is removed.

Then, a covering layer 9 made of silicon oxide ($SiO_2$) is formed on the surface of the insulating layer 7 on a region other than the recess portion 6, a top surface of the polysilicon layer 8 and the surface 4 of the silicon substrate 2 on the side of the integrated circuit region 27 by thermal oxidation or CVD as shown in FIG. 27M, as described with reference to FIG. 23J.

Then, the covering layer 9 is selectively removed by plasma etching employing a resist pattern 45 formed on the covering layer 9 by photolithography as a mask as shown in FIG. 27N(a), as described with reference to FIG. 23K.

Then, the polysilicon layer 8 is dug down by anisotropic deep RIE employing the resist pattern 45 as a mask.

Thus, first hole portions 47 are formed in the polysilicon layer 8 and remaining portions of the resist pattern 45 are peeled off as shown in FIG. 27O(*a*), as described with reference to FIG. 23L(a).

Then, protective thin films 14 are formed on circumferential surfaces and bottom surfaces of the first hole portions 47 as well as a surface of the covering layer 9 by thermal oxidation or CVD as shown in FIG. 27P, as described with reference to FIG. 23M(a).

Then, second hole portions 48 are formed immediately under the respective first hole portions 47 by RIE and through-holes 13 are completed as shown in FIG. 27Q(a), as described with reference to FIG. 23N(a).

Then, an etchant is introduced into the respective through-holes 13 as shown in FIG. 27R(a) as described with reference to FIG. 23O(a), and a substrate material under the insulating layer 7 on the bottom surface of the recess portion 6 is isotropically etched in the silicon substrate 2. While the polysilicon layer 8 is not etched as described above, a substrate material on the outside of the first etching stop layer 60 is not etched either in a direction orthogonal to the thickness direction of the silicon substrate 2, due to the presence of the first etching stop layer 60. Further, a substrate material under the second etching stop layer 70 is not etched in the silicon substrate 2 either, due to the presence of the second etching stop layer 70.

Then, the reference pressure chamber 11 is formed as a result of the isotropic etching. At this time, the polysilicon layer 8 above the reference pressure chamber 11 becomes the diaphragm 12. In the direction orthogonal to the thickness direction of the silicon substrate 2, the reference pressure chamber 11 and the diaphragm 12 are partitioned by the first etching stop layer 60. In the thickness direction of the silicon substrate 2, the reference pressure chamber 11 is held and partitioned by the insulating layer 7 on the bottom of the recess portion 6 and the second etching stop layer 70.

Then, fillers 15 are embedded in the respective through-holes 13 by CVD as shown in FIG. 27S(a), as described with reference to FIG. 23P(a). Further, the surface of the covering layer 9 is flattened by resist etchback.

Then, a step of forming an integrated circuit portion 28 (see FIG. 20(*b*)) on the integrated circuit region 27 is executed.

First, a nitride film 49 is formed on the surface of the covering layer 9 of the silicon substrate 2 as shown in FIG. 27T, as described with reference to FIG. 23Q.

Then, the nitride film 49 remains only on a portion planned to become the integrated circuit region 27 by plasma etching through a mask (not shown) of a prescribed pattern as shown in FIG. 27U, as described with reference to FIG. 23R.

Then, a LOCOS layer 29 is formed and a gate oxide film 32 is thereafter formed as shown in FIG. 27V(b), as described with reference to FIG. 23S(b).

Then, a gate electrode 33 is formed on the gate oxide film 32 as shown in FIG. 27W, as described with reference to FIG. 23T.

Then, a source 30 and a drain 31 are formed on the surface layer portion of the silicon substrate 2 on the integrated circuit region 27 as shown in FIG. 27X(b), as described with reference to FIG. 23U(b).

Thereafter a surface insulating layer 10 is formed, and a first metal wire 17, a second metal wire 18, a first metal terminal 19 and a second metal terminal 20 (see FIG. 26(*a*)) are formed as shown in FIG. 26, as described with reference to FIG. 20. At the same time, metal wires (a source-side metal wire 35, a drain-side metal wire 36 etc., see FIG. 20(*b*)) and metal terminals (not shown) linked with the respective ones of the source 30, the drain 31 and the gate electrode 33 of the integrated circuit portion 28 are also formed. Further, a passivation film 21 is formed on the surface insulating layer 10, and openings 22 exposing the first metal terminal 19 and the second metal terminal 20 (also including unshown metal terminals on the side of the integrated circuit portion 28) as pads respectively and an opening 56 are formed in the passivation film 21, as shown in FIG. 26(*b*).

Thus, the pressure sensor 1 according to the eleventh embodiment is obtained.

According to the eleventh embodiment, the effects attained in the eighth to tenth embodiments can be achieved.

(12) Others

Such an example that the diaphragm 10 is in the form of a thin disc having a large number of through-holes 11 has been shown in each of the aforementioned embodiments. The diaphragm 10 can be reduced in thickness when reducing the diameter thereof when forming the diaphragm 10. The sensitivity of the pressure sensor 1 is changeable in response to the diameter, the thickness and the shape of the diaphragm 10.

Sensitivity of the pressure sensor 1 responsive to each of the diameter, the thickness and the shape of the diaphragm 10 is now described.

FIG. 28(*a*) is a plan view of a circular diaphragm, FIG. 28(*b*) is a plan view of a quadrangular diaphragm having right-angled four corners, and FIG. 28(*c*) is a plan view of a quadrangular diaphragm having rounded four corners. FIG. 29 is a graph showing the relation between diaphragm diameters and sensitivity of pressure sensors. FIG. 30 is a graph showing the relation between diaphragm thicknesses and sensitivity of the pressure sensors.

Referring to FIG. 28, plane shapes of diaphragms 10 include a quadrangular shape (see FIG. 28(*b*)) and a quadrangular shape having rounded four corners (referred to as a corner shape, see FIG. 28(*c*)), in addition to the aforementioned circular shape (see FIG. 28(*a*)). Inscribed circles (see FIGS. 28(*b*) and 28(*c*)) shown by dotted lines in the respective diaphragms 10 of the quadrangular shape and the corner shape are circles of the same magnitude as the circular diaphragm 10 shown in FIG. 28(*a*).

FIG. 29 shows the relation between diameters of the diaphragms 10 (diaphragm diameters) and sensitivity of pressure sensors 1 under such a condition that thicknesses of the diaphragms 10 (diaphragm thicknesses) are constant (4.5 μm here). The sensitivity denotes the magnitude of a value ΔV (unit: mV) of voltage change between the aforementioned output terminals 16 and 18 (see FIG. 4) at a time when pressure acting on the diaphragms 10 has change (ΔP) of 90 kPa, and the sensitivity increases as ΔV enlarges (this also applies to FIG. 14). In the respective ones of the diaphragms 10 of the quadrangular and corner shapes, the diameters of the aforementioned inscribed circles correspond to the diaphragm diameters (see FIGS. 28(*b*) and 28(*c*)).

Referring to FIG. 29, the axis of abscissa shows the diaphragm diameters, and the axis of ordinate shows the sensitivity. As shown in FIG. 29, the sensitivity increases as the diaphragm diameters enlarge, regardless of the shapes of the diaphragms 10. Further, the quadrangular and corner shapes are higher in sensitivity than the circular shape. With reference to the same diaphragm diameter (500 μm), the quadrangular shape is slightly higher in sensitivity than the corner shape.

FIG. 30 shows the relation between the diaphragm thicknesses and sensitivity of the pressure sensors 1 under such a condition that the diaphragm diameters are constant (500 μm here). As shown in FIG. 30, the sensitivity increases as the diaphragm thicknesses decrease, regardless of the shapes of the diaphragms 10. Also in this case, the quadrangular and corner shapes are higher in sensitivity than the circular shape.

Thus, the quadrangular and corner shapes are higher in sensitivity than the circular shape in relation to the shapes of the diaphragms 10, while it is mentionable as the reason therefor that the quadrangular and corner shapes are larger in area than the circular shape due to the corners (see FIG. 28). The diaphragm 10 so easily warps as the area of the diaphragm 10 increases that the piezoresistors R1 to R4 (see FIG. 2) easily warp, whereby the sensitivity of the pressure sensor 1 increases.

In the quadrangular shape, however, local force is easily applied to the four corners, and hence the diaphragm is easily broken. In the circular diaphragm 10, on the other hand, such breakage hardly takes place. Therefore, the shape of the diaphragm 10 is properly selected depending on to which one of sensitivity and durability priority is given. When adopting the corner shape having rounded four corners, requirements for the sensitivity and the durability can be compatibly satisfied. The diaphragm 10 may alternatively be provided in a polygonal shape other than the quadrangular shape, as a matter of course.

While such an example that the integrated circuit portion 28 is formed on the silicon substrate 2 provided with the pressure sensor 1 has been shown in each of the aforementioned embodiments, the integrated circuit portion 28 may not be provided on the silicon substrate 2.

While the embodiments of the present invention have been described, various modifications can be applied in the range of subject matter described in the scope of claims for patent.

The invention claimed is:

1. A pressure sensor comprising:

a substrate provided therein with a reference pressure chamber;

a diaphragm, consisting of part of the substrate, formed on a surface layer portion of the substrate to partition the reference pressure chamber and provided with a through-hole communicating with the reference pressure chamber;

an etching stop layer formed on a surface of the diaphragm facing the reference pressure chamber;

an embedding material arranged in the through-hole; and a sidewall layer, cylindrically formed to cover a sidewall of the through-hole, protruding into the reference pressure chamber from the etching stop layer.

2. The pressure sensor according to claim 1, further comprising a piezoresistor formed on a surface of the diaphragm opposite to the surface facing the reference pressure chamber.

3. The pressure sensor according to claim 2, further including a separation layer surrounding the diaphragm and separating the diaphragm from another portion of the substrate.

4. The pressure sensor according to claim 3, wherein the separation layer extends in the substrate up to a position deeper than a bottom surface of the reference pressure chamber.

5. The pressure sensor according to claim 1, further comprising a second etching stop layer formed on a bottom surface opposed to the etching stop layer in an inner wall surface of the reference pressure chamber.

6. The pressure sensor according to claim 1, further comprising an integrated circuit portion having an integrated circuit device formed on the substrate.

7. The pressure sensor according to claim 1, wherein the sidewall layer includes a portion disposed within the reference pressure chamber.

8. The pressure sensor according to claim 7, wherein the portion of the sidewall layer is surrounded by the reference pressure chamber.

* * * * *